US012598910B2

(12) United States Patent
Kim et al.

(10) Patent No.: US 12,598,910 B2
(45) Date of Patent: Apr. 7, 2026

(54) COMPOUND AND ORGANIC LIGHT EMITTING DEVICE COMPRISING SAME

(71) Applicant: LG CHEM, LTD., Seoul (KR)

(72) Inventors: Minjun Kim, Daejeon (KR); Seung Won Choi, Daejeon (KR); Dong Hoon Lee, Daejeon (KR); Sang Duk Suh, Daejeon (KR); Young Seok Kim, Daejeon (KR); Seoyeon Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 770 days.

(21) Appl. No.: 17/432,069

(22) PCT Filed: Oct. 22, 2020

(86) PCT No.: PCT/KR2020/014473
§ 371 (c)(1),
(2) Date: Aug. 18, 2021

(87) PCT Pub. No.: WO2021/080340
PCT Pub. Date: Apr. 29, 2021

(65) Prior Publication Data

US 2022/0199915 A1 Jun. 23, 2022

(30) Foreign Application Priority Data

Oct. 22, 2019 (KR) ........................ 10-2019-0131710
Oct. 21, 2020 (KR) ........................ 10-2019-0137039

(51) Int. Cl.
*H10K 85/60* (2023.01)
*H10K 101/00* (2023.01)

(52) U.S. Cl.
CPC ......... *H10K 85/615* (2023.02); *H10K 85/626* (2023.02); *H10K 85/633* (2023.02);
(Continued)

(58) Field of Classification Search
CPC ............. H10K 85/6574; H10K 85/626; H10K 85/633; H10K 85/636; H10K 85/654;
(Continued)

(56) References Cited

U.S. PATENT DOCUMENTS 5,281,489 A * 1/1994 Mori ...................... H10K 50/11 313/506
2004/0251816 A1 12/2004 Leo et al.
(Continued)

FOREIGN PATENT DOCUMENTS

CN 107827807 A 3/2018
KR 10-2000-0051826 A 8/2000
(Continued)

OTHER PUBLICATIONS

Tao, Y., Yang, C., & Qin, J. (2011). Organic host materials for phosphorescent organic light-emitting diodes. Chemical Society Reviews, 40(5), 2943-2970. (Year: 2011).*

*Primary Examiner* — Dawn L Garrett
(74) *Attorney, Agent, or Firm* — Bryan Cave Leighton Paisner LLP

(57) ABSTRACT

A compound represented by Chemical Formula 1 and an organic light emitting device comprising the same, the compound used as a material of an organic material layer of the organic light emitting device and providing improved efficiency, low driving voltage, and improved lifetime characteristics.

(Continued)

[Chemical Formula 1]

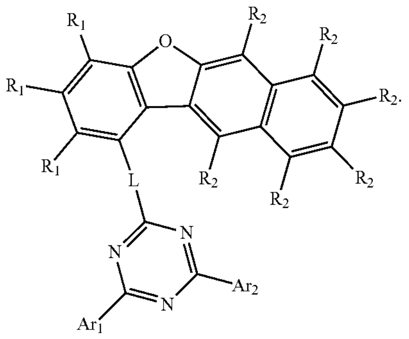

12 Claims, 1 Drawing Sheet

(52) U.S. Cl.
CPC ......... *H10K 85/636* (2023.02); *H10K 85/654* (2023.02); *H10K 85/6572* (2023.02); *H10K 85/6574* (2023.02); *H10K 85/6576* (2023.02); *H10K 2101/90* (2023.02)

(58) Field of Classification Search
CPC ........... H10K 85/6572; H10K 85/6576; H10K 2101/90; H10K 50/11; H10K 85/615; C07D 405/04; C07D 405/10; C07D 405/14
See application file for complete search history.

(56) References Cited

U.S. PATENT DOCUMENTS

| | | | | |
|---|---|---|---|---|
| 2017/0317290 | A1* | 11/2017 | Lee | C07D 409/14 |
| 2017/0317294 | A1* | 11/2017 | Kim | H10K 85/30 |
| 2019/0312215 | A1* | 10/2019 | Kang | H10K 85/6572 |
| 2020/0287140 | A1 | 9/2020 | Chae et al. | |
| 2021/0070706 | A1 | 3/2021 | Lee et al. | |
| 2021/0091314 | A1 | 3/2021 | Shin et al. | |
| 2022/0102646 | A1 | 3/2022 | Kim et al. | |
| 2023/0090185 | A1* | 3/2023 | Park | H10K 85/6576 257/40 |

FOREIGN PATENT DOCUMENTS

| | | | |
|---|---|---|---|
| KR | 10-2017-0101577 | A | 9/2017 |
| KR | 10-2018-0022574 | A | 3/2018 |
| KR | 10-2019-0002206 | A | 1/2019 |
| KR | 10-2019-0013353 | A | 2/2019 |
| KR | 10-2019-0038254 | A | 4/2019 |
| KR | 10-2021294 | B1 | 9/2019 |
| KR | 10-2019-0118403 | A | 10/2019 |
| KR | 10-2020-0079980 | A | 7/2020 |
| KR | 10-2020-0090641 | A | 7/2020 |
| KR | 10-2021-0028500 | A | 3/2021 |
| KR | 10-2263104 | B1 | 6/2021 |
| KR | 10-2339004 | B1 | 12/2021 |
| WO | 2003/012890 | A2 | 2/2003 |
| WO | 2017/150859 | A1 | 9/2017 |
| WO | 2018/038463 | A1 | 3/2018 |
| WO | 2020/116816 | A1 | 6/2020 |
| WO | 2020/153713 | A1 | 7/2020 |

* cited by examiner

COMPOUND AND ORGANIC LIGHT EMITTING DEVICE COMPRISING SAME

CROSS-REFERENCE TO RELATED APPLICATION(S)

This application is a National Stage Application of International Application No. PCT/KR2020/014473, filed on Oct. 22, 2020, which claims priority to Korean Patent Application No. 10-2019-0131710 filed on Oct. 22, 2019 and Korean Patent Application No. 10-2020-0137039 filed on Oct. 21, 2020, the disclosures of which are incorporated herein by reference in their entirety.

FIELD OF DISCLOSURE

The present disclosure relates to a novel compound and an organic light emitting device comprising the same.

BACKGROUND

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, an excellent luminance, driving voltage and response speed, and thus many studies have proceeded.

The organic light emitting device generally has a structure which comprises an anode, a cathode, and an organic material layer interposed between the anode and the cathode. The organic material layer frequently has a multilayered structure that comprises different materials in order to enhance efficiency and stability of the organic light emitting device, and for example, the organic material layer may be formed of a hole injection layer, a hole transport layer, a light emitting layer, an electron transport layer, an electron injection layer and the like. In the structure of the organic light emitting device, if a voltage is applied between two electrodes, the holes are injected from an anode into the organic material layer and the electrons are injected from the cathode into the organic material layer, and when the injected holes and electrons meet each other, an exciton is formed, and light is emitted when the exciton falls to a ground state again.

There is a continuing need for the development of new materials for the organic materials used in the organic light emitting devices as described above.

RELATED ARTS

Patent Literature (Patent Literature 0001) Korean Unexamined Patent Publication No. 10-2000-0051826

SUMMARY

It is an object of the present disclosure to provide a novel compound and an organic light emitting device comprising the same.

Provided herein is a compound represented by the following Chemical Formula 1:

[Chemical Formula 1]

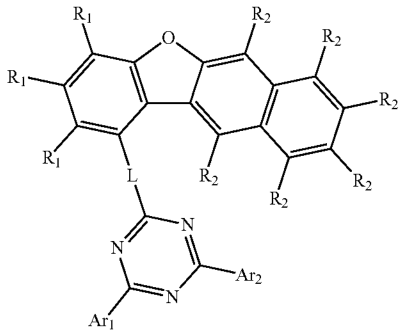

in Chemical Formula 1,

L is a single bond, or a substituted or unsubstituted $C_{6-60}$ arylene, one of $R_1$ is $Ar_3$ and the others are independently hydrogen or deuterium, $Ar_1$ to $Ar_3$ are each independently a substituted or unsubstituted $C_{6-60}$ aryl, or a substituted or unsubstituted $C_{5-60}$ heteroaryl containing any one or more heteroatom selected from the group consisting of N, O and S, and each $R_2$ is independently hydrogen or deuterium.

Also provided herein is an organic light emitting device comprising: a first electrode; a second electrode that is provided opposite to the first electrode; and one or more organic material layers that are provided between the first electrode and the second electrode, wherein one or more layers of the organic material layers include the compound represented by Chemical Formula 1.

Advantageous Effects

The above-mentioned compound represented by Chemical Formula 1 can be used as a material of an organic material layer of an organic light emitting device, and can improve the efficiency, achieve low driving voltage and/or improve lifetime characteristics in the organic light emitting device.

In particular, the compound represented by Chemical Formula 1 described above may be used as hole injection, hole transport, hole injection and transport, light emission, electron transport, or electron injection materials.

DETAILED DESCRIPTION OF THE EMBODIMENTS

Figure 1:
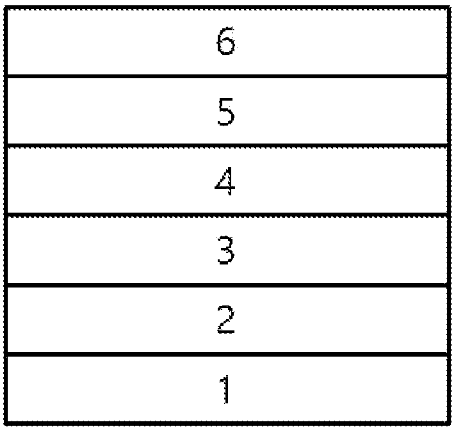
FIG. 1 shows an example of an organic light emitting device comprising a substrate 1, an anode 2, a hole transport layer 3, a light emitting layer 4, an electron injection and transport layer 5, and a cathode 6.

Hereinafter, embodiments of the present disclosure will be described in more detail to facilitate understanding of the invention.

DEFINITION OF TERMS

As used herein, the notation

and  mean a bond linked to another substituent group.

As used herein, the term "substituted or unsubstituted" means being unsubstituted or substituted with one or more substituents selected from the group consisting of deuterium; a halogen group; a cyano group; a nitro group; a hydroxy group; a carbonyl group; an ester group; an imide group; an amino group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkylamine group; an aralkylamine group; a heteroarylamine group; an arylamine group; an arylphosphine group; and a heteroaryl group containing at least one of N, O and S atoms, or being unsubstituted or substituted with a substituent to which two or more substituents of the above-exemplified substituents are connected. For example, "a substituent in which two or more substituents are connected" may be a biphenyl group. Namely, a biphenyl group may be an aryl group, or it may also be interpreted as a substituent in which two phenyl groups are connected.

In the present disclosure, the carbon number of a carbonyl group is not particularly limited, but is preferably 1 to 40. Specifically, the carbonyl group may be a compound having the following structural formulas, but is not limited thereto.

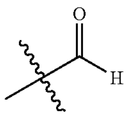 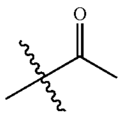 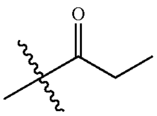

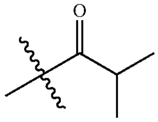 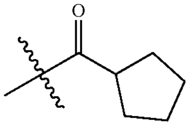

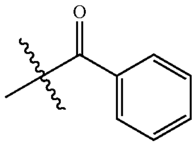 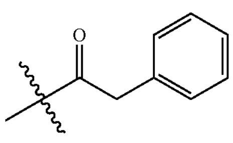

In the present disclosure, an ester group may have a structure in which oxygen of the ester group may be substituted by a straight-chain, branched-chain, or cyclic alkyl group having 1 to 25 carbon atoms, or an aryl group having 6 to 25 carbon atoms. Specifically, the ester group may be a compound having the following structural formulas, but is not limited thereto.

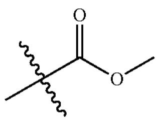 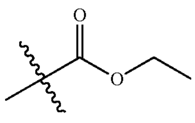

-continued

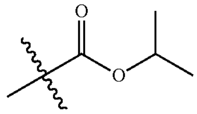 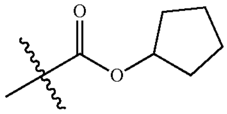

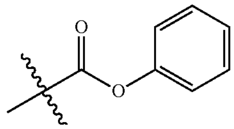 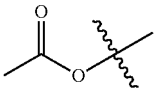

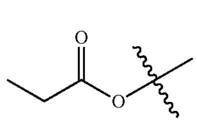 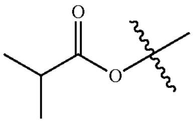

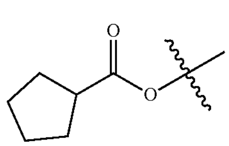 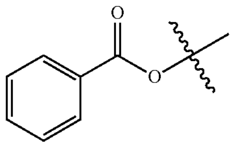

In the present disclosure, the carbon number of an imide group is not particularly limited, but is preferably 1 to 25. Specifically, the imide group may be a compound having the following structural formulas, but is not limited thereto.

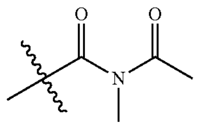 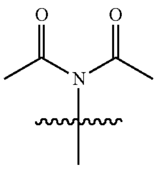

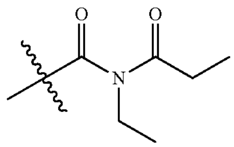 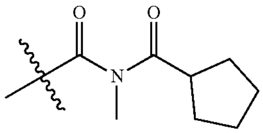

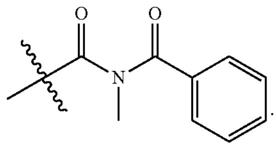.

In the present disclosure, a silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but is not limited thereto.

In the present disclosure, a boron group specifically includes a trimethylboron group, a triethylboron group, a t-butyldimethylboron group, a triphenylboron group, and a phenylboron group, but is not limited thereto.

In the present disclosure, examples of a halogen group include fluorine, chlorine, bromine, or iodine.

In the present disclosure, the alkyl group may be straight-chain or branched-chain, and the carbon number thereof is not particularly limited, but is preferably 1 to 40. According to one embodiment, the carbon number of the alkyl group is 1 to 20. According to another embodiment, the carbon number of the alkyl group is 1 to 10. According to another embodiment, the carbon number of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methyl-hexyl, and the like, but are not limited thereto.

In the present disclosure, the alkenyl group may be straight-chain or branched-chain, and the carbon number thereof is not particularly limited, but is preferably 2 to 40. According to one embodiment, the carbon number of the alkenyl group is 2 to 20. According to another embodiment, the carbon number of the alkenyl group is 2 to 10. According to still another embodiment, the carbon number of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present disclosure, a cycloalkyl group is not particularly limited, but the carbon number thereof is preferably 3 to 60. According to one embodiment, the carbon number of the cycloalkyl group is 3 to 30. According to another embodiment, the carbon number of the cycloalkyl group is 3 to 20. According to still another embodiment, the carbon number of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present disclosure, an aryl group is not particularly limited, but the carbon number thereof is preferably 6 to 60, and it may be a monocyclic aryl group or a polycyclic aryl group having an aromaticity. According to one embodiment, the carbon number of the aryl group is 6 to 30. According to one embodiment, the carbon number of the aryl group is 6 to 20. The aryl group may be a phenyl group, a biphenyl group, a terphenyl group or the like as the monocyclic aryl group, but is not limited thereto. The polycyclic aryl group includes a naphthyl group, an anthracenyl group, a phenanthrenyl group, a triphenylenyl group, a pyrenyl group, a perylenyl group, a chrysenyl group, or the like, but is not limited thereto.

In the present disclosure, a heteroaryl group is a heteroaryl group containing one or more of O, N, Si and S as a heteroatom, and the carbon number thereof is not particularly limited, but is preferably 2 to 60. Examples of the heteroaryl group include a thiophene group, a furan group, a pyrrole group, an imidazole group, a thiazole group, an oxazole group, an oxadiazol group, a triazole group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzoimidazole group, a benzothiazol group, a benzocarbazole group, a benzothiophene group, a dibenzothiophene group, a benzofuranyl group, a phenanthroline group, an isoxazolyl group, a thiadiazolyl group, a phenothiazinyl group, a dibenzofuranyl group, and the like, but are not limited thereto.

In the present disclosure, the aryl group in the aralkyl group, the aralkenyl group, the alkylaryl group, the arylamine group and the arylsily group is the same as the aforementioned examples of the aryl group. In the present disclosure, the alkyl group in the aralkyl group, the alkylaryl group and the alkylamine group is the same as the aforementioned examples of the alkyl group. In the present disclosure, the heteroaryl in the heteroarylamine can be applied to the aforementioned description of the heteroaryl group. In the present disclosure, the alkenyl group in the aralkenyl group is the same as the aforementioned examples of the alkenyl group. In the present disclosure, the aforementioned description of the aryl group may be applied except that the arylene is a divalent group. In the present disclosure, the aforementioned description of the heteroaryl group can be applied except that the heteroarylene is a divalent group. In the present disclosure, the aforementioned description of the aryl group or cycloalkyl group can be applied except that the hydrocarbon ring is not a monovalent group but formed by combining two substituent groups. In the present disclosure, the aforementioned description of the heteroaryl group can be applied, except that the heterocyclic group is not a monovalent group but formed by combining two substituent groups.

Compound

The present disclosure provides the compound represented by Chemical Formula 1.

Specifically, the compound represented by Chemical Formula 1 has a structure in which 1,3,5-triazine is a core, and three different substituents are bonded thereto.

More specifically, the three different substituents bonded to the core are a substituted or unsubstituted $C_{10-60}$ aryl ($Ar_1$), a substituted or unsubstituted $C_{5-60}$ heteroaryl ($Ar_2$), and a substituted benzo[b]naphtho[2,3-d]furanyl.

Here, $Ar_1$ and $Ar_2$ are each single-bonded to the core, but the substituted benzo[b]naphtho[2,3-d]furanyl may be single-bonded to the core or bonded via a linking group (L).

On the other hand, the substituted benzo[b]naphtho[2,3-d]furanyl is one in which any one of $R_1$ is replaced with a substituted or unsubstituted $C_{10-60}$ aryl, or is replaced with a substituted or unsubstituted $C_{5-60}$ heteroaryl ($Ar_3$).

The organic light emitting device including the compound represented by Chemical Formula 1 as a component of the organic material layer may exhibit high efficiency and long lifetime characteristics as a synergistic effect resulting from a combination of the three different substituents.

Hereinafter, the Chemical Formula 1 and the compound represented by Chemical Formula 1 are described in detail as follows.

Preferably, the Chemical Formula 1 is represented by any one of the following Chemical Formulas 1-1 to 1-3:

[Chemical Formula 1-1]

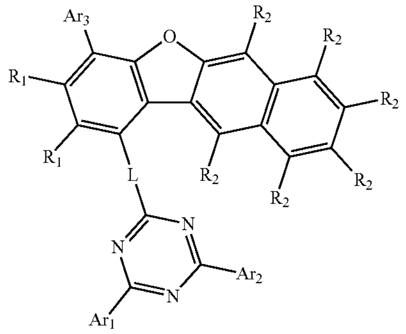

[Chemical Formula 1-2]

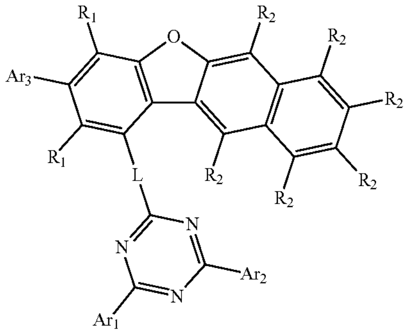

[Chemical Formula 1-3]

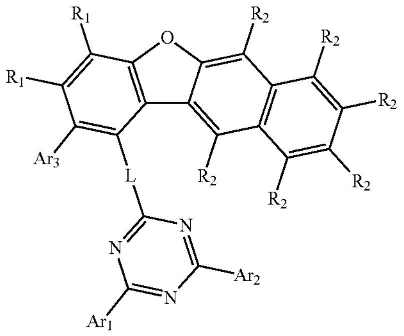

in Chemical Formulas 1-1 to 1-3, $Ar_1$ to $Ar_3$, $R_1$ and $R_2$ are the same as defined above.

Preferably, all of $R_2$ are hydrogen.

Preferably, L is a single bond, phenylene, or naphthalenediyl.

Preferably, $Ar_1$ and $Ar_2$ are each independently phenyl, biphenylyl, naphthyl, dibenzofuranyl, dibenzothiophenyl, or phenanthrenyl; and the $Ar_1$ and $Ar_2$ are each independently unsubstituted or substituted with at least one phenyl or naphthyl.

Preferably, $Ar_3$ is phenyl, biphenylyl, terphenylyl, naphthyl, dibenzofuranyl, dibenzothiophenyl, or phenanthrenyl; and the $Ar_3$ is unsubstituted or substituted with at least one phenyl.

Representative examples of the compound represented by Chemical Formula 1 are as follows:

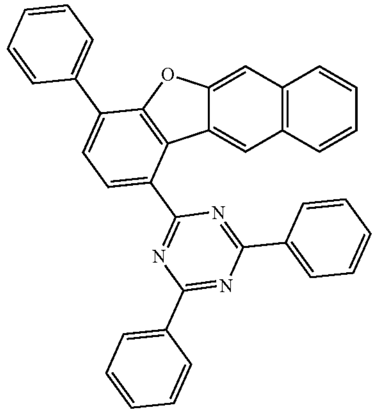

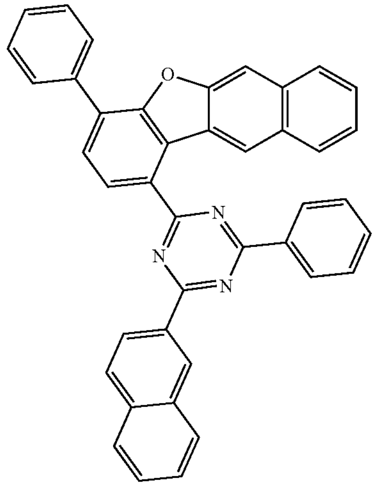

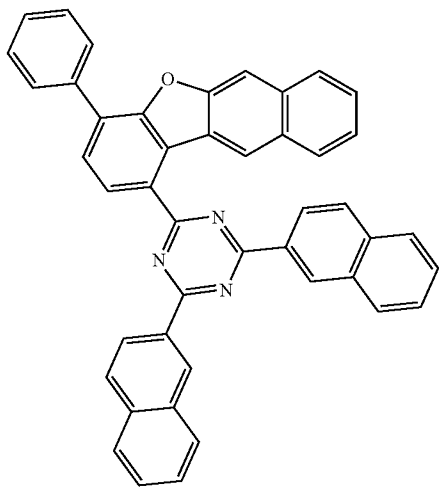

-continued
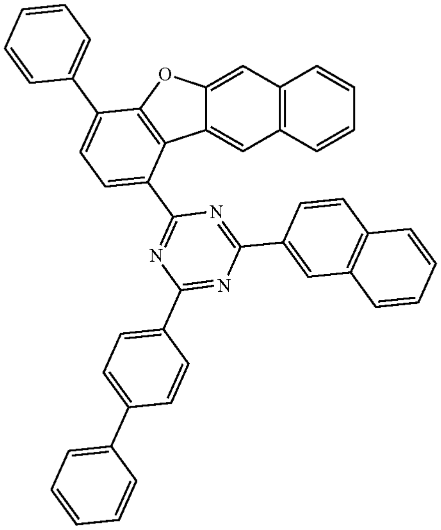
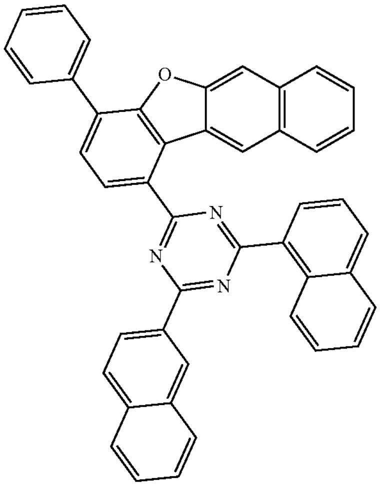
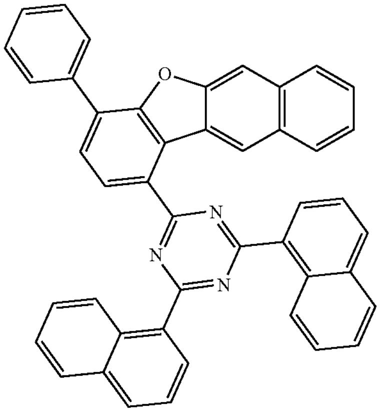
-continued
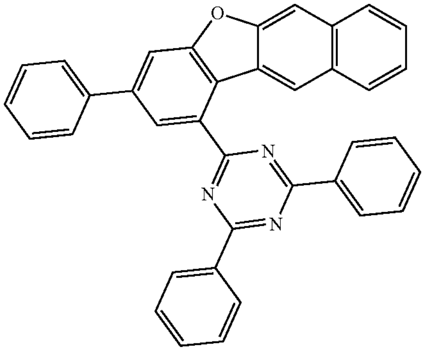
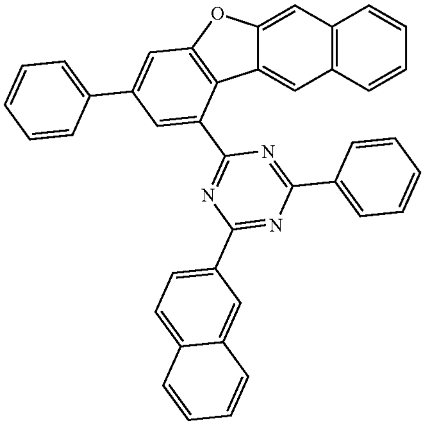
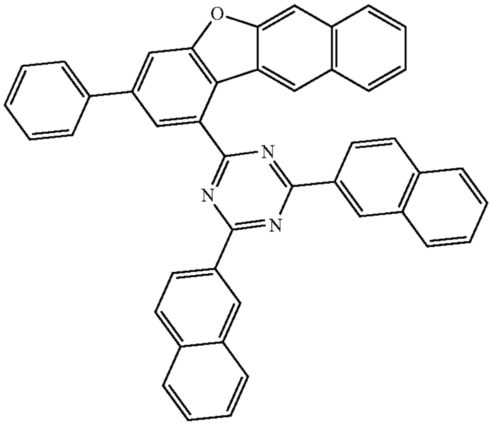
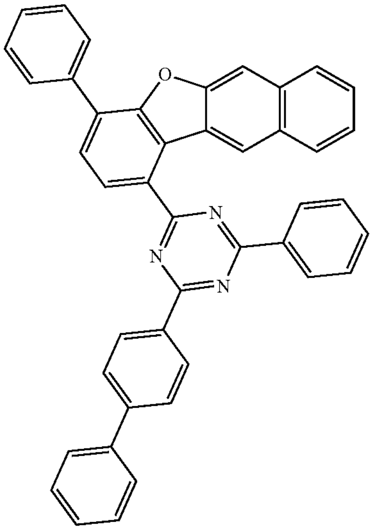

-continued
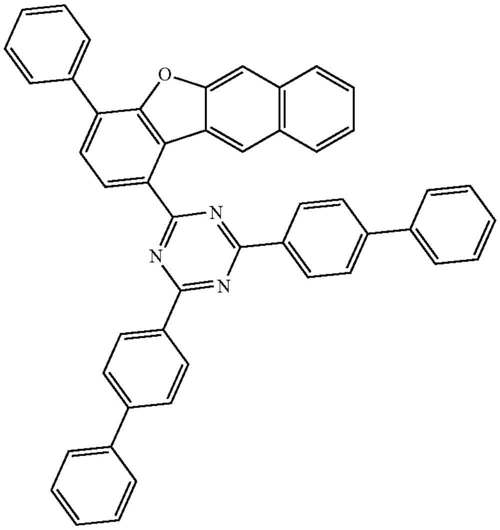
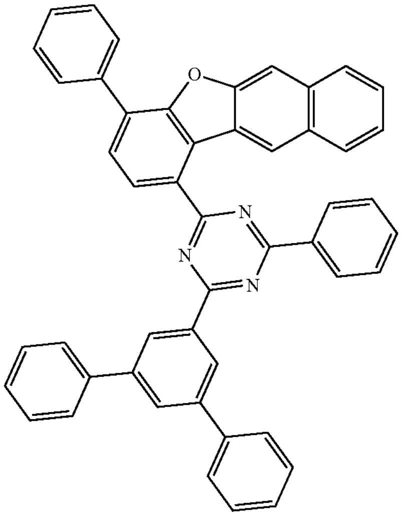
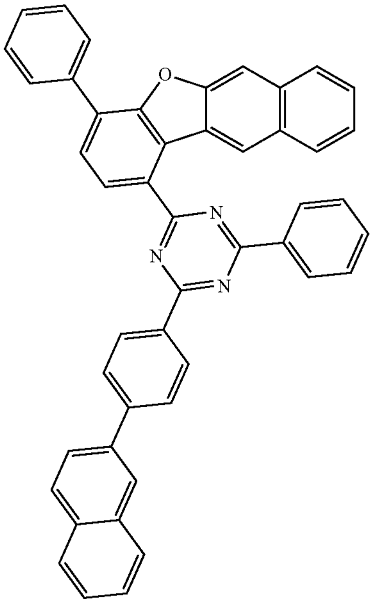
-continued
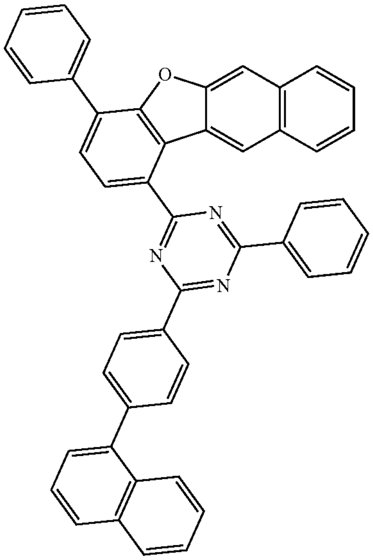
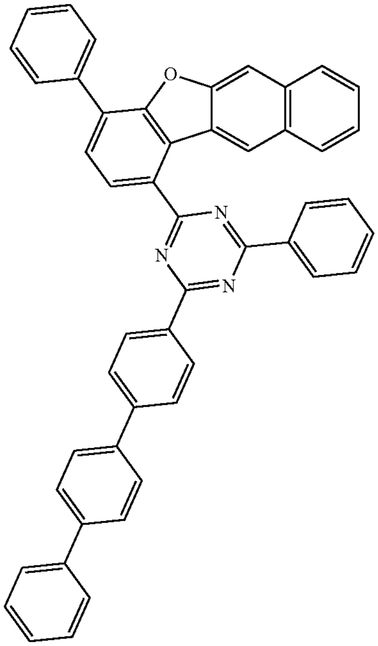
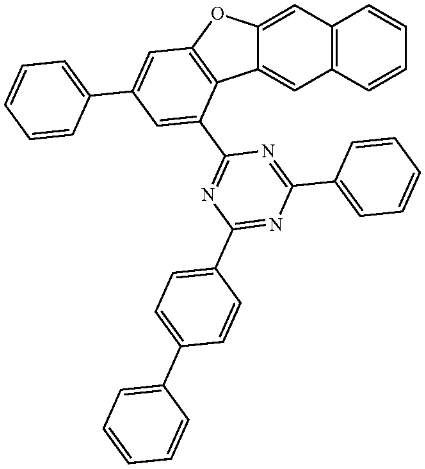

-continued
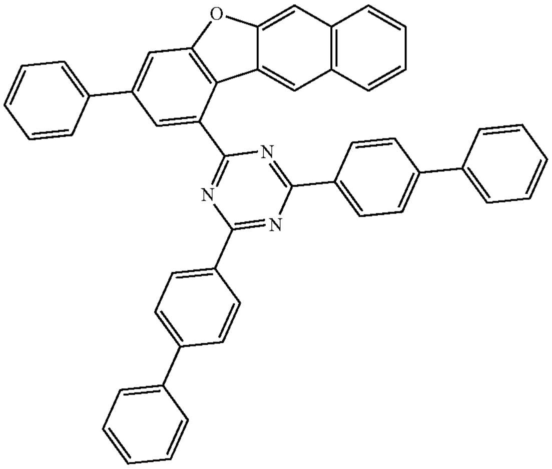
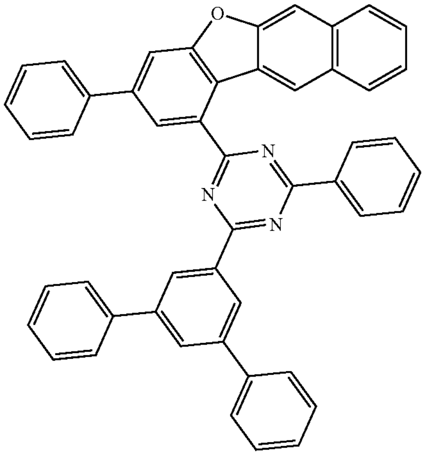
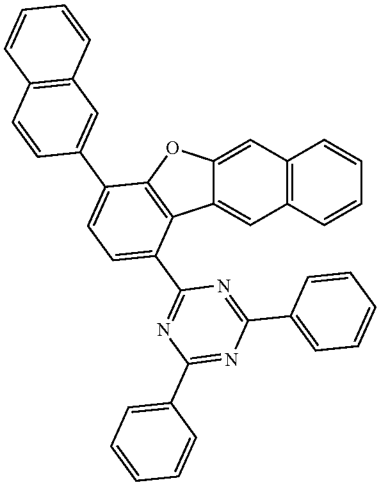
-continued
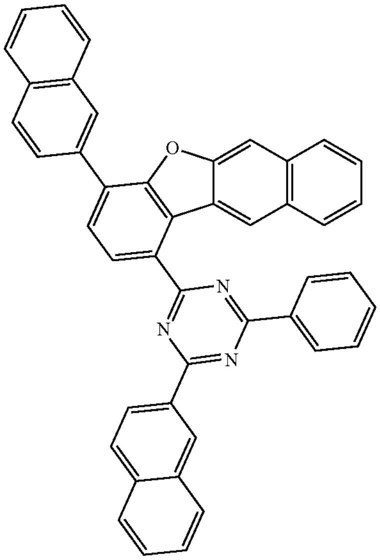
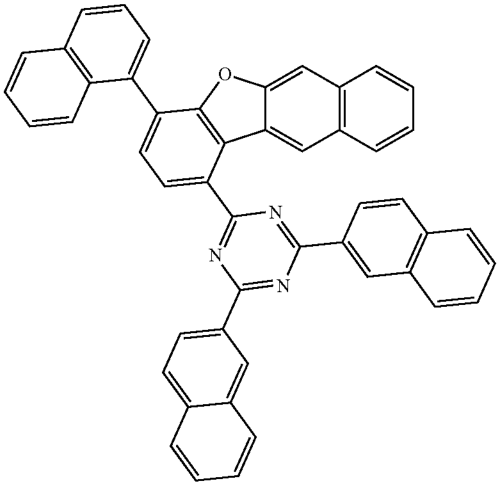
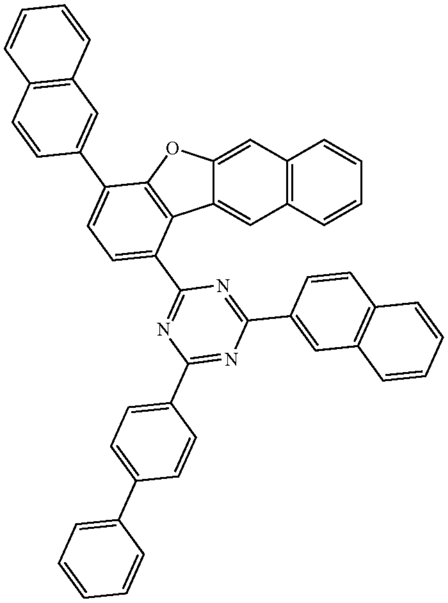

-continued
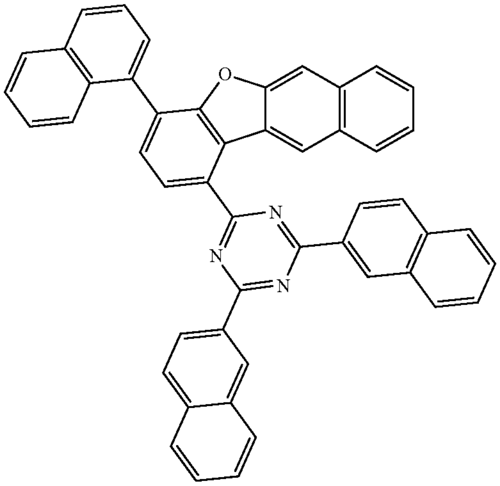
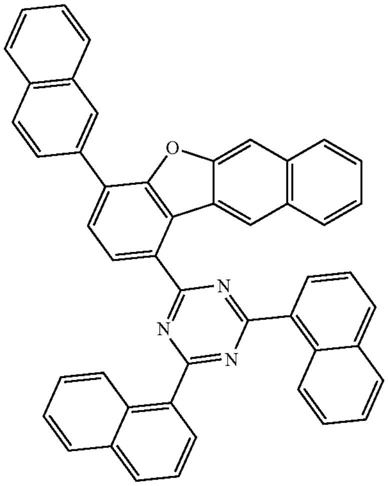
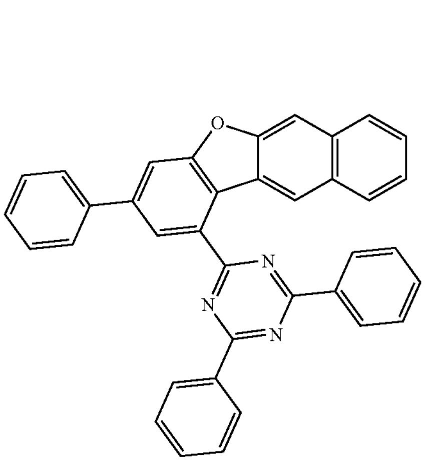
-continued
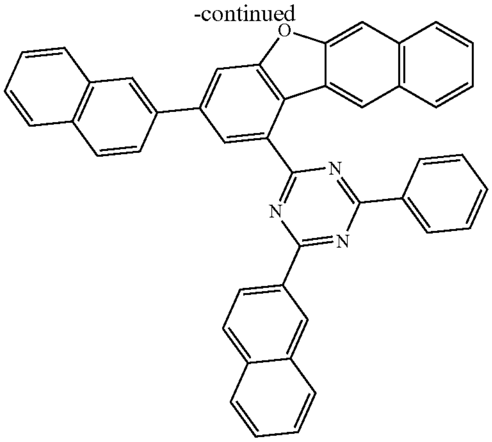
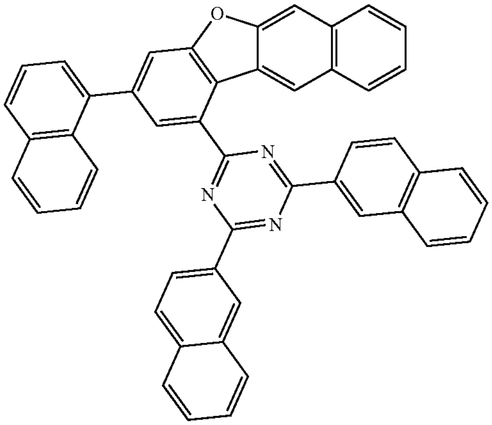
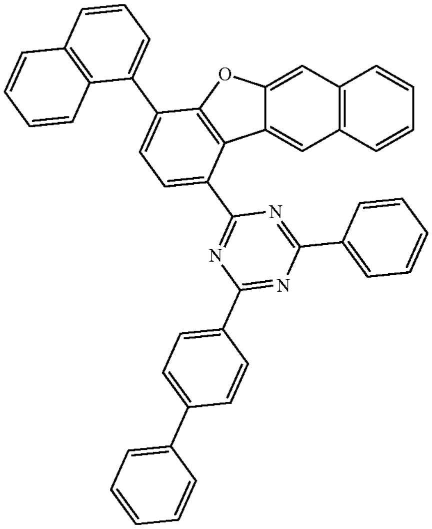

-continued
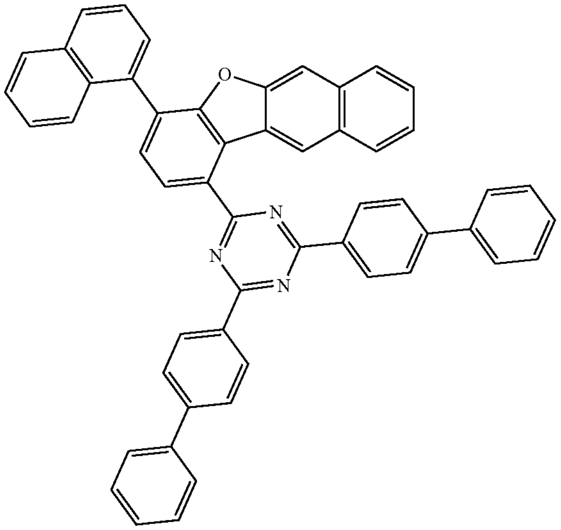
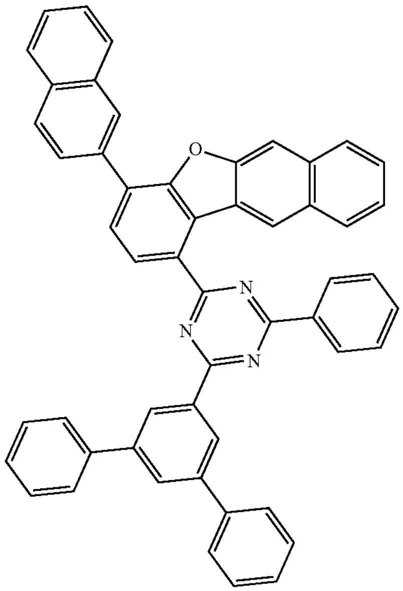
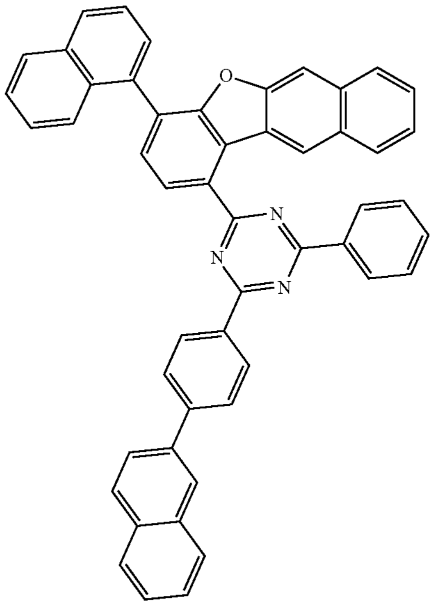
-continued
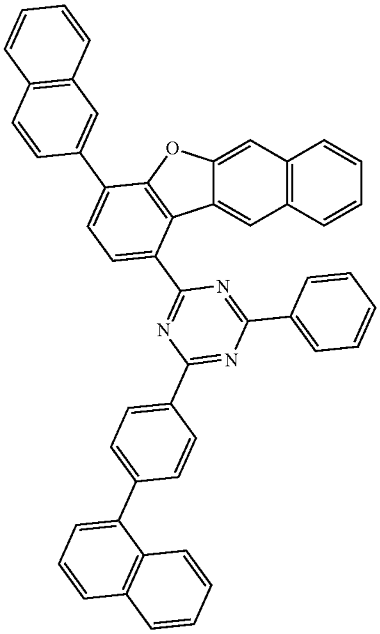
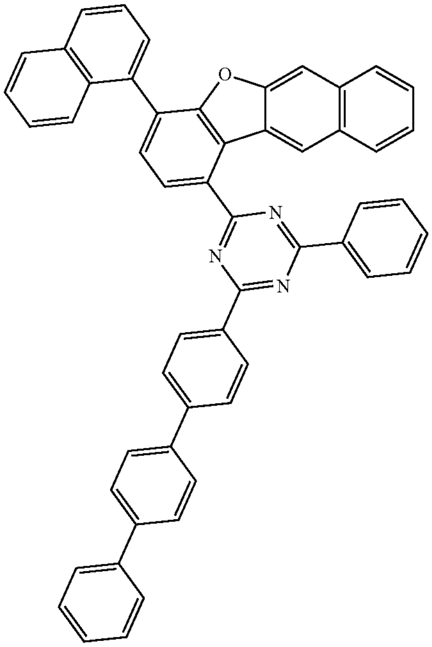

-continued
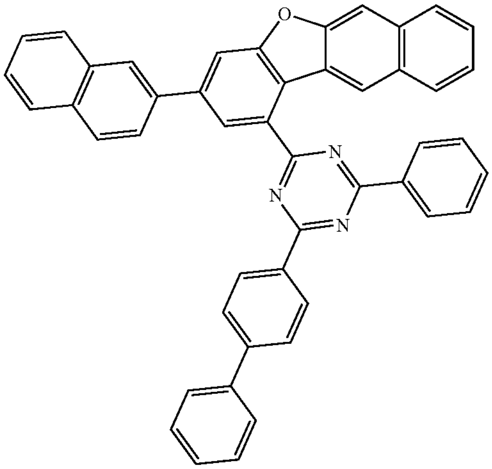
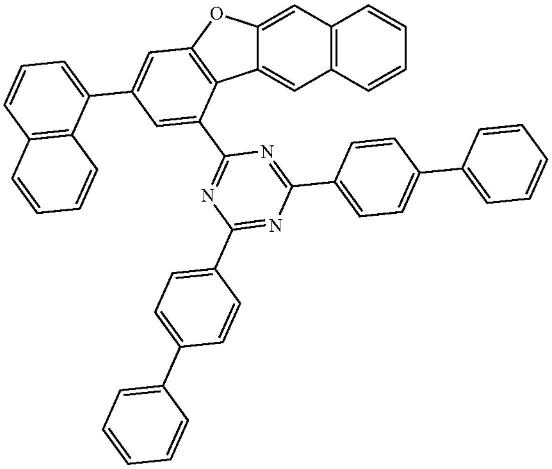
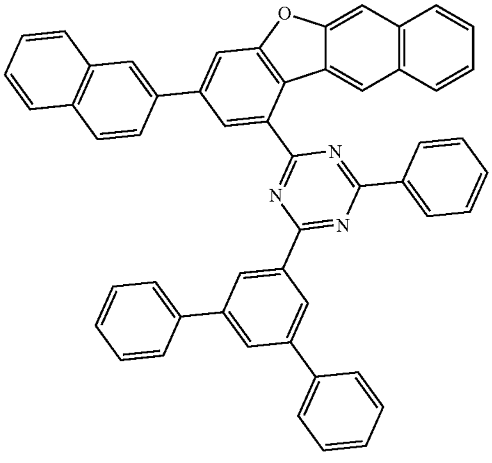
-continued
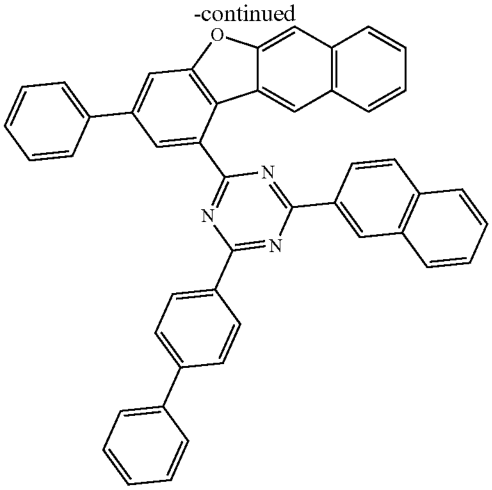
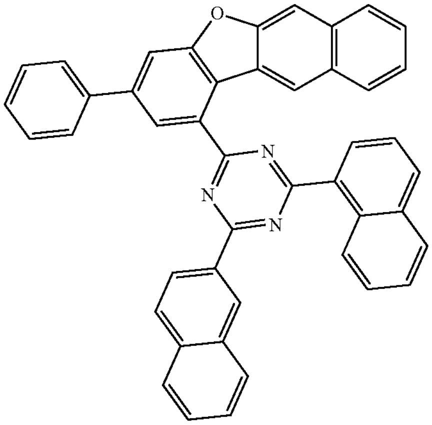
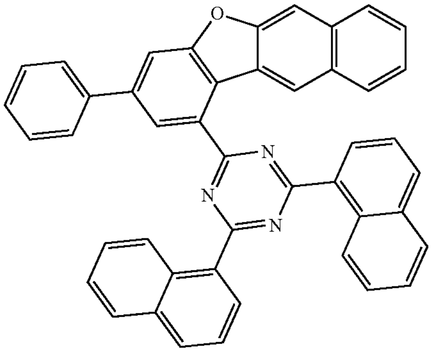
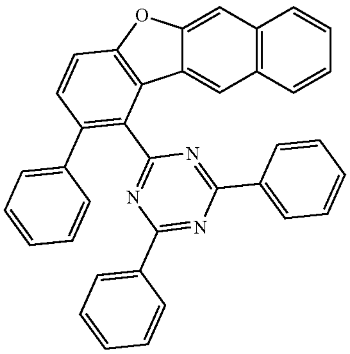

-continued
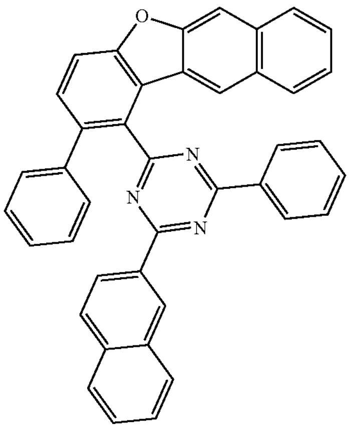
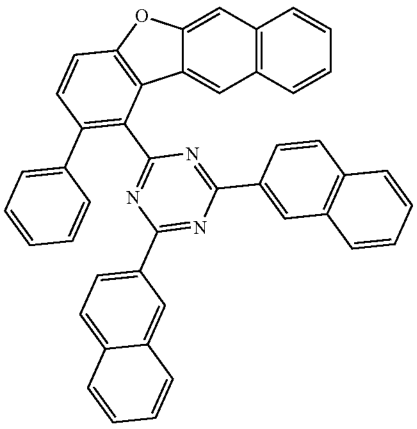
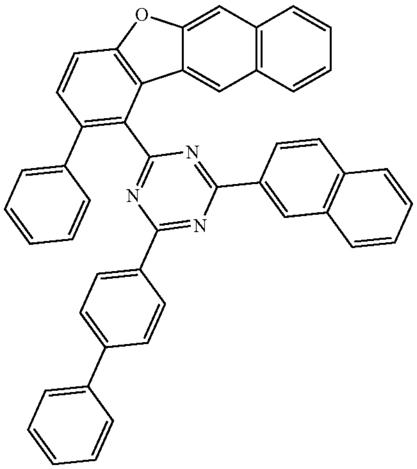
-continued
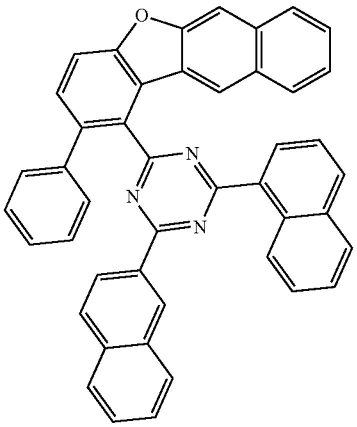
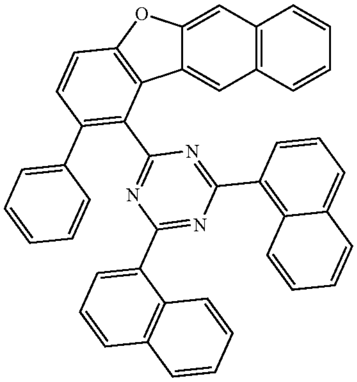
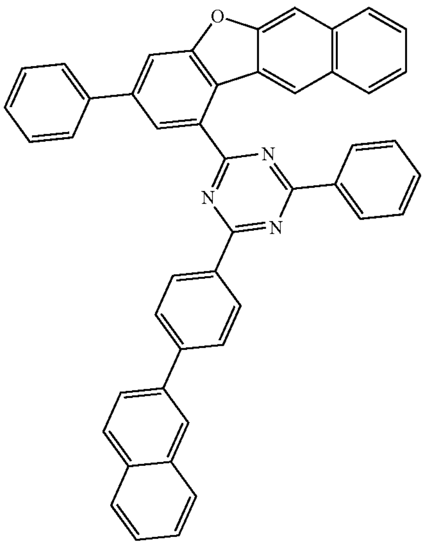

-continued
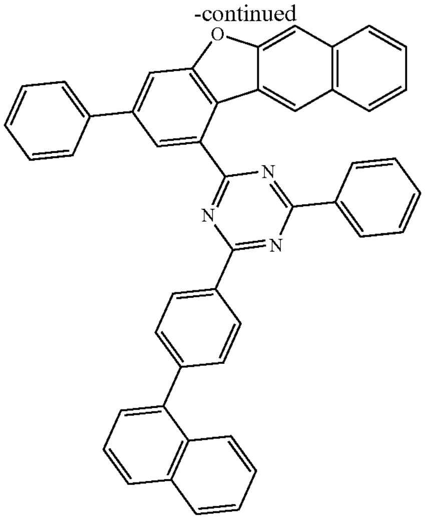
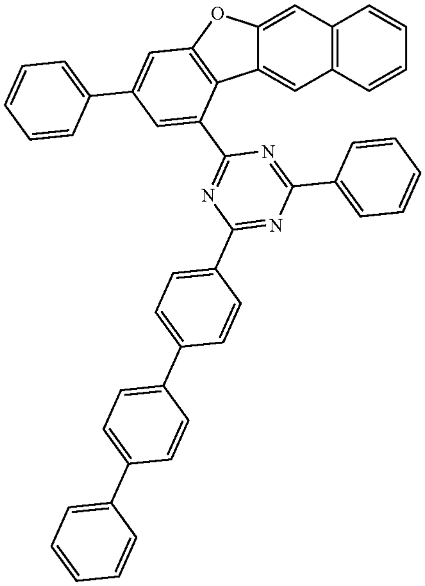
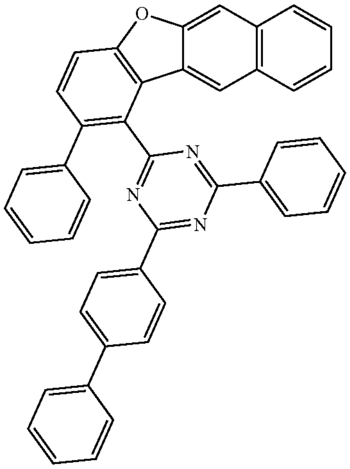
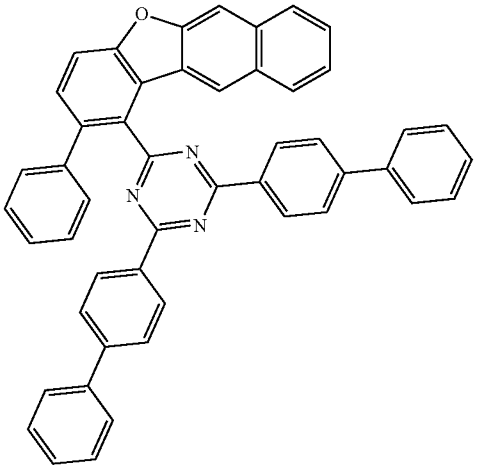
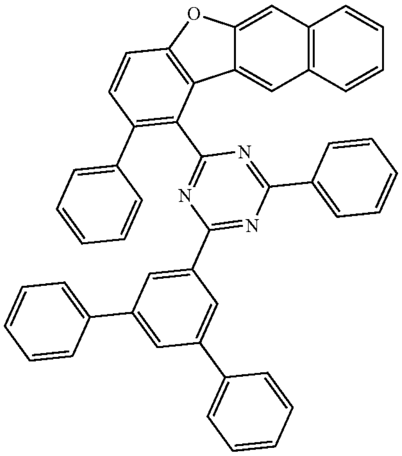
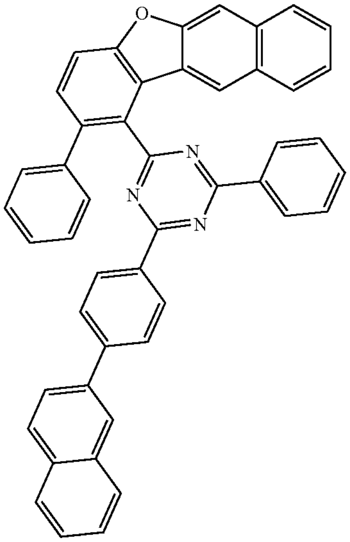

-continued
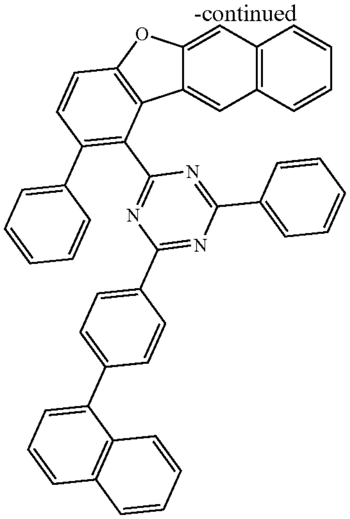
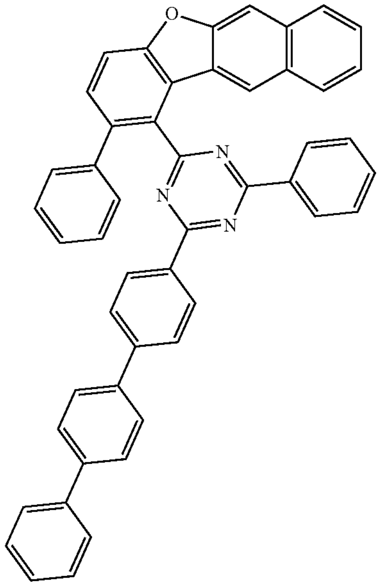
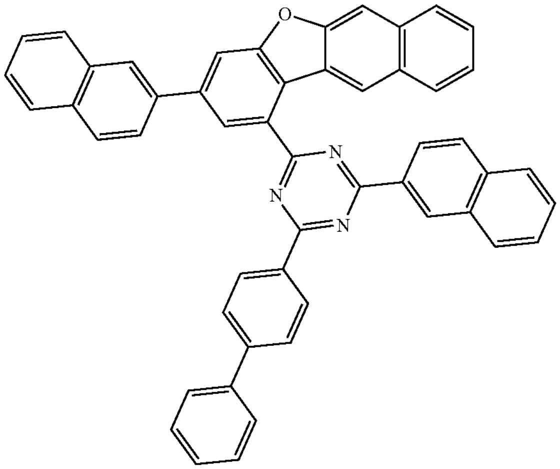
-continued
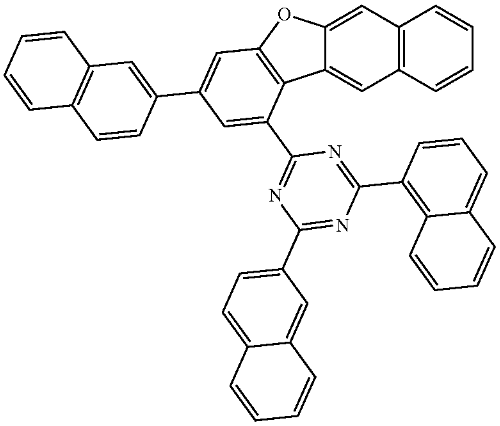
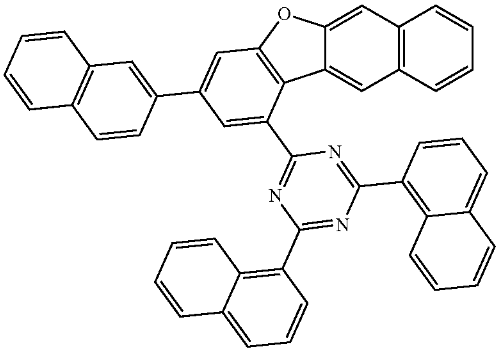
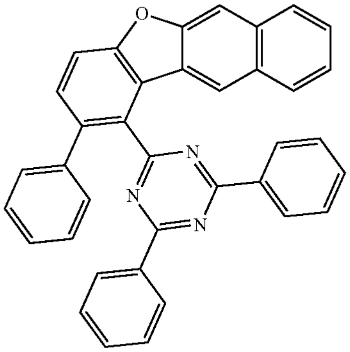
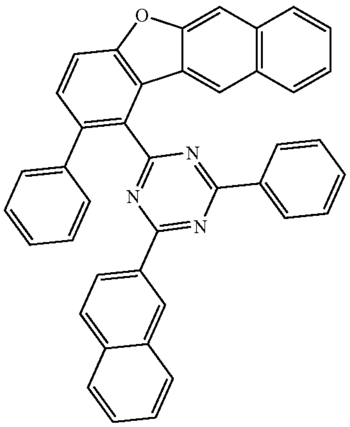

-continued
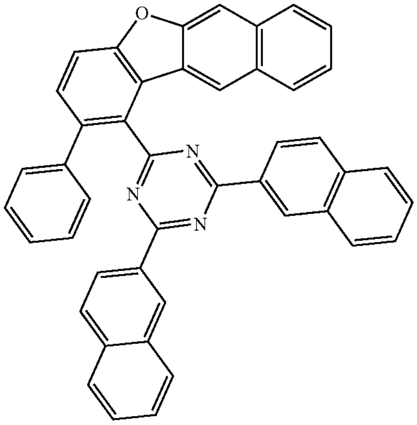
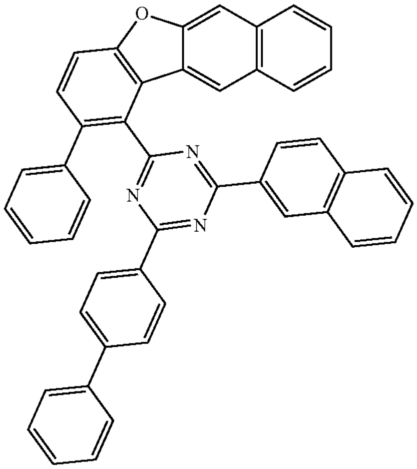
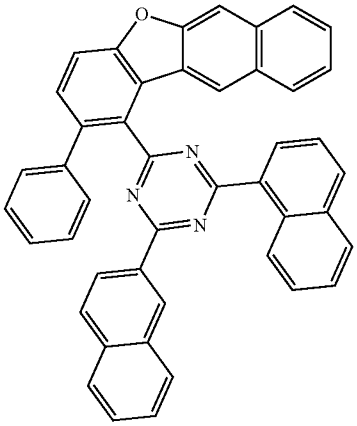
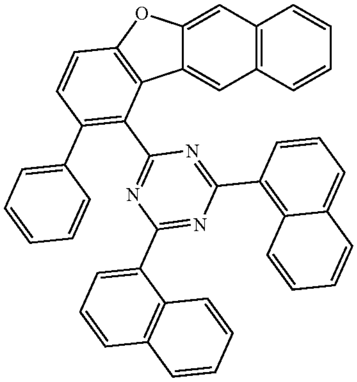
-continued
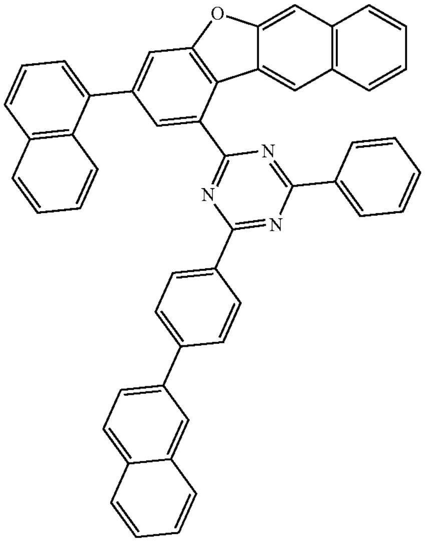
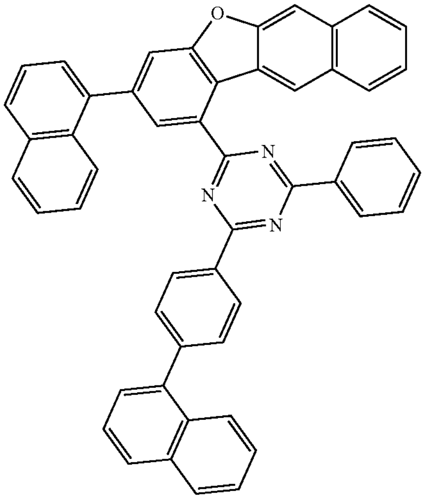
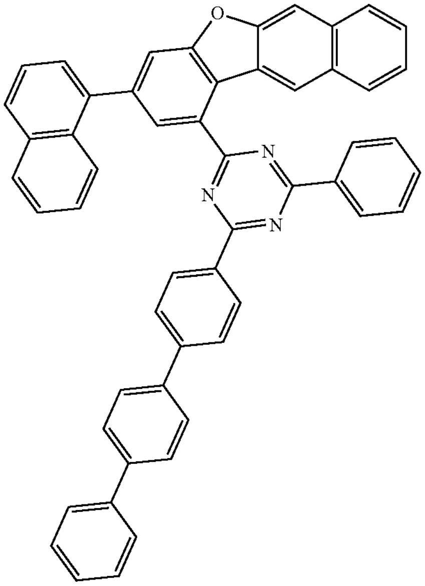

-continued
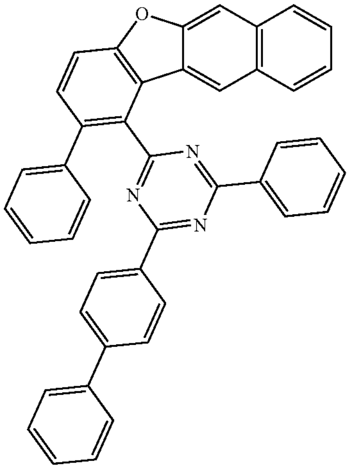
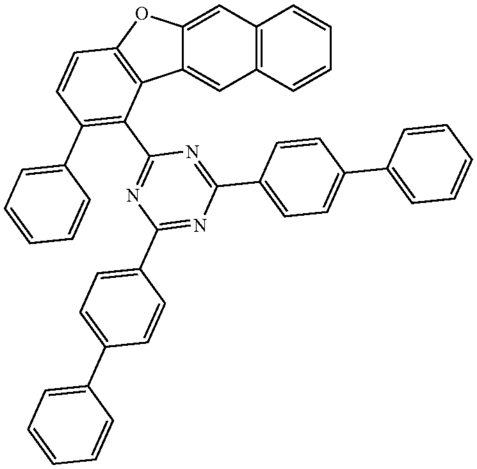
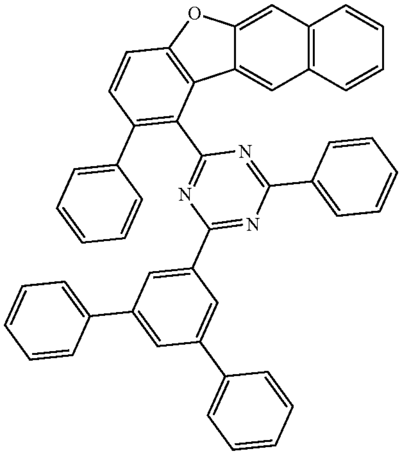
-continued
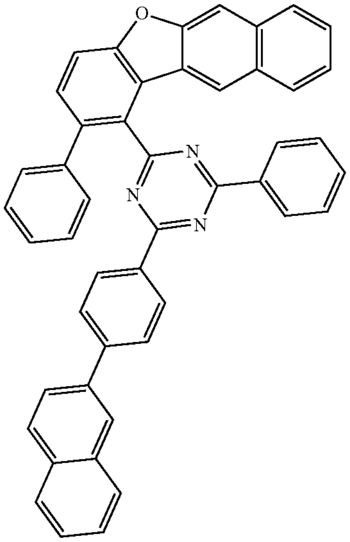
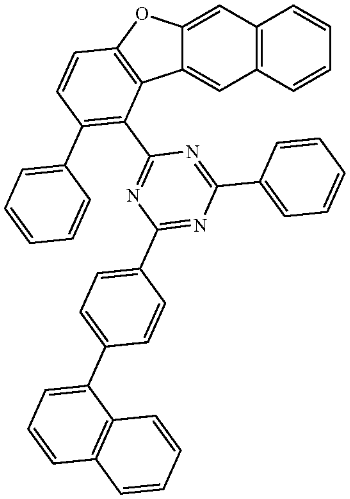
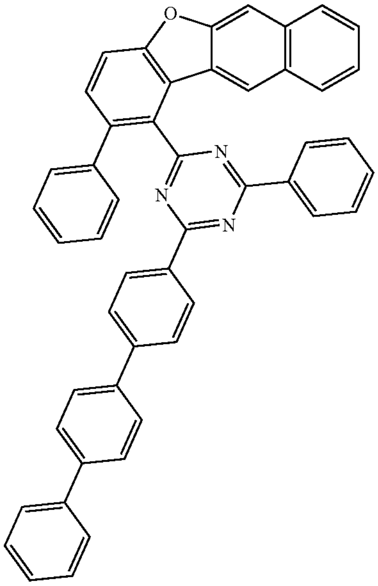

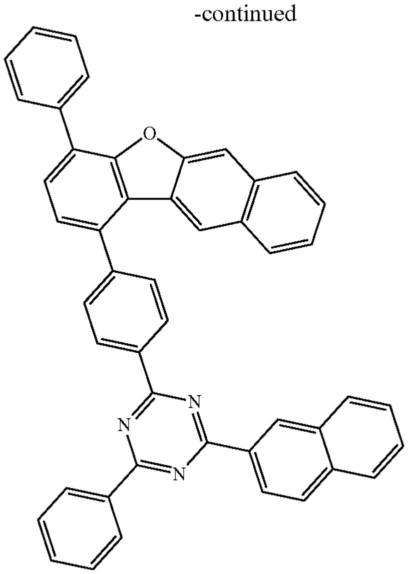
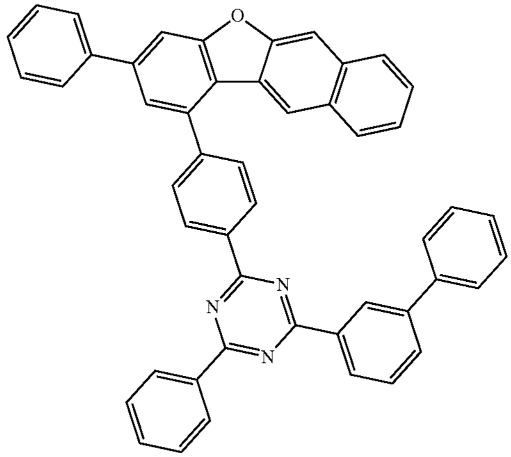
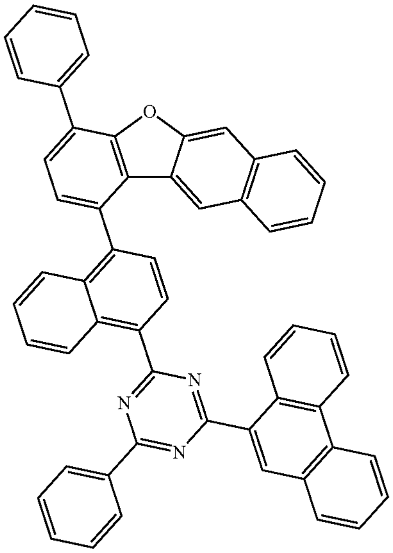
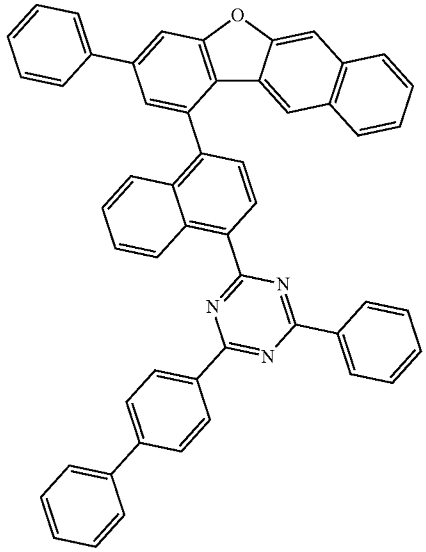
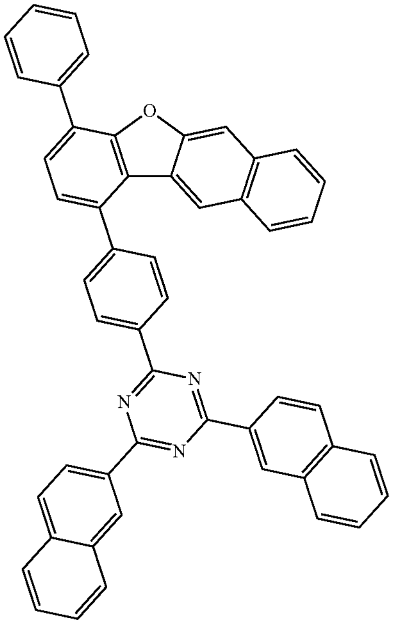
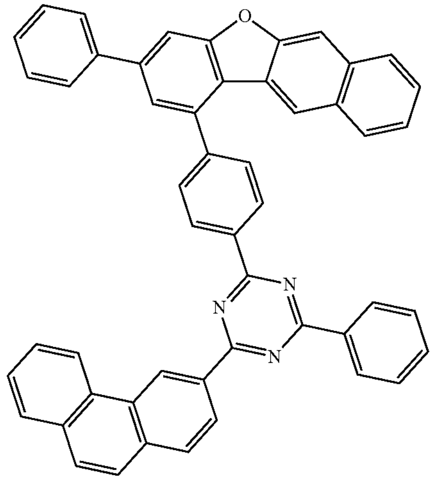

-continued
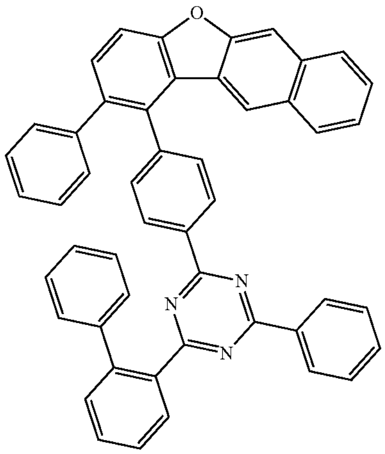
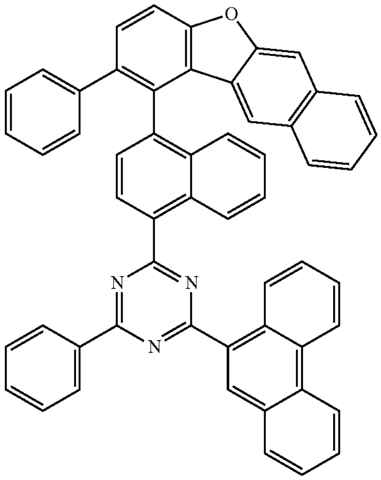
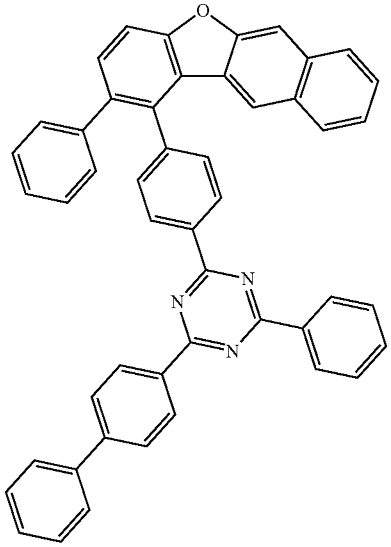
-continued
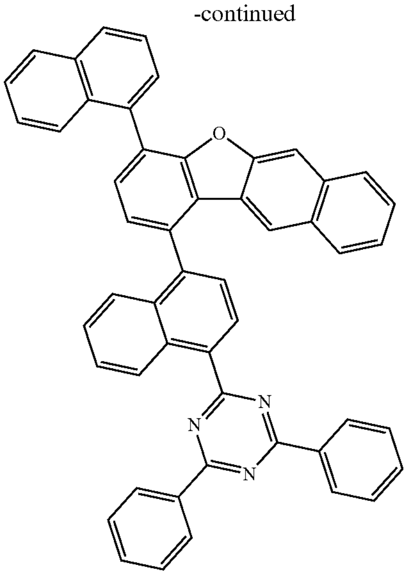
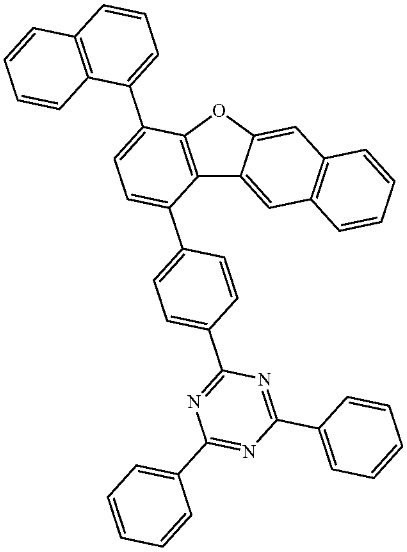
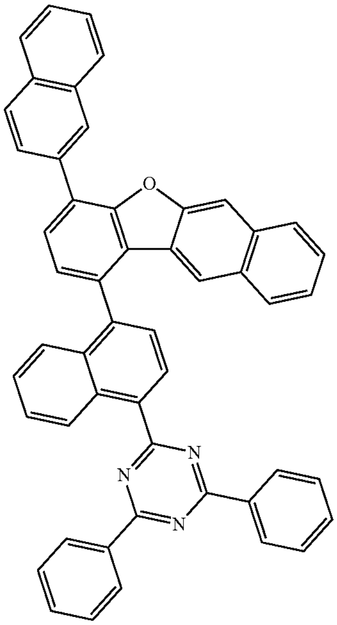

-continued
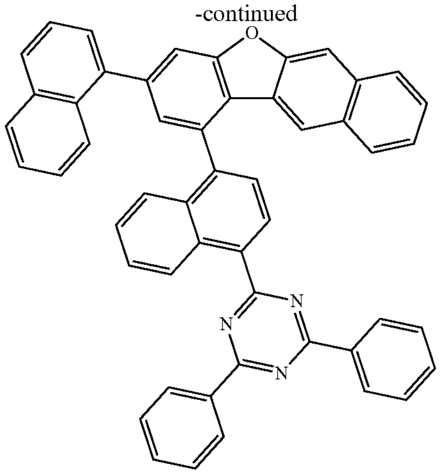
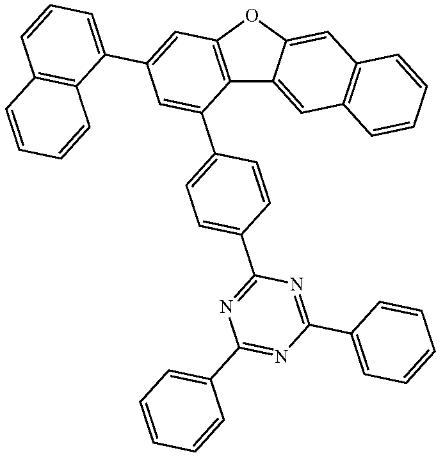
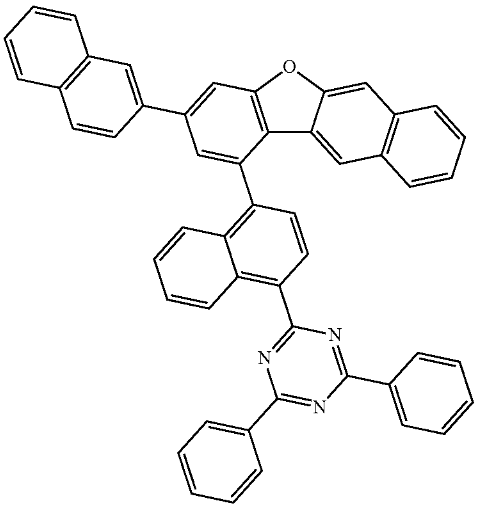
-continued
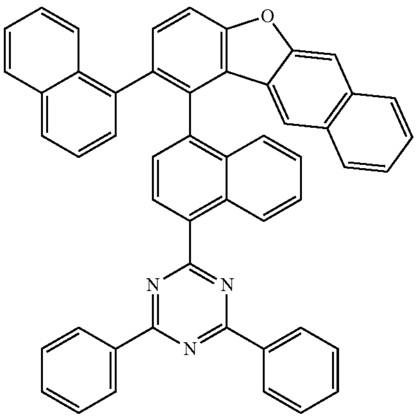
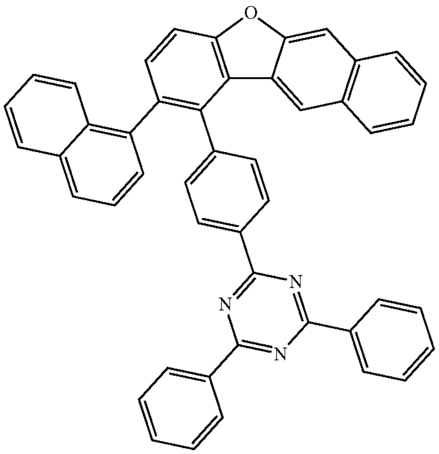
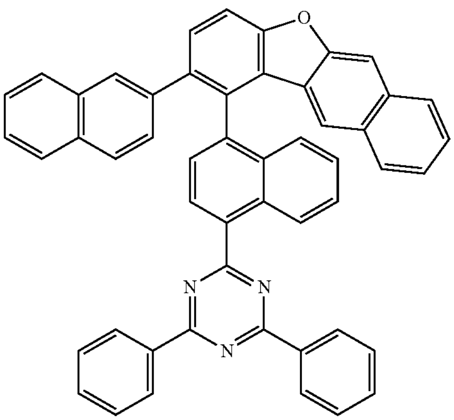

-continued
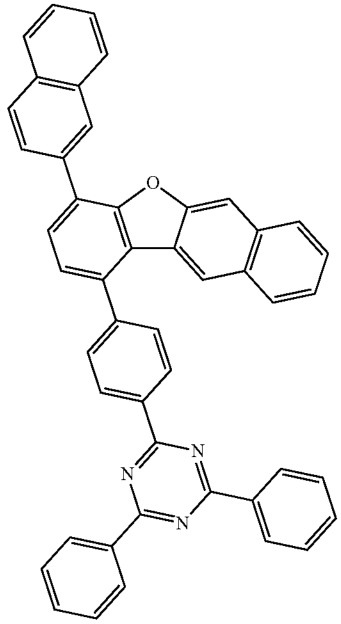
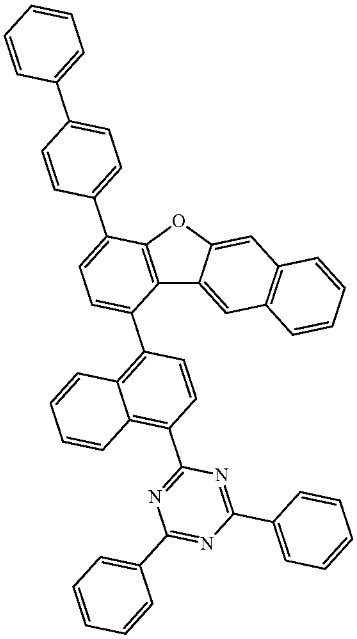
-continued
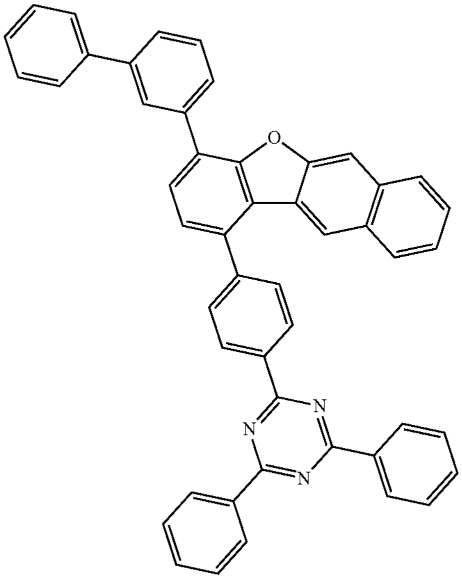
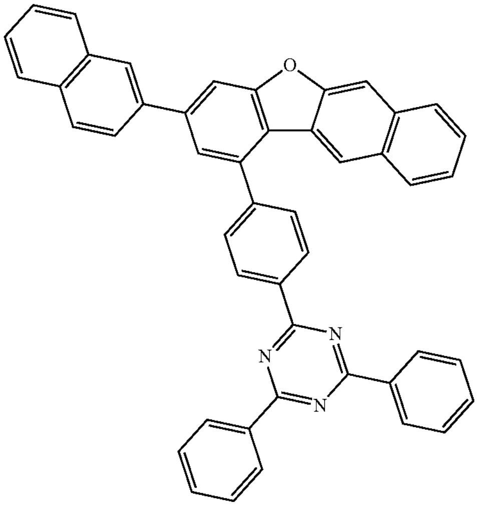
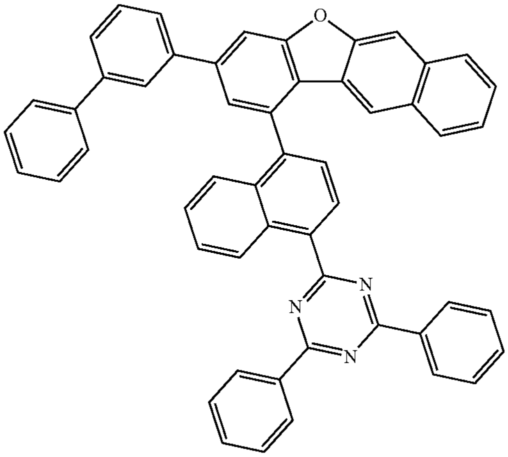

-continued
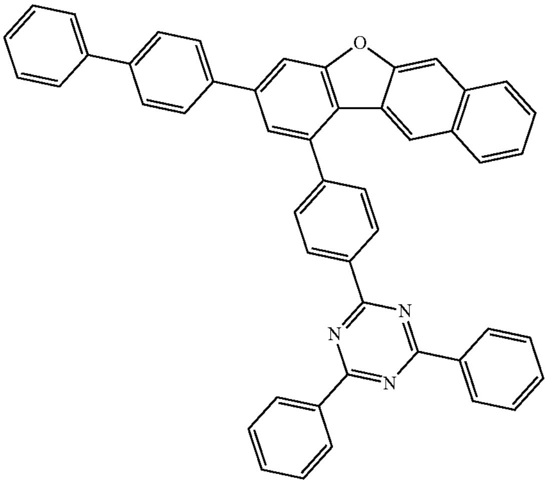
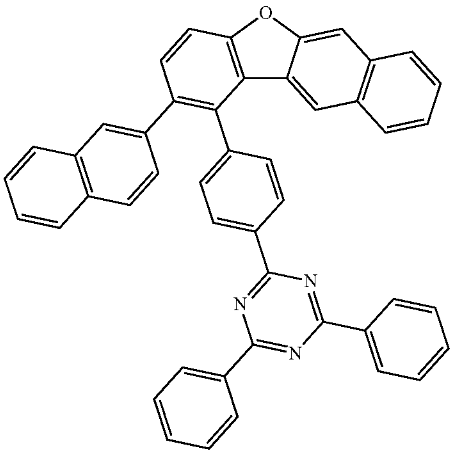
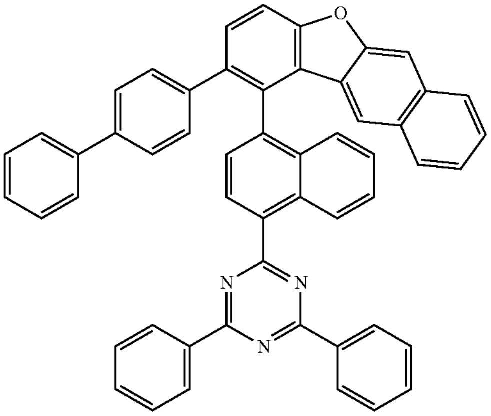
-continued
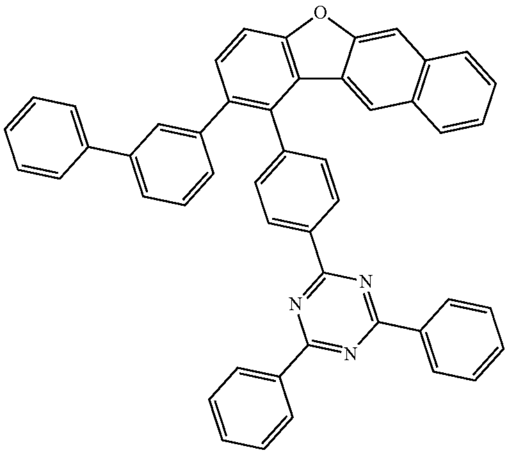
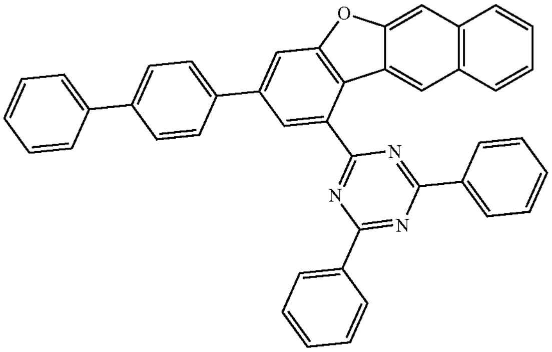
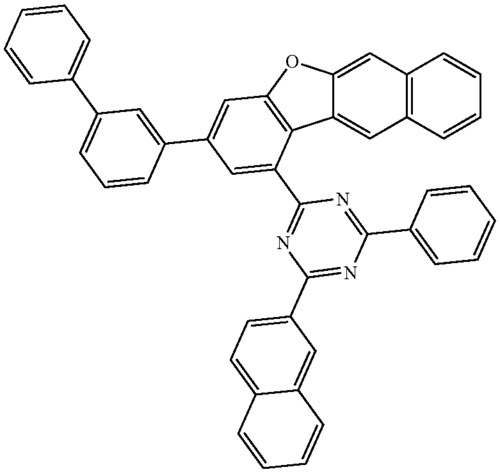

-continued
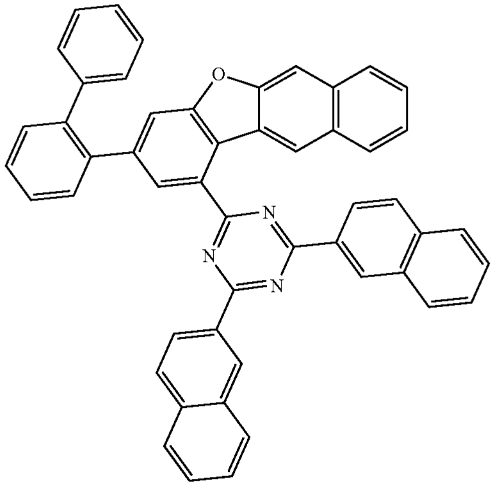
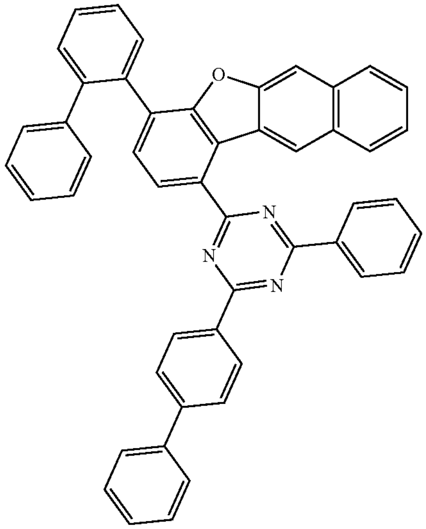
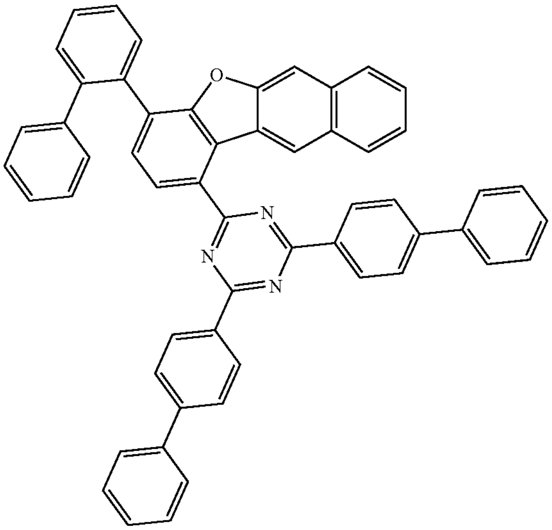
-continued
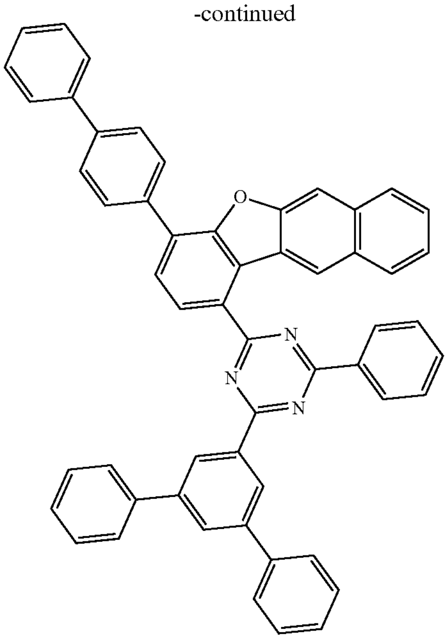
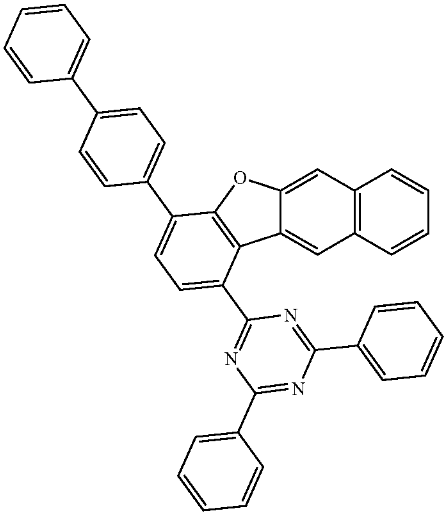
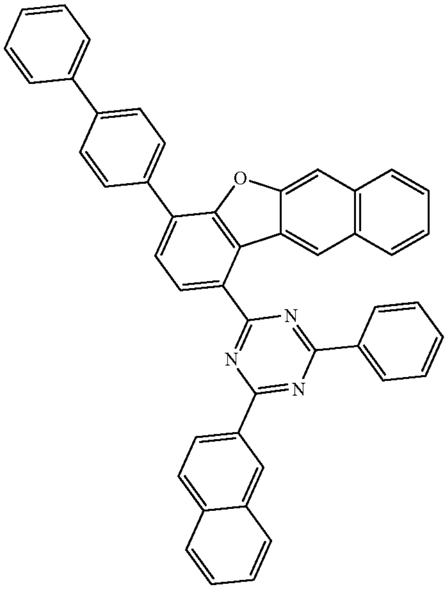

-continued
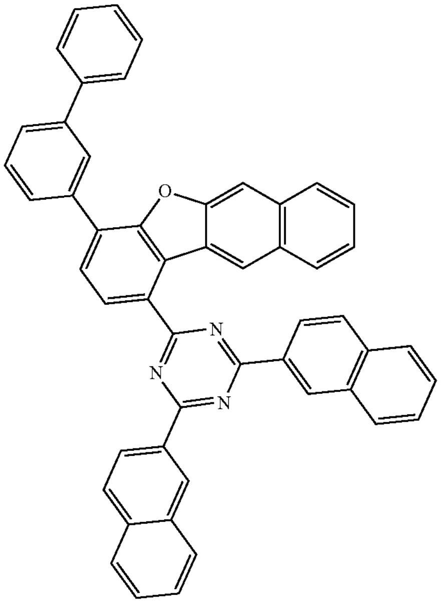
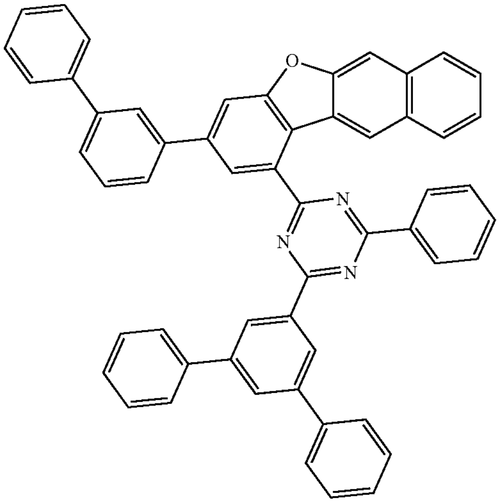
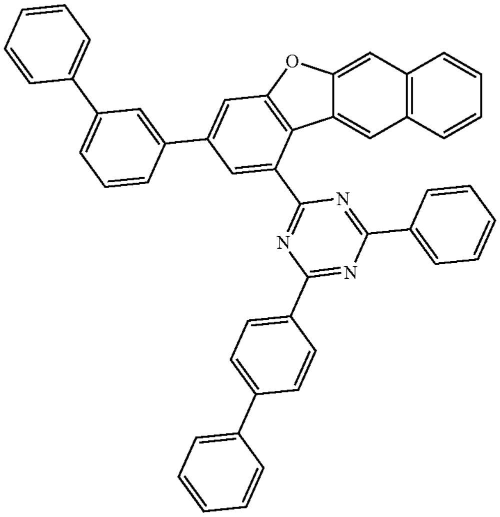
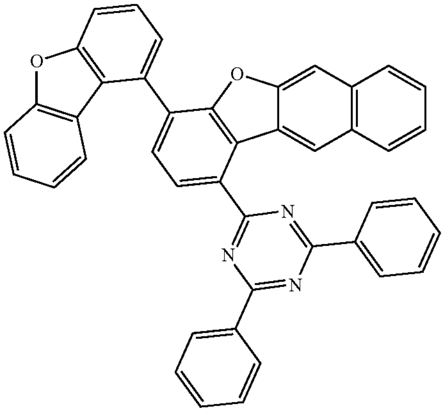
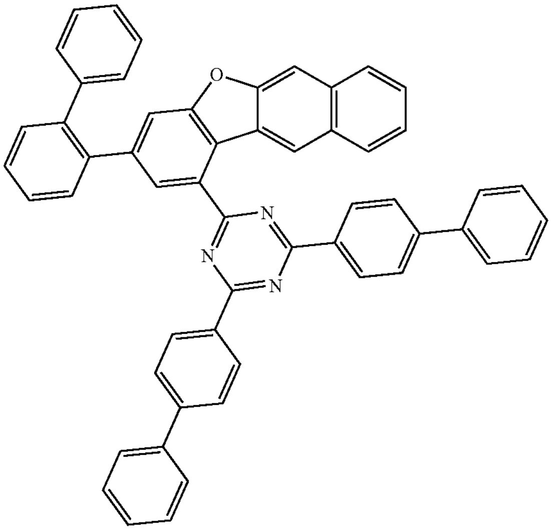
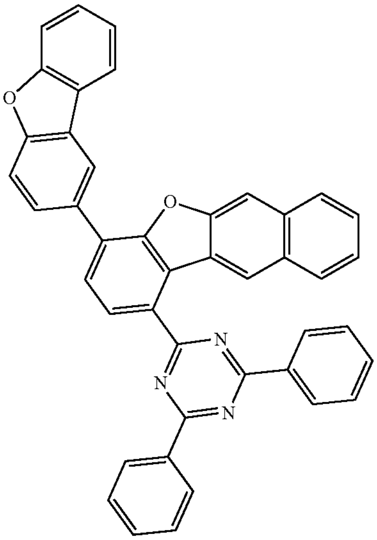

-continued
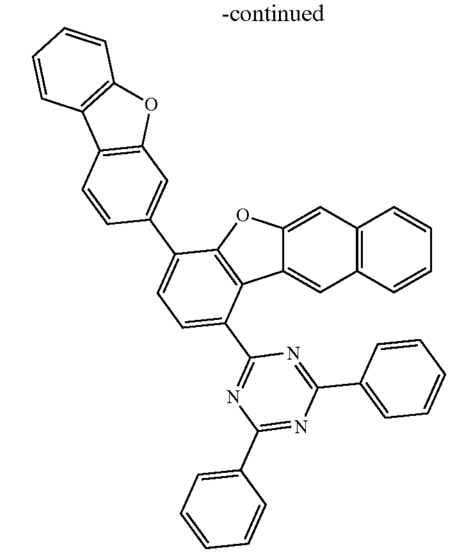
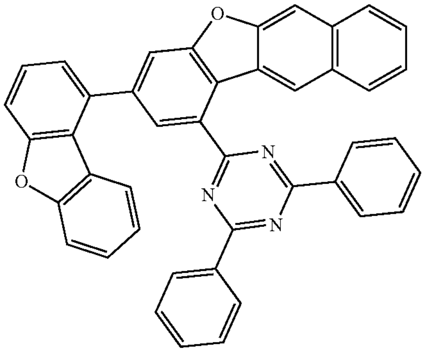
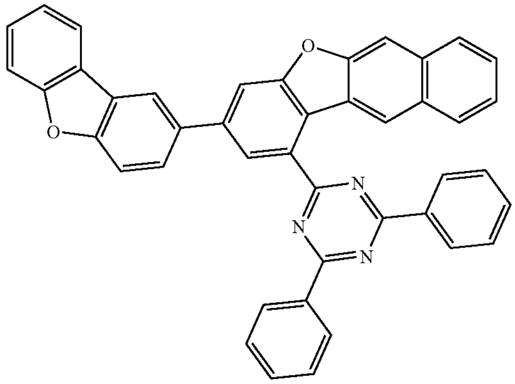
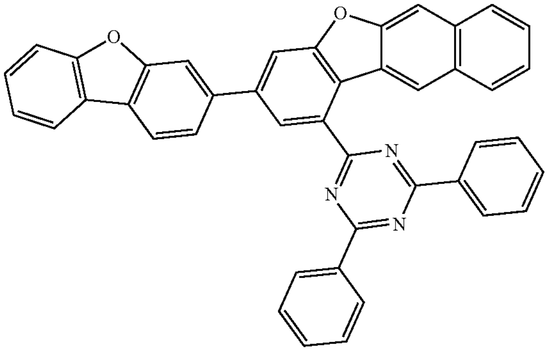
-continued
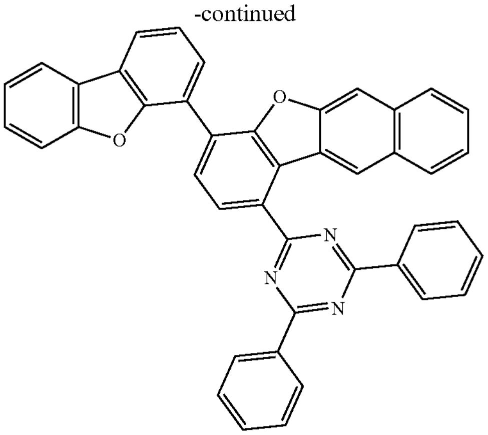
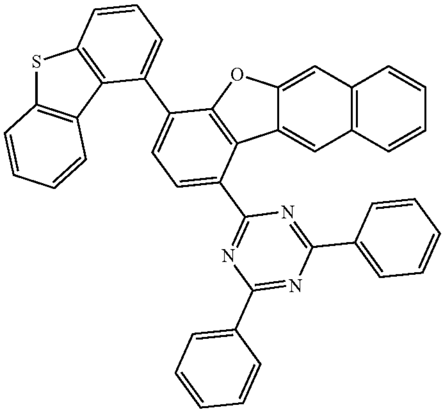
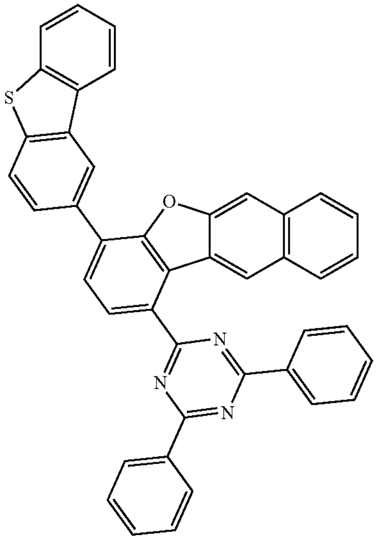
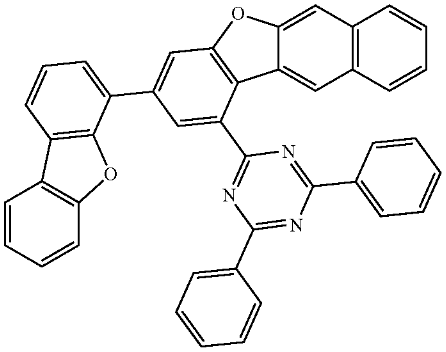

-continued
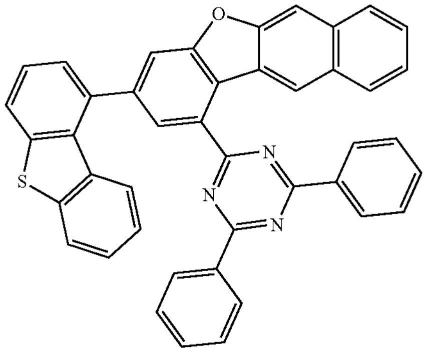
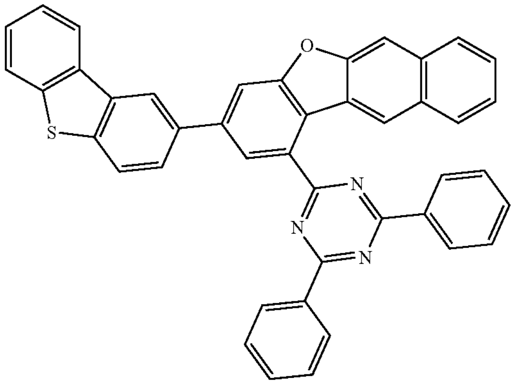
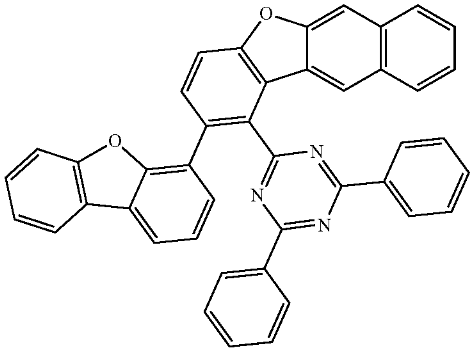
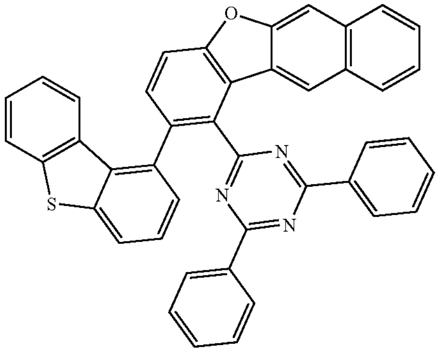
-continued
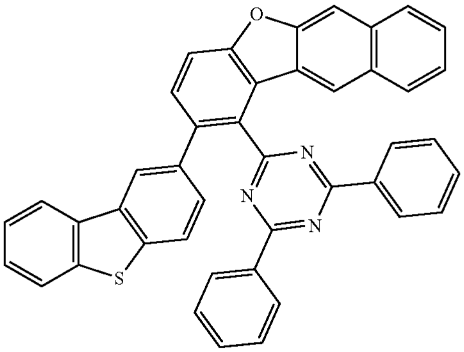
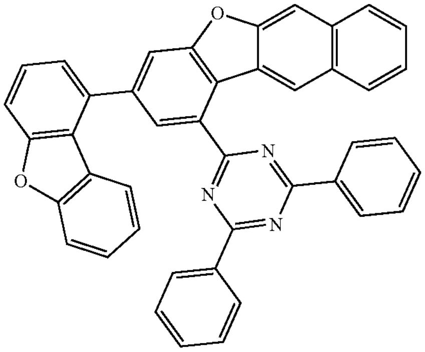
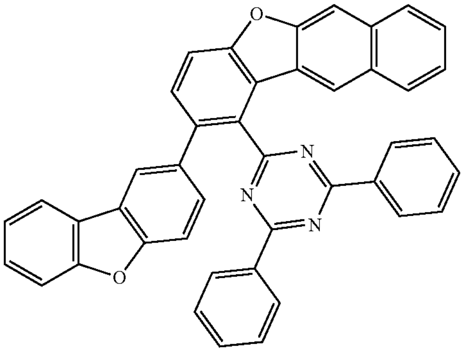
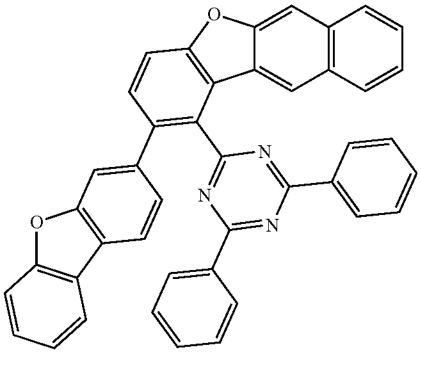

-continued
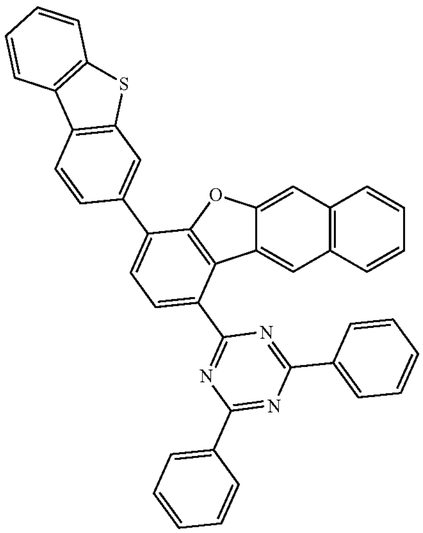
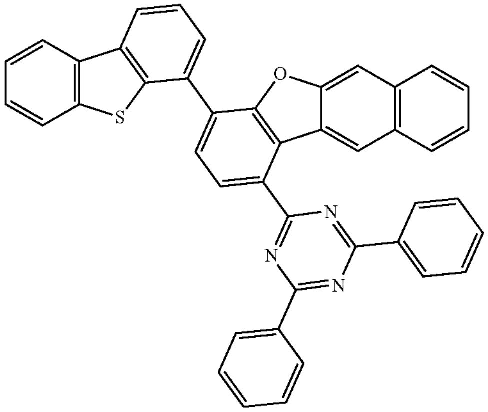
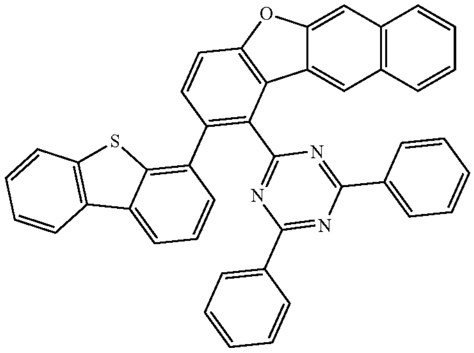
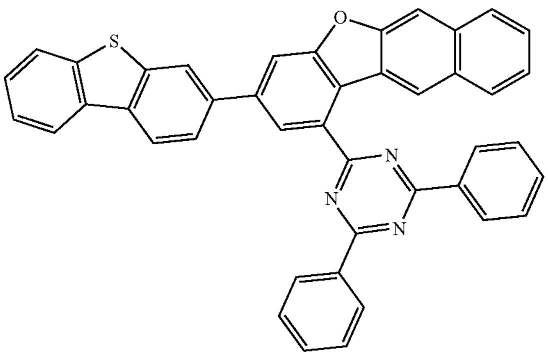
-continued
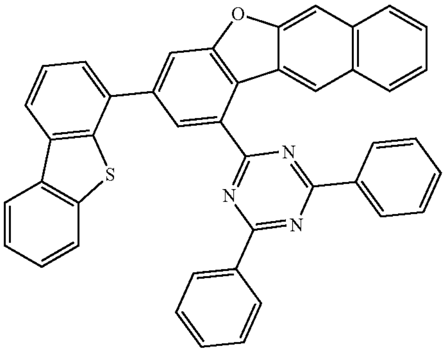
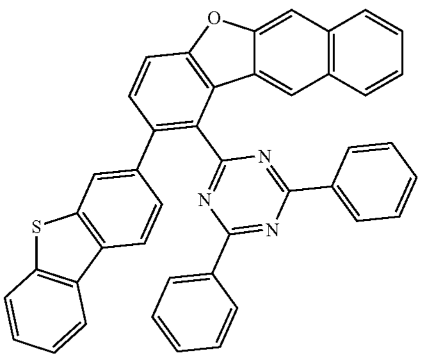
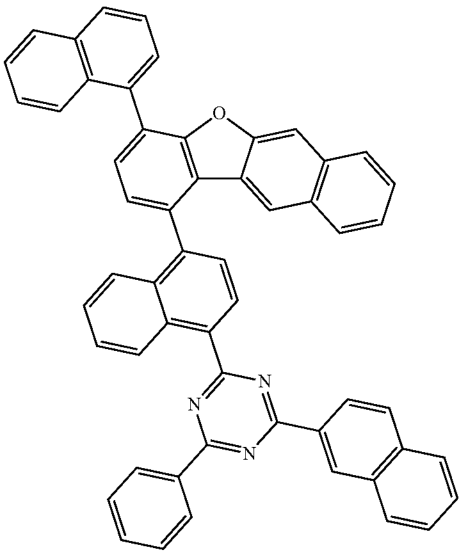

-continued
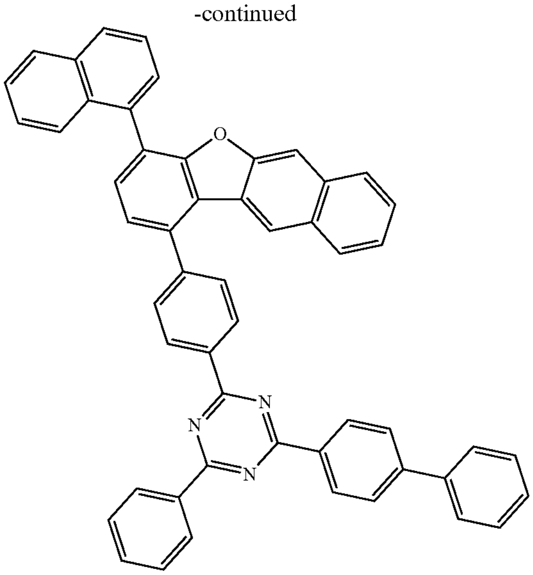
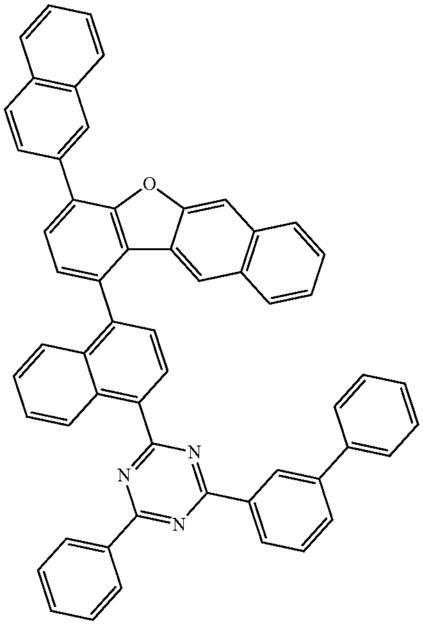
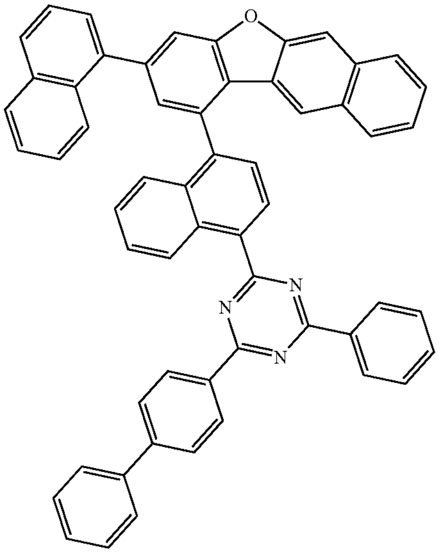
-continued
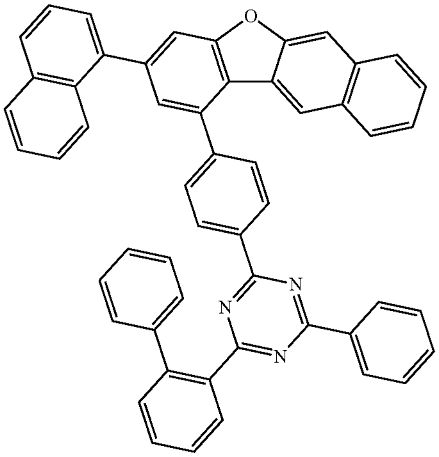
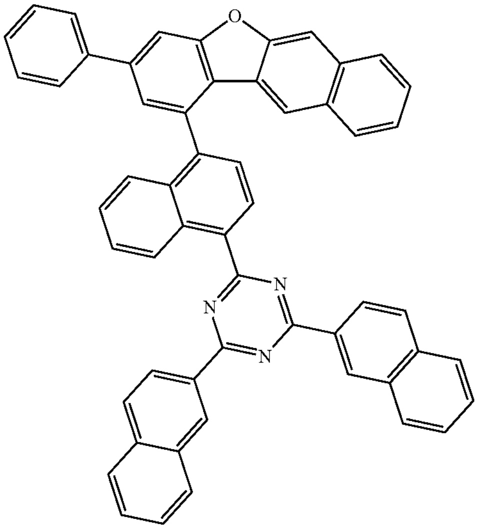
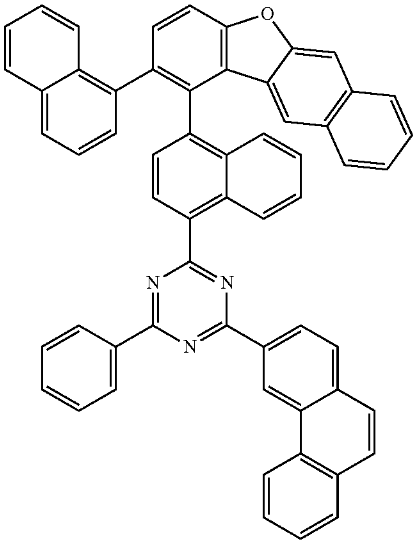

-continued
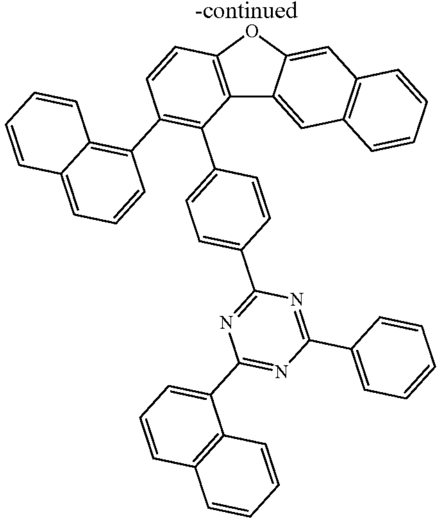
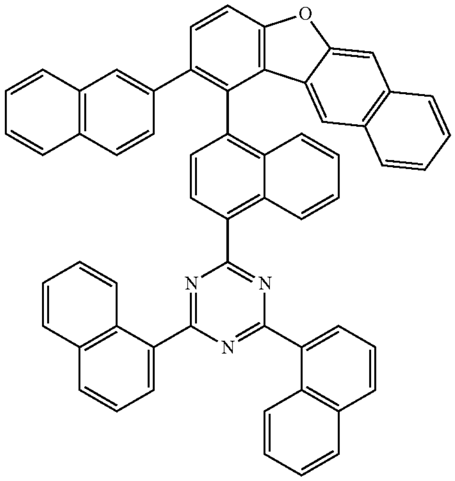
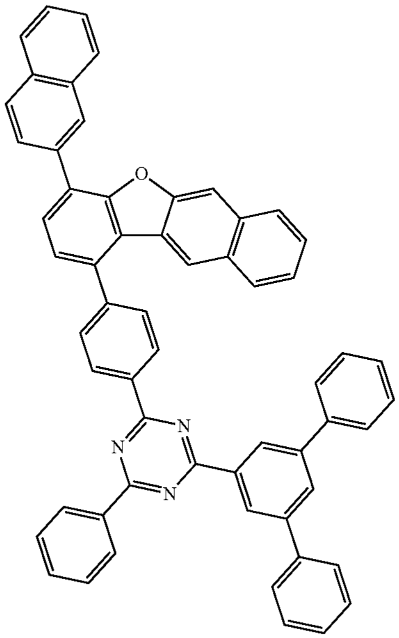
-continued
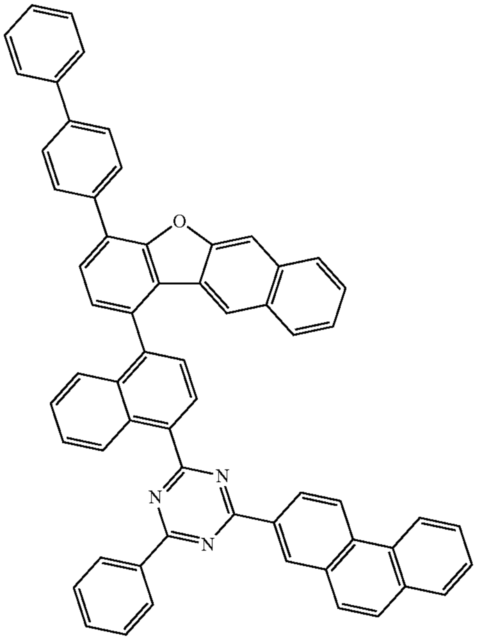
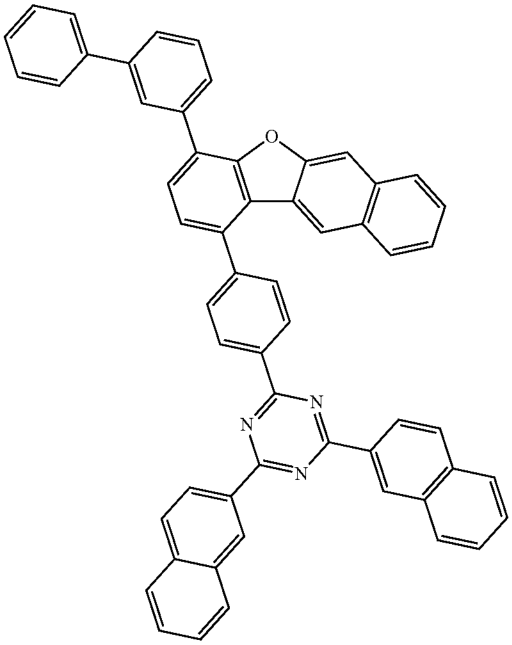

-continued
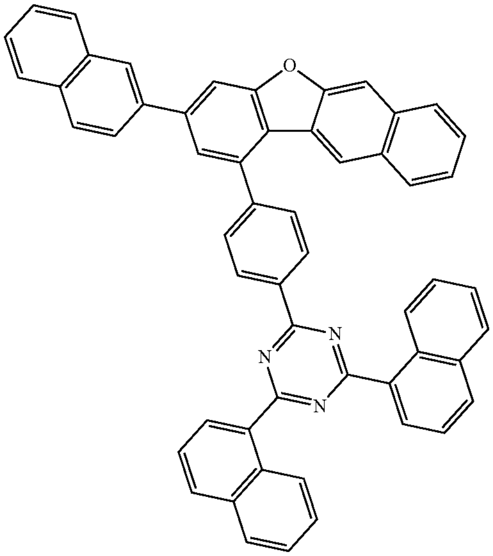
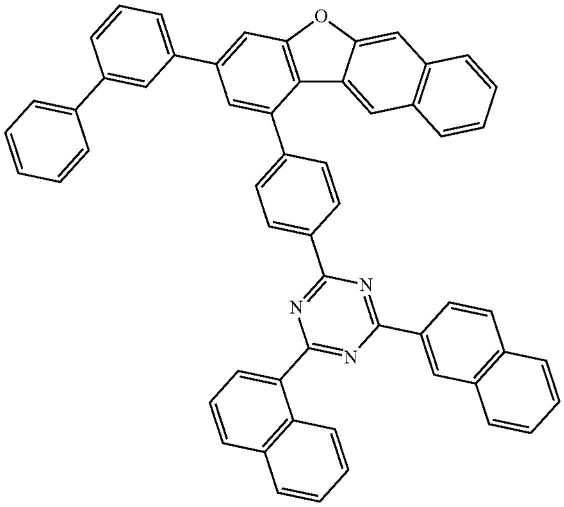
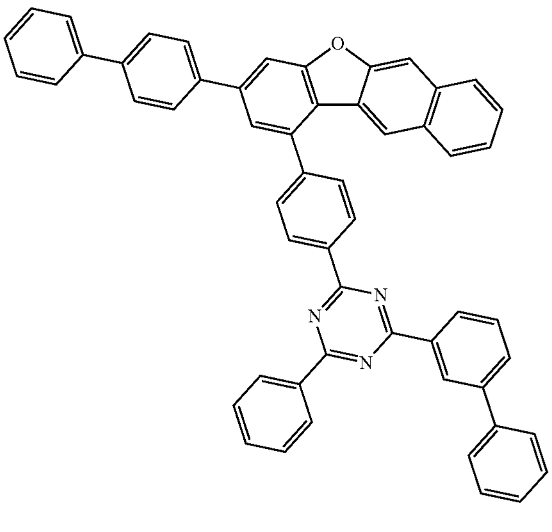
-continued
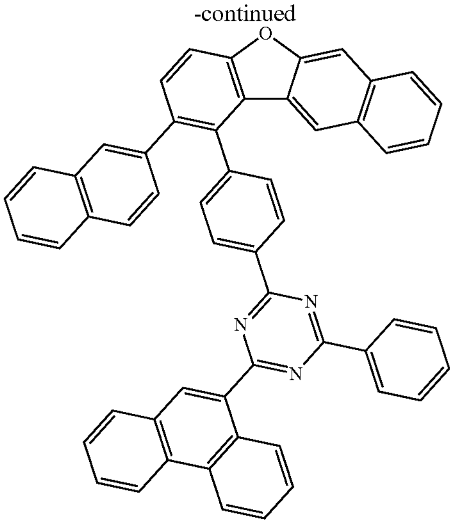
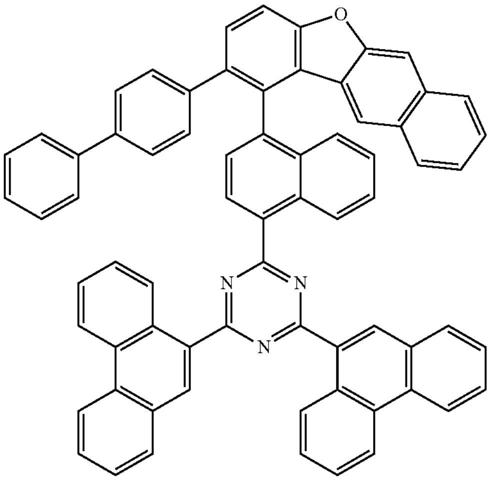
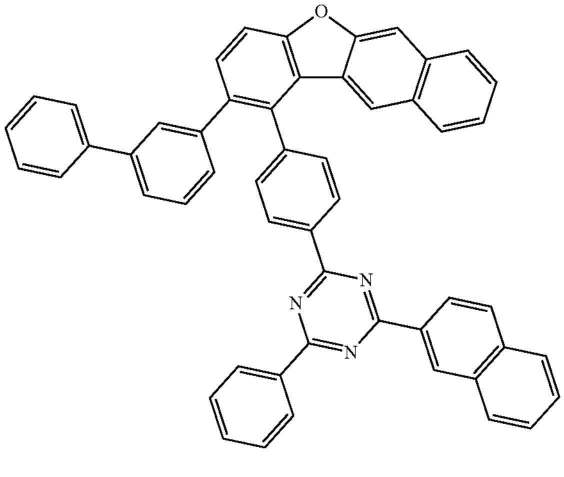

-continued
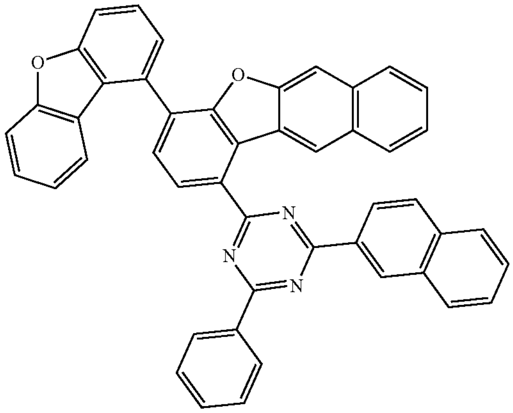
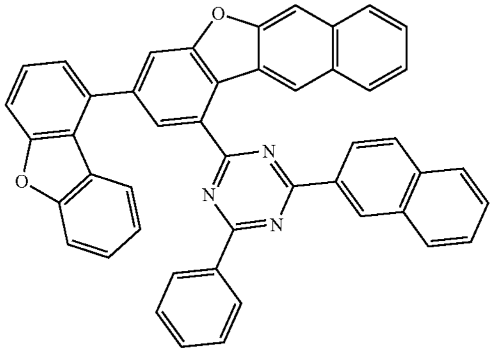
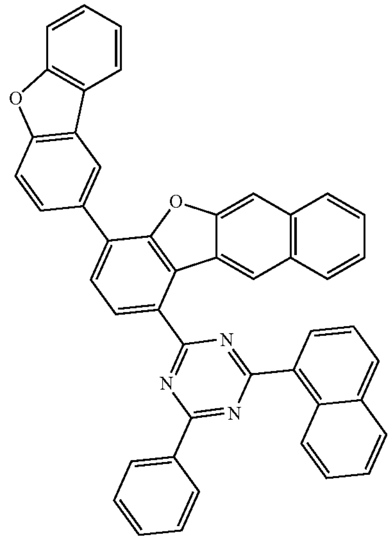
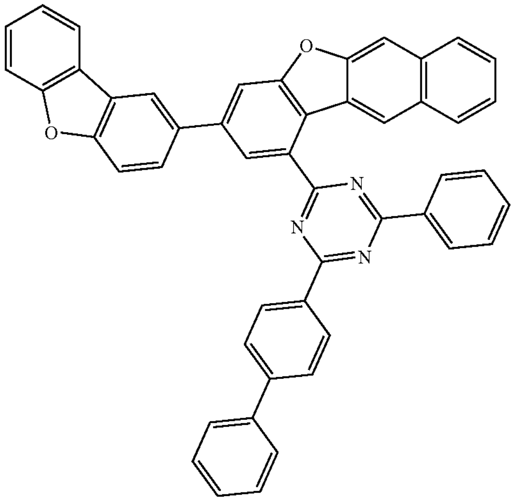
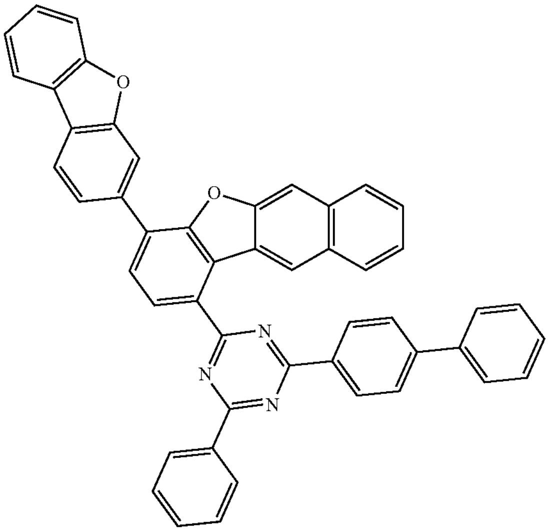
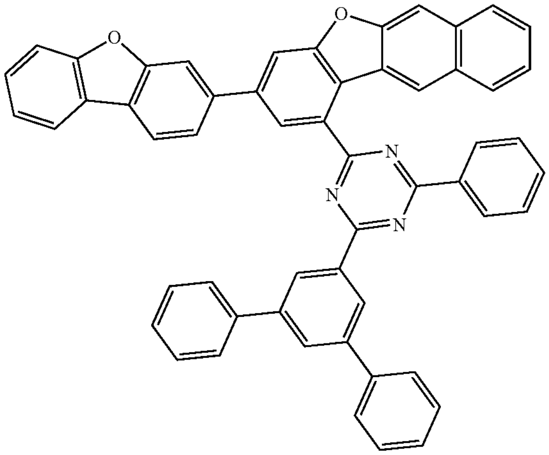

-continued
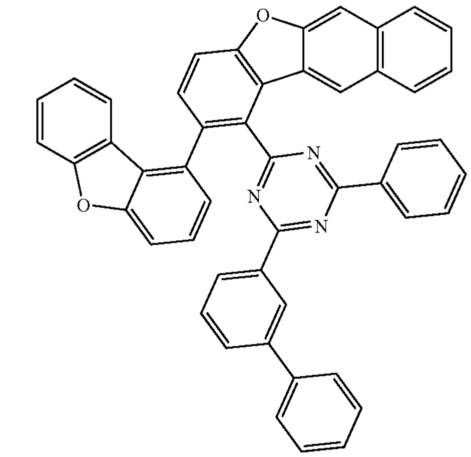
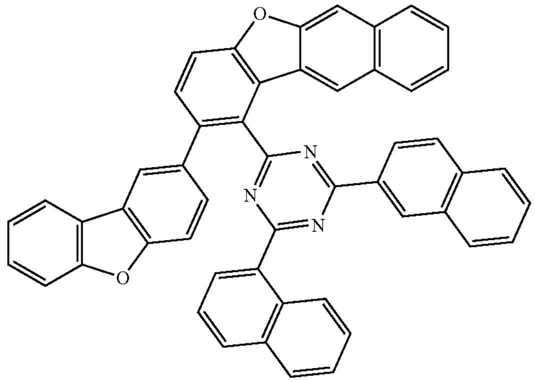
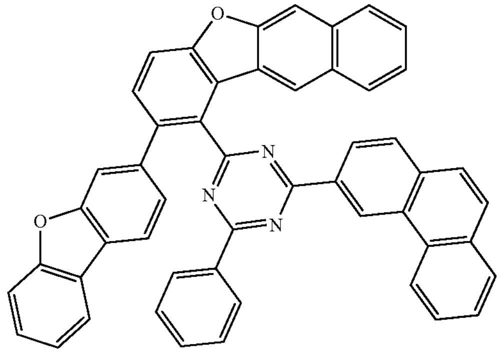
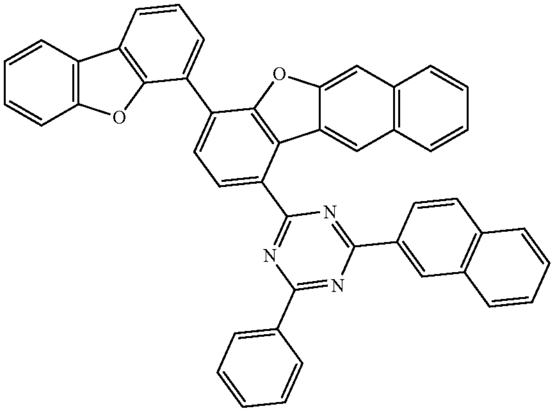
-continued
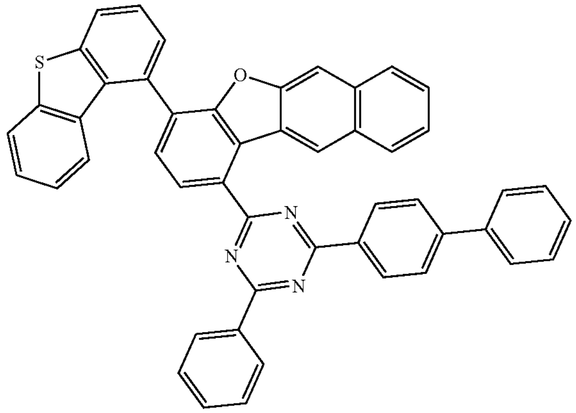
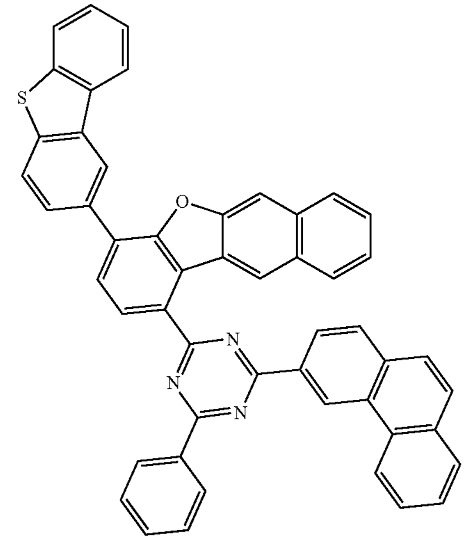
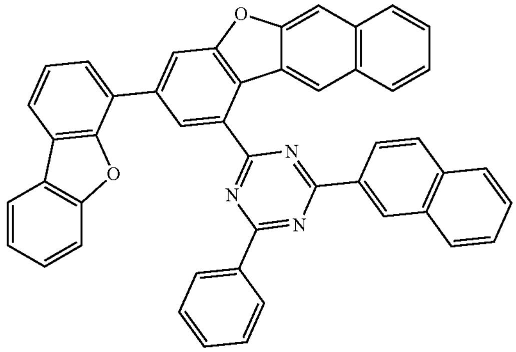
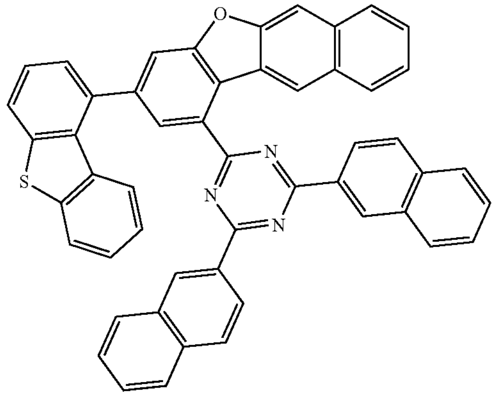

-continued
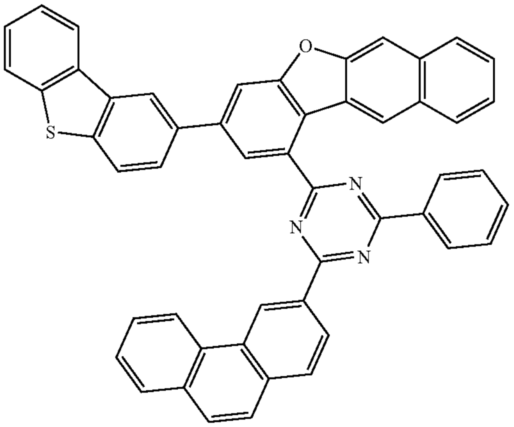
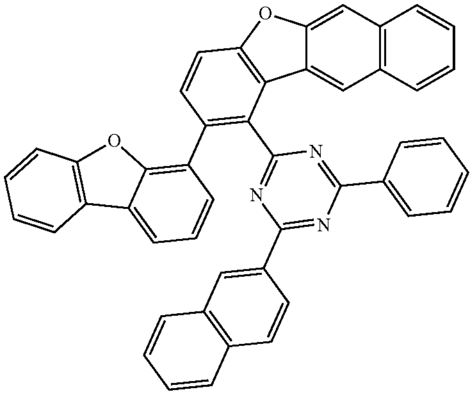
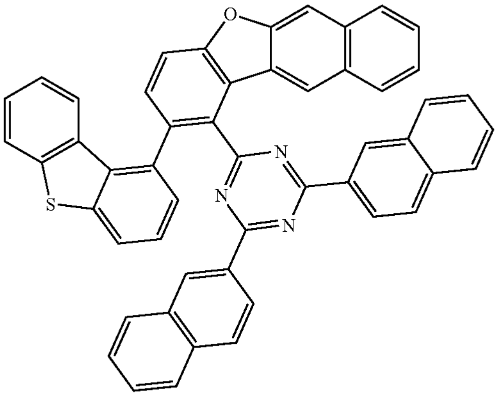
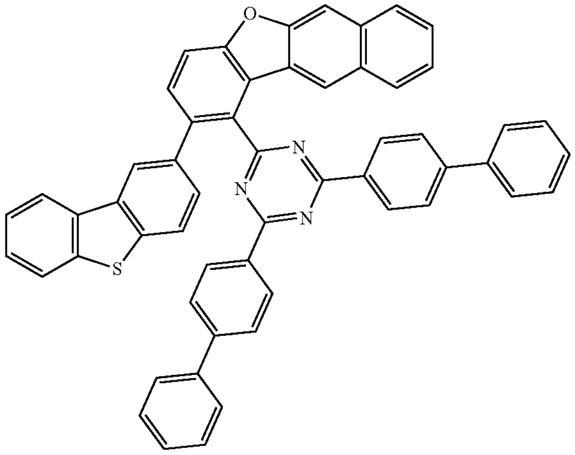
-continued
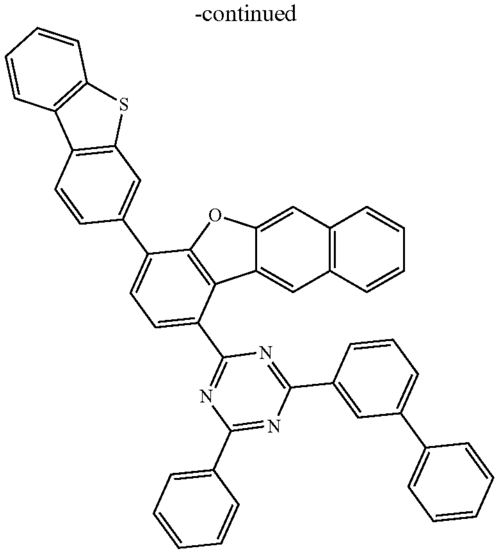
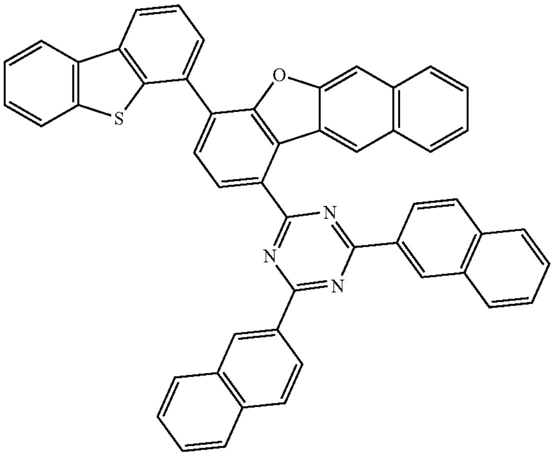
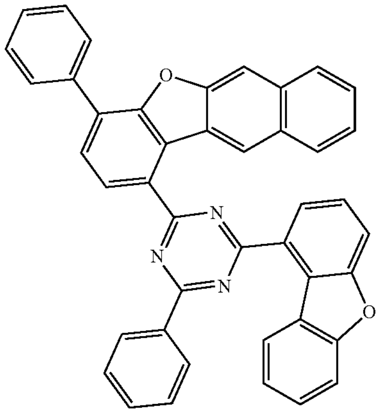

-continued
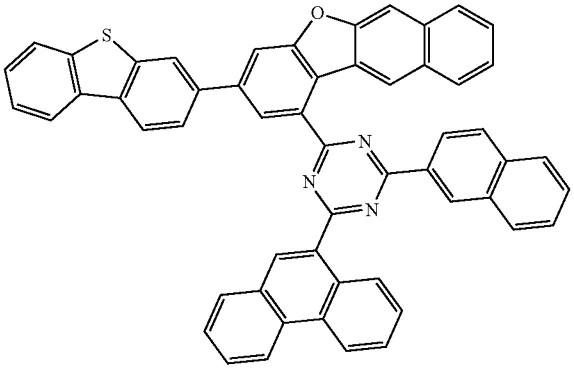
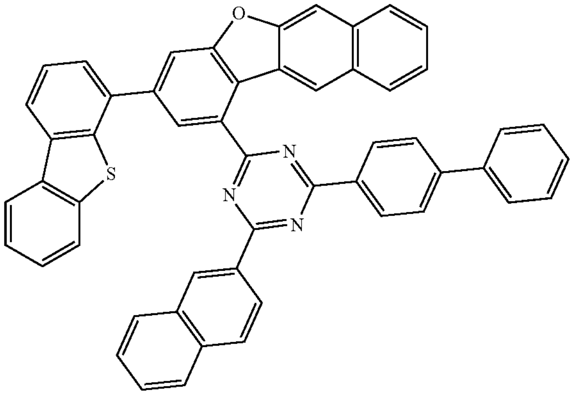
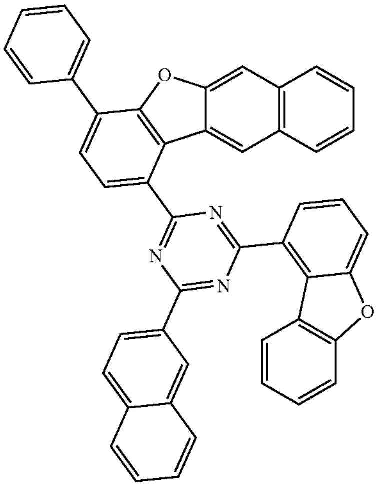
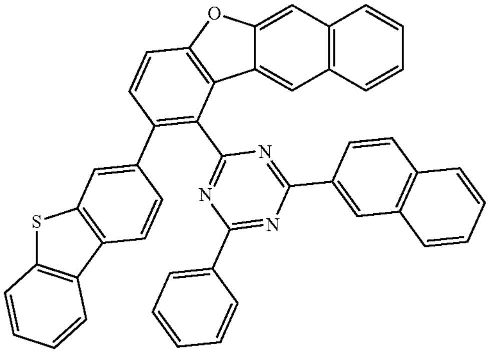
-continued
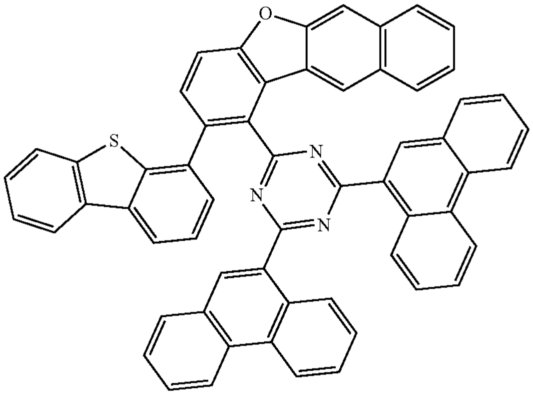
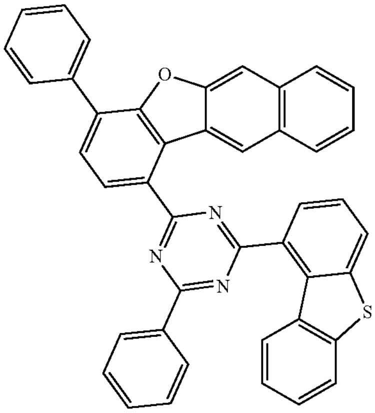
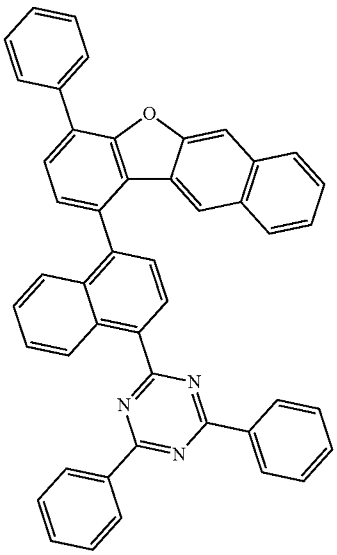

-continued
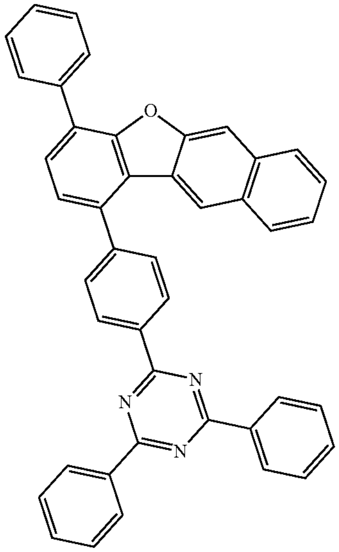
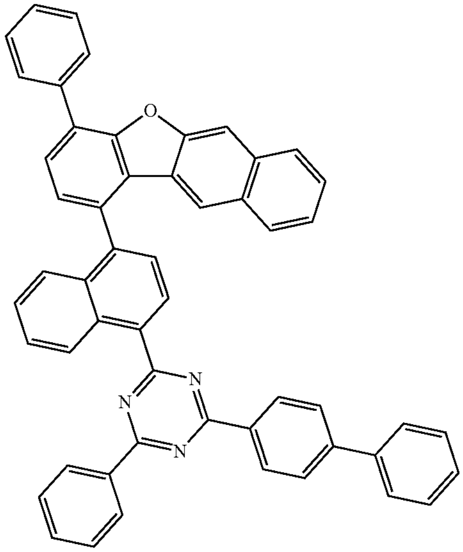
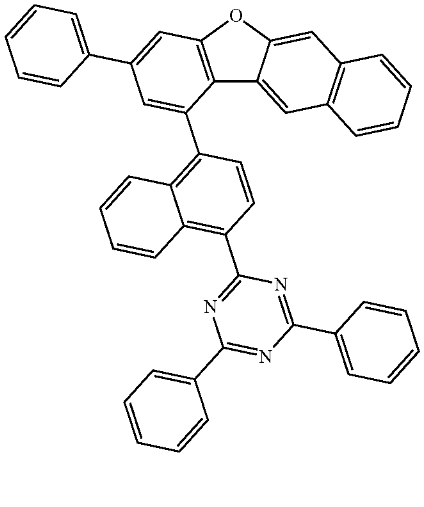
-continued
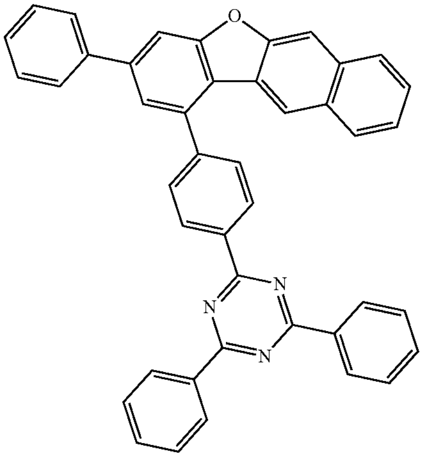
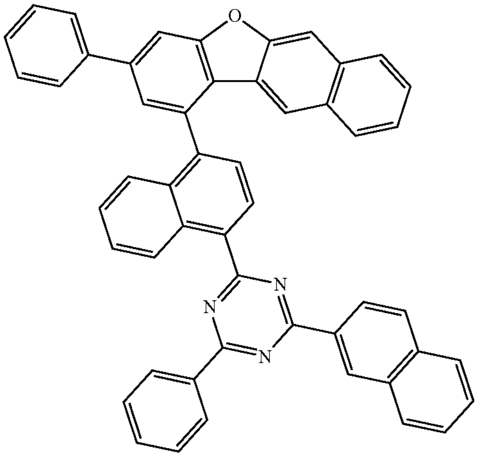
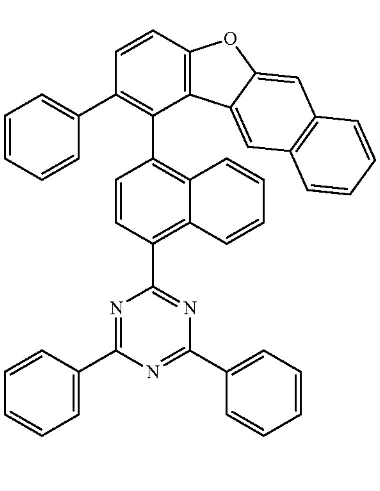

-continued
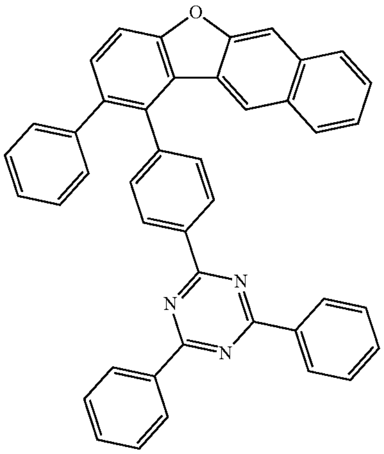
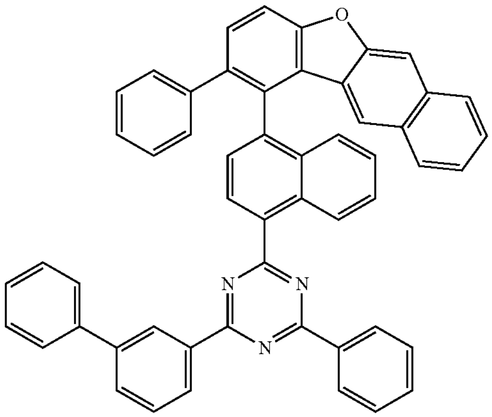
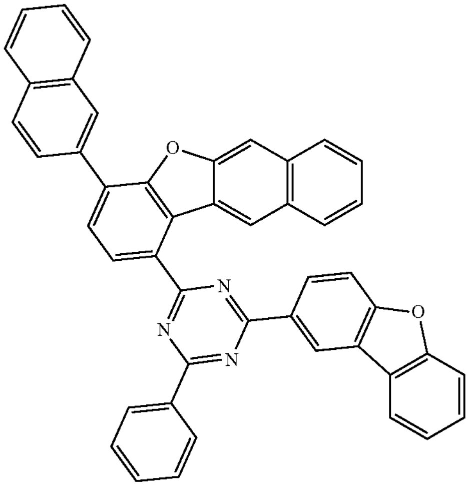
-continued
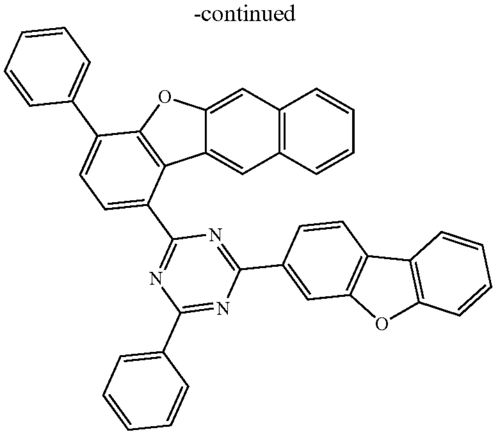
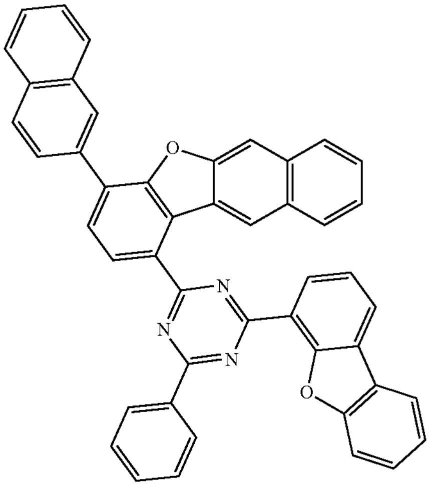
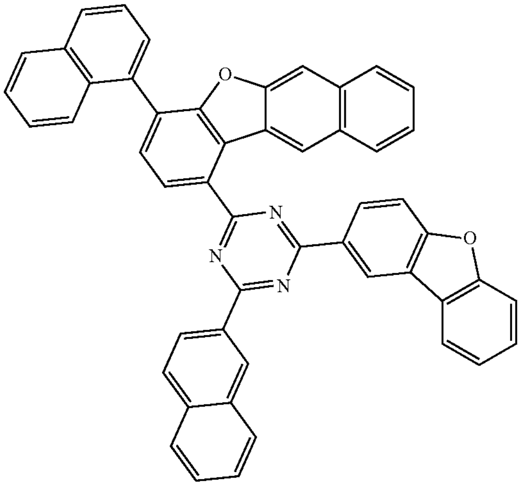

-continued
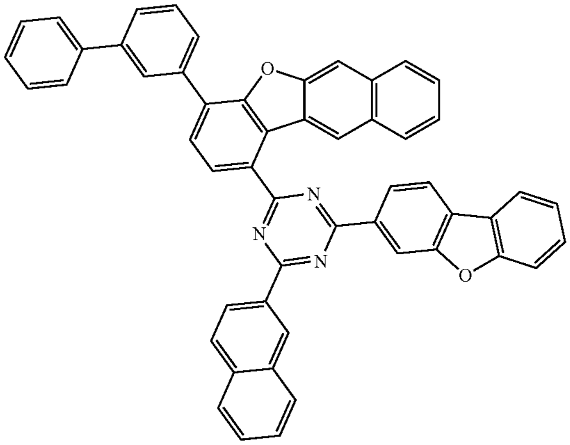
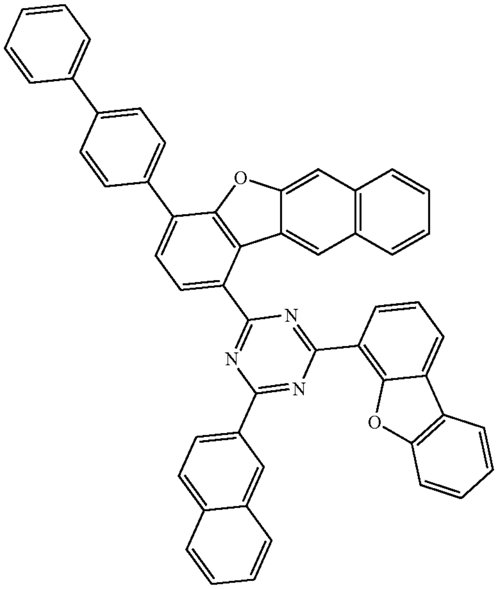
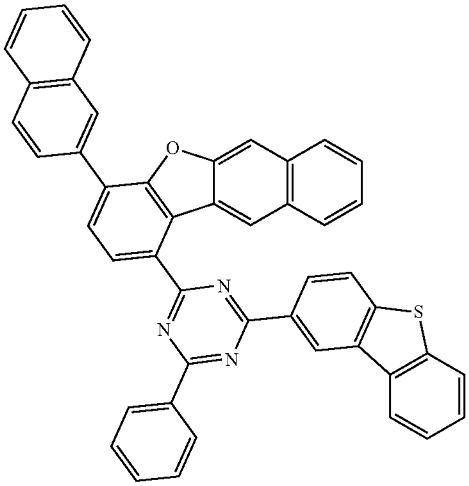
-continued
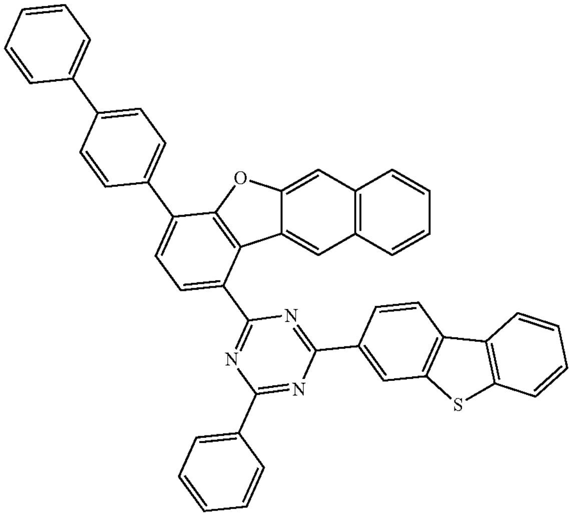
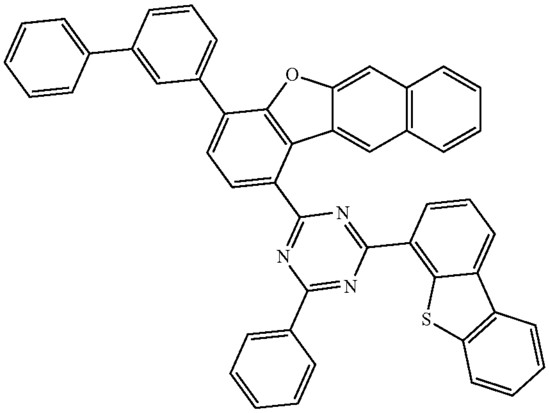
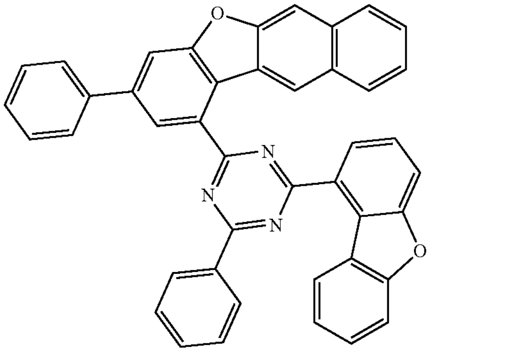
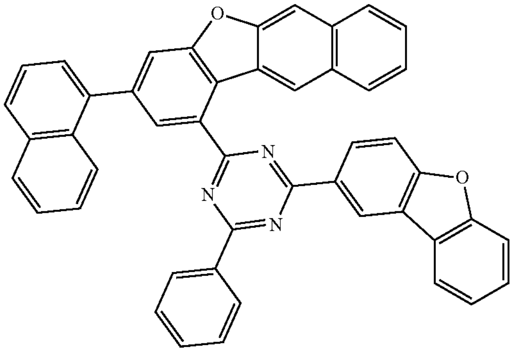

-continued
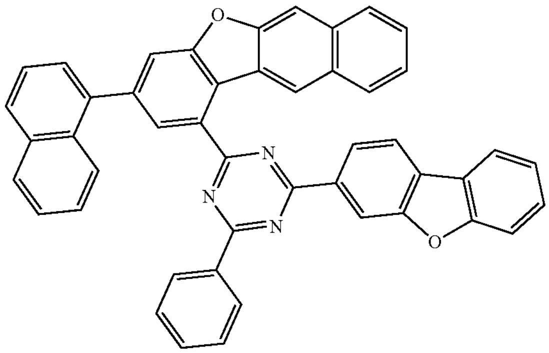
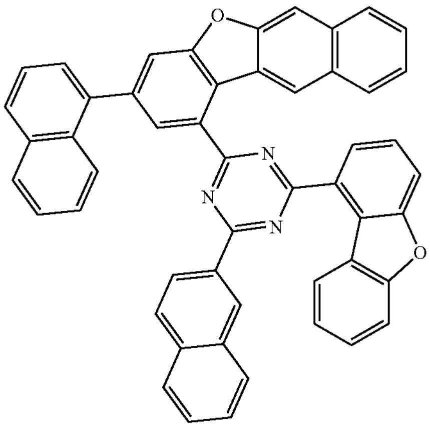
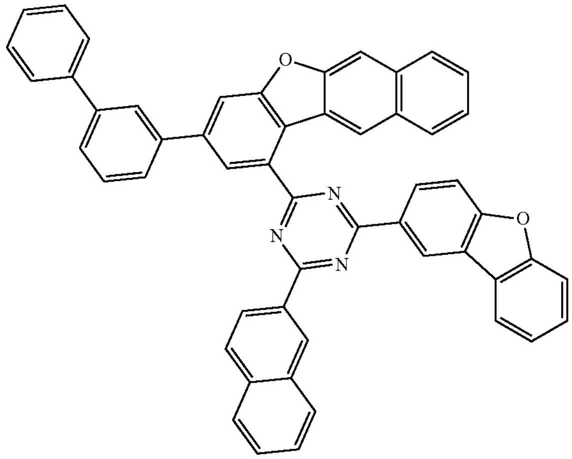
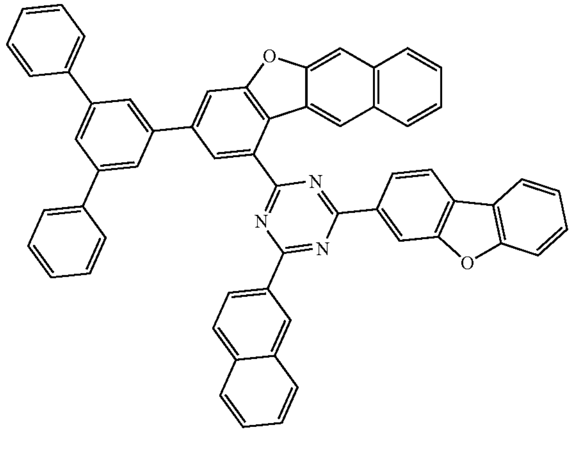
-continued
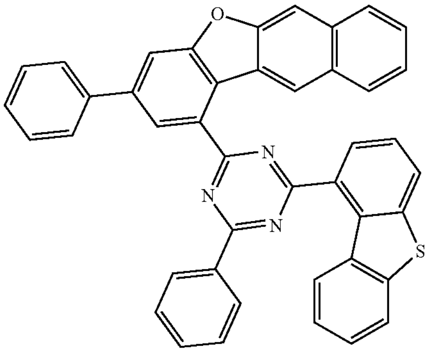
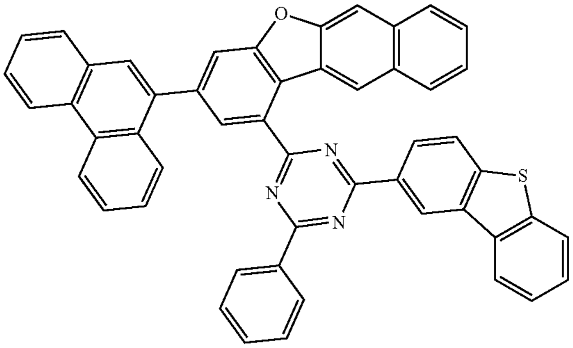
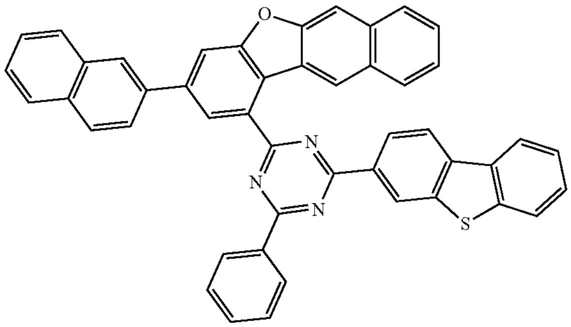
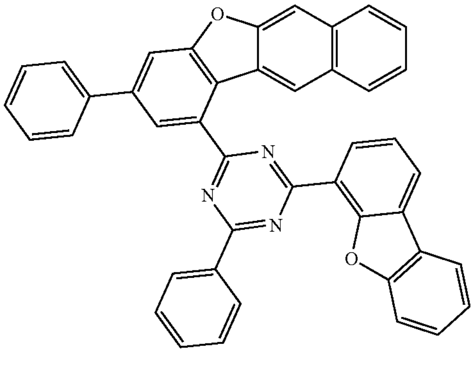

-continued
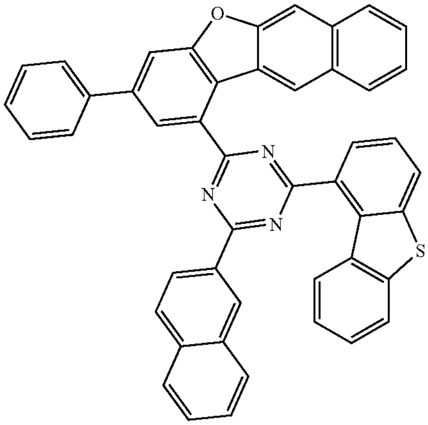
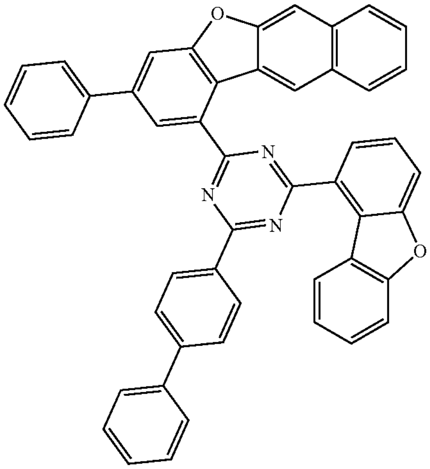
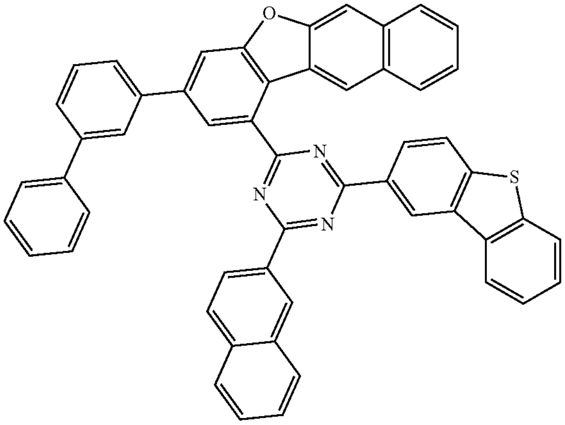
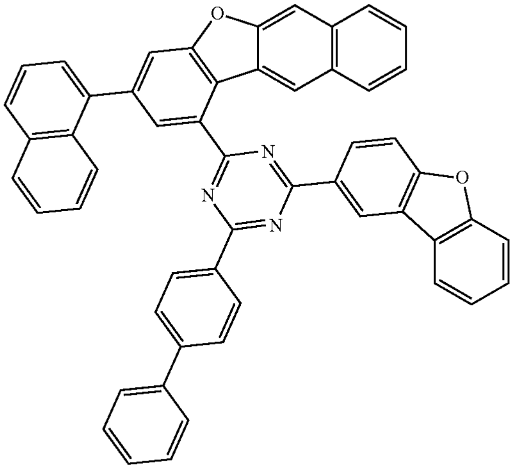
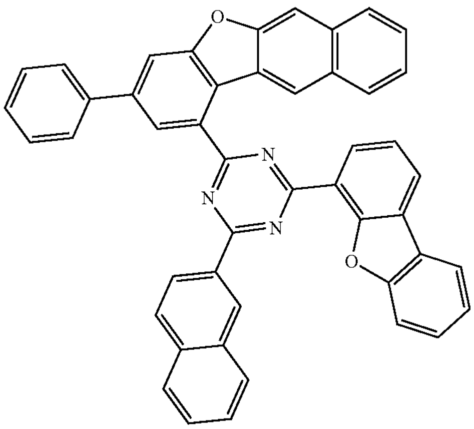
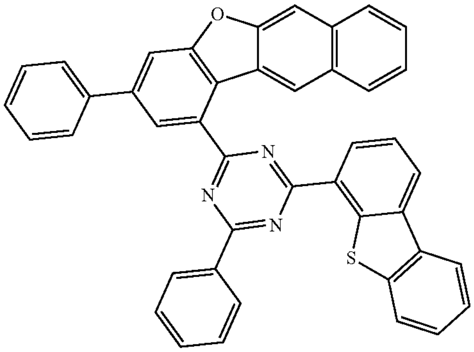

-continued
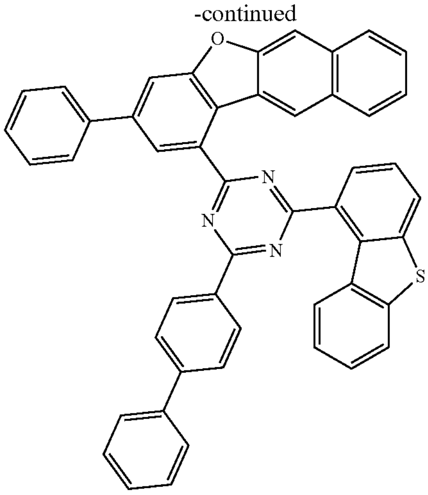
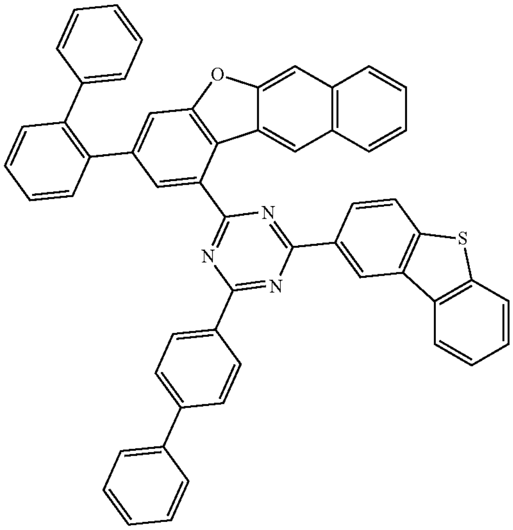
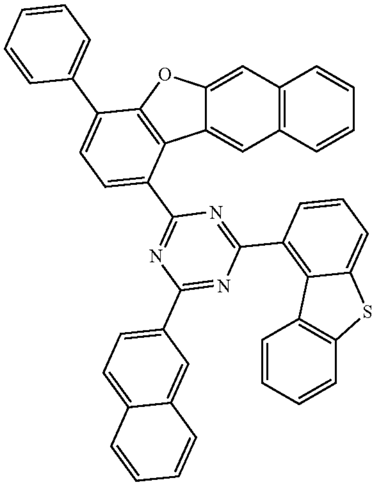
-continued
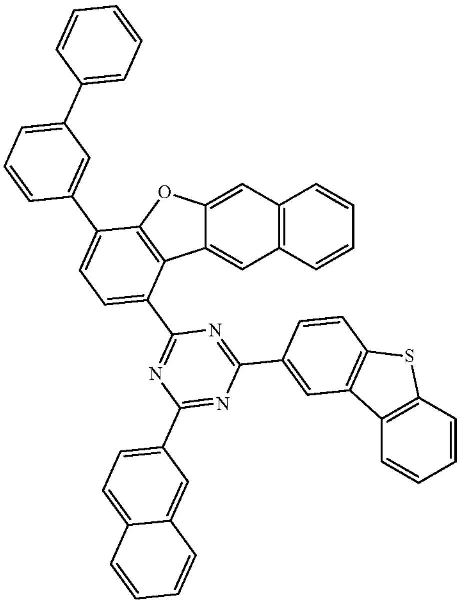
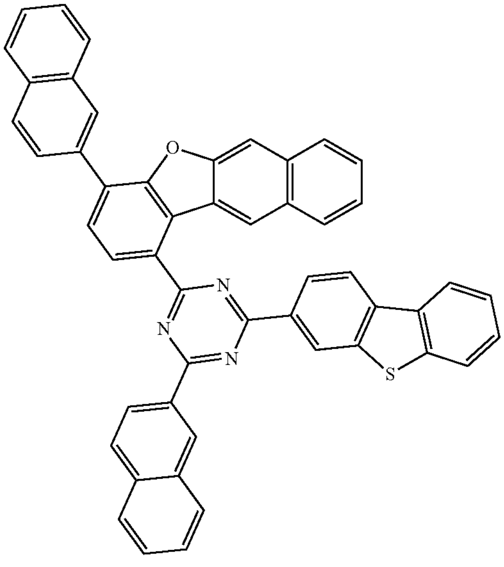

-continued
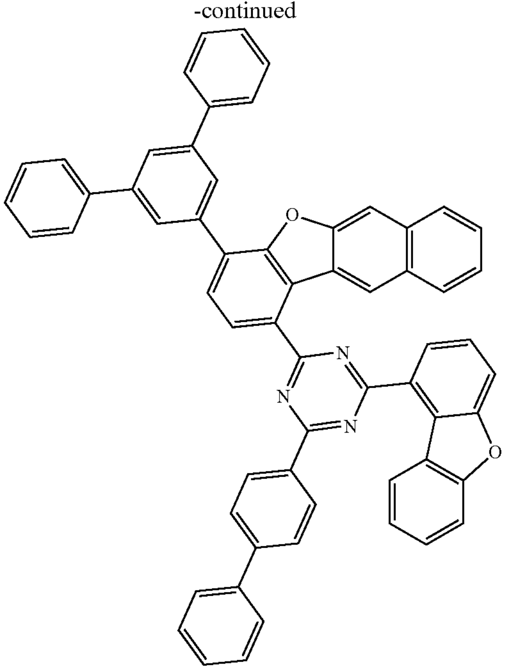
-continued
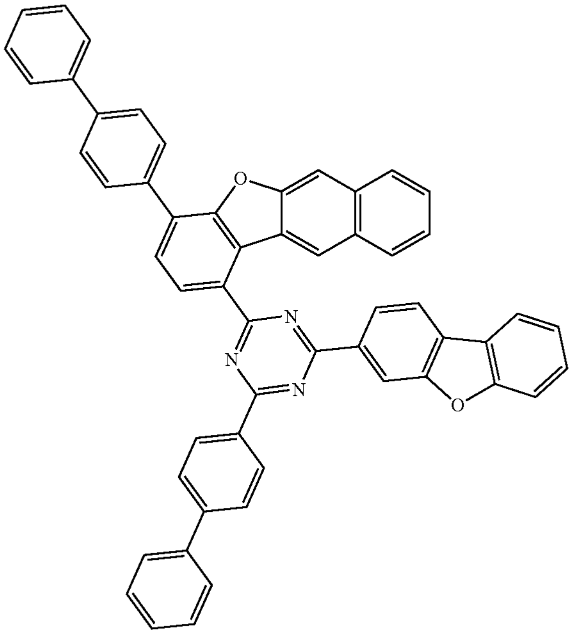
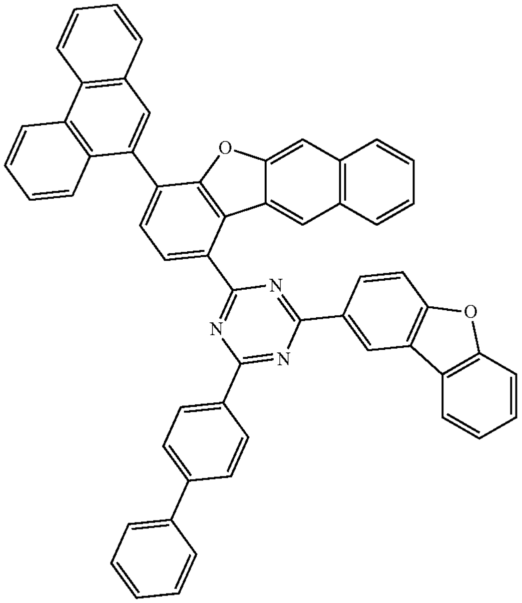
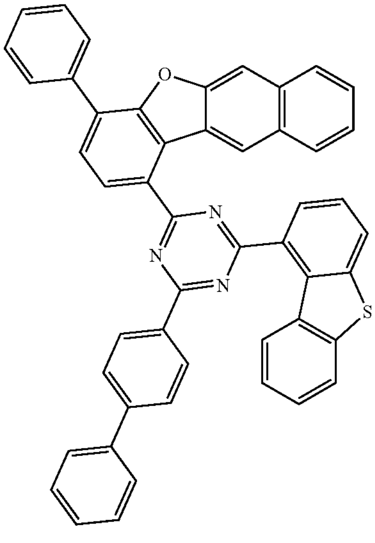

-continued
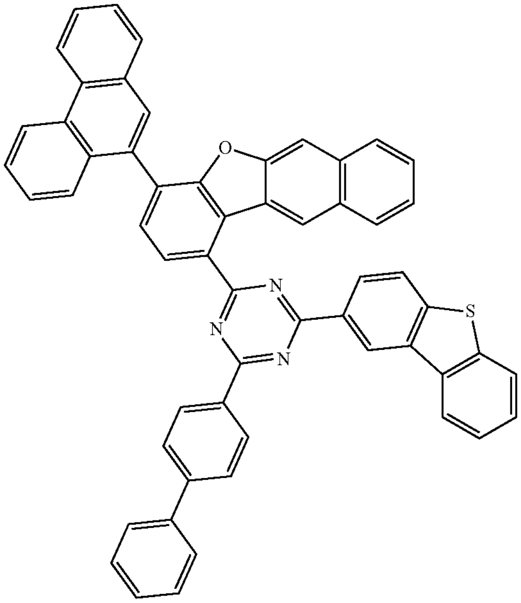
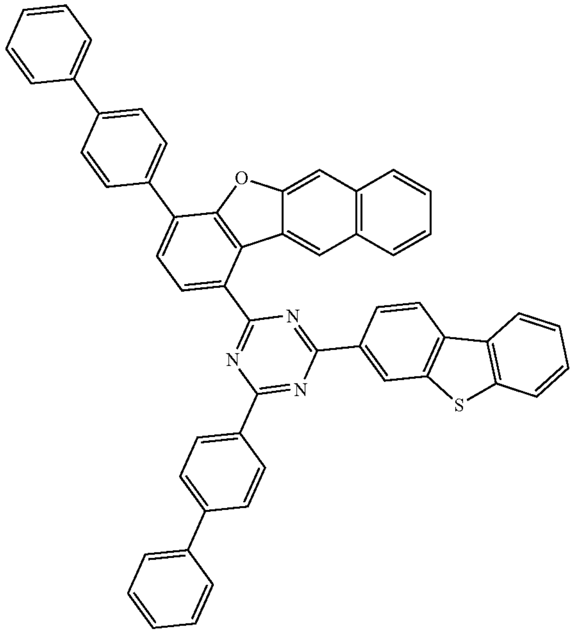
-continued
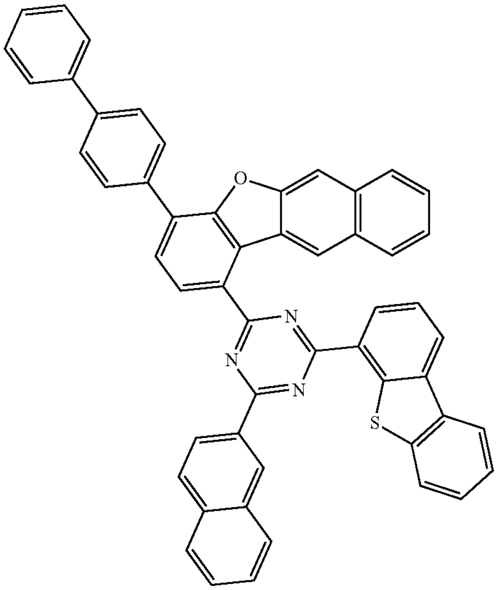
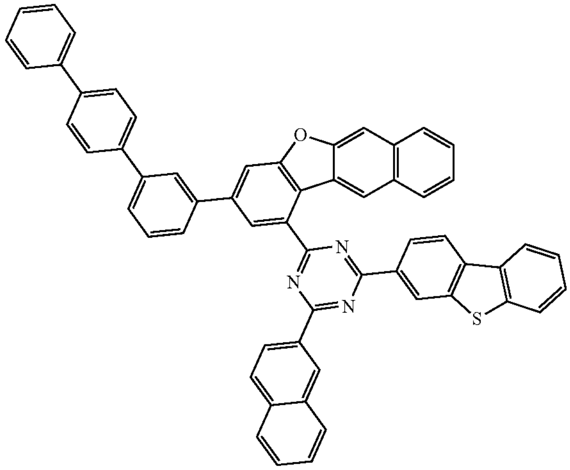
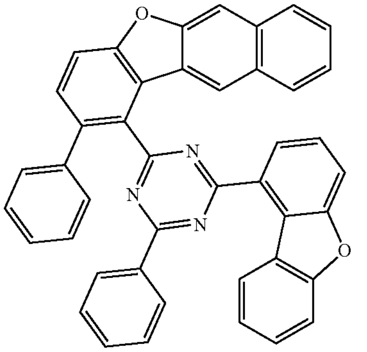

-continued
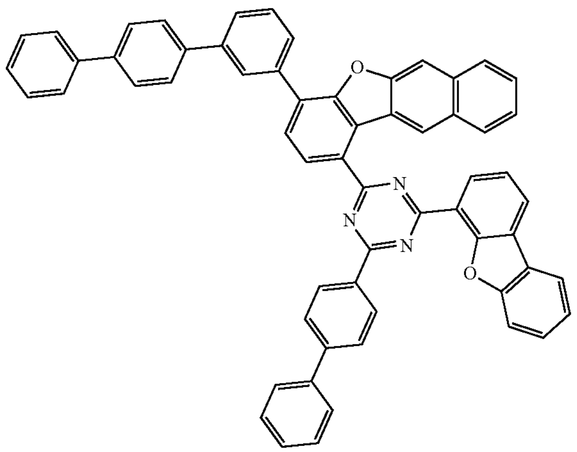
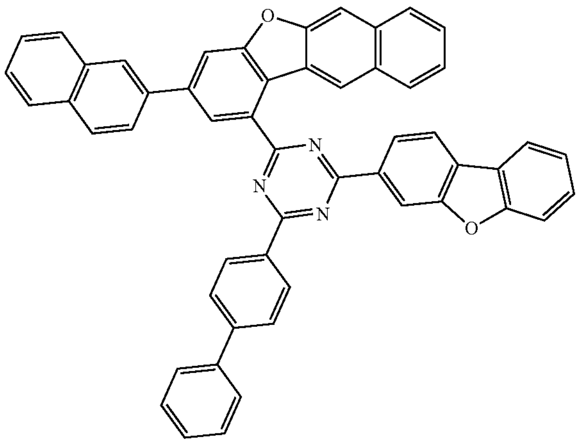
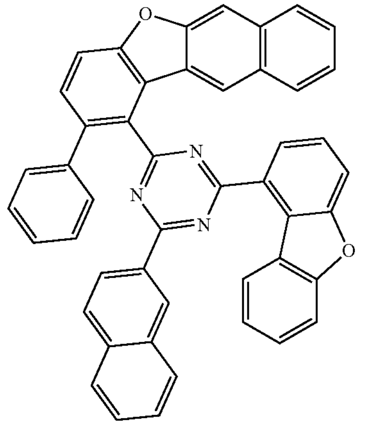
-continued
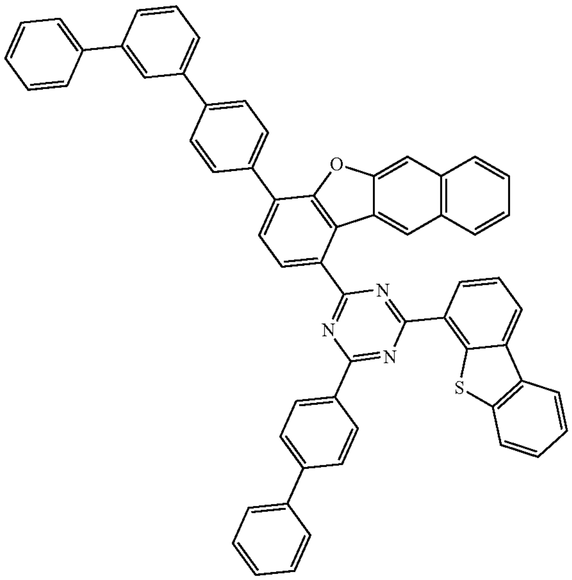
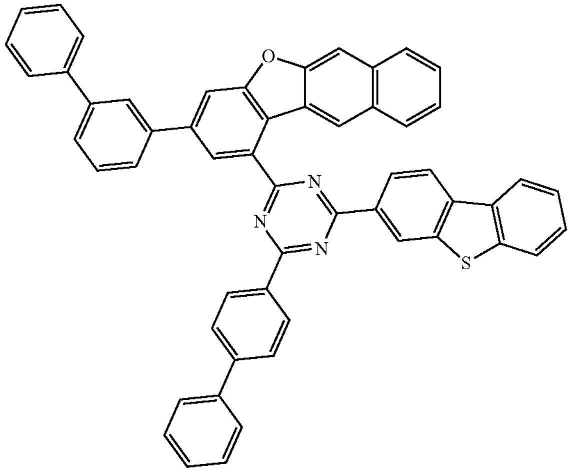
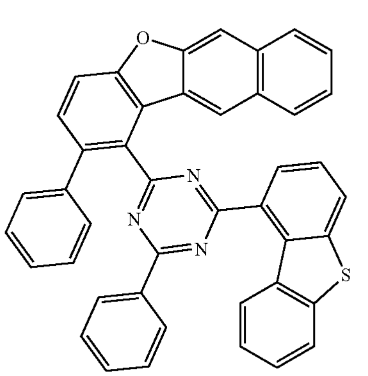

-continued
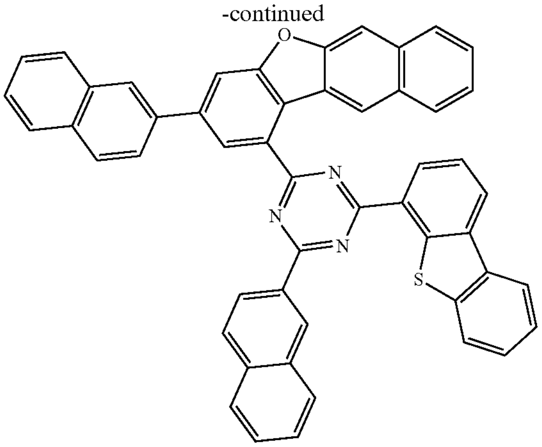
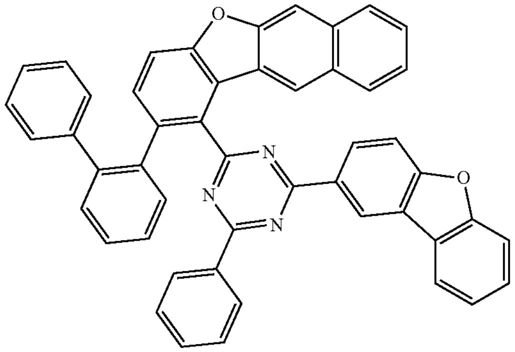
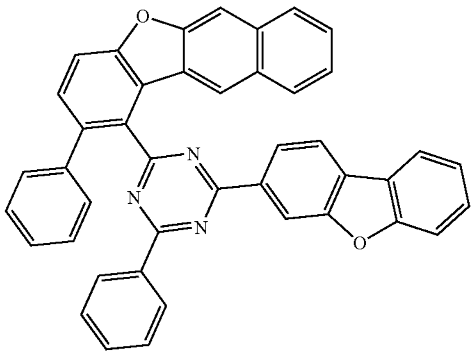
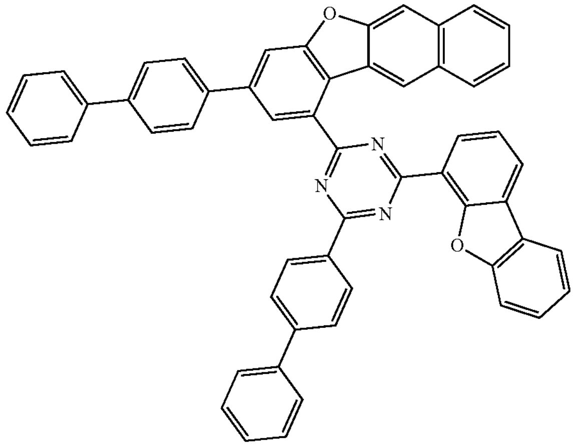
-continued
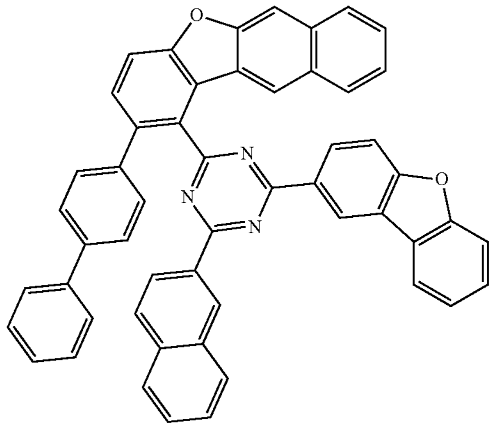
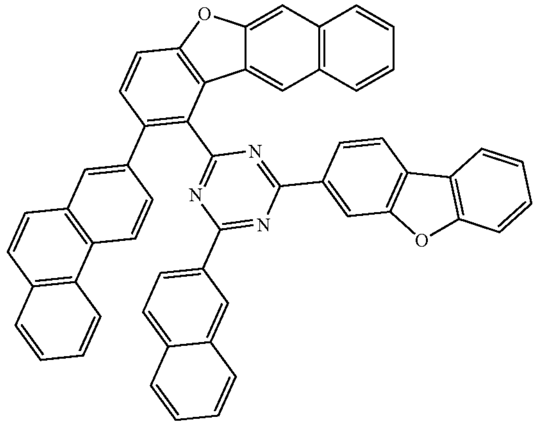
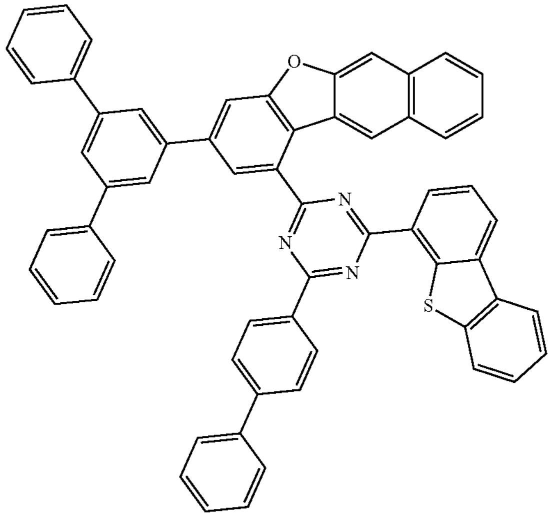
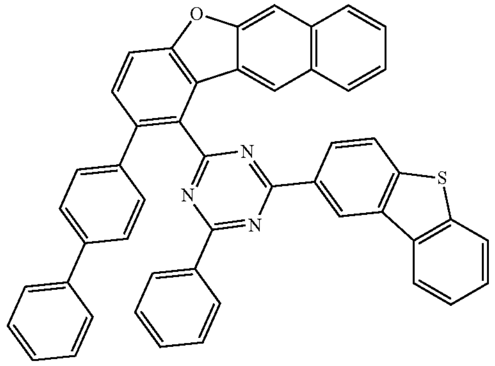

-continued
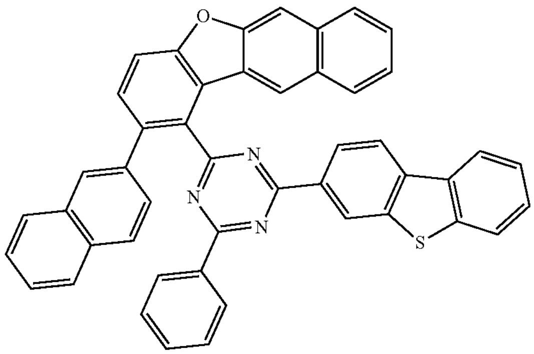
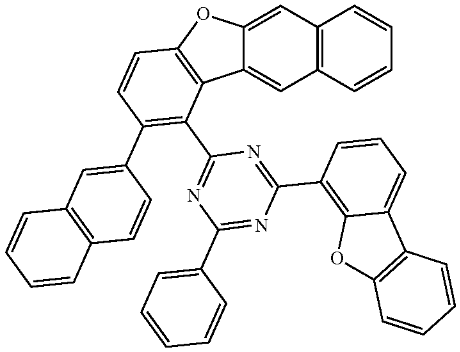
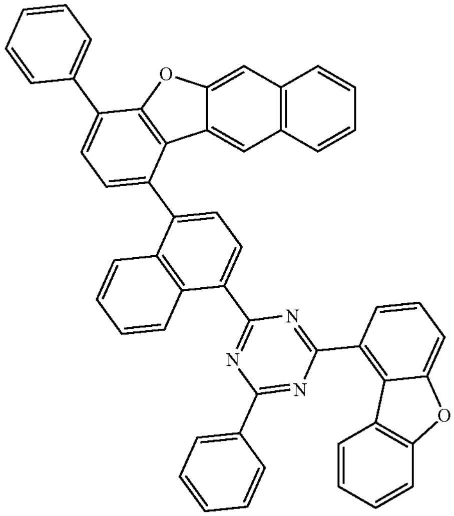
-continued
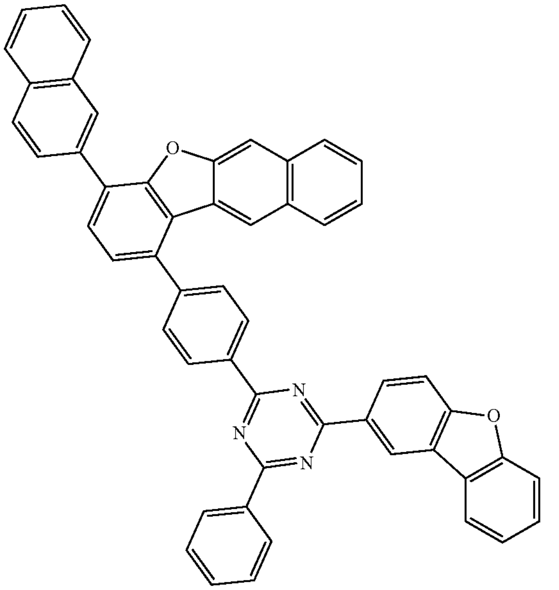
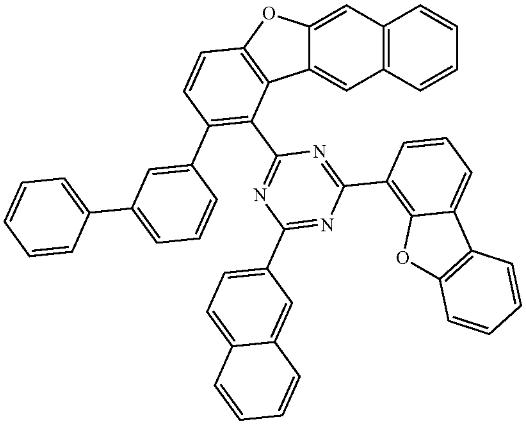
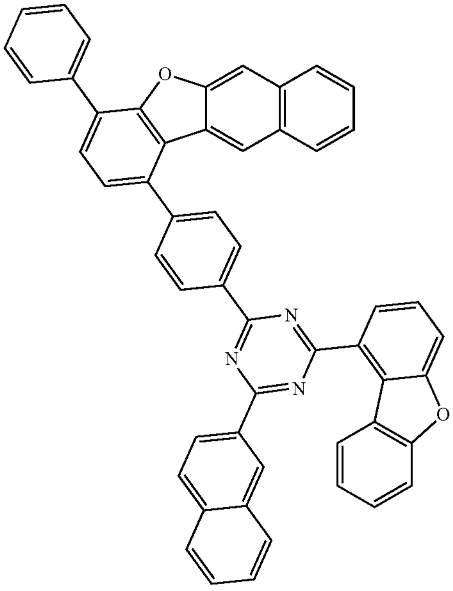

-continued
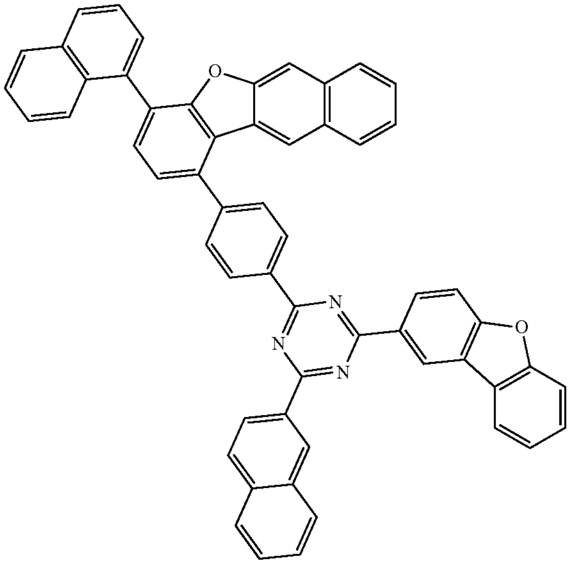
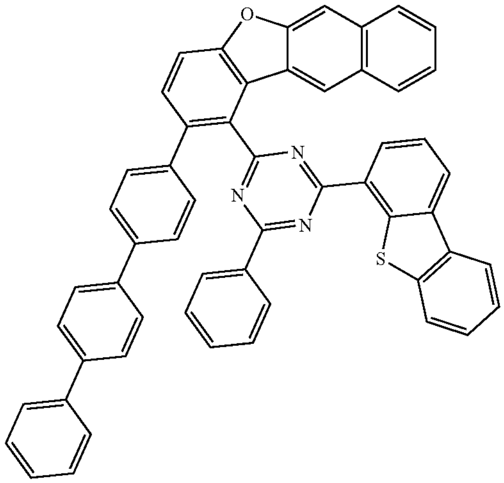
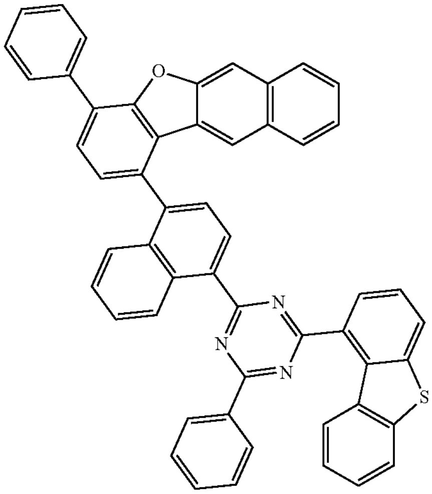
-continued
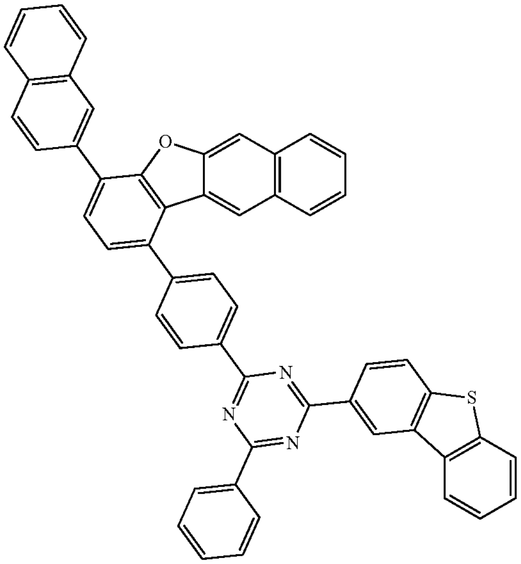
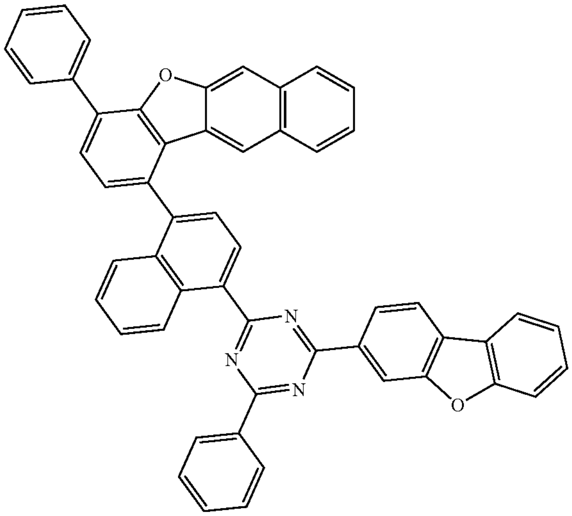
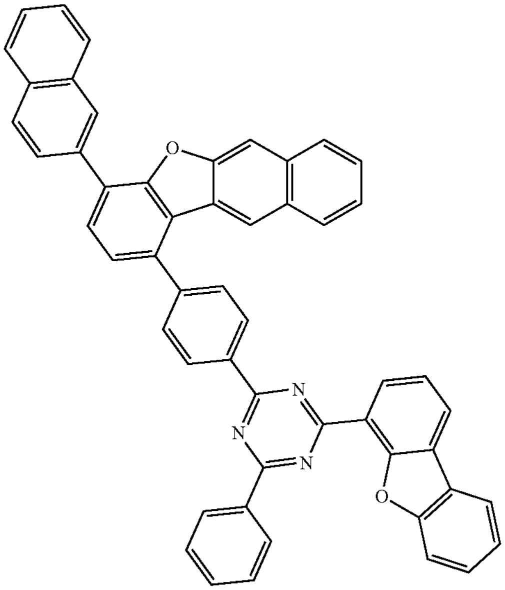

-continued
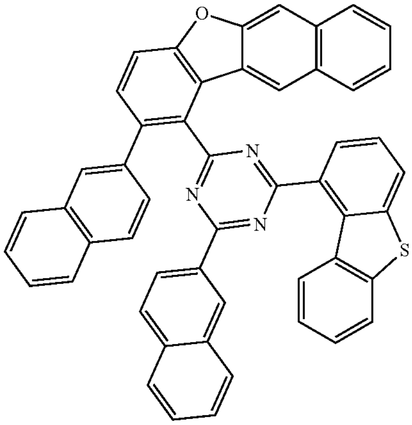
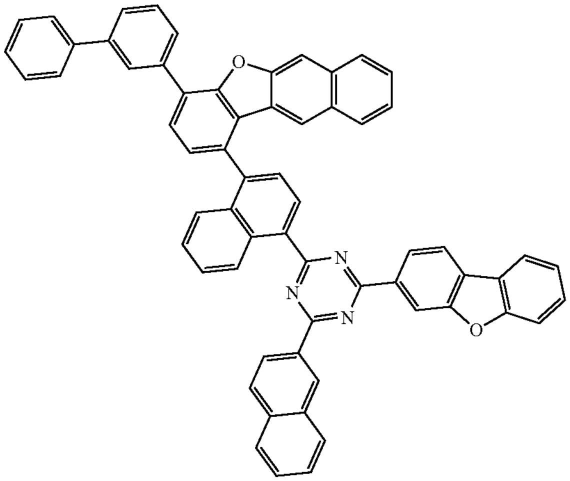
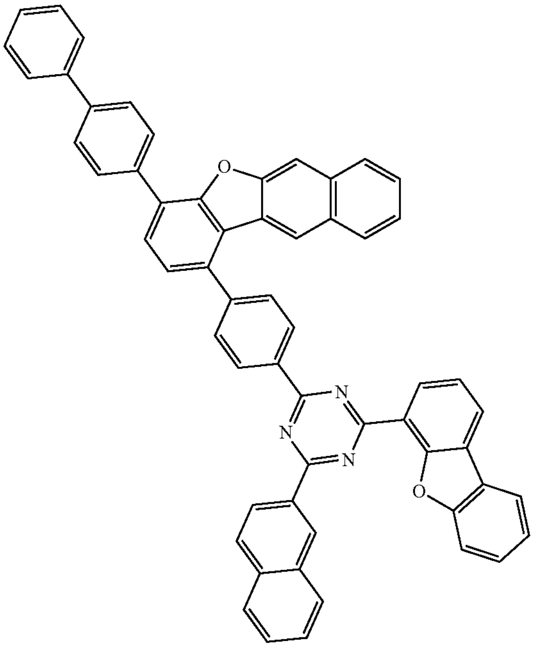
-continued
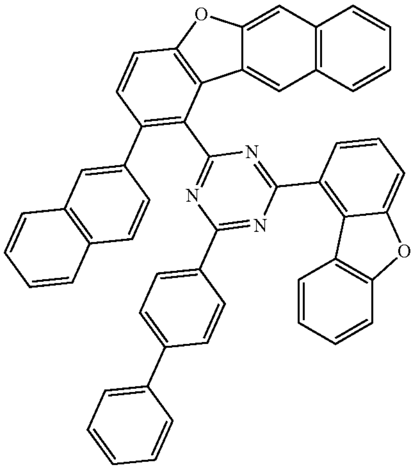
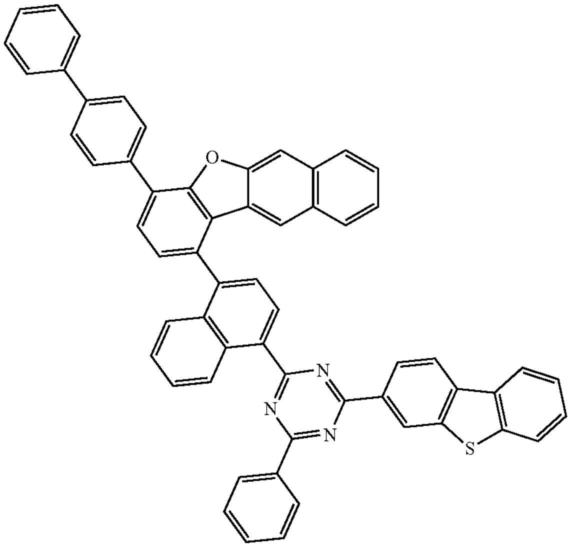
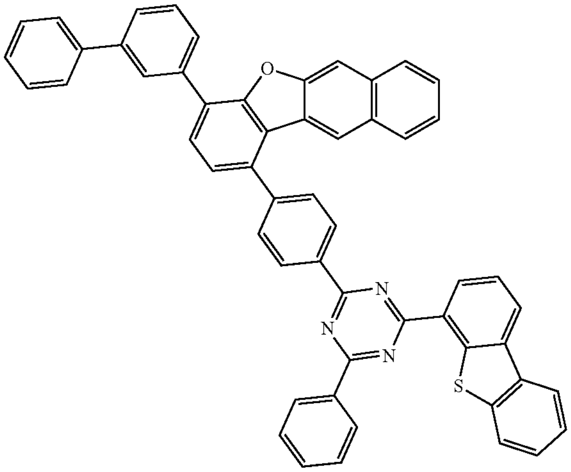

-continued
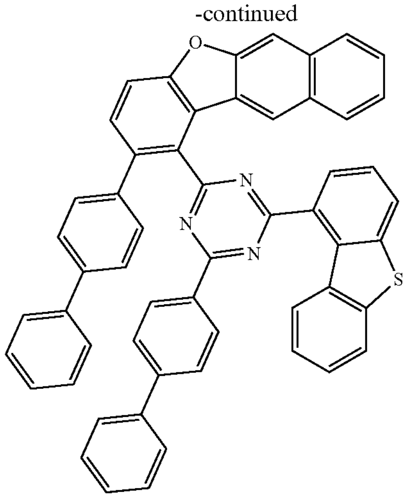
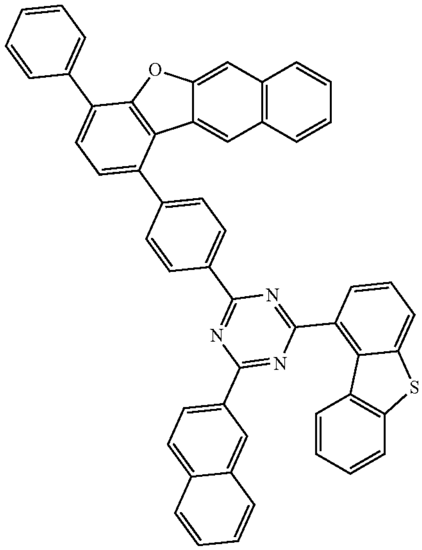
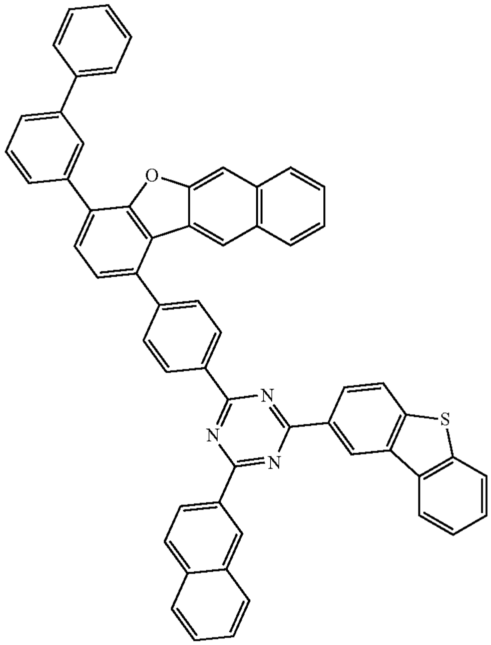
-continued
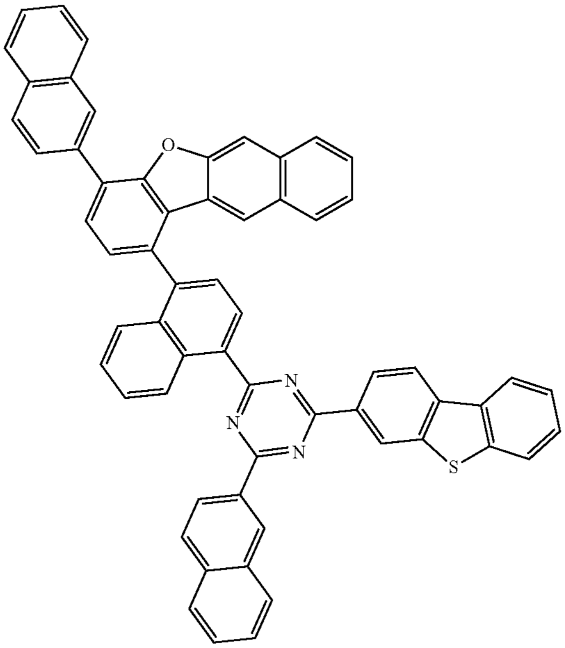
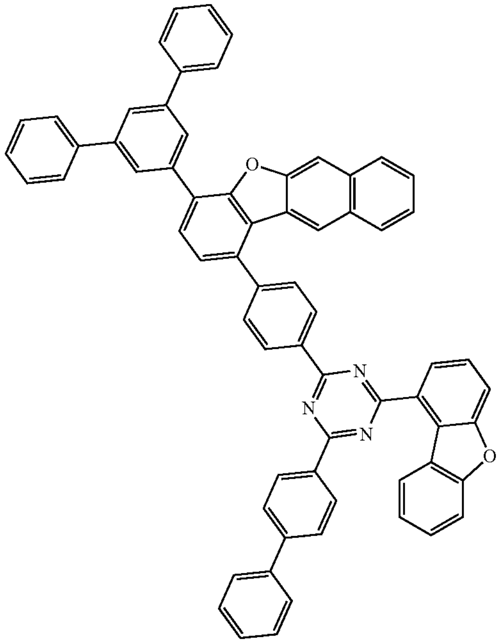

-continued
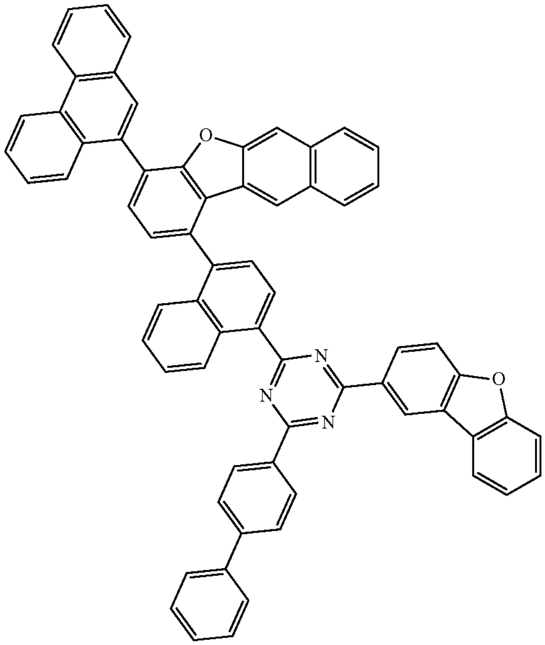
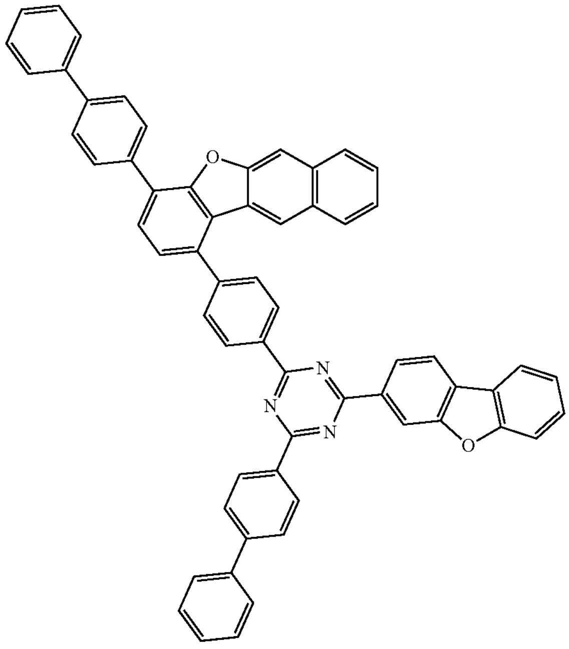
-continued
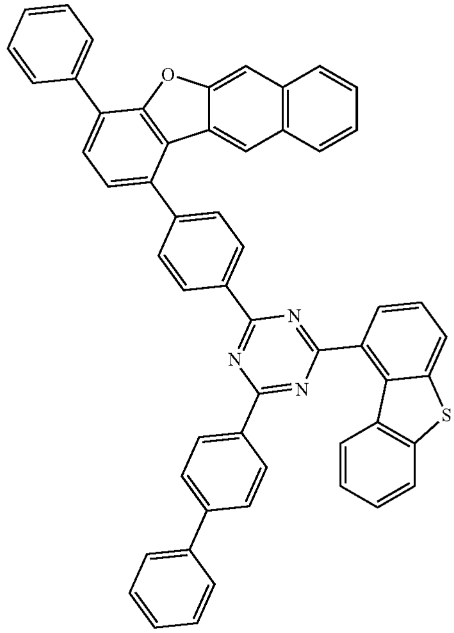
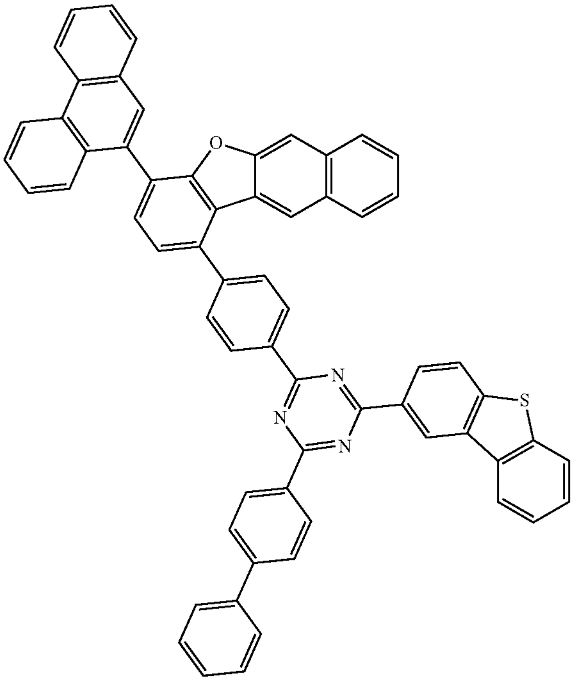

-continued
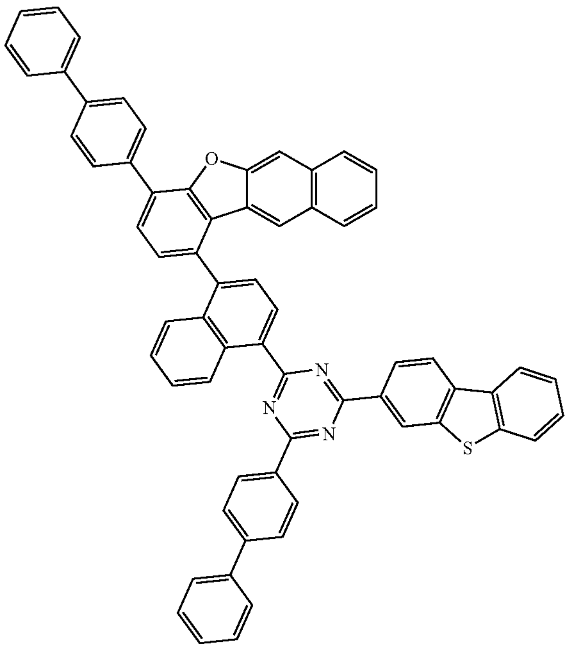
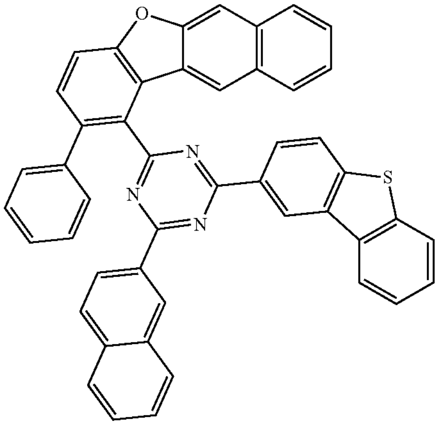
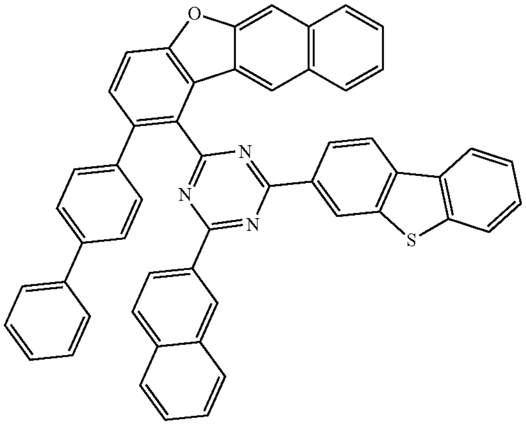
-continued
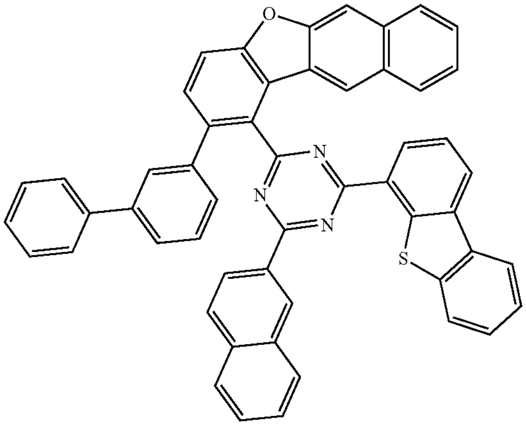
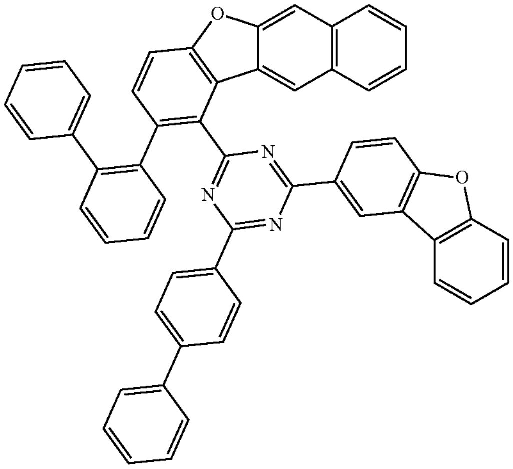
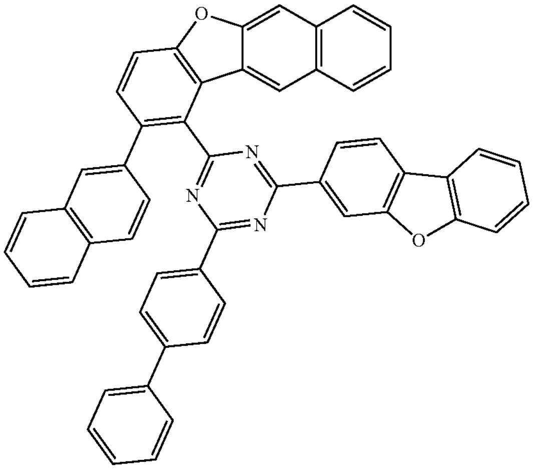

-continued
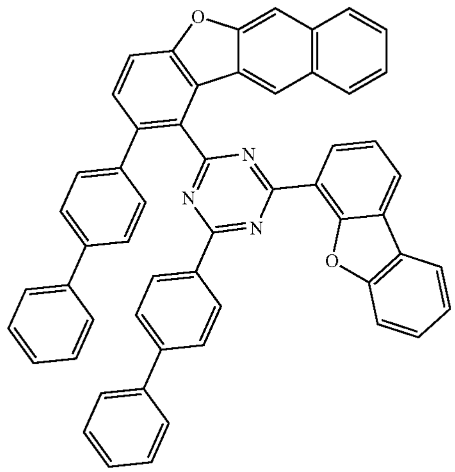
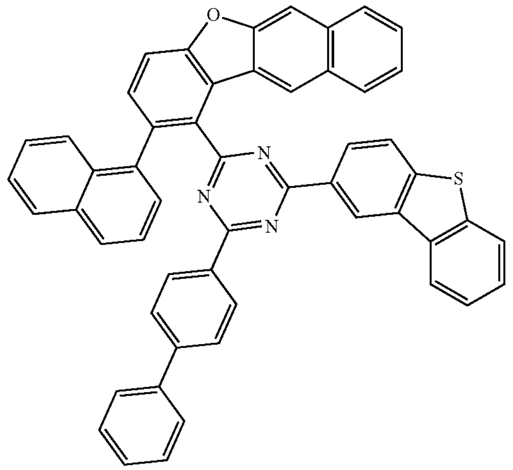
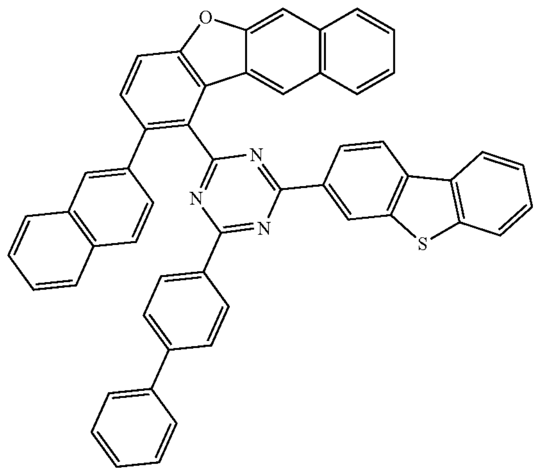
-continued
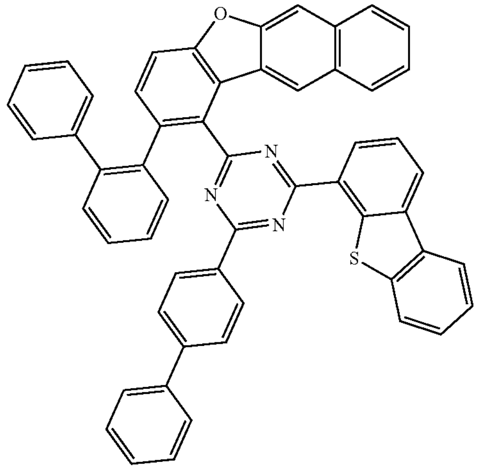
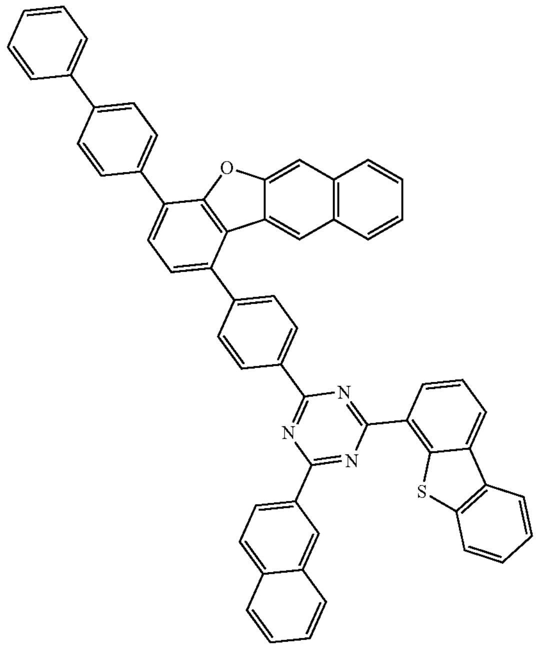
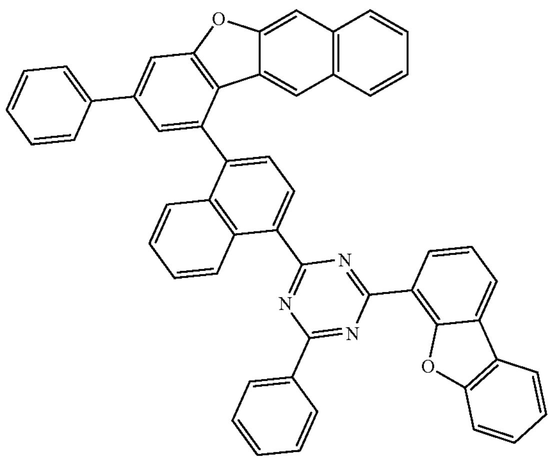

-continued
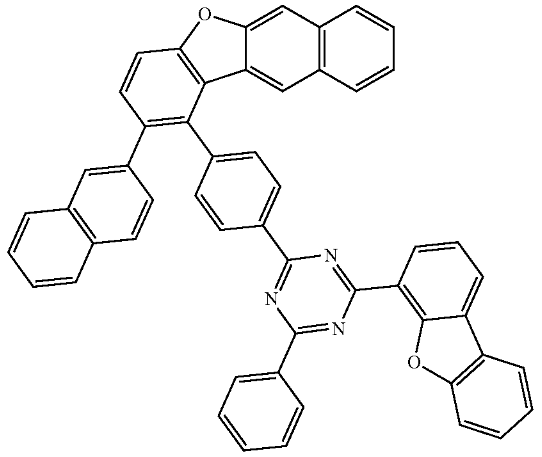
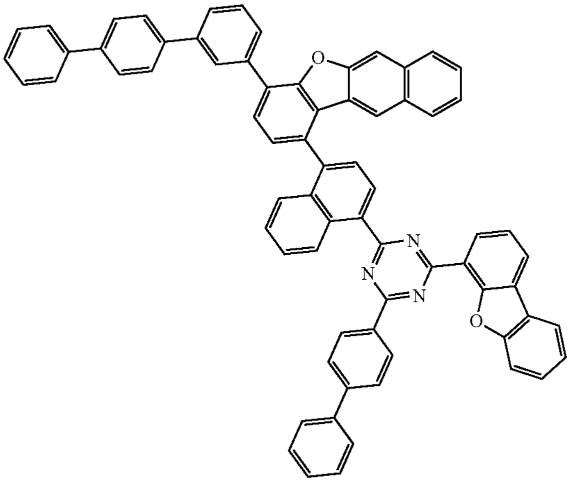
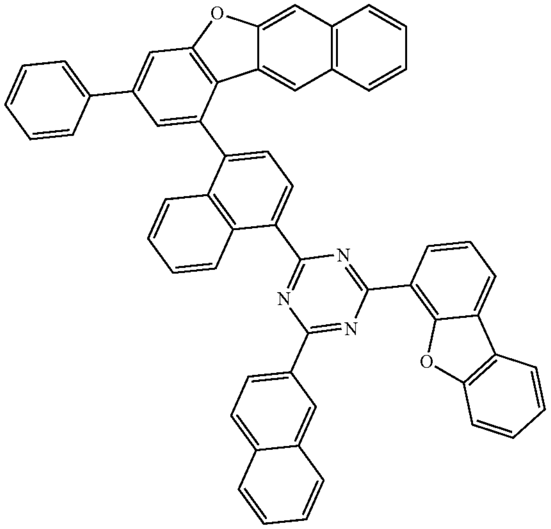
-continued
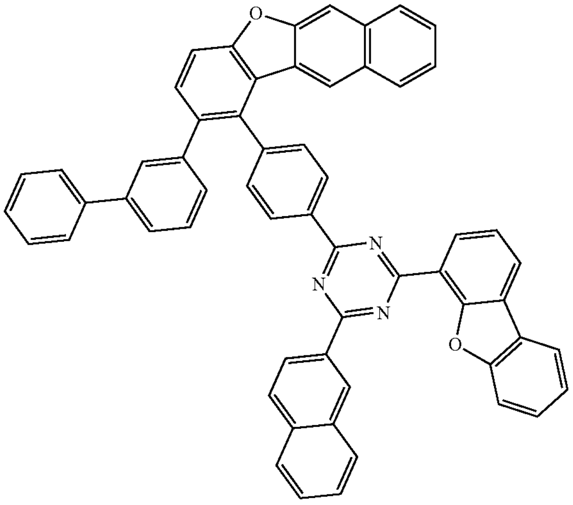
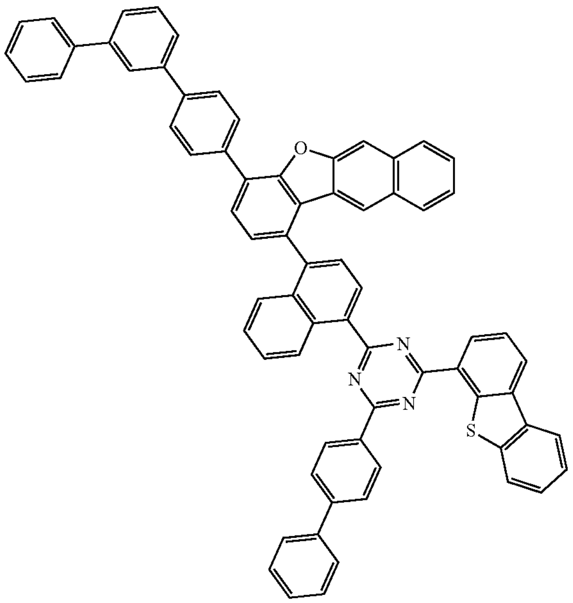
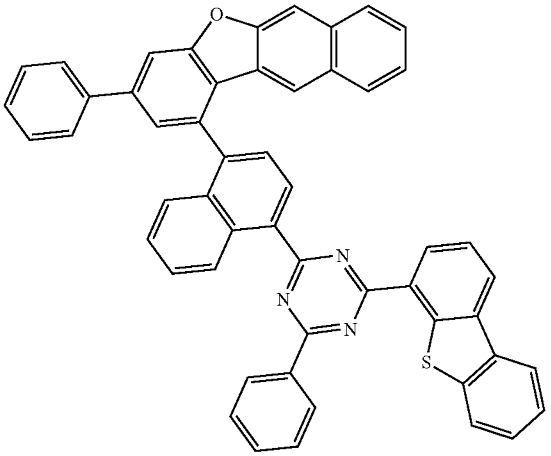

-continued
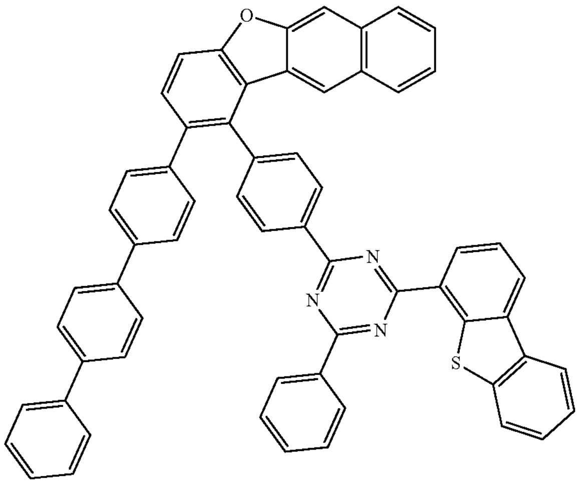
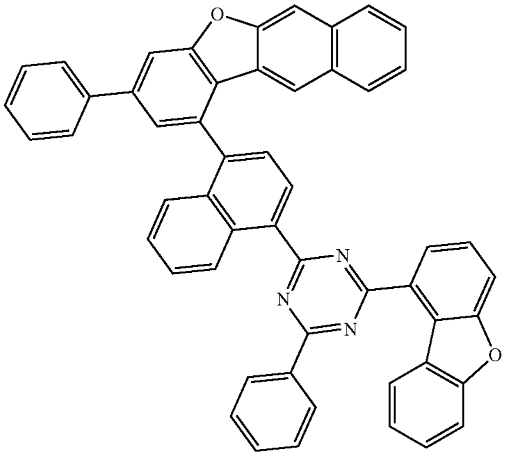
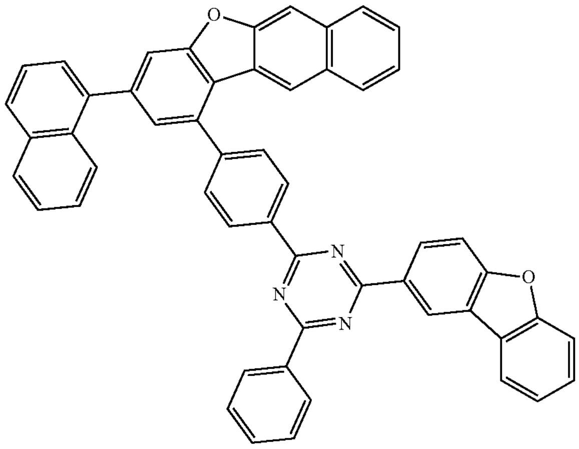
-continued
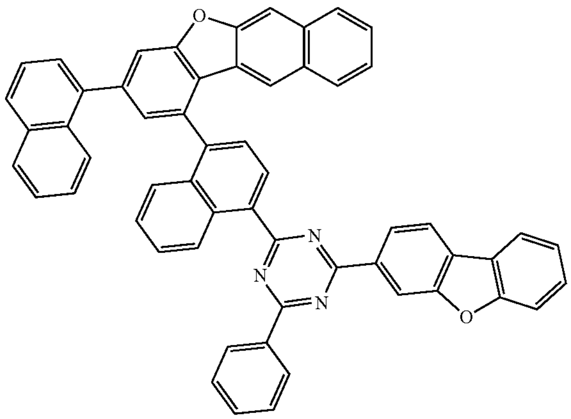
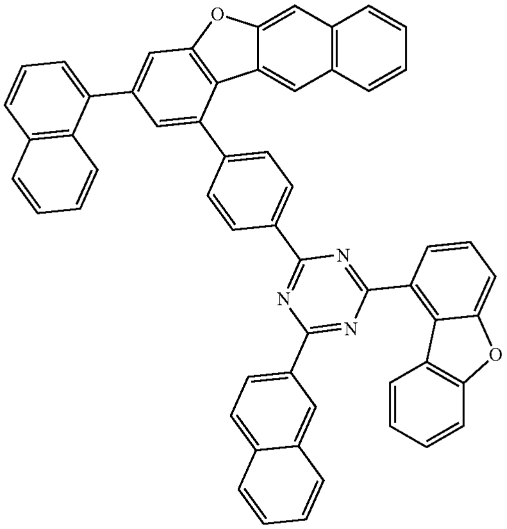
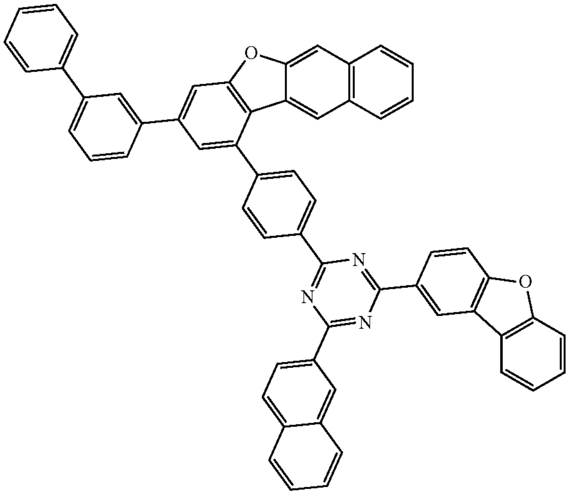

-continued
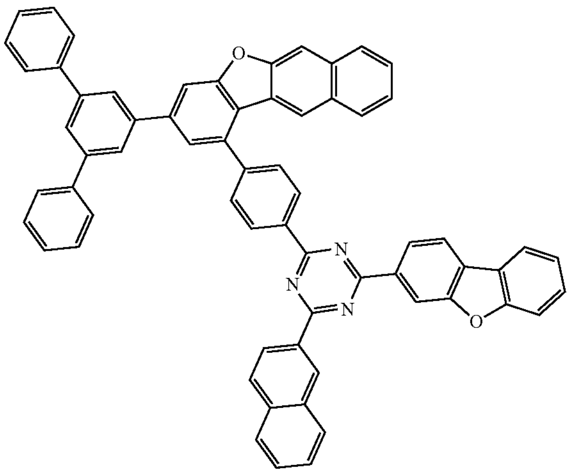
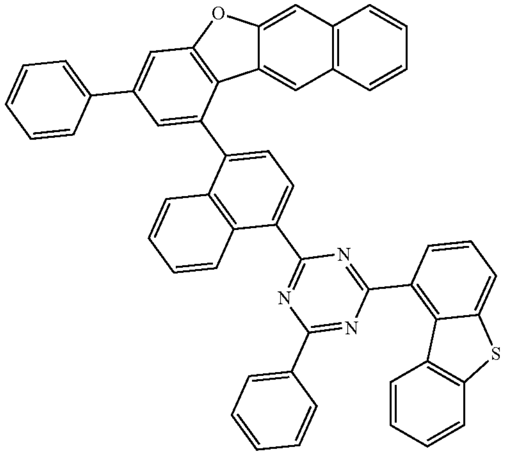
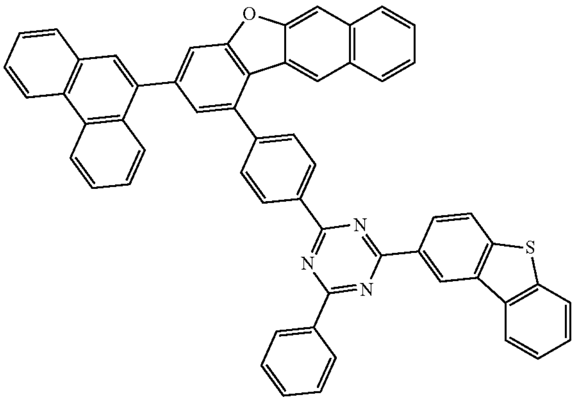
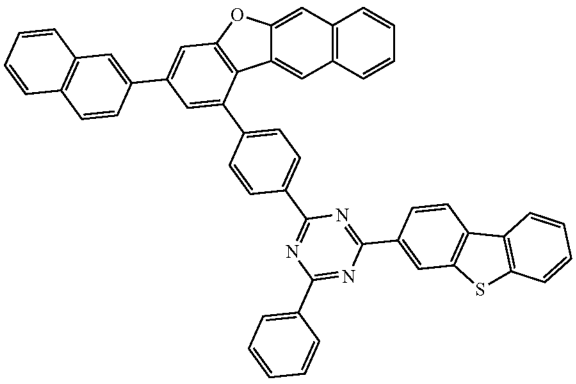
-continued
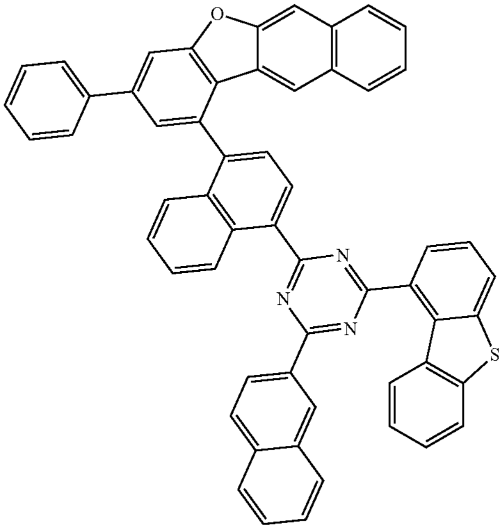
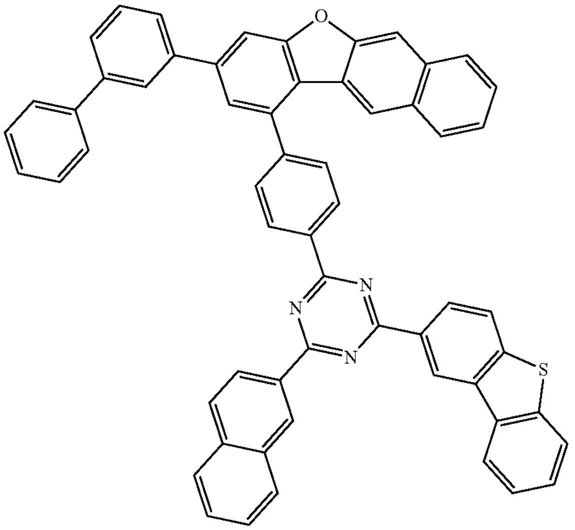
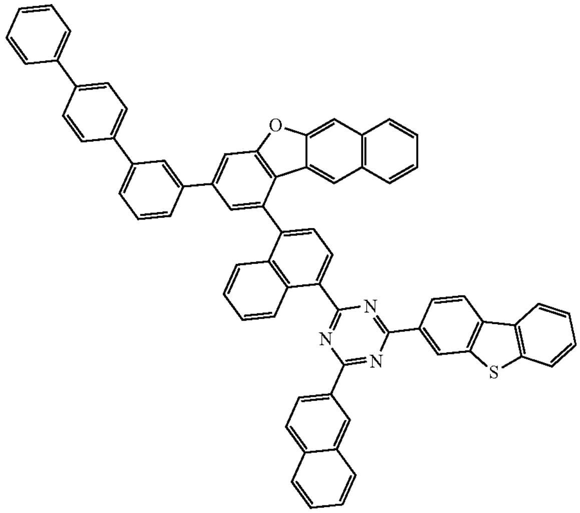

-continued
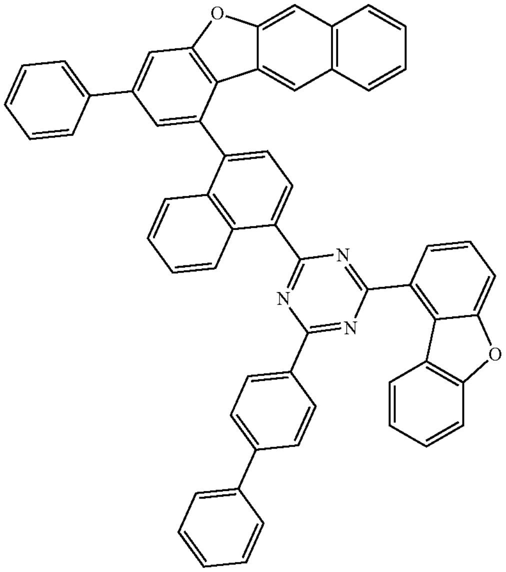
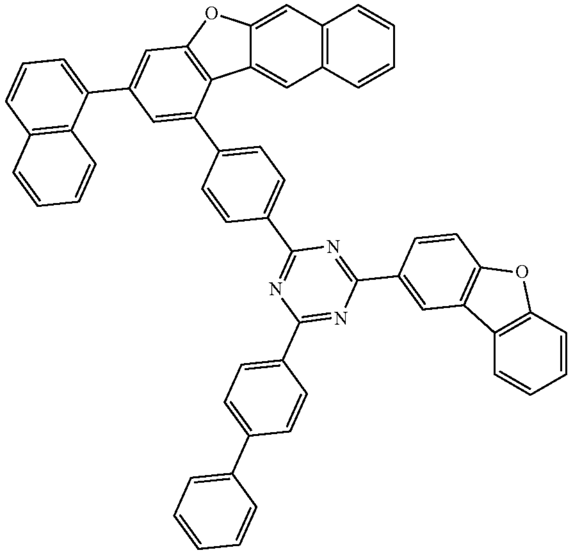
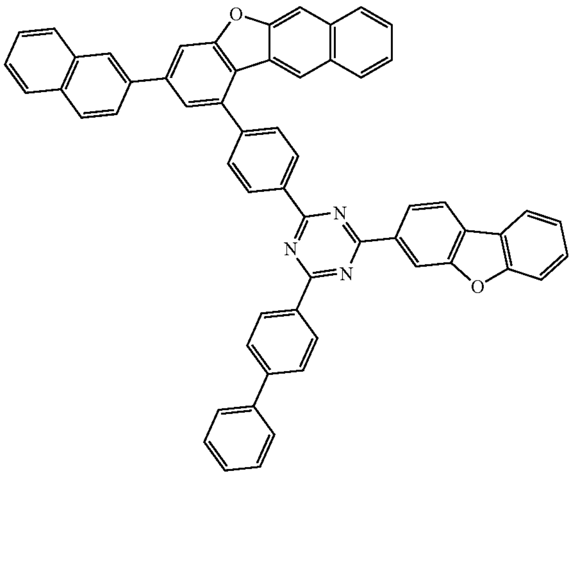
-continued
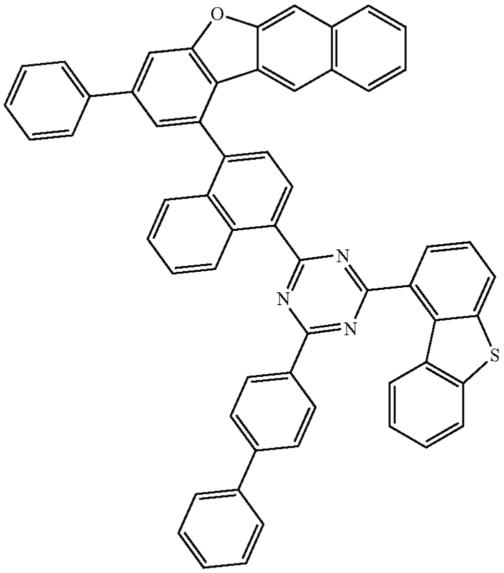
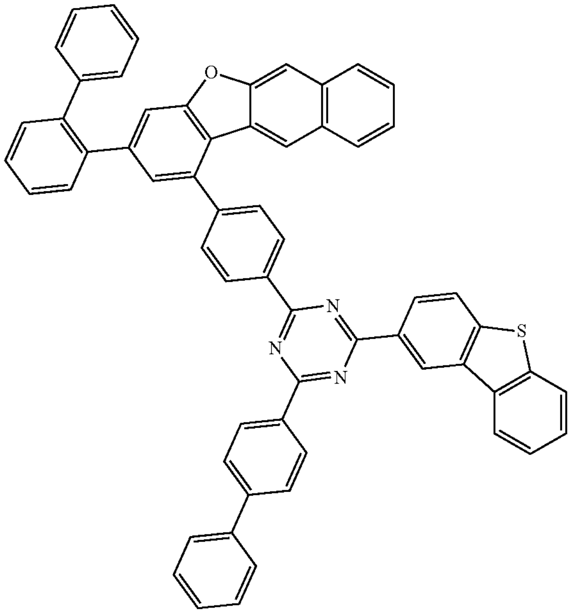
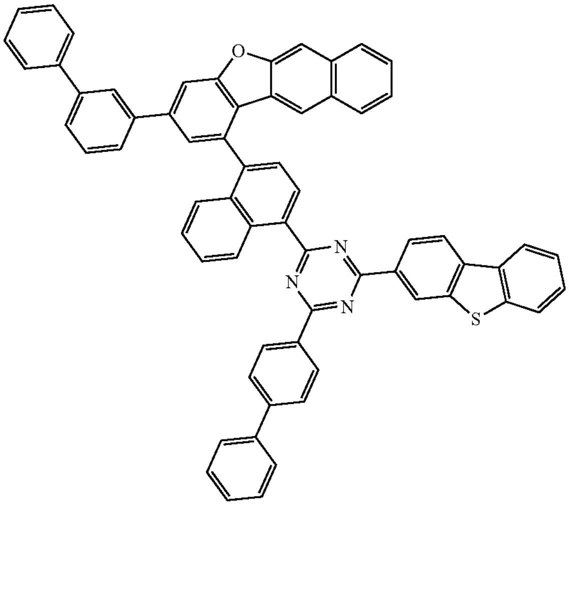

-continued
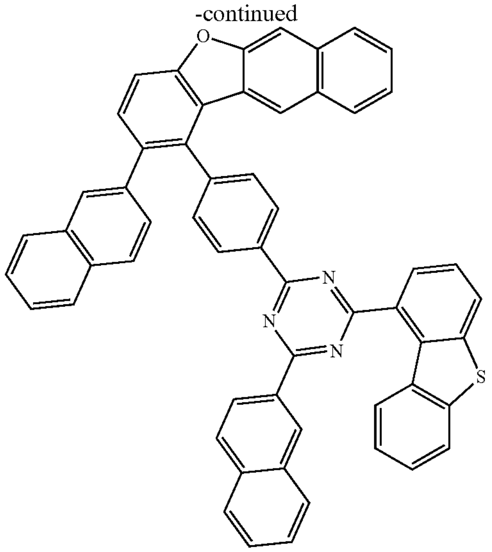
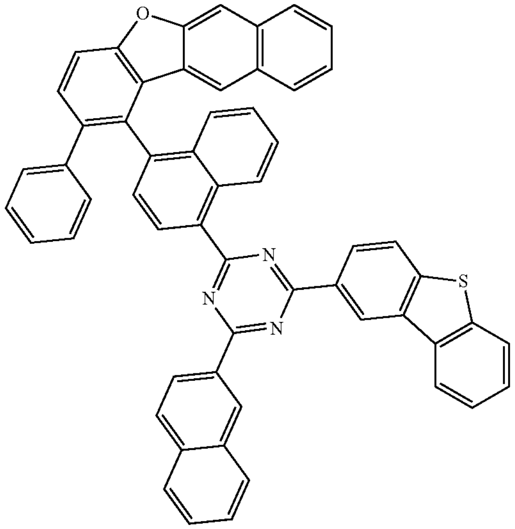
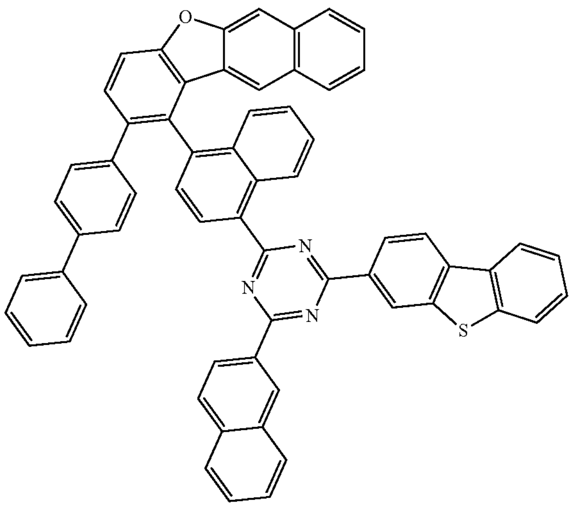
-continued
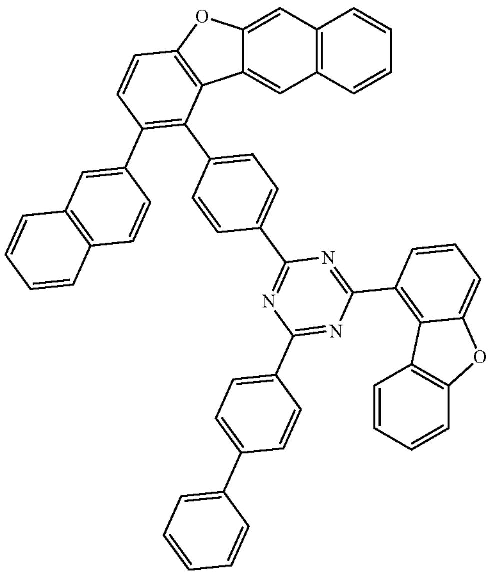
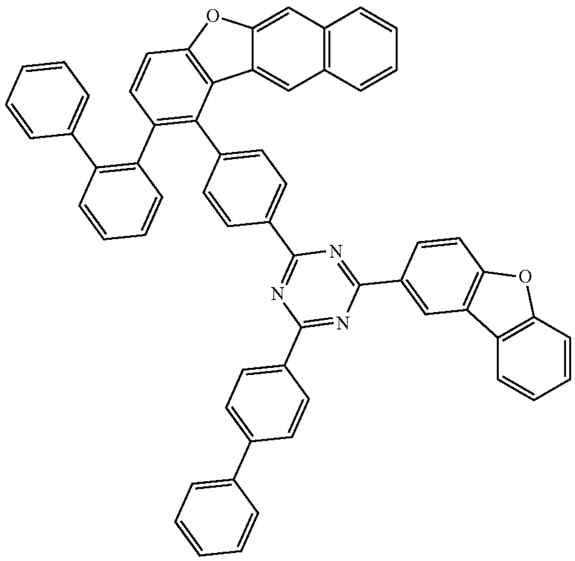
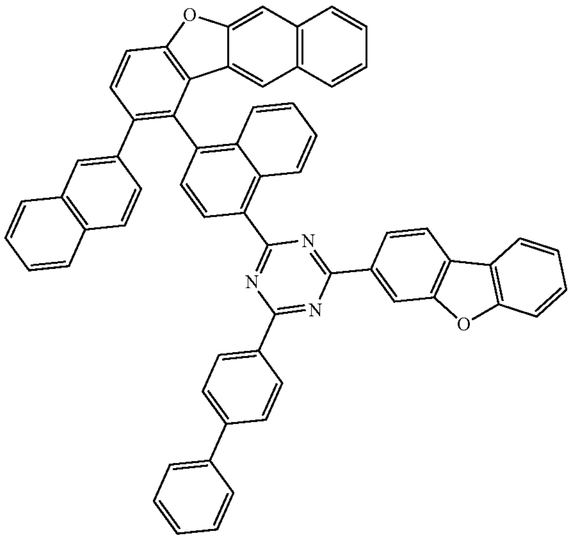

-continued
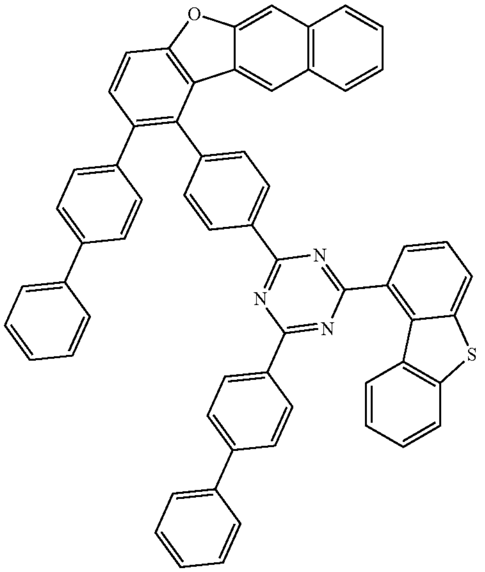
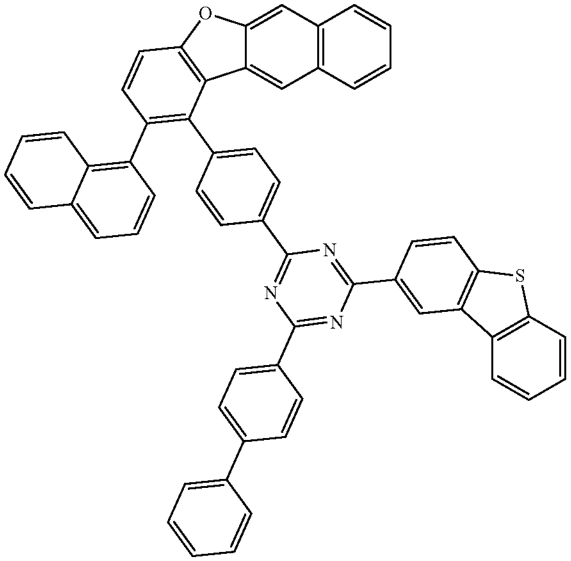
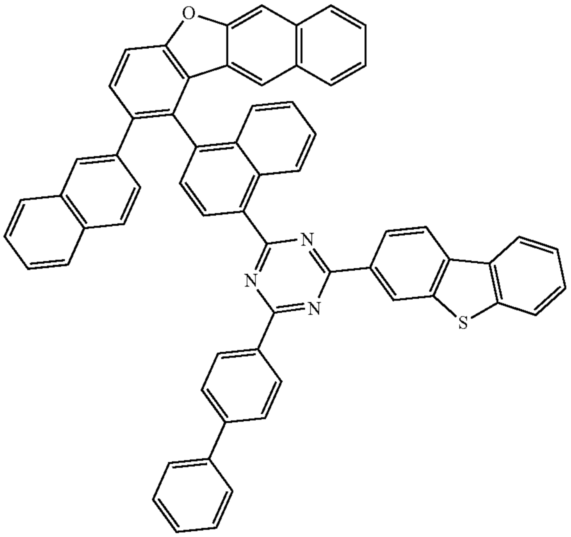
-continued
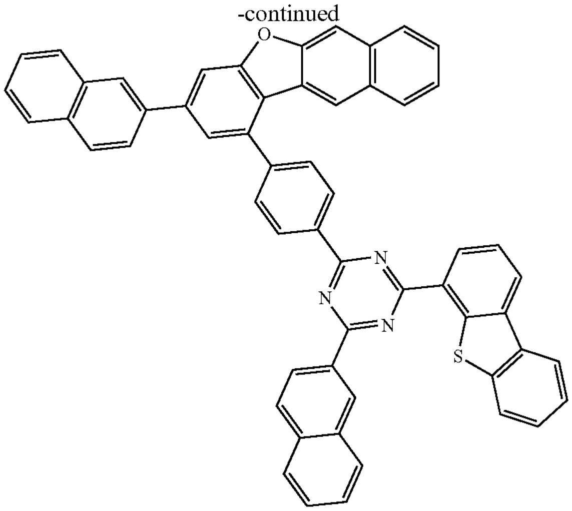
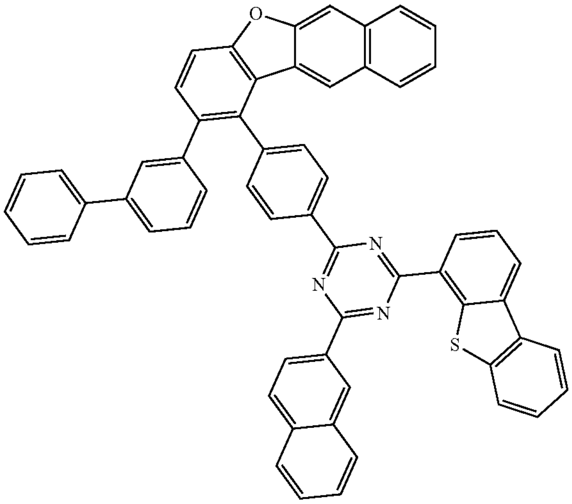
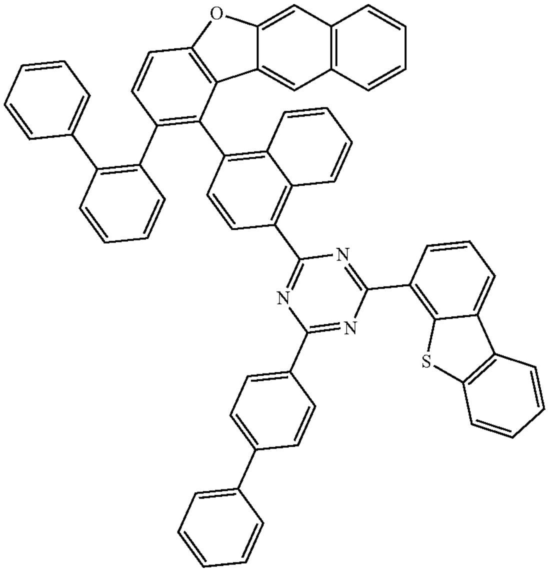

-continued
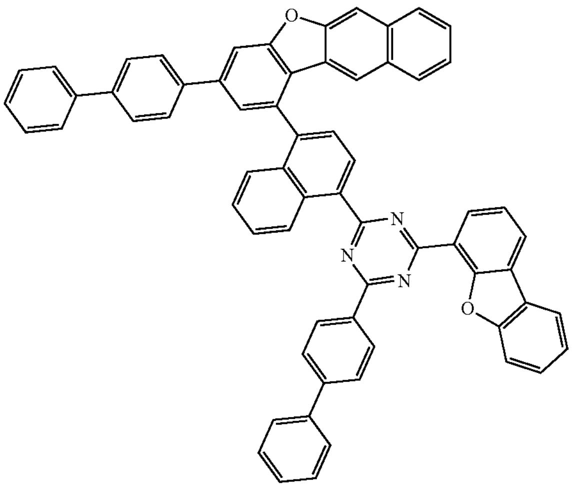
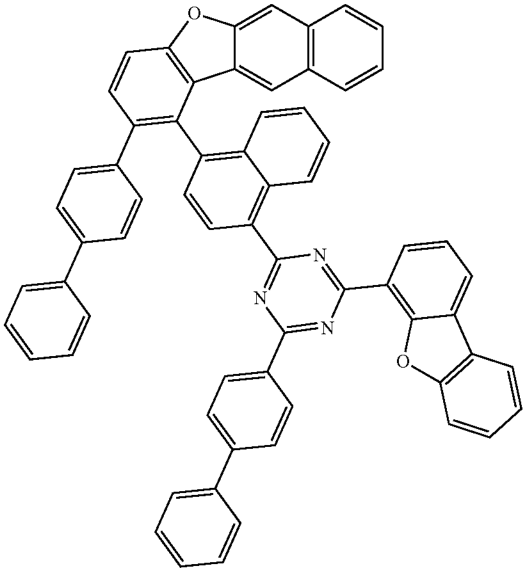
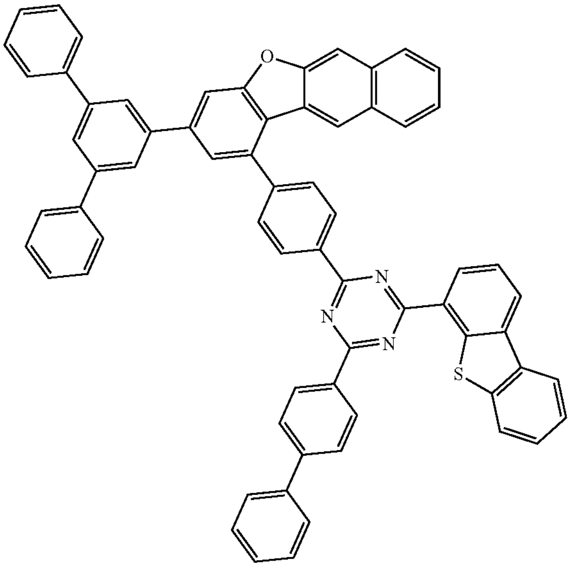
-continued
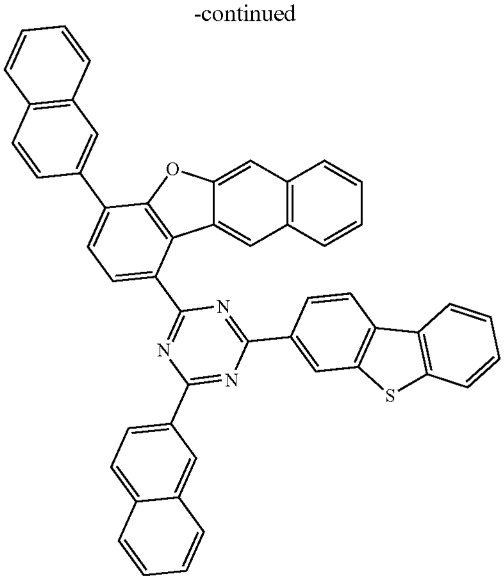
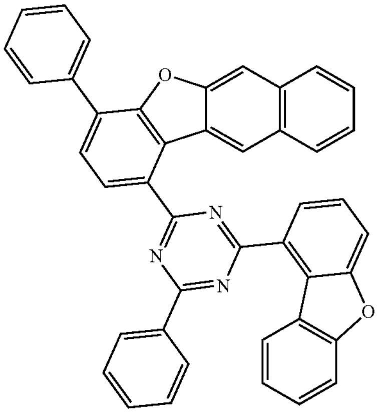
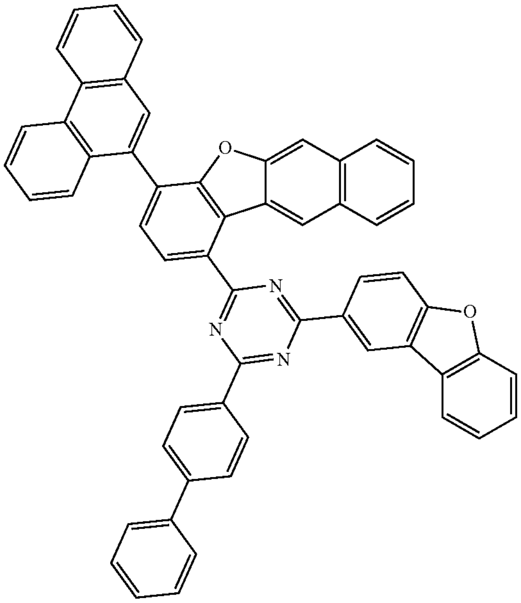

-continued

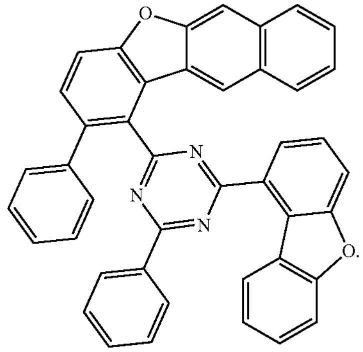 [SMILES: c1ccc(-c2nc(-c3cccc4oc5ccccc5c34)nc(-c3c(-c4ccccc4)ccc4oc5cc6ccccc6cc5c34)n2)cc1]

The compound represented by Chemical Formula 1 may be prepared by a preparation method as shown in the following Reaction Scheme 1.

[Reaction Scheme 1]

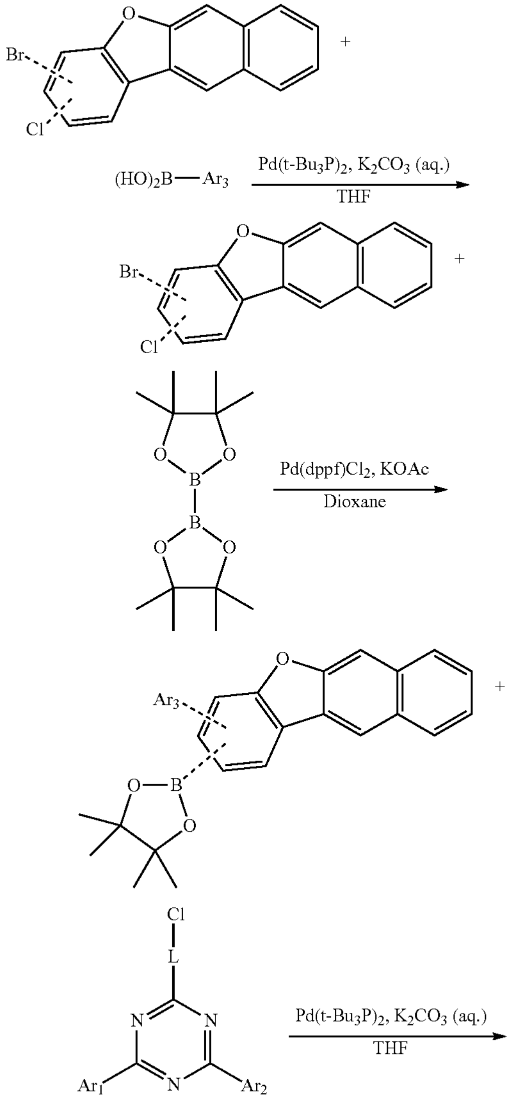

-continued

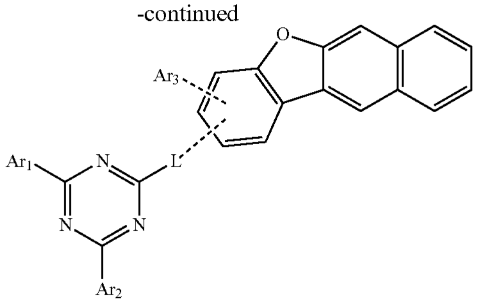

wherein in Reaction Scheme 1, $Ar_1$ to $Ar_3$ and L are the same as defined above.

Organic Light Emitting Device

On the other hand, the present disclosure provides an organic light emitting device comprising the compound represented by Chemical Formula 1. As an example, the present disclosure provides an organic light emitting device comprising: a first electrode; a second electrode that is provided to face the first electrode; and an organic material layer including one or more layers that are provided between the first electrode and the second electrode, wherein one or more layers of the organic material layer include the compound represented by Chemical Formula 1.

The organic material layer of the organic light emitting device of the present disclosure may have a single-layer structure, or it may have a multilayered structure in which two or more organic material layers are stacked. For example, the organic light emitting device of the present disclosure may have a structure comprising a hole injection layer, a hole transport layer, a light emitting layer, an electron transport layer, an electron injection layer and the like as the organic material layer. However, the structure of the organic light emitting device is not limited thereto, and it may include a smaller number of organic layers.

Further, the organic material layer may include a hole injection layer, a hole transport layer, or a layer for simultaneously performing hole injection and transport, wherein the hole injection layer, the hole transport layer, or the layer for simultaneously performing hole injection and transport may include the compound represented by Chemical Formula 1.

Further, the organic material layer may include a light emitting layer, wherein the light emitting layer includes the compound represented by Chemical Formula 1.

The organic material layer of the organic light emitting device of the present disclosure may have a single-layer structure, or it may have a multilayered structure in which two or more organic material layers are stacked. For example, the organic light emitting device of the present disclosure may have a structure further comprising a hole injection layer and a hole transport layer provided between the first electrode and the light emitting layer, and an electron transport layer and an electron injection layer provided between the light emitting layer and the second electrode, in addition to the light emitting layer as the organic material layer. However, the structure of the organic light emitting device is not limited thereto, and it may include a smaller number of organic material layers or a larger number of organic material layers.

Further, the organic light emitting device according to the present disclosure may be a normal type organic light emitting device in which an anode, one or more organic material layers and a cathode are sequentially stacked on a substrate wherein the first electrode is an anode, and the second electrode is a cathode. Further, the organic light emitting device according to the present disclosure may be an inverted type organic light emitting device in which a cathode, one or more organic material layers and an anode are sequentially stacked on a substrate wherein the first electrode is a cathode and the second electrode is an anode. For example, the structure of an organic light emitting device according to an embodiment of the present disclosure is illustrated in FIGS. 1 and 2.

FIG. 1 shows an example of an organic light emitting device comprising a substrate 1, an anode 2, a hole transport layer 3, a light emitting layer 4, an electron injection and transport layer 5, and a cathode 6. In such a structure, the compound represented by Chemical Formula 1 may be included in the hole transport layer.

Figure 2:
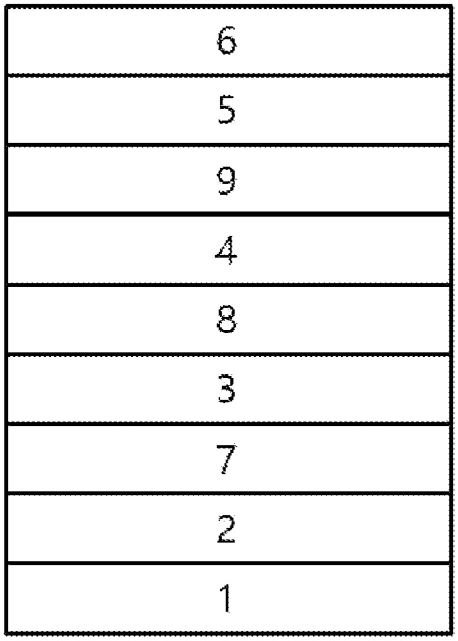
FIG. 2 shows an example of an organic light emitting device comprising a substrate 1, an anode 2, a hole injection layer 7, a hole transport layer 3, an electron blocking layer 8, a light emitting layer 4, a hole blocking layer 9, an electron injection and transport layer 5, and a cathode 6.

FIG. 2 shows an example of an organic light emitting device comprising a substrate 1, an anode 2, a hole injection layer 7, a hole transport layer 3, an electron blocking layer 8, a light emitting layer 4, a hole blocking layer 9, an electron injection and transport layer 5, and a cathode 6. In such a structure, the compound represented by Chemical Formula 1 may be included in the hole injection layer, the hole transport layer, or the electron blocking layer.

The organic light emitting device according to the present disclosure may be manufactured by materials and methods known in the art, except that one or more layers of the organic material layers include the compound represented by Chemical Formula 1. Moreover, when the organic light emitting device includes a plurality of organic material layers, the organic material layers may be formed of the same material or different materials.

For example, the organic light emitting device according to the present disclosure can be manufactured by sequentially stacking a first electrode, an organic material layer and a second electrode on a substrate.

In this case, the organic light emitting device may be manufactured by depositing a metal, metal oxides having conductivity, or an alloy thereof on the substrate using a PVD (physical vapor deposition) method such as a sputtering method or an e-beam evaporation method to form an anode, forming organic material layers including the hole injection layer, the hole transport layer, the light emitting layer and the electron transport layer thereon, and then depositing a material that can be used as the cathode thereon. In addition to such a method, the organic light emitting device may be manufactured by sequentially depositing a cathode material, an organic material layer and an anode material on a substrate.

Further, the compound represented by Chemical Formula 1 may be formed into an organic material layer by a solution coating method as well as a vacuum deposition method at the time of manufacturing an organic light emitting device. Herein, the solution coating method means a spin coating, a dip coating, a doctor blading, an inkjet printing, a screen printing, a spray method, a roll coating, or the like, but is not limited thereto.

In addition to such a method, the organic light emitting device may be manufactured by sequentially depositing a cathode material, an organic material layer and an anode material on a substrate (International Publication WO2003/012890). However, the manufacturing method is not limited thereto.

As an example, the first electrode is an anode, and the second electrode is a cathode, or alternatively, the first electrode is a cathode and the second electrode is an anode.

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or $SnO_2$:Sb; conductive polymers such as poly(3-methylthiophene), poly[3,4-(ethylene-1,2-dioxy)thiophene](PEDOT), polypyrrole, and polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or $LiO_2$/Al, and the like, but are not limited thereto.

The hole injection layer is a layer for injecting holes from the electrode, and the hole injection material is preferably a compound which has a capability of transporting the holes, thus has a hole injecting effect in the anode and an excellent hole injecting effect to the light emitting layer or the light emitting material, prevents excitons produced in the light emitting layer from moving to an electron injection layer or the electron injection material, and further is excellent in the ability to form a thin film. It is preferable that a HOMO (highest occupied molecular orbital) of the hole injection material is between the work function of the anode material and a HOMO of a peripheral organic material layer. Specific examples of the hole injection material include metal porphyrine, oligothiophene, an arylamine-based organic material, a hexanitrilehexaazatriphenylene-based organic material, a quinacridone-based organic material, a perylene-based organic material, anthraquinone, polyaniline and polythiophene-based conductive polymer, and the like, but are not limited thereto.

The hole transport layer is a layer that receives holes from a hole injection layer and transports the holes to the light emitting layer. The hole transport layer is suitably a material having large mobility to the holes, which may receive holes from the anode or the hole injection layer and transfer the holes to the light emitting layer. As the hole transport material, the compound represented by Chemical Formula 1 may be used, or an arylamine-based organic material, a conductive polymer, a block copolymer in which a conjugate portion and a non-conjugate portion are present together, and the like, but are not limited thereto.

The electron inhibition layer means a layer which is formed on the hole transport layer, is preferably provided in contact with the light emitting layer, and thus serves to control hole mobility, to prevent excessive movement of electrons, and to increase the probability of hole-electron bonding, thereby improving the efficiency of the organic light emitting device. The electron inhibition layer includes an electron blocking material, and as an example of such an electron blocking material, the compound represented by the Chemical Formula 1 may be used, or an arylamine-based organic material, and the like may be used, but are not limited thereto.

The light emitting material is preferably a material which may receive holes and electrons transported from a hole transport layer and an electron transport layer, respectively, and combine the holes and the electrons to emit light in a visible ray region, and has good quantum efficiency to fluorescence or phosphorescence. Specific examples of the light emitting material include an 8-hydroxy-quinoline aluminum complex ($Alq_3$); a carbazole-based compound; a dimerized styryl compound; BAlq; a 10-hydroxybenzoquinoline-metal compound; a benzoxazole, benzthiazole and benzimidazole-based compound; a poly(p-phenylenevinylene)(PPV)-based polymer; a spiro compound; polyfluorene, lubrene, and the like, but are not limited thereto.

As an example, the light emitting layer may include the compound represented by Chemical Formula 1 alone as a host alone; or may include the compound of Chemical Formula 1 as a first host and, at the same time, further include the compound represented by the following Chemical Formula 4 as a second host:

[Chemical formula 4]

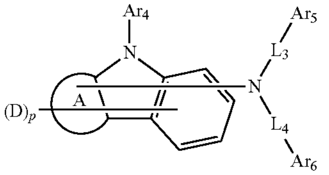

in Chemical Formula 4,

A is a substituted or unsubstituted naphthalene ring, $Ar_4$ is a substituted or unsubstituted $C_{6-60}$ aryl, $L_3$ and $L_4$ are each independently a single bond, or a substituted or unsubstituted $C_{6-60}$ arylene;

$Ar_5$ and $Ar_6$ are each independently a substituted or unsubstituted $C_{6-60}$ aryl, a substituted or unsubstituted $C_{2-60}$ heteroaryl containing any one or more heteroatoms selected from the group consisting of N, O and S, or adamantyl, and p is an integer of 0 to 9.

Preferably, the compound of Chemical Formula 4 is represented by any one of the following Chemical Formulas 4-1 to 4-3:

[Chemical Formula 4-1]

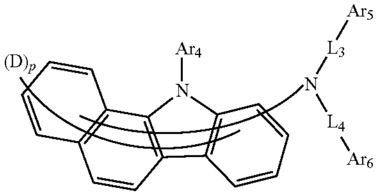

(Chemical Formula 4-2]

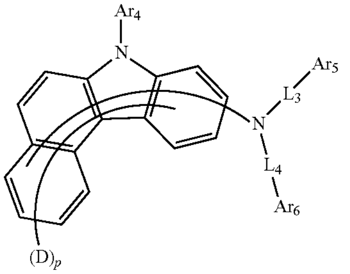

-continued

[Chemical Formula 4-3]

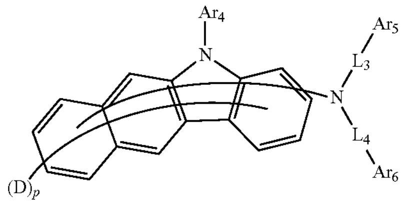

in Chemical Formulas 4-1 to 4-3, $Ar_4$ to $Ar_6$, $L_3$, $L_4$, and p are the same as defined above.

Preferably, $Ar_4$ is phenyl, biphenylyl, or naphthyl, each of which is unsubstituted or substituted with at least one tert-butyl or phenyl.

Preferably, $L_3$ and $L_4$ are each independently a single bond, phenylene, or naphthalenediyl, each of which is independently unsubstituted or substituted with at least one phenyl.

Preferably, $Ar_5$ and $Ar_6$ are each independently phenyl, biphenylyl, terphenylyl, naphthyl, dibenzofuranyl, dibenzothiophenyl, fluorenyl, 9,9-dimethylfluorenyl or adamantyl, each of which is independently unsubstituted or substituted with at least one tert-butyl or phenyl.

Preferably, p is 0.

Representative examples of the compound represented by Chemical Formula 4 are as follows:

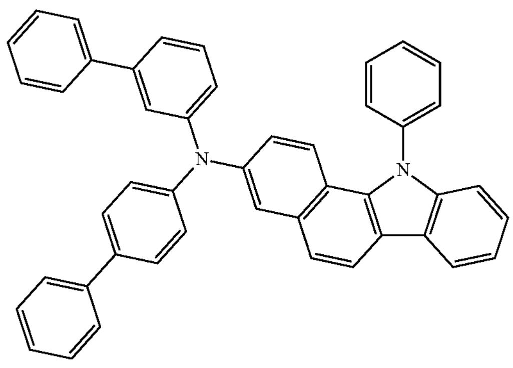

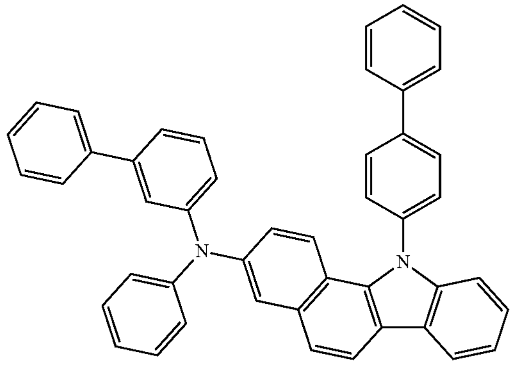

-continued
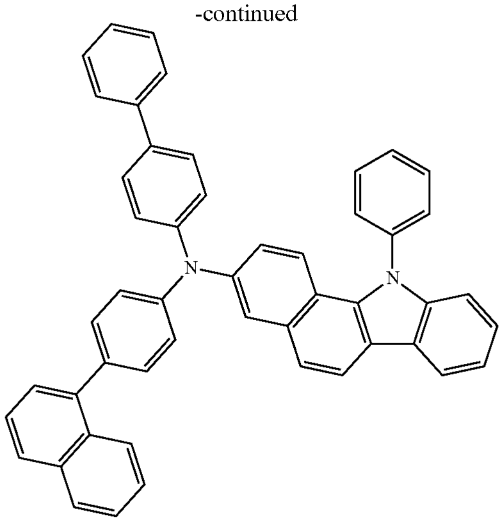
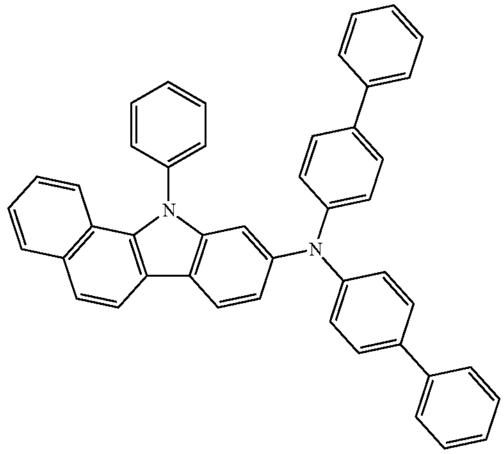
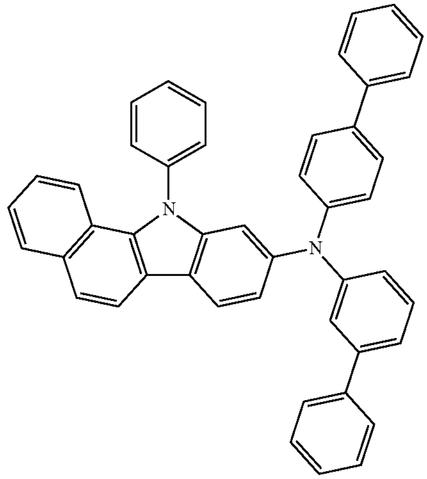
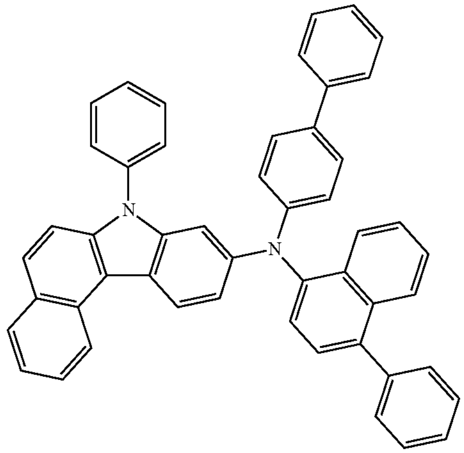
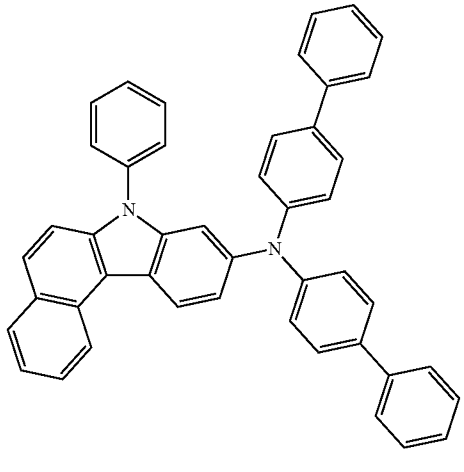
-continued
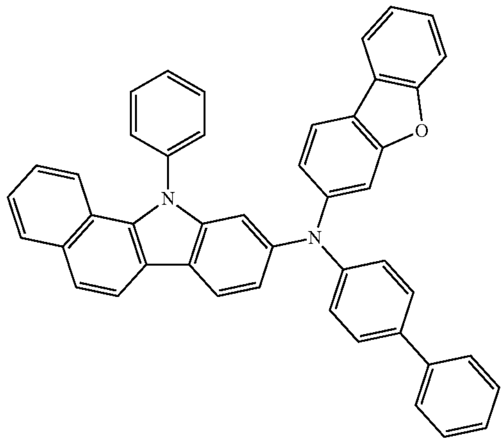

-continued
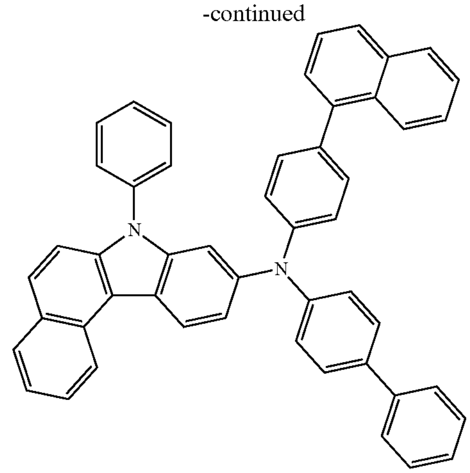
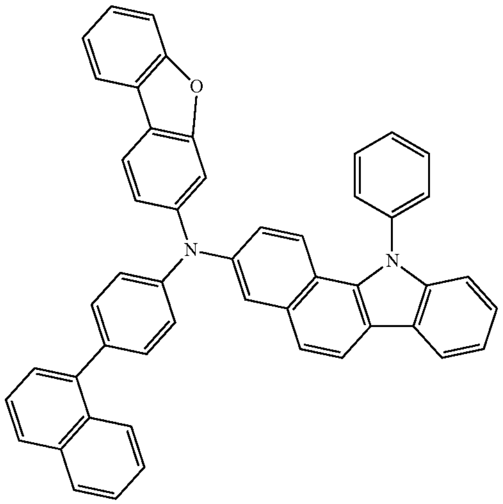
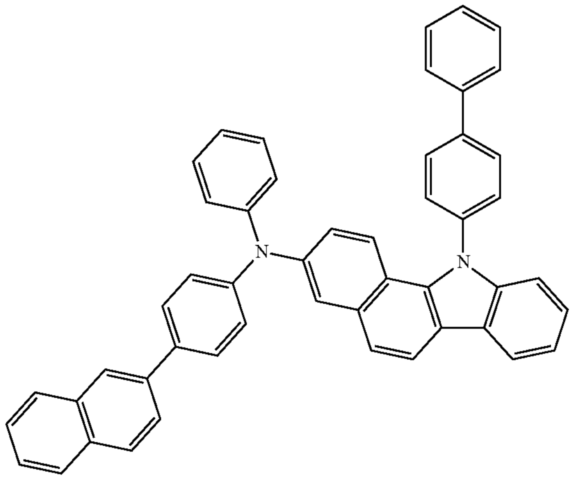
-continued
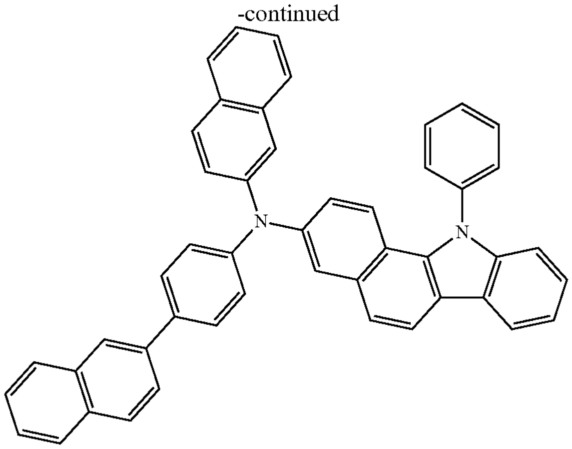
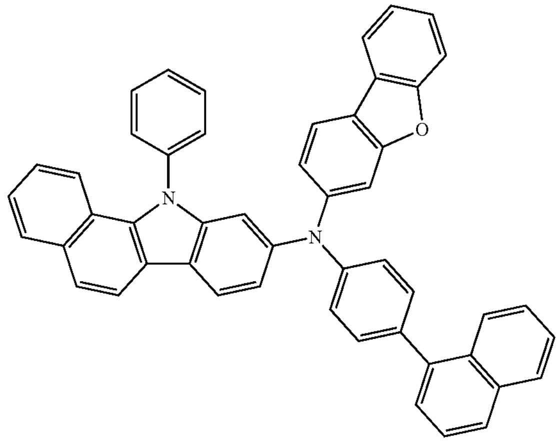
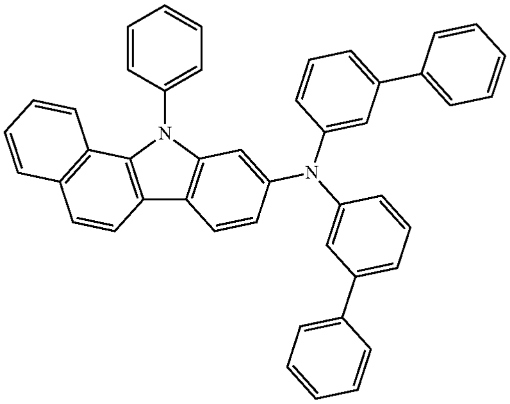
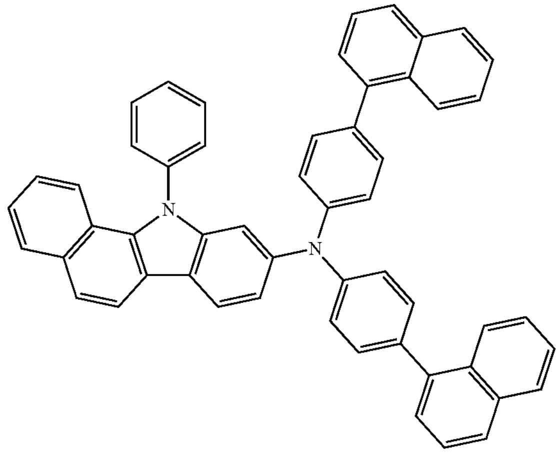

-continued
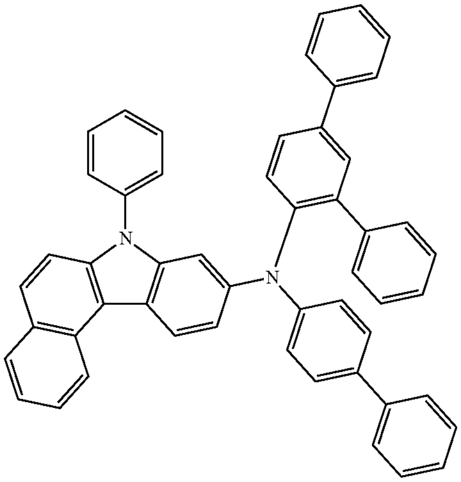
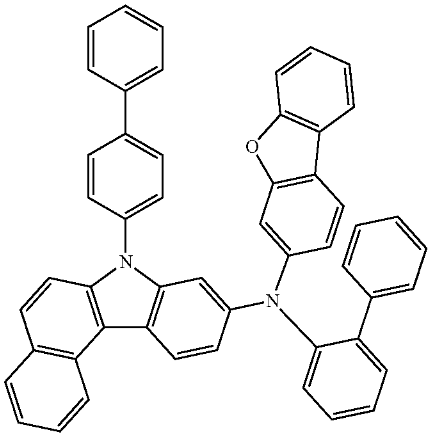
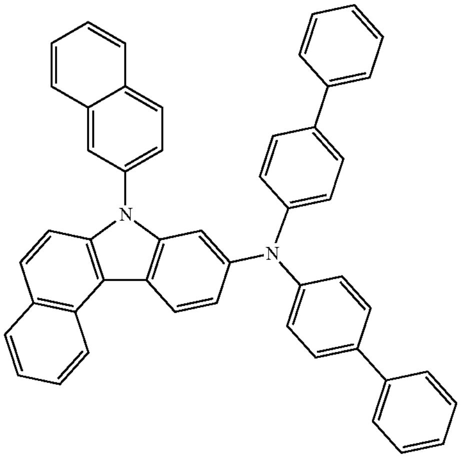
-continued
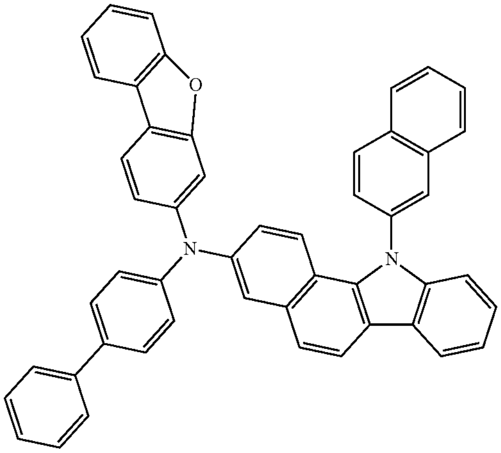
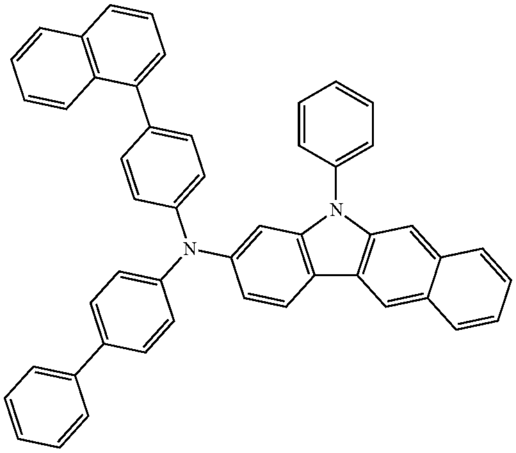
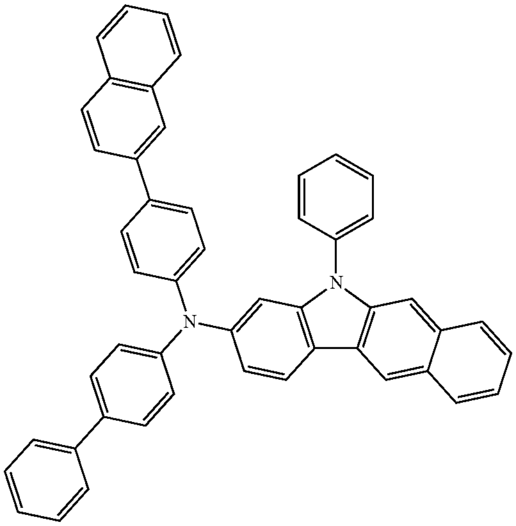

-continued
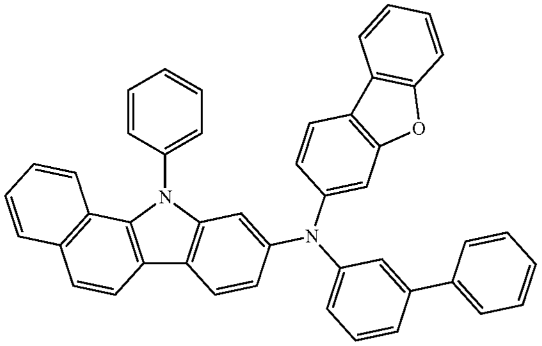
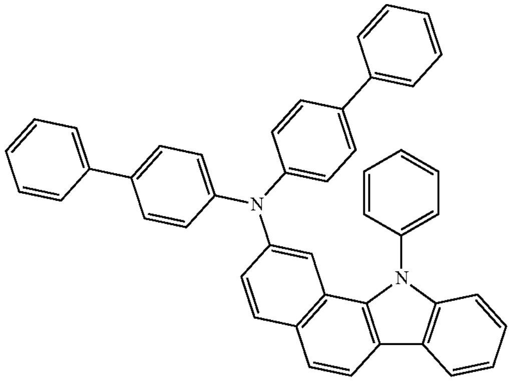
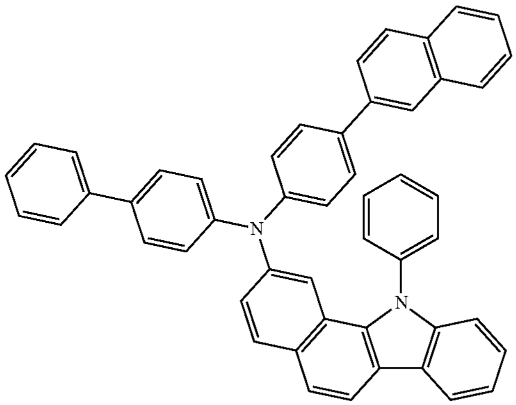
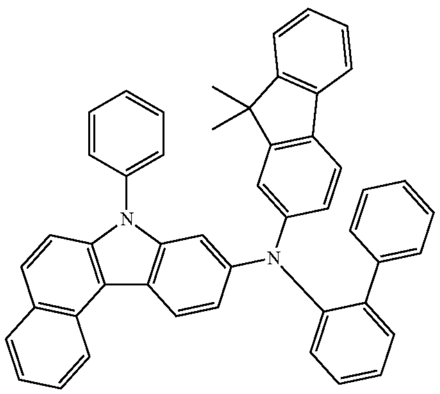
-continued
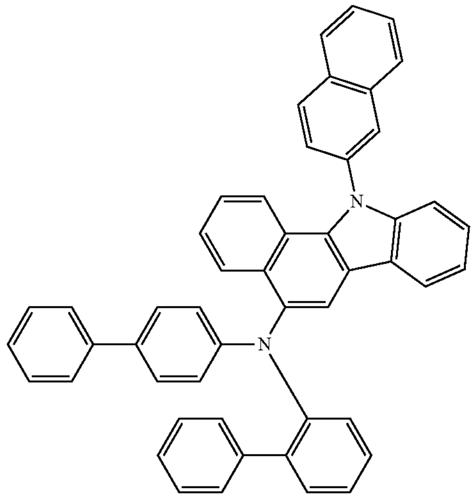
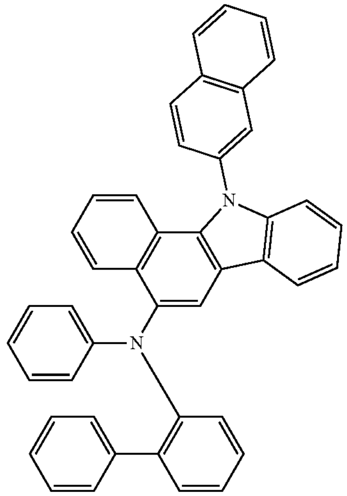
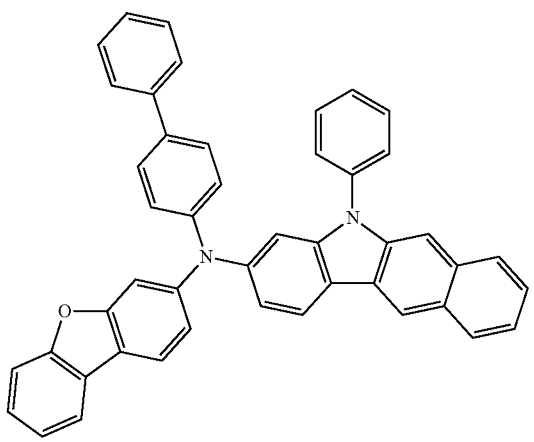

-continued
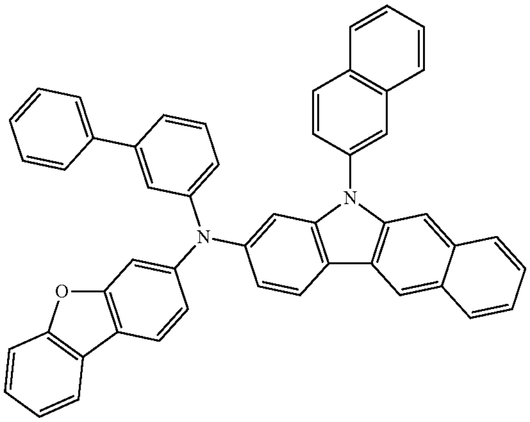
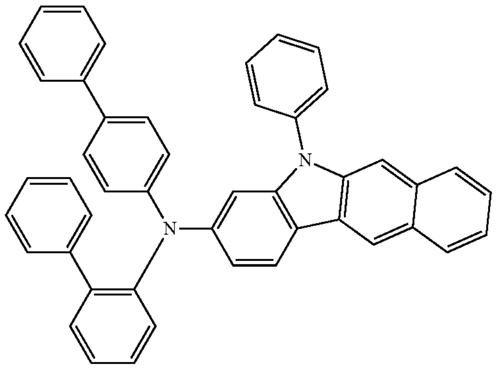
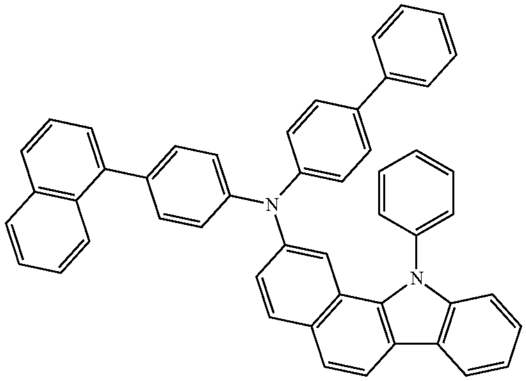
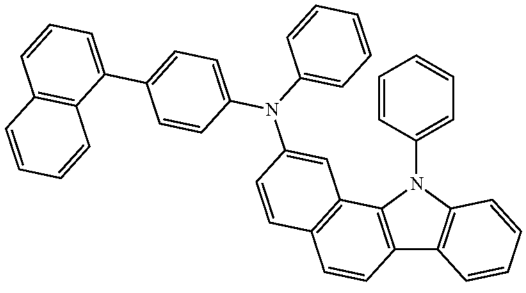
-continued
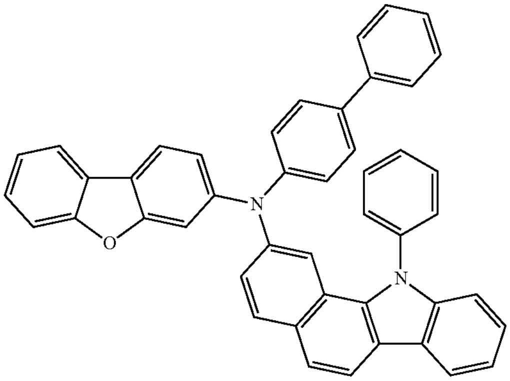
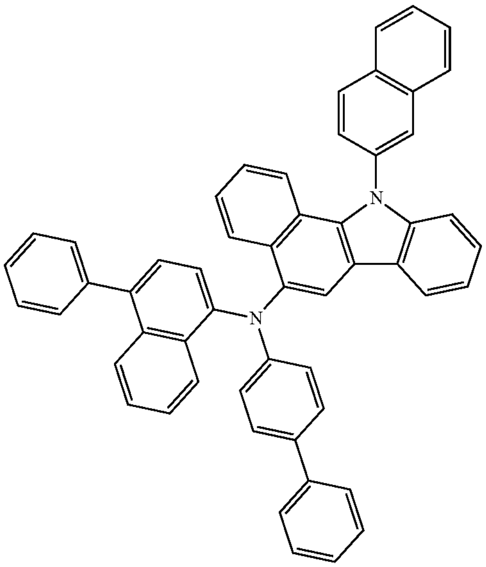
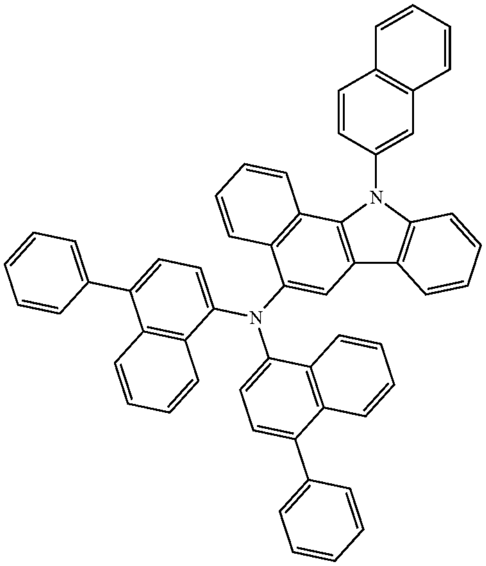

-continued
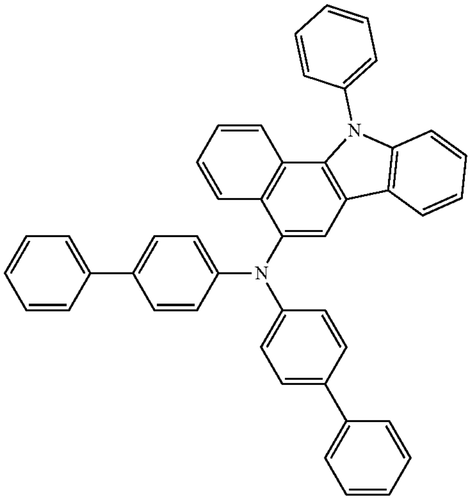
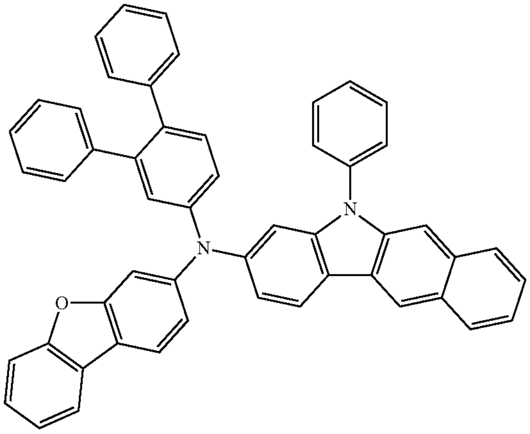
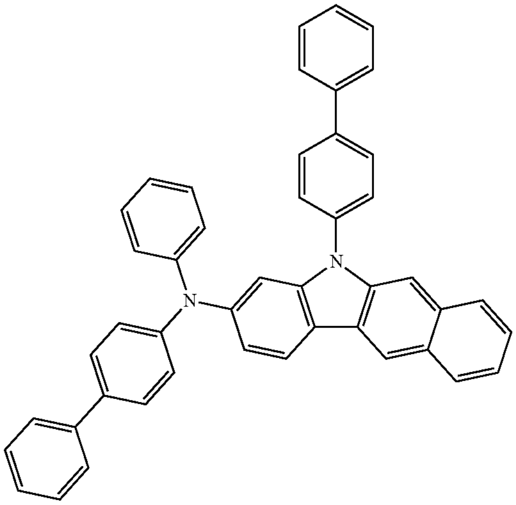
-continued
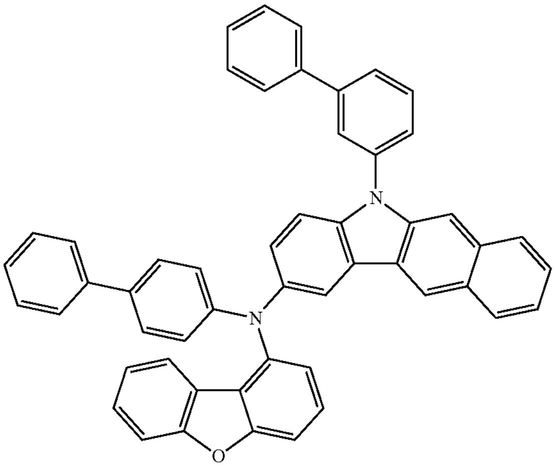
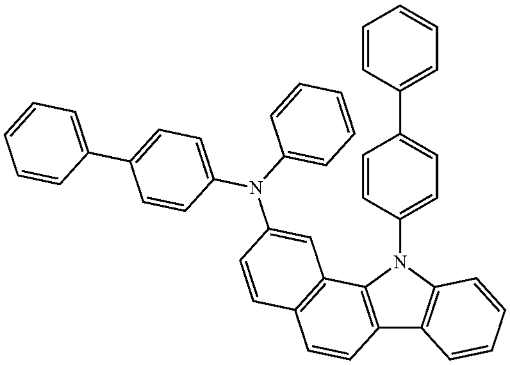
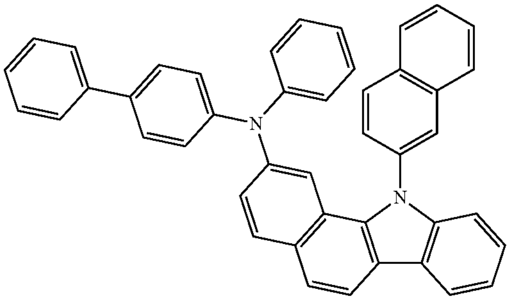
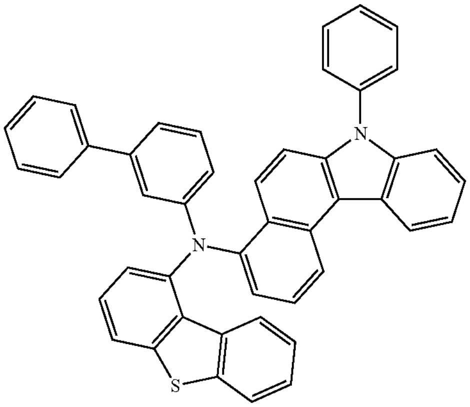

-continued
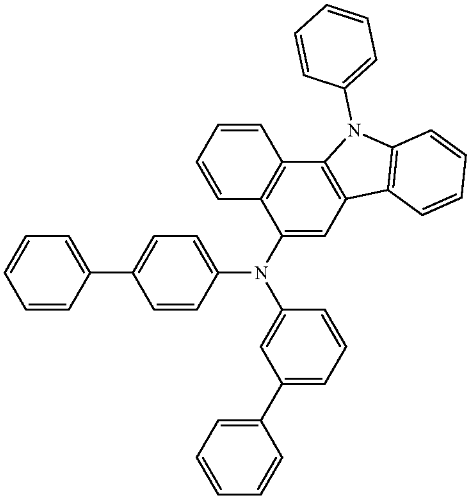
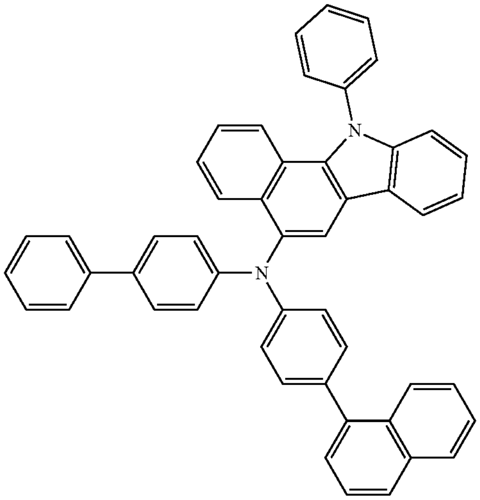
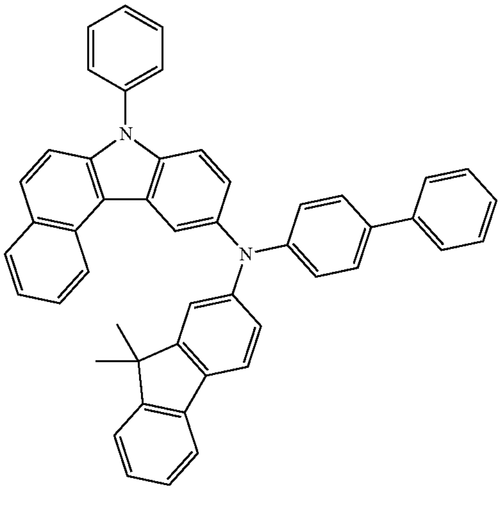
-continued
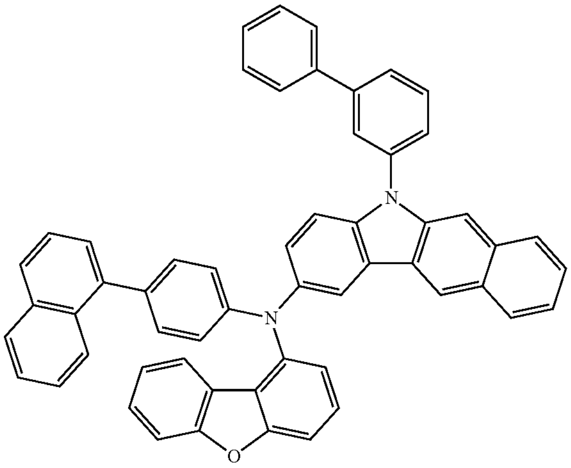
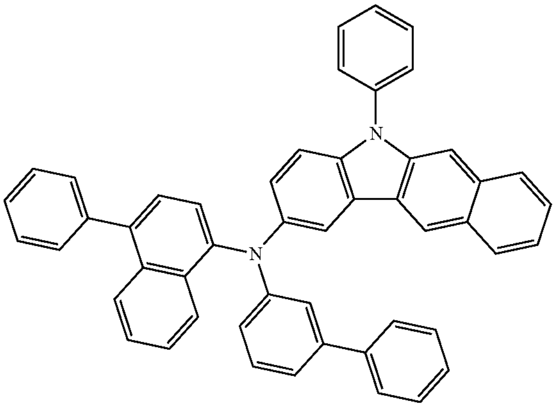
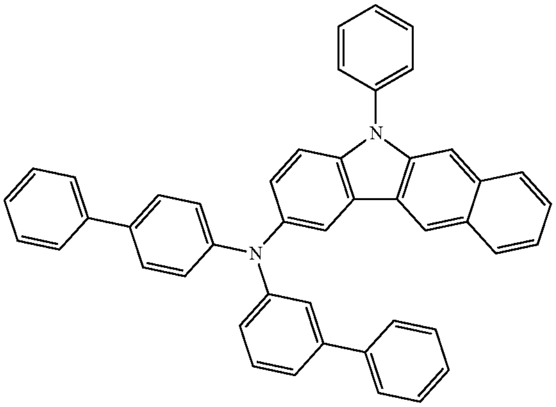
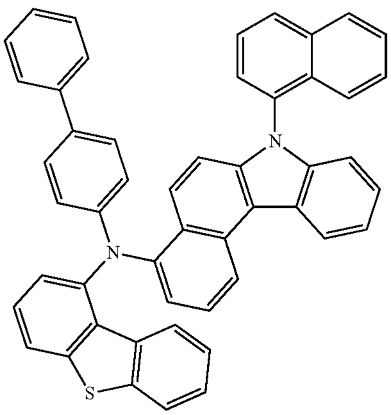

-continued
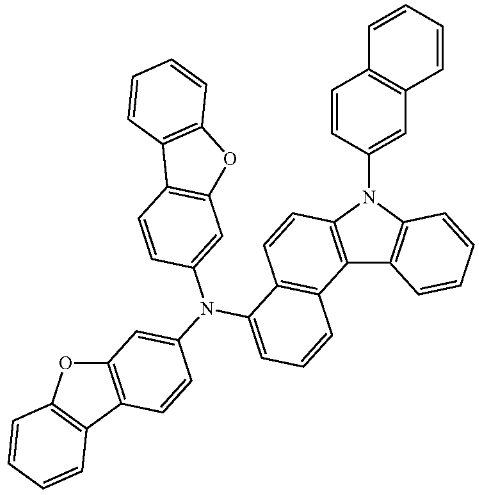
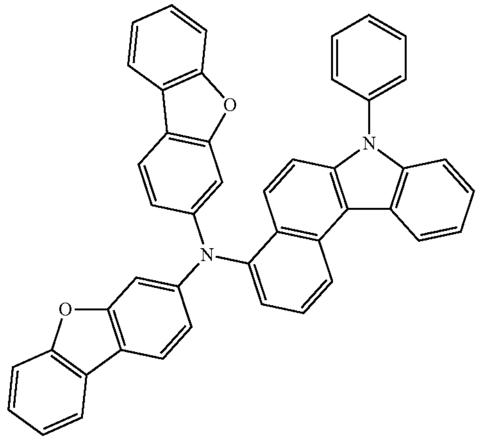
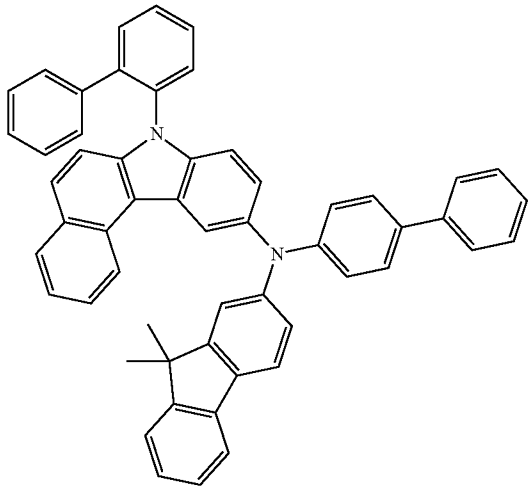
-continued
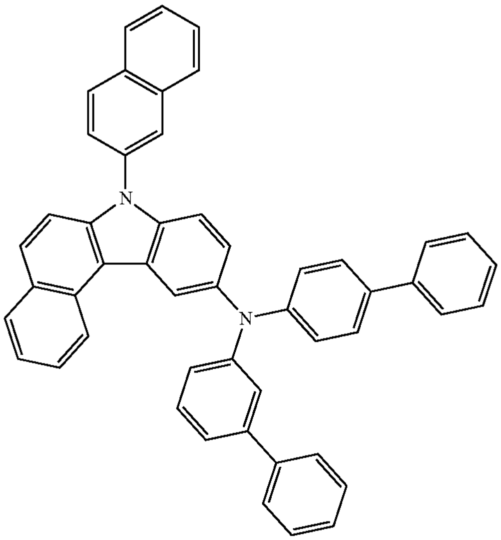
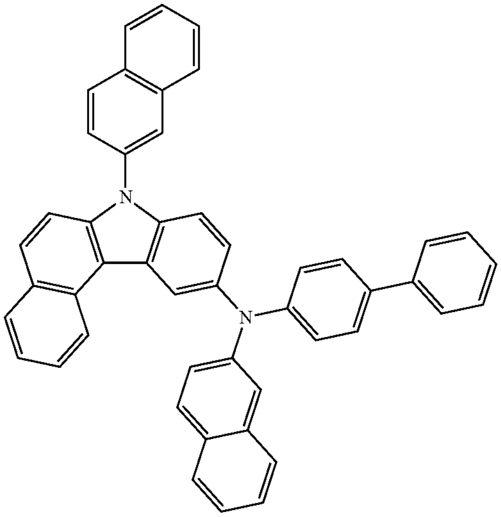
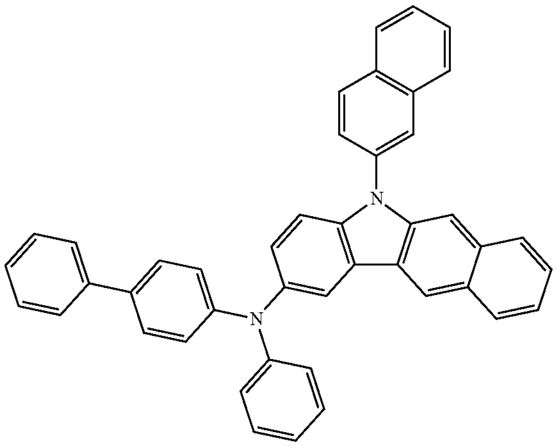

-continued
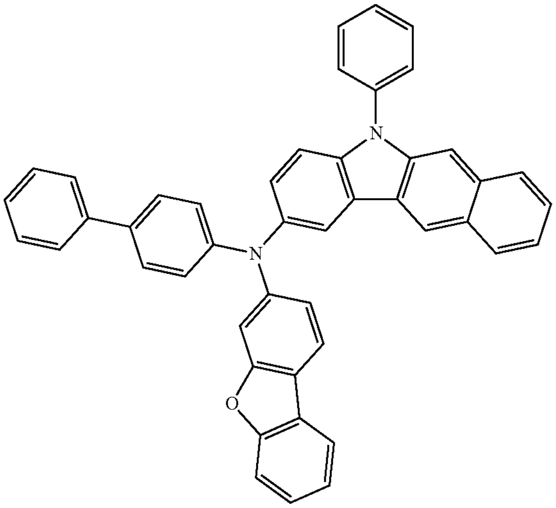
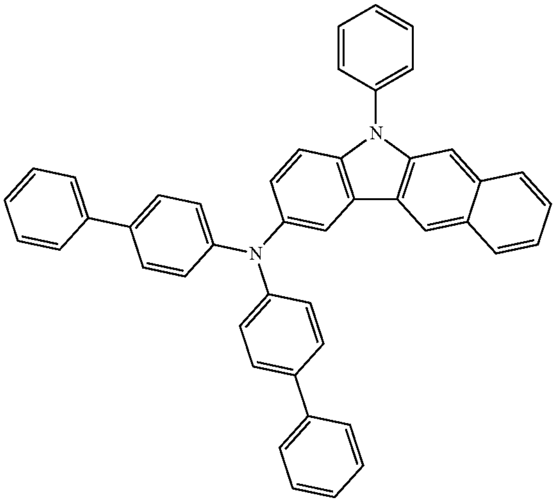
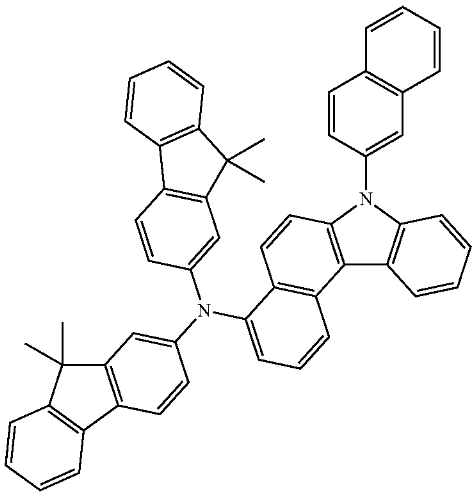
-continued
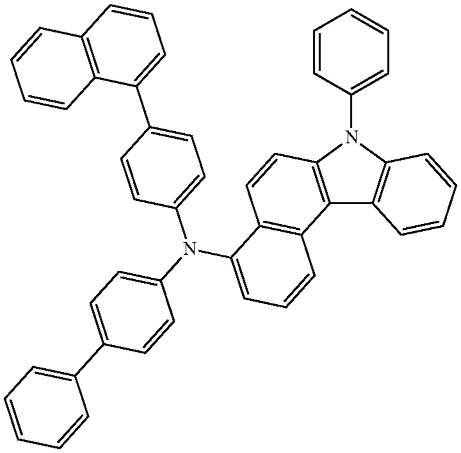
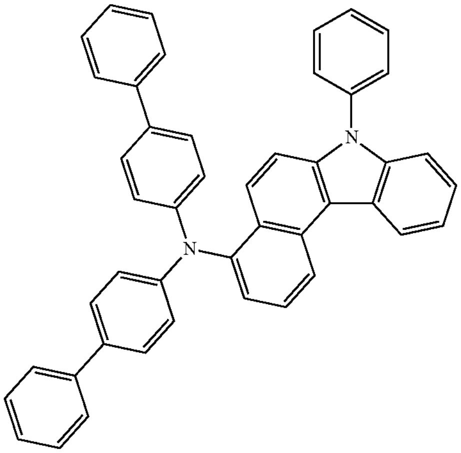
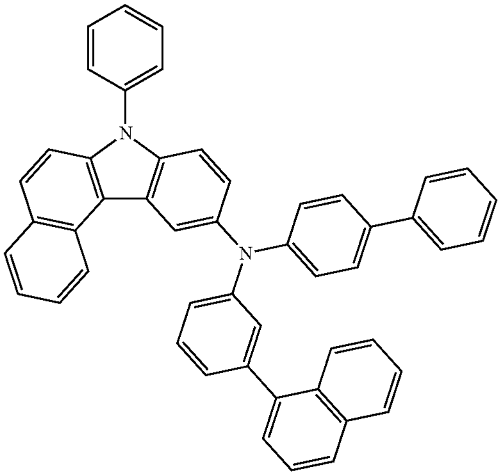

-continued
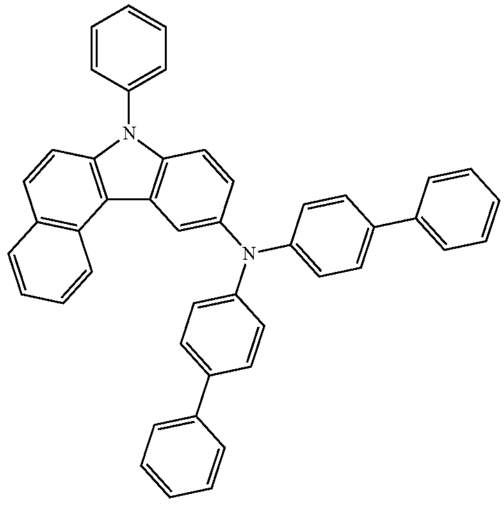
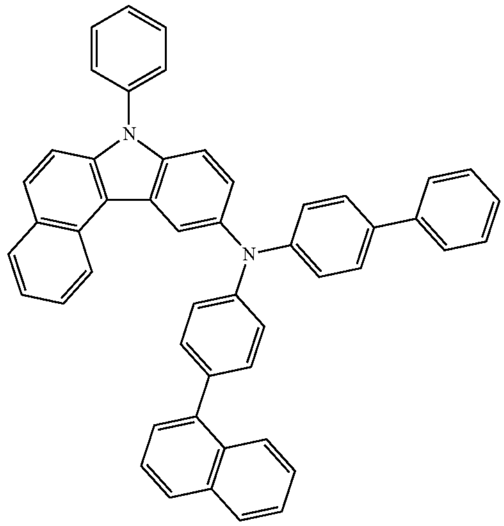
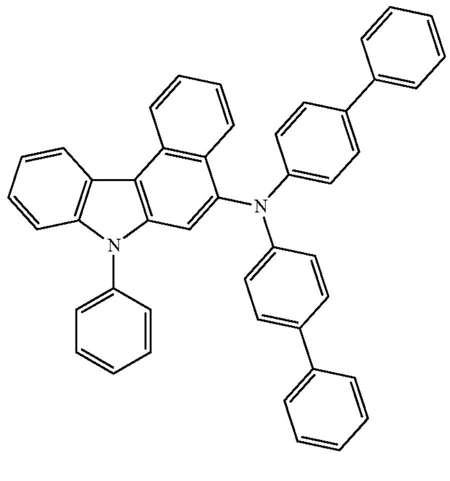
-continued
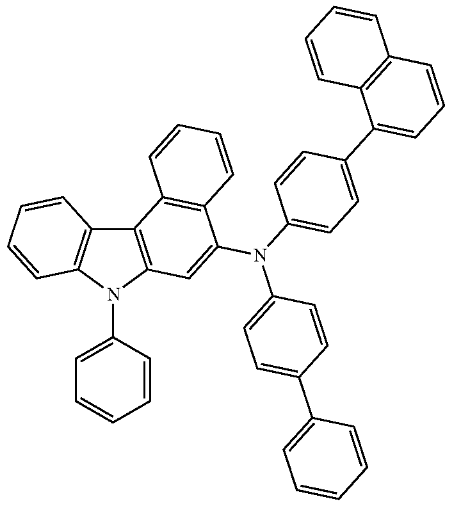
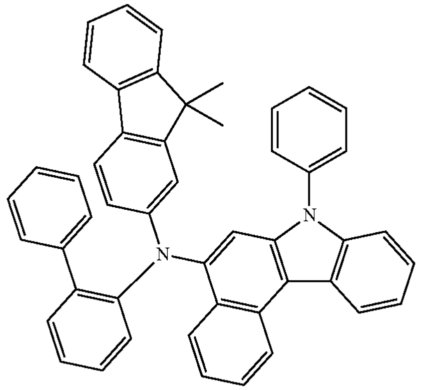
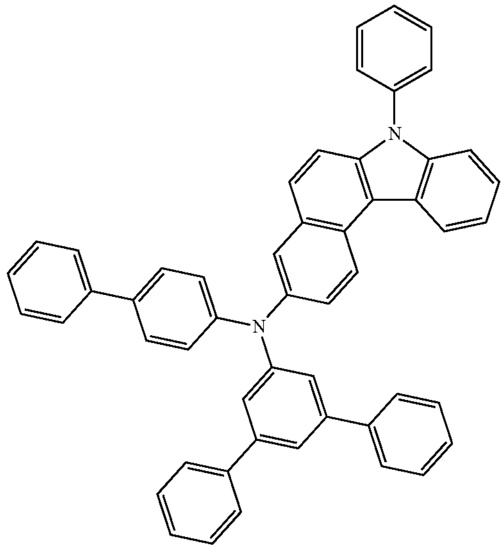

-continued
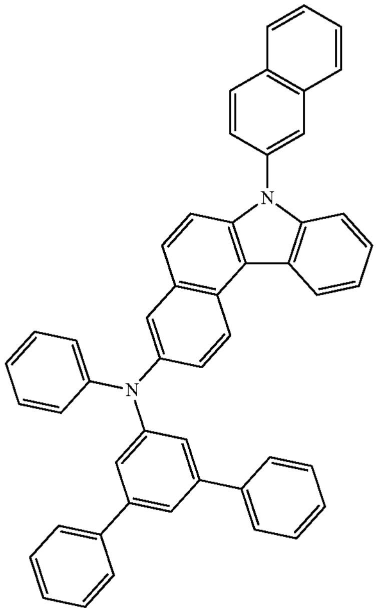
-continued
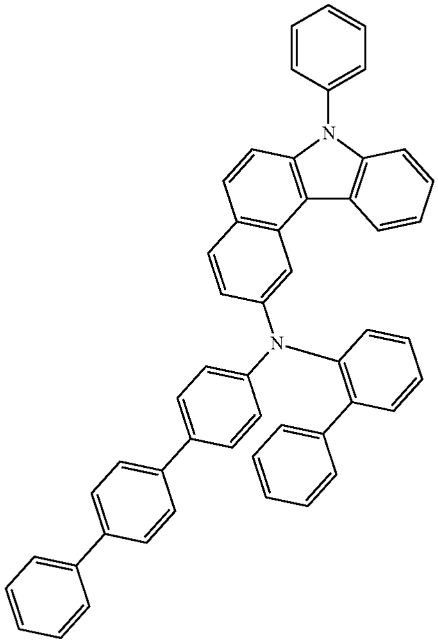
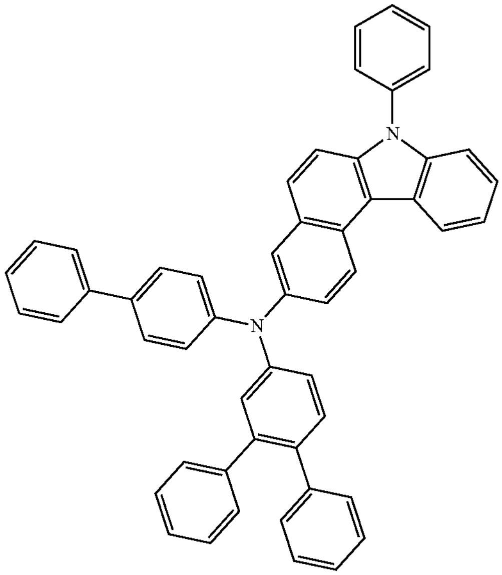
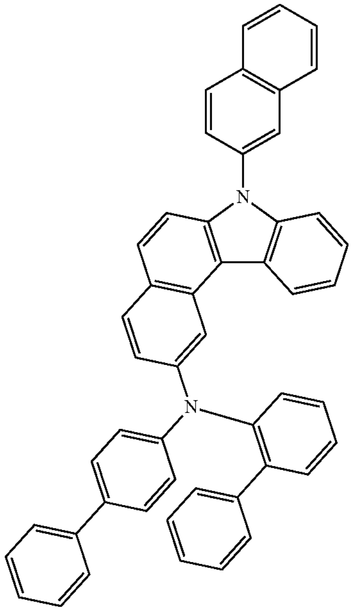

-continued
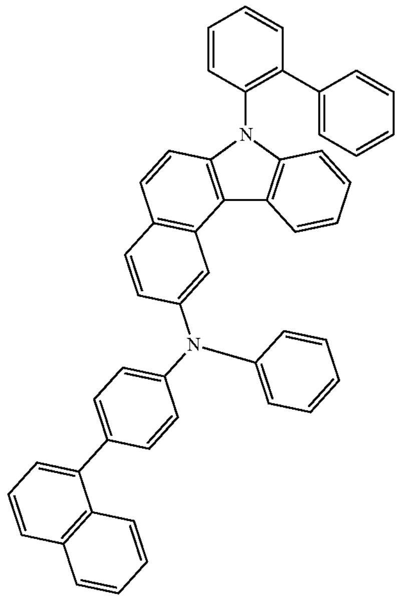
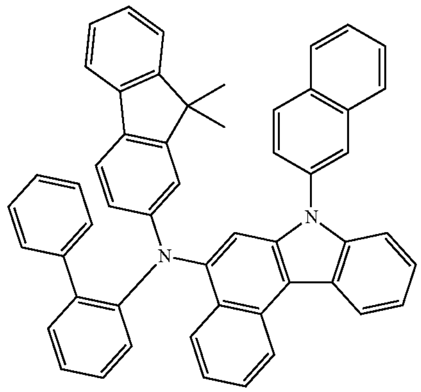
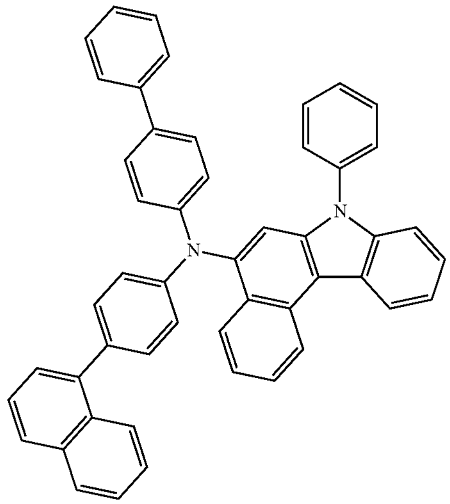
-continued
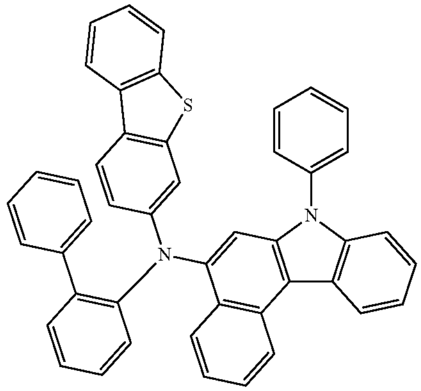
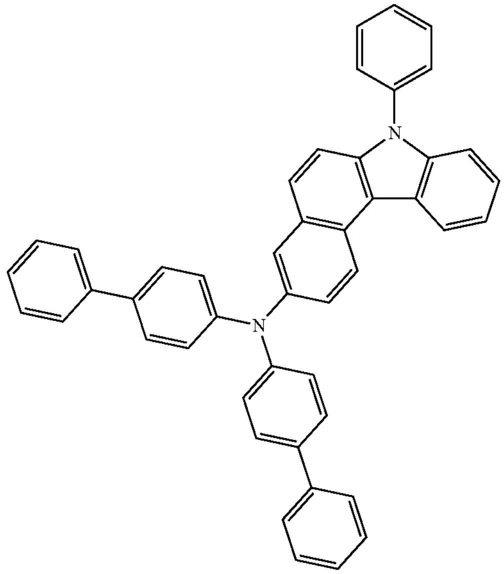
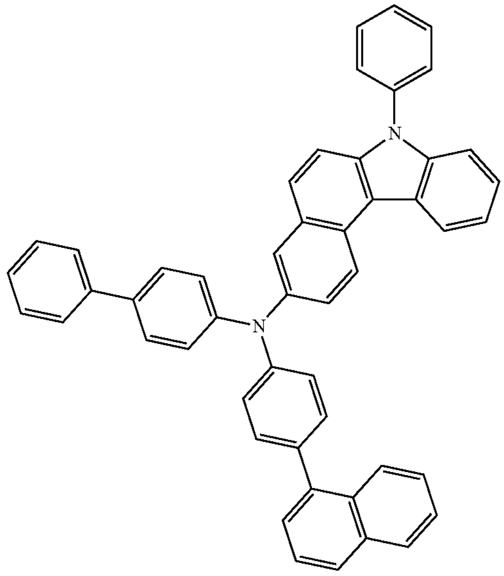

-continued
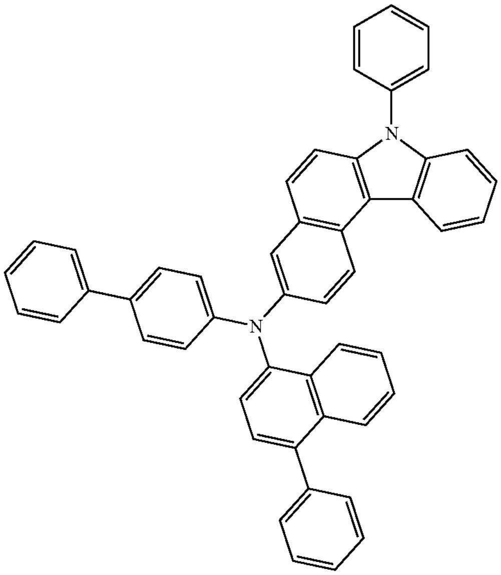
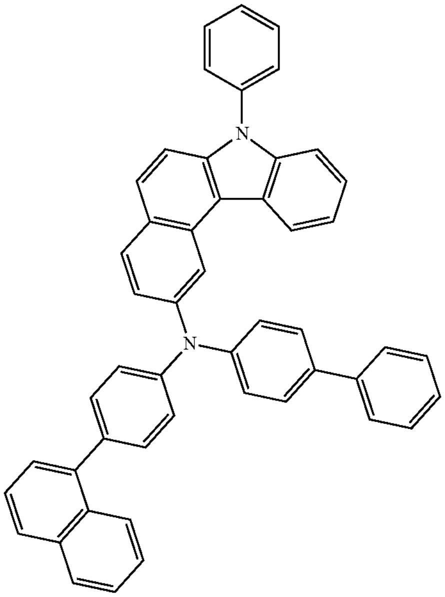
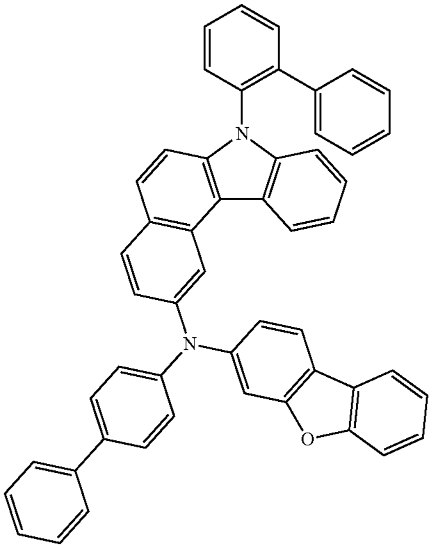
-continued
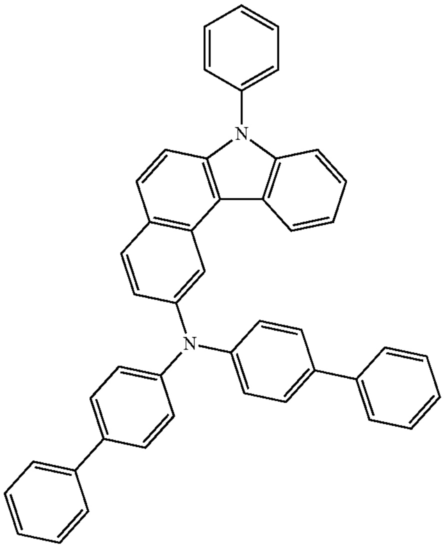
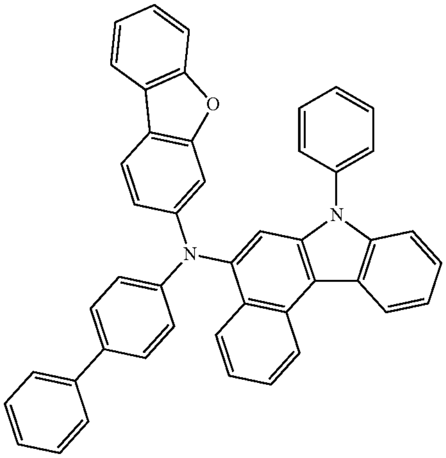
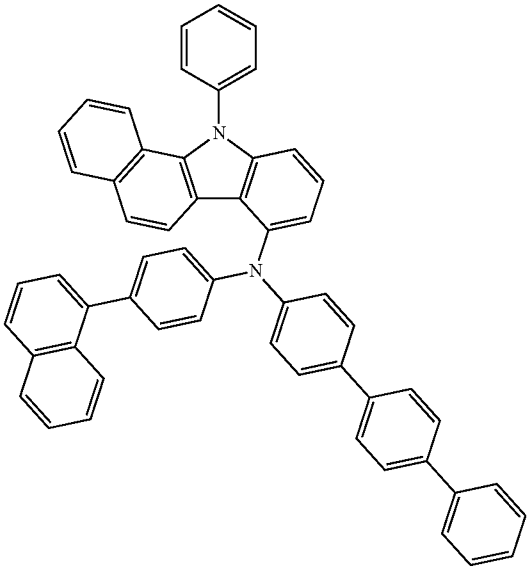

-continued
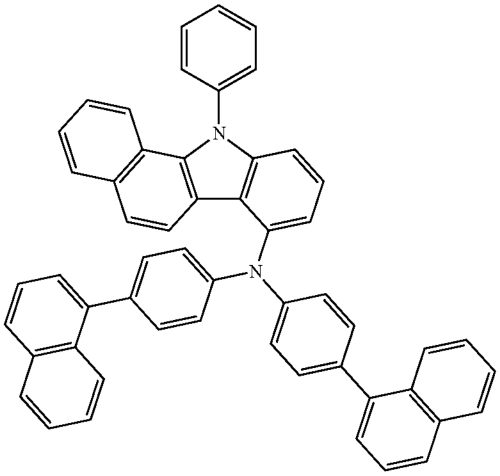
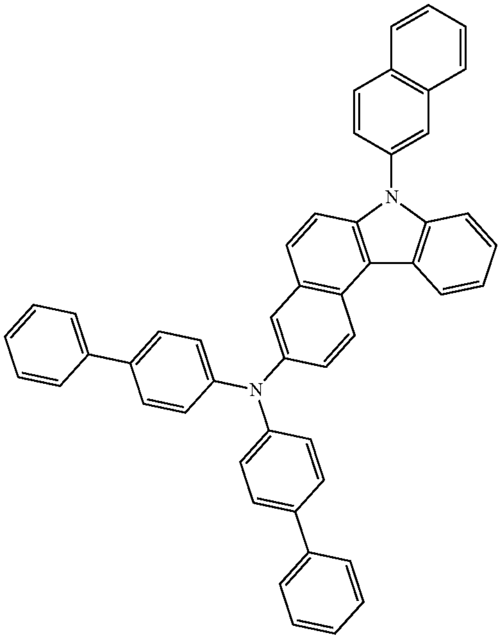
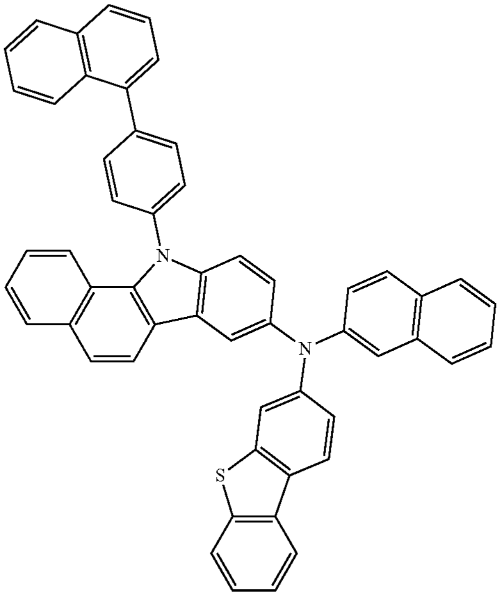
-continued
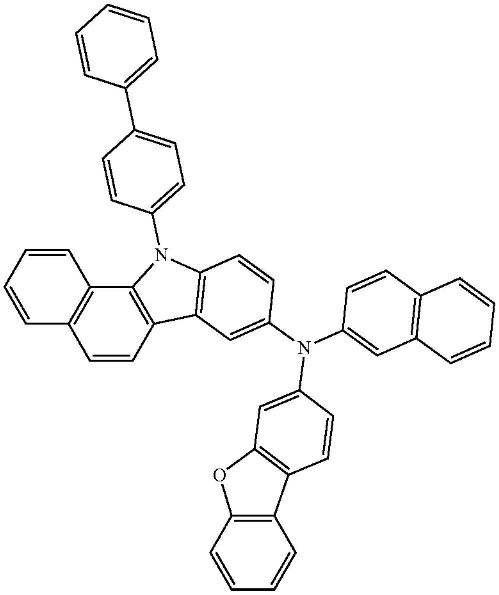
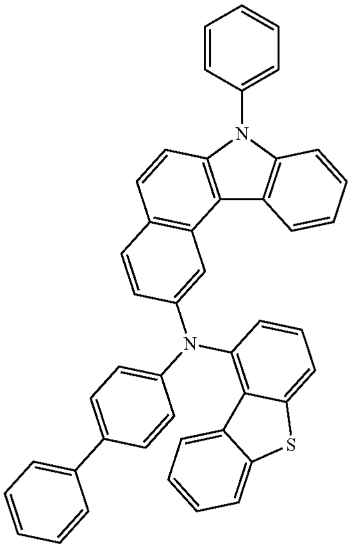

-continued
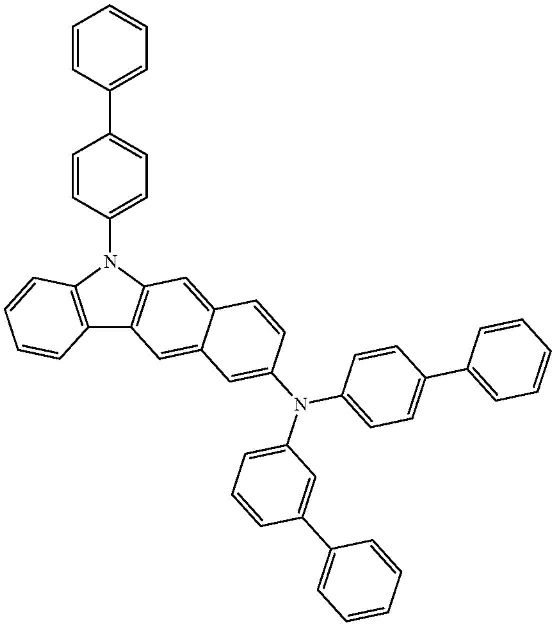
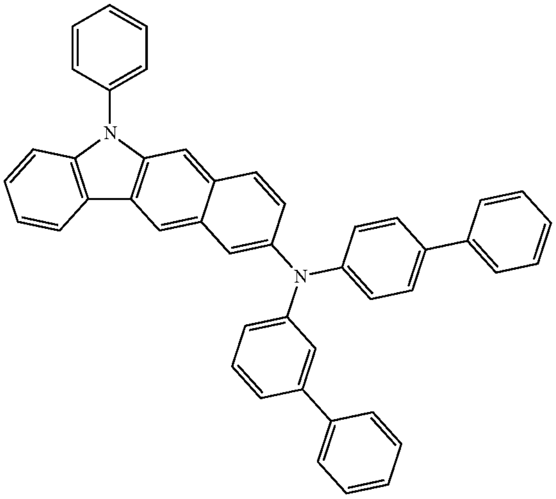
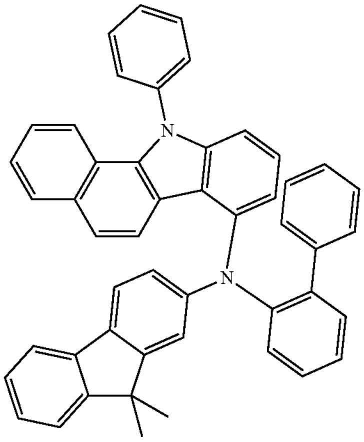
-continued
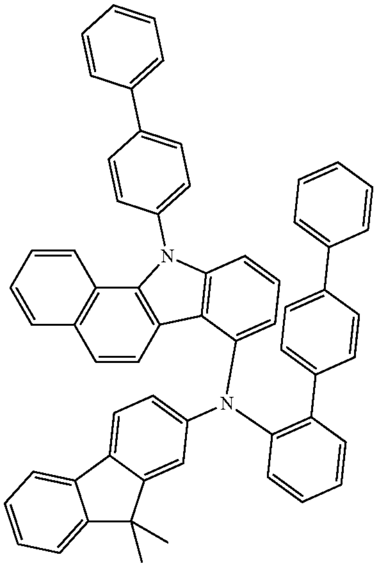
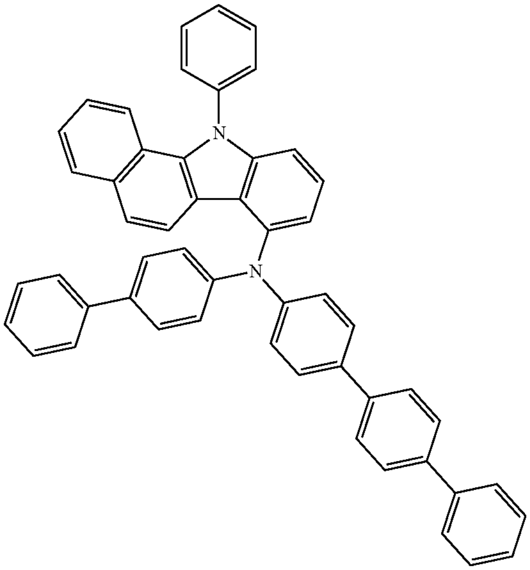
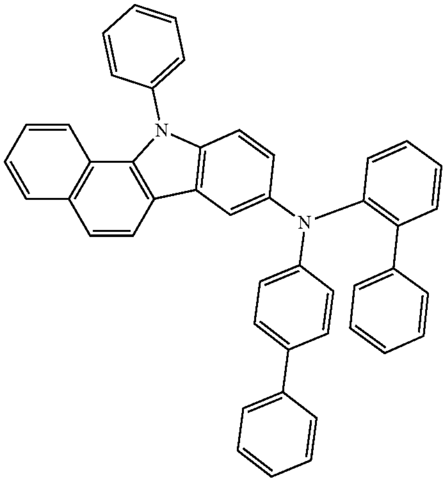

-continued
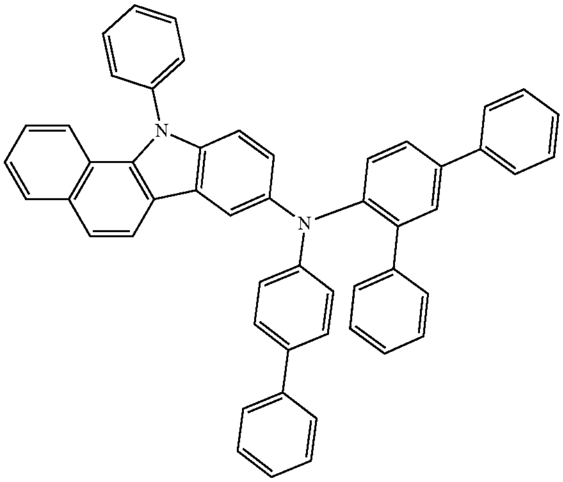
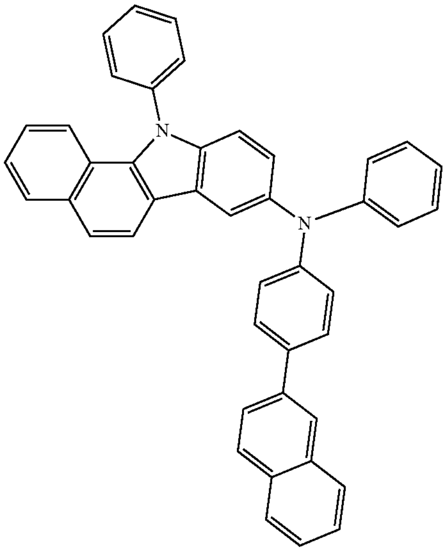
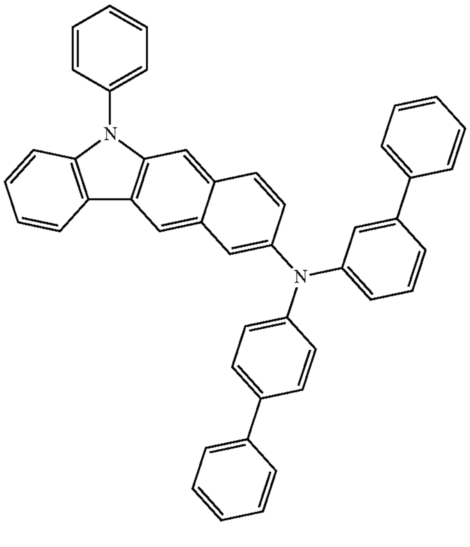
-continued
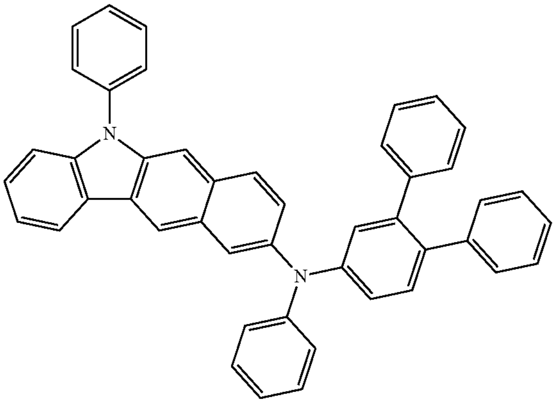
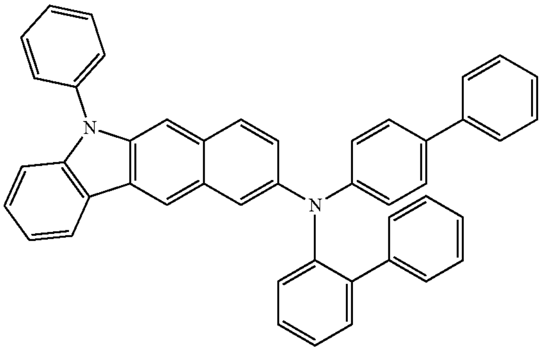
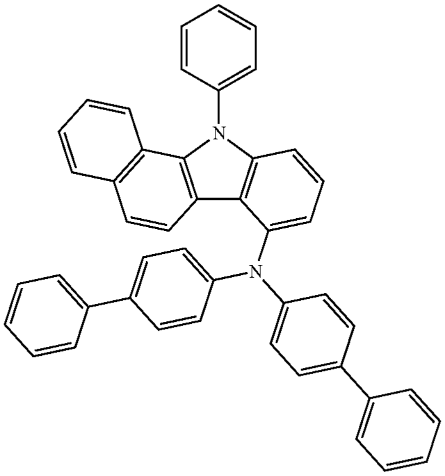
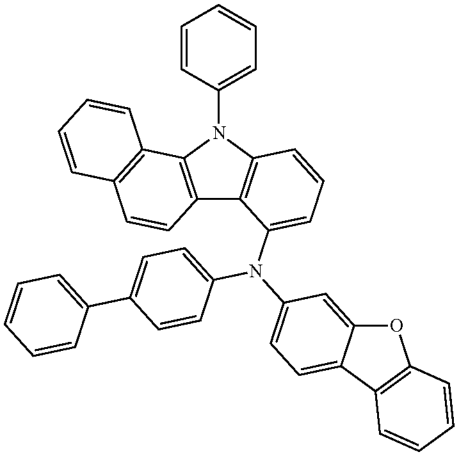

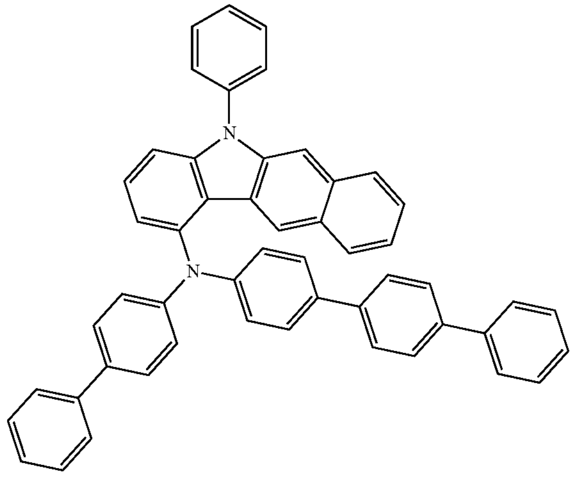
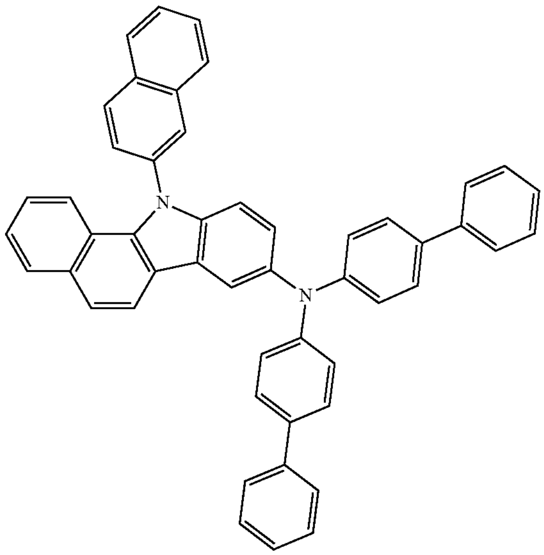
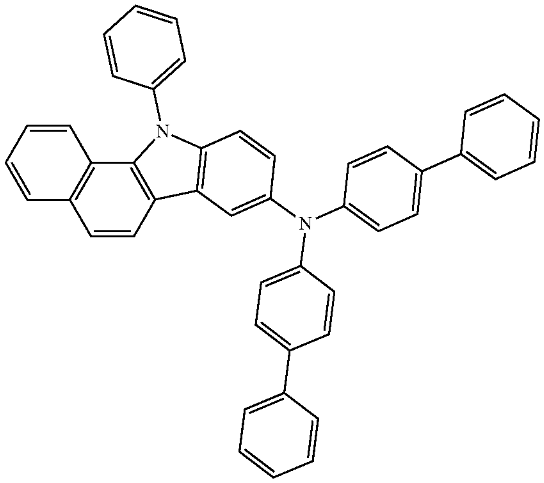
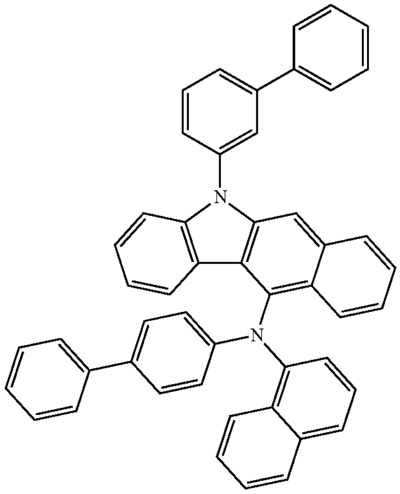
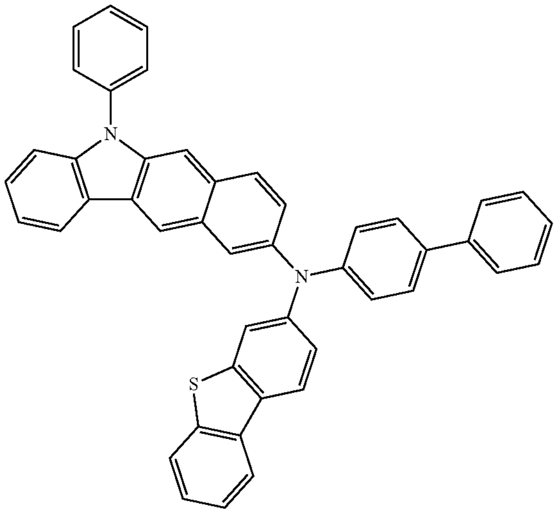
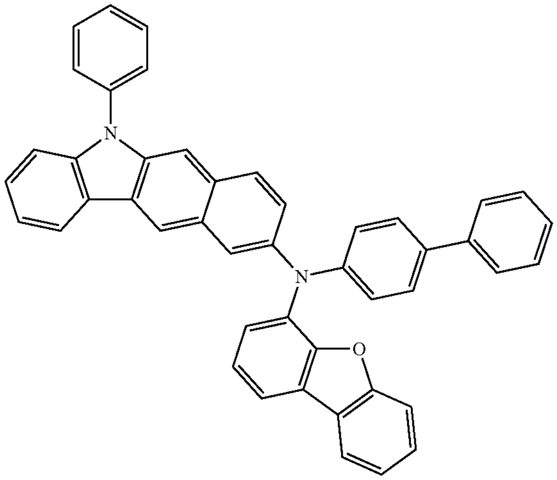 [SMILES: c1ccc(-c2ccc(N(c3ccc4cc5c(cc4c3)c3ccccc3n5-c3ccccc3)c3cccc4c3oc3ccccc34)cc2)cc1]

-continued
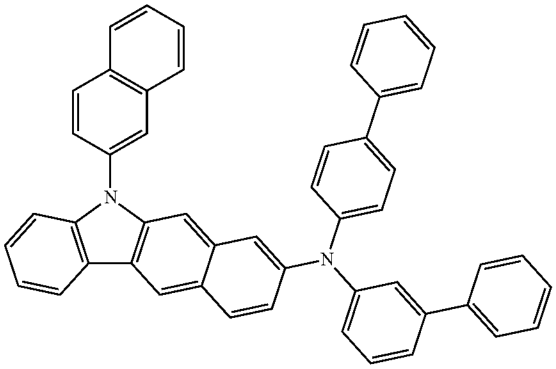
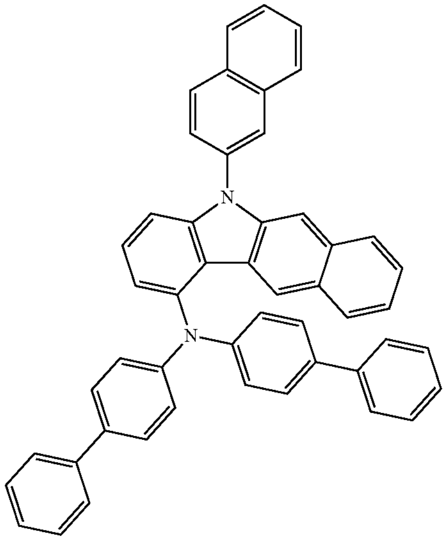
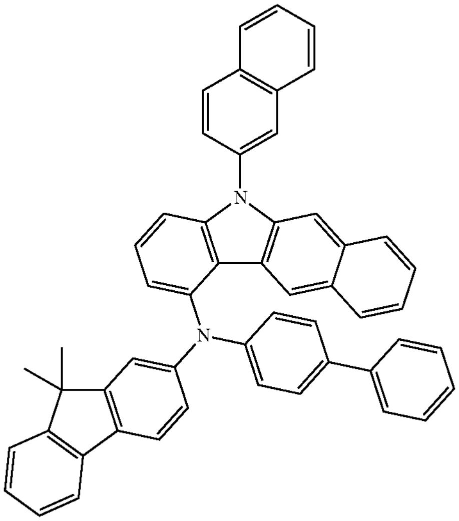
-continued
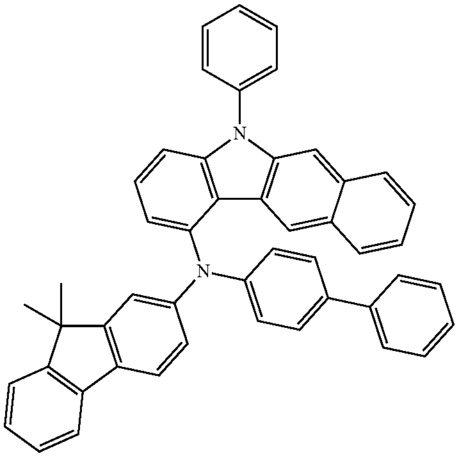
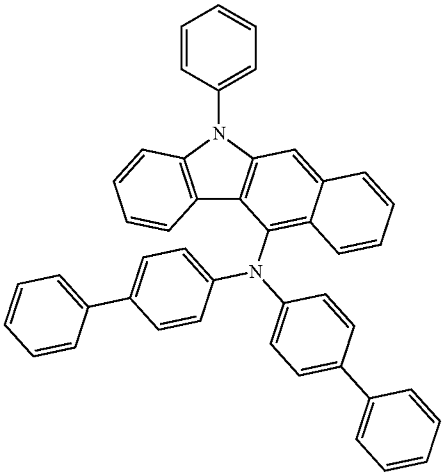
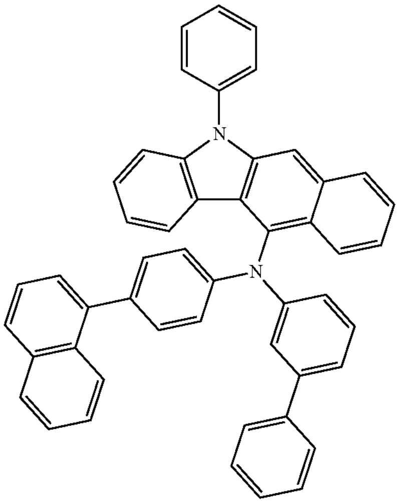

-continued
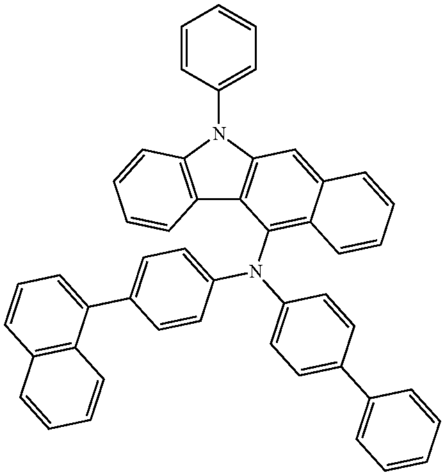
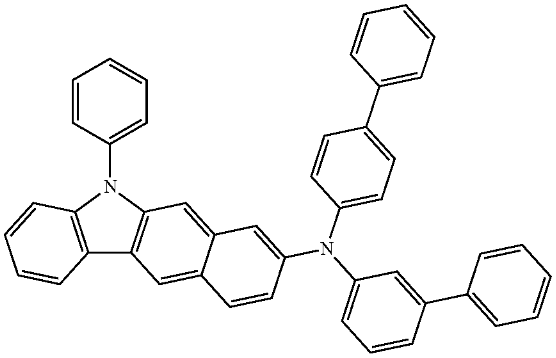
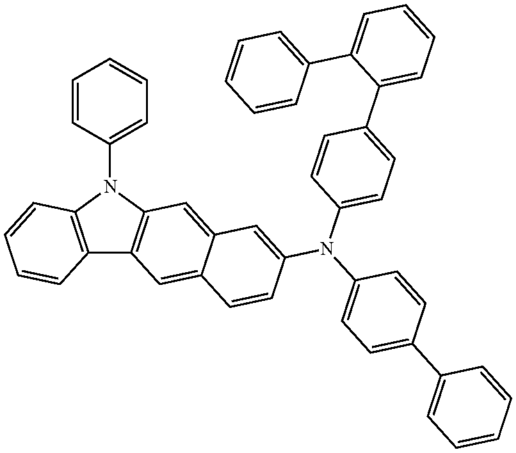
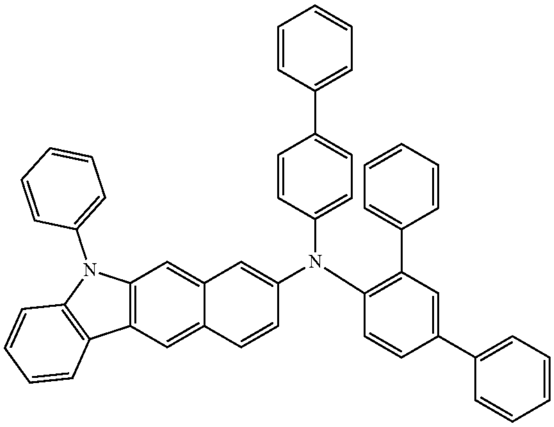
-continued
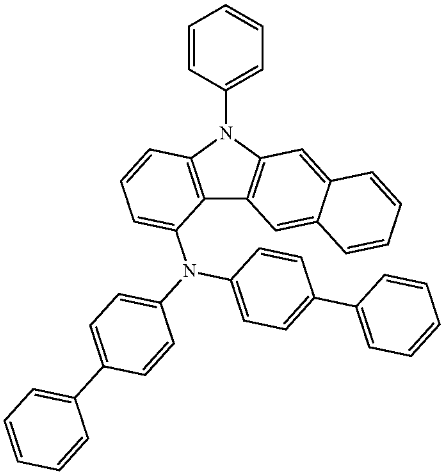
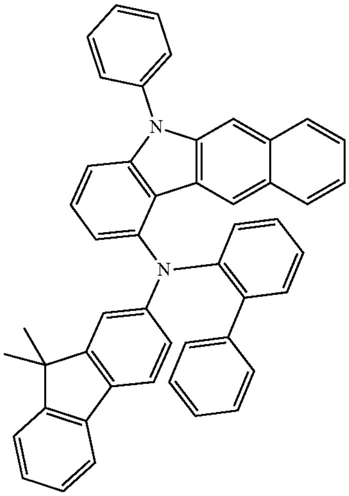
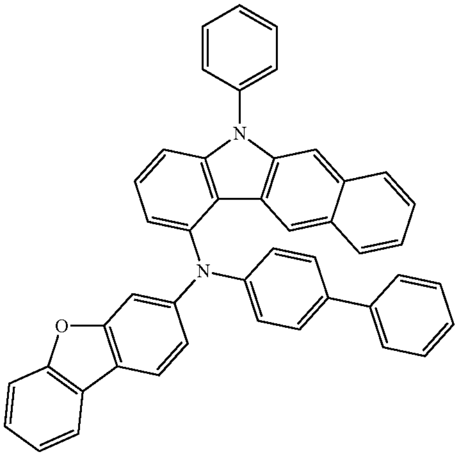

-continued
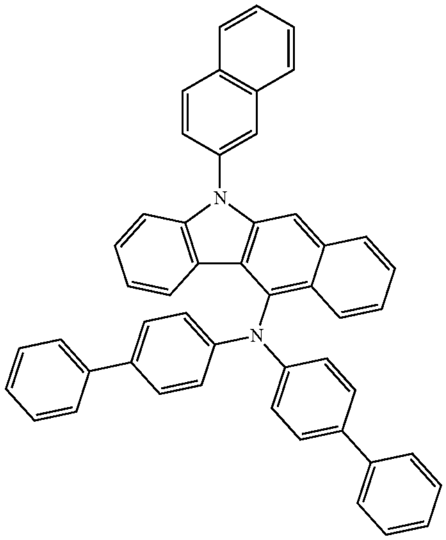
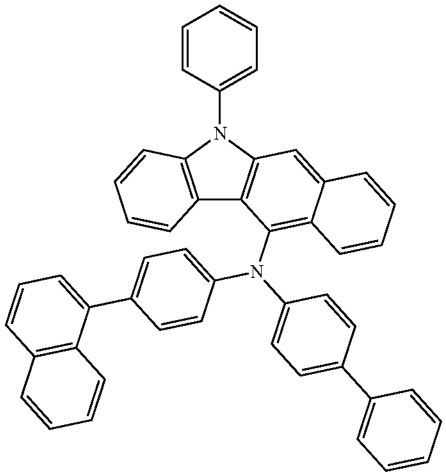
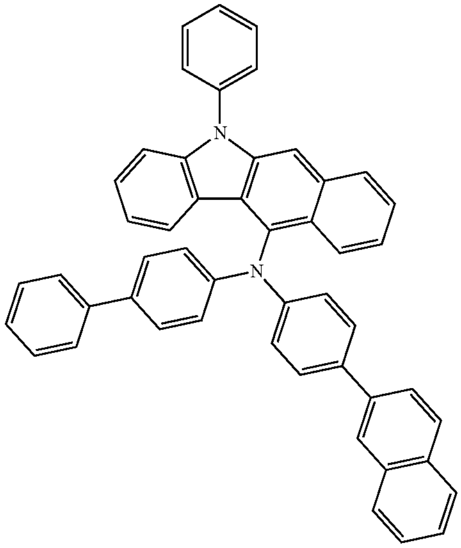
-continued
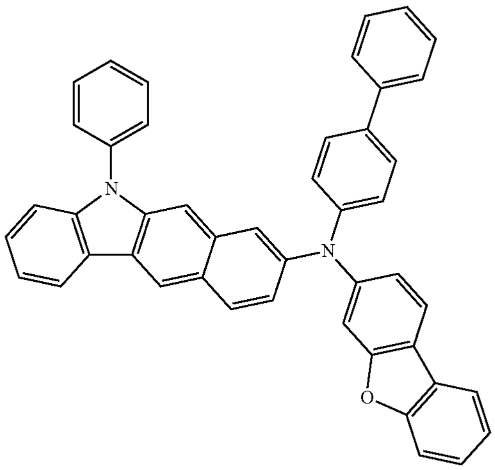
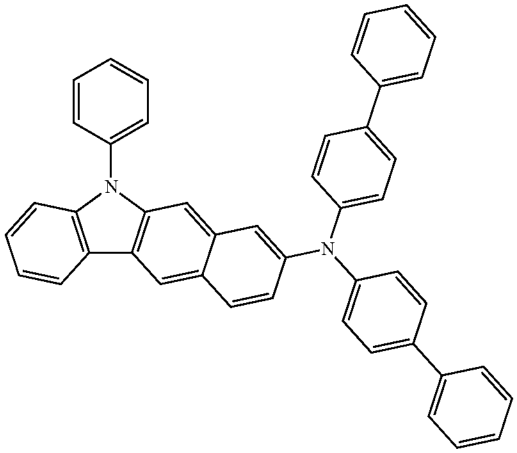
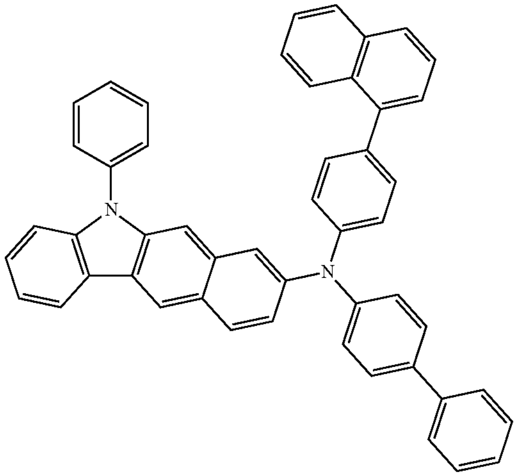

-continued
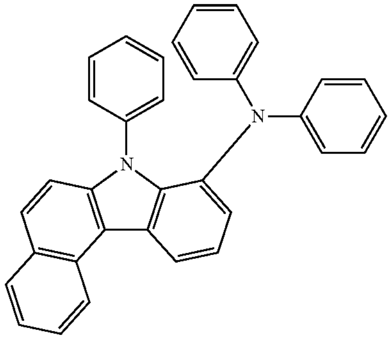
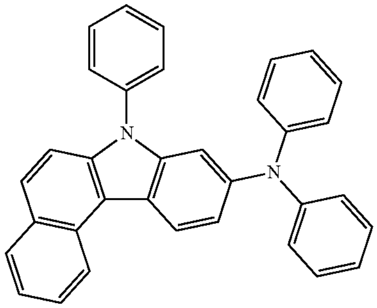
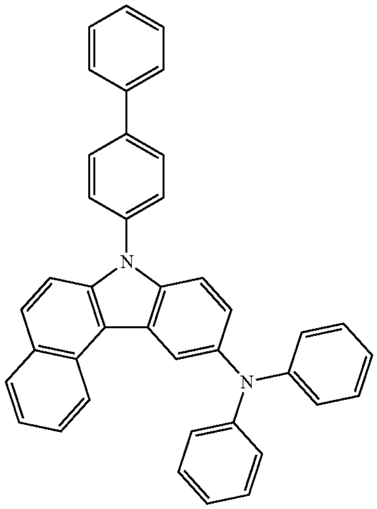
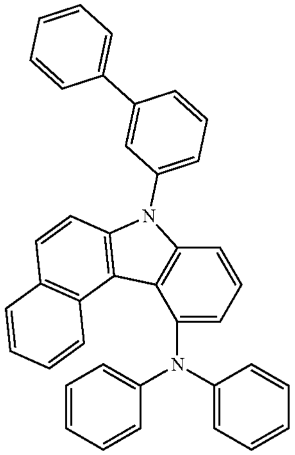
-continued
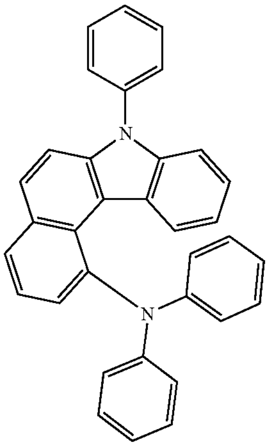
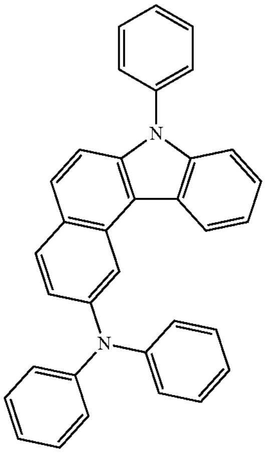
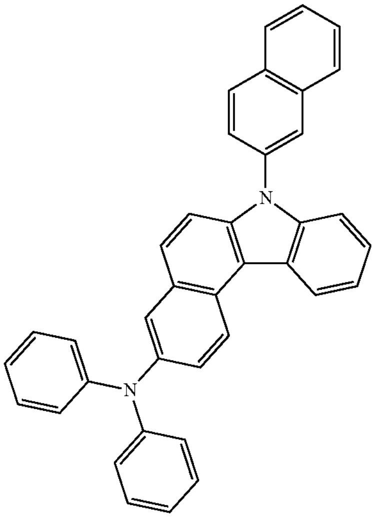

-continued
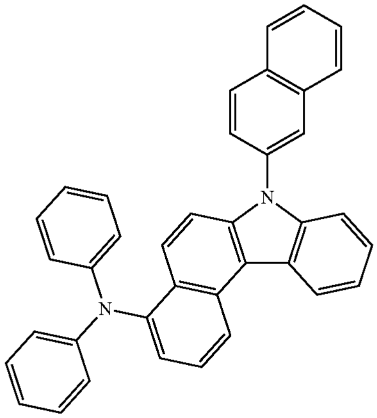
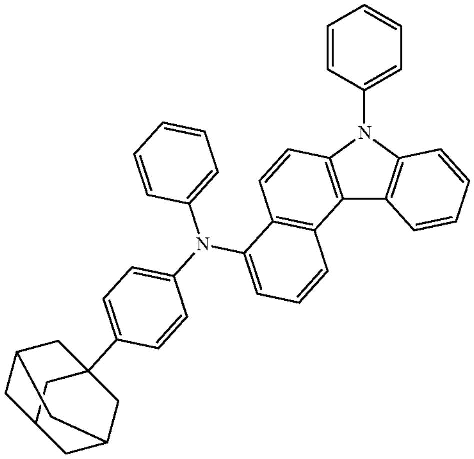
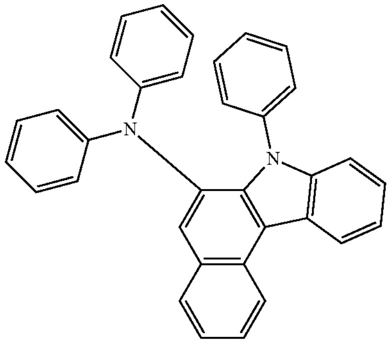
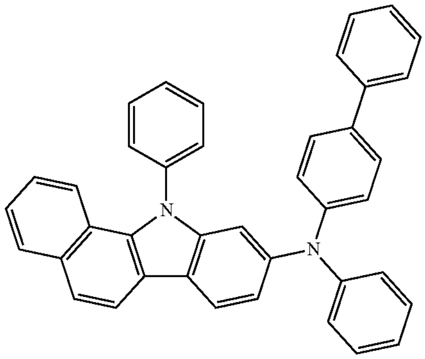
-continued
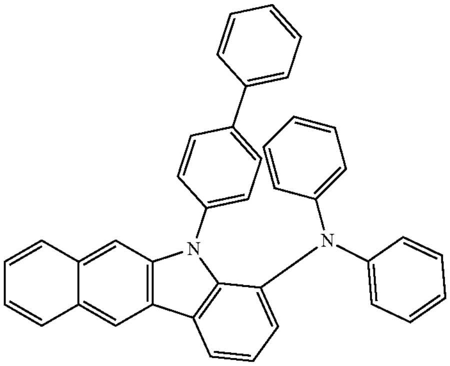
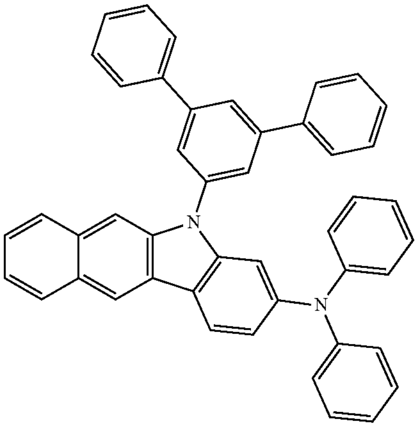
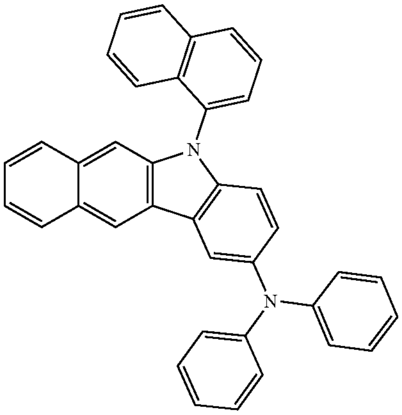
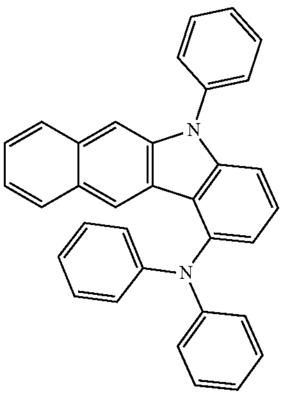

-continued
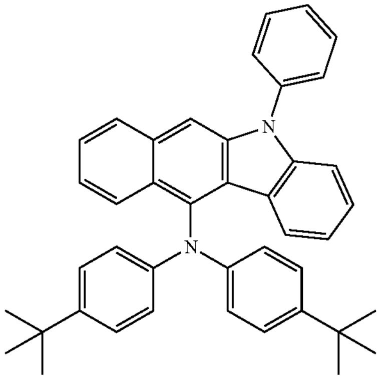
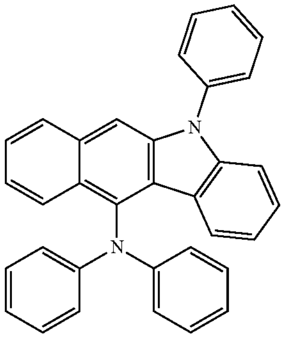
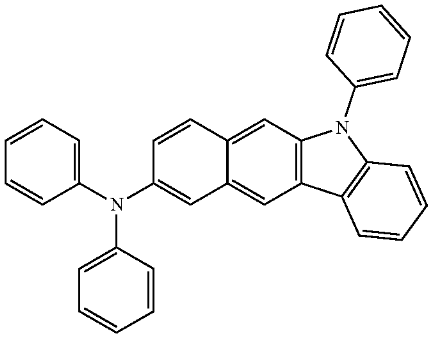
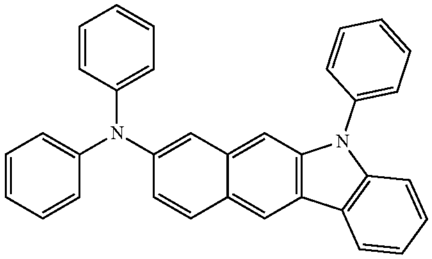
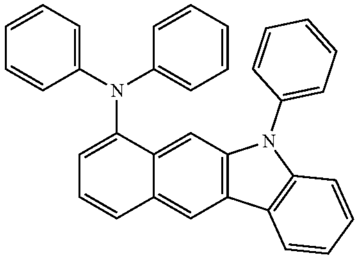
-continued
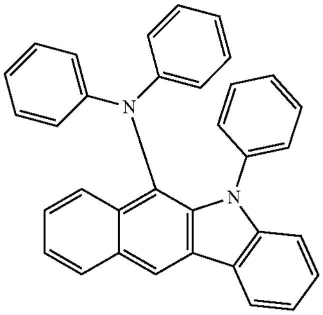
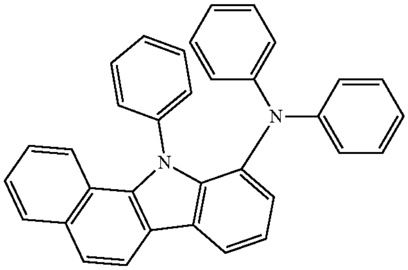
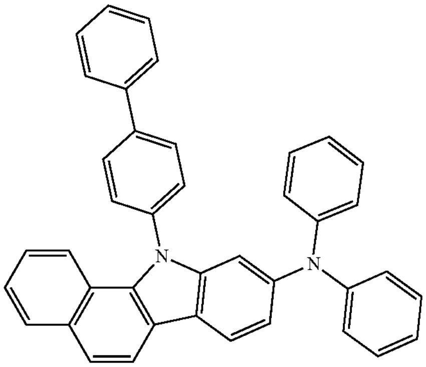
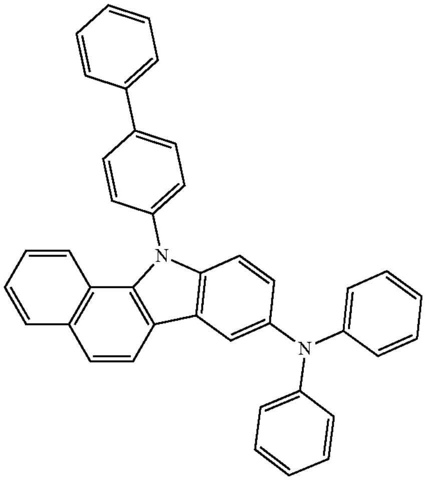

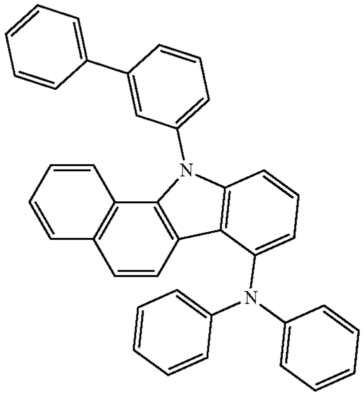
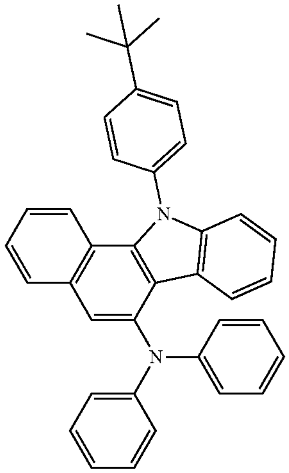
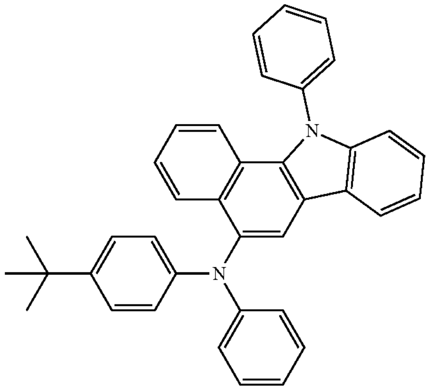
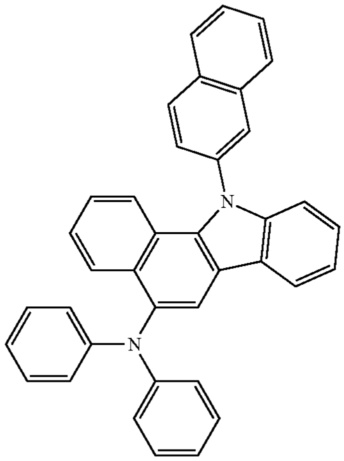
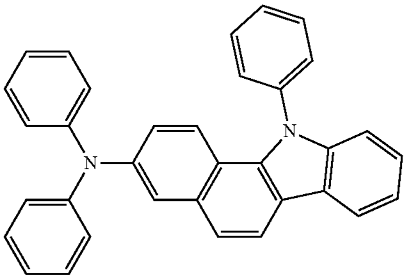
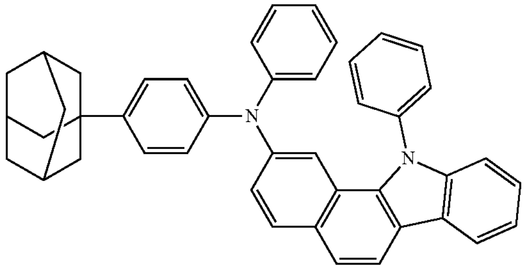
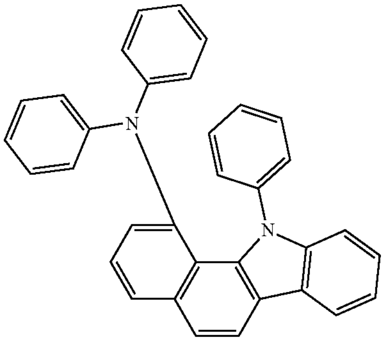
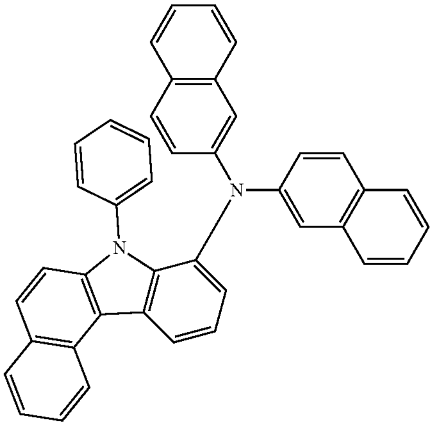
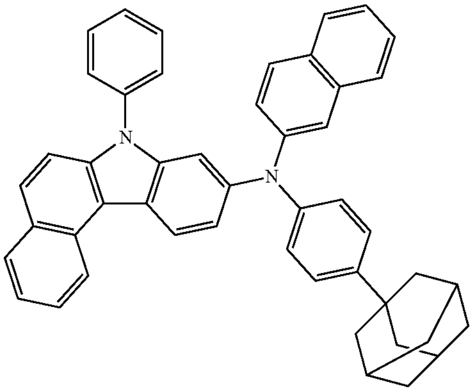

-continued
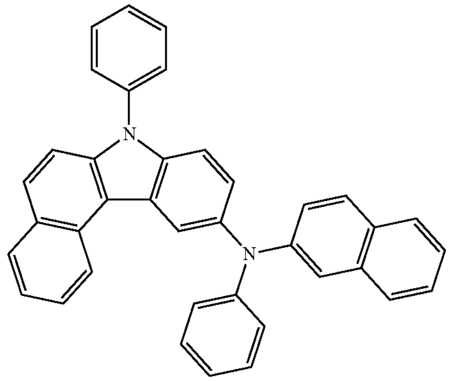
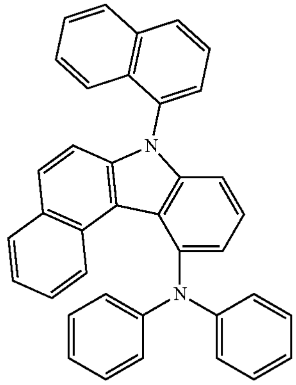
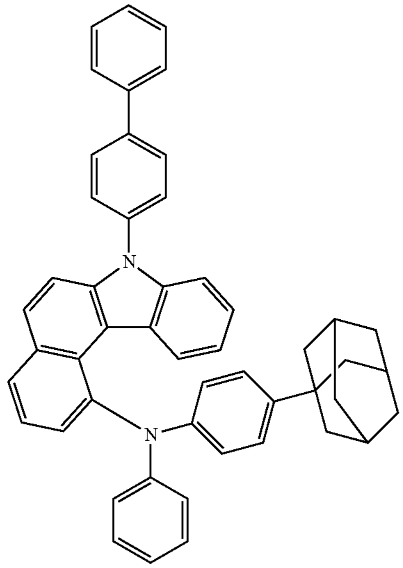
-continued
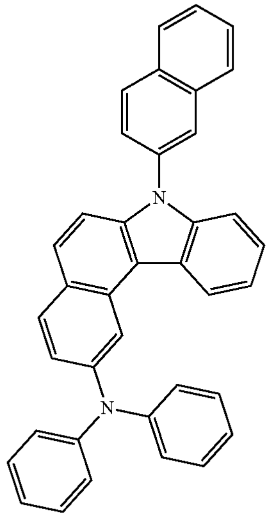
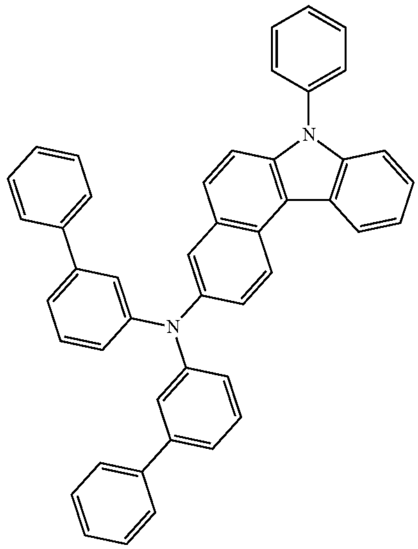
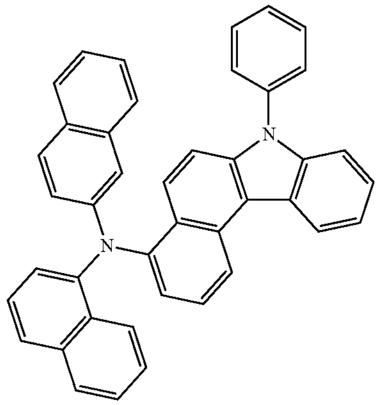

-continued
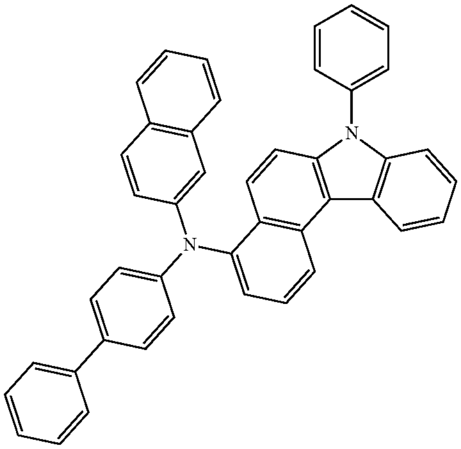
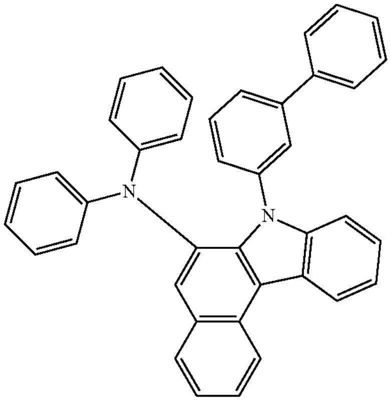
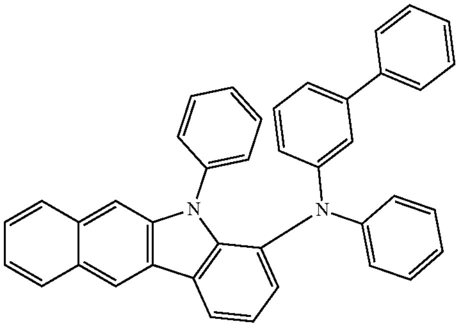
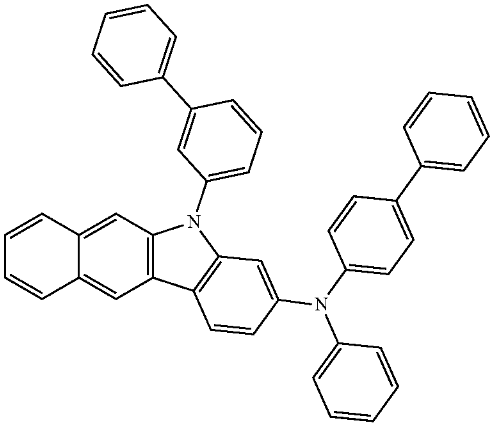
-continued
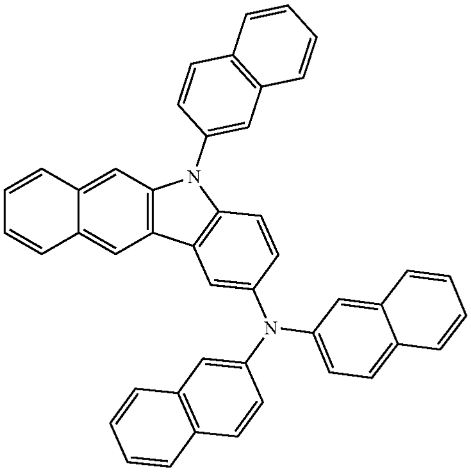
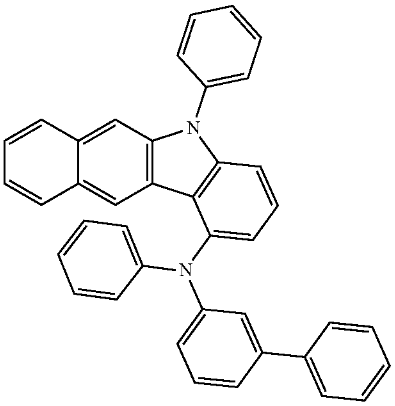
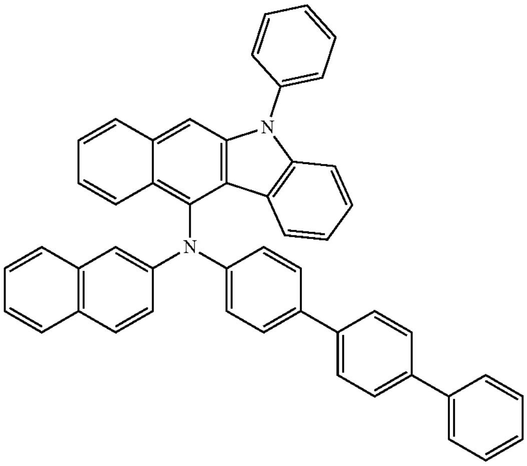

-continued
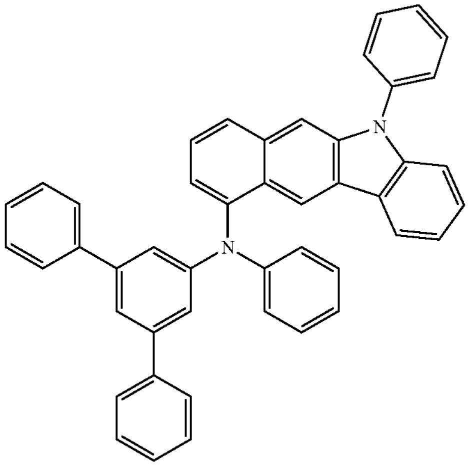
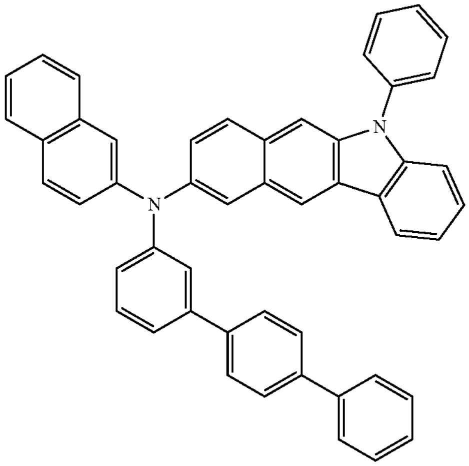
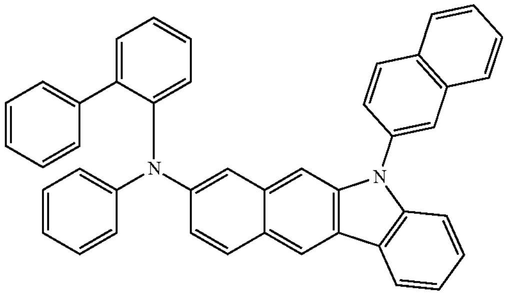
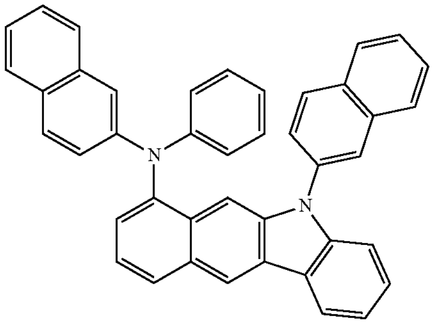
-continued
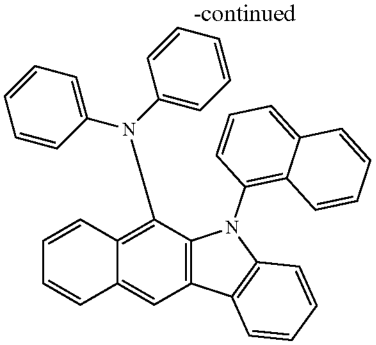
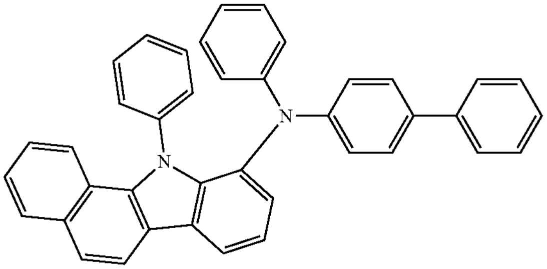
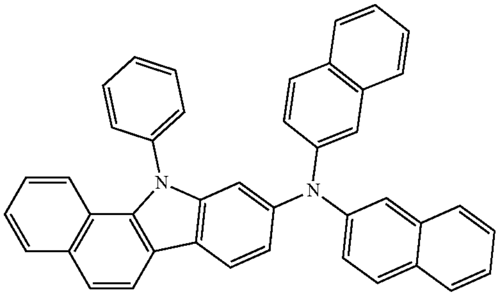
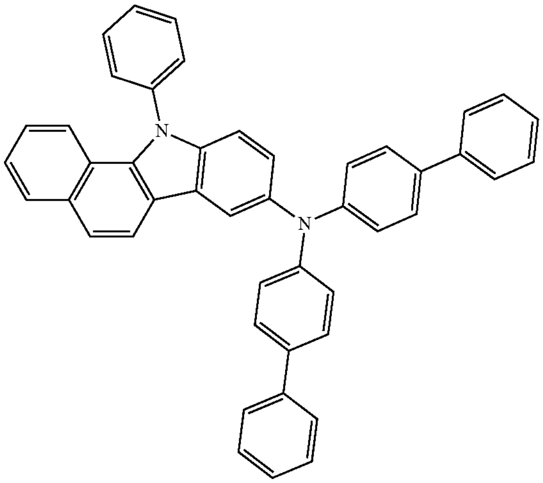
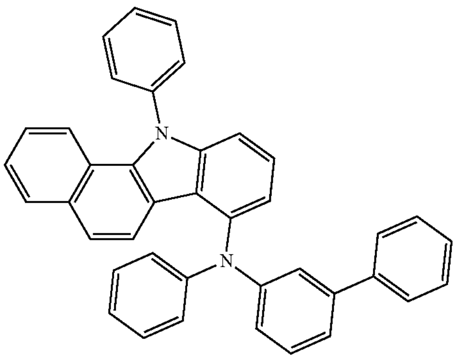

-continued
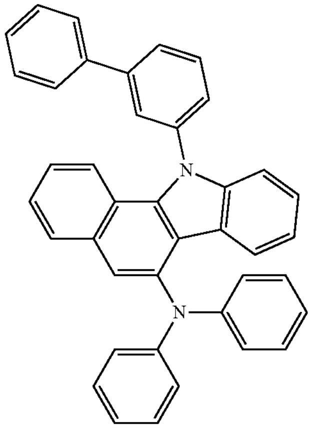
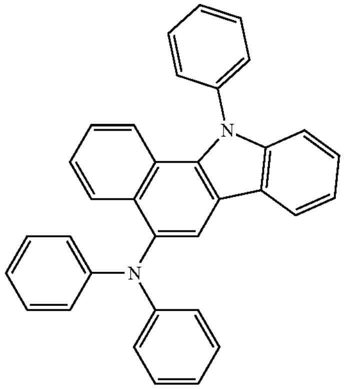
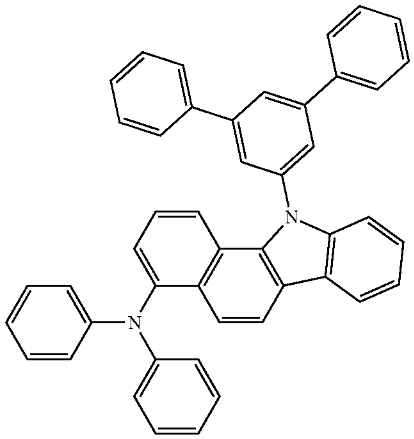
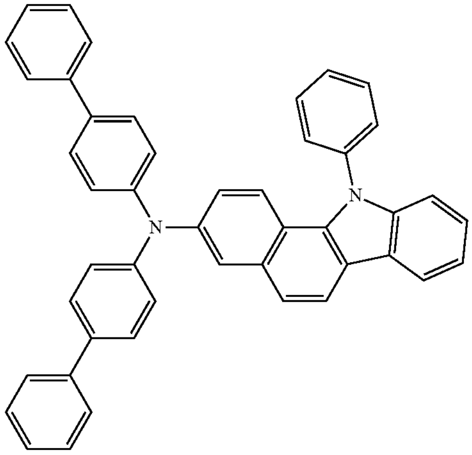
-continued
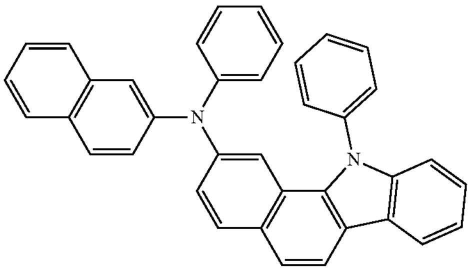
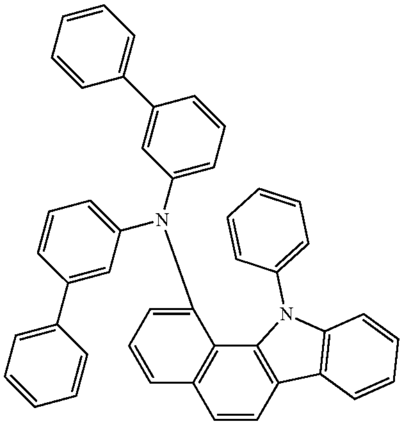
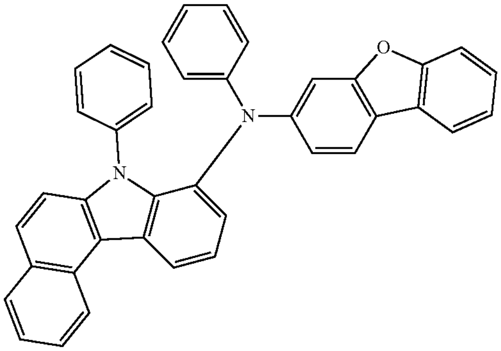
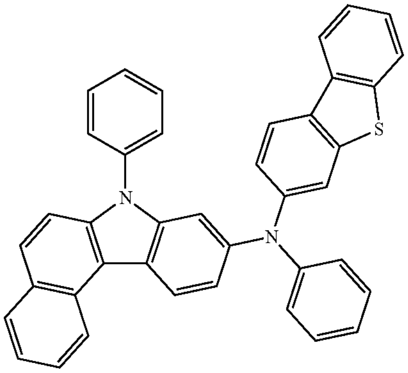

-continued
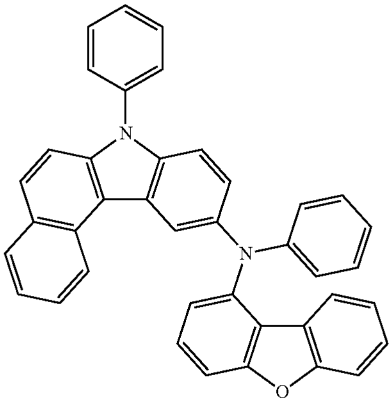
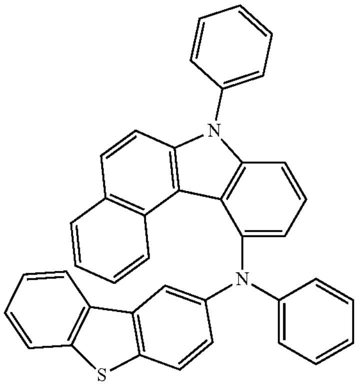
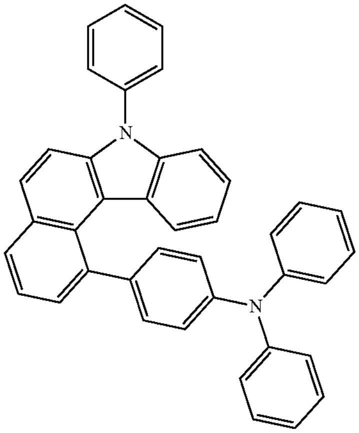
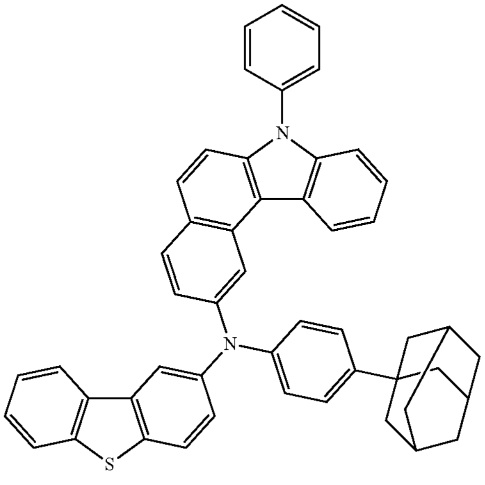
-continued
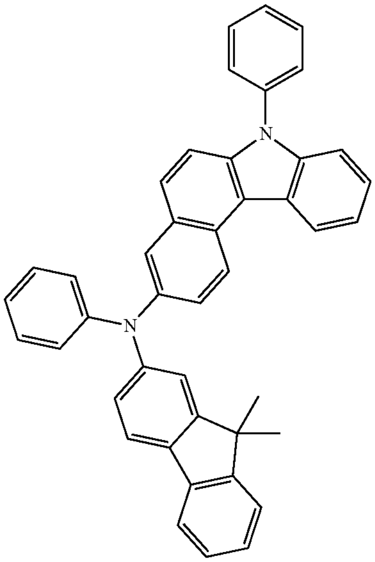
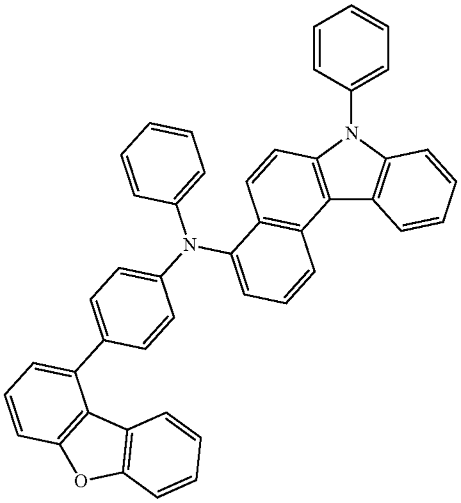
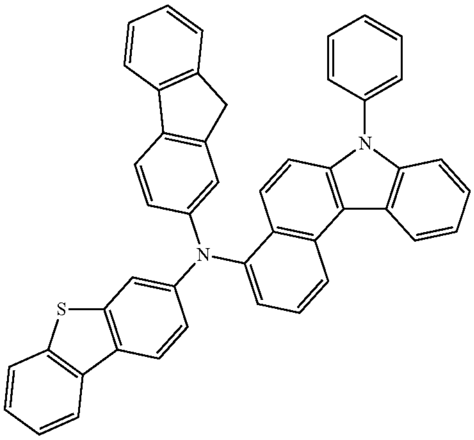

-continued
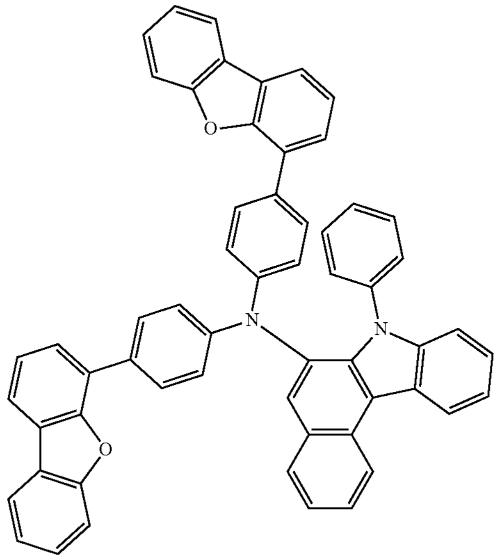
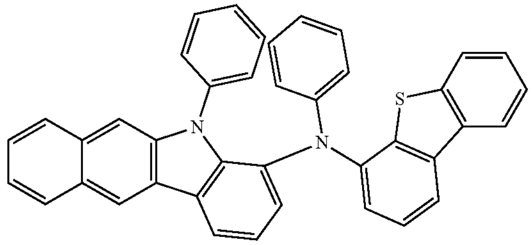
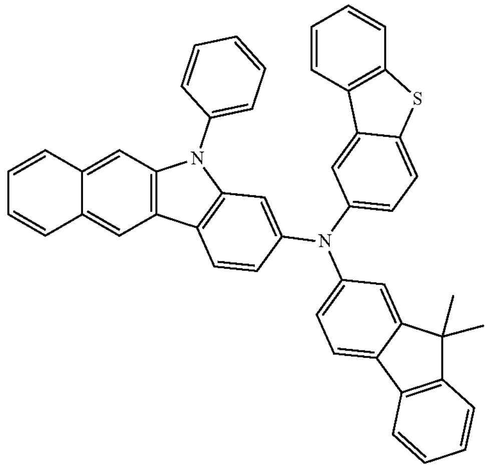
-continued
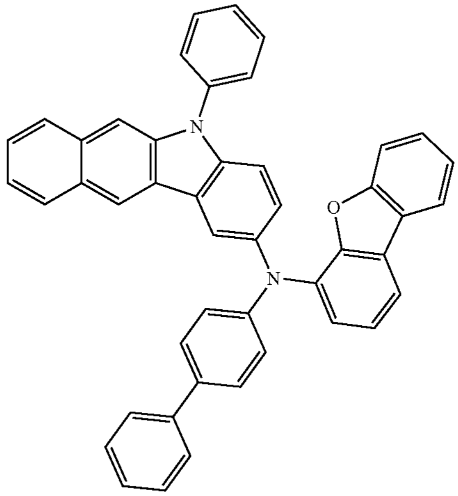
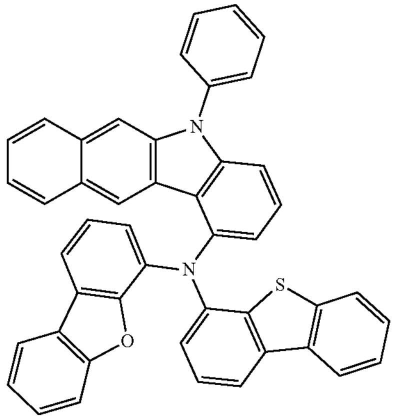
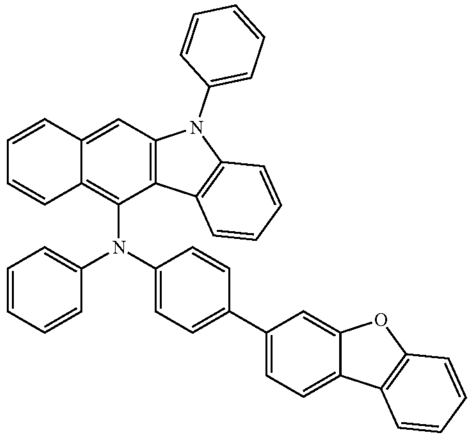

-continued

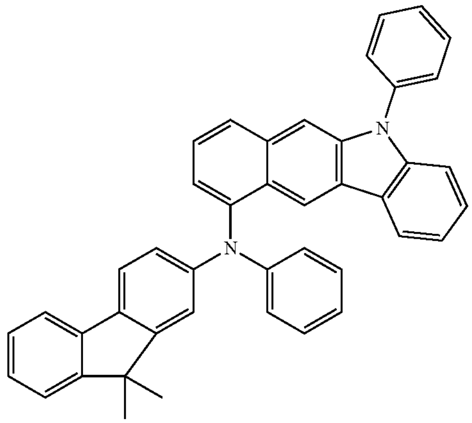

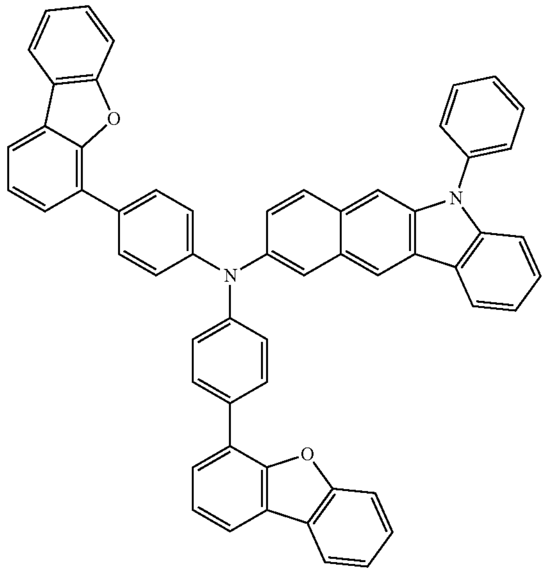

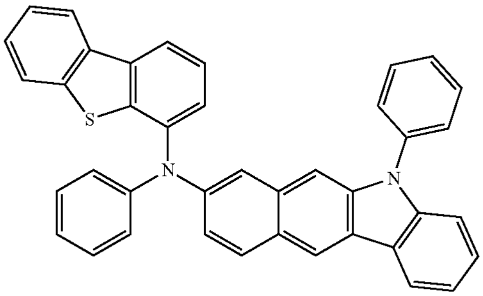

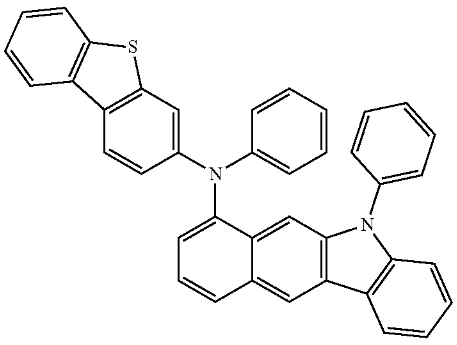

-continued

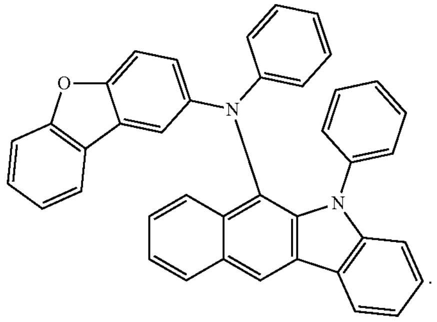

Examples of the dopant material include an aromatic amine derivative, a styrylamine compound, a boron complex, a fluoranthene compound, a metal complex, and the like. Specifically, the aromatic amine derivative is a substituted or unsubstituted fused aromatic ring derivative having an arylamino group, and examples thereof include pyrene, anthracene, chrysene, periflanthene and the like, which have an arylamino group. The styrylamine compound is a compound where at least one arylvinyl group is substituted in substituted or unsubstituted arylamine, in which one or two or more substituent groups selected from the group consisting of an aryl group, a silyl group, an alkyl group, a cycloalkyl group, and an arylamino group are substituted or unsubstituted. Specific examples thereof include styrylamine, styryldiamine, styryltriamine, styryltetramine, and the like, but are not limited thereto. Further, the metal complex includes an iridium complex, a platinum complex, and the like, but is not limited thereto.

Representative examples of the dopant material are as follows:

Dp-1

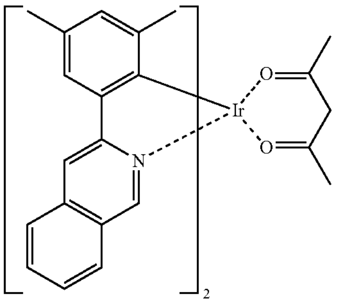

Dp-2

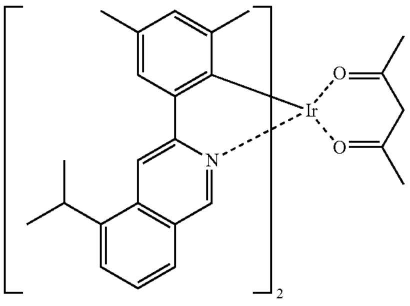

-continued
Dp-3
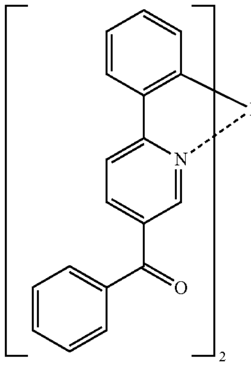
Dp-4
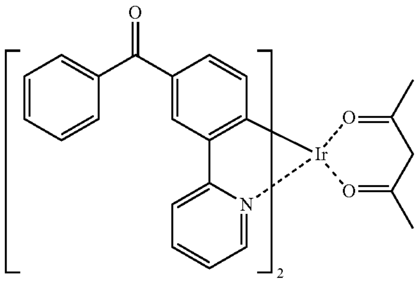
Dp-5
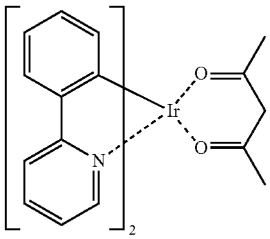
Dp-6
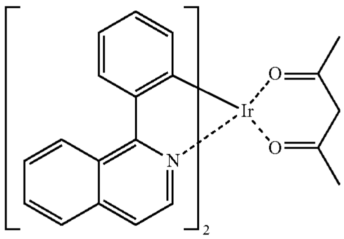
Dp-7
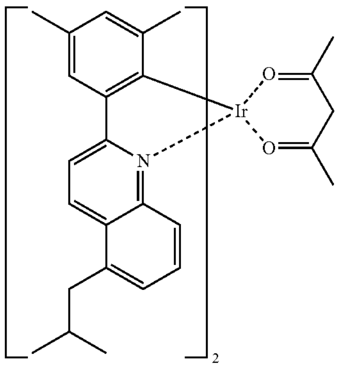
-continued
Dp-8
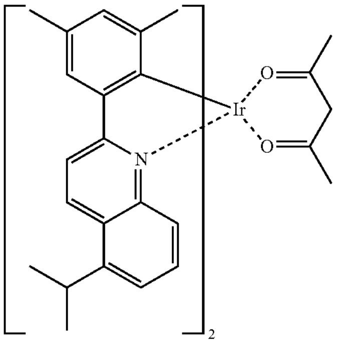
Dp-9
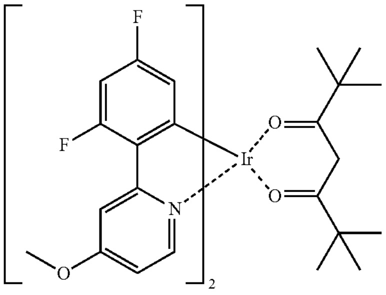
Dp-10
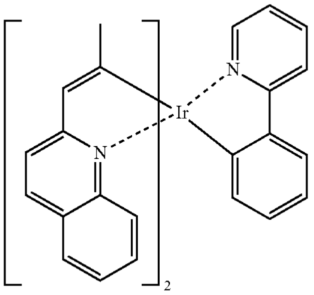
Dp-11
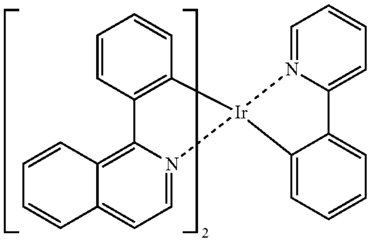
Dp-12
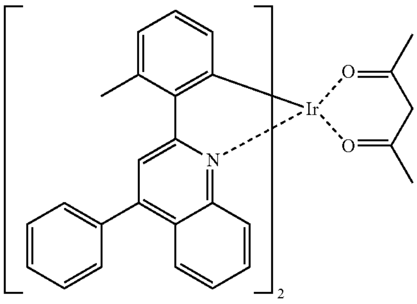

-continued
Dp-13
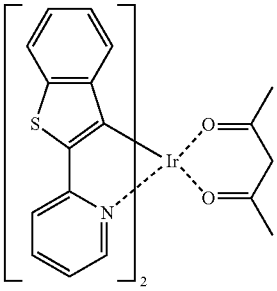
Dp-14
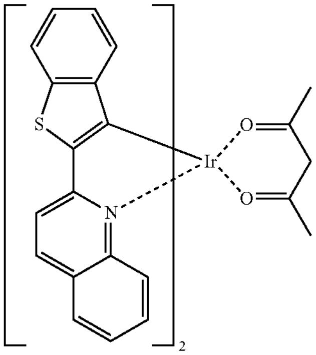
Dp-15
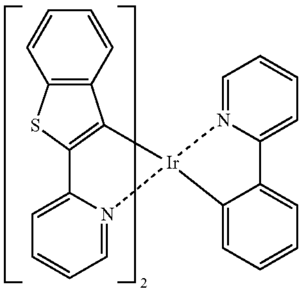
Dp-16
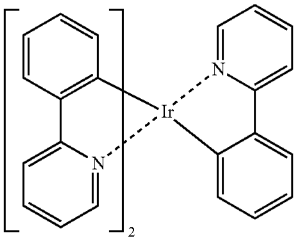
Dp-17
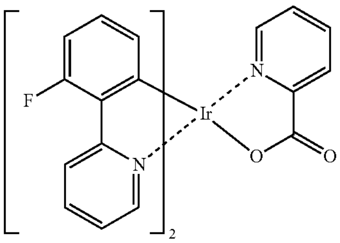
-continued
Dp-18
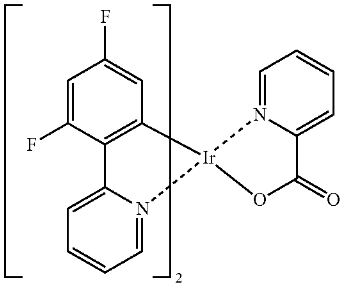
Dp-19
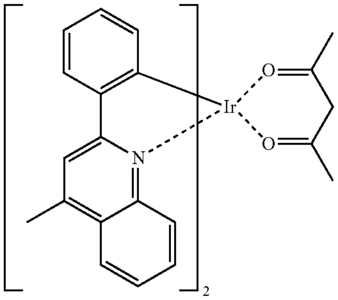
Dp-20
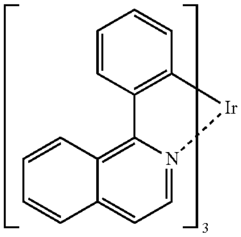
Dp-21
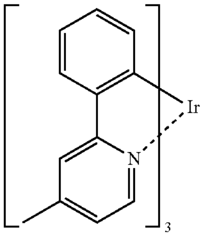
Dp-22
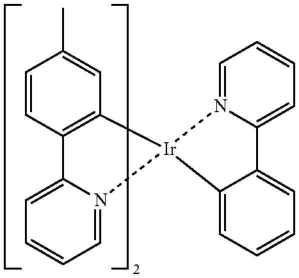
Dp-23
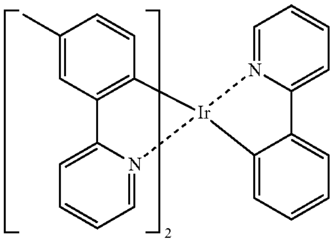

-continued
Dp-24
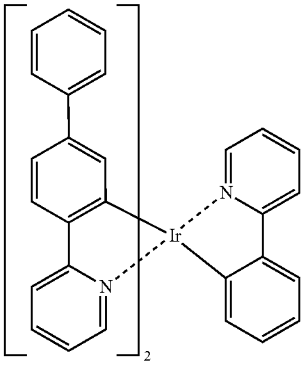
Dp-25
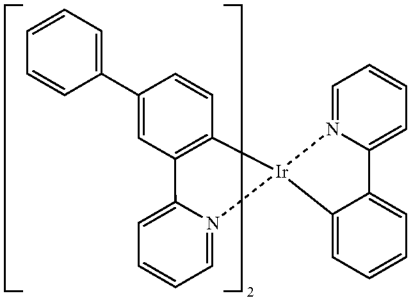
Dp-26
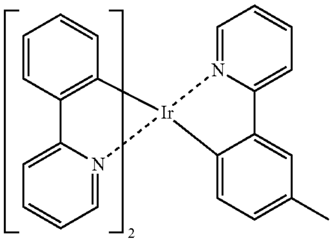
Dp-27
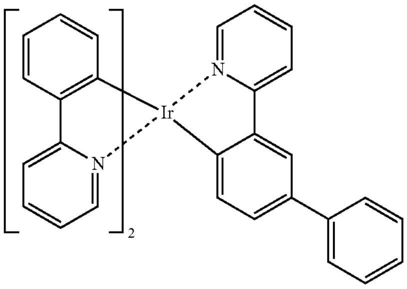
Dp-28
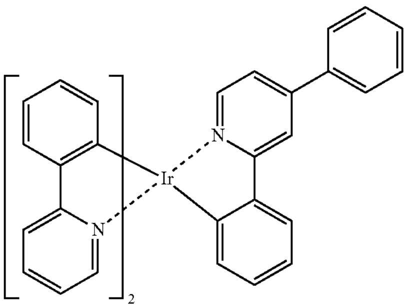
-continued
Dp-29
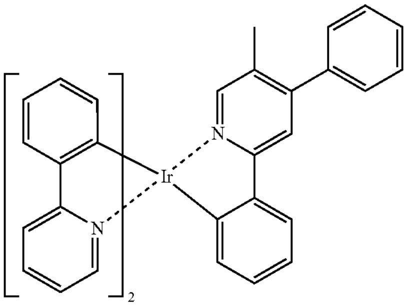
Dp-30
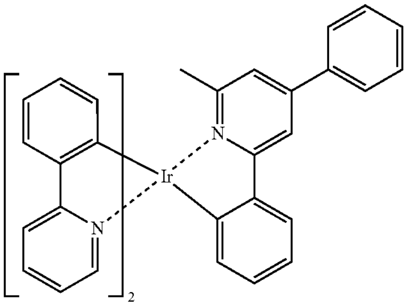
Dp-31
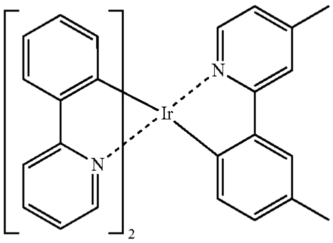
Dp-32
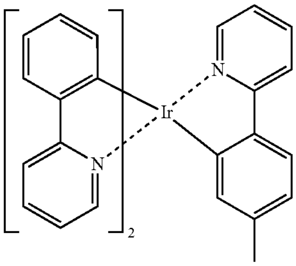
Dp-33
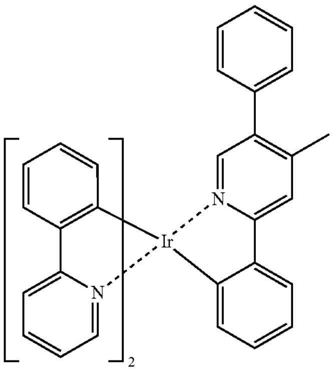

-continued

Dp-34

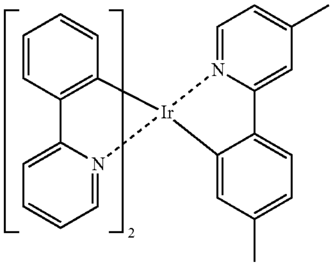

Dp-35

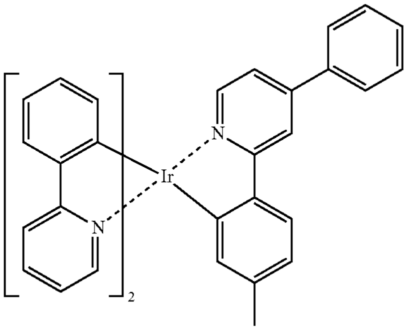

Dp-36

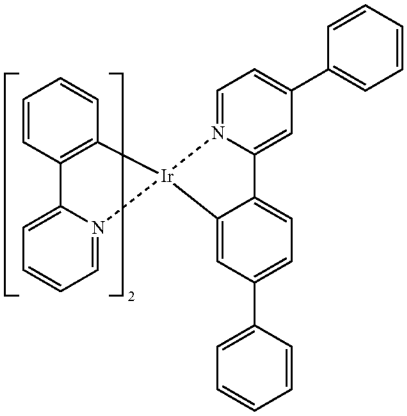

Dp-37

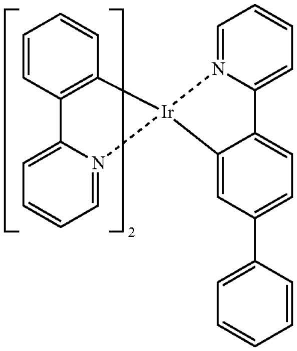

-continued

Dp-38

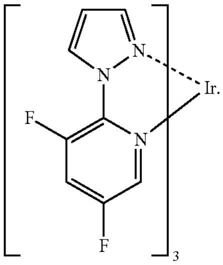

The hole blocking layer means a layer which is formed on the light emitting layer, is preferably provided in contact with the light emitting layer, and thus serves to control electron mobility, to prevent excessive movement of holes, and to increase the probability of hole-electron bonding, thereby improving the efficiency of the organic light emitting device. The hole blocking layer includes an hole blocking material, and as an example of such an hole blocking material, compounds having introduced electron attracting groups, such as azine-based derivatives including triazine; triazole derivatives; oxadiazole derivatives; phenanthroline derivatives; phosphine oxide derivatives can be used, but is not limited thereto.

The electron injection and transport layer is a layer for simultaneously performing the roles of an electron transport layer and an electron injection layer that inject electrons from an electrode and transport the received electrons to the light emitting layer, and is formed on the light emitting layer or the hole blocking layer. The electron injection and transport material is suitably a material which can receive electrons well from a cathode and transfer the electrons to a light emitting layer, and has a large mobility for electrons. Specific examples of the electron injection and transport material include: an Al complex of 8-hydroxyquinoline; a complex including $Alq_3$; an organic radical compound; a hydroxyflavone-metal complex, a triazine derivative, and the like, but are not limited thereto. Alternatively, it may be used together with fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like, but are not limited thereto.

Examples of the metal complex compound include 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)(2-naphtholato)gallium, and the like, but are not limited thereto.

The organic light emitting device according to the present disclosure may be a front side emission type, a back-side emission type, or a double side emission type according to the used material.

In addition, the compound represented by Chemical Formula 1 may be included in an organic solar cell or an organic transistor in addition to an organic light emitting device.

The preparation of the compound represented by Chemical Formula 1 and the organic light emitting device containing the same will be described in detail in the following examples. However, these examples are presented for illustrative purposes only, and are not intended to limit the scope of the present disclosure.

Synthesis Example 1

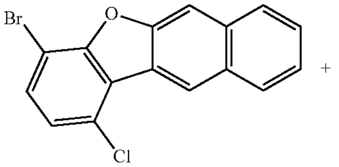

A

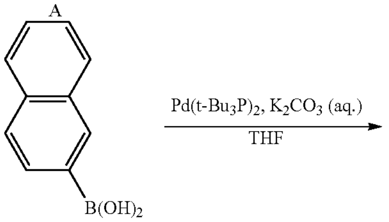

sub1

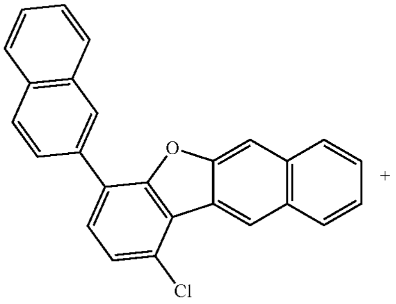

subA-1

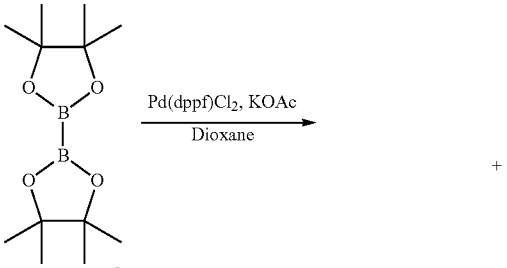

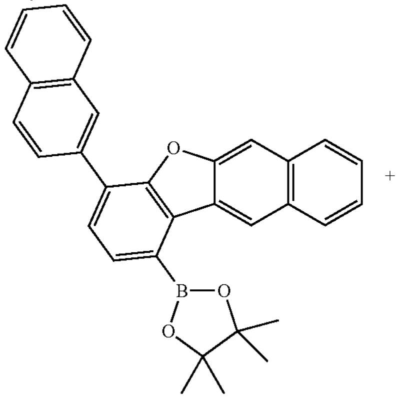

subA-1'

-continued

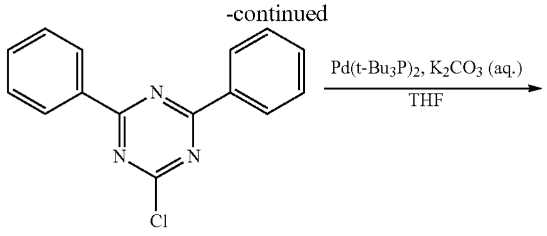

Trz1

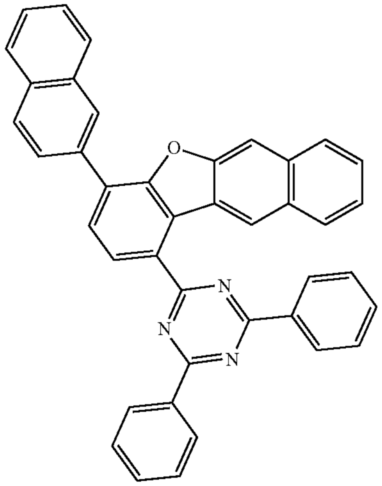

1

Chemical Formula A (15 g, 45.2 mmol) and sub1 (7.8 g, 45.2 mmol) were added to 300 ml of THF under a nitrogen atmosphere, and the mixture was stirred and refluxed. Then, potassium carbonate (18.8 g, 135.7 mmol) was dissolved in 56 ml of water, added thereto, sufficiently stirred, and then bis(tri-tert-butylphosphine)palladium(0) (0.2 g, 0.5 mmol) was added. After the reaction for 11 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 13.2 g of subA-1. (Yield: 77%, MS: [M+H]+=379)

subA-1 (15 g, 39.6 mmol) and bis(pinacolato)diboron (11.1 g, 43.6 mmol) were added to 300 ml of 1,4-dioxane under a nitrogen atmosphere, and the mixture was stirred and refluxed. Then, potassium acetate (5.8 g, 59.4 mmol) was added thereto, sufficiently stirred, and then bis(dibenzylideneacetone)palladium(0) (0.7 g, 1.2 mmol) and tricyclohexylphosphine (0.7 g, 2.4 mmol) were added. After the reaction for 8 hours, the reaction mixture was cooled to room temperature, the organic layer was separated using chloroform and water, and then the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 12.8 g of subA-1'. (Yield: 69%, MS: [M+H]+=471)

subA-1' (15 g, 31.9 mmol) and Trz1 (8.5 g, 31.9 mmol) were added to 300 ml of THF under a nitrogen atmosphere, and the mixture was stirred and refluxed. Then, potassium carbonate (13.2 g, 95.7 mmol) was dissolved in 40 ml of water, added thereto, sufficiently stirred, and then bis(tri-tert-butylphosphine)palladium(0) (0.2 g, 0.3 mmol) was added. After the reaction for 11 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 11.7 g of Compound 1. (Yield: 64%, MS: [M+H]+=576)

Synthesis Example 2

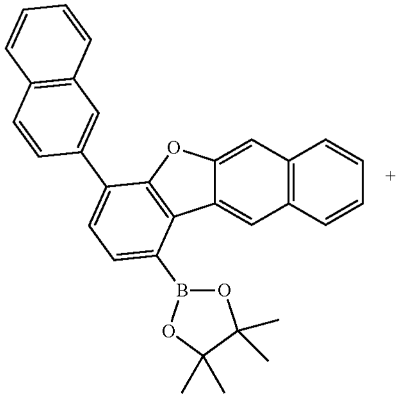

subA-1'

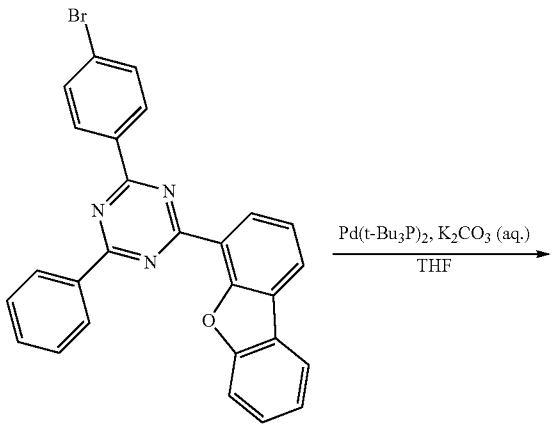

Trz2

-continued

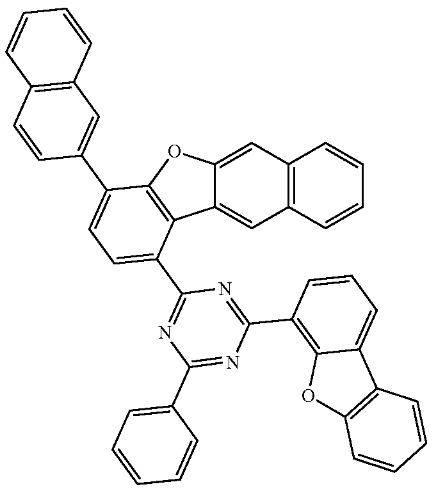

2 subA-1' (15 g, 31.9 mmol) and Trz2 (15.3 g, 31.9 mmol) were added to 300 ml of THF under a nitrogen atmosphere, and the mixture was stirred and refluxed. Then, potassium carbonate (13.2 g, 95.7 mmol) was dissolved in 40 ml of water, added thereto, sufficiently stirred, and then bis(tri-tert-butylphosphine)palladium(0) (0.2 g, 0.3 mmol) was added. After the reaction for 12 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 17.3 g of Compound 2. (Yield: 73%, MS: [M+H]+=742)

Synthesis Example 3

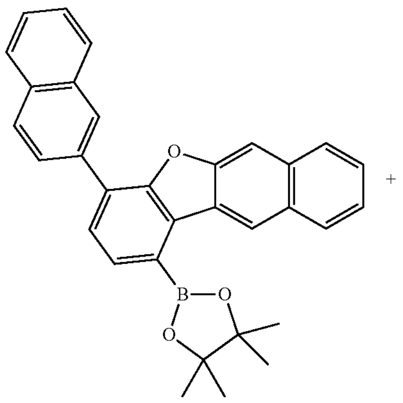

subA-1'

-continued

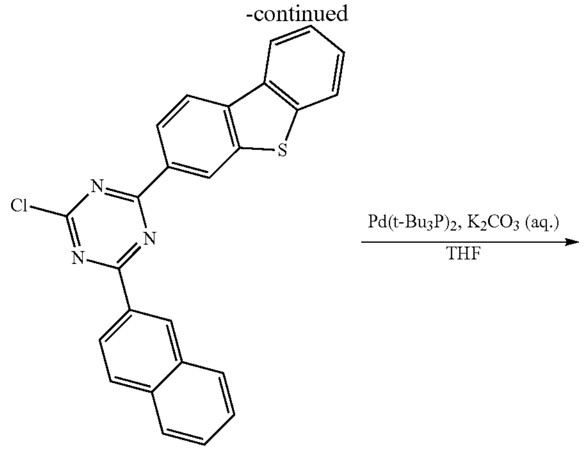

Trz3

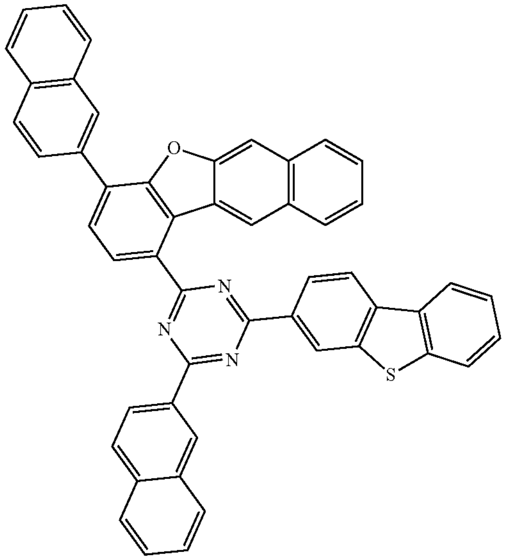

3 subA-1' (15 g, 31.9 mmol) and Trz3 (13.5 g, 31.9 mmol) were added to 300 ml of THF under a nitrogen atmosphere, and the mixture was stirred and refluxed. Then, potassium carbonate (13.2 g, 95.7 mmol) was dissolved in 40 ml of water, added thereto, sufficiently stirred, and then bis(tri-tert-butylphosphine)palladium(0) (0.2 g, 0.3 mmol) was added. After the reaction for 9 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 18.4 g of Compound 3. (Yield: 79%, MS: [M+H]+=732)

Synthesis Example 4

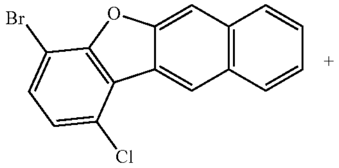

A

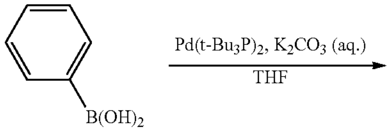

sub2

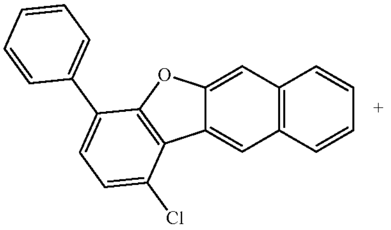

subA-2

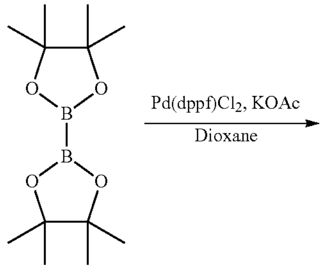

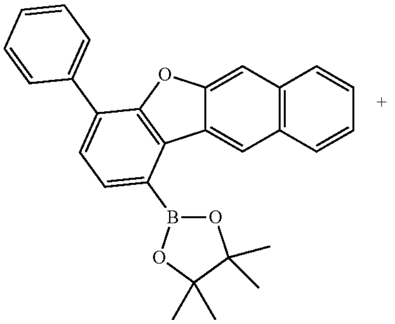

subA-2′

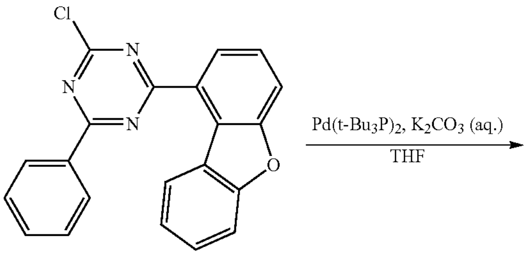

Trz4

-continued

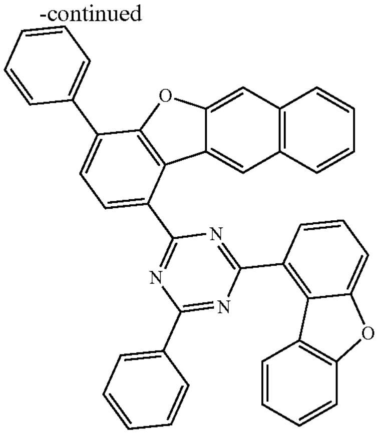

4

Chemical Formula A (15 g, 45.2 mmol) and sub2 (5.5 g, 45.2 mmol) were added to 300 ml of THF under a nitrogen atmosphere, and the mixture was stirred and refluxed. Then, potassium carbonate (18.8 g, 135.7 mmol) was dissolved in 56 ml of water, added thereto, sufficiently stirred, and then bis(tri-tert-butylphosphine)palladium(0) (0.2 g, 0.5 mmol) was added. After the reaction for 8 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 11.7 g of subA-2. (Yield: 79%, MS: [M+H]+=329)

subA-2 (15 g, 45.6 mmol) and bis(pinacolato)diboron (12.7 g, 50.2 mmol) were added to 300 ml of 1,4-dioxane under a nitrogen atmosphere, and the mixture was stirred and refluxed. Then, potassium acetate (6.7 g, 68.4 mmol) was added thereto, sufficiently stirred, and then bis(dibenzylideneacetone)palladium(0) (0.8 g, 1.4 mmol) and tricyclohexylphosphine (0.8 g, 2.7 mmol) were added. After the reaction for 9 hours, the reaction mixture was cooled to room temperature, the organic layer was separated using chloroform and water, and then the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 14.8 g of subA-2'. (Yield: 77%, MS: [M+H]+=421)

subA-2' (15 g, 35.7 mmol) and Trz4 (12.8 g, 35.7 mmol) were added to 300 ml of THF under a nitrogen atmosphere, and the mixture was stirred and refluxed. Then, potassium carbonate (14.8 g, 107.1 mmol) was dissolved in 44 ml of water, added thereto, sufficiently stirred, and then bis(tri-tert-butylphosphine)palladium(0) (0.2 g, 0.4 mmol) was added. After the reaction for 9 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 13.2 g of Compound 4. (Yield: 60%, MS: [M+H]+=616)

Synthesis Example 5

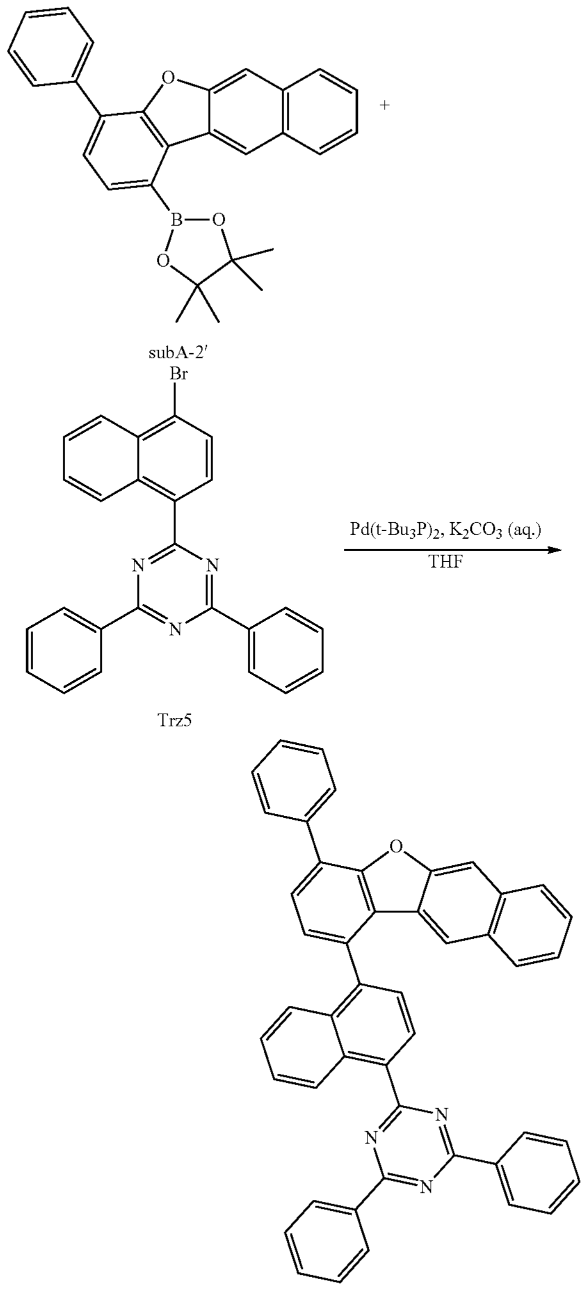

subA-2' (15 g, 35.7 mmol) and Trz5 (15.6 g, 35.7 mmol) were added to 300 ml of THF under a nitrogen atmosphere, and the mixture was stirred and refluxed. Then, potassium carbonate (14.8 g, 107.1 mmol) was dissolved in 44 ml of water, added thereto, sufficiently stirred, and then bis(tri-tert-butylphosphine)palladium(0) (0.2 g, 0.4 mmol) was added. After the reaction for 9 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 17 g of Compound 5. (Yield: 73%, MS: [M+H]+=652)

Synthesis Example 6

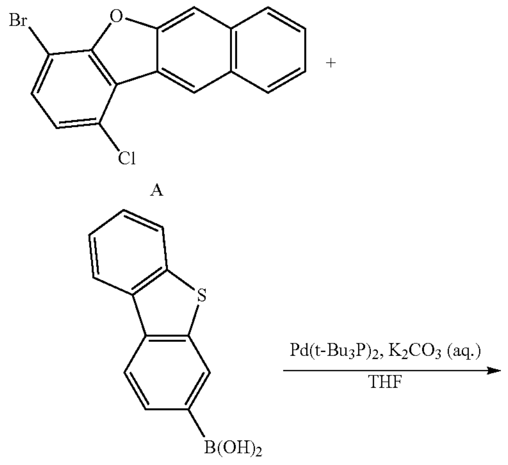

A sub3

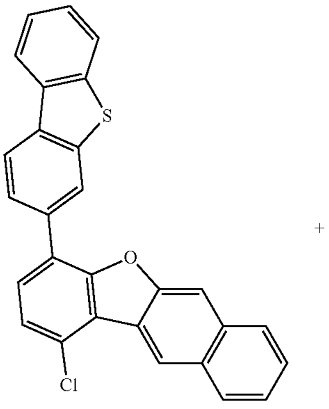

subA-3

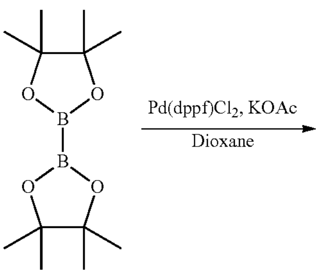

-continued

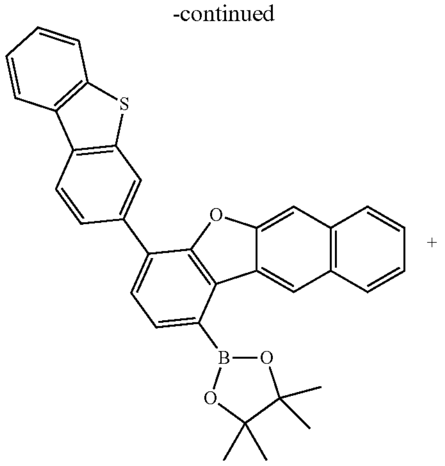

subA-3'

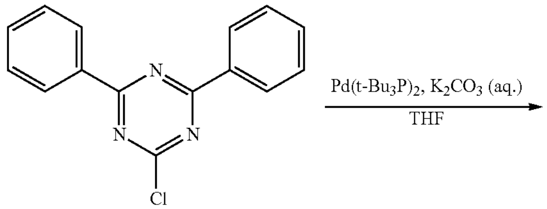

Trz1

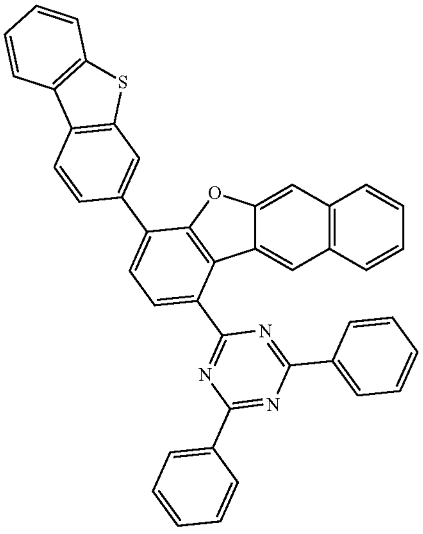

6

Chemical Formula A (15 g, 45.2 mmol) and sub3 (10.3 g, 45.2 mmol) were added to 300 ml of THF under a nitrogen atmosphere, and the mixture was stirred and refluxed. Then, potassium carbonate (18.8 g, 135.7 mmol) was dissolved in 56 ml of water, added thereto, sufficiently stirred, and then bis(tri-tert-butylphosphine)palladium(0) (0.2 g, 0.5 mmol) was added. After the reaction for 11 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 14.1 g of subA-3. (Yield: 72%, MS: [M+H]+=435)

subA-3 (15 g, 34.5 mmol) and bis(pinacolato)diboron (9.6 g, 37.9 mmol) were added to 300 ml of 1,4-dioxane under a nitrogen atmosphere, and the mixture was stirred and refluxed. Then, potassium acetate (5.1 g, 51.7 mmol) was added thereto, sufficiently stirred, and then bis(dibenzylideneacetone)palladium(0) (0.6 g, 1 mmol) and tricyclohexylphosphine (0.6 g, 2.1 mmol) were added. After the reaction for 8 hours, the reaction mixture was cooled to room temperature, the organic layer was separated using chloroform and water, and then the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 12.7 g of subA-3'. (Yield: 70%, MS: [M+H]+=527)

subA-3' (15 g, 28.5 mmol) and Trz1 (7.6 g, 28.5 mmol) were added to 300 ml of THF under a nitrogen atmosphere, and the mixture was stirred and refluxed. Then, potassium carbonate (11.8 g, 85.5 mmol) was dissolved in 35 ml of water, added thereto, sufficiently stirred, and then bis(tri-tert-butylphosphine)palladium(0) (0.1 g, 0.3 mmol) was added. After the reaction for 11 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 13.7 g of Compound 6. (Yield: 76%, MS: [M+H]+=632)

Synthesis Example 7

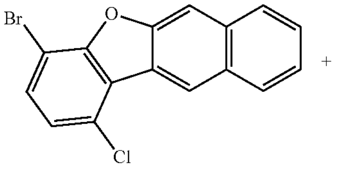

A

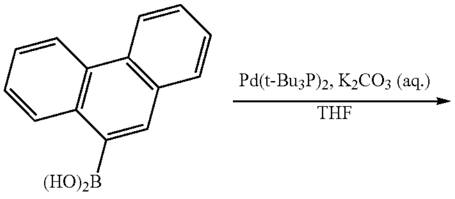

sub4

-continued

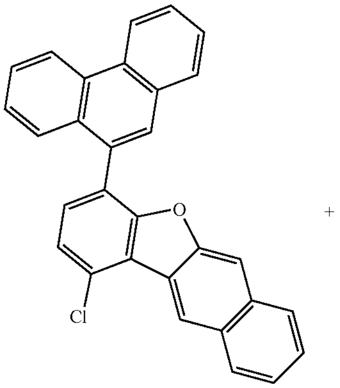

subA-4

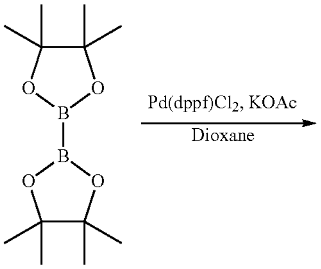

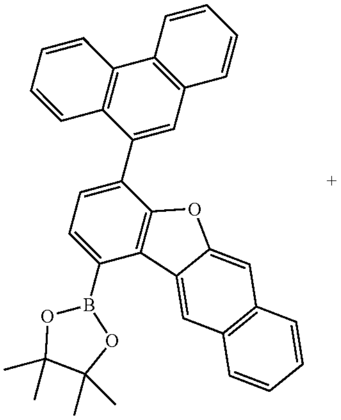

subA-4'

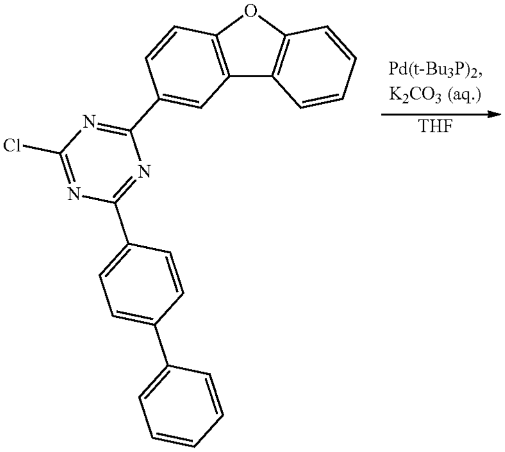

Trz6

-continued

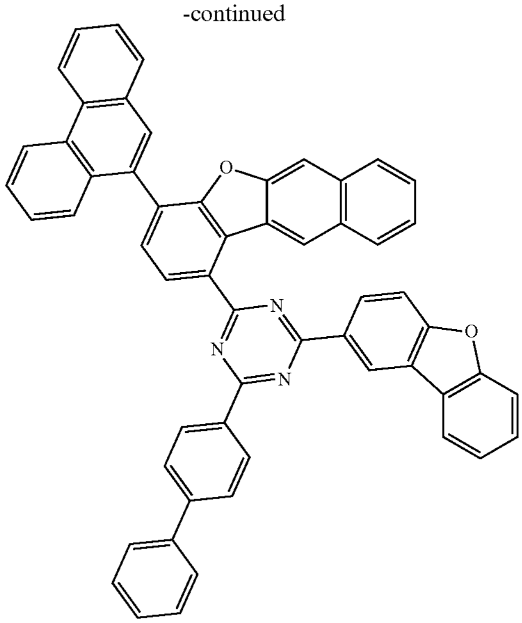

7

Chemical Formula A (15 g, 45.2 mmol) and sub4 (10 g, 45.2 mmol) were added to 300 ml of THF under a nitrogen atmosphere, and the mixture was stirred and refluxed. Then, potassium carbonate (18.8 g, 135.7 mmol) was dissolved in 56 ml of water, added thereto, sufficiently stirred, and then bis(tri-tert-butylphosphine)palladium(0) (0.2 g, 0.5 mmol) was added. After the reaction for 11 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 11.6 g of subA-4. (Yield: 60%, MS: [M+H]+=429)

subA-4 (15 g, 34.5 mmol) and bis(pinacolato)diboron (9.6 g, 37.9 mmol) were added to 300 ml of 1,4-dioxane under a nitrogen atmosphere, and the mixture was stirred and refluxed. Then, potassium acetate (5.1 g, 51.7 mmol) was added thereto, sufficiently stirred, and then bis(dibenzylideneacetone)palladium(0) (0.6 g, 1 mmol) and tricyclohexylphosphine (0.6 g, 2.1 mmol) were added. After the reaction for 8 hours, the reaction mixture was cooled to room temperature, the organic layer was separated using chloroform and water, and then the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 12.7 g of subA-4'. (Yield: 70%, MS: [M+H]+=527)

subA-4' (15 g, 28.8 mmol) and Trz6 (12.5 g, 28.8 mmol) were added to 300 ml of THF under a nitrogen atmosphere, and the mixture was stirred and refluxed. Then, potassium carbonate (12 g, 86.5 mmol) was dissolved in 36 ml of water, added thereto, sufficiently stirred, and then bis(tri-tert-butylphosphine)palladium(0) (0.1 g, 0.3 mmol) was added. After the reaction for 10 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 16.6 g of Compound 7. (Yield: 73%, MS: [M+H]+=792)

Synthesis Example 8

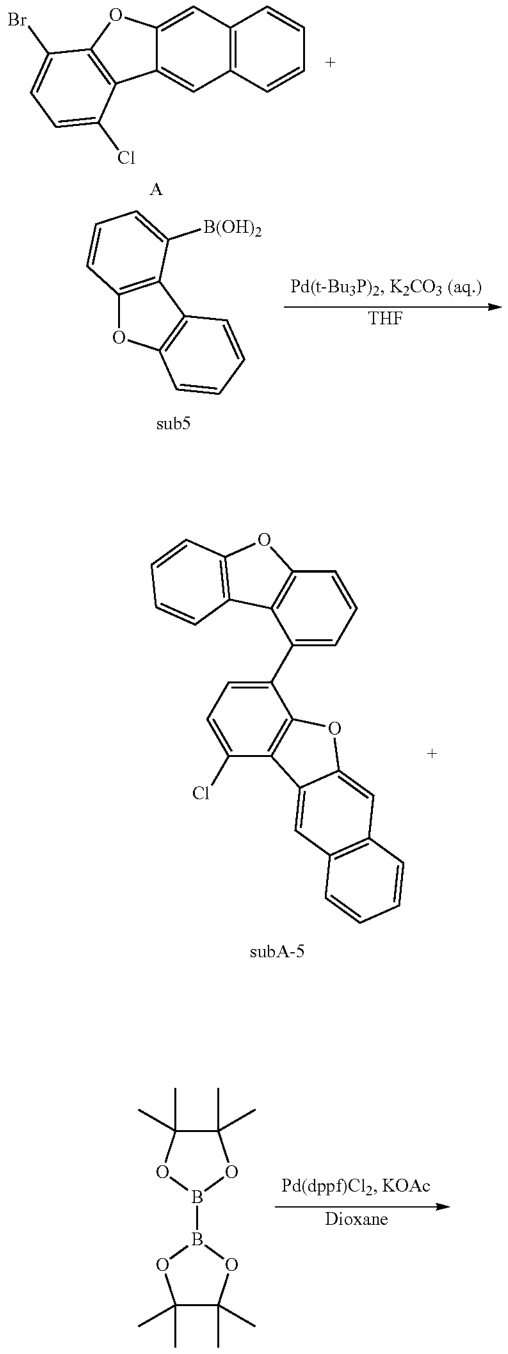

A sub5 subA-5

-continued

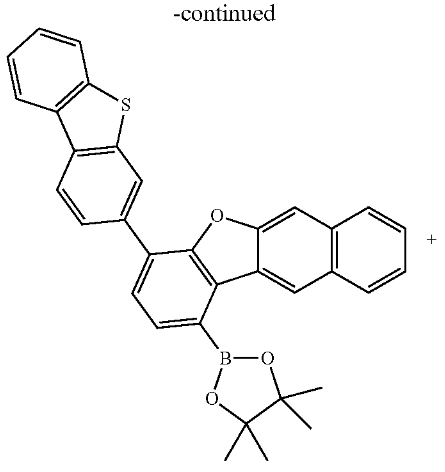

subA-5'

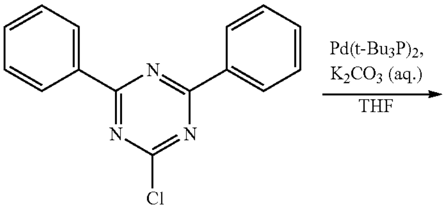

Trz1

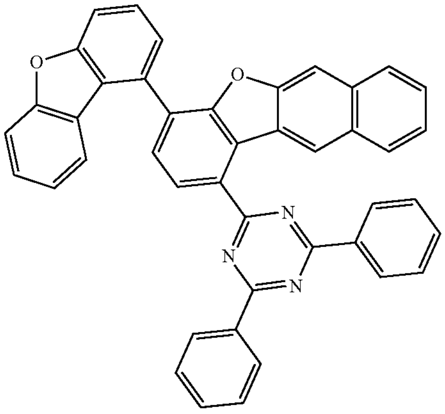

8

Chemical Formula A (15 g, 45.2 mmol) and sub5 (9.6 g, 45.2 mmol) were added to 300 ml of THF under a nitrogen atmosphere, and the mixture was stirred and refluxed. Then, potassium carbonate (18.8 g, 135.7 mmol) was dissolved in 56 ml of water, added thereto, sufficiently stirred, and then bis(tri-tert-butylphosphine)palladium(0) (0.2 g, 0.5 mmol) was added. After the reaction for 9 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 14.8 g of subA-5. (Yield: 78%, MS: [M+H]+=419)

subA-5 (15 g, 35.8 mmol) and bis(pinacolato)diboron (10 g, 39.4 mmol) were added to 300 ml of 1,4-dioxane under a nitrogen atmosphere, and the mixture was stirred and refluxed. Then, potassium acetate (5.3 g, 53.7 mmol) was added thereto, sufficiently stirred, and then bis(dibenzylideneacetone)palladium(0) (0.6 g, 1.1 mmol) and tricyclohexylphosphine (0.6 g, 2.1 mmol) were added. After the reaction for 6 hours, the reaction mixture was cooled to room temperature, the organic layer was separated using chloroform and water, and then the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 14.3 g of subA-5'. (Yield: 76%, MS: [M+H]+=527)

subA-5' (15 g, 28.5 mmol) and Trz1 (7.6 g, 28.5 mmol) were added to 300 ml of THF under a nitrogen atmosphere, and the mixture was stirred and refluxed. Then, potassium carbonate (11.8 g, 85.5 mmol) was dissolved in 35 ml of water, added thereto, sufficiently stirred, and then bis(tri-tert-butylphosphine)palladium(0) (0.1 g, 0.3 mmol) was added. After the reaction for 12 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 12.3 g of Compound 8. (Yield: 70%, MS: [M+H]+=616)

Synthesis Example 9

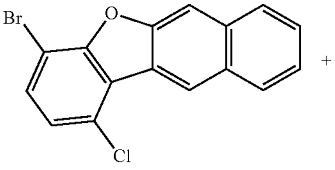

A

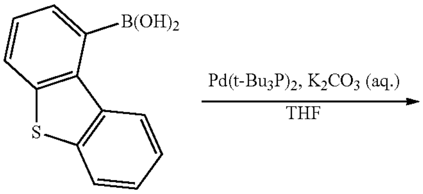

sub6

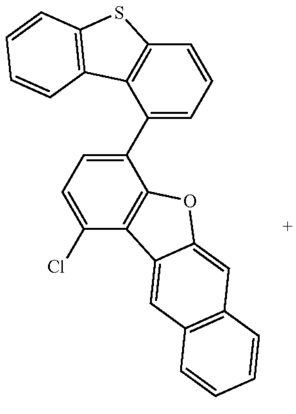

subA-6

-continued

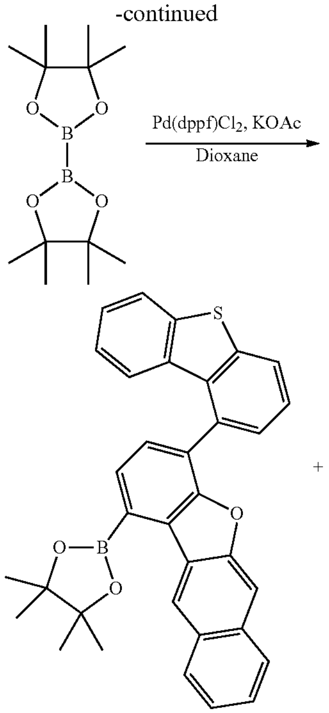

subA-6'

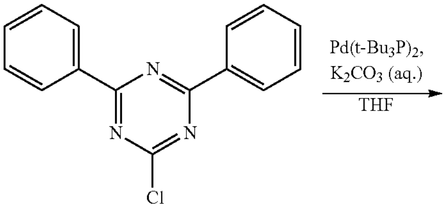

Trz1

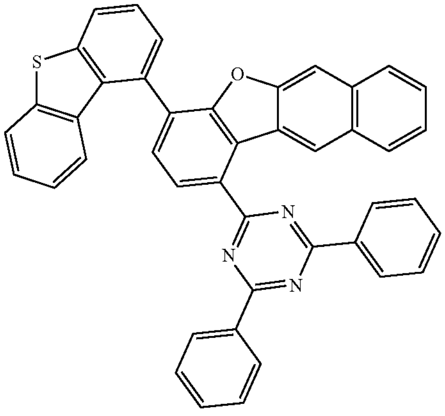

9

Chemical Formula A (15 g, 45.2 mmol) and sub6 (10.3 g, 45.2 mmol) were added to 300 ml of THF under a nitrogen atmosphere, and the mixture was stirred and refluxed. Then, potassium carbonate (18.8 g, 135.7 mmol) was dissolved in 56 ml of water, added thereto, sufficiently stirred, and then bis(tri-tert-butylphosphine)palladium(0) (0.2 g, 0.5 mmol) was added. After the reaction for 10 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 15.7 g of subA-6. (Yield: 80%, MS: [M+H]+=435)

subA-6 (15 g, 34.5 mmol) and bis(pinacolato)diboron (9.6 g, 37.9 mmol) were added to 300 ml of 1,4-dioxane under a nitrogen atmosphere, and the mixture was stirred and refluxed. Then, potassium acetate (5.1 g, 51.7 mmol) was added thereto, sufficiently stirred, and then bis(dibenzylideneacetone)palladium(0) (0.6 g, 1 mmol) and tricyclohexylphosphine (0.6 g, 2.1 mmol) were added. After the reaction for 8 hours, the reaction mixture was cooled to room temperature, the organic layer was separated using chloroform and water, and then the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 11.6 g of subA-6'. (Yield: 64%, MS: [M+H]+=527)

subA-6' (15 g, 28.5 mmol) and Trz1 (7.6 g, 28.5 mmol) were added to 300 ml of THF under a nitrogen atmosphere, and the mixture was stirred and refluxed. Then, potassium carbonate (11.8 g, 85.5 mmol) was dissolved in 35 ml of water, added thereto, sufficiently stirred, and then bis(tri-tert-butylphosphine)palladium(0) (0.1 g, 0.3 mmol) was added. After the reaction for 9 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 14.4 g of Compound 9. (Yield: 80%, MS: [M+H]+=632)

Synthesis Example 10

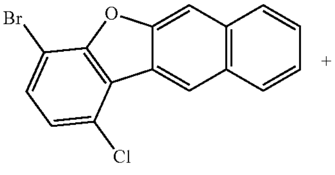

A

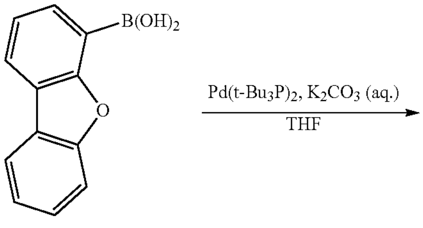

sub7

-continued

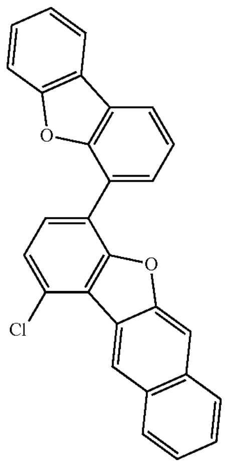

+ subA-7

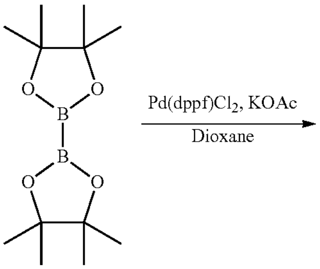

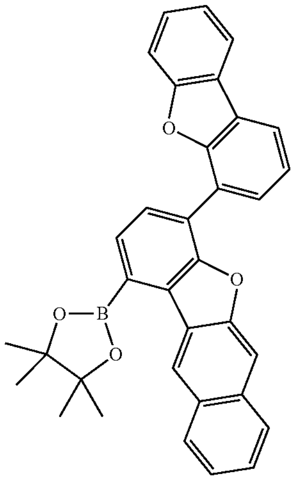

+ subA-7'

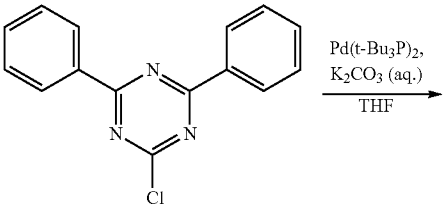

Trz1

-continued

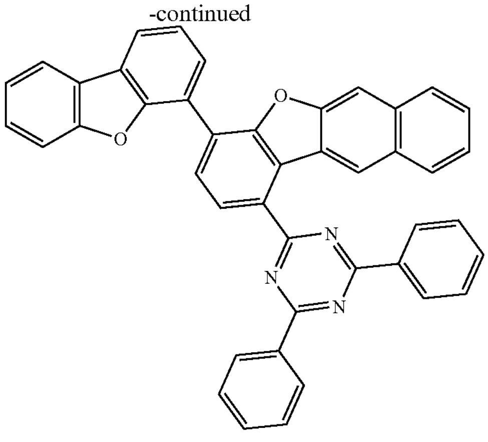

10

Chemical Formula A (15 g, 45.2 mmol) and sub7 (9.6 g, 45.2 mmol) were added to 300 ml of THF under a nitrogen atmosphere, and the mixture was stirred and refluxed. Then, potassium carbonate (18.8 g, 135.7 mmol) was dissolved in 56 ml of water, added thereto, sufficiently stirred, and then bis(tri-tert-butylphosphine)palladium(0) (0.2 g, 0.5 mmol) was added. After the reaction for 11 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 12.3 g of subA-7. (Yield: 65%, MS: [M+H]+=419)

subA-7 (15 g, 35.8 mmol) and bis(pinacolato)diboron (10 g, 39.4 mmol) were added to 300 ml of 1,4-dioxane under a nitrogen atmosphere, and the mixture was stirred and refluxed. Then, potassium acetate (5.3 g, 53.7 mmol) was added thereto, sufficiently stirred, and then bis(dibenzylideneacetone)palladium(0) (0.6 g, 1.1 mmol) and tricyclohexylphosphine (0.6 g, 2.1 mmol) were added. After the reaction for 7 hours, the reaction mixture was cooled to room temperature, the organic layer was separated using chloroform and water, and then the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 12.8 g of subA-7'. (Yield: 70%, MS: [M+H]+=511)

subA-7' (15 g, 29.4 mmol) and Trz1 (7.9 g, 29.4 mmol) were added to 300 ml of THF under a nitrogen atmosphere, and the mixture was stirred and refluxed. Then, potassium carbonate (12.2 g, 88.2 mmol) was dissolved in 37 ml of water, added thereto, sufficiently stirred, and then bis(tri-tert-butylphosphine)palladium(0) (0.2 g, 0.3 mmol) was added. After the reaction for 10 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 11.2 g of Compound 10. (Yield: 62%, MS: [M+H]+=616)

Synthesis Example 11

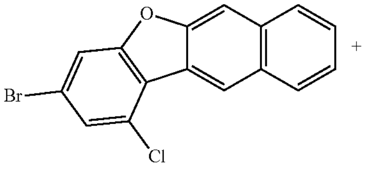

B

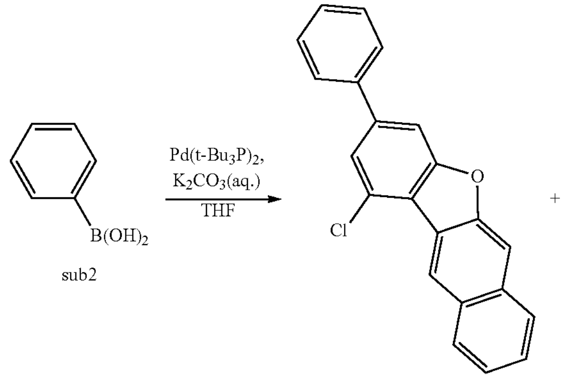

sub2 subB-1

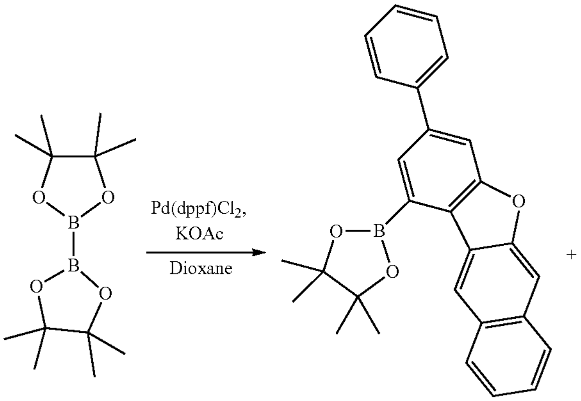

subB-1'

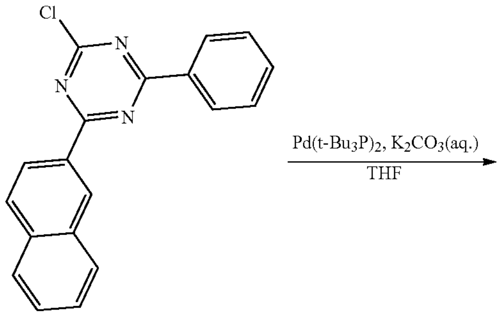

Trz7

-continued

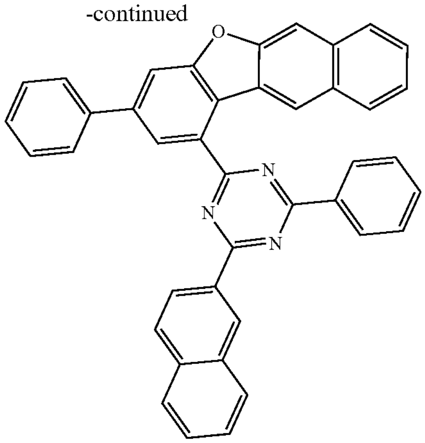

11

Chemical Formula B (15 g, 45.2 mmol) and sub2 (5.5 g, 45.2 mmol) were added to 300 ml of THF under a nitrogen atmosphere, and the mixture was stirred and refluxed. Then, potassium carbonate (18.8 g, 135.7 mmol) was dissolved in 56 ml of water, added thereto, sufficiently stirred, and then bis(tri-tert-butylphosphine)palladium(0) (0.2 g, 0.5 mmol) was added. After the reaction for 11 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 10.8 g of subB-1. (Yield: 73%, MS: [M+H]+=329)

subB-1 (15 g, 45.6 mmol) and bis(pinacolato)diboron (12.7 g, 50.2 mmol) were added to 300 ml of 1,4-dioxane under a nitrogen atmosphere, and the mixture was stirred and refluxed. Then, potassium acetate (6.7 g, 68.4 mmol) was added thereto, sufficiently stirred, and then bis(dibenzylideneacetone)palladium(0) (0.8 g, 1.4 mmol) and tricyclohexylphosphine (0.8 g, 2.7 mmol) were added. After the reaction for 9 hours, the reaction mixture was cooled to room temperature, the organic layer was separated using chloroform and water, and then the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 13 g of subB-1'. (Yield: 68%, MS: [M+H]+=421)

subB-1' (15 g, 35.7 mmol) and Trz7 (11.3 g, 35.7 mmol) were added to 300 ml of THF under a nitrogen atmosphere, and the mixture was stirred and refluxed. Then, potassium carbonate (14.8 g, 107.1 mmol) was dissolved in 44 ml of water, added thereto, sufficiently stirred, and then bis(tri-tert-butylphosphine)palladium(0) (0.2 g, 0.4 mmol) was added. After the reaction for 9 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 12.5 g of Compound 11. (Yield: 61%, MS: [M+H]+=576)

Synthesis Example 12

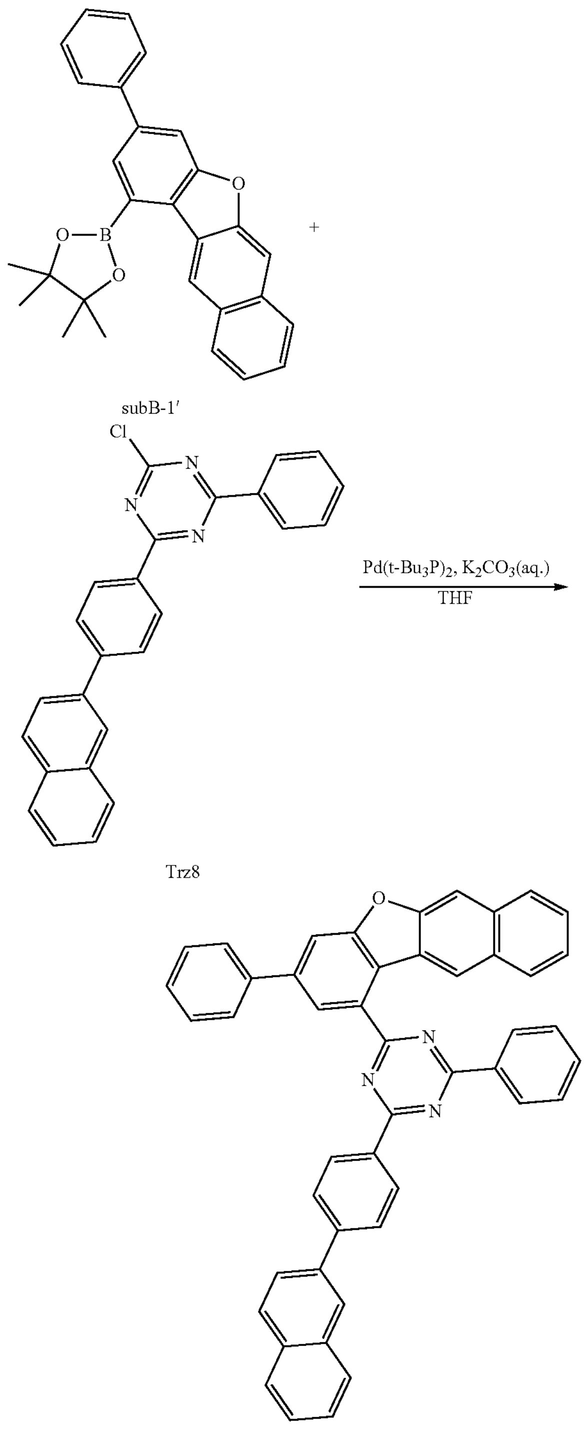

subB-1'

Trz8

12 subB-1' (15 g, 35.7 mmol) and Trz8 (14.1 g, 35.7 mmol) were added to 300 ml of THF under a nitrogen atmosphere, and the mixture was stirred and refluxed. Then, potassium carbonate (14.8 g, 107.1 mmol) was dissolved in 44 ml of water, added thereto, sufficiently stirred, and then bis(tri-tert-butylphosphine)palladium(0) (0.2 g, 0.4 mmol) was added. After the reaction for 10 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 15.8 g of Compound 12. (Yield: 68%, MS: [M+H]+=652)

Synthesis Example 13

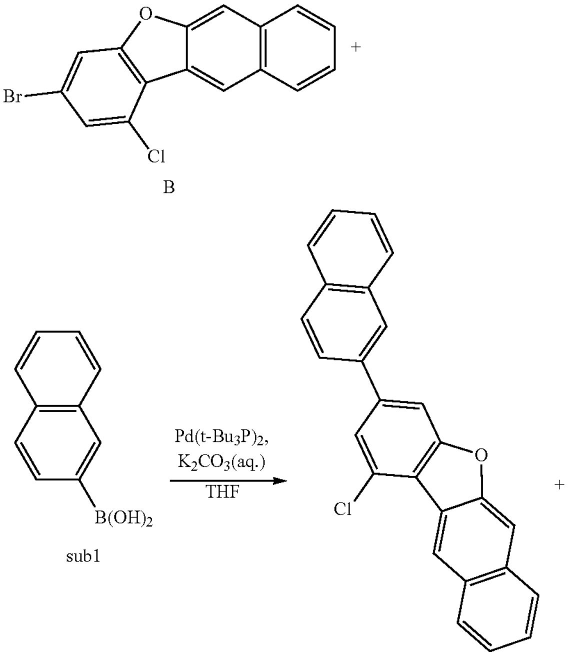

B sub1 subB-2

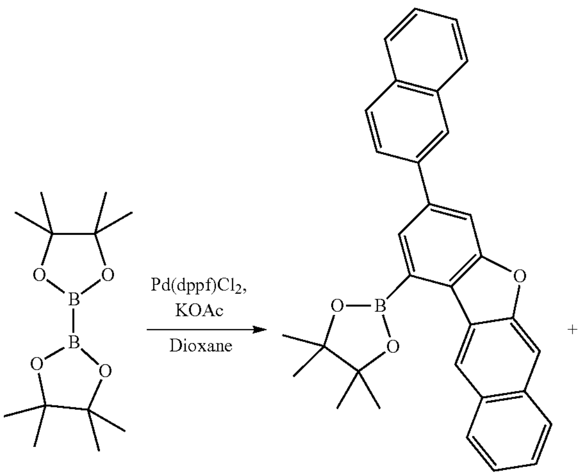

subB-2'

-continued

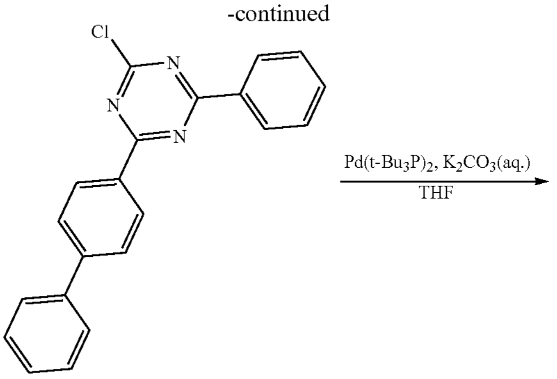

Trz9

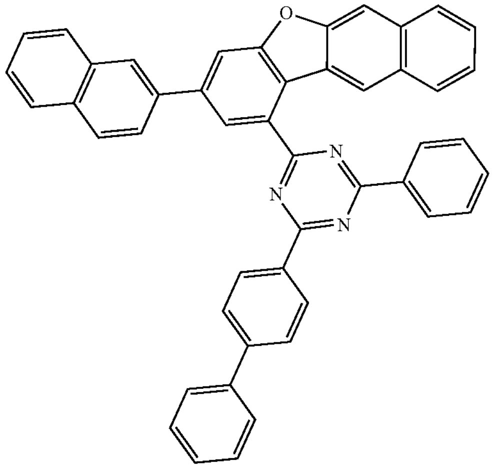

13

Chemical Formula B (15 g, 45.2 mmol) and sub1 (7.8 g, 45.2 mmol) were added to 300 ml of THF under a nitrogen atmosphere, and the mixture was stirred and refluxed. Then, potassium carbonate (18.8 g, 135.7 mmol) was dissolved in 56 ml of water, added thereto, sufficiently stirred, and then bis(tri-tert-butylphosphine)palladium(0) (0.2 g, 0.5 mmol) was added. After the reaction for 12 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 10.8 g of subB-2. (Yield: 63%, MS: [M+H]+=379)

subB-2 (15 g, 39.6 mmol) and bis(pinacolato)diboron (11.1 g, 43.6 mmol) were added to 300 ml of 1,4-dioxane under a nitrogen atmosphere, and the mixture was stirred and refluxed. Then, potassium acetate (5.8 g, 59.4 mmol) was added thereto, sufficiently stirred, and then bis(dibenzylideneacetone)palladium(0) (0.7 g, 1.2 mmol) and tricyclohexylphosphine (0.7 g, 2.4 mmol) were added. After the reaction for 6 hours, the reaction mixture was cooled to room temperature, the organic layer was separated using chloroform and water, and then the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 12.5 g of subB-2'. (Yield: 67%, MS: [M+H]+=471)

subB-2' (15 g, 31.9 mmol) and Trz9 (11 g, 31.9 mmol) were added to 300 ml of THF under a nitrogen atmosphere, and the mixture was stirred and refluxed. Then, potassium carbonate (13.2 g, 95.7 mmol) was dissolved in 40 ml of water, added thereto, sufficiently stirred, and then bis(tri-tert-butylphosphine)palladium(0) (0.2 g, 0.3 mmol) was added. After the reaction for 11 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 14.3 g of Compound 13. (Yield: 69%, MS: [M+H]+=652)

Synthesis Example 14

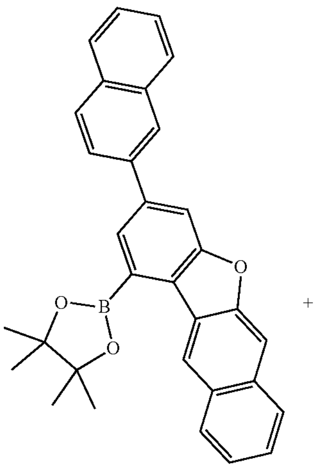

subB-2'

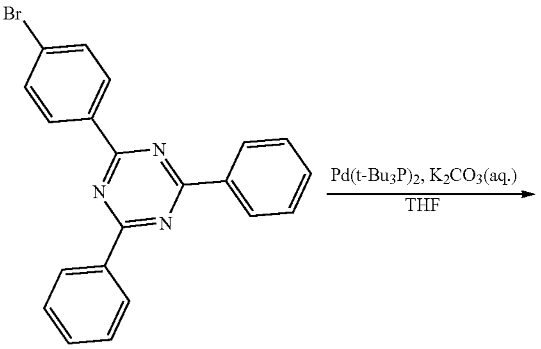

Trz10

-continued

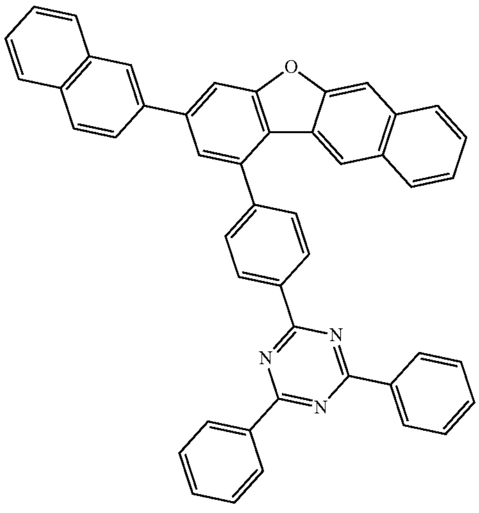

14 subB-2' (15 g, 31.9 mmol) and Trz10 (12.4 g, 31.9 mmol) were added to 300 ml of THF under a nitrogen atmosphere, and the mixture was stirred and refluxed. Then, potassium carbonate (13.2 g, 95.7 mmol) was dissolved in 40 ml of water, added thereto, sufficiently stirred, and then bis(tri-tert-butylphosphine)palladium(0) (0.2 g, 0.3 mmol) was added. After the reaction for 9 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 14.9 g of Compound 14. (Yield: 76%, MS: [M+H]+=616)

Synthesis Example 15

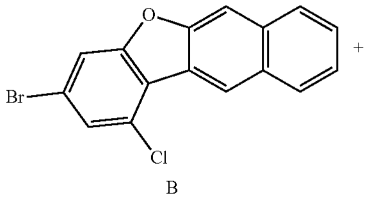

B

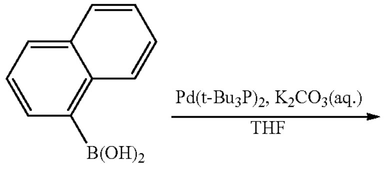

sub8

-continued

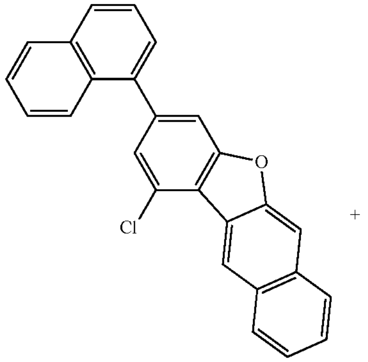

subB-3

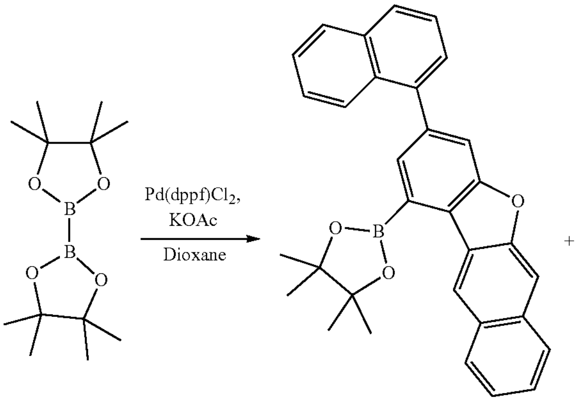

subB-3'

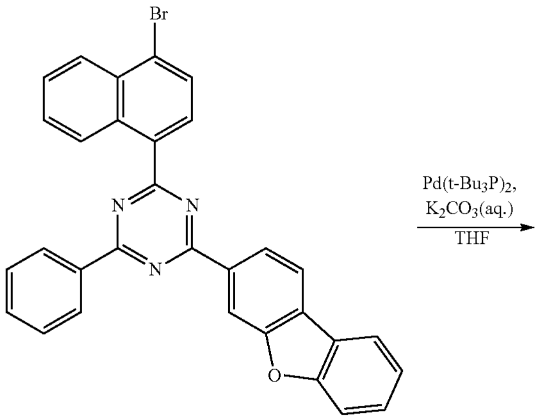

Trz11

-continued

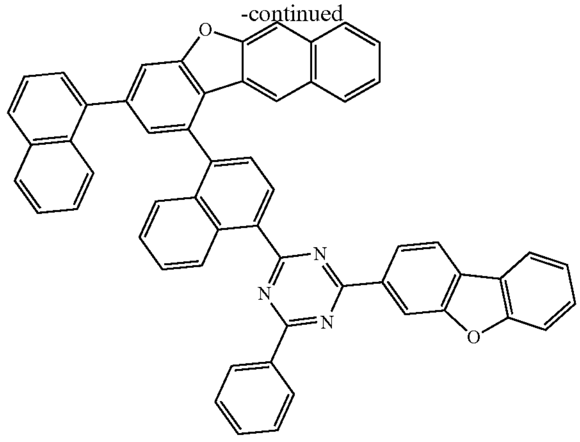

15

Chemical Formula B (15 g, 45.2 mmol) and sub8 (7.8 g, 45.2 mmol) were added to 300 ml of THF under a nitrogen atmosphere, and the mixture was stirred and refluxed. Then, potassium carbonate (18.8 g, 135.7 mmol) was dissolved in 56 ml of water, added thereto, sufficiently stirred, and then bis(tri-tert-butylphosphine)palladium(0) (0.2 g, 0.5 mmol) was added. After the reaction for 12 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 12.7 g of subB-3. (Yield: 74%, MS: [M+H]+=379)

subB-3 (15 g, 35.8 mmol) and bis(pinacolato)diboron (10 g, 39.4 mmol) were added to 300 ml of 1,4-dioxane under a nitrogen atmosphere, and the mixture was stirred and refluxed. Then, potassium acetate (5.3 g, 53.7 mmol) was added thereto, sufficiently stirred, and then bis(dibenzylideneacetone)palladium(0) (0.6 g, 1.1 mmol) and tricyclohexylphosphine (0.6 g, 2.1 mmol) were added. After the reaction for 10 hours, the reaction mixture was cooled to room temperature, the organic layer was separated using chloroform and water, and then the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 11.1 g of subB-3'. (Yield: 66%, MS: [M+H]+=471)

subB-3' (15 g, 31.9 mmol) and Trz11 (16.9 g, 31.9 mmol) were added to 300 ml of THF under a nitrogen atmosphere, and the mixture was stirred and refluxed. Then, potassium carbonate (13.2 g, 95.7 mmol) was dissolved in 40 ml of water, added thereto, sufficiently stirred, and then bis(tri-tert-butylphosphine)palladium(0) (0.2 g, 0.3 mmol) was added. After the reaction for 11 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 20.2 g of Compound 15. (Yield: 80%, MS: [M+H]+=792)

Synthesis Example 16

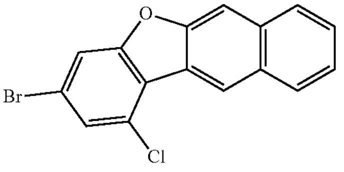

+

B

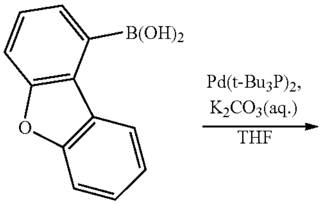

sub5

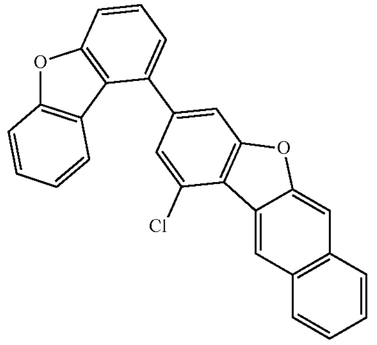

+ subB-4

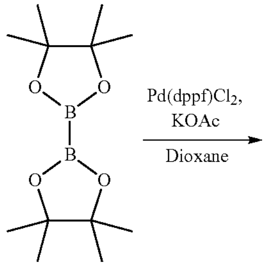

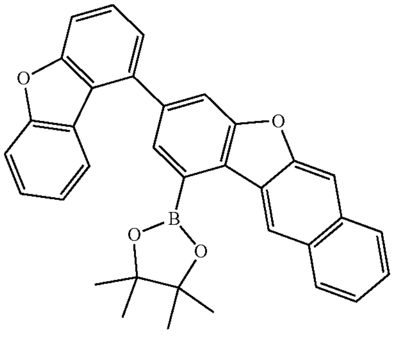

+ subB-4'

-continued

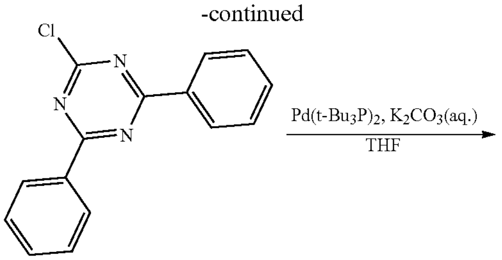

Trzl

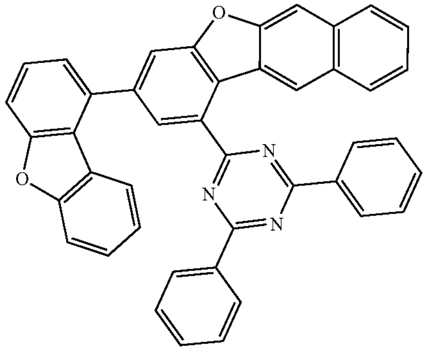

16

Chemical Formula B (15 g, 45.2 mmol) and sub5 (9.6 g, 45.2 mmol) were added to 300 ml of THF under a nitrogen atmosphere, and the mixture was stirred and refluxed. Then, potassium carbonate (18.8 g, 135.7 mmol) was dissolved in 56 ml of water, added thereto, sufficiently stirred, and then bis(tri-tert-butylphosphine)palladium(0) (0.2 g, 0.5 mmol) was added. After the reaction for 10 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 12.3 g of subB-4. (Yield: 65%, MS: [M+H]+=419)

subB-4 (15 g, 35.8 mmol) and bis(pinacolato)diboron (10 g, 39.4 mmol) were added to 300 ml of 1,4-dioxane under a nitrogen atmosphere, and the mixture was stirred and refluxed. Then, potassium acetate (5.3 g, 53.7 mmol) was added thereto, sufficiently stirred, and then bis(dibenzylideneacetone)palladium(0) (0.6 g, 1.1 mmol) and tricyclohexylphosphine (0.6 g, 2.1 mmol) were added. After the reaction for 5 hours, the reaction mixture was cooled to room temperature, the organic layer was separated using chloroform and water, and then the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 11.9 g of subB-4'. (Yield: 65%, MS: [M+H]+=511)

subB-4' (15 g, 29.4 mmol) and Trz1 (7.9 g, 29.4 mmol) were added to 300 ml of THF under a nitrogen atmosphere, and the mixture was stirred and refluxed. Then, potassium carbonate (12.2 g, 88.2 mmol) was dissolved in 37 ml of water, added thereto, sufficiently stirred, and then bis(tri-tert-butylphosphine)palladium(0) (0.2 g, 0.3 mmol) was added. After the reaction for 9 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 10.8 g of Compound 16. (Yield: 60%, MS: [M+H]+=616)

Synthesis Example 17

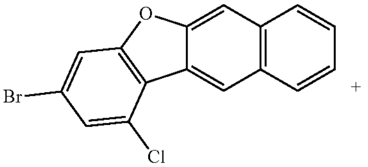

B

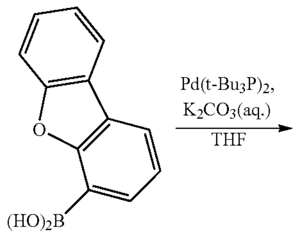

sub7

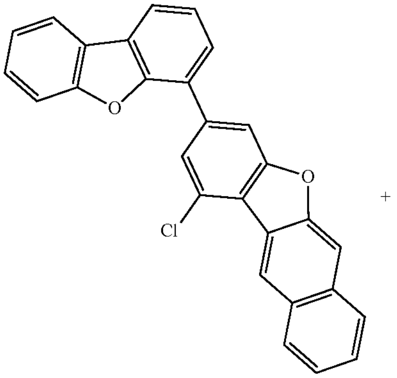

subB-5

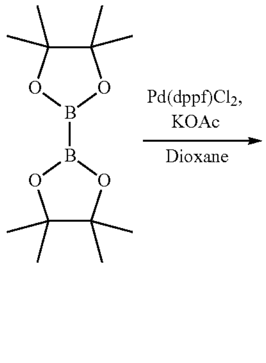

-continued

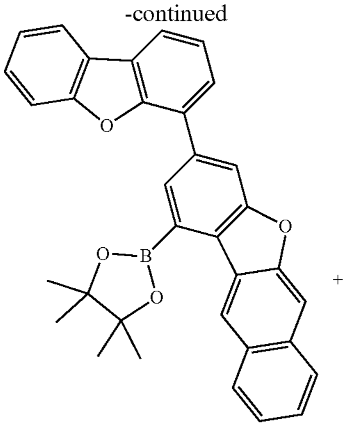

subB-5'

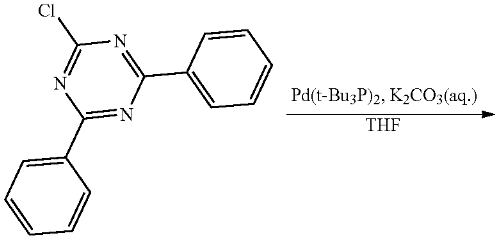

Trz1

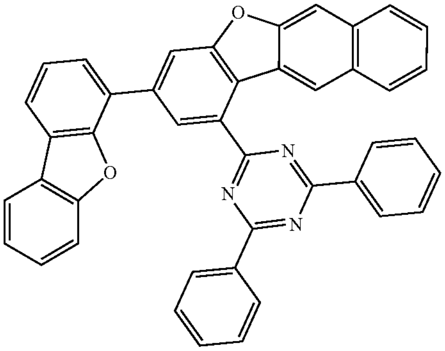

17

Chemical Formula B (15 g, 45.2 mmol) and sub7 (9.6 g, 45.2 mmol) were added to 300 ml of THF under a nitrogen atmosphere, and the mixture was stirred and refluxed. Then, potassium carbonate (18.8 g, 135.7 mmol) was dissolved in 56 ml of water, added thereto, sufficiently stirred, and then bis(tri-tert-butylphosphine)palladium(0) (0.2 g, 0.5 mmol) was added. After the reaction for 10 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 13.4 g of subB-5. (Yield: 71%, MS: [M+H]+=419)

subB-5 (15 g, 35.8 mmol) and bis(pinacolato)diboron (10 g, 39.4 mmol) were added to 300 ml of 1,4-dioxane under a nitrogen atmosphere, and the mixture was stirred and refluxed. Then, potassium acetate (5.3 g, 53.7 mmol) was added thereto, sufficiently stirred, and then bis(dibenzylideneacetone)palladium(0) (0.6 g, 1.1 mmol) and tricyclohexylphosphine (0.6 g, 2.1 mmol) were added. After the reaction for 8 hours, the reaction mixture was cooled to room temperature, the organic layer was separated using chloroform and water, and then the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 11 g of subB-5'. (Yield: 60%, MS: [M+H]+=511)

subB-5' (15 g, 29.4 mmol) and Trz1 (7.9 g, 29.4 mmol) were added to 300 ml of THF under a nitrogen atmosphere, and the mixture was stirred and refluxed. Then, potassium carbonate (12.2 g, 88.2 mmol) was dissolved in 37 ml of water, added thereto, sufficiently stirred, and then bis(tri-tert-butylphosphine)palladium(0) (0.2 g, 0.3 mmol) was added. After the reaction for 10 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 11.2 g of Compound 17. (Yield: 62%, MS: [M+H]+=616)

Synthesis Example 18

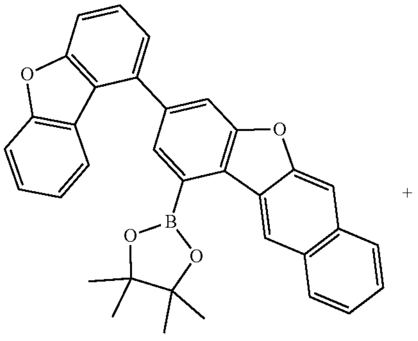

subB-4'

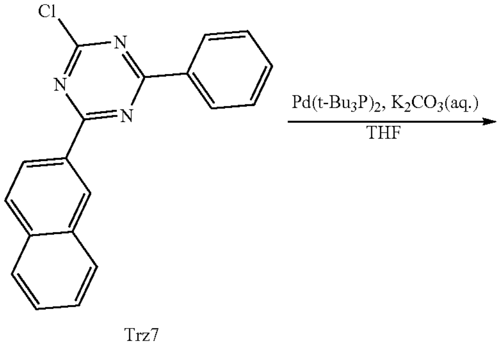

Trz7

-continued

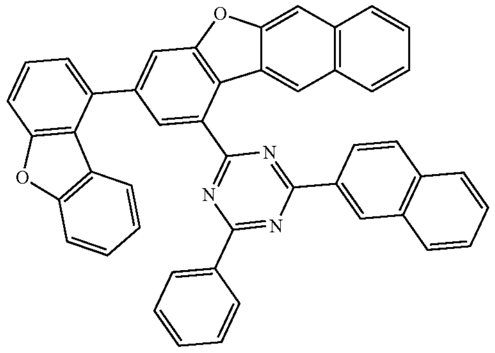

18 subB-4' (15 g, 29.4 mmol) and Trz7 (9.3 g, 29.4 mmol) were added to 300 ml of THF under a nitrogen atmosphere, and the mixture was stirred and refluxed. Then, potassium carbonate (12.2 g, 88.2 mmol) was dissolved in 37 ml of water, added thereto, sufficiently stirred, and then bis(tri-tert-butylphosphine)palladium(0) (0.2 g, 0.3 mmol) was added. After the reaction for 10 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 14.3 g of Compound 18. (Yield: 62%, MS: [M+H]+=666)

Synthesis Example 19

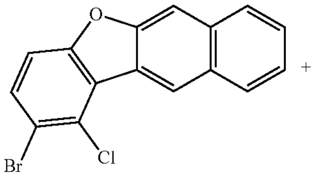

C

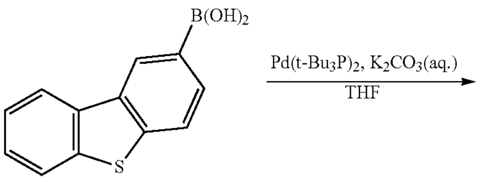

sub10

-continued

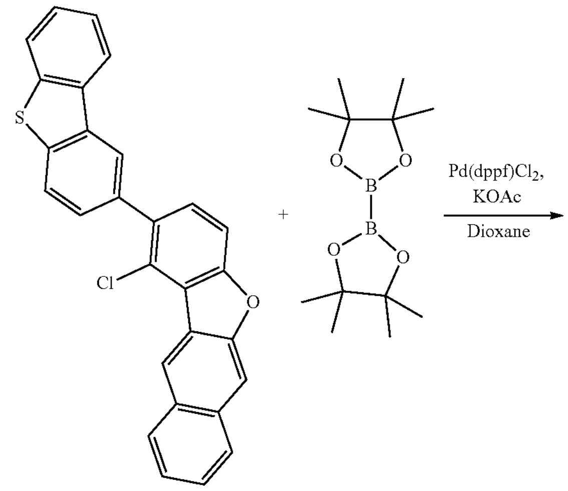

subC-1

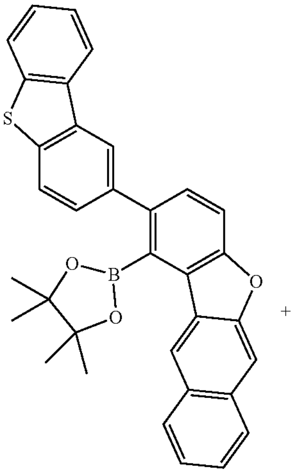

subC-1'

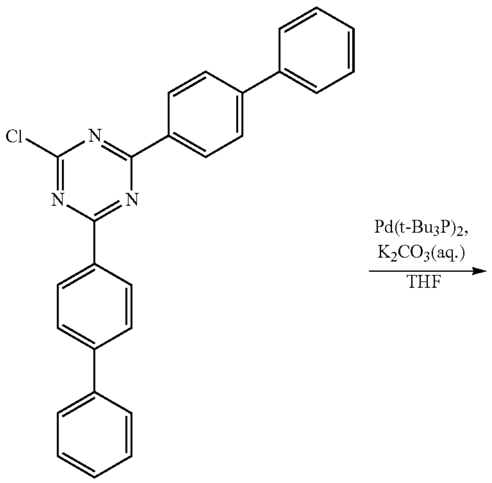

Trz12

-continued

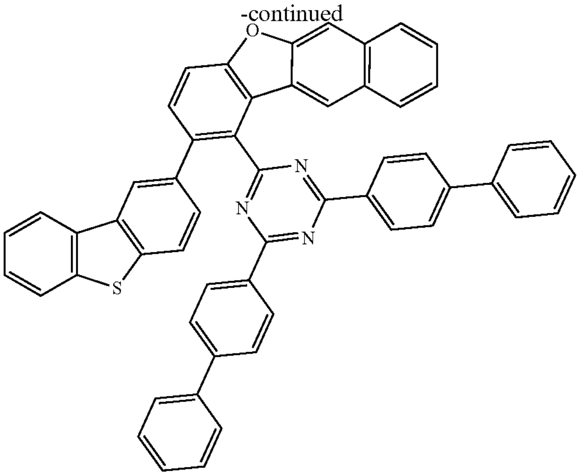

19

Chemical Formula C (15 g, 45.2 mmol) and sub10 (10.3 g, 45.2 mmol) were added to 300 ml of THF under a nitrogen atmosphere, and the mixture was stirred and refluxed. Then, potassium carbonate (18.8 g, 135.7 mmol) was dissolved in 56 ml of water, added thereto, sufficiently stirred, and then bis(tri-tert-butylphosphine)palladium(0) (0.2 g, 0.5 mmol) was added. After the reaction for 12 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 14.5 g of subC-1. (Yield: 74%, MS: [M+H]+=435)

subC-1 (15 g, 34.5 mmol) and bis(pinacolato)diboron (9.6 g, 37.9 mmol) were added to 300 ml of 1,4-dioxane under a nitrogen atmosphere, and the mixture was stirred and refluxed. Then, potassium acetate (5.1 g, 51.7 mmol) was added thereto, sufficiently stirred, and then bis(dibenzylideneacetone)palladium(0) (0.6 g, 1 mmol) and tricyclohexylphosphine (0.6 g, 2.1 mmol) were added. After the reaction for 7 hours, the reaction mixture was cooled to room temperature, the organic layer was separated using chloroform and water, and then the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 11.6 g of subC-1'. (Yield: 64%, MS: [M+H]+=527)

subC-1' (15 g, 28.5 mmol) and Trz12 (12 g, 28.5 mmol) were added to 300 ml of THF under a nitrogen atmosphere, and the mixture was stirred and refluxed. Then, potassium carbonate (11.8 g, 85.5 mmol) was dissolved in 35 ml of water, added thereto, sufficiently stirred, and then bis(tri-tert-butylphosphine)palladium(0) (0.1 g, 0.3 mmol) was added. After the reaction for 12 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 17.6 g of Compound 19. (Yield: 73%, MS: [M+H]+=784)

Synthesis Example 20

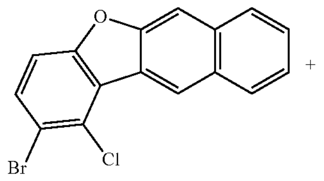

C

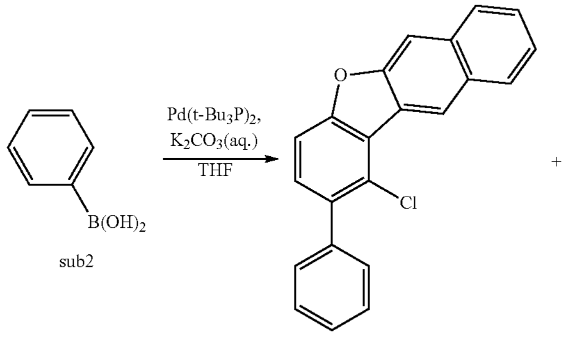

subC-2

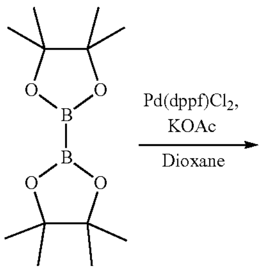

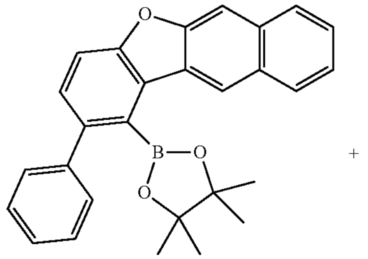

subC-2'

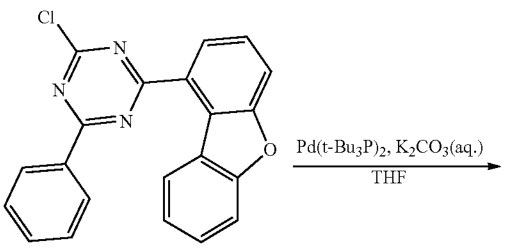

Trz4

-continued

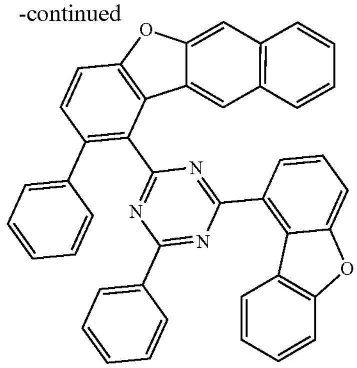

20

Chemical Formula C (15 g, 45.2 mmol) and sub2 (5.5 g, 45.2 mmol) were added to 300 ml of THF under a nitrogen atmosphere, and the mixture was stirred and refluxed. Then, potassium carbonate (18.8 g, 135.7 mmol) was dissolved in 56 ml of water, added thereto, sufficiently stirred, and then bis(tri-tert-butylphosphine)palladium(0) (0.2 g, 0.5 mmol) was added. After the reaction for 8 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 11.1 g of subC-2. (Yield: 75%, MS: [M+H]+=329)

subC-2 (15 g, 45.6 mmol) and bis(pinacolato)diboron (12.7 g, 50.2 mmol) were added to 300 ml of 1,4-dioxane under a nitrogen atmosphere, and the mixture was stirred and refluxed. Then, potassium acetate (6.7 g, 68.4 mmol) was added thereto, sufficiently stirred, and then bis(dibenzylideneacetone)palladium(0) (0.8 g, 1.4 mmol) and tricyclohexylphosphine (0.8 g, 2.7 mmol) were added. After the reaction for 6 hours, the reaction mixture was cooled to room temperature, the organic layer was separated using chloroform and water, and then the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 14.4 g of subC-2'. (Yield: 75%, MS: [M+H]+=421)

subC-2' (15 g, 35.7 mmol) and Trz4 (12.8 g, 35.7 mmol) were added to 300 ml of THF under a nitrogen atmosphere, and the mixture was stirred and refluxed. Then, potassium carbonate (14.8 g, 107.1 mmol) was dissolved in 44 ml of water, added thereto, sufficiently stirred, and then bis(tri-tert-butylphosphine)palladium(0) (0.2 g, 0.4 mmol) was added. After the reaction for 10 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 15.1 g of Compound 20. (Yield: 69%, MS: [M+H]+=616)

Synthesis Example 21

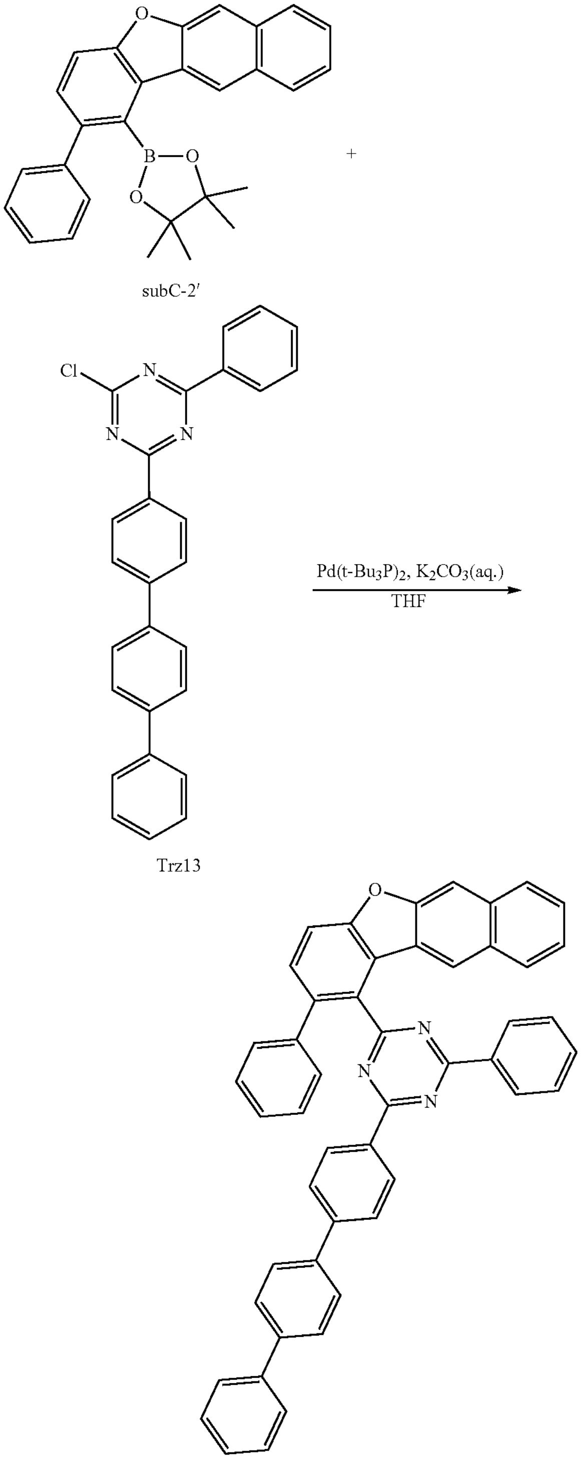

subC-2'

Trz13

21 subC-2' (15 g, 35.7 mmol) and Trz13 (15 g, 35.7 mmol) were added to 300 ml of THF under a nitrogen atmosphere, and the mixture was stirred and refluxed. Then, potassium carbonate (14.8 g, 107.1 mmol) was dissolved in 44 ml of water, added thereto, sufficiently stirred, and then bis(tritert-butylphosphine)palladium(0) (0.2 g, 0.4 mmol) was added. After the reaction for 12 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 16 g of Compound 21. (Yield: 66%, MS: [M+H]+=678)

Synthesis Example 22

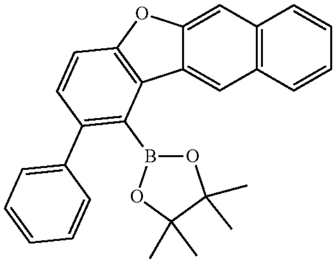

+ subC-2'

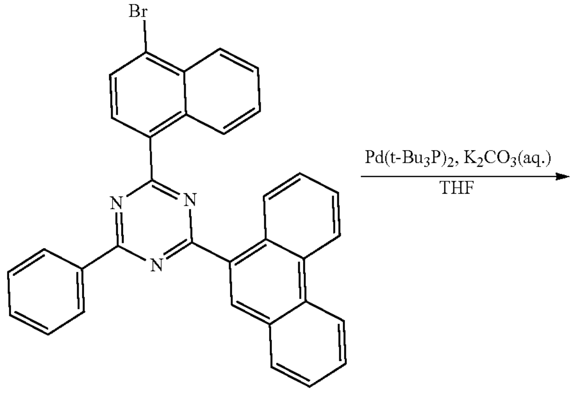

Trz14

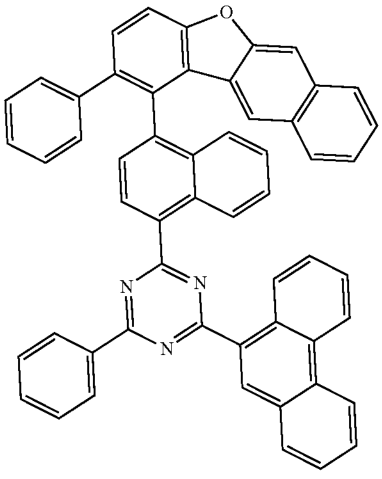

22 subC-2' (15 g, 35.7 mmol) and Trz14 (9.6 g, 35.7 mmol) were added to 300 ml of THF under a nitrogen atmosphere, and the mixture was stirred and refluxed. Then, potassium carbonate (14.8 g, 107.1 mmol) was dissolved in 44 ml of water, added thereto, sufficiently stirred, and then bis(tri-tert-butylphosphine)palladium(0) (0.2 g, 0.4 mmol) was added. After the reaction for 10 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 18.2 g of Compound 22. (Yield: 68%, MS: [M+H]+=752)

Synthesis Example 23

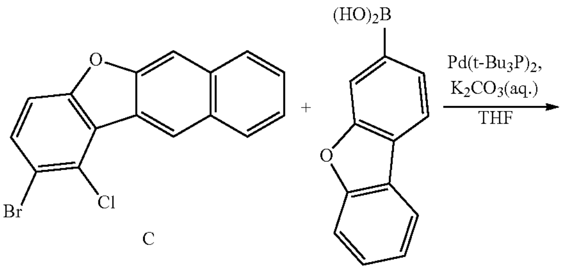

C sub11

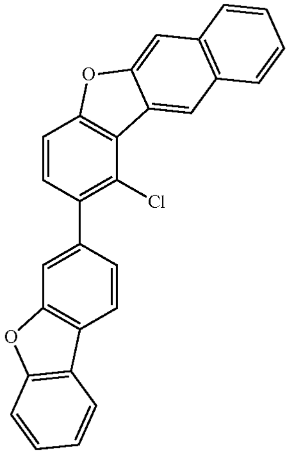

+ subC-3

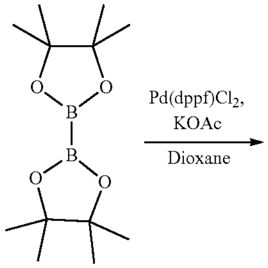

-continued

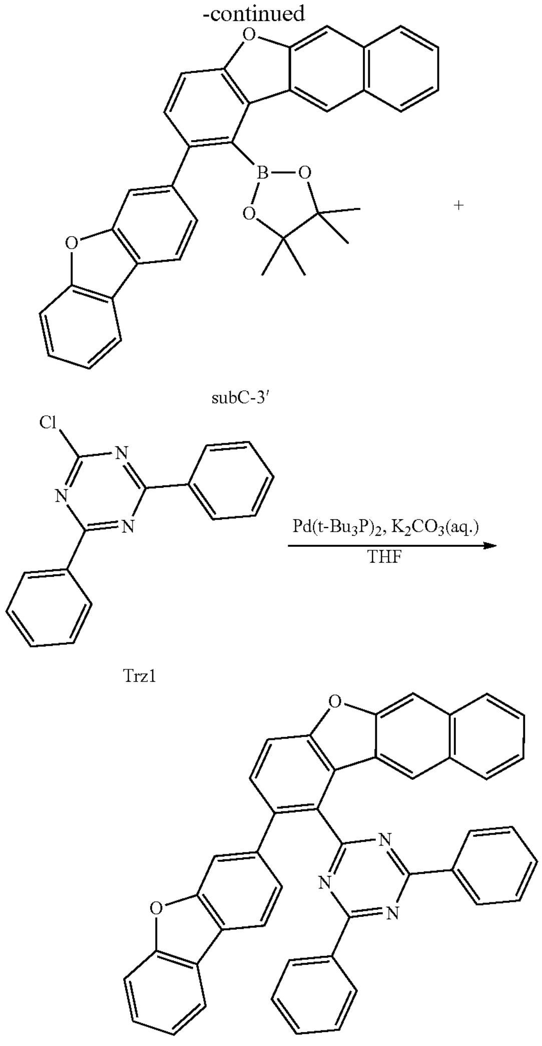

subC-3'

Trz1

23

Chemical Formula C (15 g, 45.2 mmol) and sub11 (9.6 g, 45.2 mmol) were added to 300 ml of THF under a nitrogen atmosphere, and the mixture was stirred and refluxed. Then, potassium carbonate (18.8 g, 135.7 mmol) was dissolved in 56 ml of water, added thereto, sufficiently stirred, and then bis(tri-tert-butylphosphine)palladium(0) (0.2 g, 0.5 mmol) was added. After the reaction for 12 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 13.4 g of subC-3. (Yield: 71%, MS: [M+H]+=419)

subC-3 (15 g, 35.8 mmol) and bis(pinacolato)diboron (10 g, 39.4 mmol) were added to 300 ml of 1,4-dioxane under a nitrogen atmosphere, and the mixture was stirred and refluxed. Then, potassium acetate (5.3 g, 53.7 mmol) was added thereto, sufficiently stirred, and then bis(dibenzylideneacetone)palladium(0) (0.6 g, 1.1 mmol) and tricyclohexylphosphine (0.6 g, 2.1 mmol) were added. After the reaction for 9 hours, the reaction mixture was cooled to room temperature, the organic layer was separated using chloroform and water, and then the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 11.4 g of subC-3'. (Yield: 68%, MS: [M+H]+=471)

subC-3' (15 g, 29.4 mmol) and Trz1 (7.9 g, 29.4 mmol) were added to 300 ml of THF under a nitrogen atmosphere, and the mixture was stirred and refluxed. Then, potassium carbonate (12.2 g, 88.2 mmol) was dissolved in 37 ml of water, added thereto, sufficiently stirred, and then bis(tri-tert-butylphosphine)palladium(0) (0.2 g, 0.3 mmol) was added. After the reaction for 9 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 11 g of Compound 23. (Yield: 61%, MS: [M+H]+=616)

Synthesis Example 24

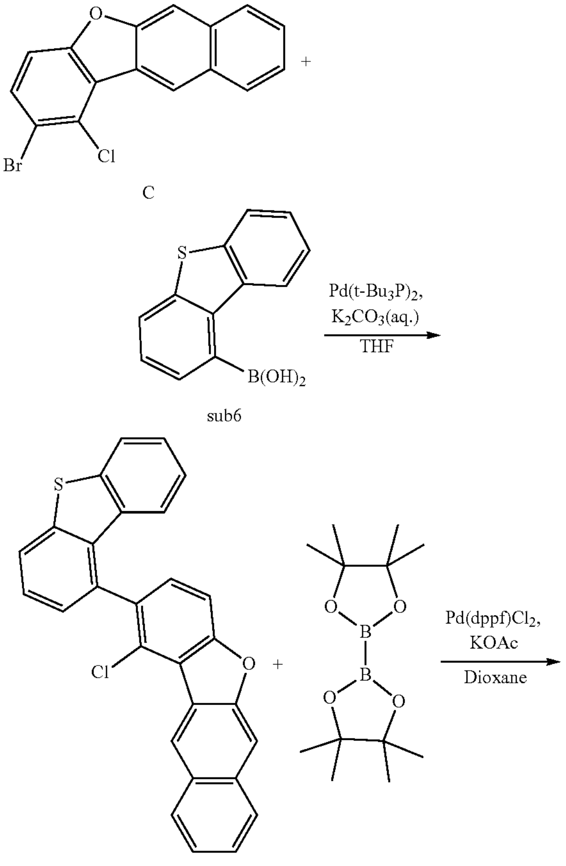

C sub6 subC-4

-continued

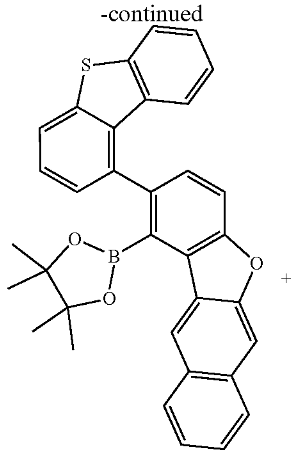

subC-4′

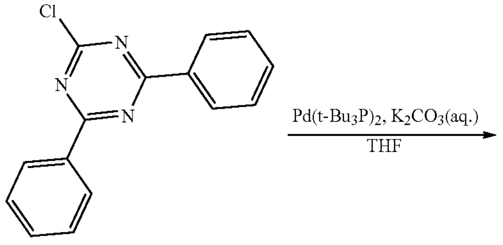

Trz1

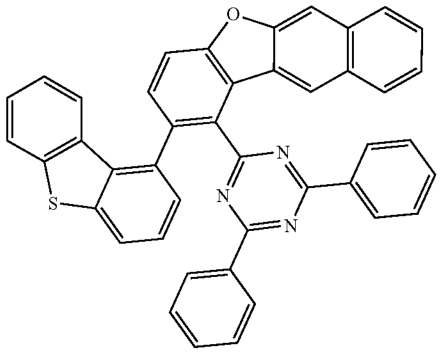

24

Chemical Formula C (15 g, 45.2 mmol) and sub6 (10.3 g, 45.2 mmol) were added to 300 ml of THF under a nitrogen atmosphere, and the mixture was stirred and refluxed. Then, potassium carbonate (18.8 g, 135.7 mmol) was dissolved in 56 ml of water, added thereto, sufficiently stirred, and then bis(tri-tert-butylphosphine)palladium(0) (0.2 g, 0.5 mmol) was added. After the reaction for 11 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 12 g of subC-4. (Yield: 61%, MS: [M+H]+=435)

subC-4 (15 g, 34.5 mmol) and bis(pinacolato)diboron (9.6 g, 37.9 mmol) were added to 300 ml of 1,4-dioxane under a nitrogen atmosphere, and the mixture was stirred and refluxed. Then, potassium acetate (5.1 g, 51.7 mmol) was added thereto, sufficiently stirred, and then bis(dibenzylideneacetone)palladium(0) (0.6 g, 1 mmol) and tricyclohexylphosphine (0.6 g, 2.1 mmol) were added. After the reaction for 6 hours, the reaction mixture was cooled to room temperature, the organic layer was separated using chloroform and water, and then the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 11.4 g of subC-4'. (Yield: 63%, MS: [M+H]+=527)

subC-4' (15 g, 28.5 mmol) and Trz1 (7.6 g, 28.5 mmol) were added to 300 ml of THF under a nitrogen atmosphere, and the mixture was stirred and refluxed. Then, potassium carbonate (11.8 g, 85.5 mmol) was dissolved in 35 ml of water, added thereto, sufficiently stirred, and then bis(tri-tert-butylphosphine)palladium(0) (0.1 g, 0.3 mmol) was added. After the reaction for 9 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 11.7 g of Compound 24. (Yield: 65%, MS: [M+H]+=632)

Synthesis Example 25

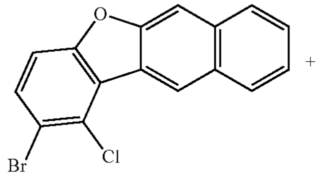

C

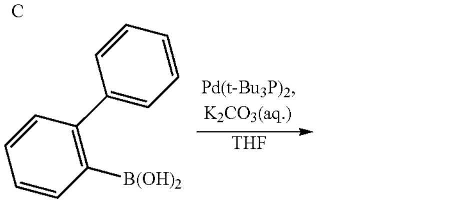

sub12

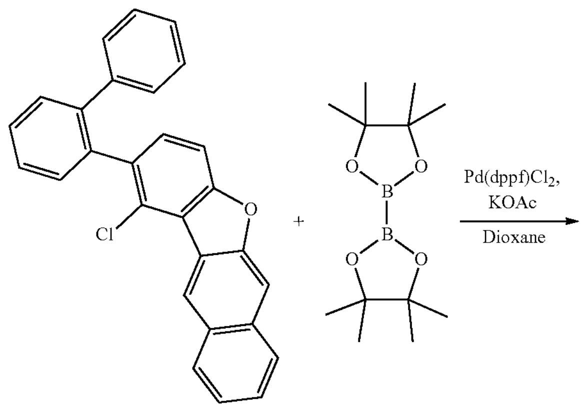

subC-5

-continued

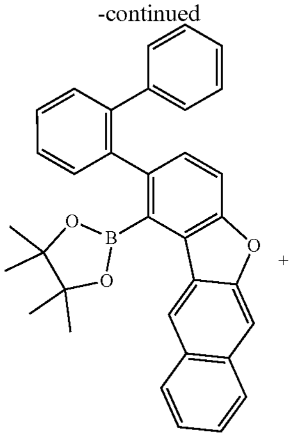

subC-5'

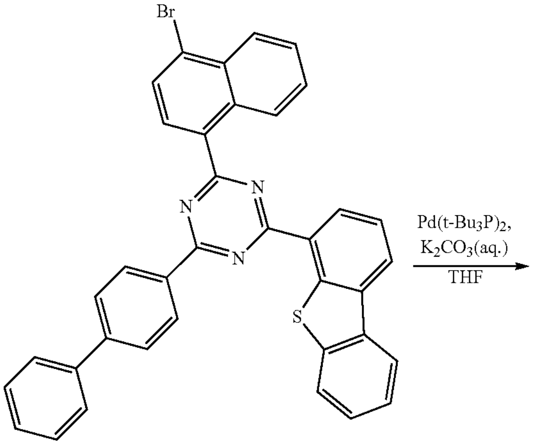

Trz15

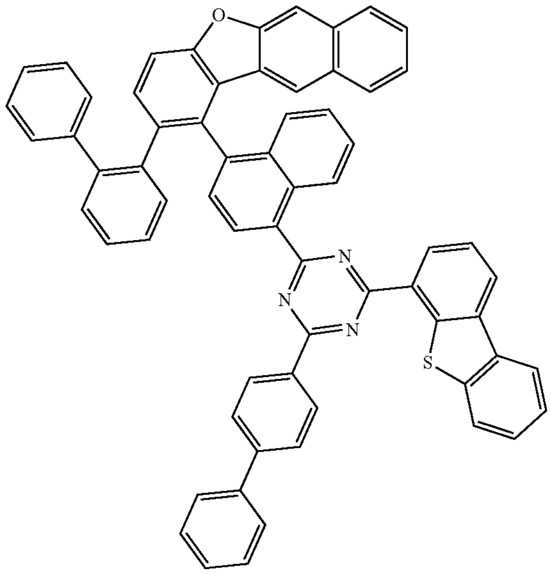

25

Chemical Formula C (15 g, 45.2 mmol) and sub12 (9 g, 45.2 mmol) were added to 300 ml of THF under a nitrogen atmosphere, and the mixture was stirred and refluxed. Then, potassium carbonate (18.8 g, 135.7 mmol) was dissolved in 56 ml of water, added thereto, sufficiently stirred, and then bis(tri-tert-butylphosphine)palladium(0) (0.2 g, 0.5 mmol) was added. After the reaction for 12 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 12.1 g of subC-5. (Yield: 66%, MS: [M+H]+=405)

subC-5 (15 g, 37 mmol) and bis(pinacolato)diboron (10.3 g, 40.8 mmol) were added to 300 ml of 1,4-dioxane under a nitrogen atmosphere, and the mixture was stirred and refluxed. Then, potassium acetate (5.5 g, 55.6 mmol) was added thereto, sufficiently stirred, and then bis(dibenzylideneacetone)palladium(0) (0.6 g, 1.1 mmol) and tricyclohexylphosphine (0.6 g, 2.2 mmol) were added. After the reaction for 9 hours, the reaction mixture was cooled to room temperature, the organic layer was separated using chloroform and water, and then the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 11.6 g of subC-5'. (Yield: 63%, MS: [M+H]+=497)

subC-5' (15 g, 30.2 mmol) and Trz15 (18.8 g, 30.2 mmol) were added to 300 ml of THF under a nitrogen atmosphere, and the mixture was stirred and refluxed. Then, potassium carbonate (12.5 g, 90.7 mmol) was dissolved in 38 ml of water, added thereto, sufficiently stirred, and then bis(tri-tert-butylphosphine)palladium(0) (0.2 g, 0.3 mmol) was added. After the reaction for 12 hours, the reaction mixture was cooled to room temperature, the organic layer and the aqueous layer were separated, and the organic layer was distilled. This was dissolved again in chloroform, washed twice with water, and the organic layer was then separated. Anhydrous magnesium sulfate was added thereto, stirred and then filtered. The filtrate was distilled under reduced pressure. The concentrated compound was purified by silica gel column chromatography to give 20.9 g of Compound 25. (Yield: 76%, MS: [M+H]+=910)

Example 1

A glass substrate on which ITO (indium tin oxide) was coated as a thin film to a thickness of 1,000 Å was put into distilled water in which a detergent was dissolved, and ultrasonically cleaned. At this time, a product manufactured by Fischer Co. was used as the detergent, and as the distilled water, distilled water filtered twice using a filter manufactured by Millipore Co. was used. After the ITO was cleaned for 30 minutes, ultrasonic cleaning was repeated twice using distilled water for 10 minutes. After the cleaning with distilled water was completed, the substrate was ultrasonically cleaned with solvents of isopropyl alcohol, acetone and methanol, dried, and then transferred to a plasma cleaner. In addition, the substrate was cleaned for 5 minutes using oxygen plasma and then transferred to a vacuum depositor.

On the transparent ITO electrode thus prepared, a hole injection layer was formed with the following compound HI-1 in a thickness of 1150 Å, where the following compound A-1 was p-doped at a concentration of 1.5 wt. %. The following compound HT-1 was vacuum deposited on the hole injection layer to form a hole transport layer with a film thickness of 800 Å. Then, the following compound EB-1 was vacuum deposited in a film thickness of 150 Å on the hole transport layer to form an electron blocking layer. Then, the following Compound 1 and the following compound Dp-7 were vacuum deposited in a weight ratio of 98:2 on the EB-1 deposited layer to form a red light emitting layer with a film thickness of 400 Å. The following compound HB-1 was vacuum deposited in a film thickness of 30 Å on the light emitting layer to form a hole blocking layer. Then, the following compound ET-1 and the following compound LiQ were vacuum deposited in a ratio of 2:1 on the hole blocking layer to form an electron injection and transport layer with a film thickness of 300 Å. Lithium fluoride (LiF) and aluminum were sequentially deposited to have a thickness of 12 Å and 1,000 Å, respectively, on the electron injection and transport layer, thereby forming a cathode.

In the above-mentioned processes, the deposition rates of the organic materials were maintained at 0.4 to 0.7 Å/sec, the deposition rates of lithium fluoride and the aluminum of the cathode were maintained at 0.3 Å/sec and 2 Å/sec, respectively, and the degree of vacuum during the deposition was maintained at $2\times10^{-7}$ to $5\times10^{-6}$ torr, thereby manufacturing an organic light emitting device.

HI-1

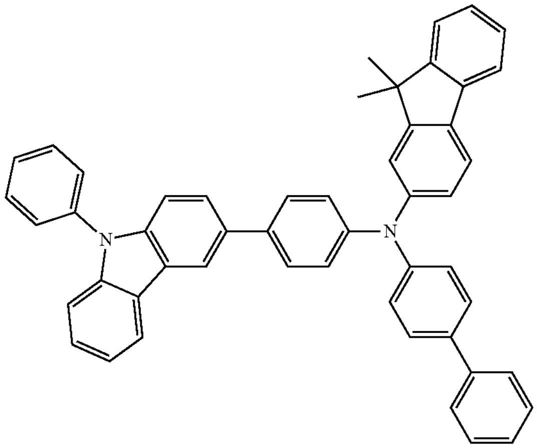

A-1

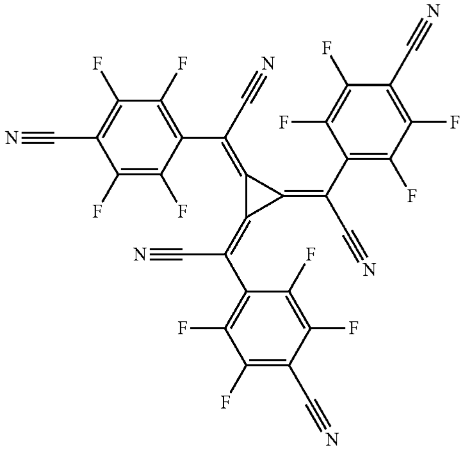

HT-1

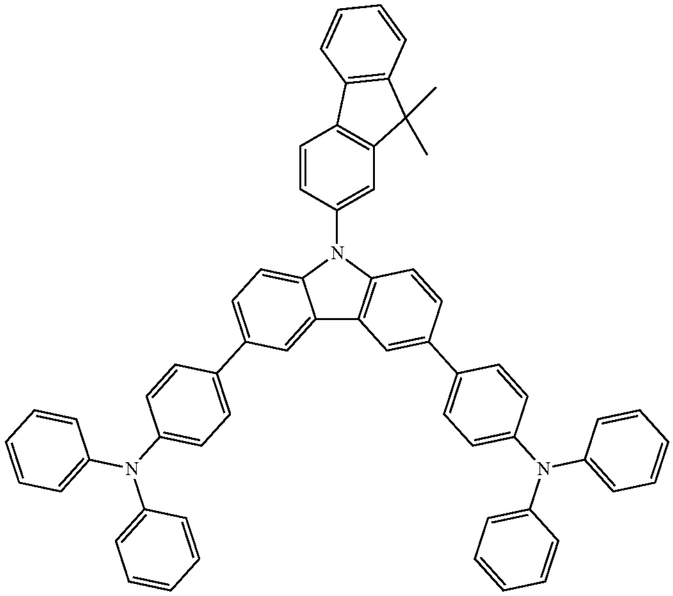

-continued
EB-1
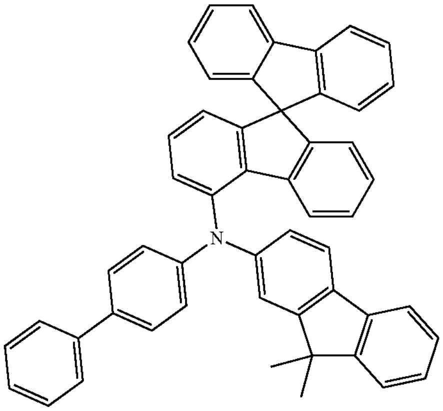
1
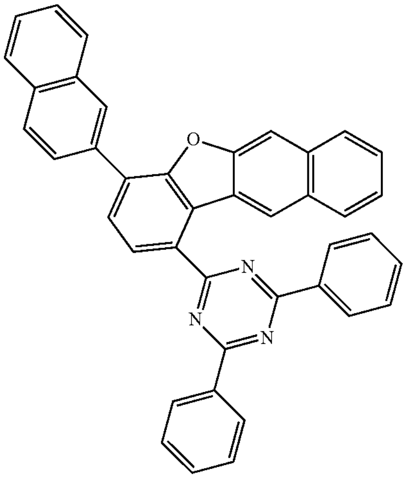
Dp-7
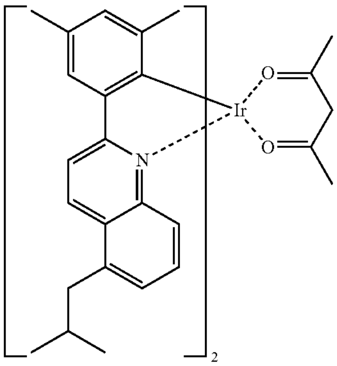
HB-1
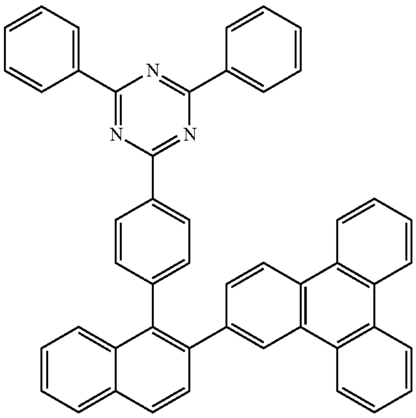
ET-1
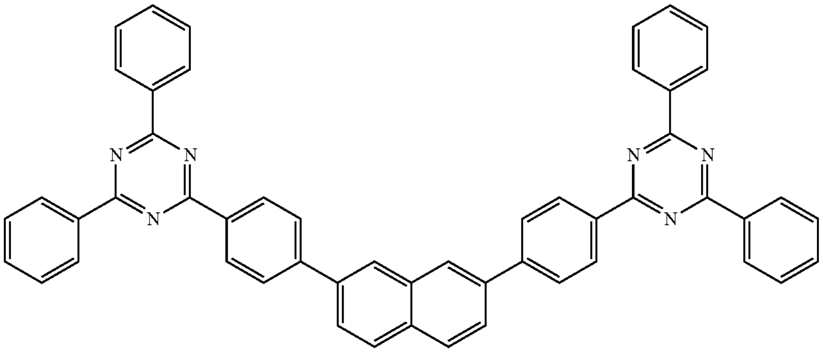

-continued
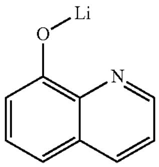
LiQ
Z-1
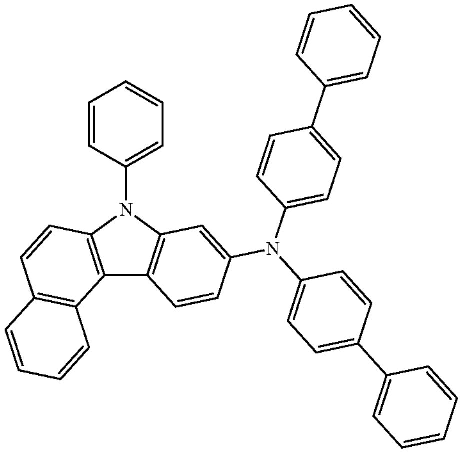
Z-2
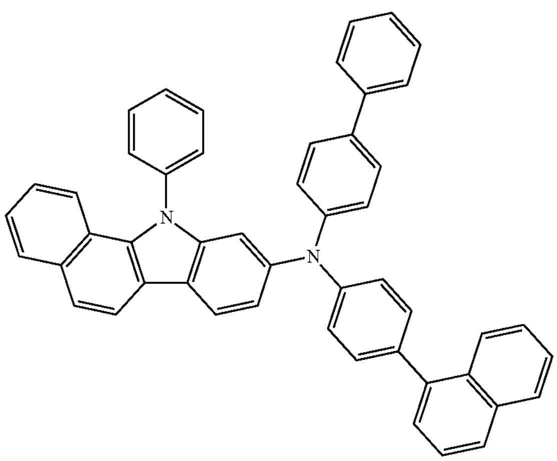
C-1
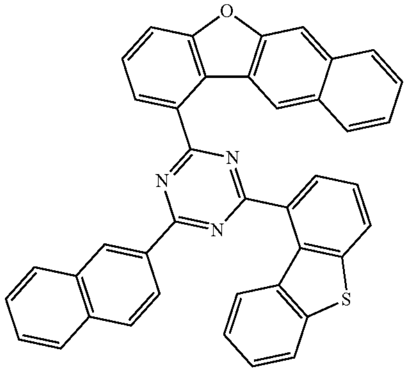
C-2
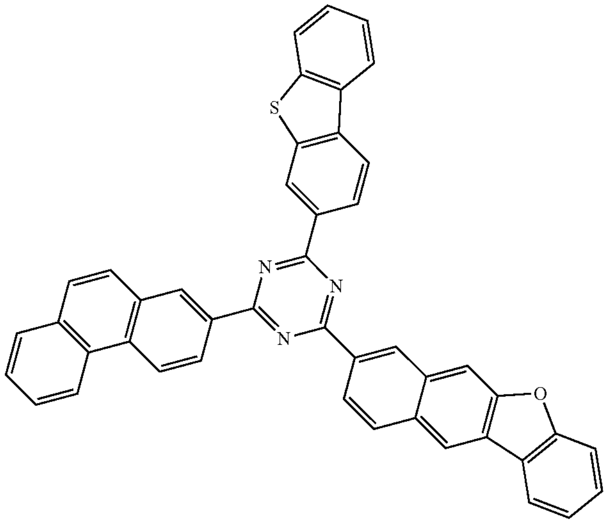

-continued
C-3
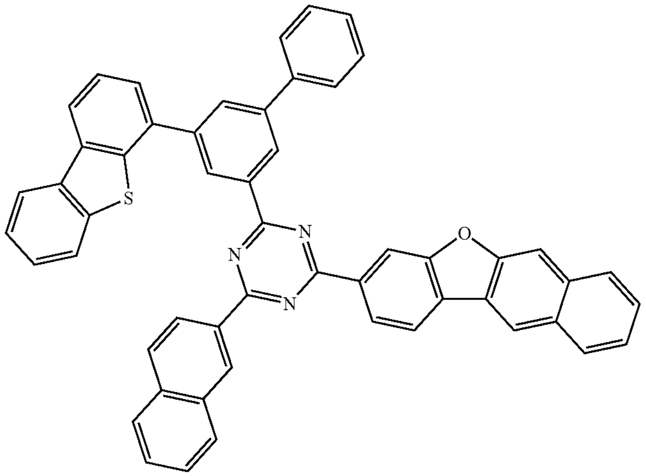
C-4
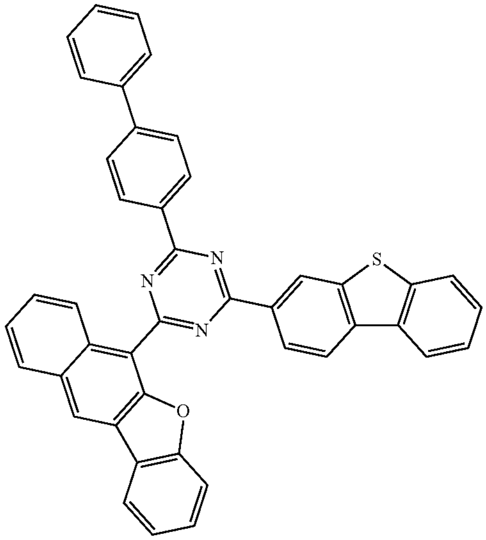
C-5
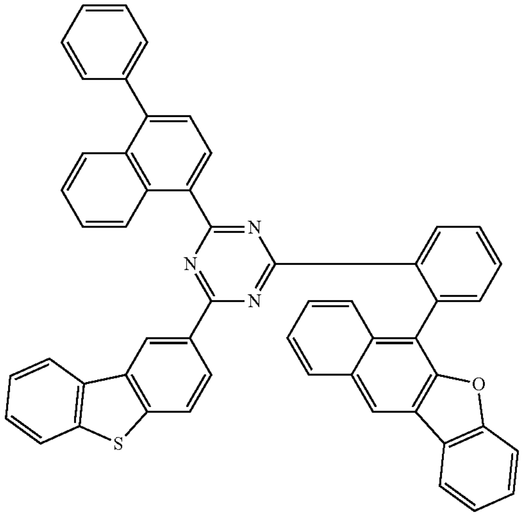
C-6
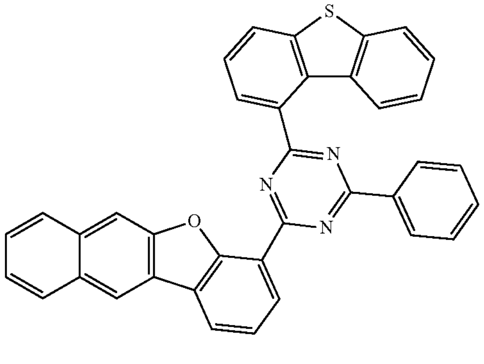

-continued
C-7
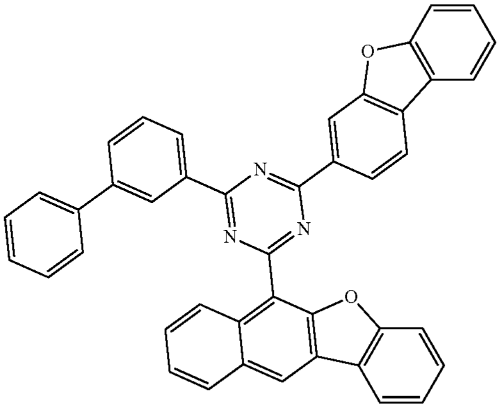
C-8
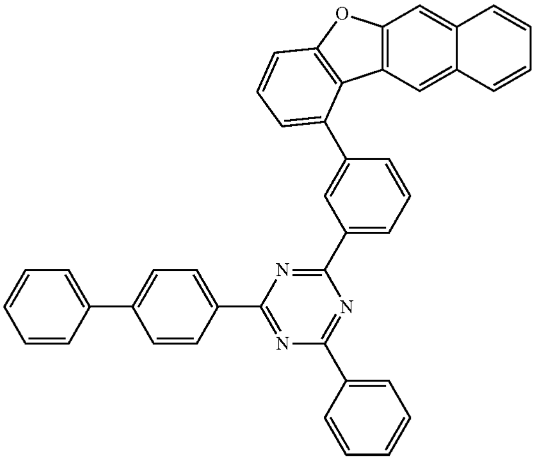
C-9
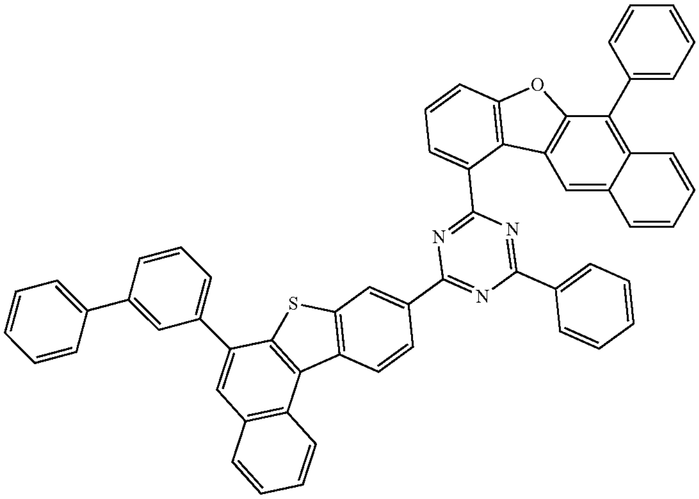
C-10
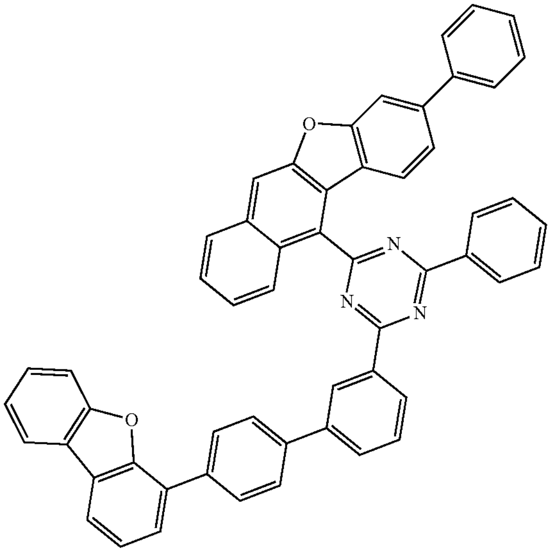

-continued

C-11

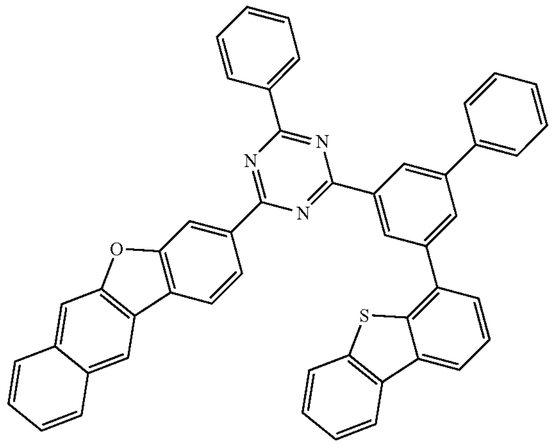

C-12

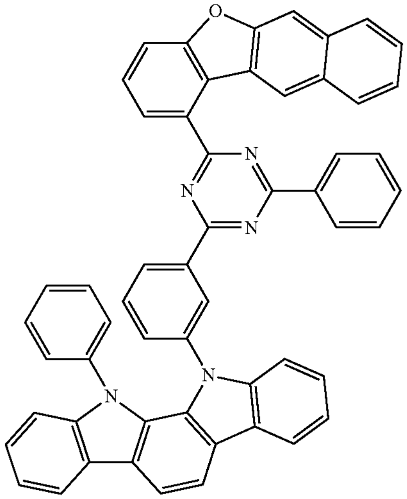

Examples 2 to 25

The organic light emitting devices of Examples 2 to 25 were manufactured in the same manner as in Example 1, except that the compounds shown in Table 1 below were used instead of Compound 1 in the organic light emitting device of Example 1.

Comparative Examples 1 to 12

The organic light emitting devices of Comparative Examples 1 to 12 were manufactured in the same manner as in Example 1, except that the compounds listed in Table 1 below were used instead of Compound 1 in the organic light emitting device of Example 1.

Examples 26 to 75

The organic light emitting devices of Examples 26 to 75 were manufactured in the same manner as in Example 1, except that the first host and the second host listed in Table 2 below were vacuum co-deposited at a ratio of 1:1 instead of Compound 1 in the organic light emitting device of Example 1.

Comparative Examples 13 to 36

The organic light emitting devices of Comparative Examples 13 to 36 were manufactured in the same manner as in Example 1, except that the first host and the second host listed in Table 2 below were vacuum co-deposited at a ratio of 1:1 instead of Compound 1 in the organic light emitting device of Example 1.

When a current was applied to the organic light emitting devices manufactured in Examples 1 to 75 and Comparative Examples 1 to 36, voltage and efficiency were measured (based on 15 mA/cm$^2$) and the results are shown in Tables 1 and 2 below. The lifetime T95 means the time required for the luminance to be reduced to 95% of the initial luminance (7000 nit).

TABLE 1

| Category | Material | Efficiency (cd/A) | Lifetime T95(hr) | Light emitting color |
|---|---|---|---|---|
| Example 1 | Compound 1 | 23.4 | 184 | Red |
| Example 2 | Compound 2 | 20.9 | 133 | Red |
| Example 3 | Compound 3 | 20.8 | 155 | Red |
| Example 4 | Compound 4 | 23.1 | 147 | Red |
| Example 5 | Compound 5 | 23.5 | 160 | Red |
| Example 6 | Compound 6 | 21.3 | 152 | Red |
| Example 7 | Compound 7 | 22.9 | 143 | Red |
| Example 8 | Compound 8 | 23.7 | 152 | Red |
| Example 9 | Compound 9 | 21.3 | 158 | Red |
| Example 10 | Compound 10 | 23.7 | 163 | Red |
| Example 11 | Compound 11 | 21.8 | 151 | Red |
| Example 12 | Compound 12 | 20.3 | 140 | Red |
| Example 13 | Compound 13 | 23.4 | 159 | Red |
| Example 14 | Compound 14 | 22.4 | 163 | Red |
| Example 15 | Compound 15 | 22.0 | 143 | Red |
| Example 16 | Compound 16 | 23.7 | 184 | Red |
| Example 17 | Compound 17 | 23.1 | 189 | Red |
| Example 18 | Compound 18 | 23.3 | 192 | Red |
| Example 19 | Compound 19 | 20.1 | 151 | Red |
| Example 20 | Compound 20 | 22.3 | 164 | Red |
| Example 21 | Compound 21 | 21.9 | 142 | Red |
| Example 22 | Compound 22 | 20.4 | 167 | Red |
| Example 23 | Compound 23 | 22.3 | 158 | Red |
| Example 24 | Compound 24 | 23.5 | 193 | Red |
| Example 25 | Compound 25 | 20.4 | 167 | Red |
| Comparative Example 1 | C-1 | 17.9 | 154 | Red |
| Comparative Example 2 | C-2 | 17.4 | 133 | Red |
| Comparative Example 3 | C-3 | 17.1 | 110 | Red |
| Comparative Example 4 | C-4 | 18.1 | 138 | Red |
| Comparative Example 5 | C-5 | 17.2 | 76 | Red |
| Comparative Example 6 | C-6 | 17.9 | 134 | Red |
| Comparative Example 7 | C-7 | 17.5 | 112 | Red |
| Comparative Example 8 | C-8 | 17.0 | 98 | Red |
| Comparative Example 9 | C-9 | 15.1 | 101 | Red |
| Comparative Example 10 | C-10 | 17.8 | 129 | Red |
| Comparative Example 11 | C-11 | 16.3 | 129 | Red |
| Comparative Example 12 | C-12 | 20.4 | 129 | Red |

TABLE 2

| Category | First host | Second host | Driving voltage (V) | Efficiency (cd/A) | Lifetime T95(hr) | Light emitting color |
|---|---|---|---|---|---|---|
| Example 26 | Compound 1 | Z-1 | 3.45 | 26.4 | 362 | Red |
| Example 27 | Compound 2 | Z-1 | 3.53 | 23.2 | 301 | Red |
| Example 28 | Compound 3 | Z-1 | 3.54 | 22.1 | 312 | Red |
| Example 29 | Compound 4 | Z-1 | 3.57 | 23.0 | 294 | Red |
| Example 30 | Compound 5 | Z-1 | 3.60 | 25.5 | 320 | Red |
| Example 31 | Compound 6 | Z-1 | 3.58 | 20.4 | 301 | Red |
| Example 32 | Compound 7 | Z-1 | 3.61 | 21.7 | 299 | Red |
| Example 33 | Compound 8 | Z-1 | 3.43 | 26.7 | 347 | Red |
| Example 34 | Compound 9 | Z-1 | 3.61 | 23.0 | 313 | Red |
| Example 35 | Compound 10 | Z-1 | 3.54 | 24.2 | 327 | Red |
| Example 36 | Compound 11 | Z-1 | 3.52 | 23.1 | 304 | Red |
| Example 37 | Compound 12 | Z-1 | 3.60 | 25.8 | 297 | Red |
| Example 38 | Compound 13 | Z-1 | 3.57 | 22.5 | 317 | Red |
| Example 39 | Compound 14 | Z-1 | 3.54 | 22.0 | 324 | Red |
| Example 40 | Compound 15 | Z-1 | 3.61 | 24.3 | 296 | Red |
| Example 41 | Compound 16 | Z-1 | 3.41 | 26.8 | 352 | Red |
| Example 42 | Compound 17 | Z-1 | 3.44 | 27.1 | 327 | Red |
| Example 43 | Compound 18 | Z-1 | 3.40 | 26.3 | 359 | Red |
| Example 44 | Compound 19 | Z-1 | 3.53 | 23.1 | 303 | Red |
| Example 45 | Compound 20 | Z-1 | 3.62 | 25.3 | 320 | Red |
| Example 46 | Compound 21 | Z-1 | 3.57 | 23.9 | 285 | Red |
| Example 47 | Compound 22 | Z-1 | 3.60 | 22.4 | 294 | Red |
| Example 48 | Compound 23 | Z-1 | 3.52 | 24.3 | 311 | Red |
| Example 49 | Compound 24 | Z-1 | 3.42 | 26.5 | 353 | Red |
| Example 50 | Compound 25 | Z-1 | 3.61 | 23.8 | 282 | Red |
| Example 51 | Compound 1 | Z-2 | 3.37 | 27.0 | 341 | Red |
| Example 52 | Compound 2 | Z-2 | 3.50 | 24.1 | 324 | Red |
| Example 53 | Compound 3 | Z-2 | 3.58 | 22.5 | 308 | Red |
| Example 54 | Compound 4 | Z-2 | 3.51 | 23.8 | 312 | Red |
| Example 55 | Compound 5 | Z-2 | 3.63 | 26.1 | 302 | Red |
| Example 56 | Compound 6 | Z-2 | 3.54 | 21.0 | 329 | Red |
| Example 57 | Compound 7 | Z-2 | 3.60 | 21.3 | 320 | Red |
| Example 58 | Compound 8 | Z-2 | 3.45 | 27.3 | 334 | Red |
| Example 59 | Compound 9 | Z-2 | 3.54 | 22.4 | 294 | Red |
| Example 60 | Compound 10 | Z-2 | 3.58 | 23.7 | 318 | Red |
| Example 61 | Compound 11 | Z-2 | 3.48 | 22.8 | 321 | Red |
| Example 62 | Compound 12 | Z-2 | 3.55 | 25.9 | 304 | Red |
| Example 63 | Compound 13 | Z-2 | 3.61 | 22.1 | 301 | Red |
| Example 64 | Compound 14 | Z-2 | 3.55 | 22.6 | 311 | Red |
| Example 65 | Compound 15 | Z-2 | 3.60 | 24.5 | 303 | Red |
| Example 66 | Compound 16 | Z-2 | 3.46 | 27.2 | 322 | Red |
| Example 67 | Compound 17 | Z-2 | 3.39 | 27.3 | 331 | Red |
| Example 68 | Compound 18 | Z-2 | 3.45 | 26.7 | 364 | Red |
| Example 69 | Compound 19 | Z-2 | 3.60 | 24.2 | 297 | Red |
| Example 70 | Compound 20 | Z-2 | 3.58 | 25.8 | 312 | Red |
| Example 71 | Compound 21 | Z-2 | 3.59 | 24.2 | 304 | Red |
| Example 72 | Compound 22 | Z-2 | 3.54 | 21.8 | 290 | Red |
| Example 73 | Compound 23 | Z-2 | 3.55 | 26.1 | 301 | Red |
| Example 74 | Compound 24 | Z-2 | 3.40 | 26.9 | 335 | Red |
| Example 75 | Compound 25 | Z-2 | 3.57 | 24.7 | 300 | Red |
| Comparative Example 13 | C-l | Z-1 | 3.76 | 23.5 | 250 | Red |
| Comparative Example 14 | C-2 | Z-1 | 3.93 | 22.0 | 217 | Red |
| Comparative Example 15 | C-3 | Z-1 | 3.94 | 21.2 | 226 | Red |
| Comparative Example 16 | C-4 | Z-1 | 3.91 | 21.8 | 238 | Red |
| Comparative Example 17 | C-5 | Z-1 | 4.08 | 19.4 | 204 | Red |
| Comparative Example 18 | C-6 | Z-1 | 3.95 | 20.4 | 213 | Red |
| Comparative Example 19 | C-7 | Z-1 | 3.91 | 19.3 | 222 | Red |
| Comparative Example 20 | C-8 | Z-1 | 3.73 | 22.4 | 248 | Red |
| Comparative Example 21 | C-9 | Z-1 | 3.85 | 19.3 | 223 | Red |
| Comparative Example 22 | C-10 | Z-1 | 3.91 | 21.8 | 254 | Red |
| Comparative Example 23 | C-11 | Z-1 | 3.88 | 19.7 | 239 | Red |
| Comparative Example 24 | C-12 | Z-1 | 3.73 | 22.4 | 271 | Red |
| Comparative Example 25 | C-1 | Z-2 | 3.73 | 23.8 | 247 | Red |

TABLE 2-continued

| Category | First host | Second host | Driving voltage (V) | Efficiency (cd/A) | Lifetime T95(hr) | Light emitting color |
|---|---|---|---|---|---|---|
| Comparative Example 26 | C-2 | Z-2 | 3.95 | 22.5 | 224 | Red |
| Comparative Example 27 | C-3 | Z-2 | 3.90 | 21.7 | 243 | Red |
| Comparative Example 28 | C-4 | Z-2 | 3.94 | 21.2 | 237 | Red |
| Comparative Example 29 | C-5 | Z-2 | 4.02 | 19.9 | 214 | Red |
| Comparative Example 30 | C-6 | Z-2 | 3.97 | 20.7 | 209 | Red |
| Comparative Example 31 | C-7 | Z-2 | 3.94 | 19.8 | 248 | Red |
| Comparative Example 32 | C-8 | Z-2 | 3.70 | 22.6 | 240 | Red |
| Comparative Example 33 | C-9 | Z-2 | 3.86 | 19.7 | 253 | Red |
| Comparative Example 34 | C-10 | Z-2 | 3.93 | 21.4 | 250 | Red |
| Comparative Example 35 | C-11 | Z-2 | 3.84 | 20.3 | 242 | Red |
| Comparative Example 36 | C-12 | Z-2 | 3.76 | 22.8 | 263 | Red |

When a current was applied to the organic light emitting devices manufactured in Examples 1 to 75 and Comparative Examples 1 to 36, the results shown in Tables 1 and 2 were obtained.

Example 1 has a structure using Compound [EB-1] as an electron blocking layer and Compound 1/Dp-7 as a red light emitting layer. In Comparative Examples 1 to 36, the organic light emitting devices were manufactured by using Compounds C-1 to C-12 instead of Compound 1.

Looking at the results in Table 1, when the compound of the present disclosure was used as a host for the red light emitting layer, the efficiency was significantly increased as compared with the materials of Comparative Examples, confirming that energy transfer from the host to the red dopant was well performed. In addition, it was confirmed that the lifetime characteristics could be significantly improved by almost two times while maintaining high efficiency. Finally, it can be judged that the compound of the present disclosure has higher stability to electrons and holes than the compounds of Comparative Examples.

The results in Table 2 show the results of co-deposition of two types of hosts, and when the first host and the second host were used in a ratio of 1:1, it exhibited more excellent results than the result using only the first host. It can be confirmed that by using the second host, the amount of holes increased, electrons and holes in the red light emitting layer maintained a more stable balance, and efficiency and lifetime increased significantly. In conclusion, it can be confirmed that when the compound of the present disclosure was used as a host for the red light emitting layer, the driving voltage, luminous efficiency, and lifetime characteristics of the organic light emitting devices could be improved.

DESCRIPTION OF REFERENCE NUMERALS

1: substrate
2: anode
3: hole transport layer
4: light emitting layer
5: electron injection and transport layer -continued 6: cathode
7: hole injection layer
8: electron blocking layer
9: hole blocking layer

What is claimed is:

1. A compound represented by the following Chemical Formula 1:

[Chemical Formula 1]

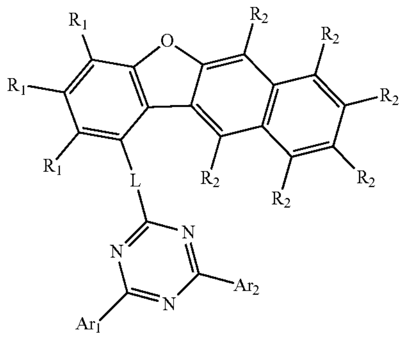

wherein, in Chemical Formula 1,

L is a single bond, phenylene, or naphthalenediyl, one of $R_1$ is $Ar_3$ and the other $R_1$s are hydrogen, $Ar_1$ and $Ar_2$ are each independently phenyl, biphenylyl, naphthyl, dibenzofuranyl, dibenzothiophenyl, or phenanthrenyl, each of which is independently unsubstituted or substituted with one or more phenyl or naphthyl, $Ar_3$ is phenyl, biphenylyl, terphenylyl, naphthyl, dibenzofuranyl, dibenzothiophenyl, or phenanthrenyl, and $R_2$ is hydrogen.

2. The compound of claim 1, wherein the compound of Chemical Formula 1 is represented by any one of the following Chemical Formulas 1-1 to 1-3:

[Chemical Formula 1-1]
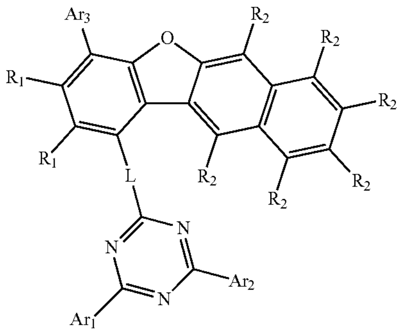
[Chemical Formula 1-2]
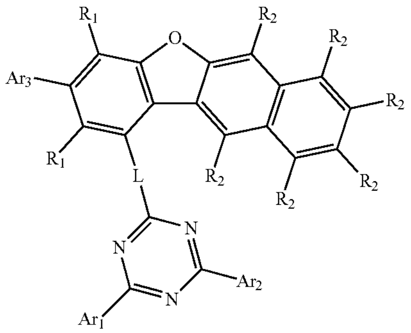
[Chemical Formula 1-3]
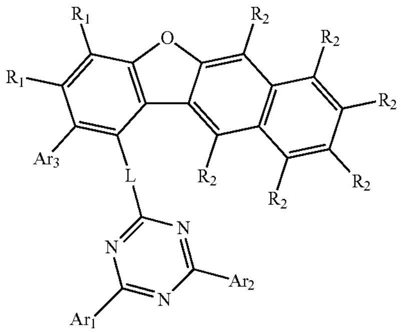
wherein in Chemical Formulas 1-1 to 1-3, $Ar_1$ to $Ar_3$, L, $R_1$ and $R_2$ are the same as defined in claim 1.
3. The compound of claim 1, wherein
the compound is any one selected from the group consisting of the following compounds:
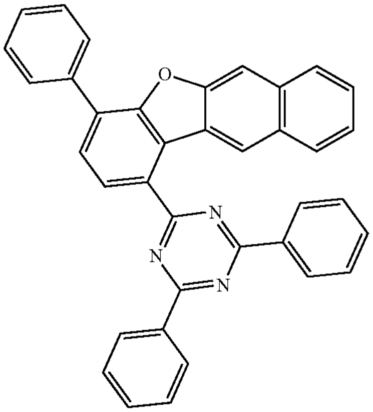
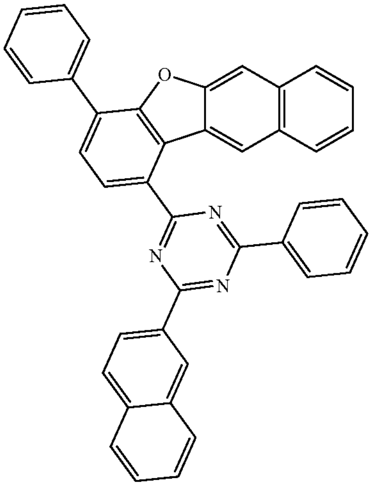
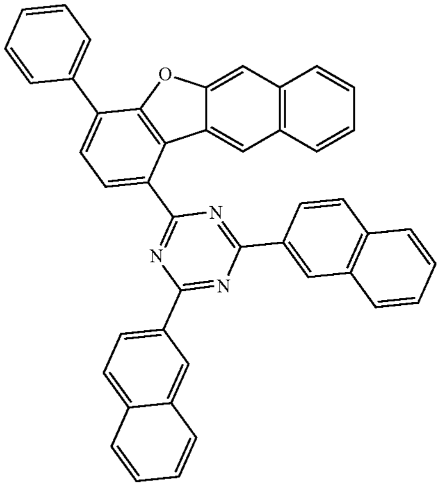

-continued
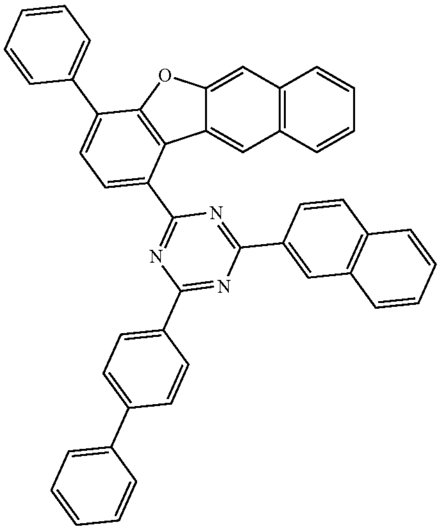
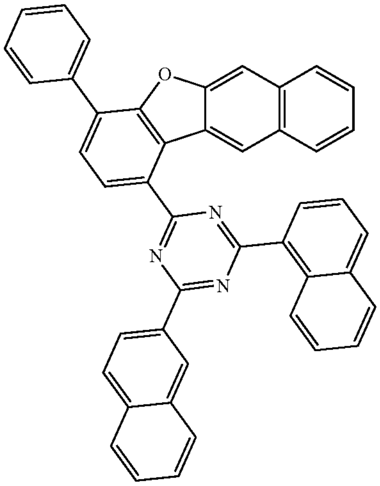
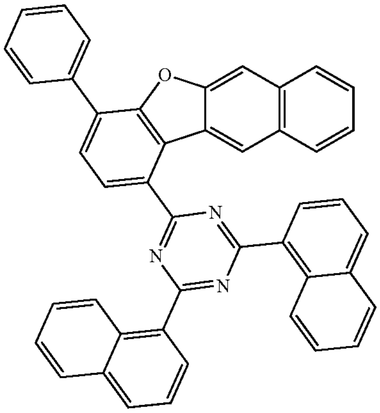
-continued
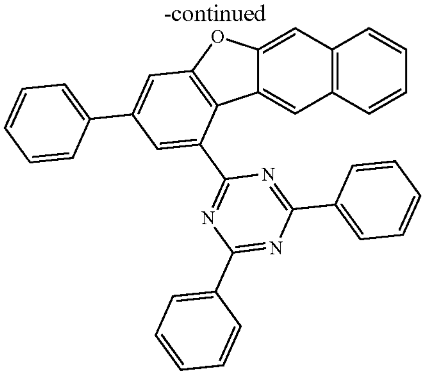
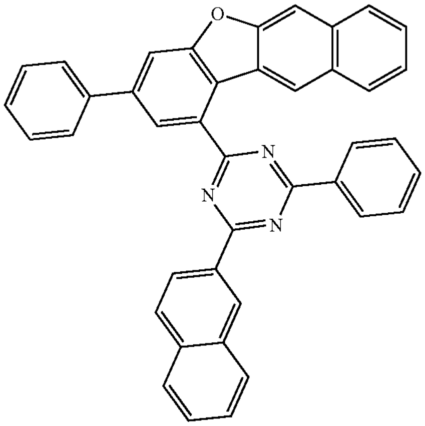
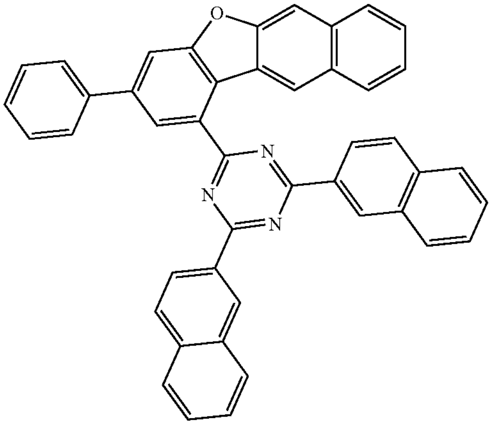
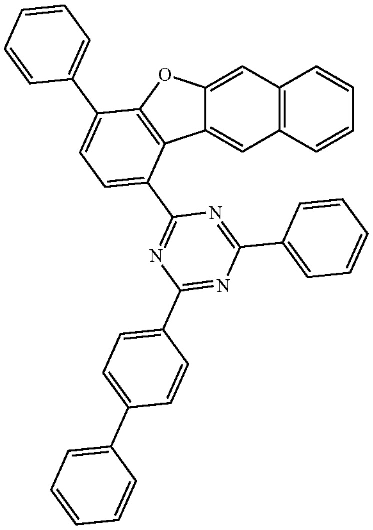

-continued
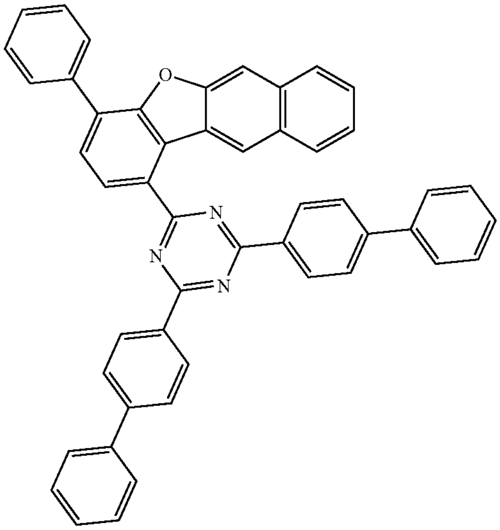
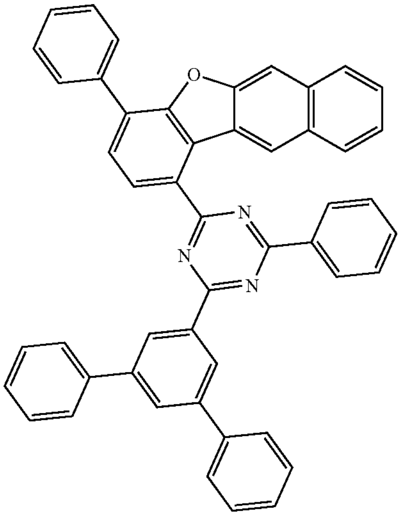
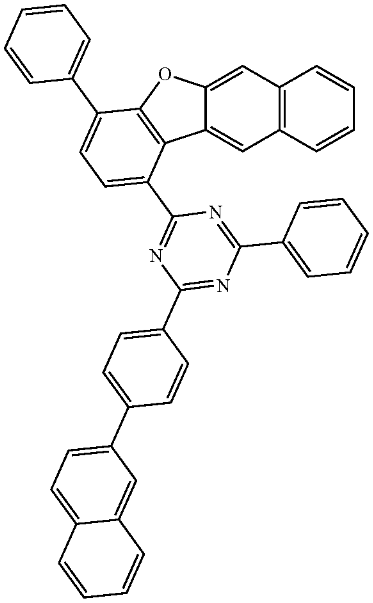
-continued
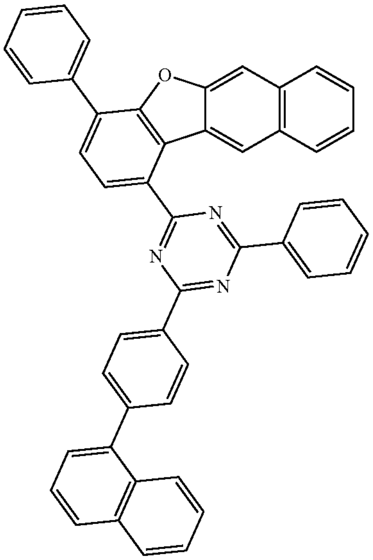
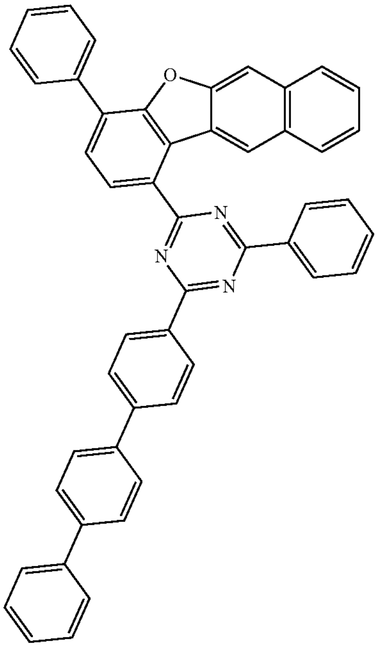
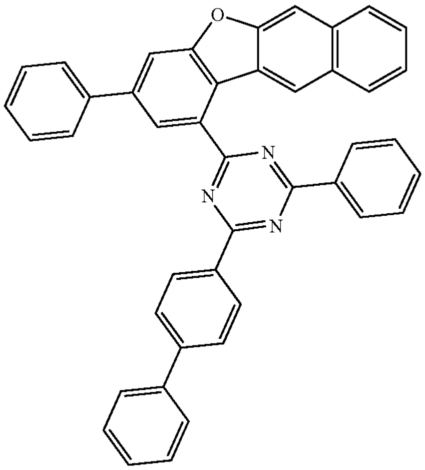

-continued
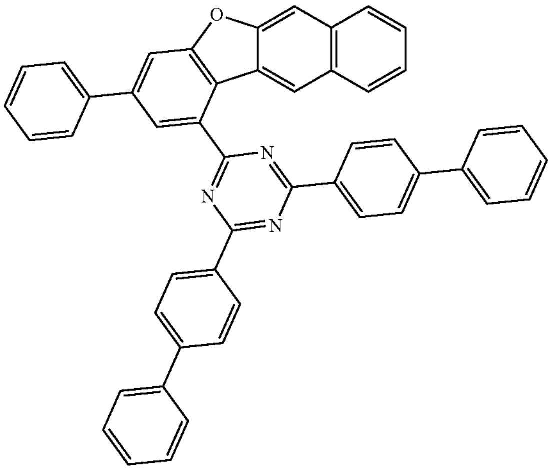
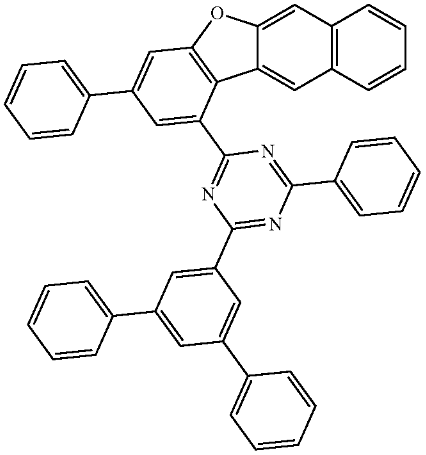
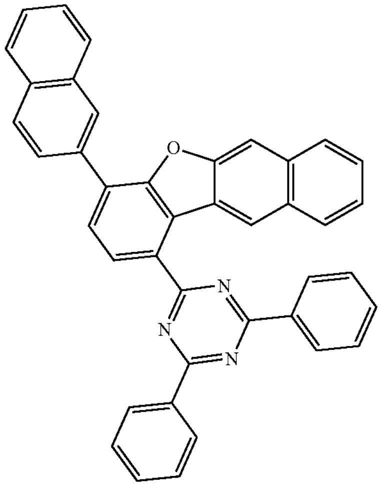
-continued
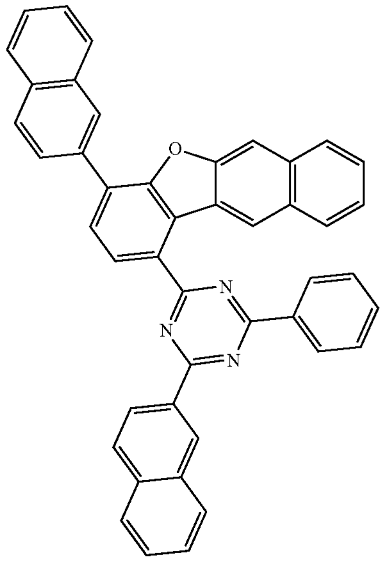
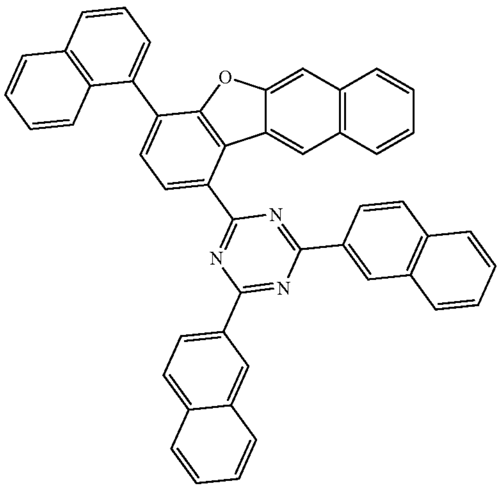
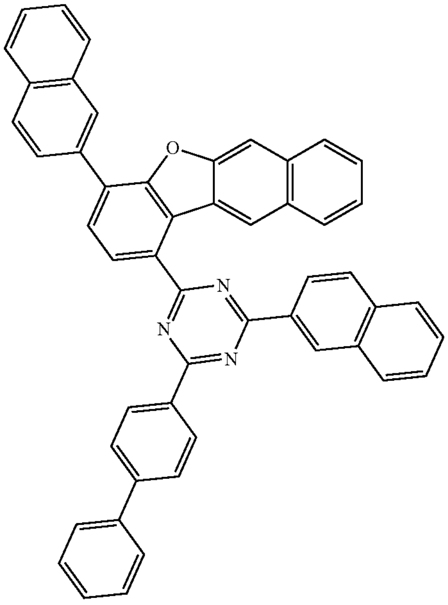

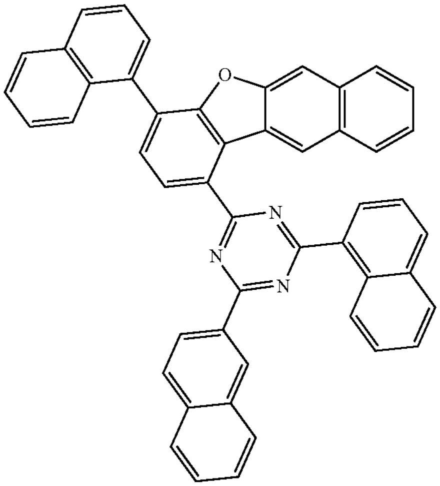
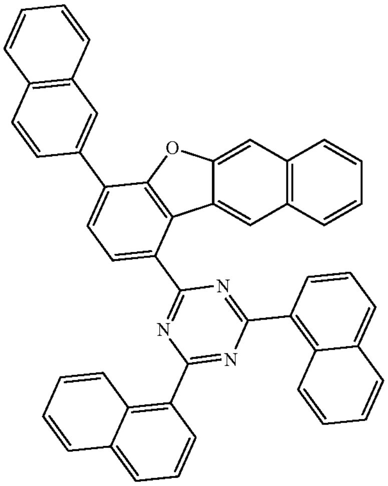
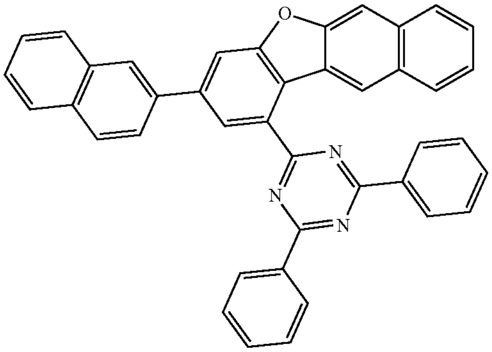
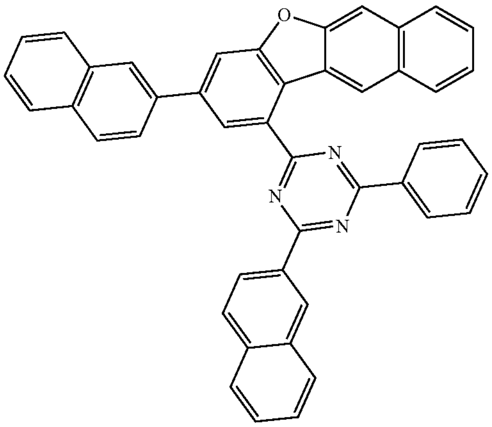
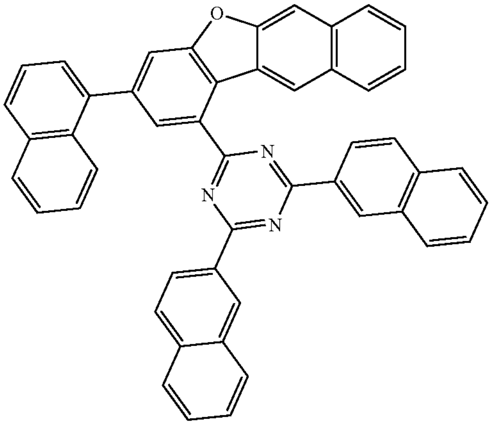
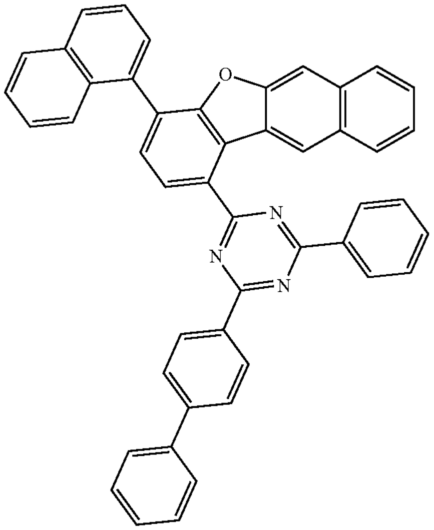

-continued
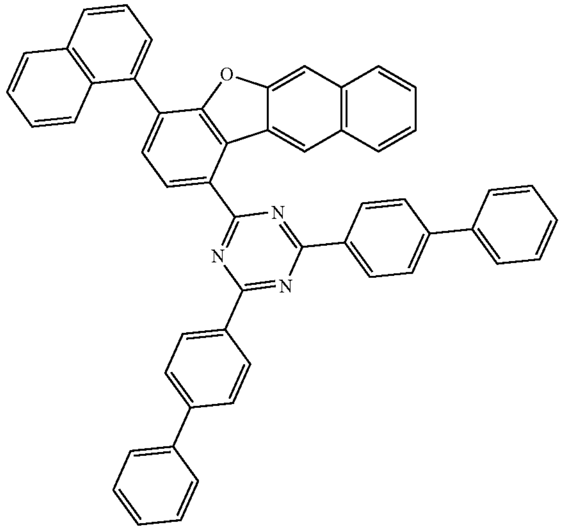
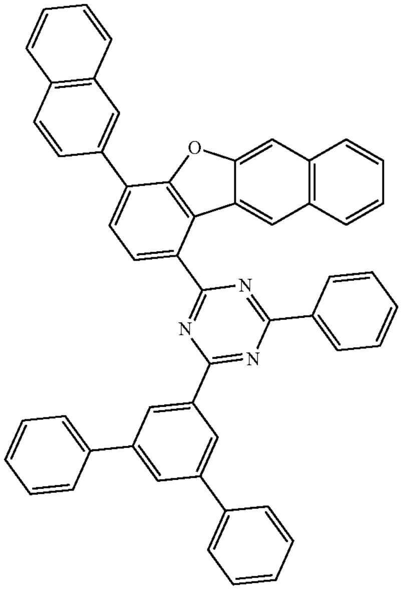
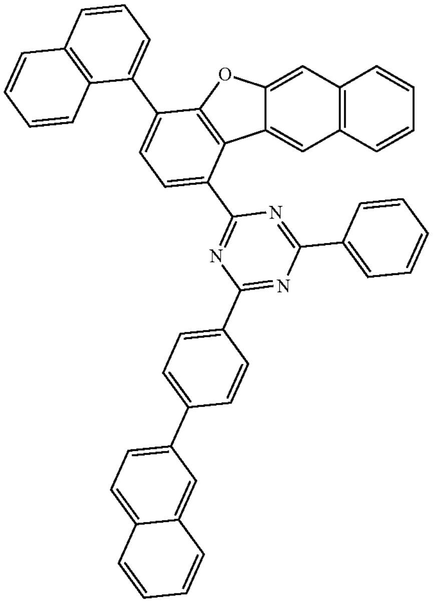
-continued
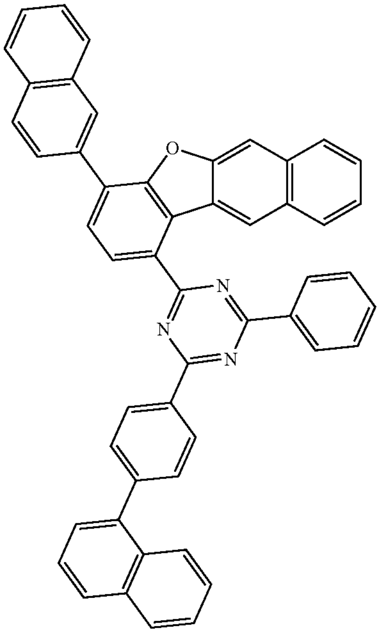
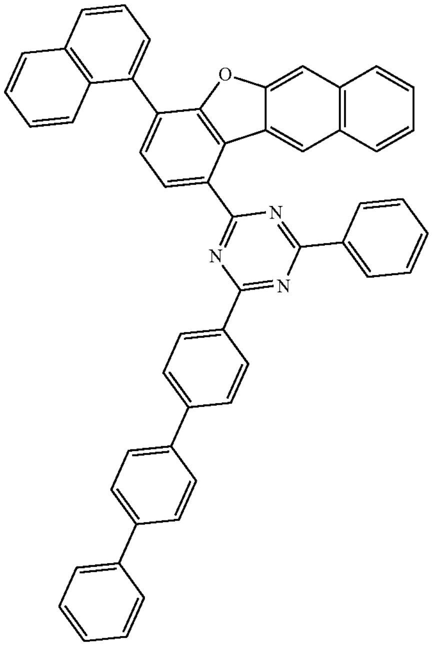

-continued
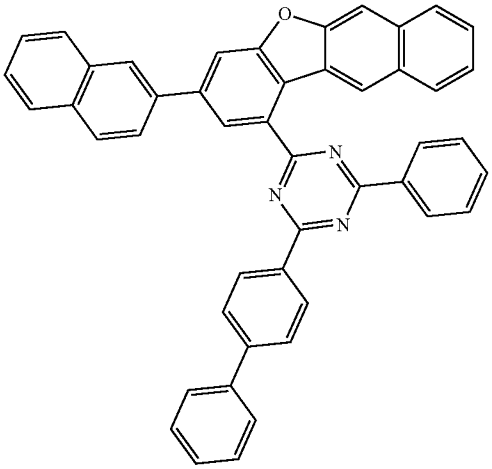
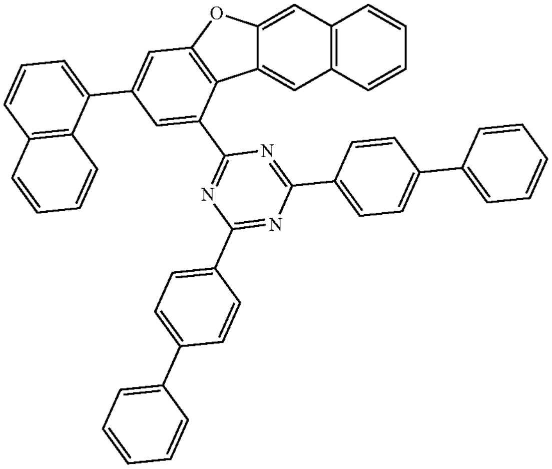
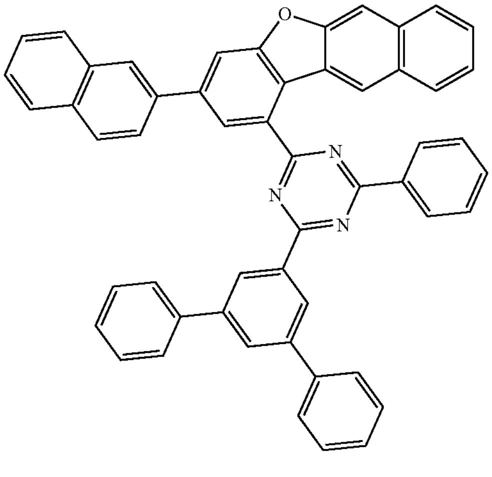
-continued
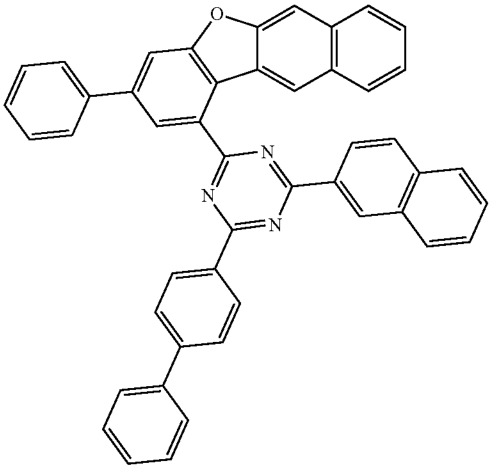
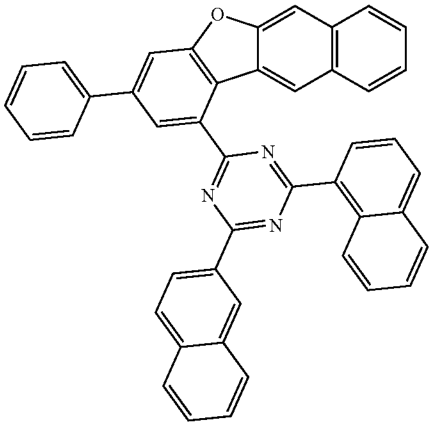
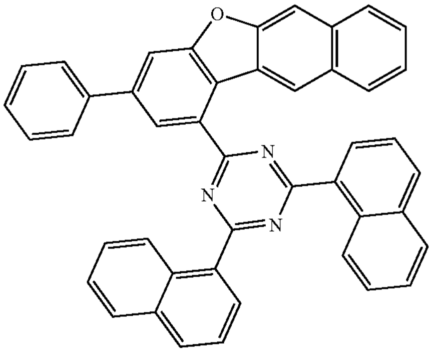
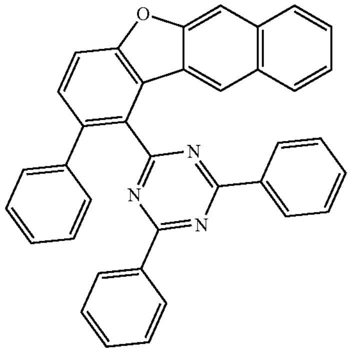

-continued
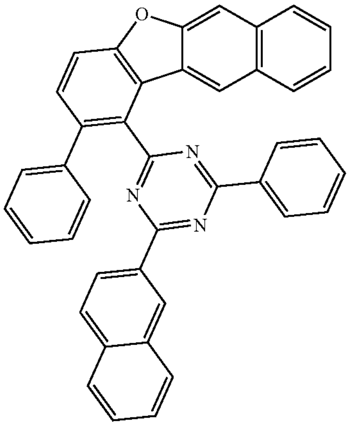
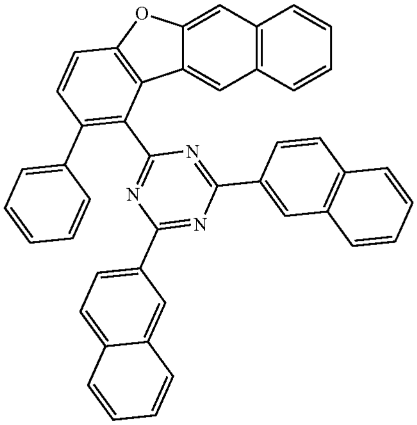
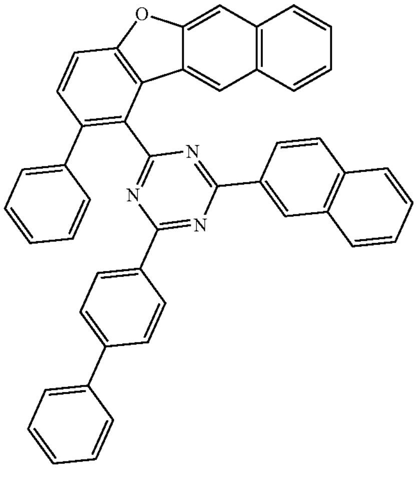
-continued
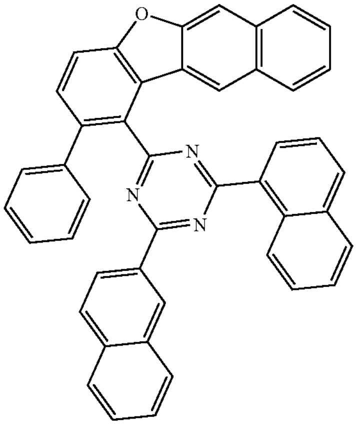
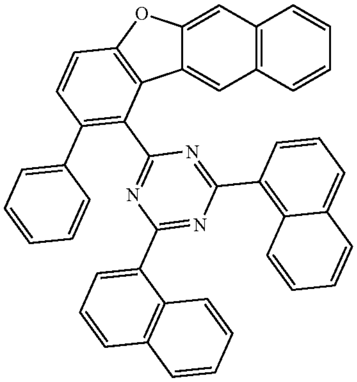
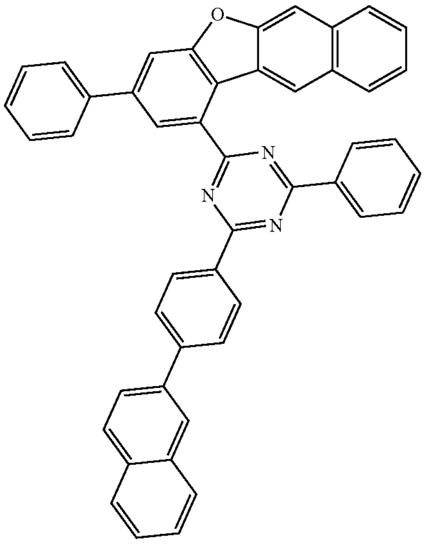

-continued
-continued
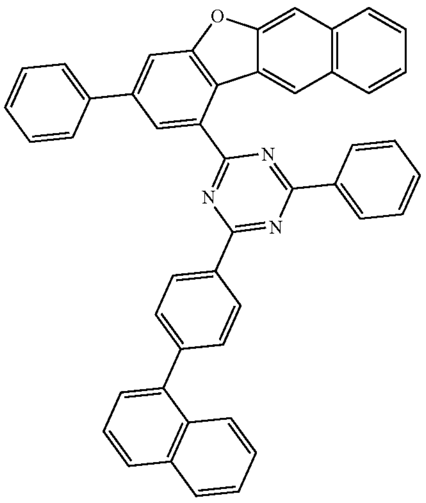
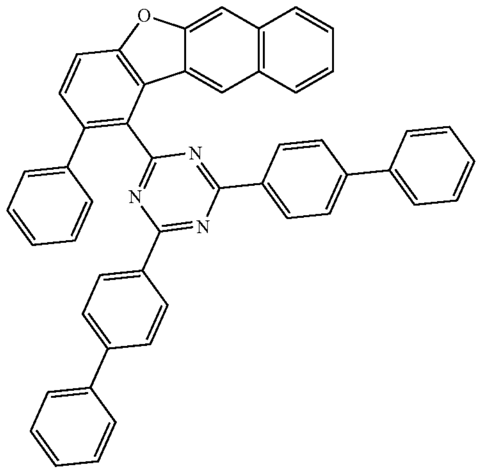
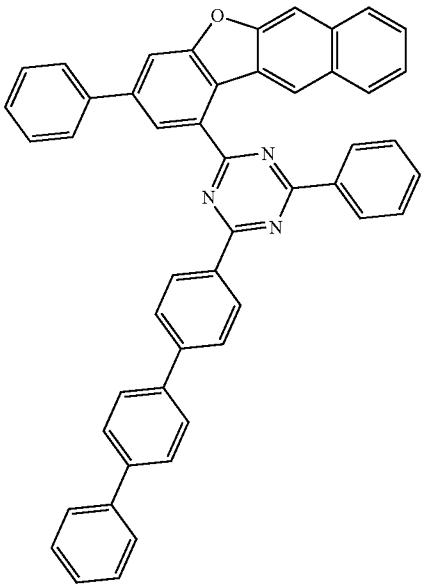
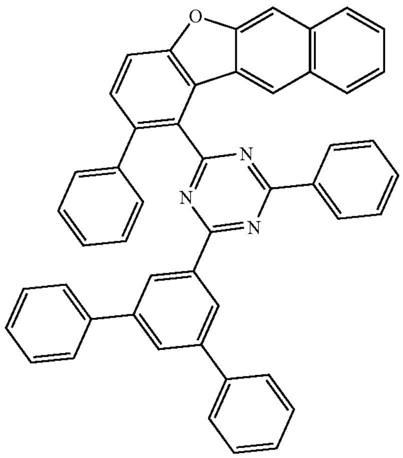
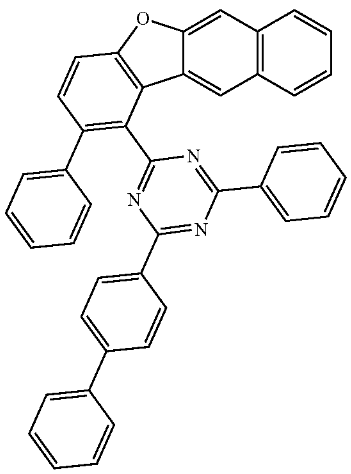
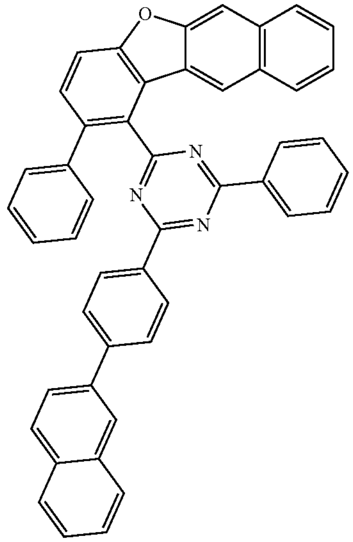

-continued
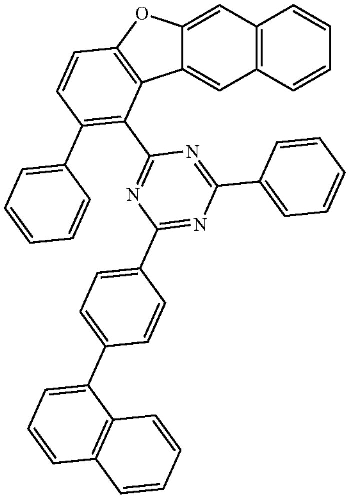
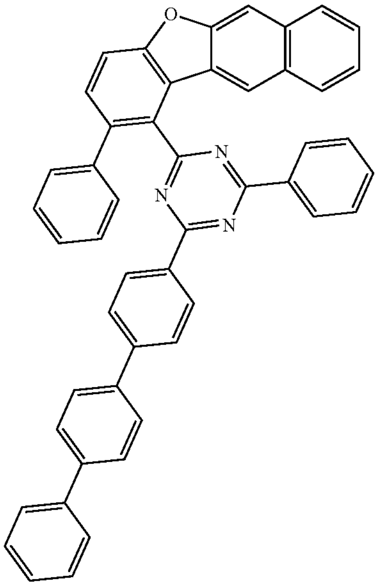
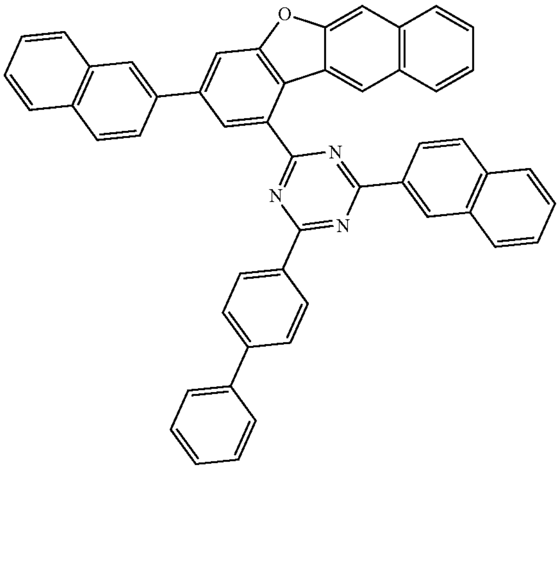
-continued
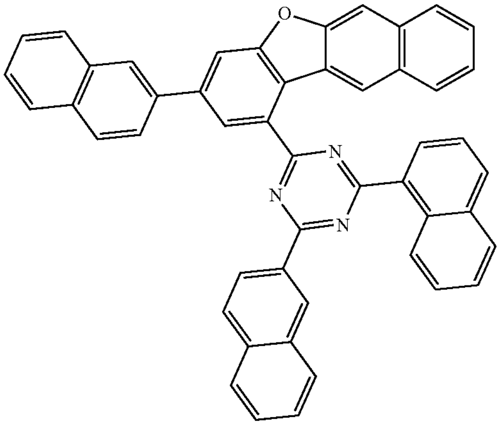
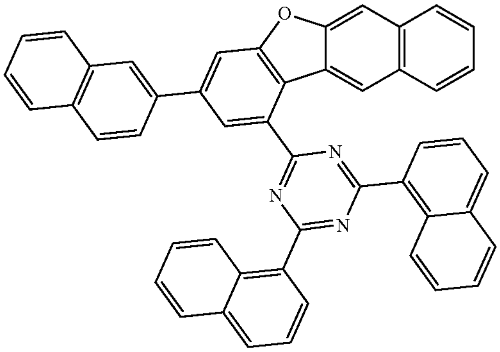
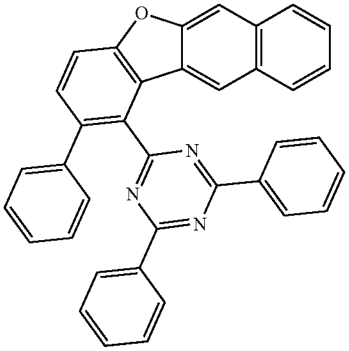
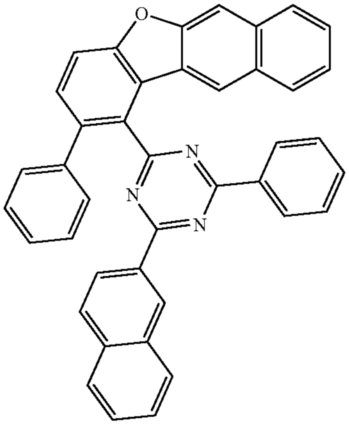

-continued
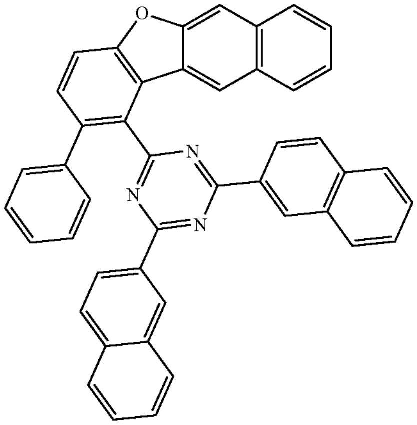
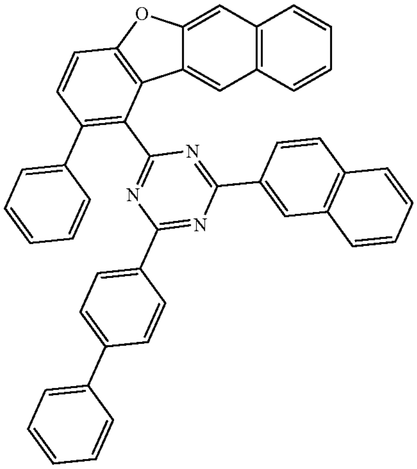
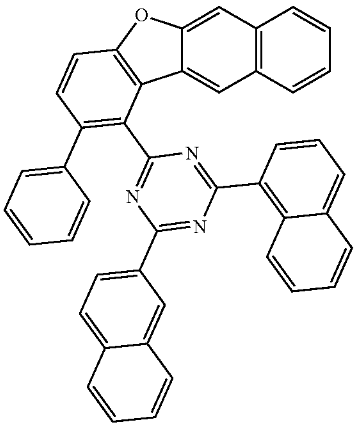
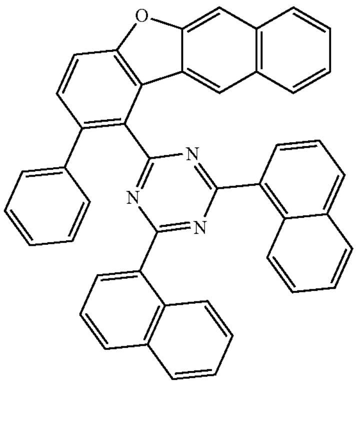
-continued
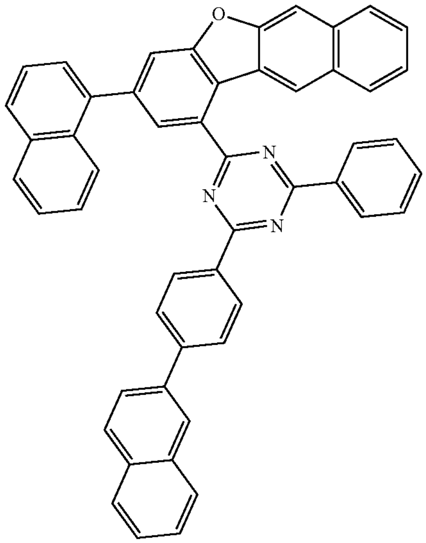
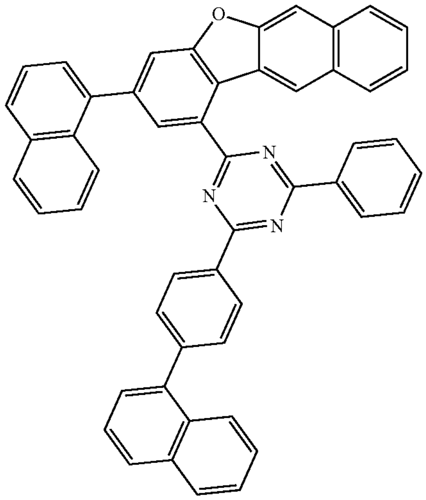
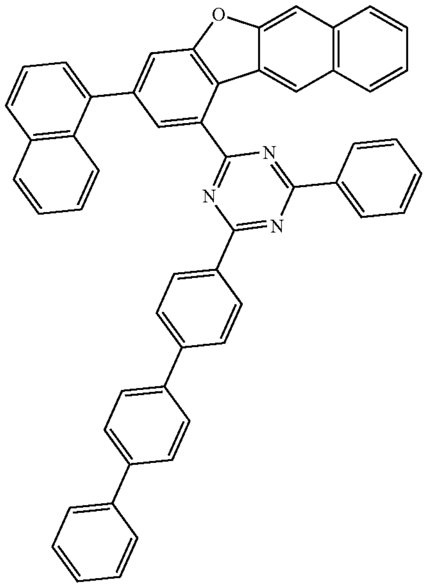

-continued
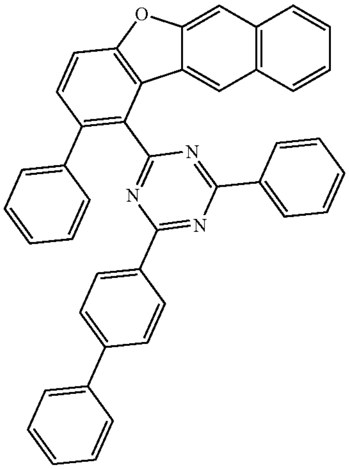
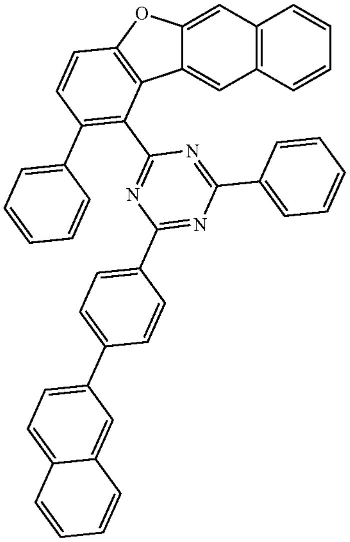
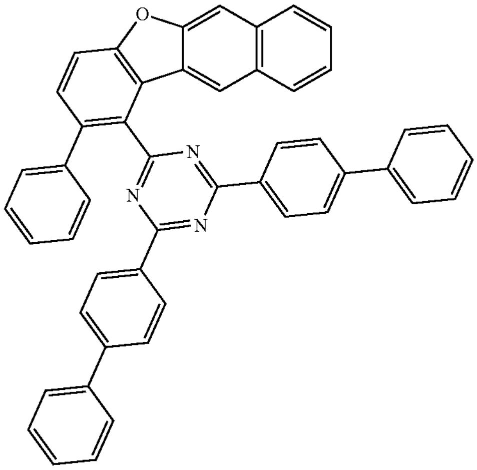
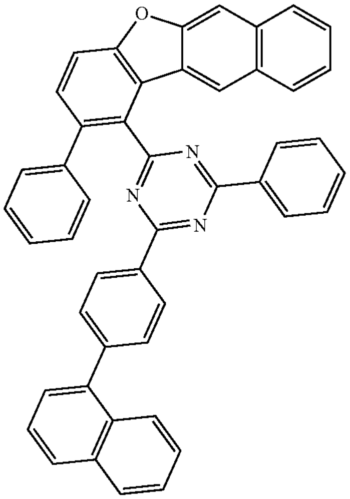
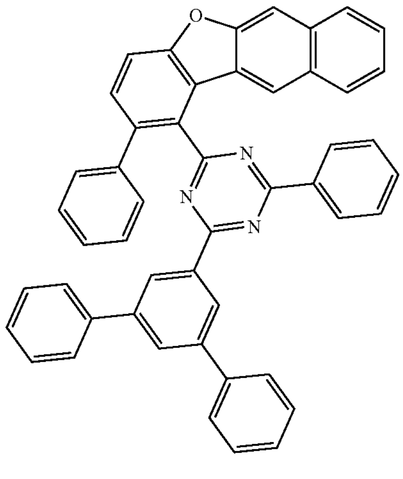
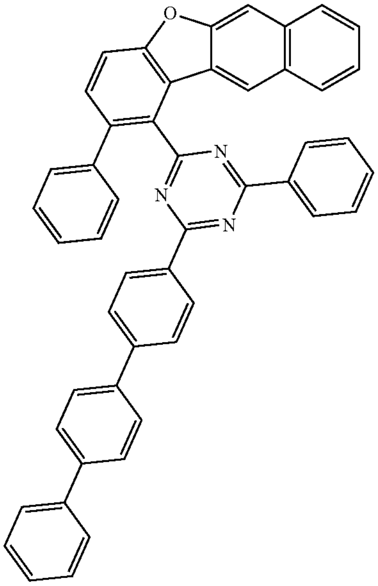

-continued
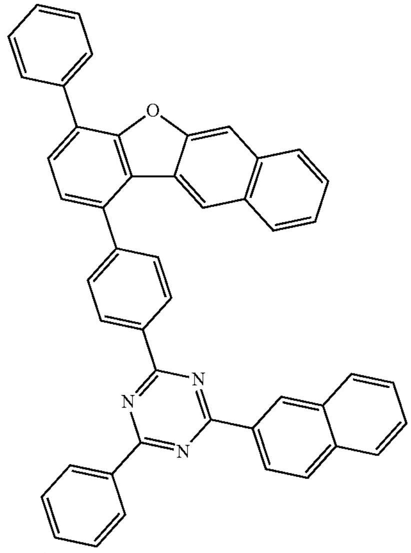
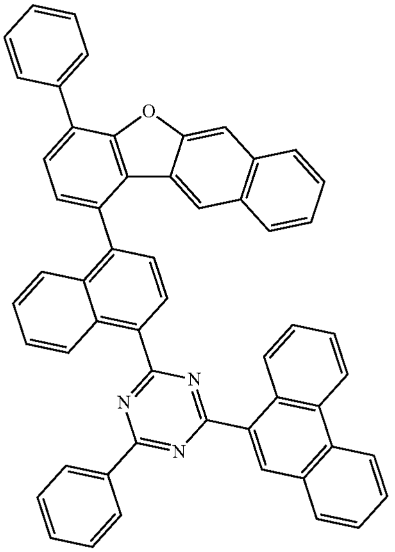
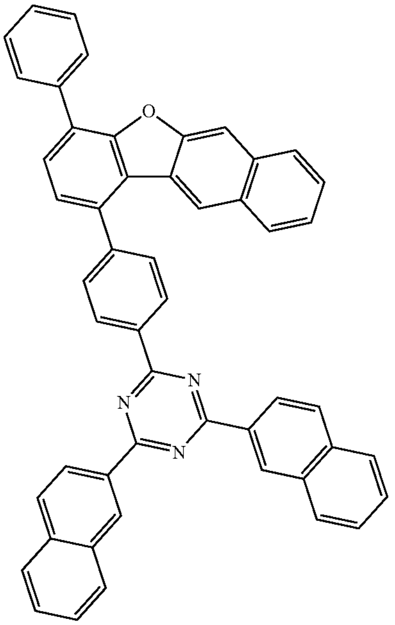
-continued
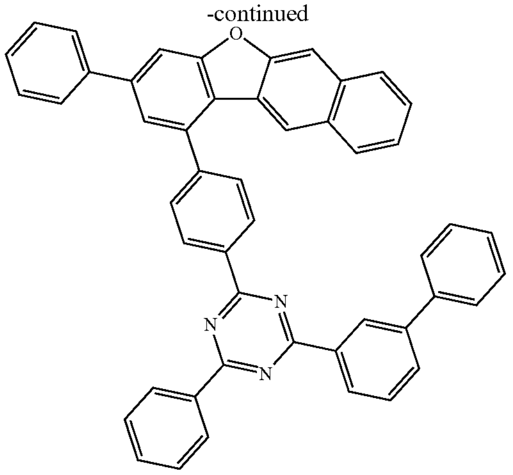
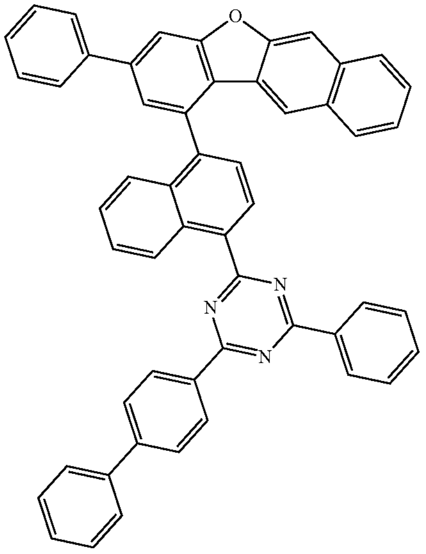
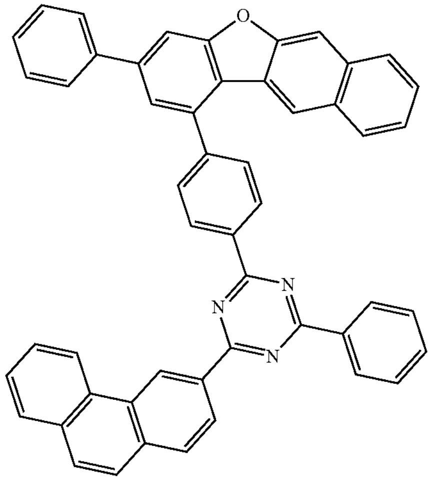

-continued
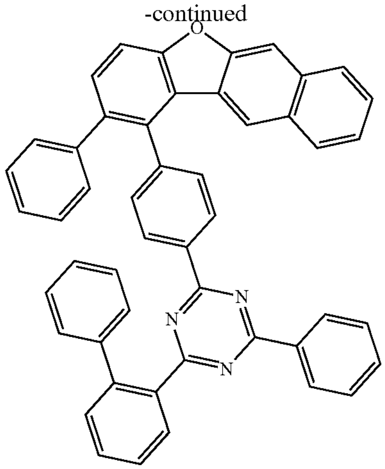
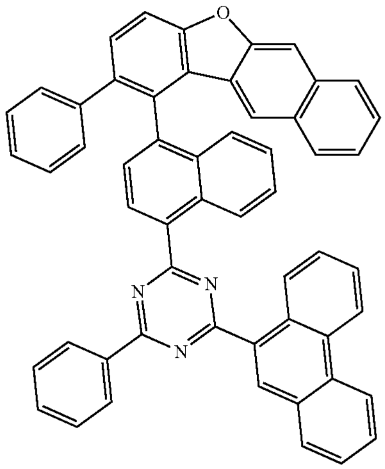
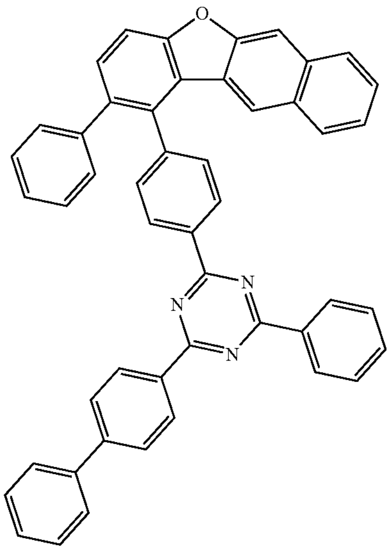
-continued
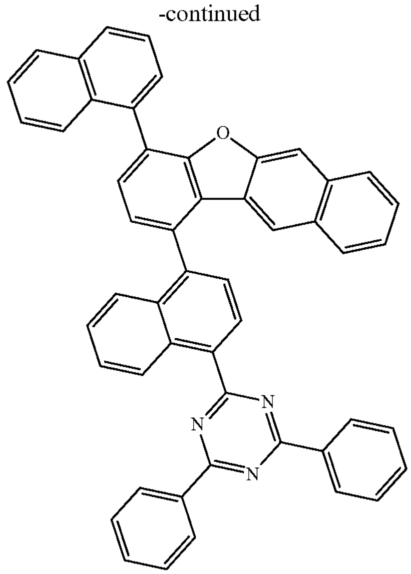
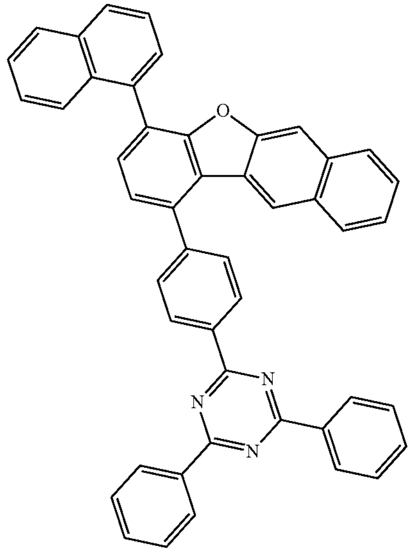
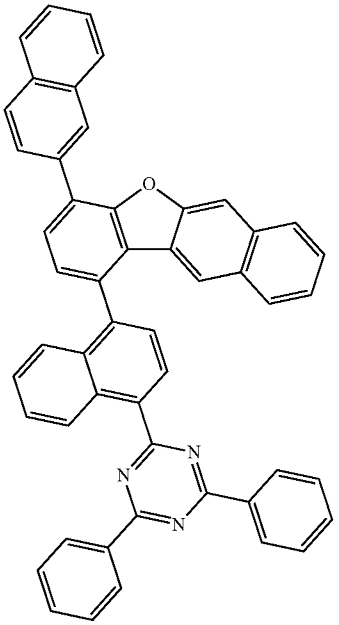

-continued
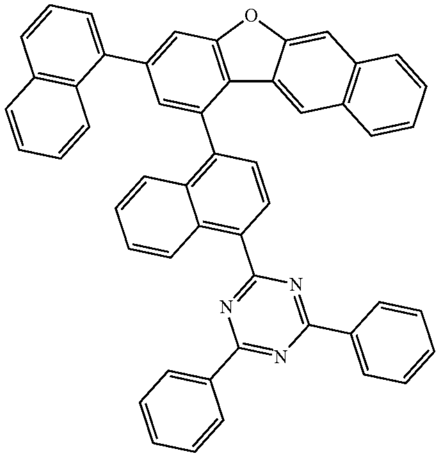
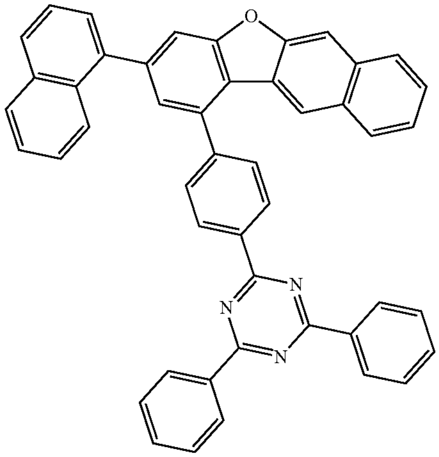
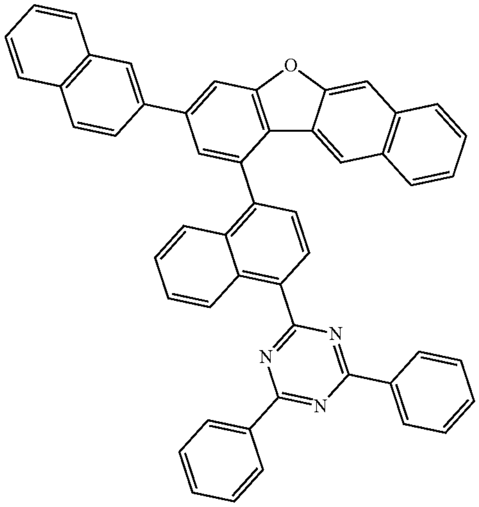
-continued
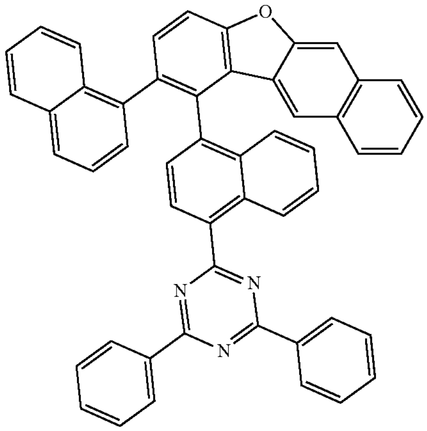
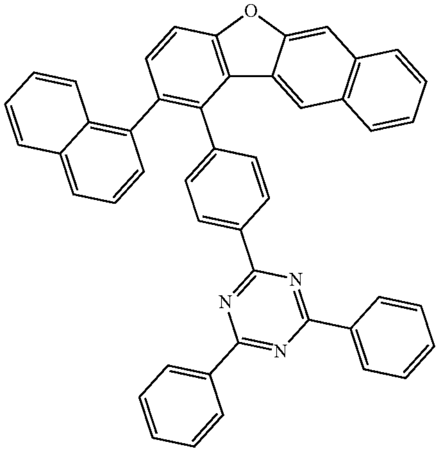
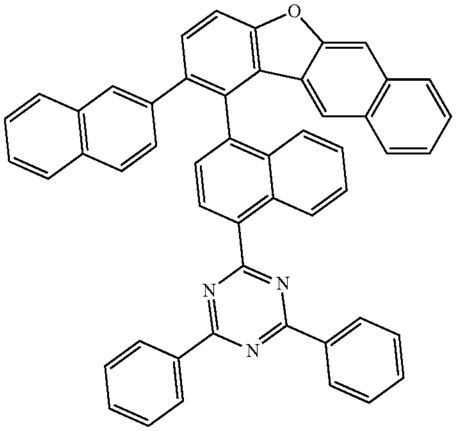

-continued
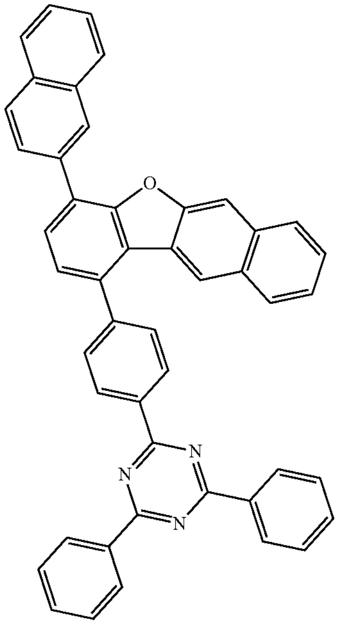
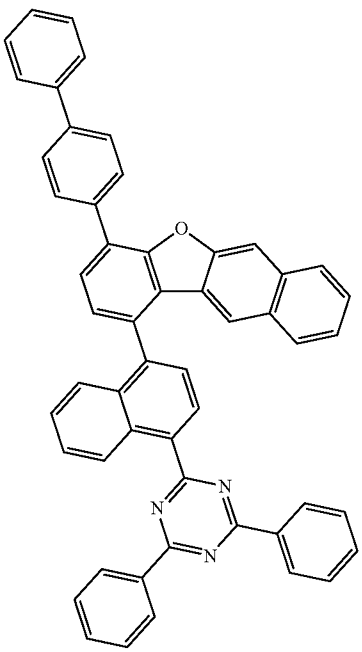
-continued
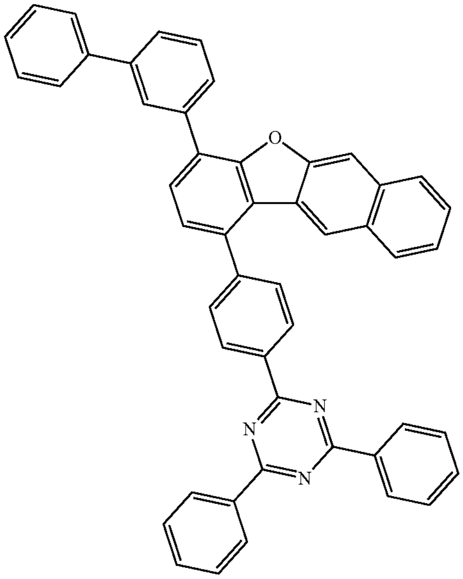
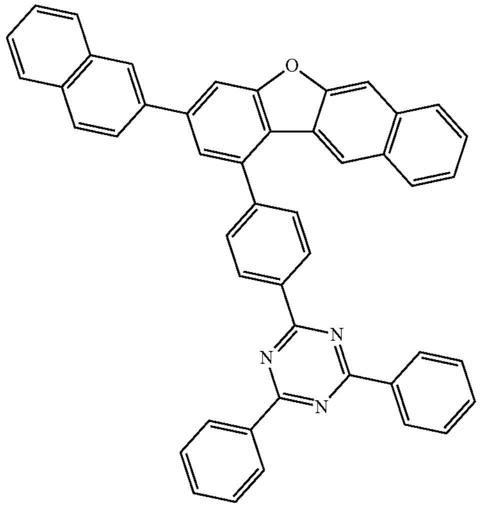
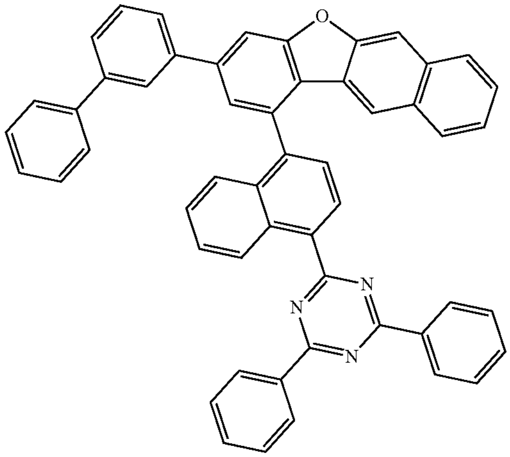

-continued
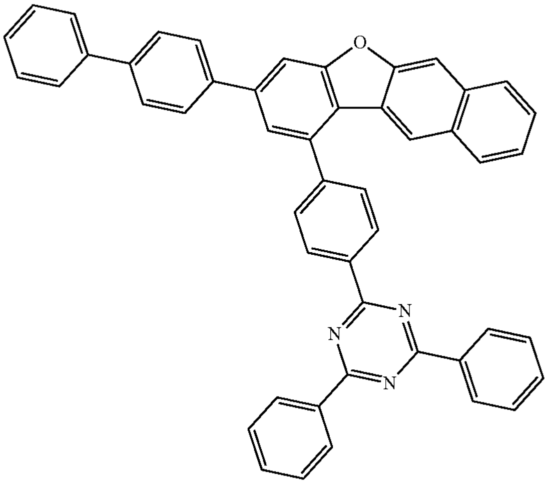
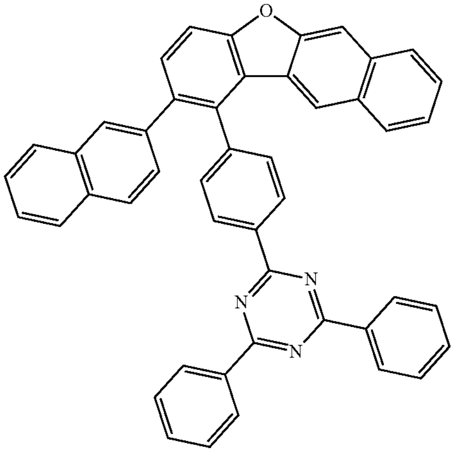
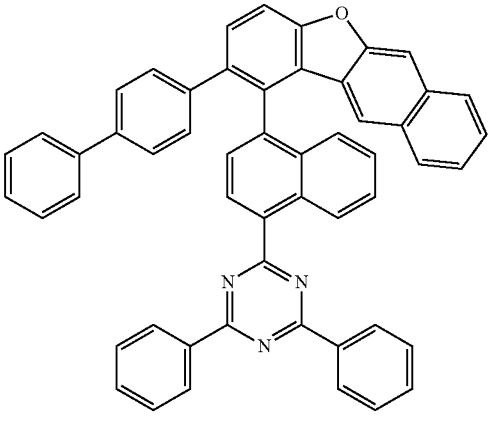
-continued
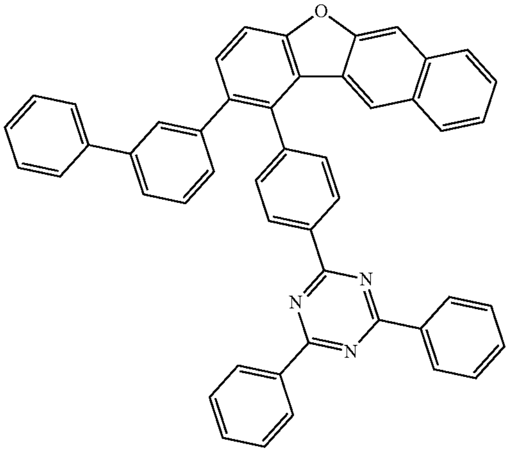
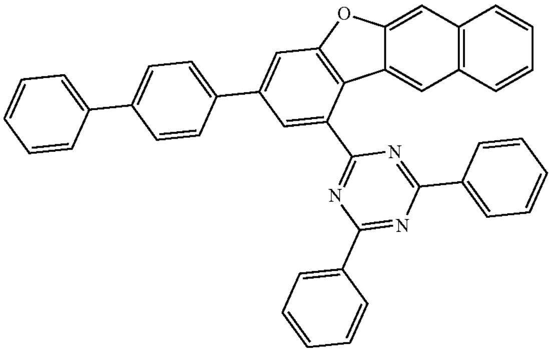
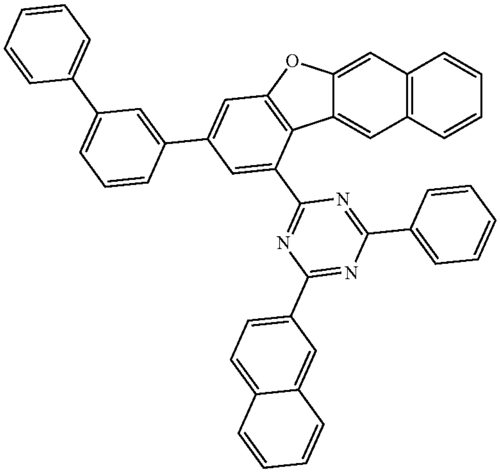

-continued
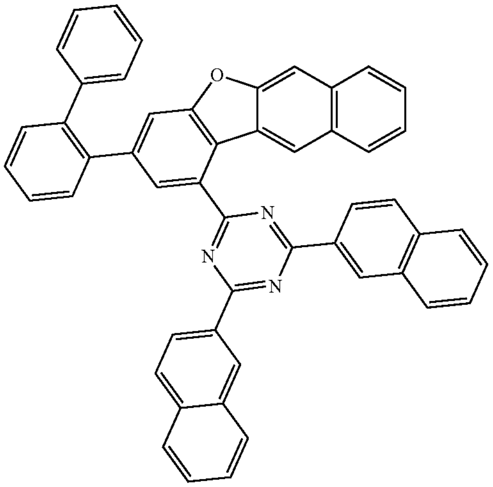
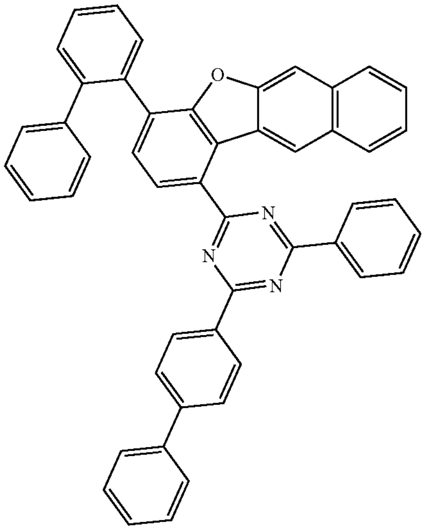
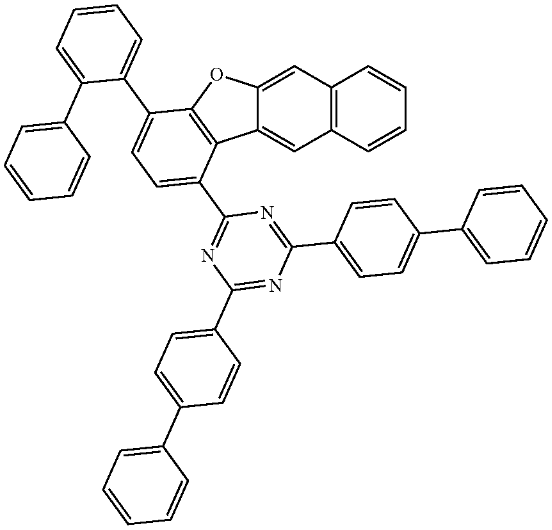
-continued
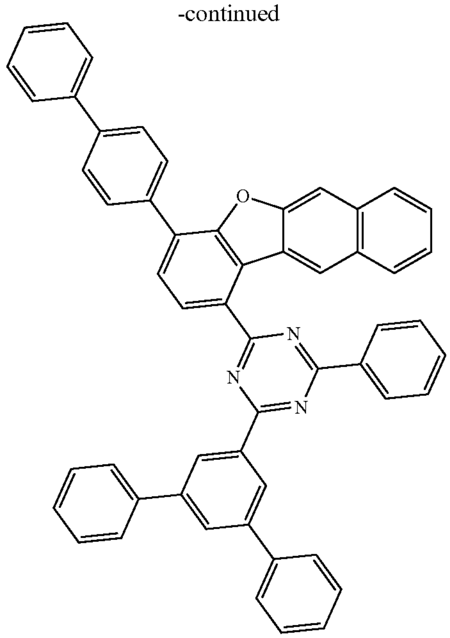
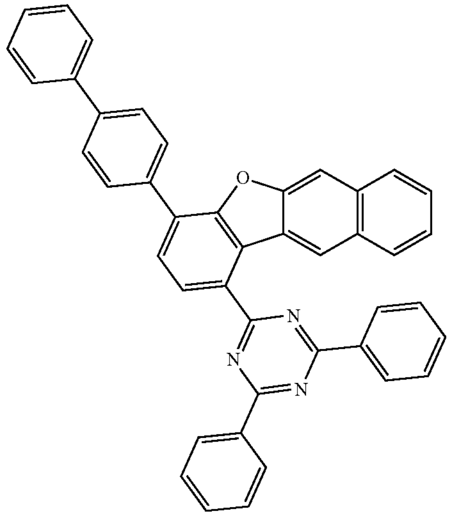
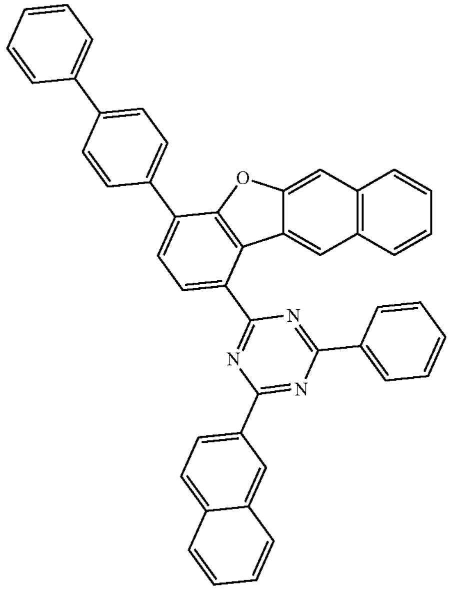

-continued
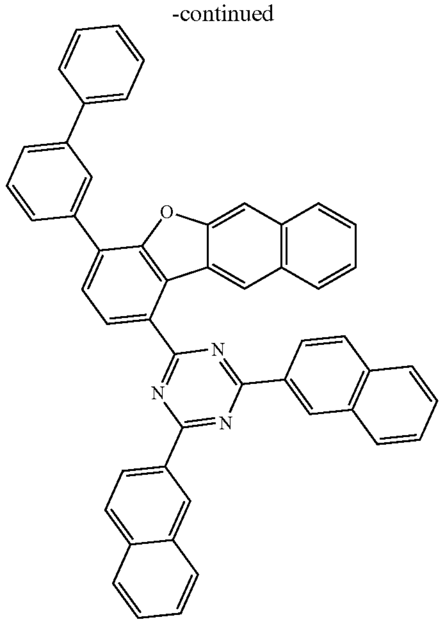
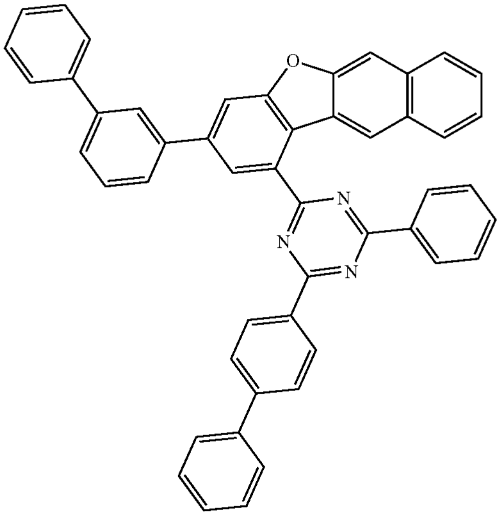
-continued
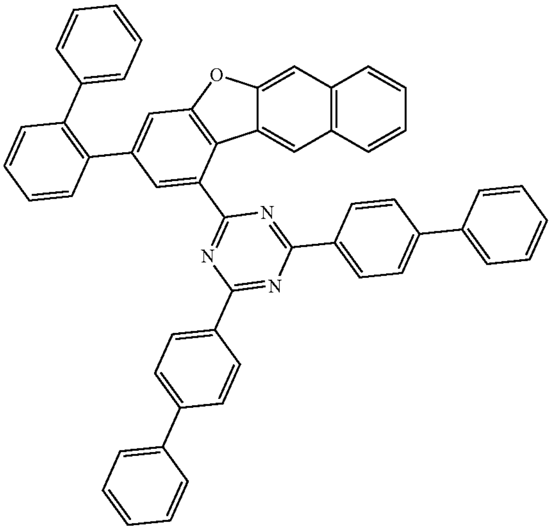
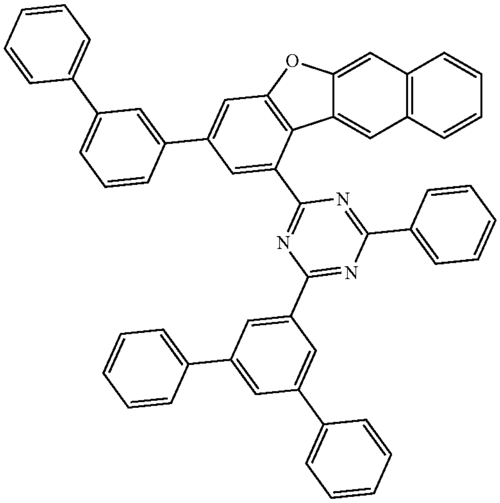
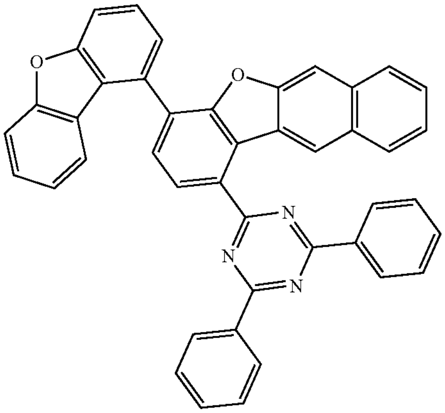

-continued
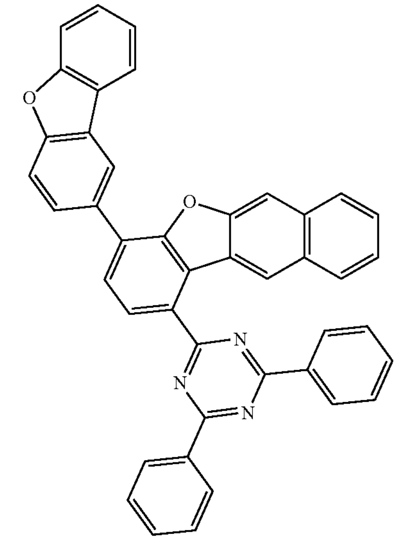
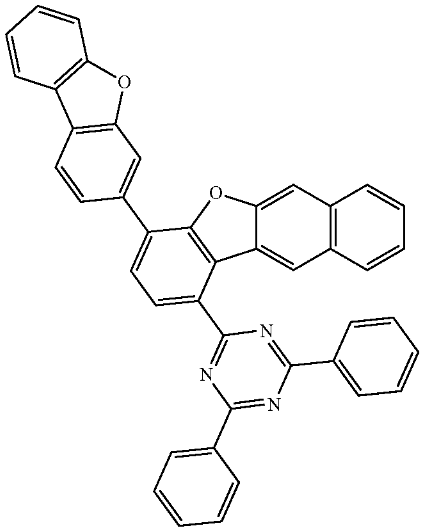
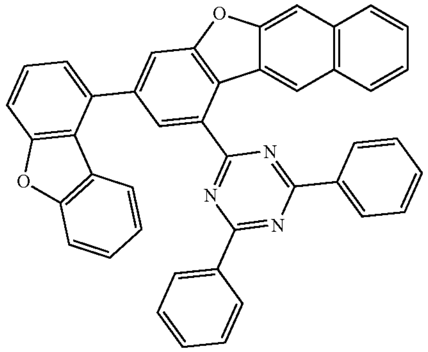
-continued
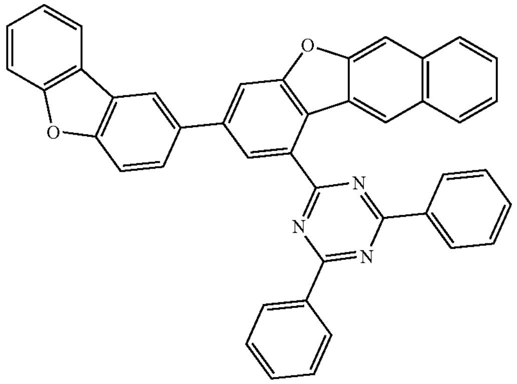
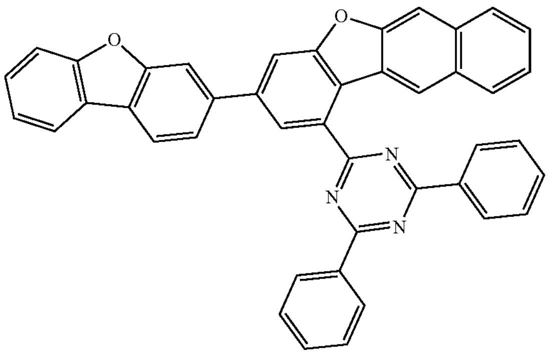
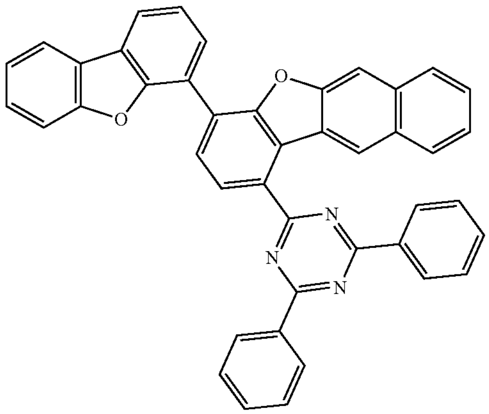
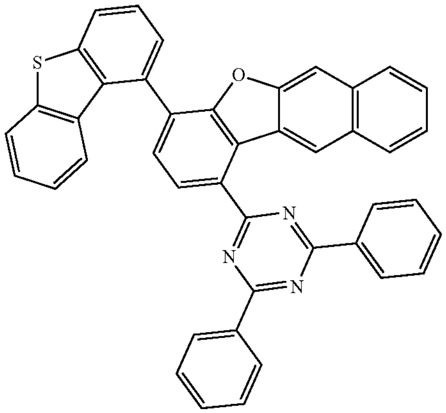

-continued
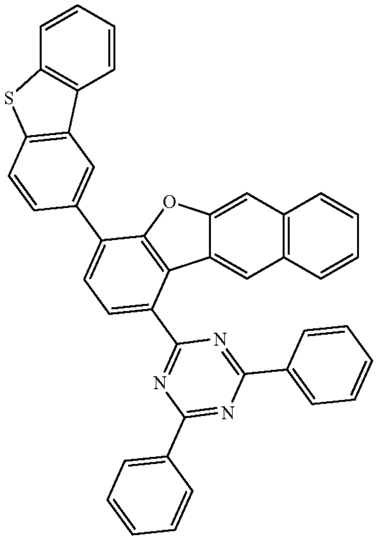
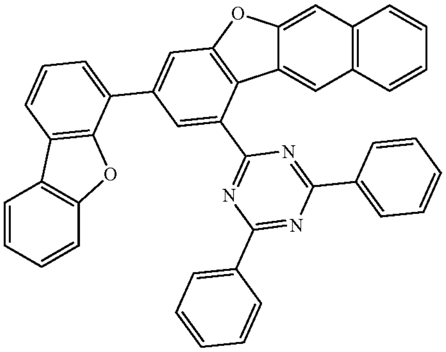
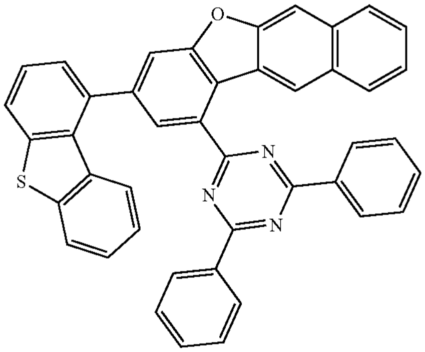
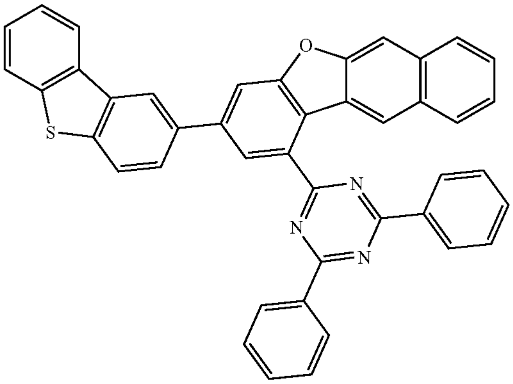
-continued
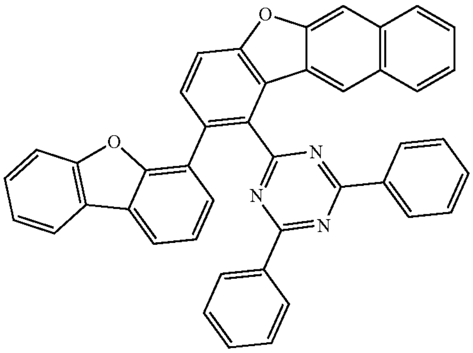
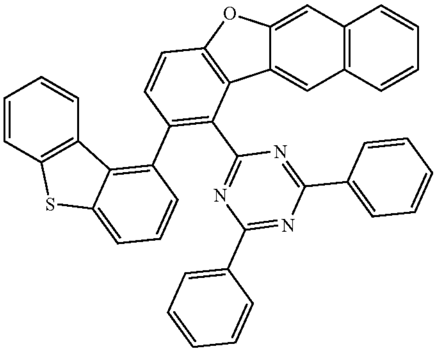
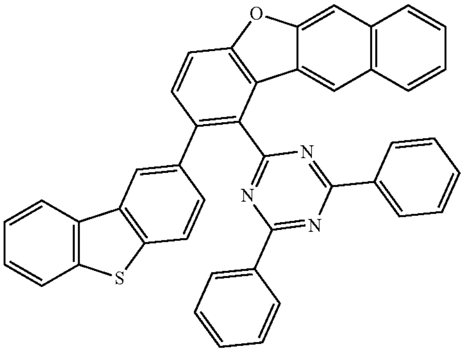
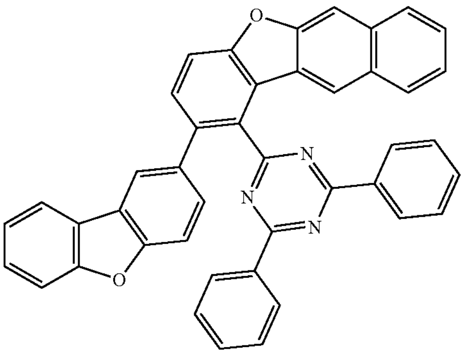

-continued
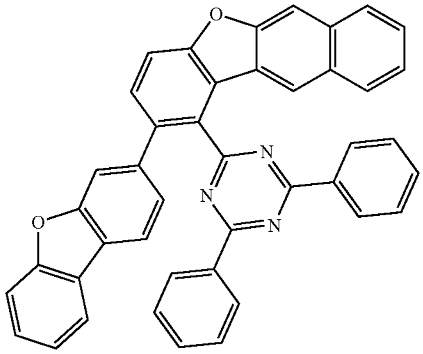
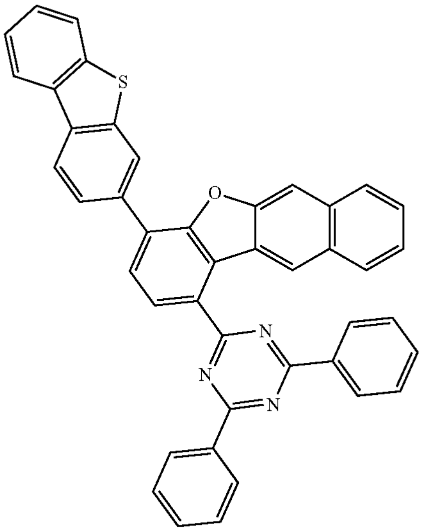
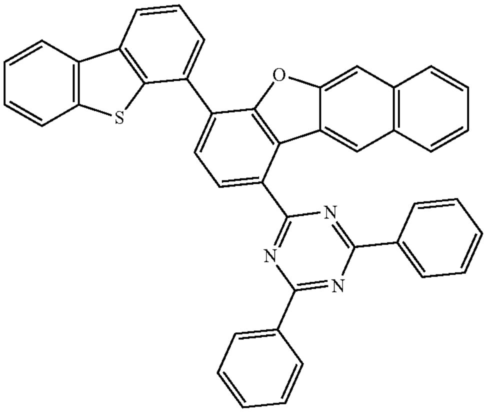
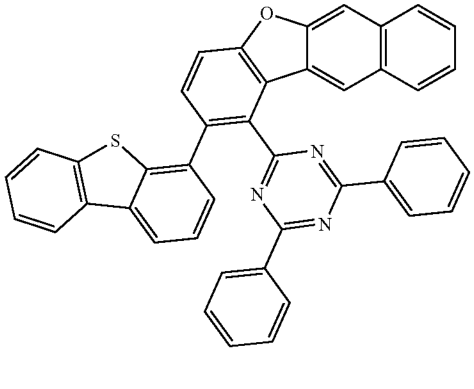
-continued
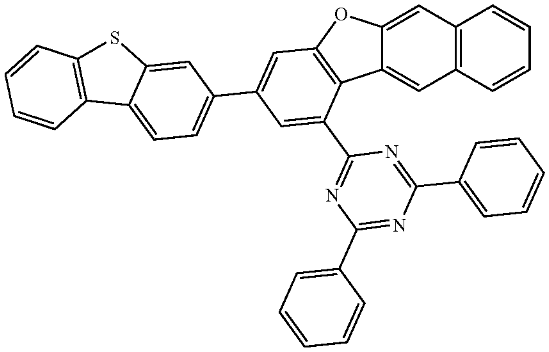
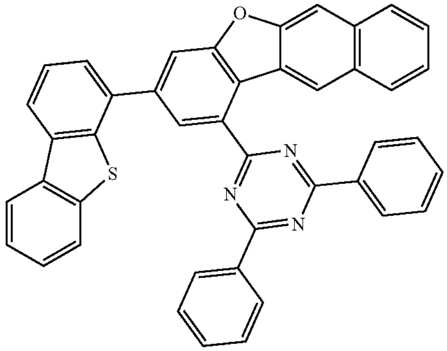
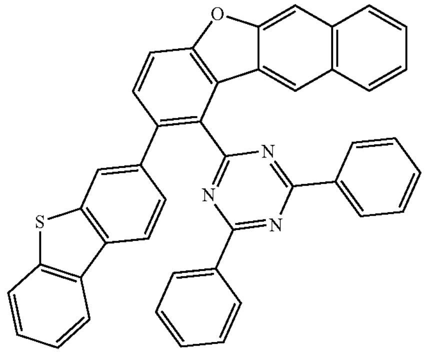
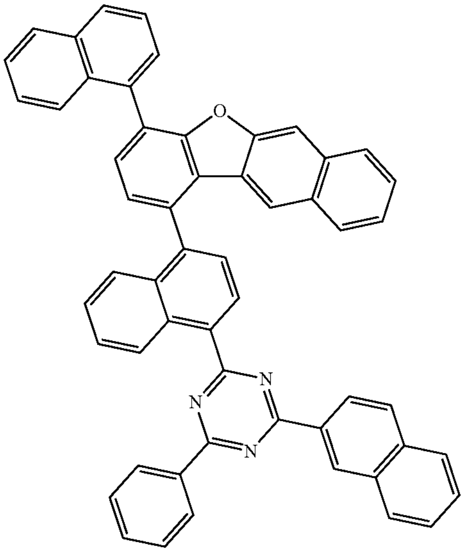

-continued
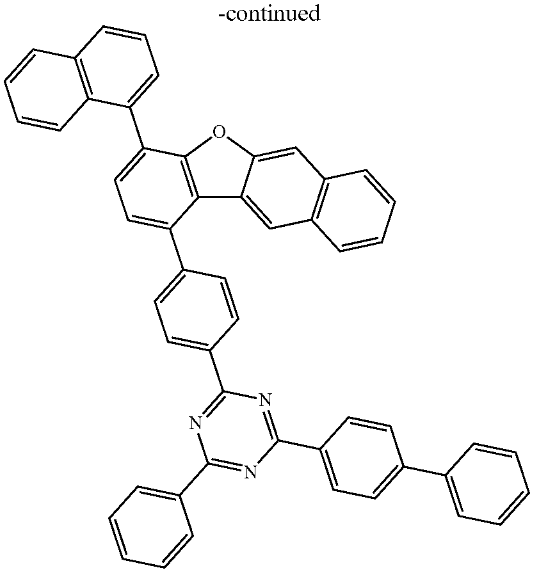
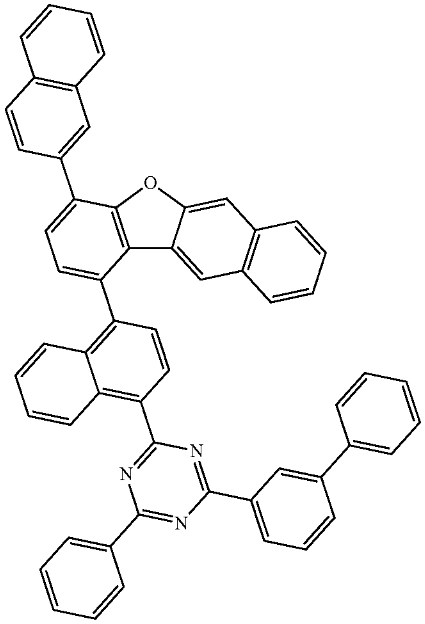
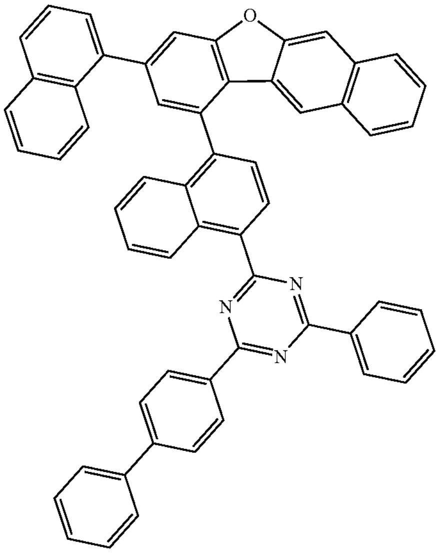
-continued
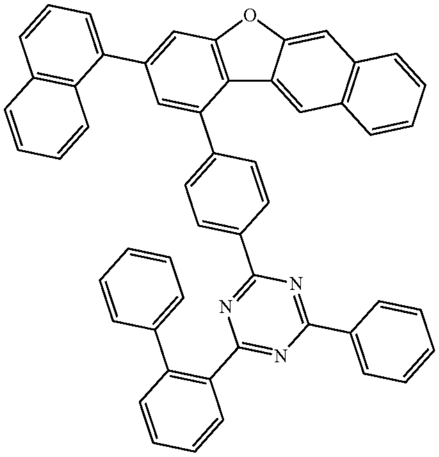
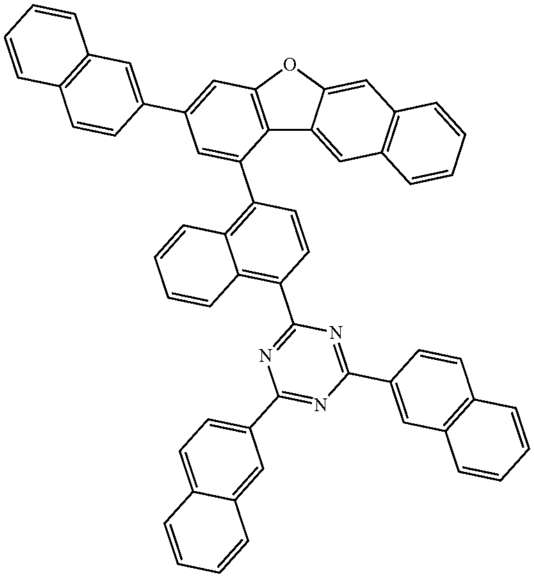
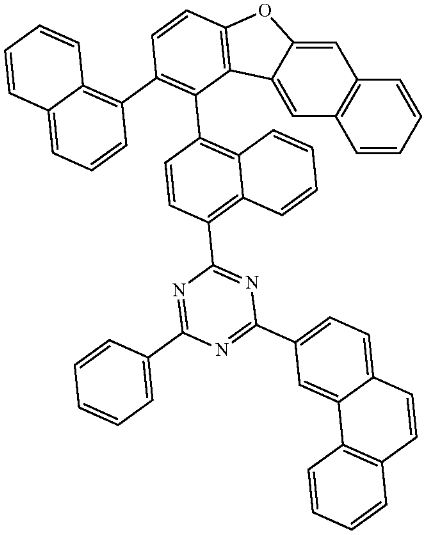

-continued
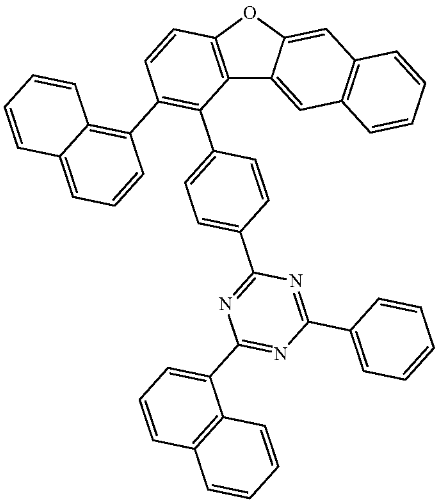
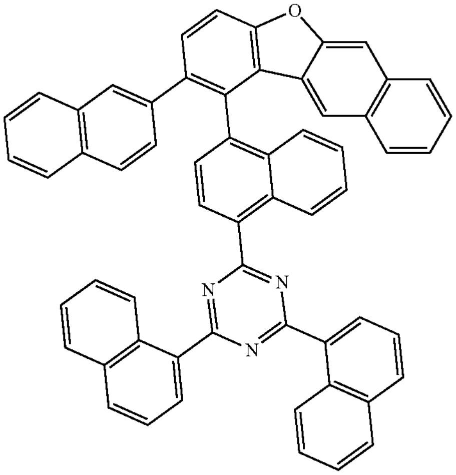
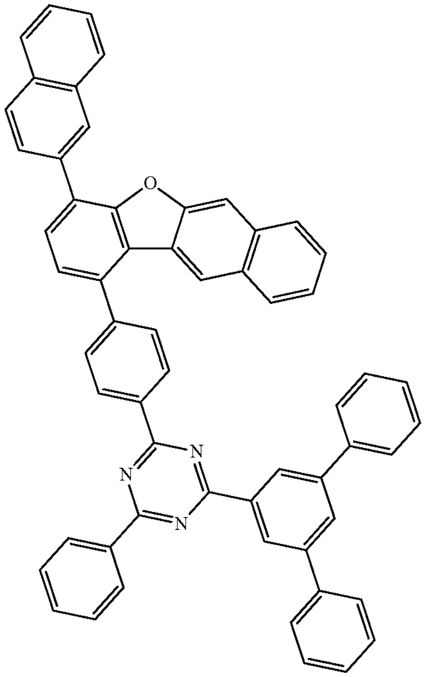
-continued
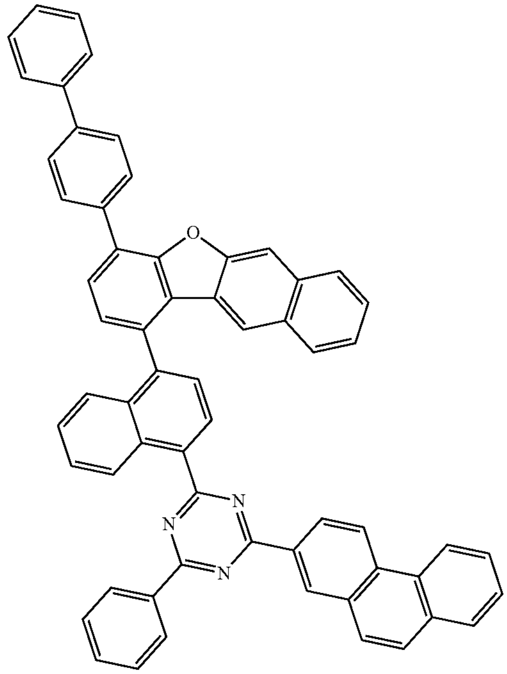
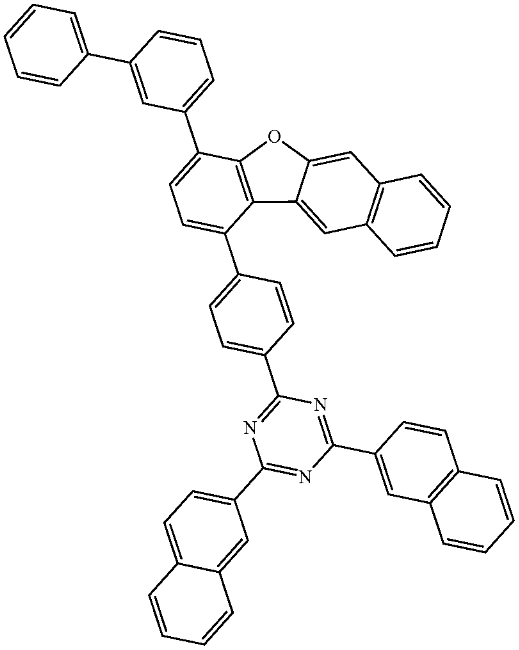

-continued
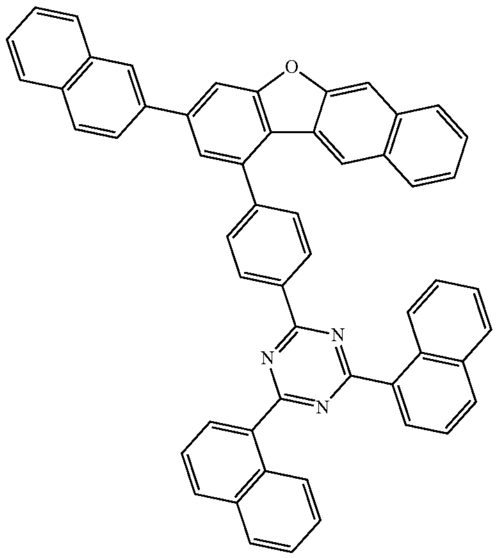
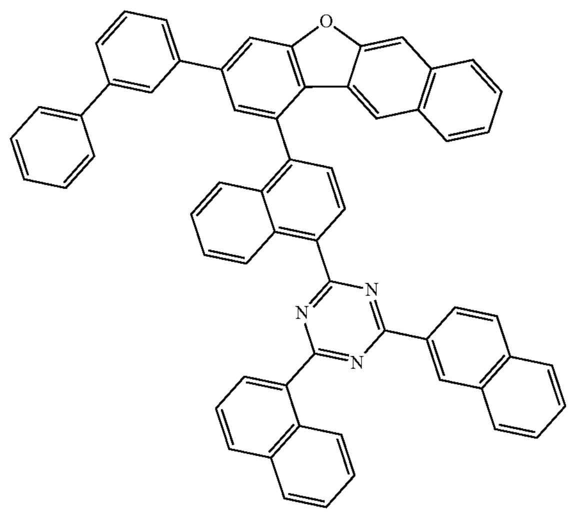
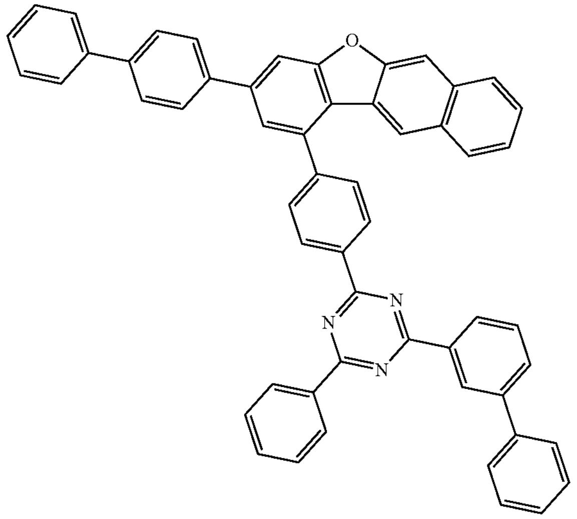
-continued
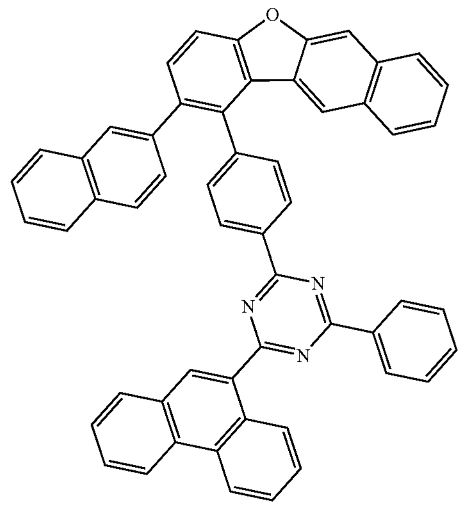
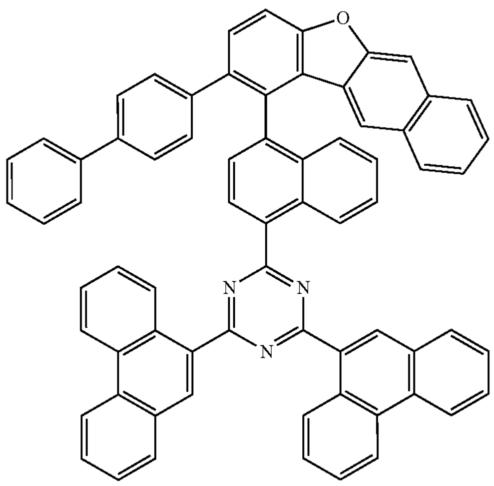
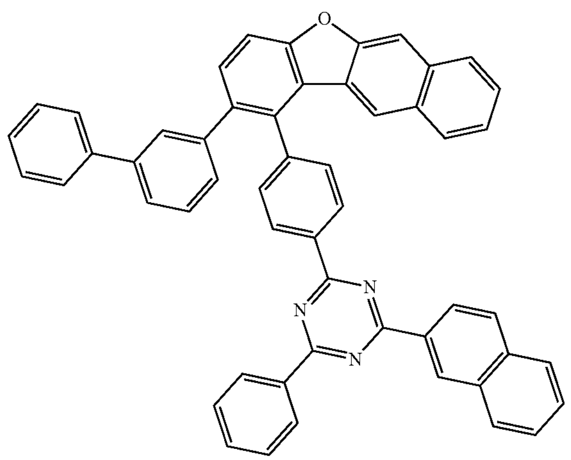 [SMILES: c1ccc(-c2cccc(-c3ccc4oc5cc6ccccc6cc5c4c3-c3ccc(-c4nc(-c5ccccc5)nc(-c5ccc6ccccc6c5)n4)cc3)c2)cc1]

-continued
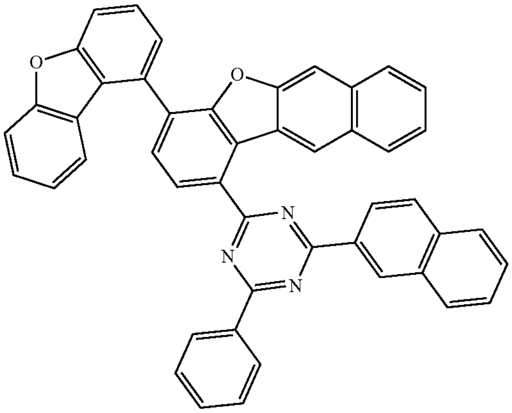
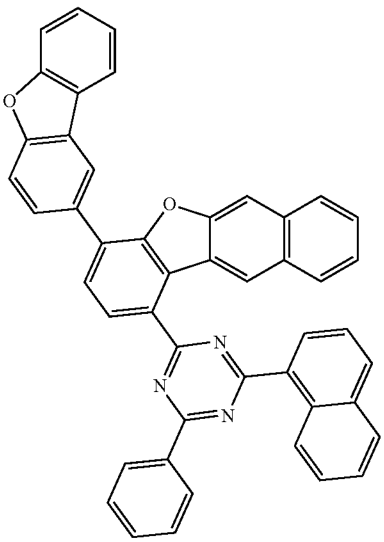
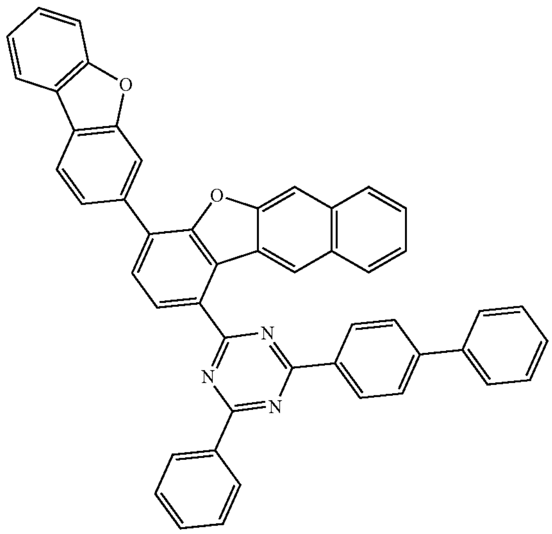
-continued
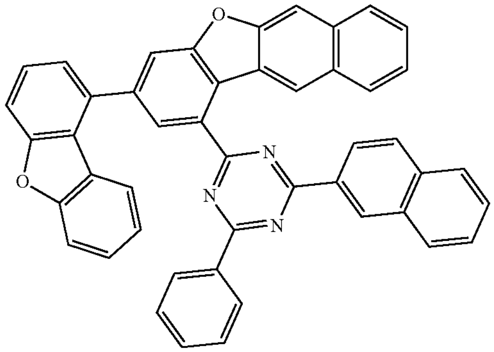
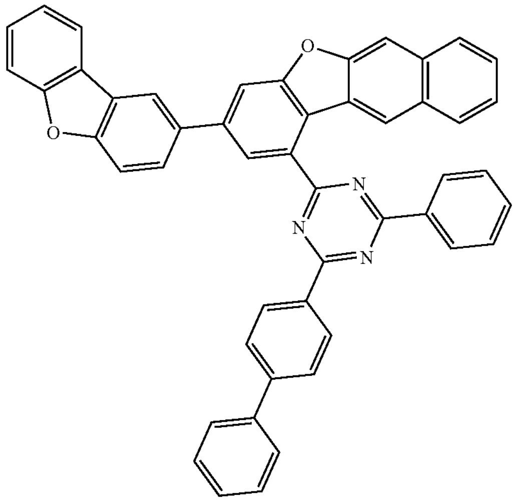
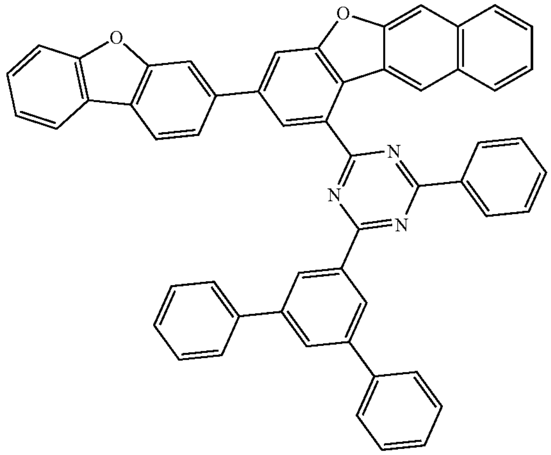

-continued
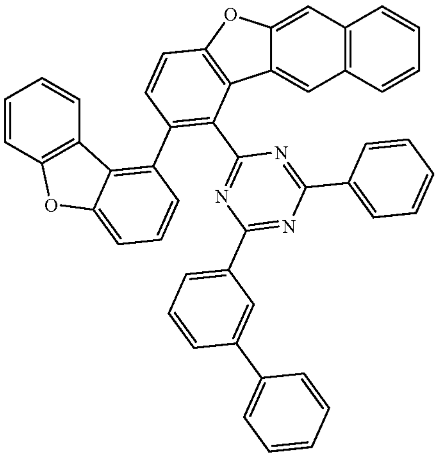
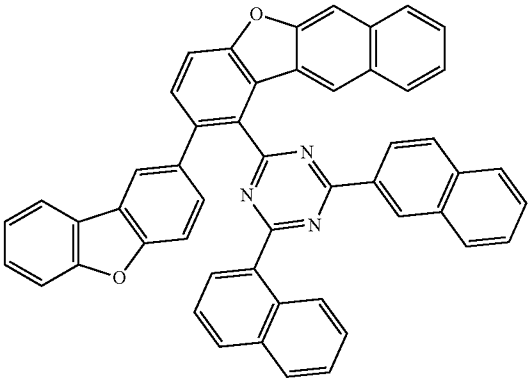
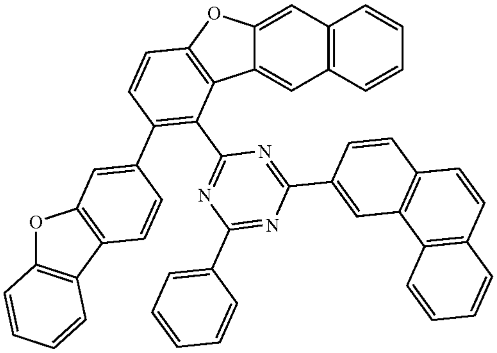
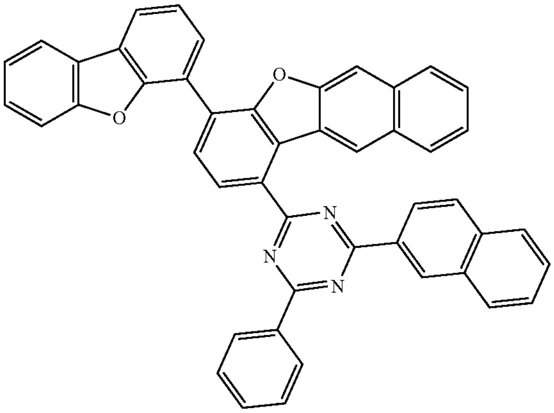
-continued
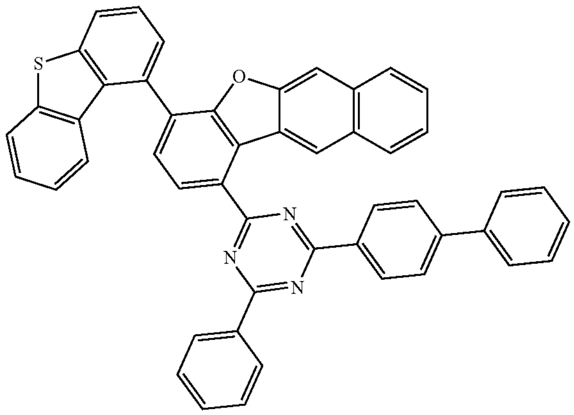
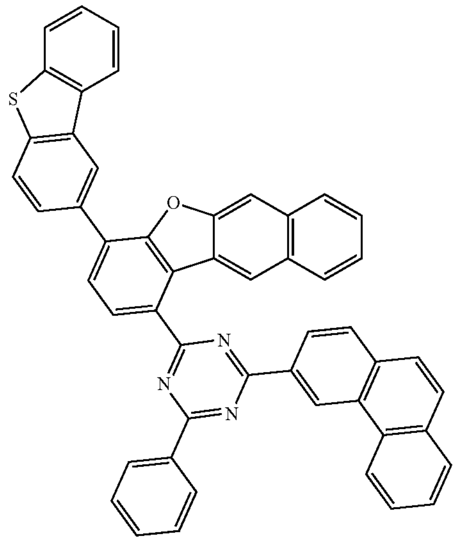
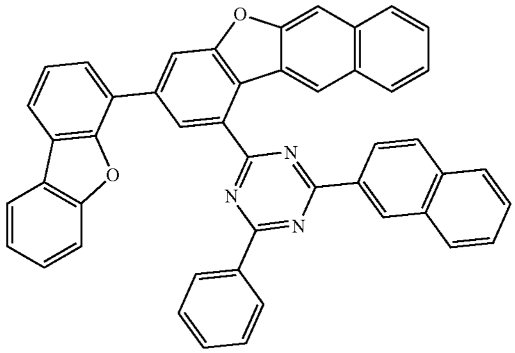
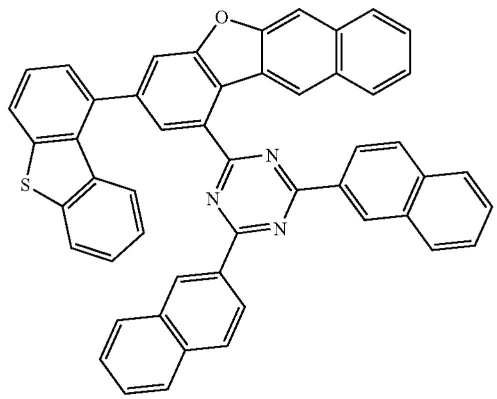

-continued
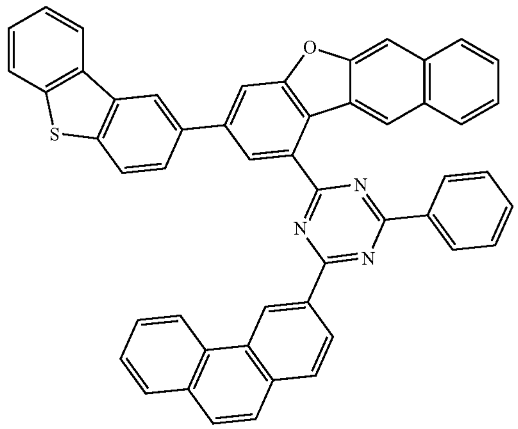
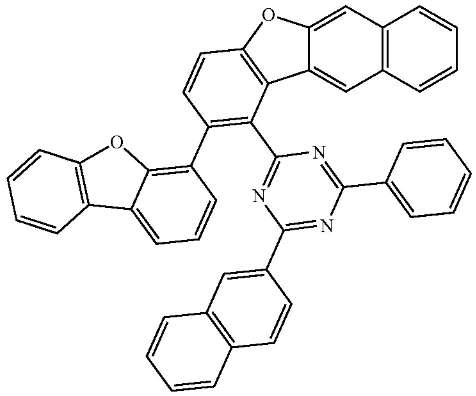
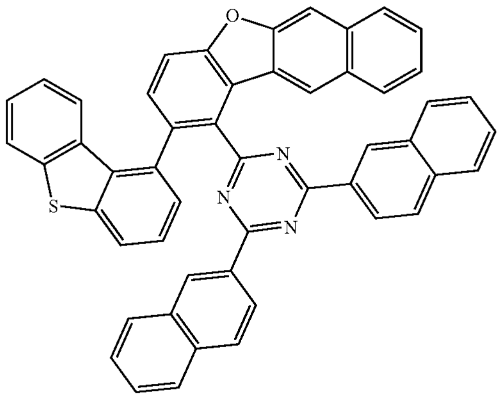
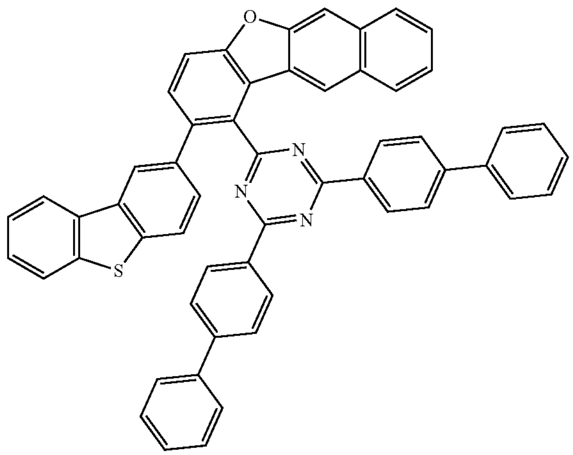
-continued
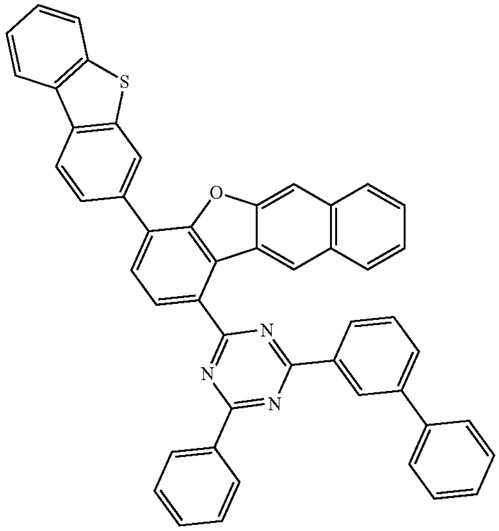
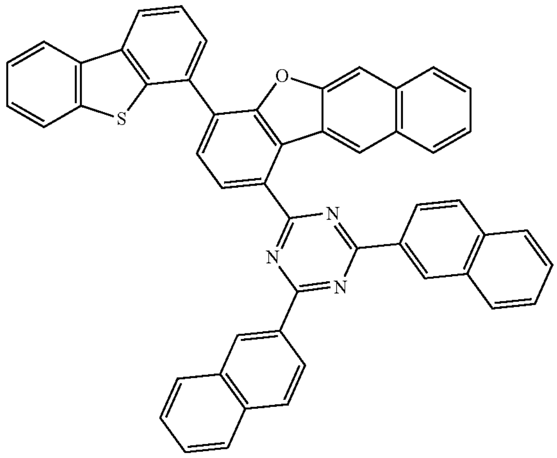
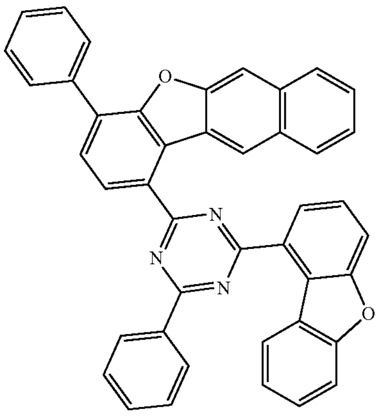

-continued
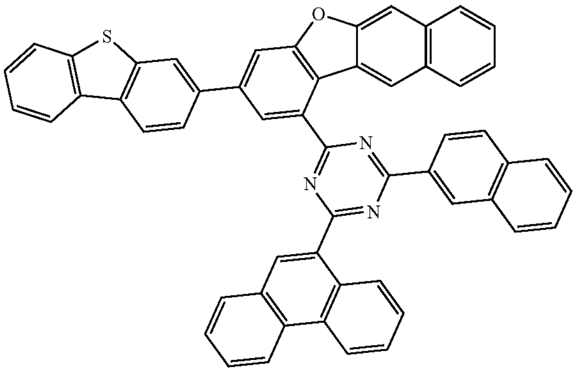
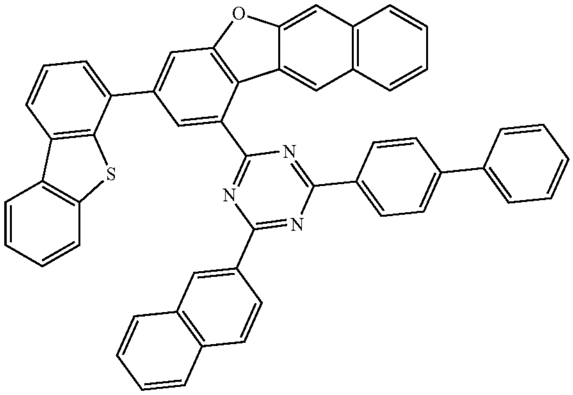
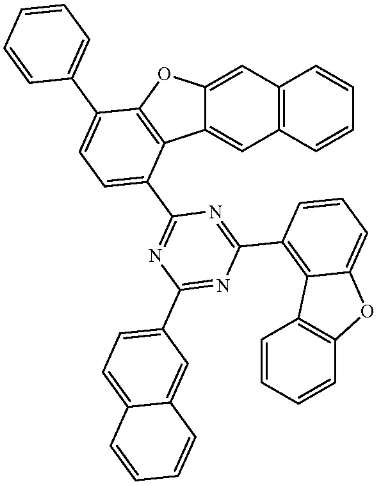
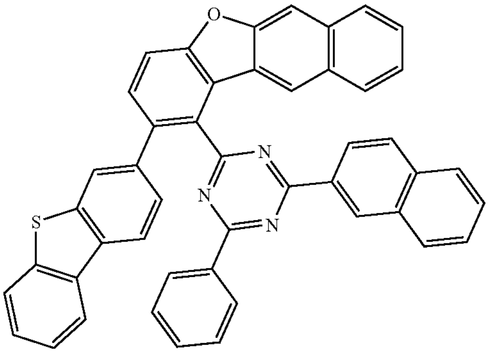
-continued
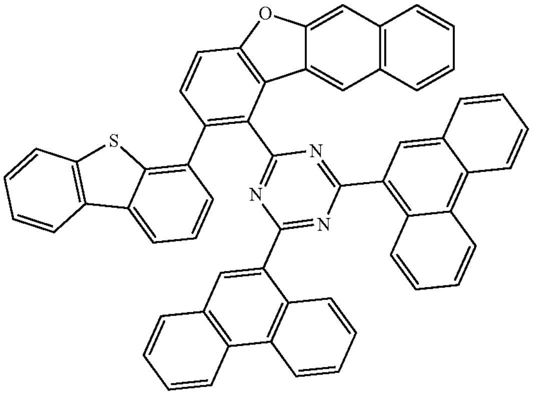
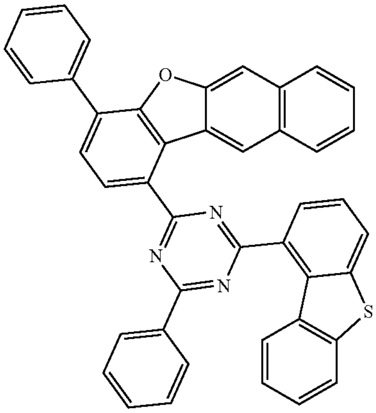
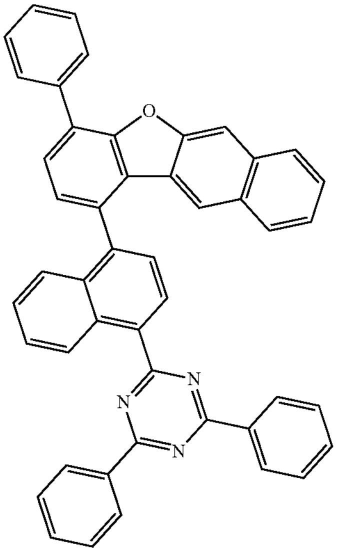

-continued
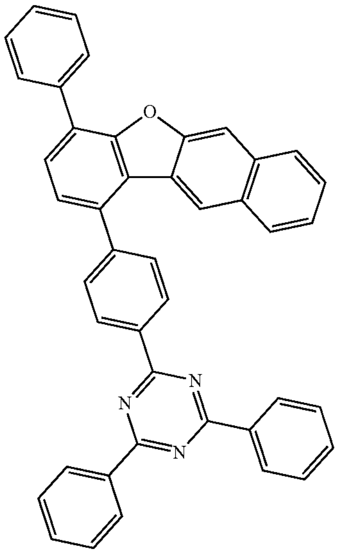
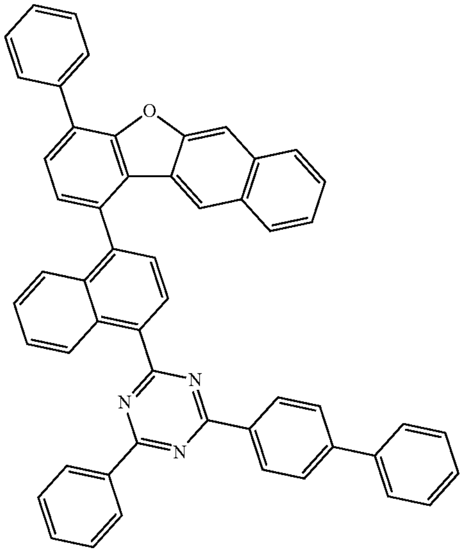
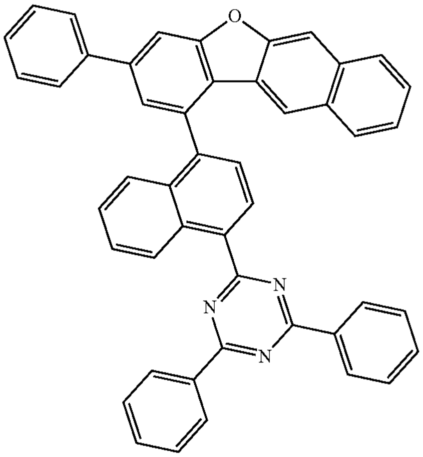
-continued
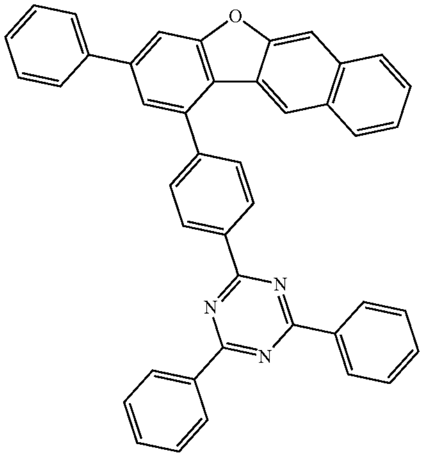
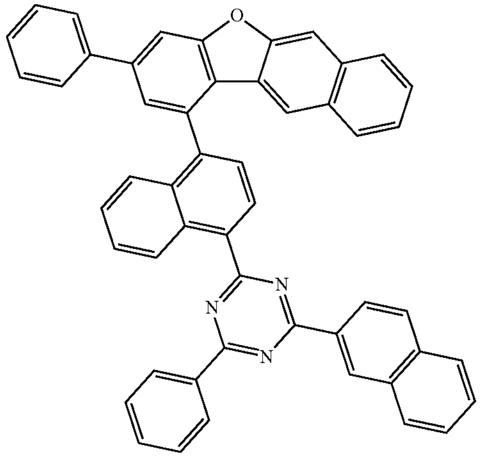
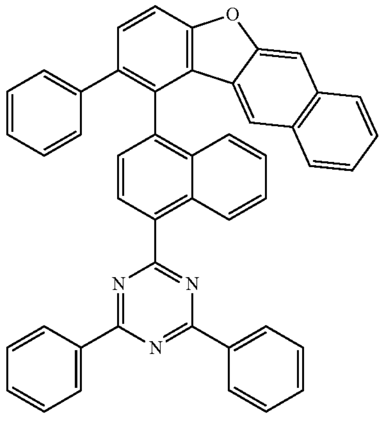

-continued
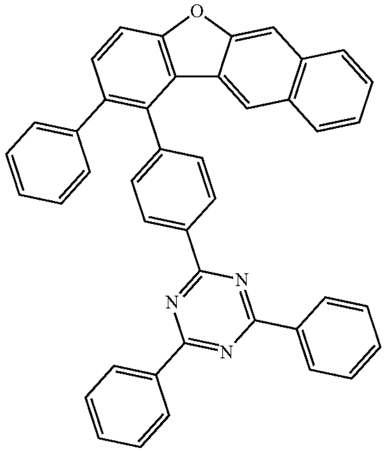
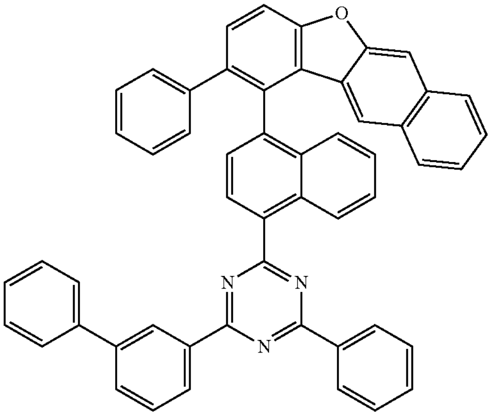
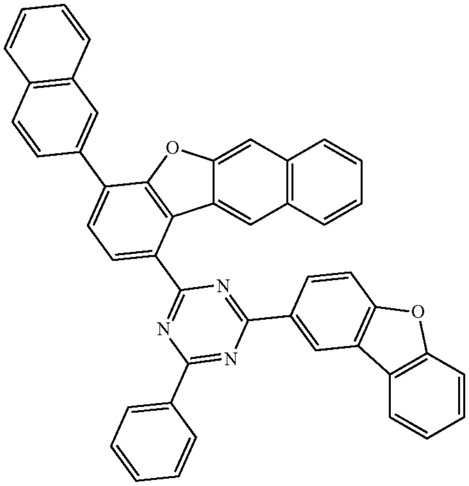
-continued
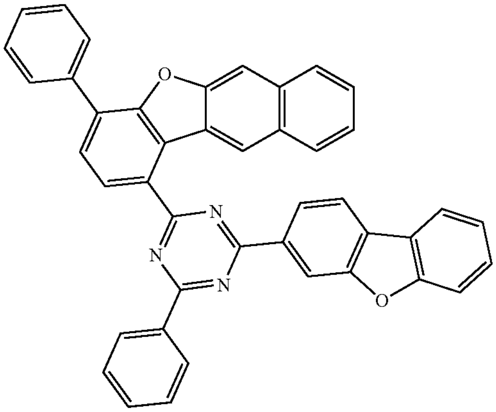
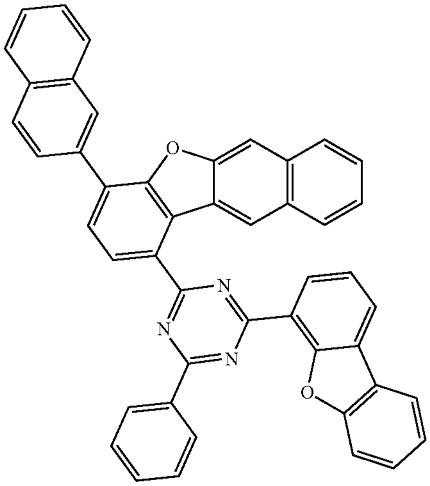
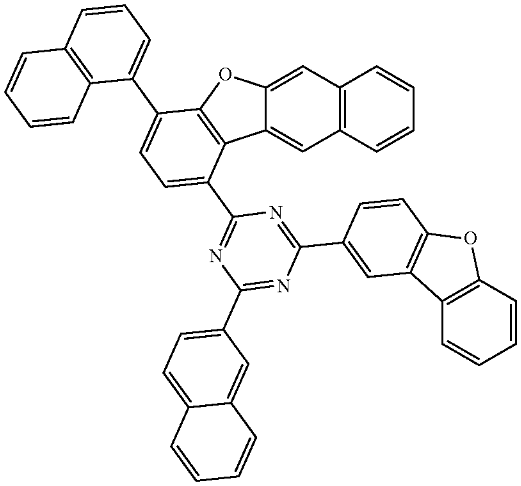

-continued
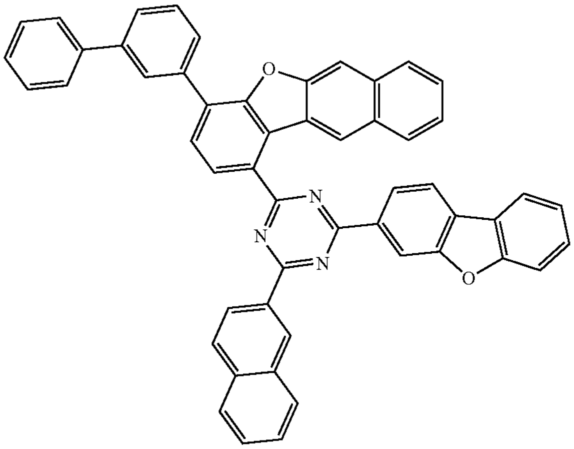
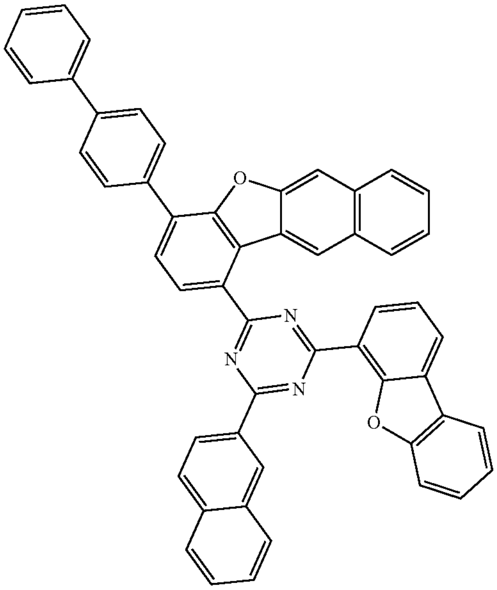
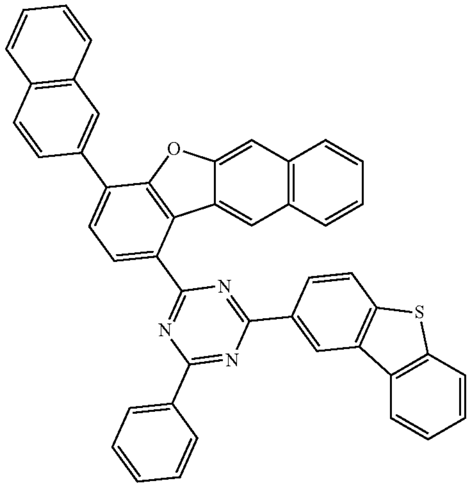
-continued
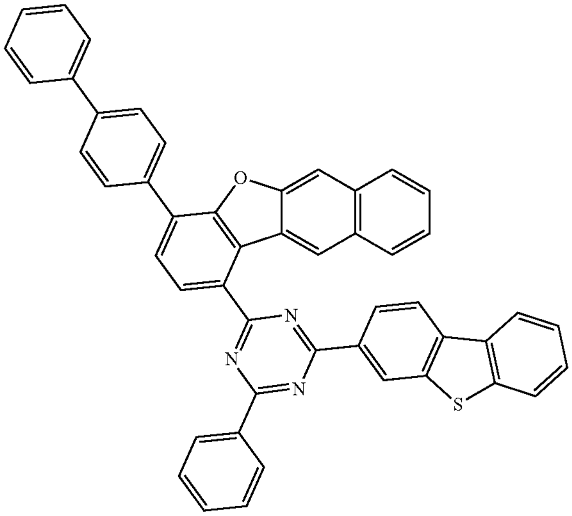
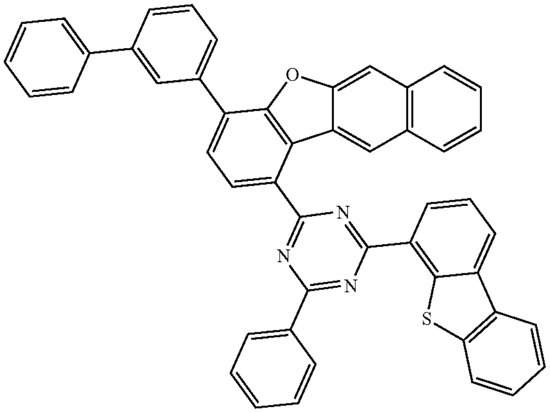
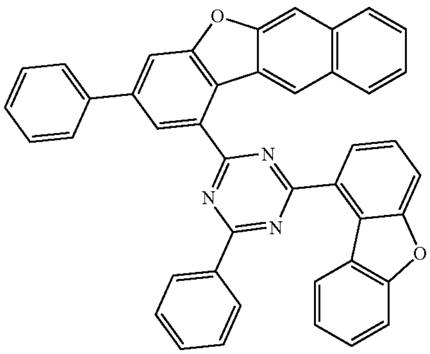
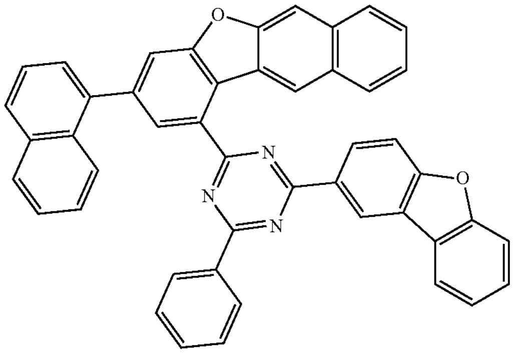

-continued
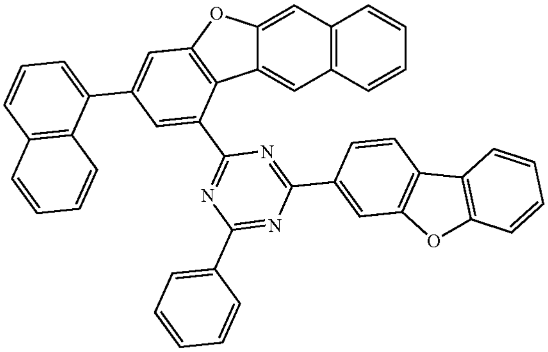
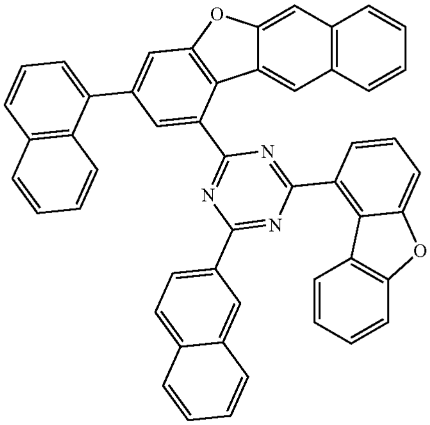
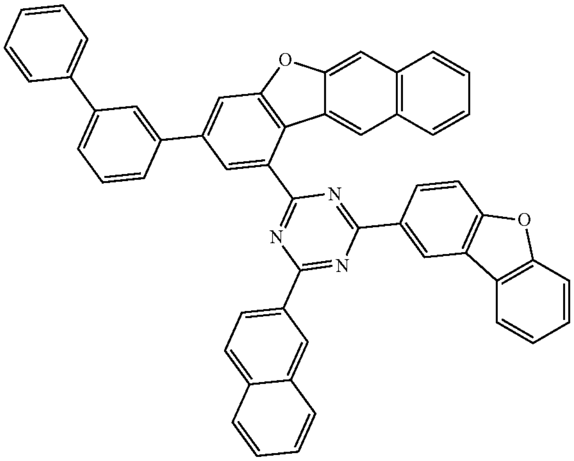
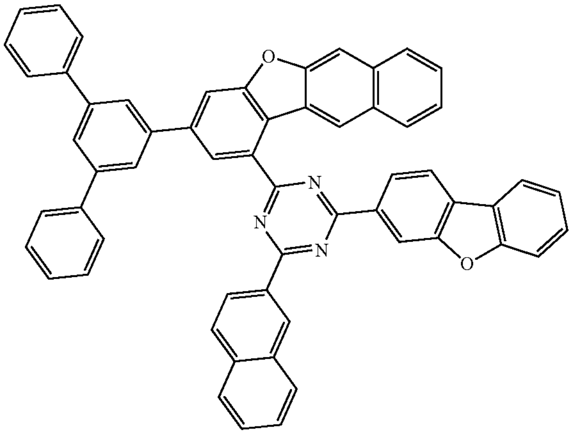
-continued
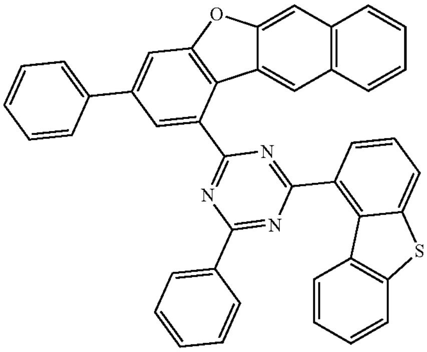
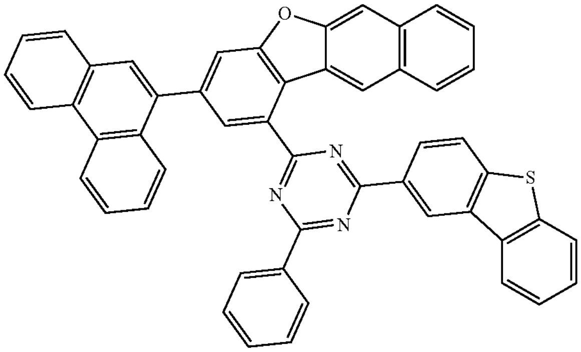
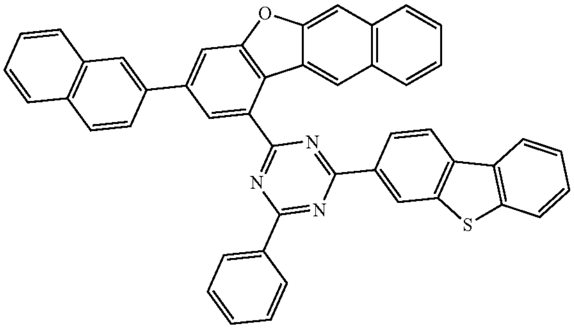
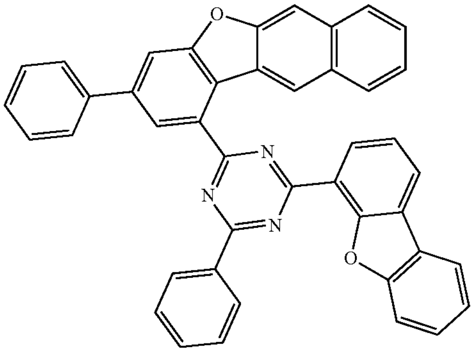

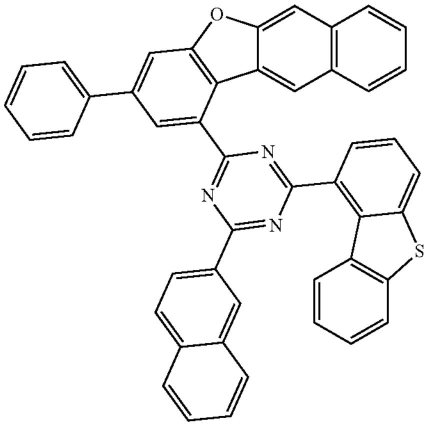
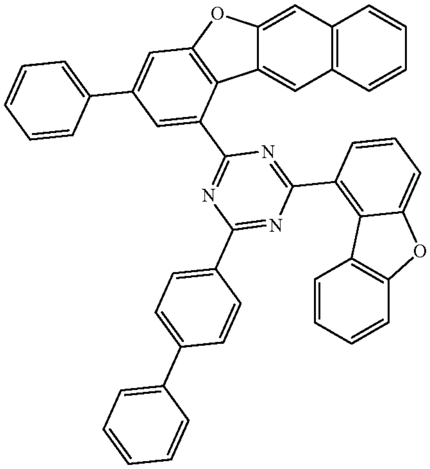
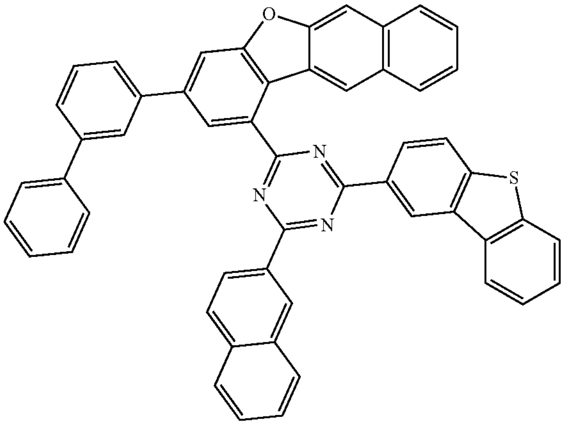
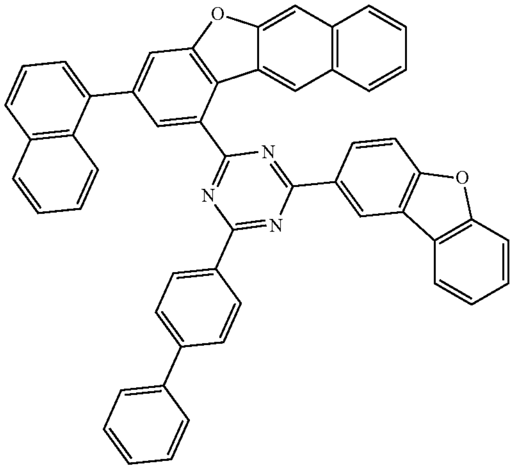
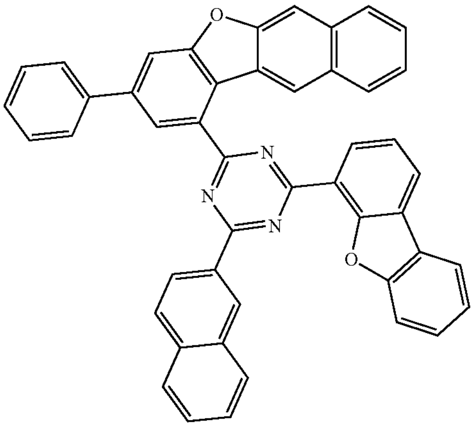
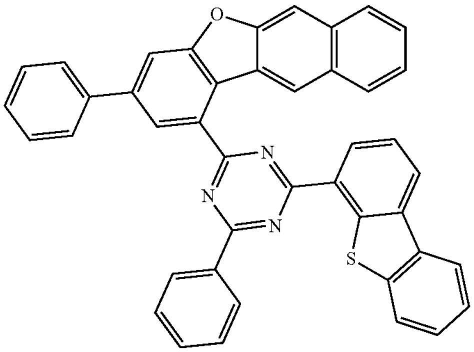

-continued
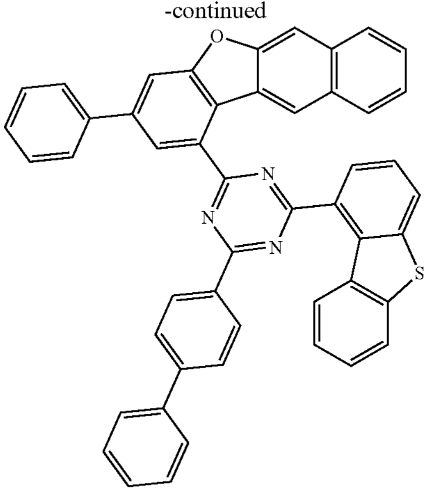
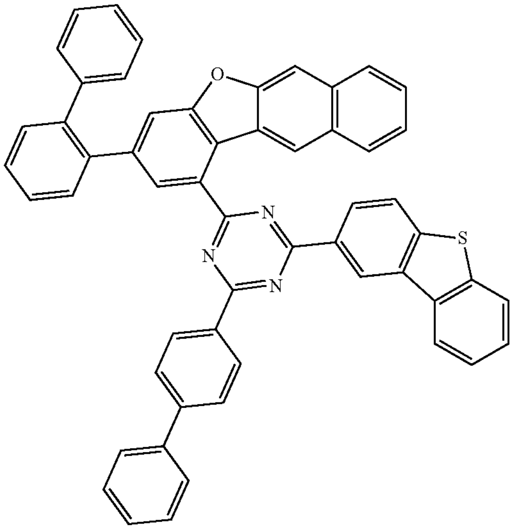
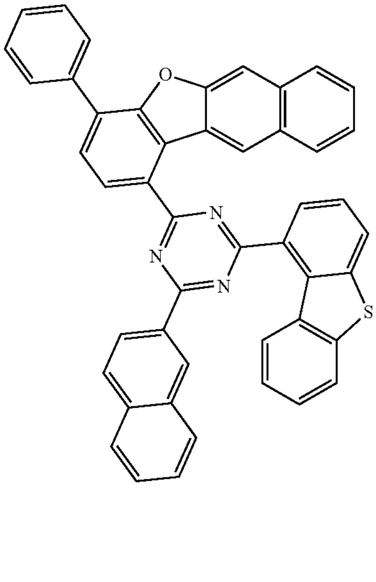
-continued
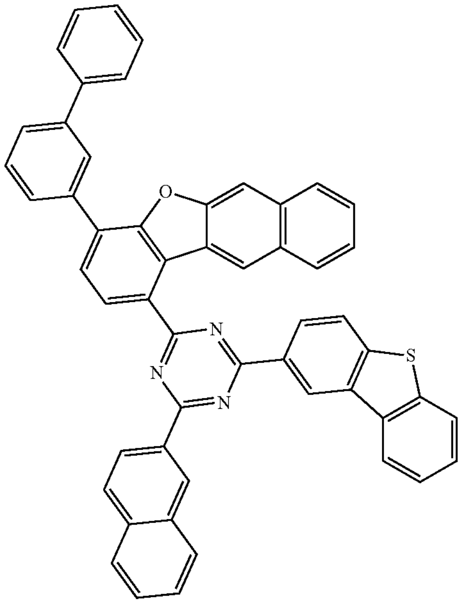
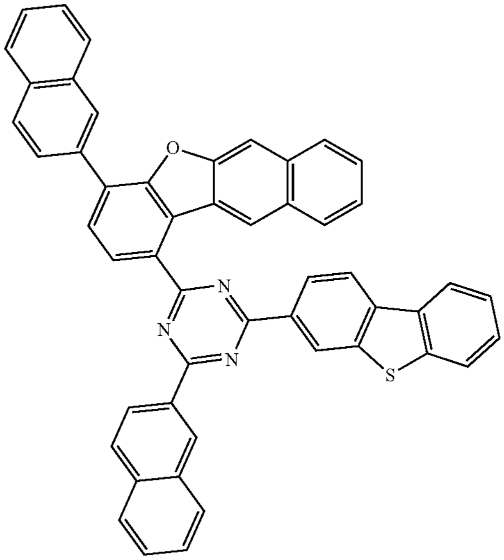

-continued
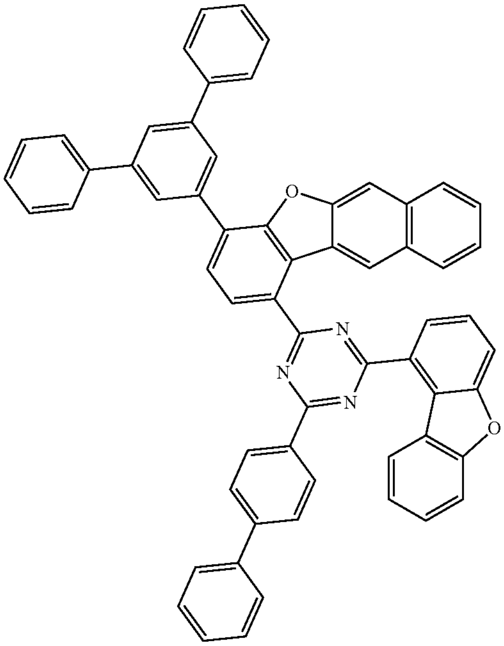
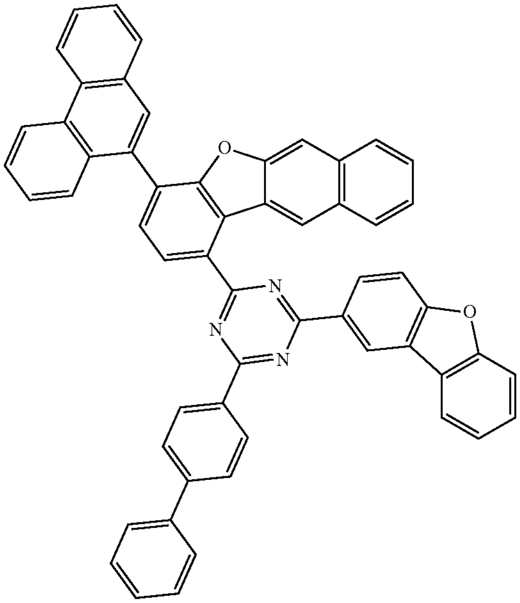
-continued
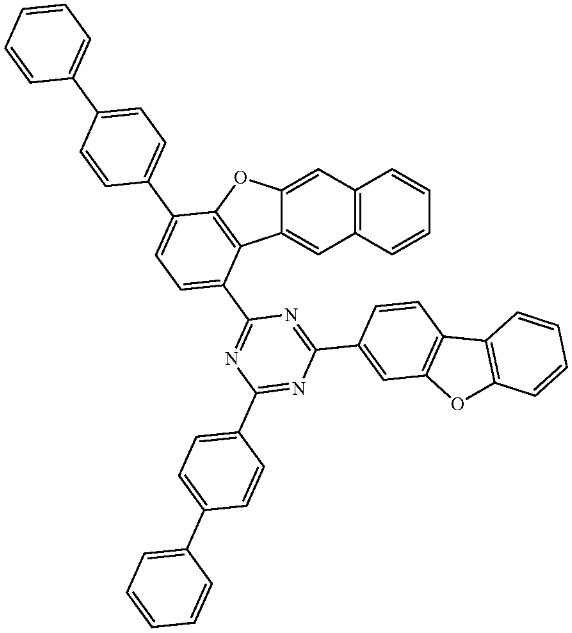
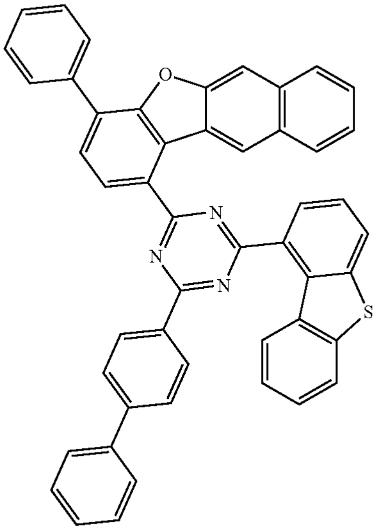

-continued
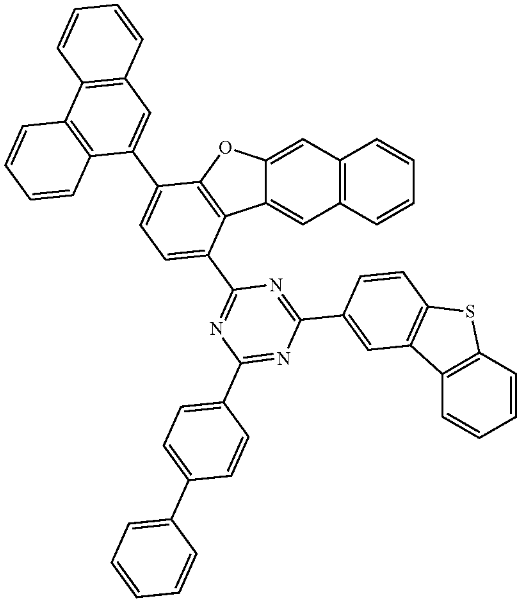
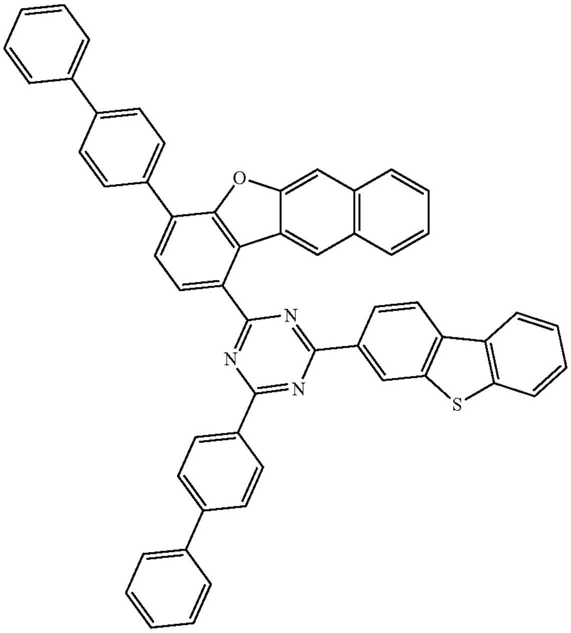
-continued
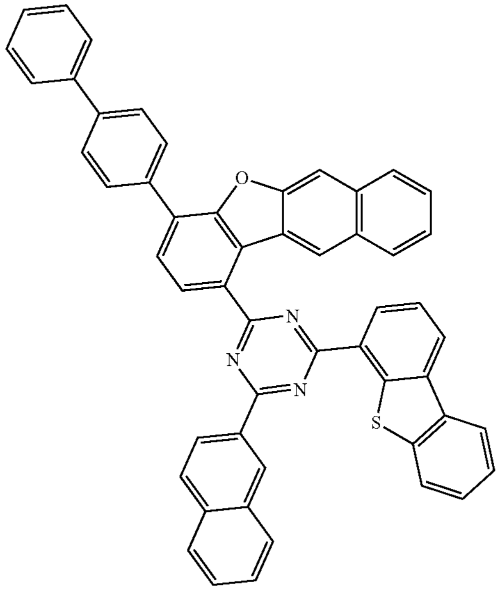
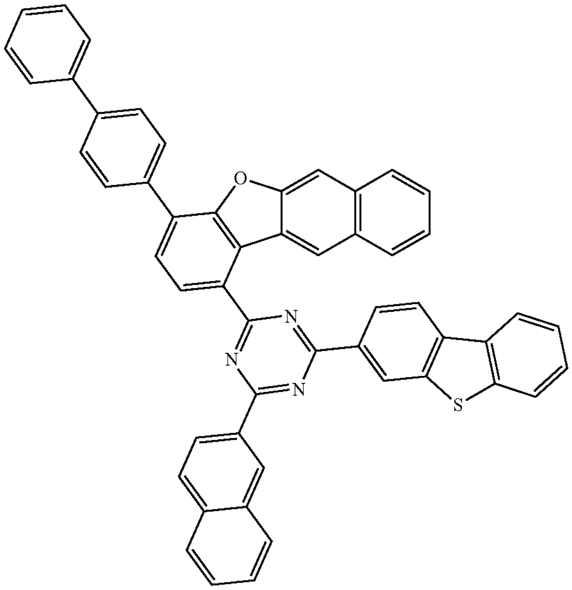
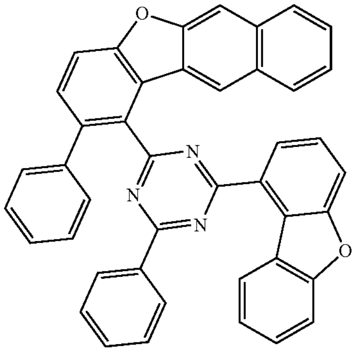

-continued
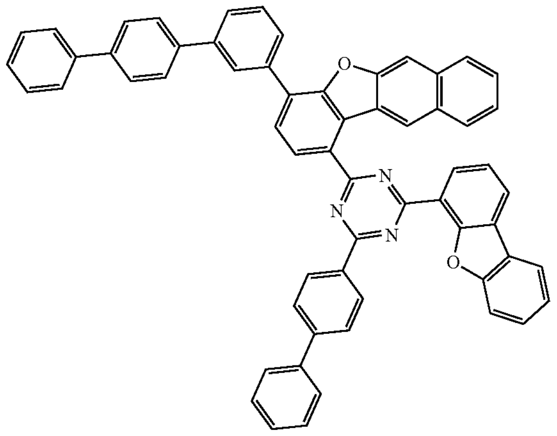
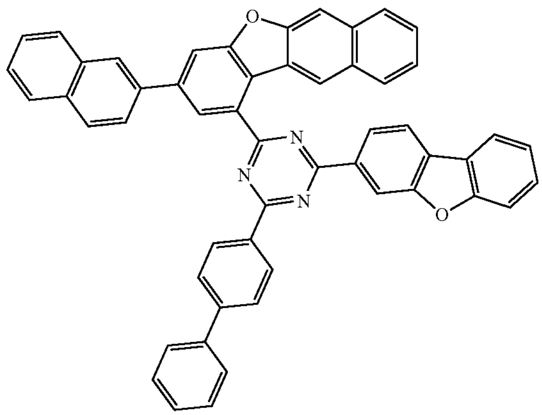
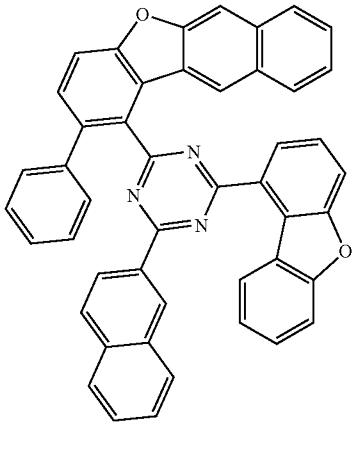
-continued
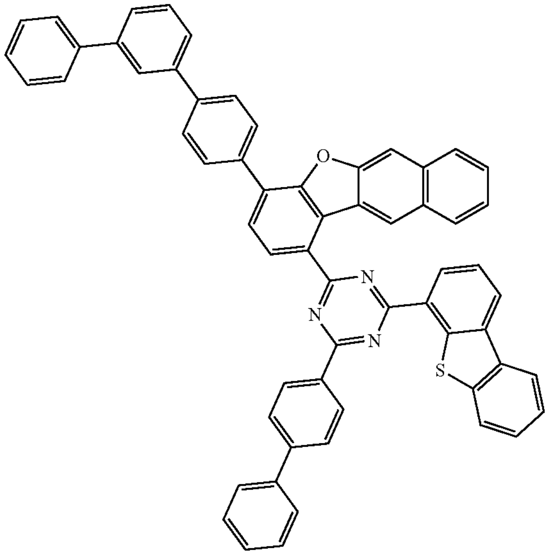
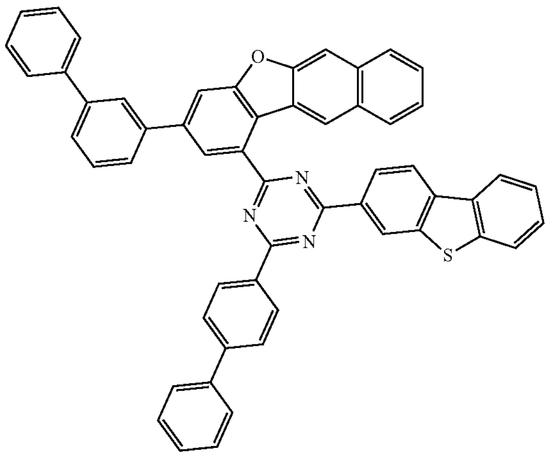
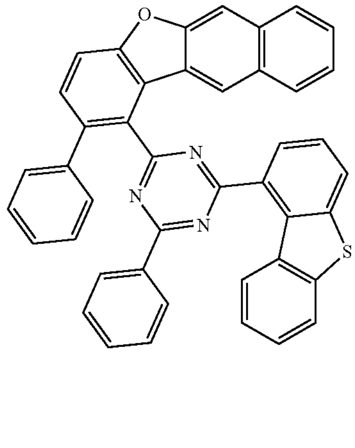

-continued
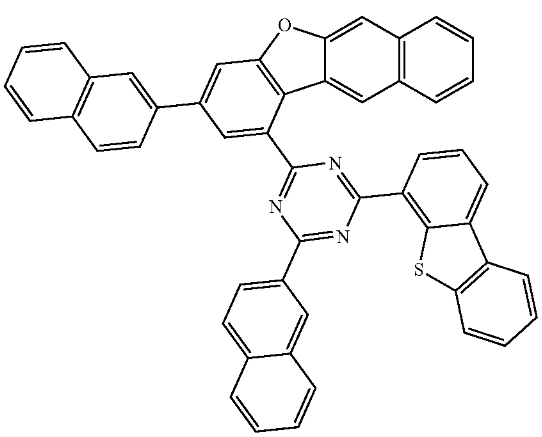
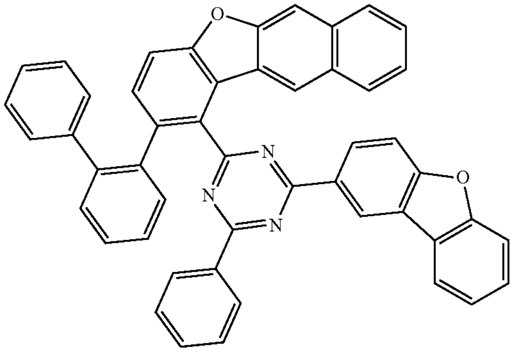
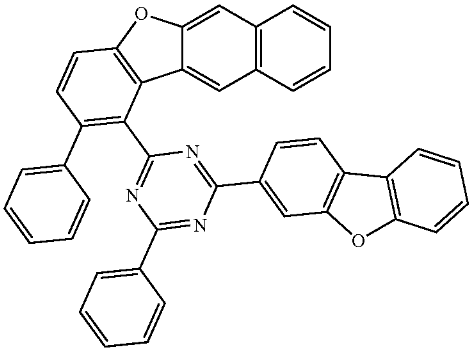
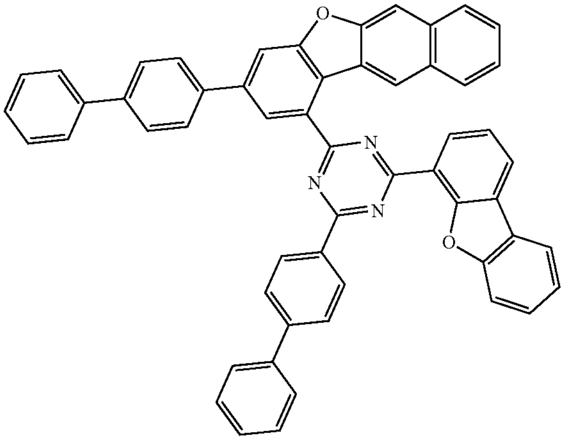
-continued
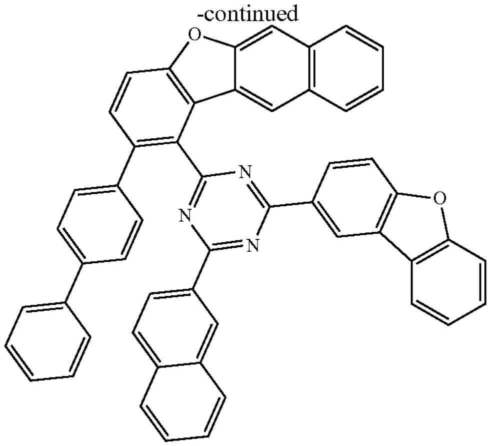
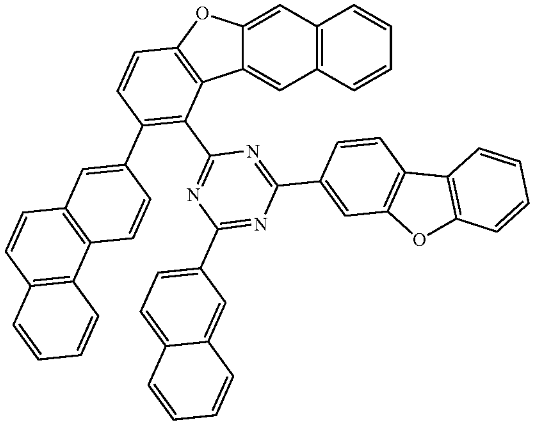
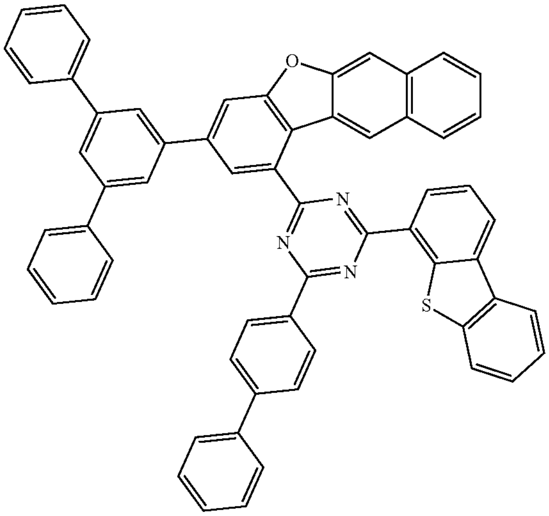
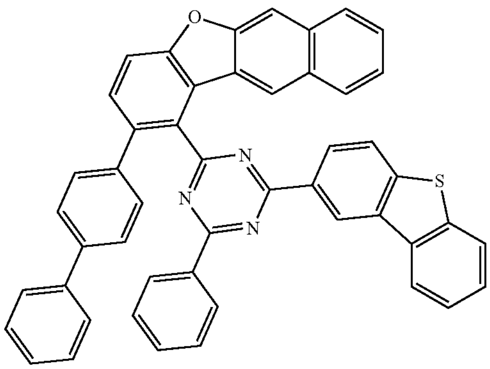

-continued
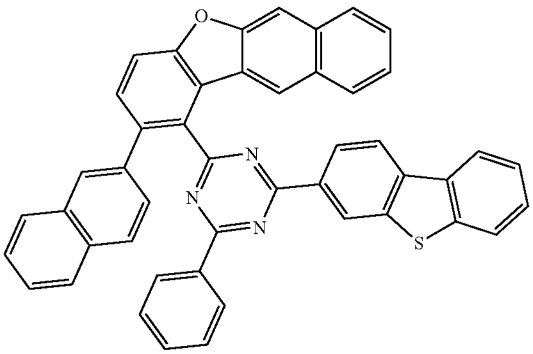
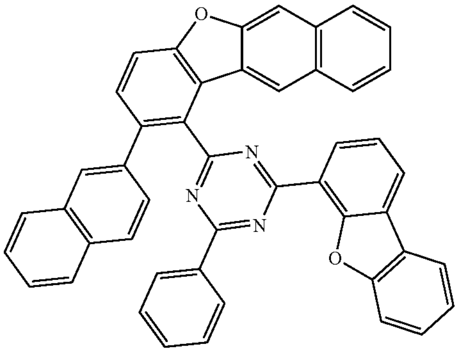
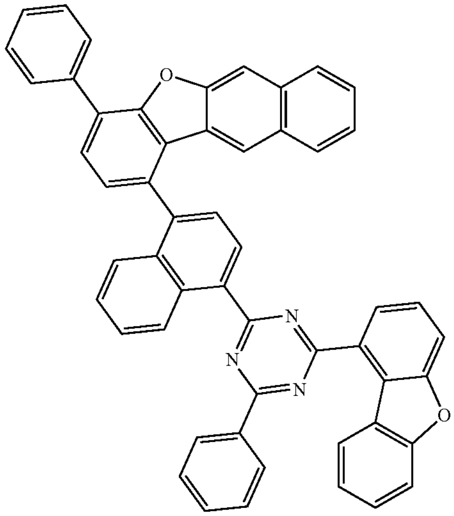
-continued
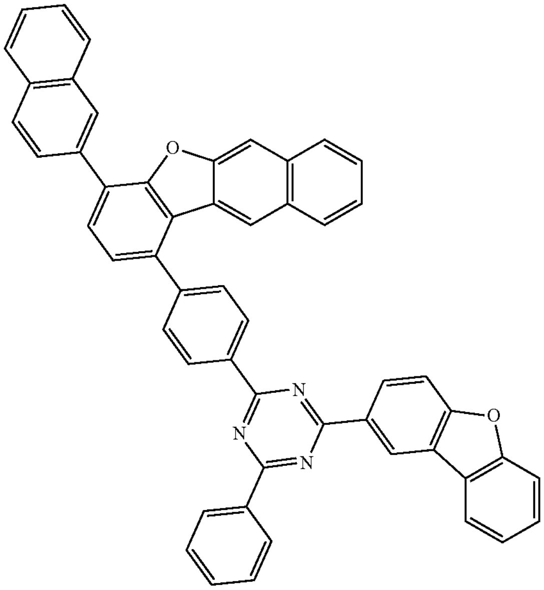
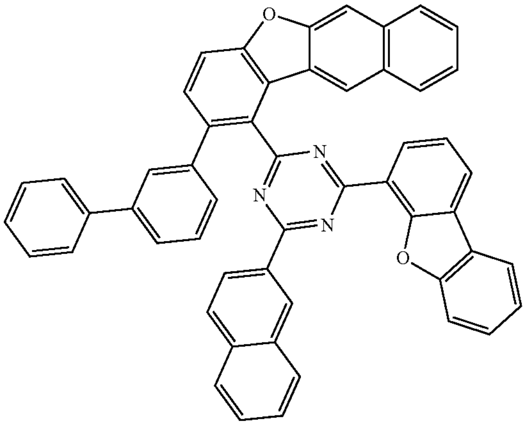
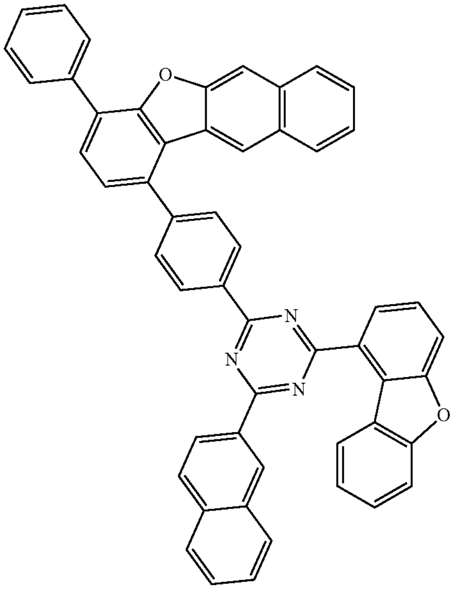

-continued
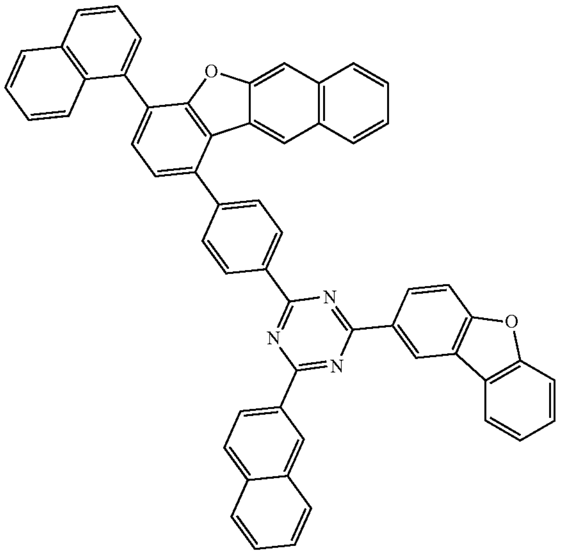
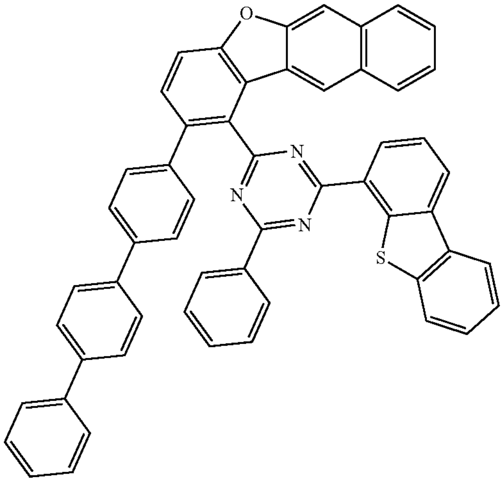
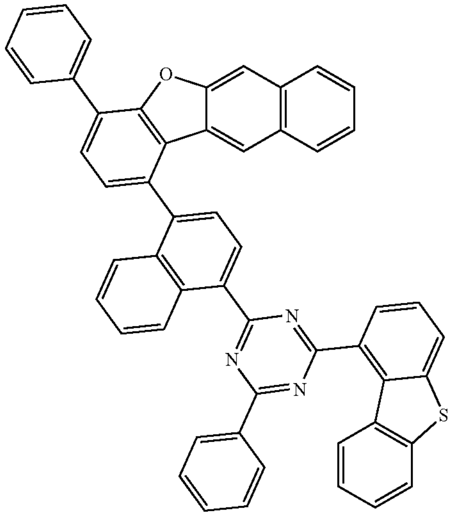
-continued
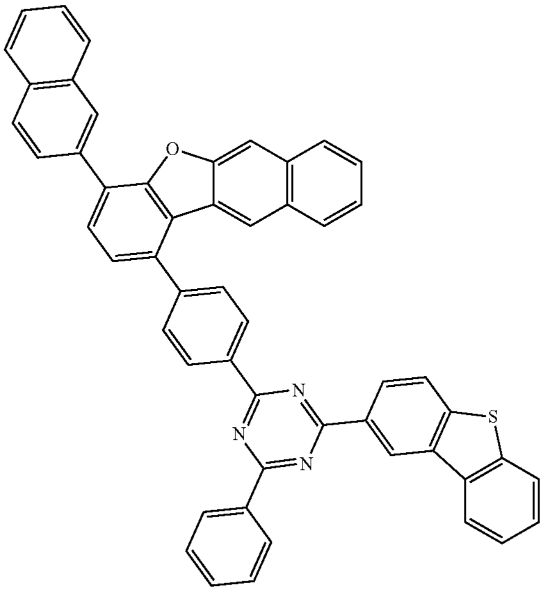
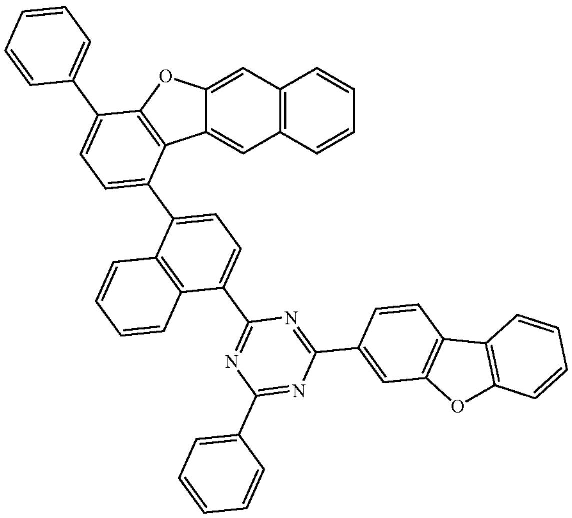
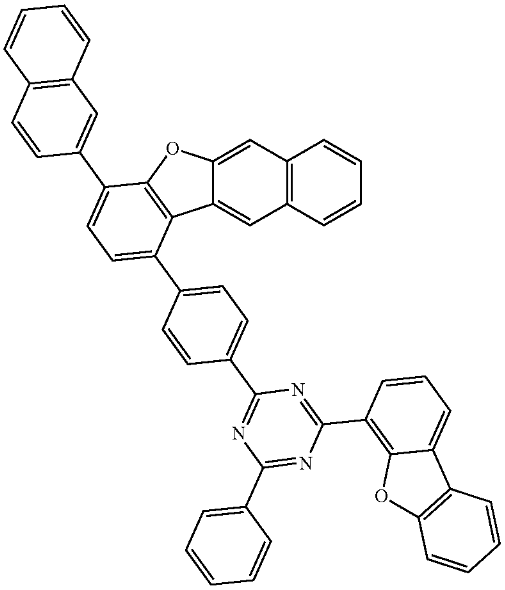

-continued
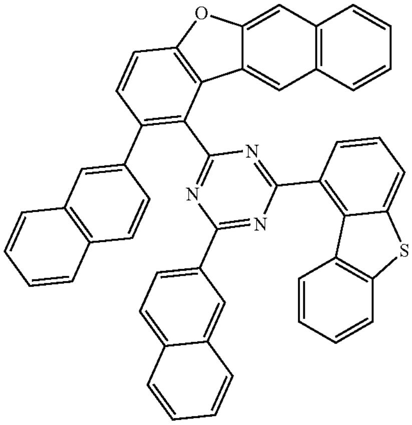
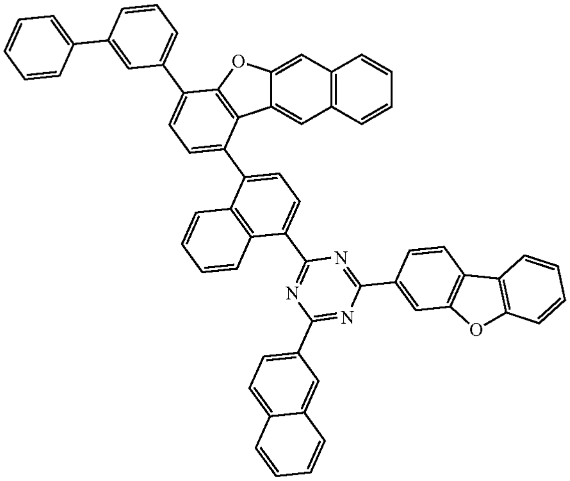
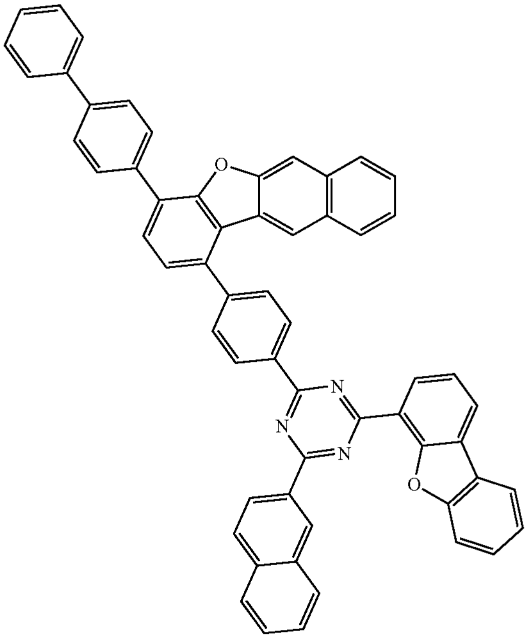
-continued
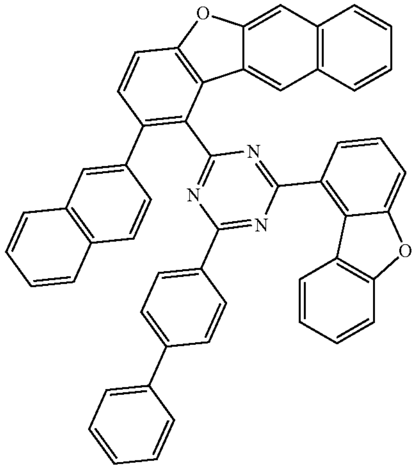
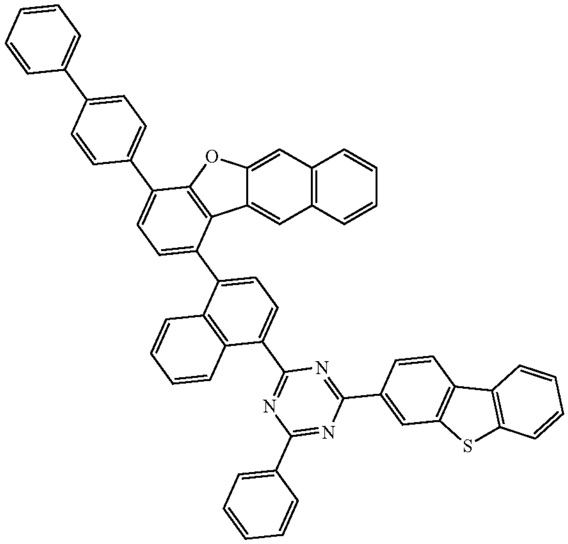
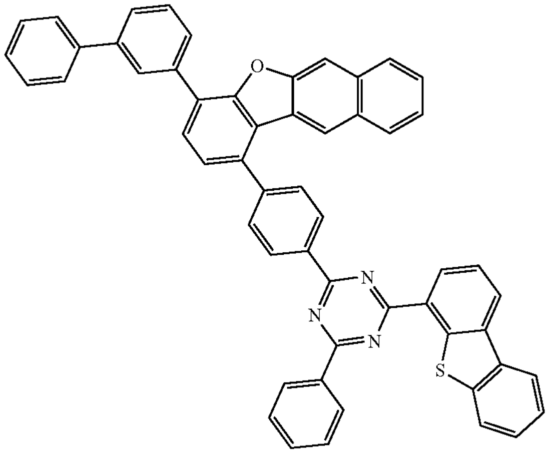

-continued
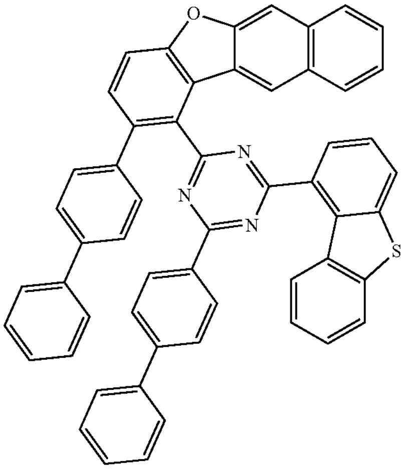
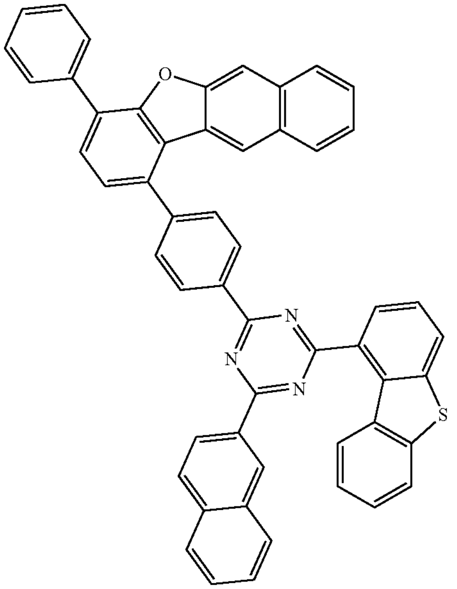
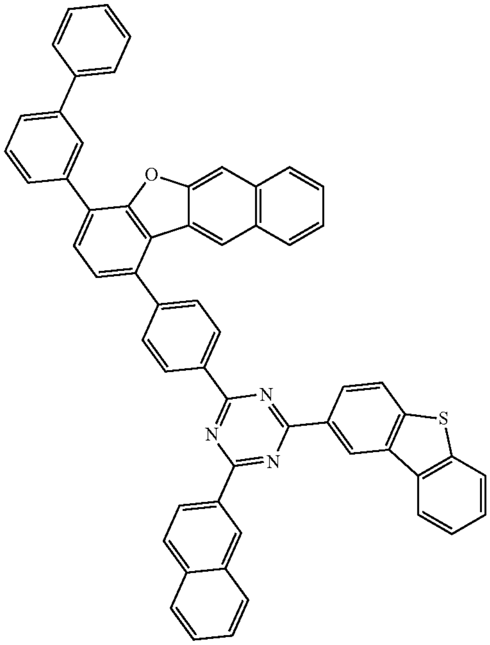
-continued
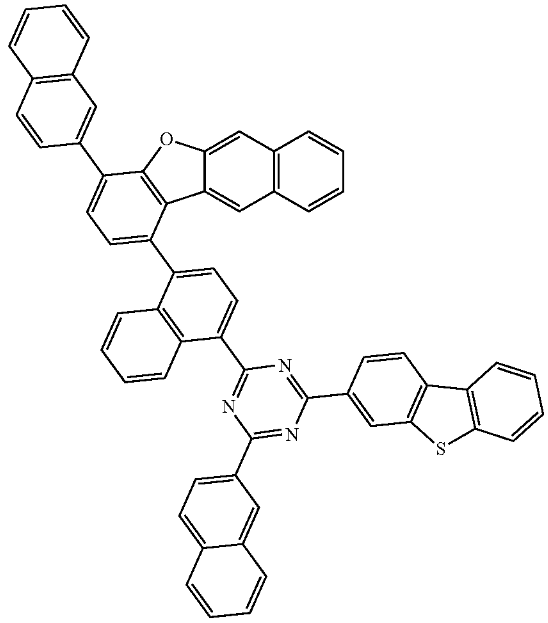
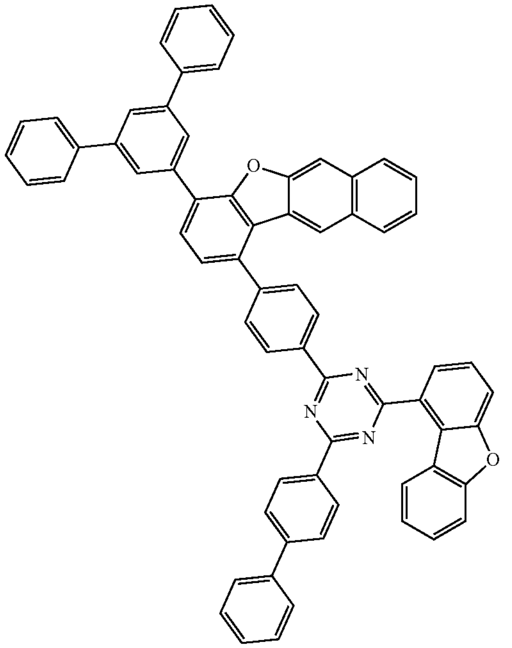

-continued
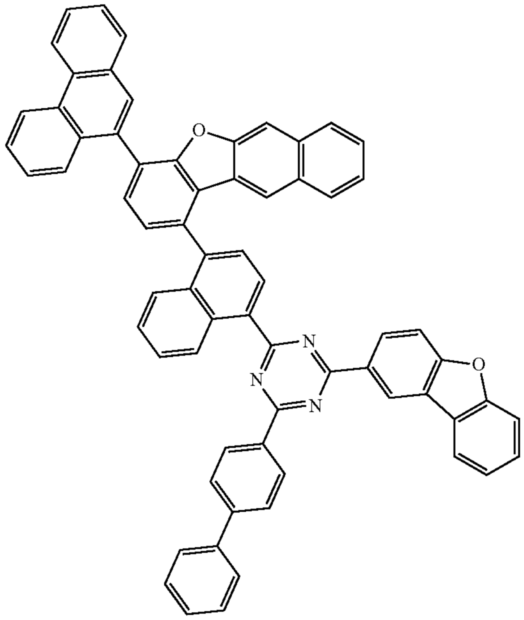
-continued
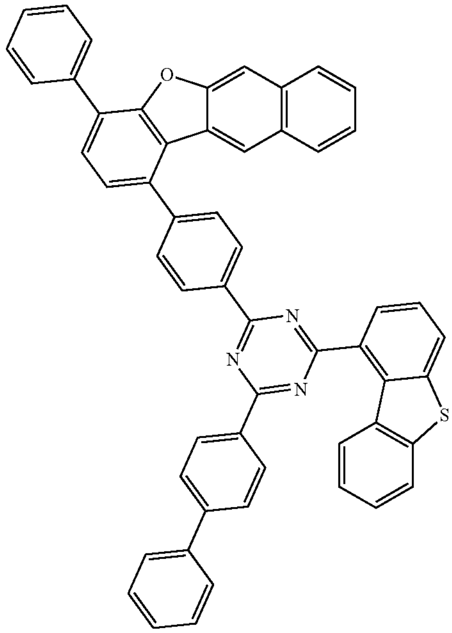
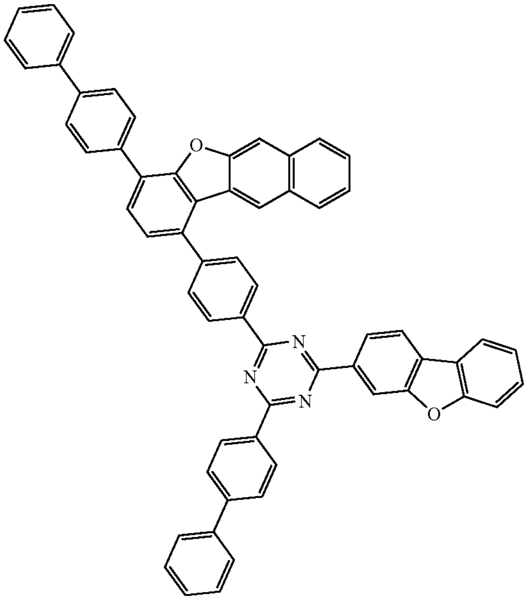
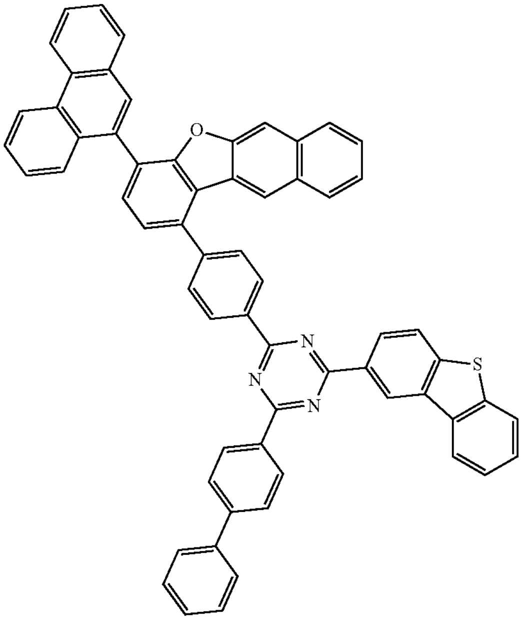

-continued
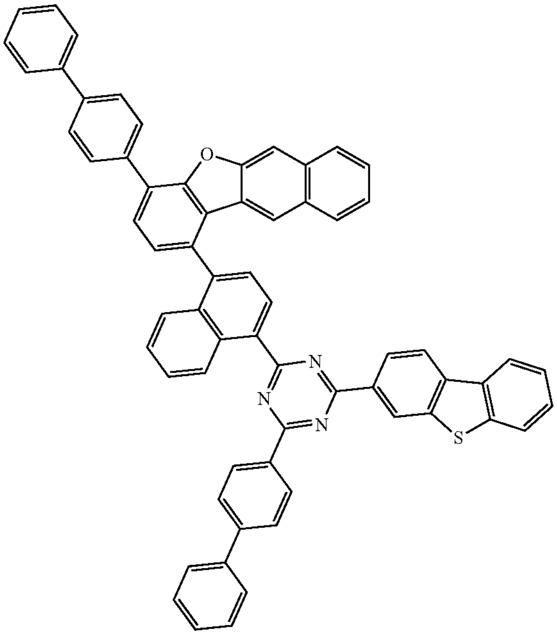 [SMILES: c1ccc(-c2ccc(-c3nc(-c4ccc5c(c4)sc4ccccc45)nc(-c4ccc(-c5ccc(-c6ccc(-c7ccccc7)cc6)c6oc7cc8ccccc8cc7c56)c5ccccc45)n3)cc2)cc1]
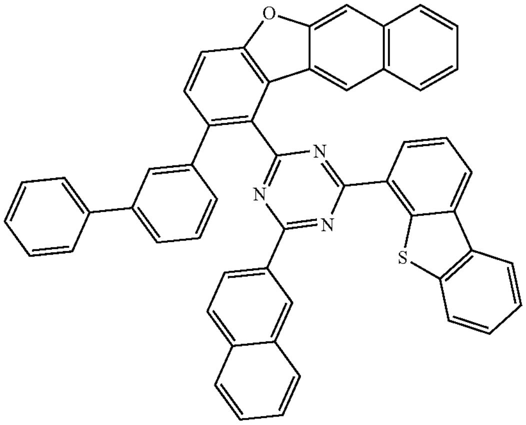
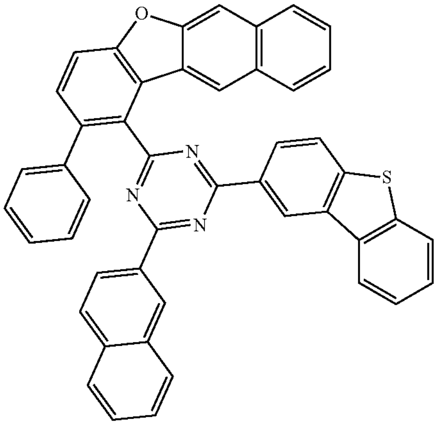
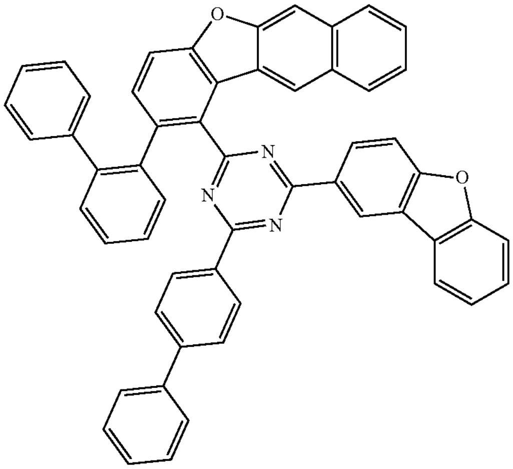
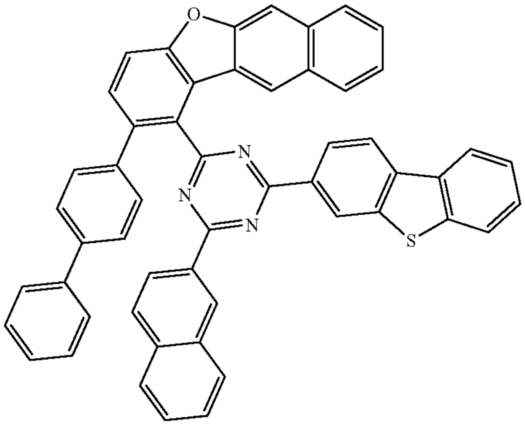
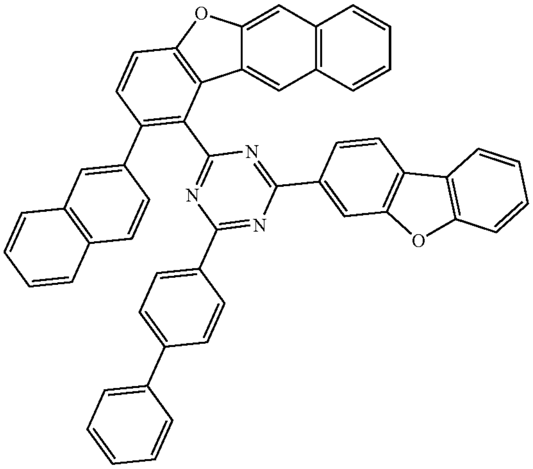
-continued -continued
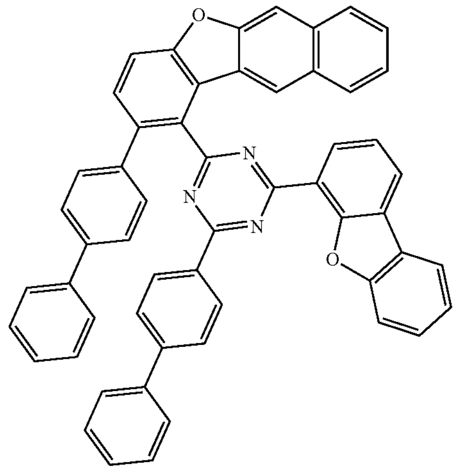
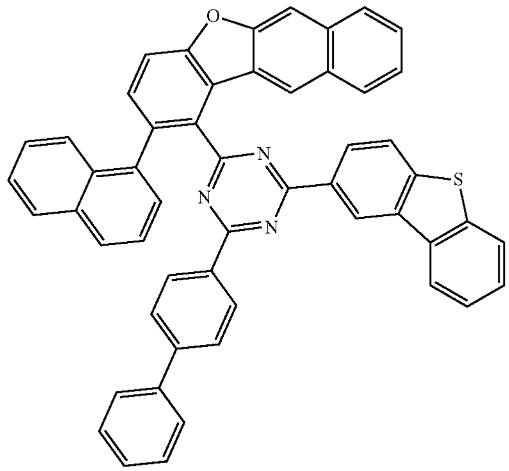
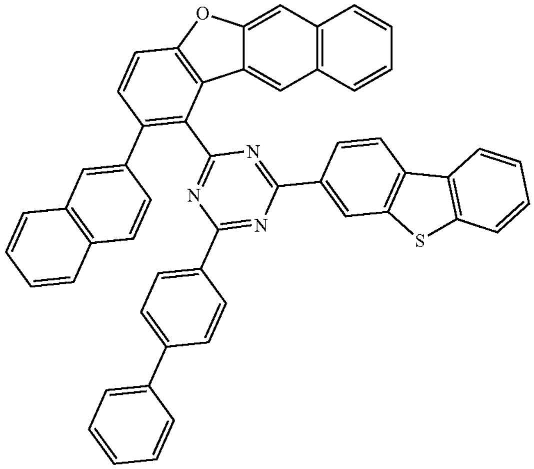
-continued
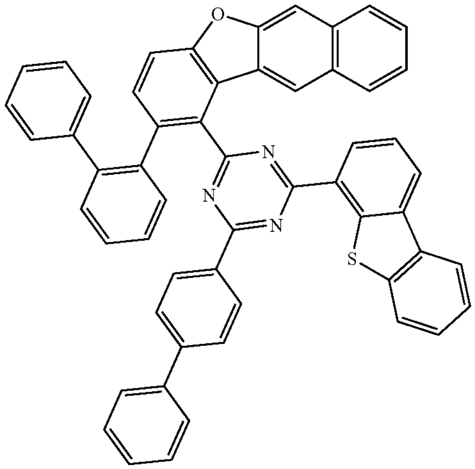
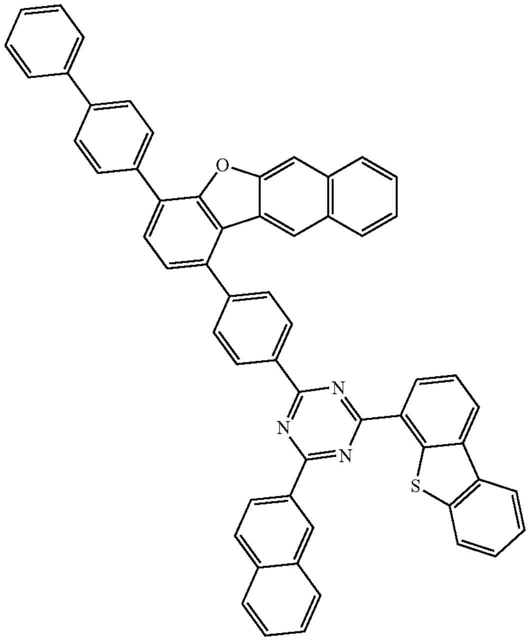
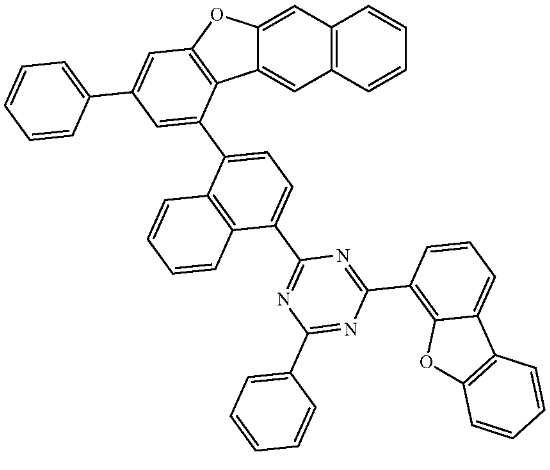

-continued
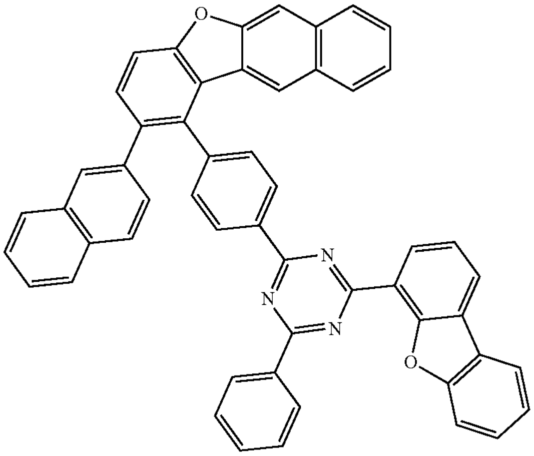
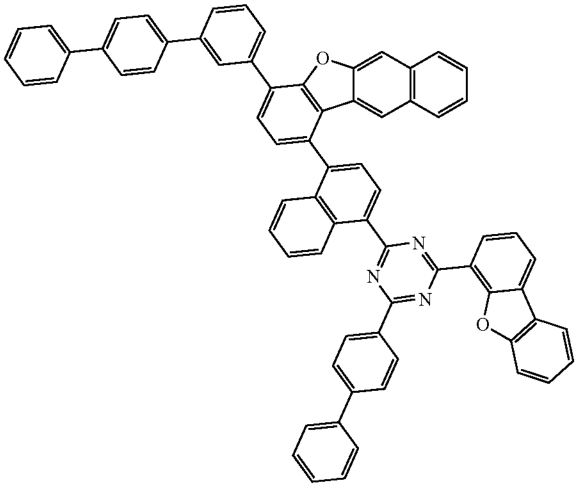
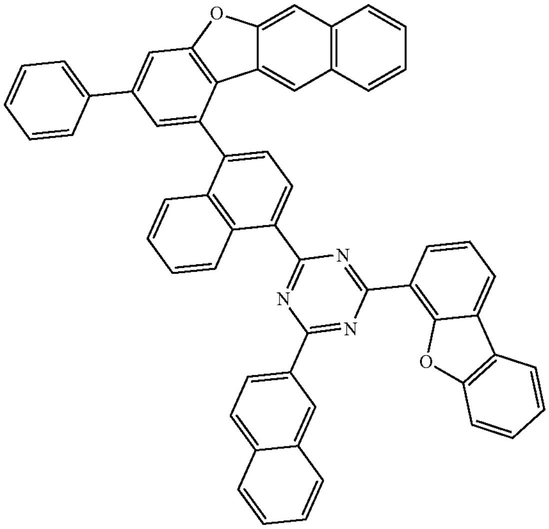
-continued
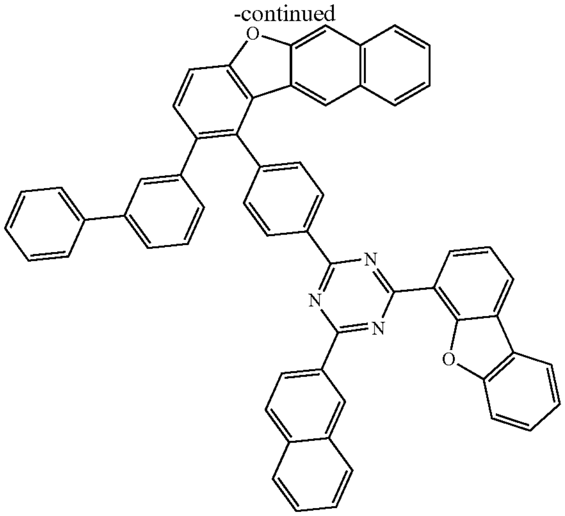
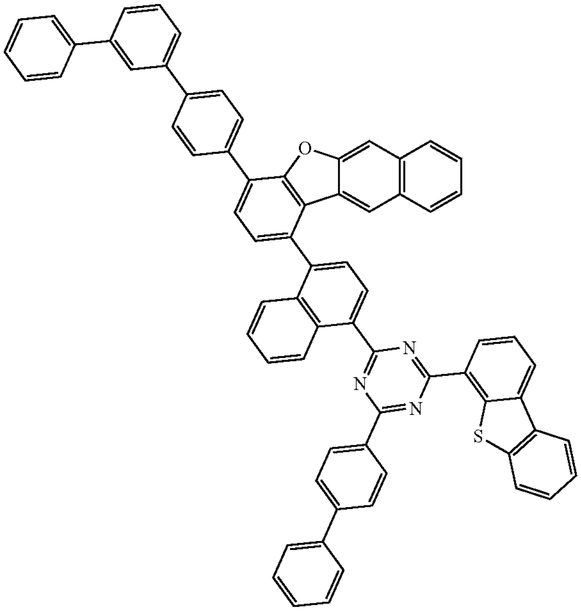
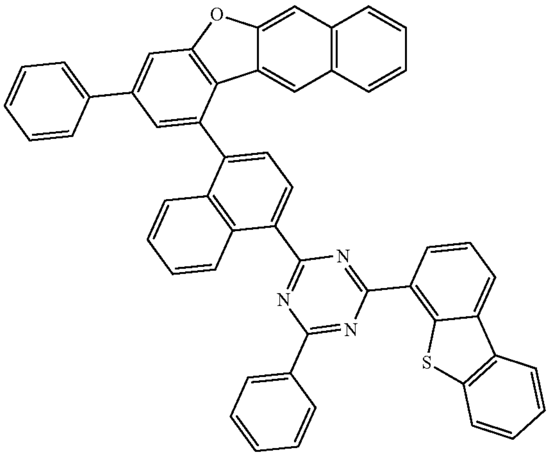

-continued
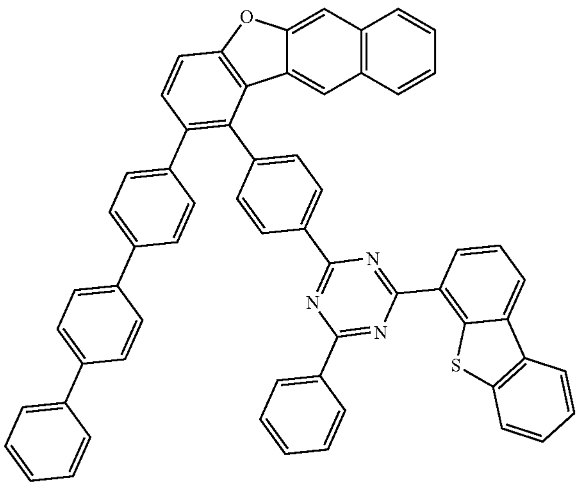
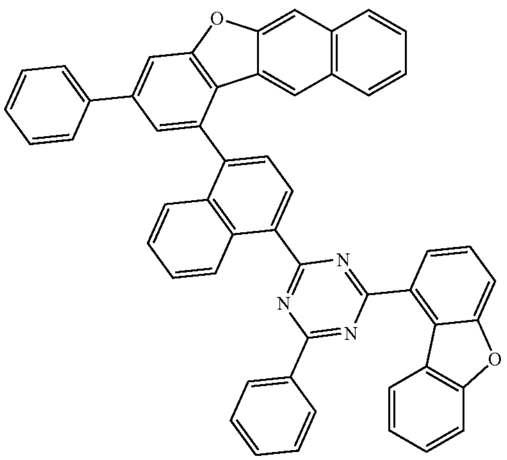
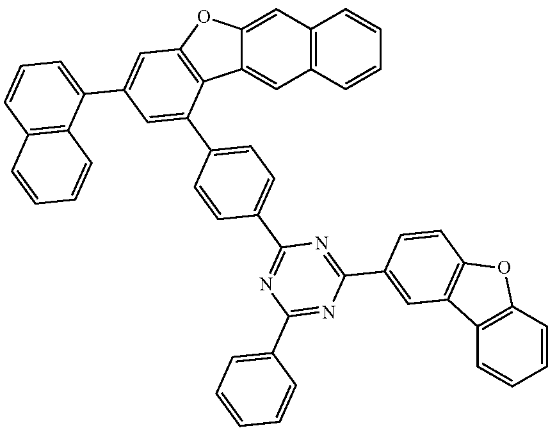
-continued
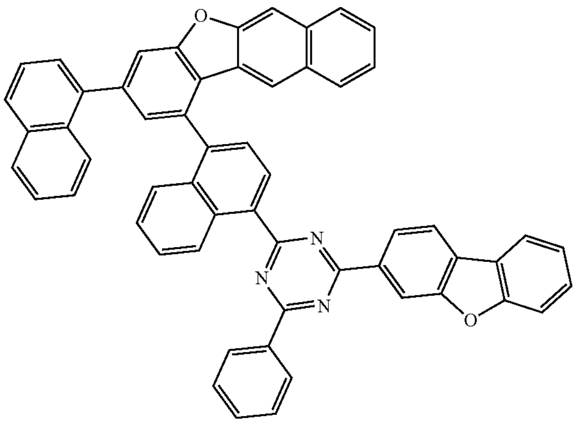
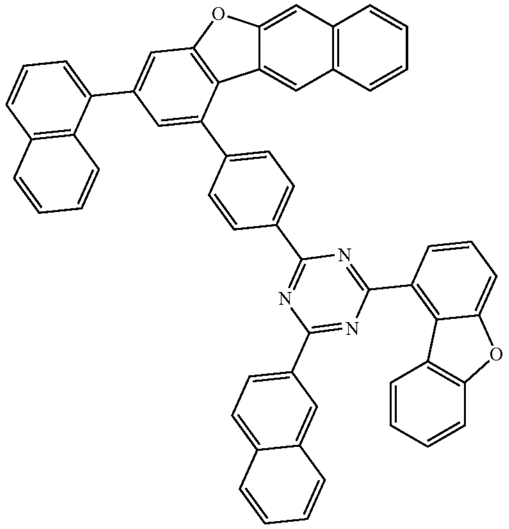
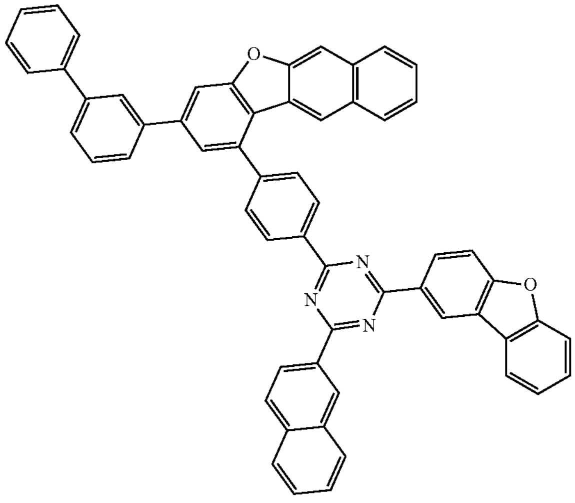

-continued
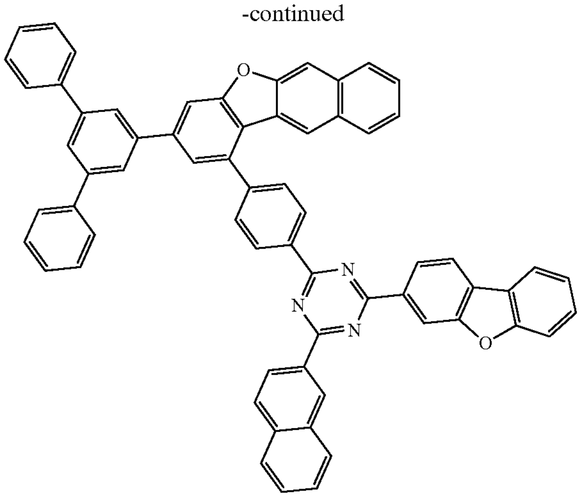
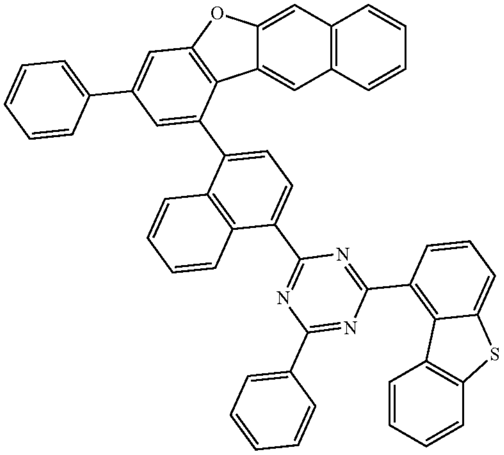
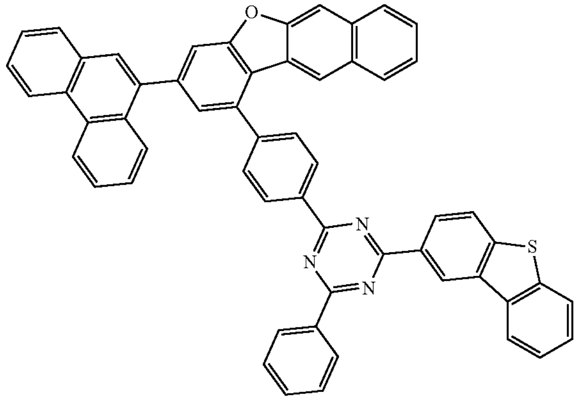
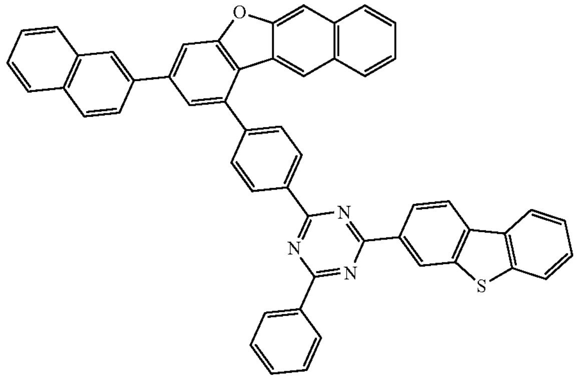
-continued
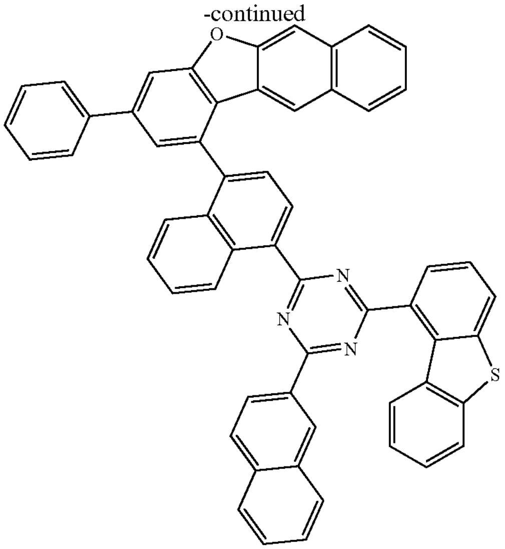
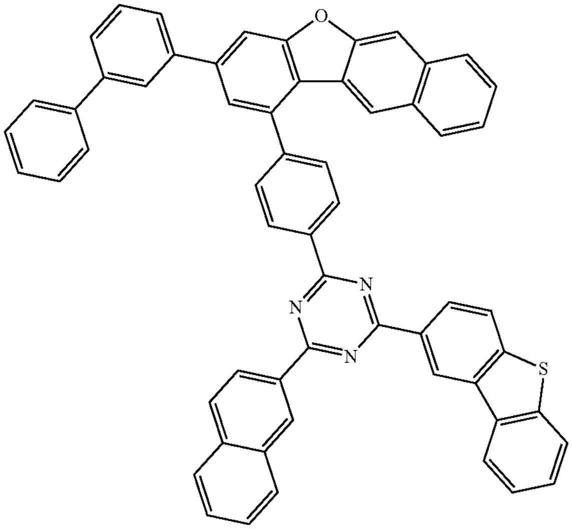
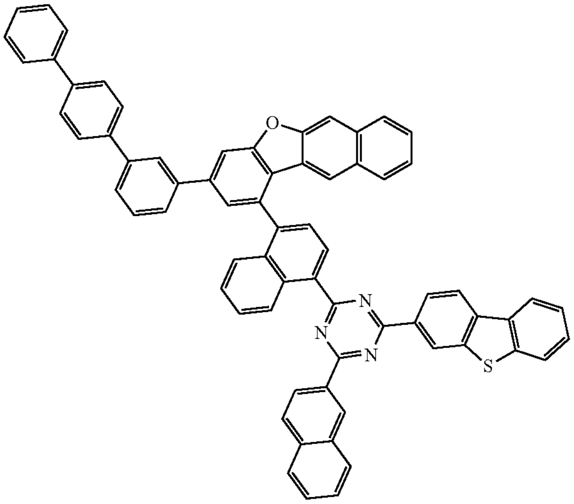

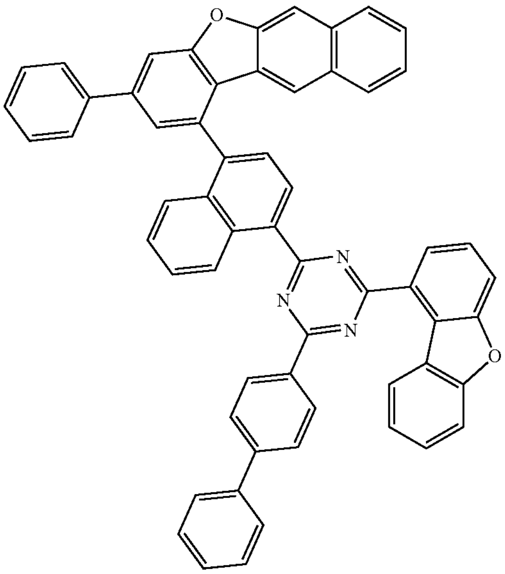
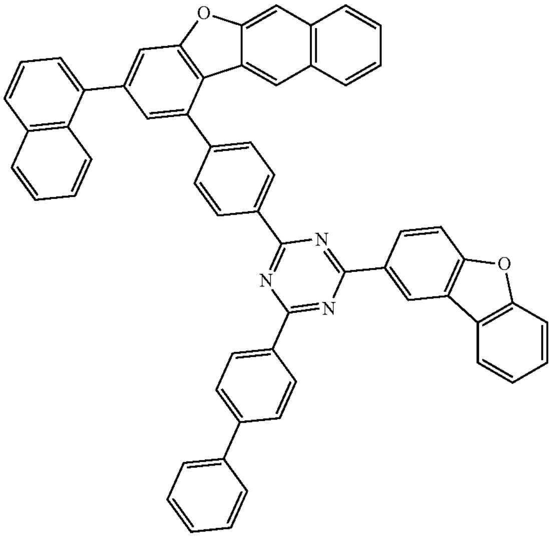
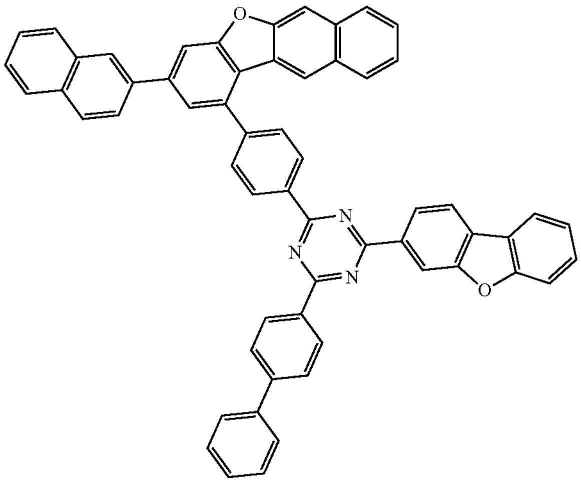
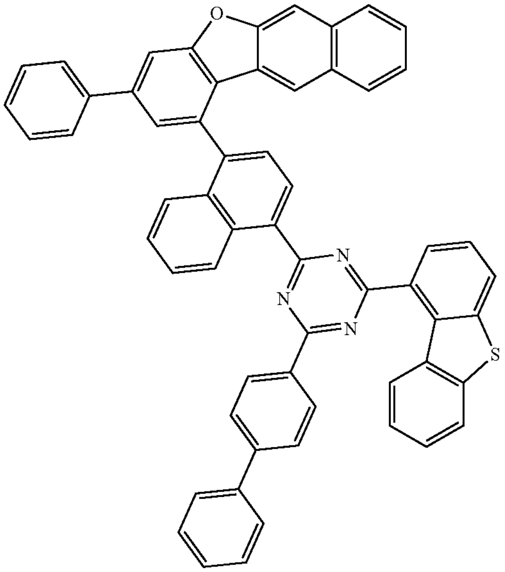
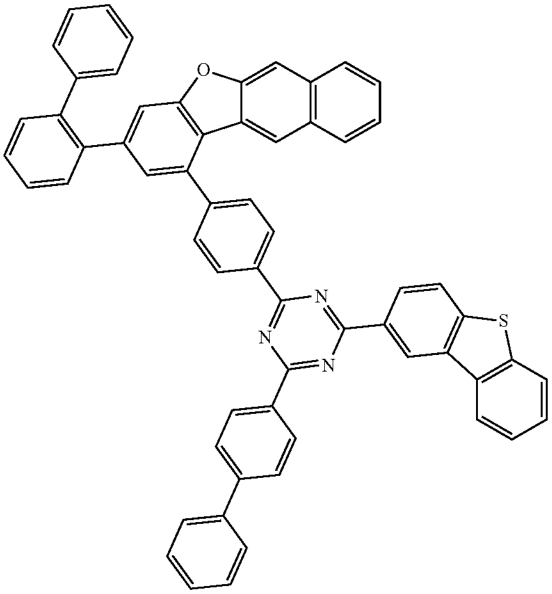
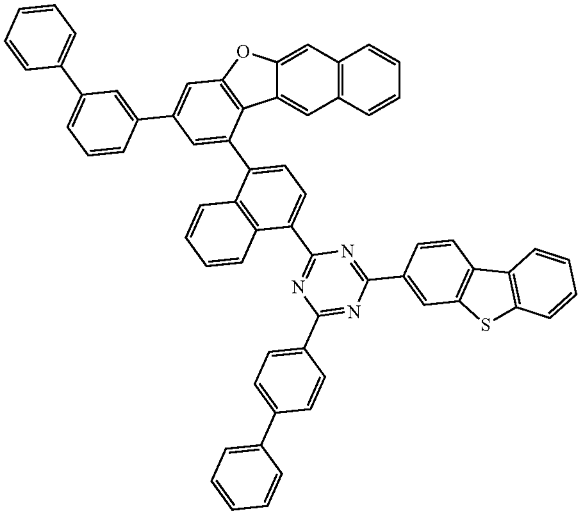

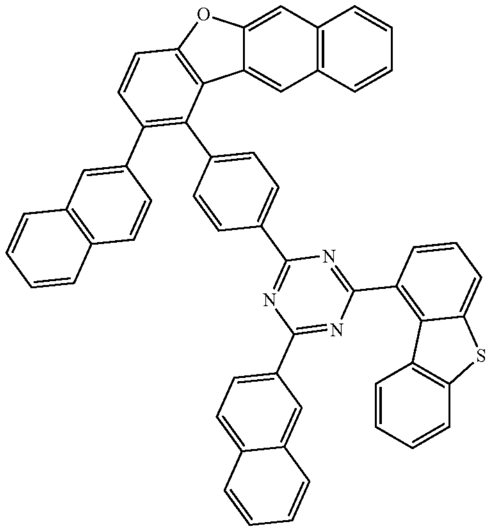
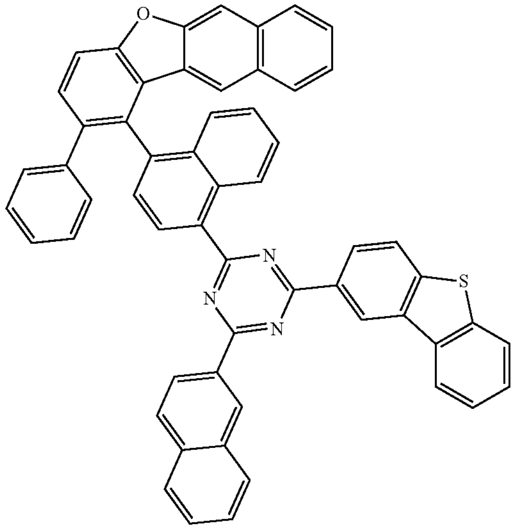
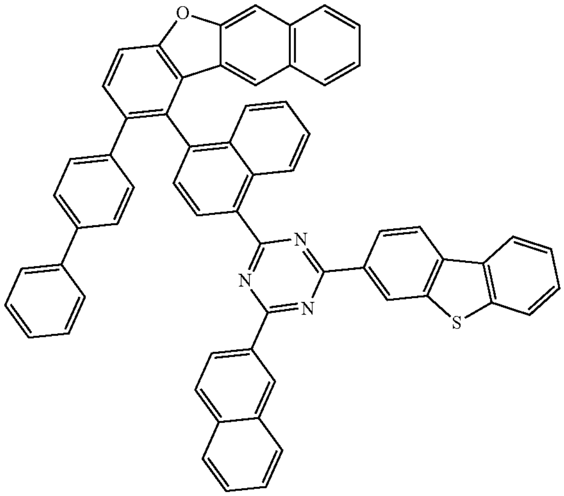
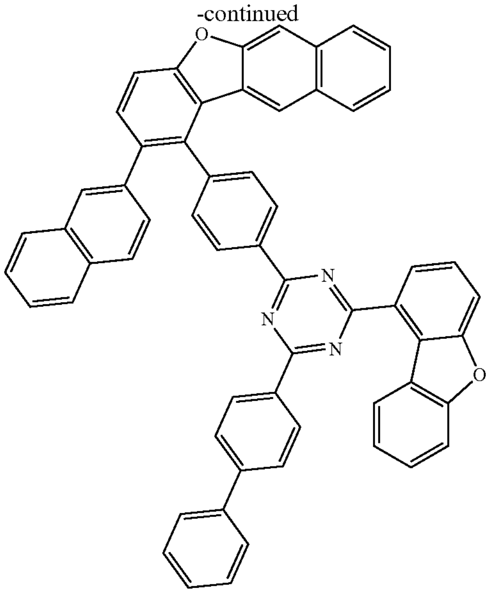
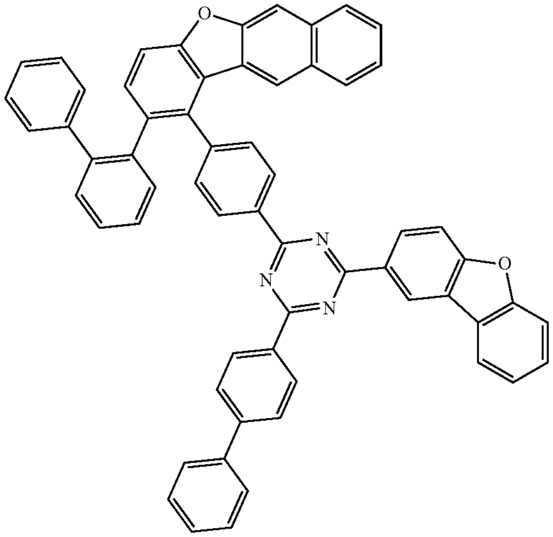
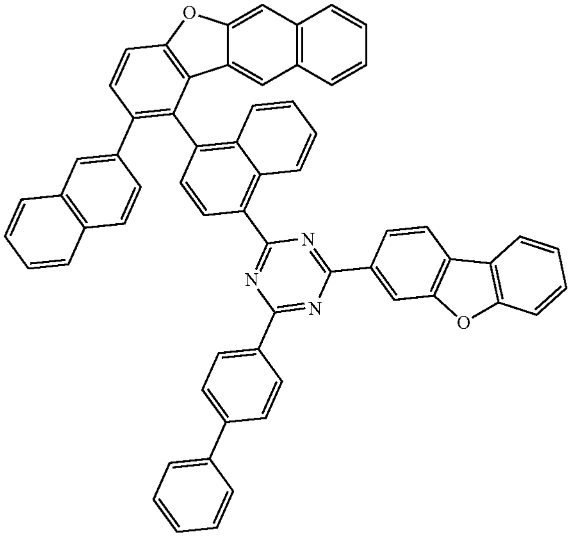

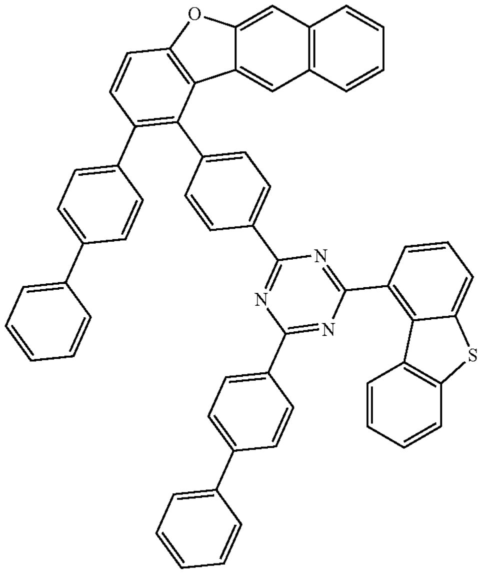
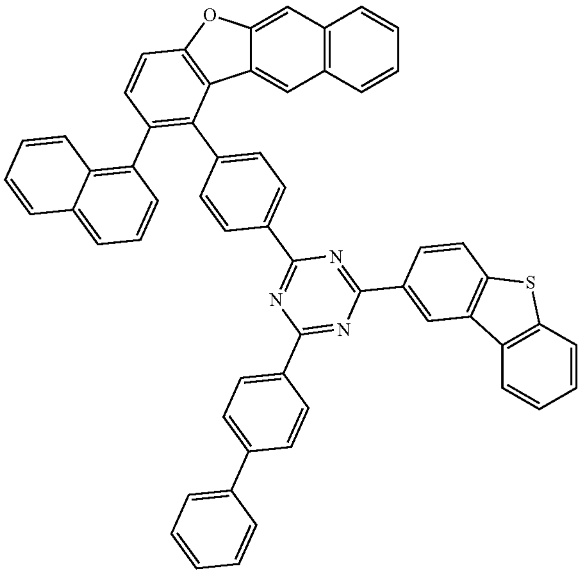
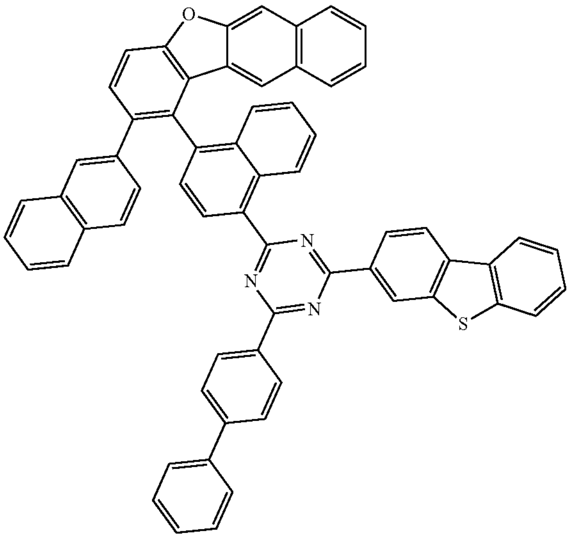
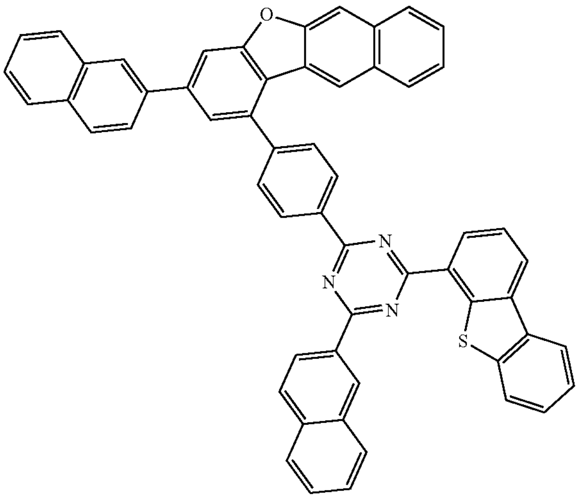
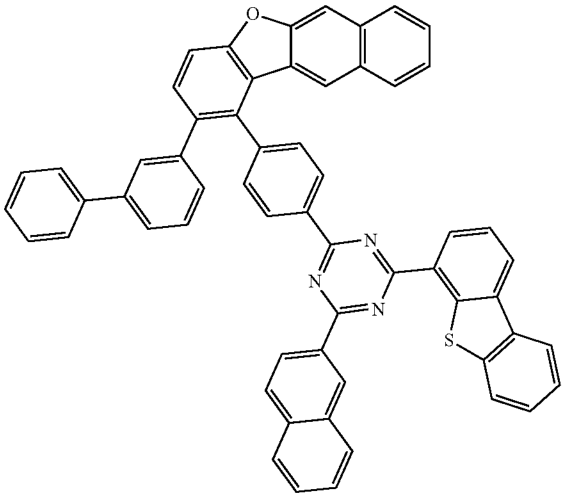
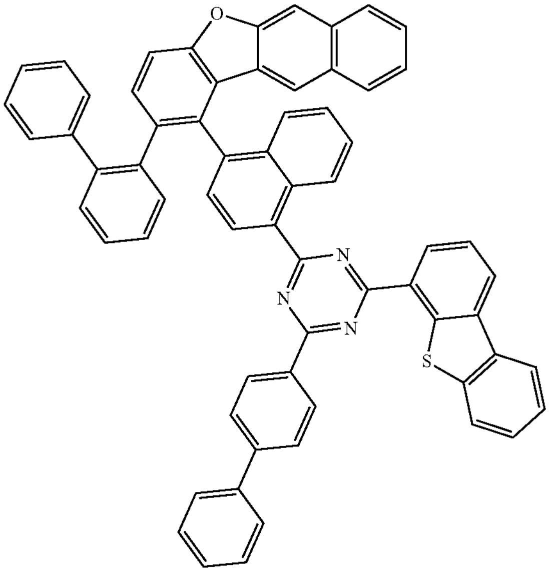

-continued

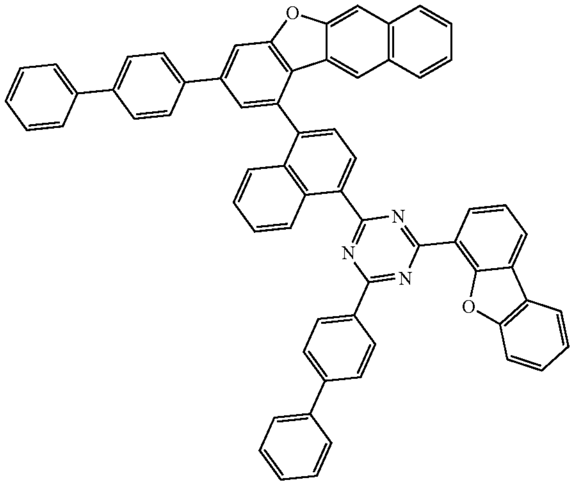

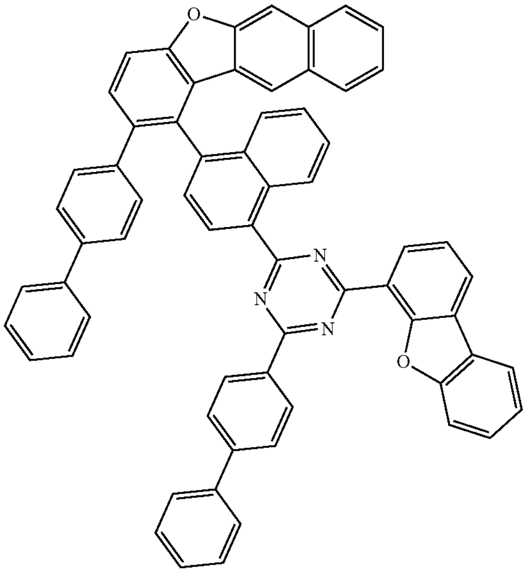

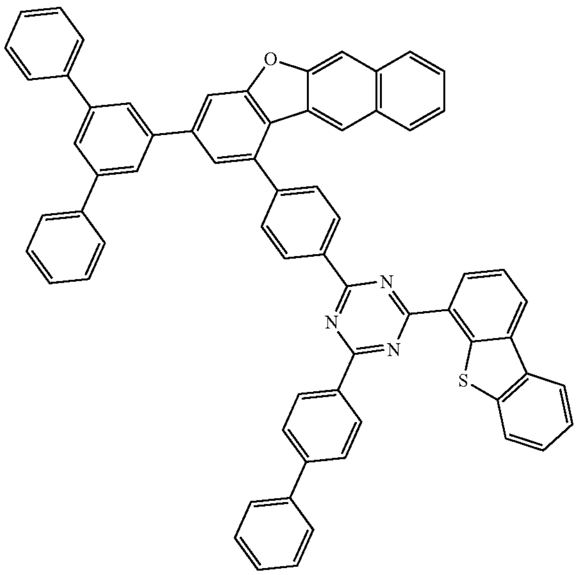

-continued

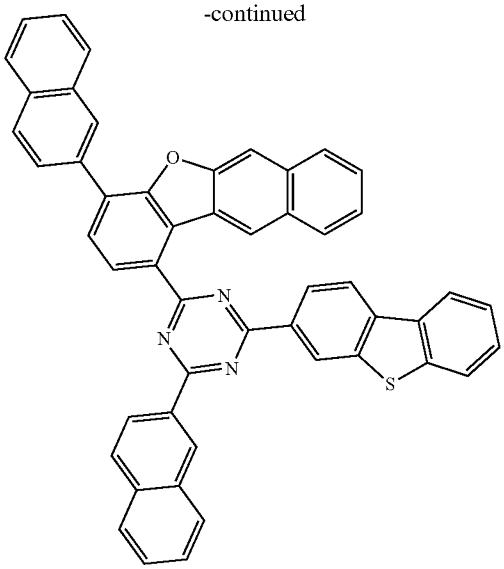

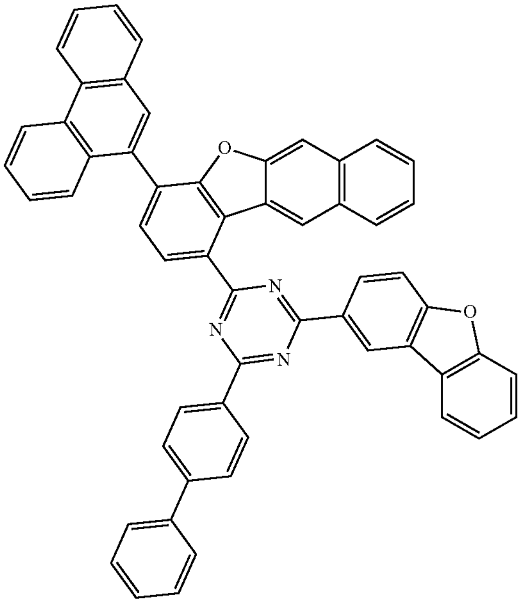

.

4. An organic light emitting device comprising: a first electrode; a second electrode that is provided to face the first electrode; and an organic material layer including one or more layers that are provided between the first electrode and the second electrode, wherein one or more layers of the organic material layer include the compound according to claim 1.

5. The organic light emitting device of claim 4, wherein the organic material layer comprises a light emitting layer, and the light emitting layer comprises the compound as a host.

6. The organic light emitting device of claim 4, wherein the organic material layer comprises a light emitting layer, the light emitting layer comprises the compound as a first host and further comprises a compound represented by the following Chemical Formula 4 as a second host:

[Chemical formula 4]

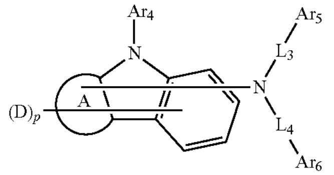

wherein in Chemical Formula 4,

A is a substituted or unsubstituted naphthalene ring, $Ar_4$ is a substituted or unsubstituted $C_{6-60}$ aryl, $L_3$ and $L_4$ are each independently a single bond, or a substituted or unsubstituted $C_{6-60}$ arylene, $Ar_5$ and $Ar_6$ are each independently a substituted or unsubstituted $C_{6-60}$ aryl, a substituted or unsubstituted $C_{2-60}$ heteroaryl containing one or more heteroatoms selected from the group consisting of N, O and S, or adamantyl, and p is an integer of 0 to 9.

7. The organic light emitting device of claim 6, wherein the compound of Chemical Formula 4 is represented by any one of the following Chemical Formulas 4-1 to 4-3:

[Chemical Formula 4-1]

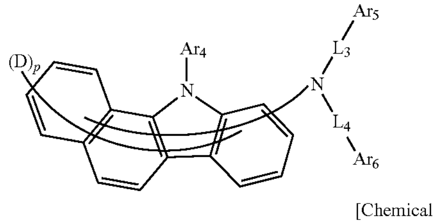

[Chemical Formula 4-2]

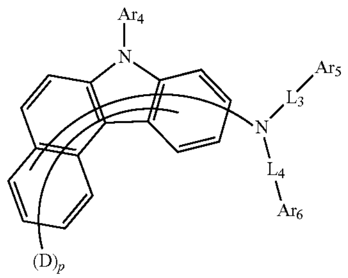

[Chemical Formula 4-3]

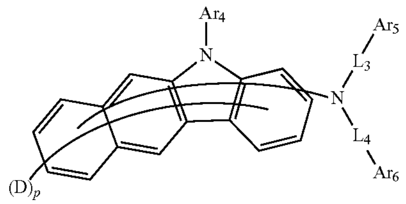

wherein in Chemical Formulas 4-1 to 4-3, $Ar_4$ to $Ar_6$, $L_3$, $L_4$, and p are the same as defined in claim 6.

8. The organic light emitting device of claim 6, wherein $Ar_4$ is phenyl, biphenylyl, or naphthyl, each of which is unsubstituted or substituted with one or more tert-butyl or phenyl.

9. The organic light emitting device of claim 6, wherein $L_3$ and $L_4$ are each independently a single bond, phenylene or naphthalenediyl, each of which is independently unsubstituted or substituted with one or more phenyl.

10. The organic light emitting device of claim 6, wherein $Ar_5$ and $Ar_6$ are each independently phenyl, biphenylyl, terphenylyl, naphthyl, dibenzofuranyl, dibenzothiophenyl, fluorenyl, 9,9-dimethylfluorenyl, or adamantyl, each of which is independently unsubstituted or substituted with one or more tert-butyl or phenyl.

11. The organic light emitting device of claim 6, wherein the compound represented by Chemical Formula 4 is any one selected from the group consisting of the following compounds:

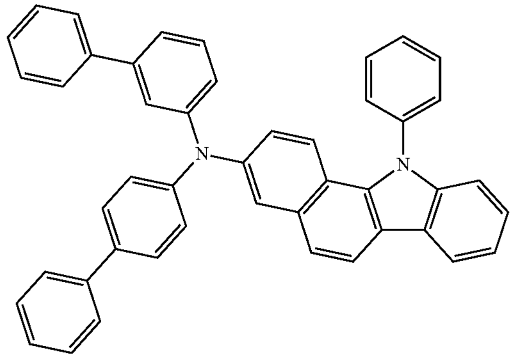

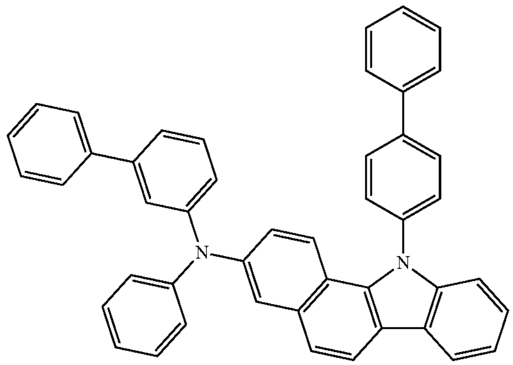

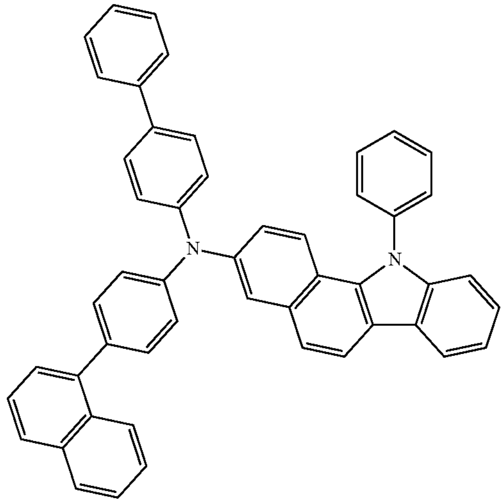

-continued
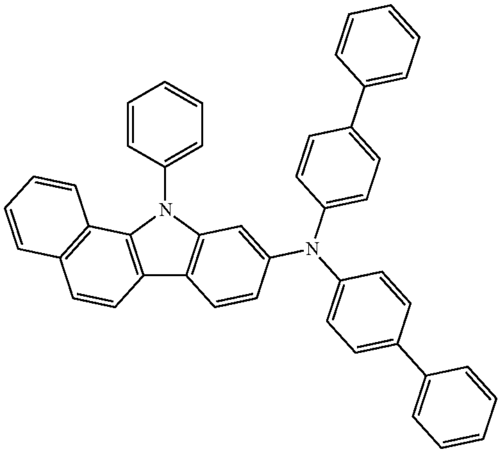
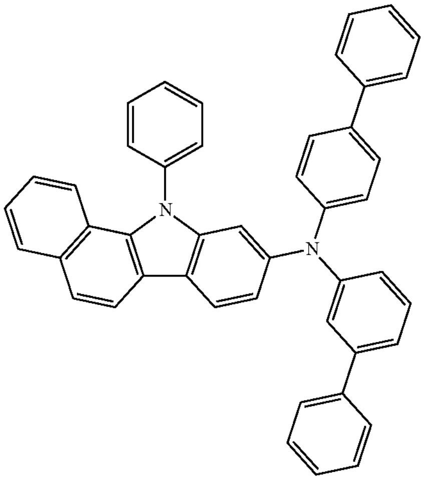
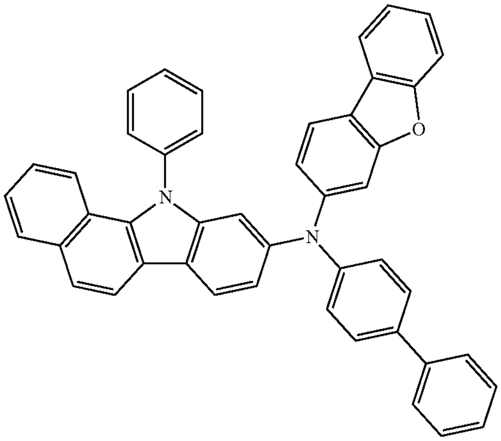
-continued
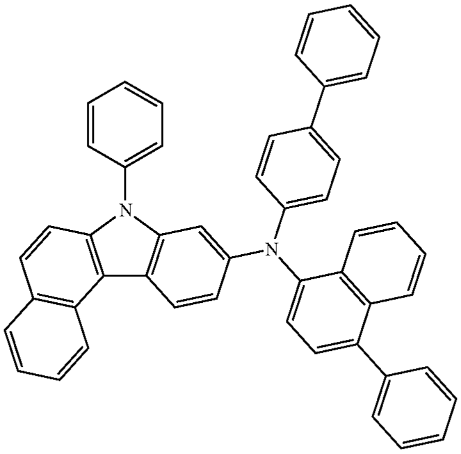
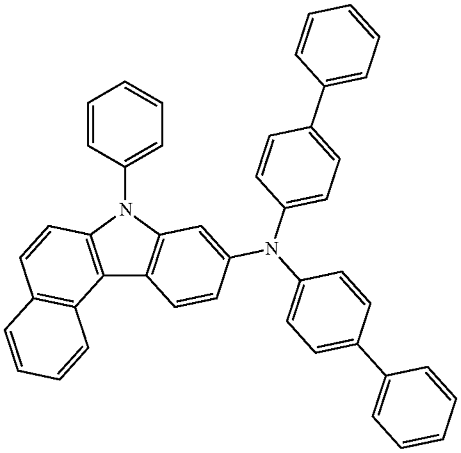
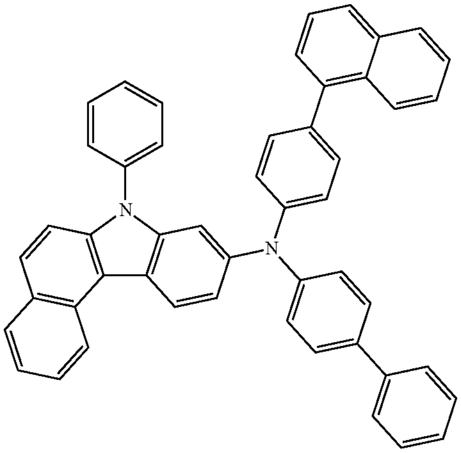

-continued
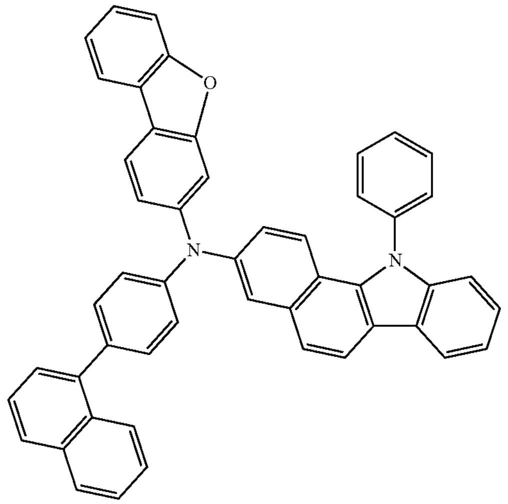
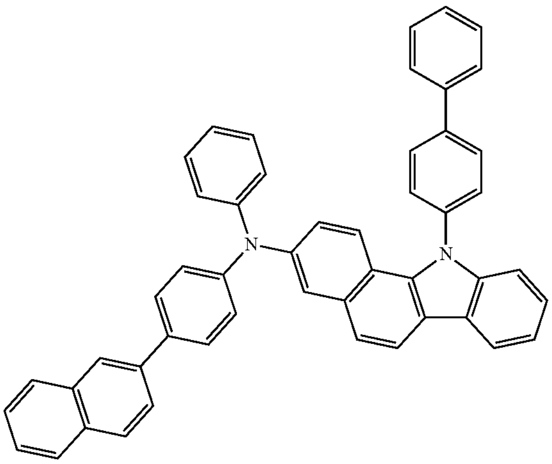
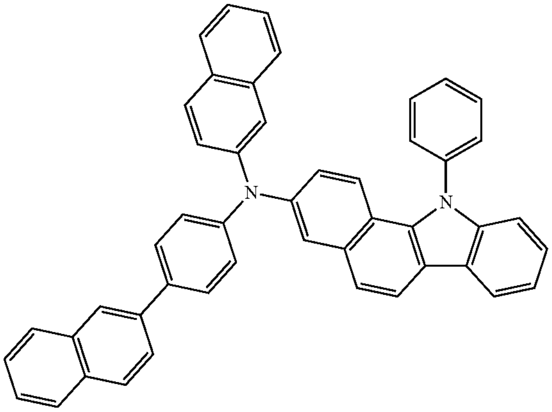
-continued
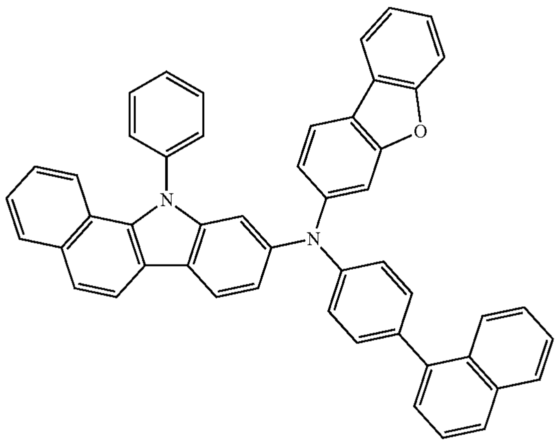
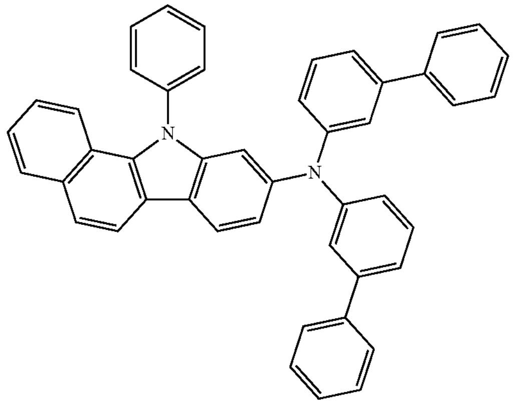
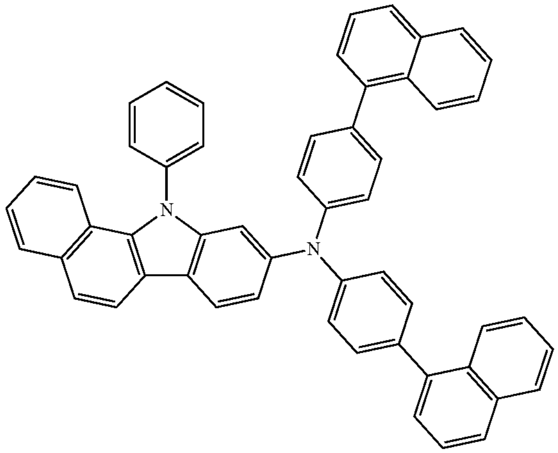

-continued
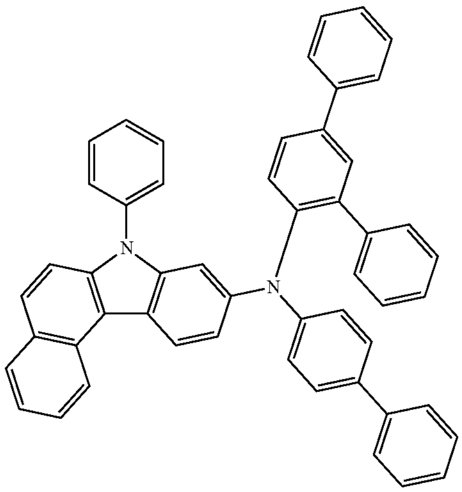
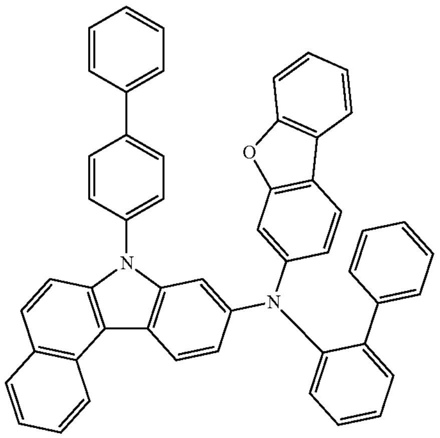
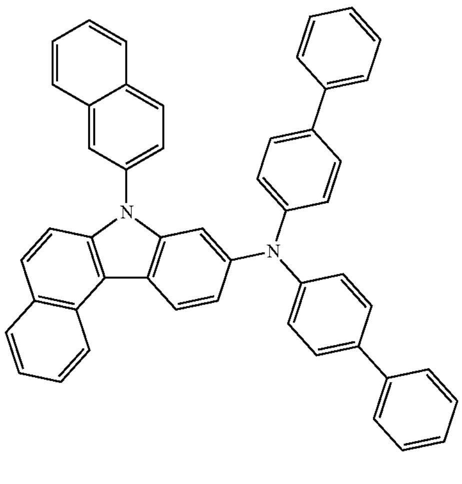
-continued
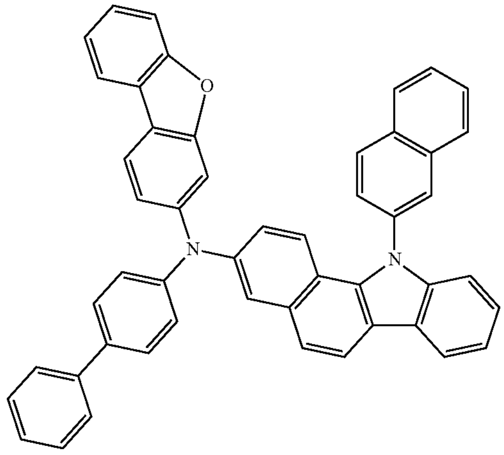
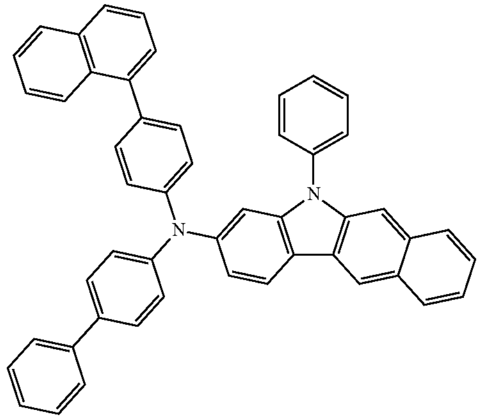
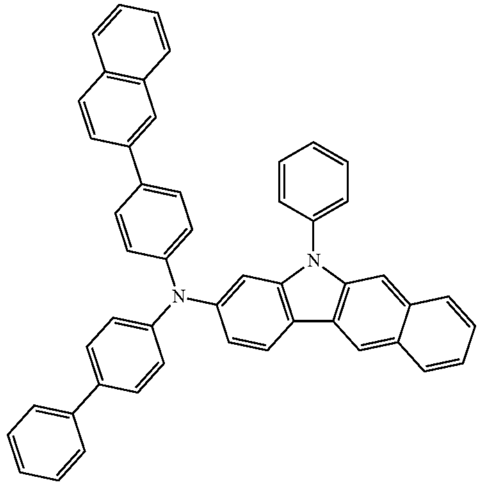
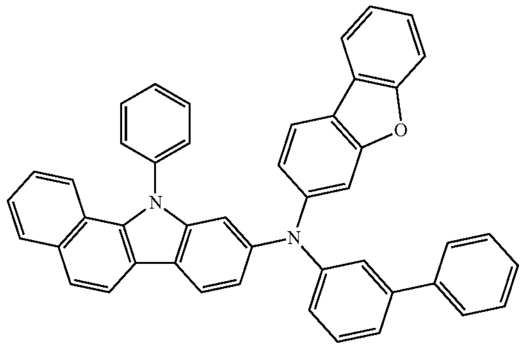

-continued
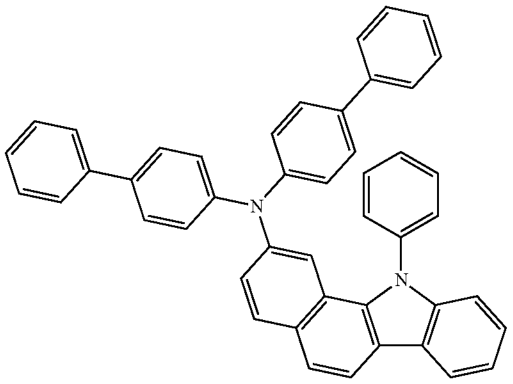
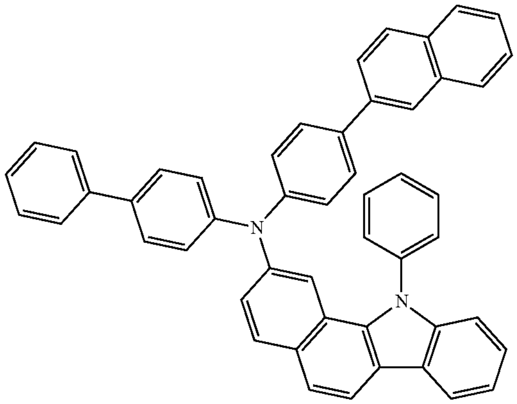
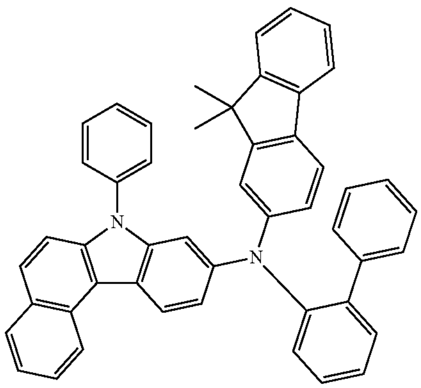
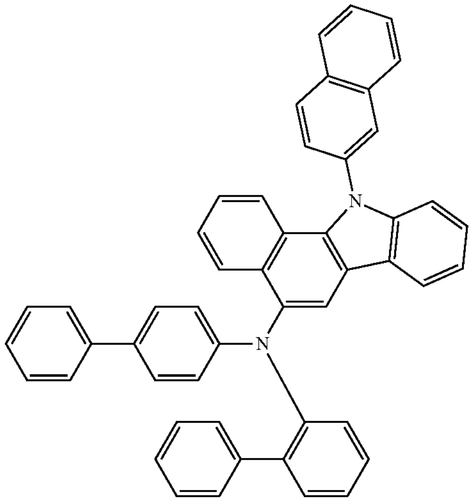
-continued
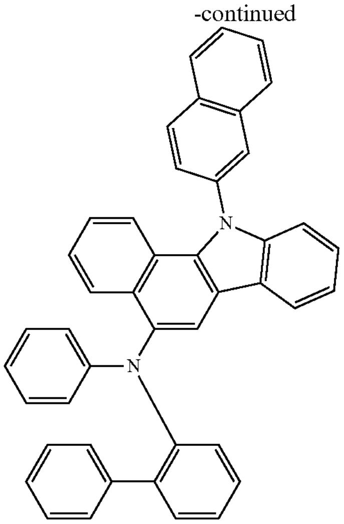
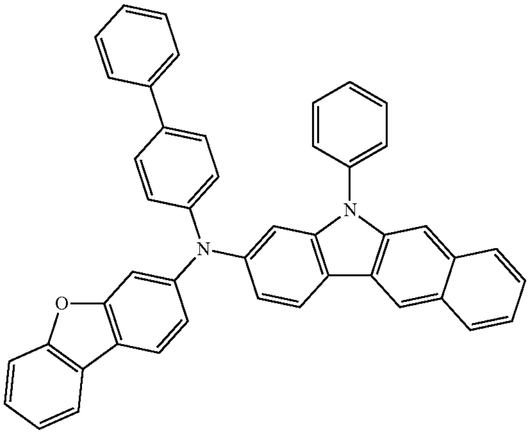
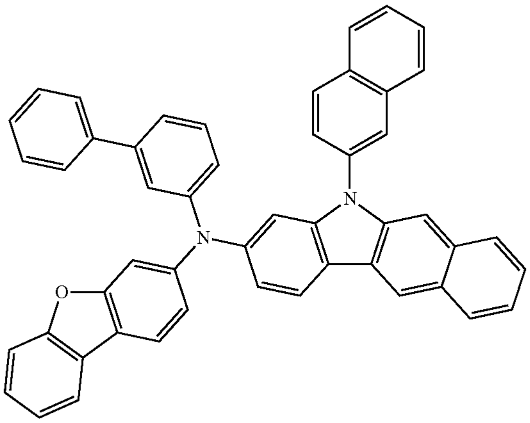
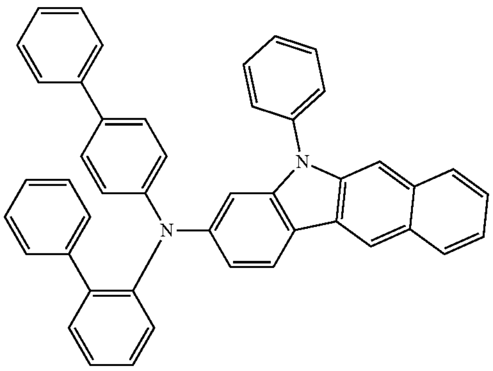

-continued
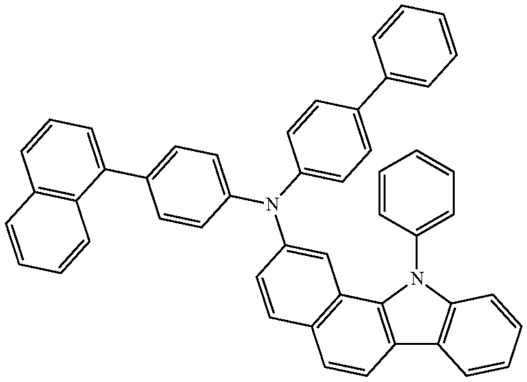
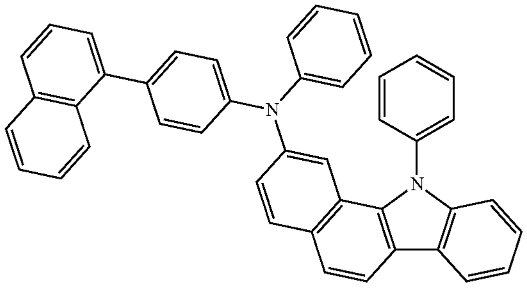
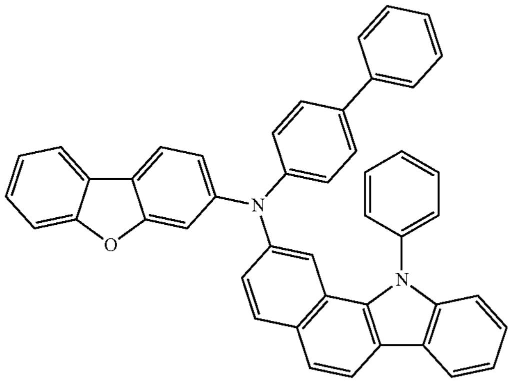
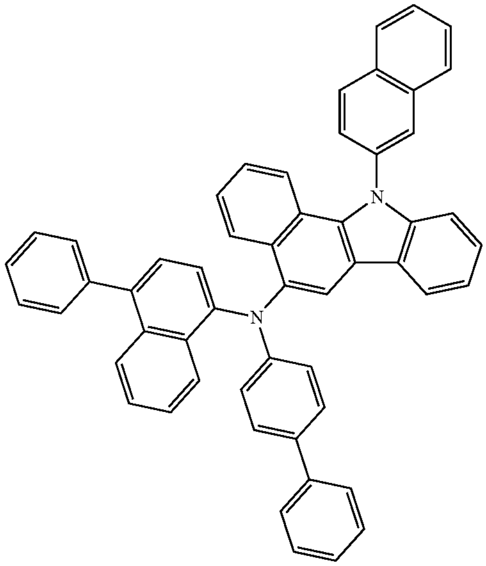
-continued
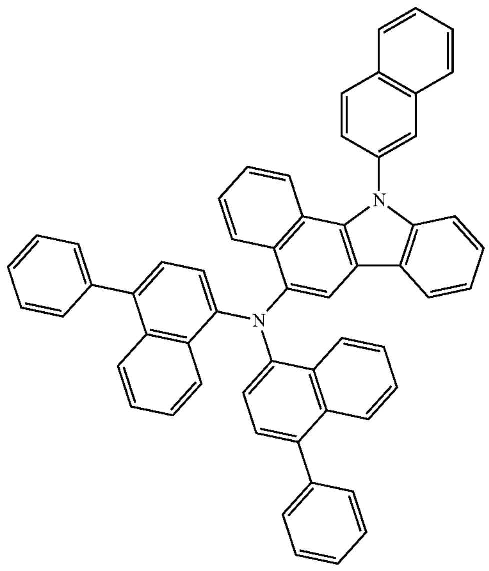
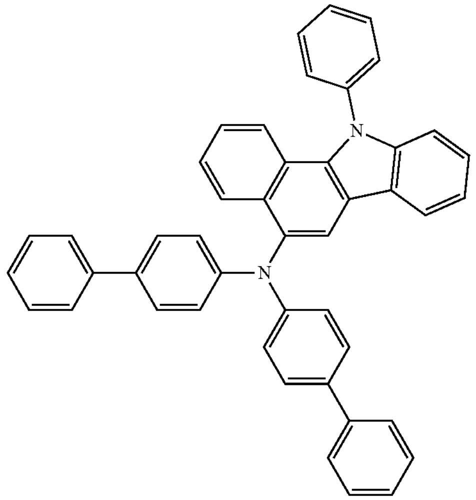
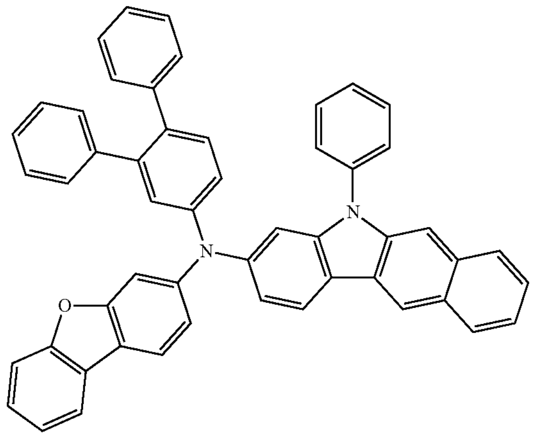

-continued
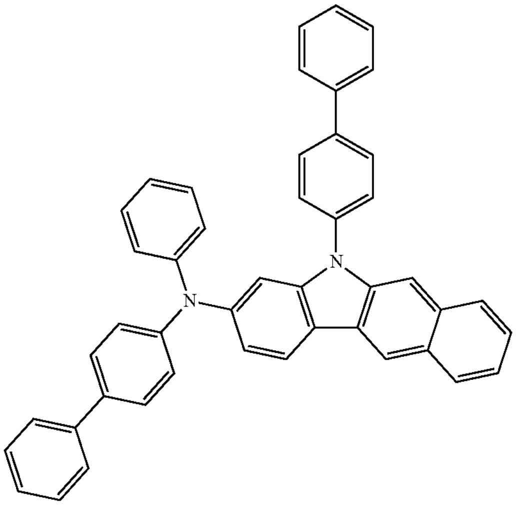
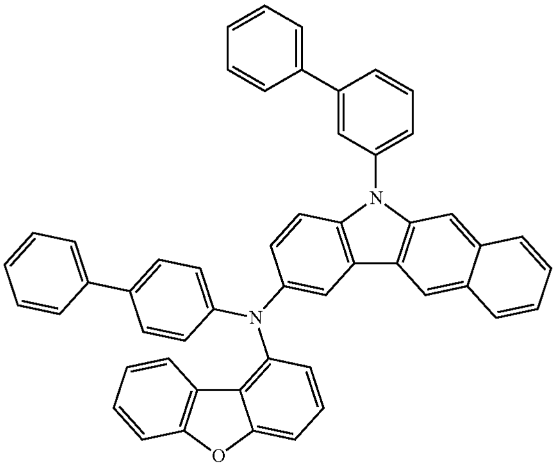
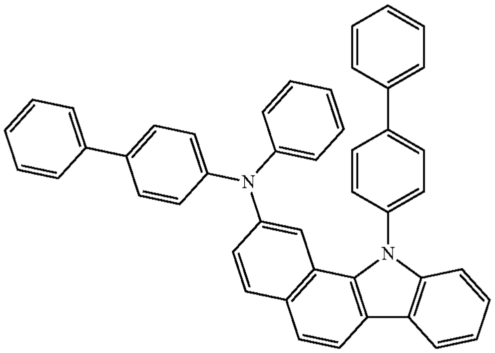
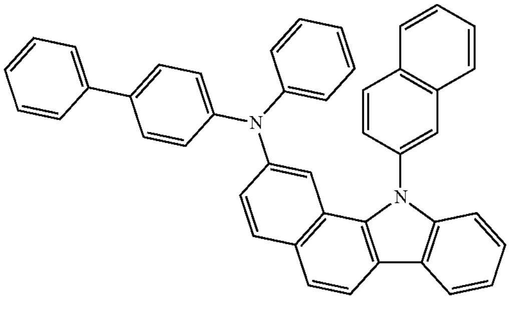
-continued
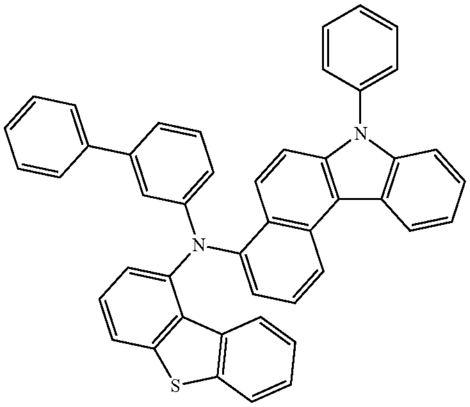
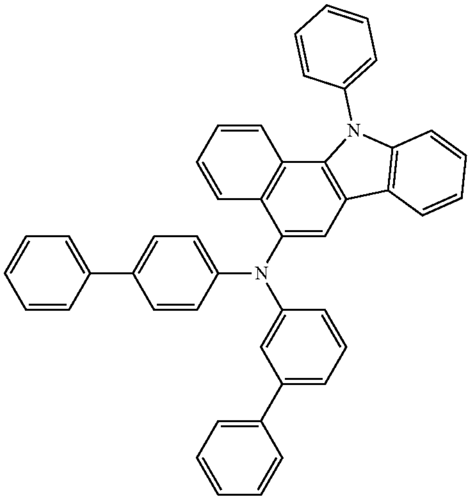
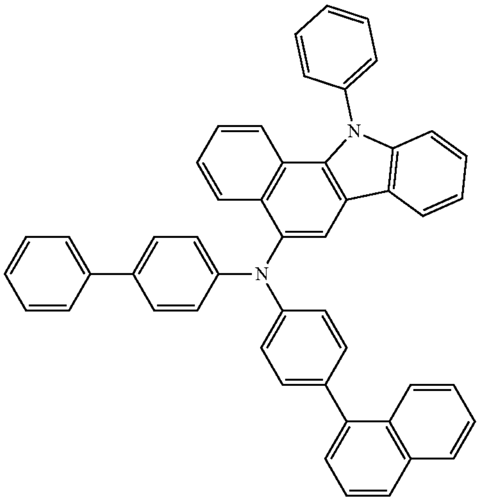

-continued
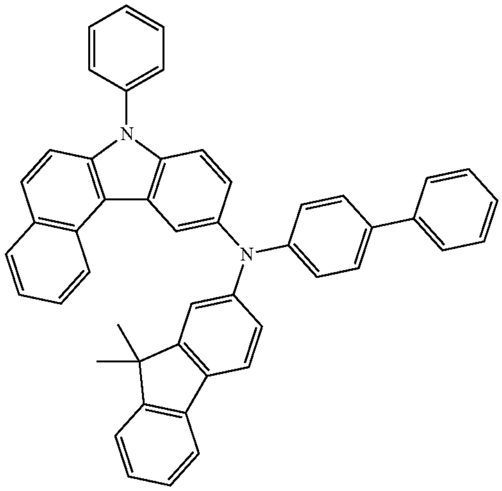
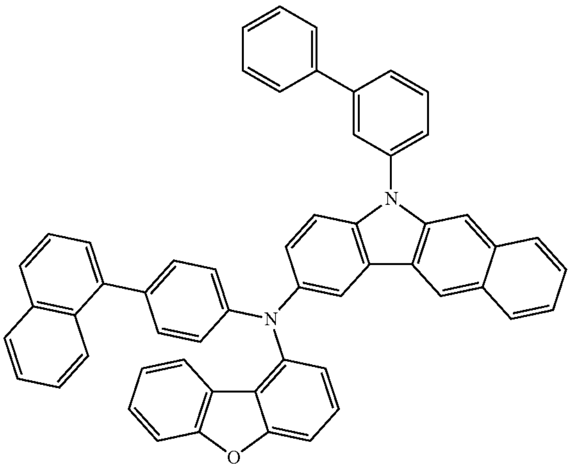
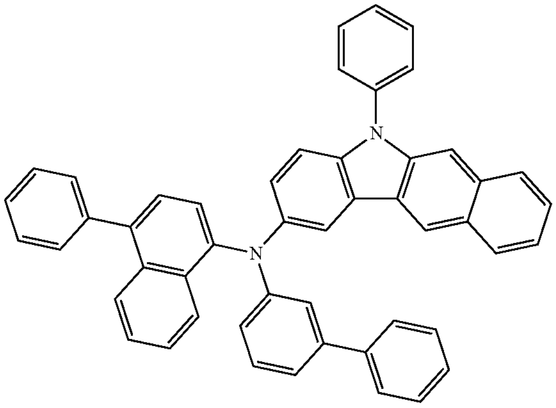
-continued
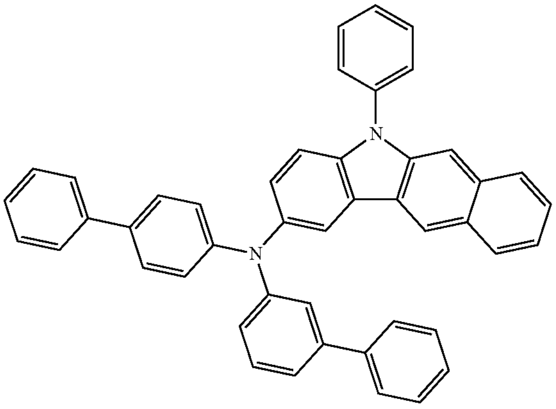
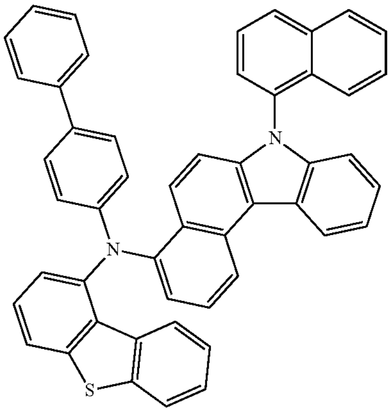
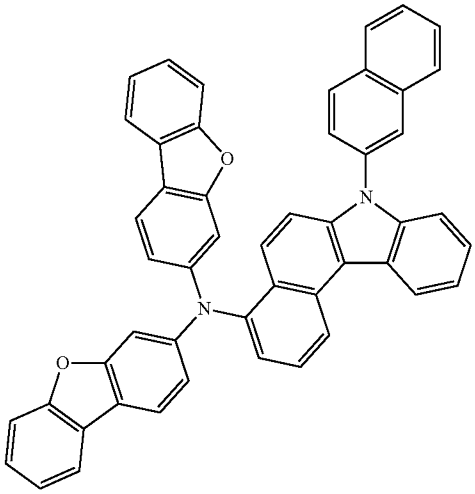

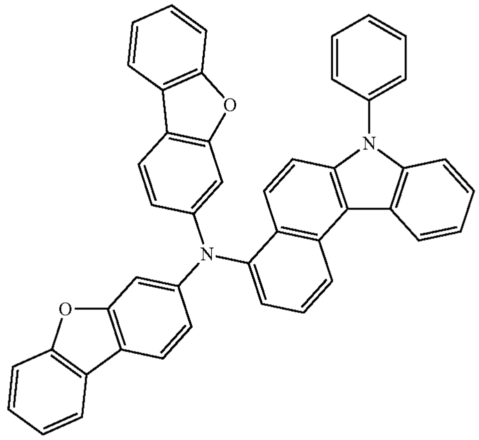
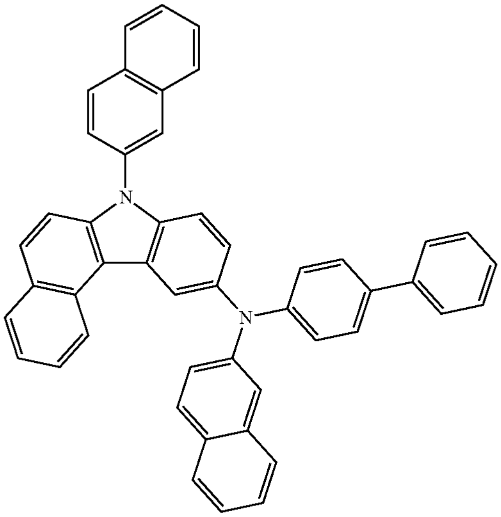
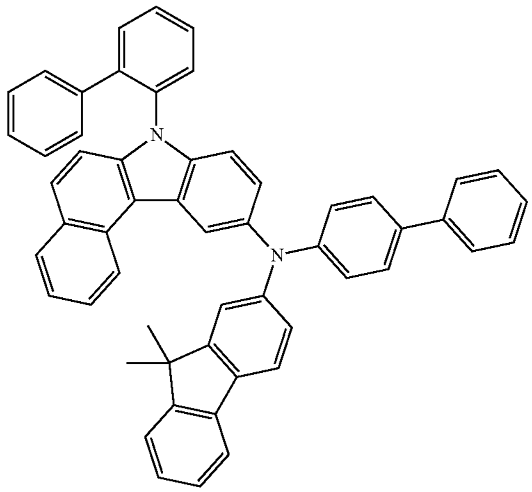
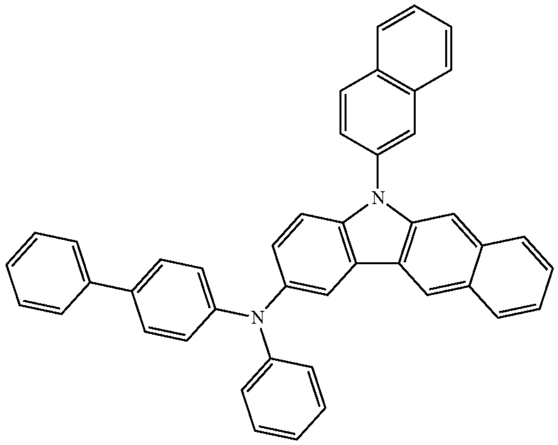
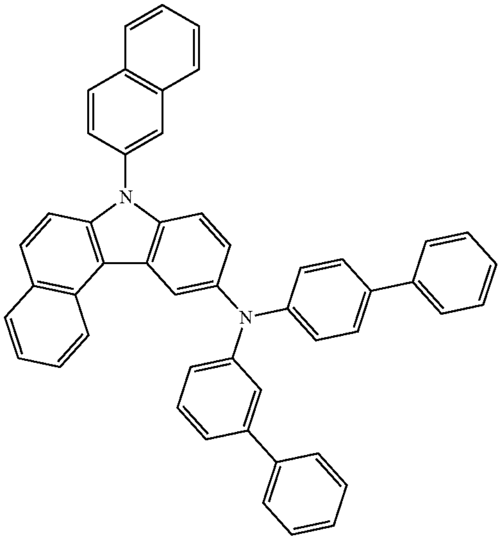
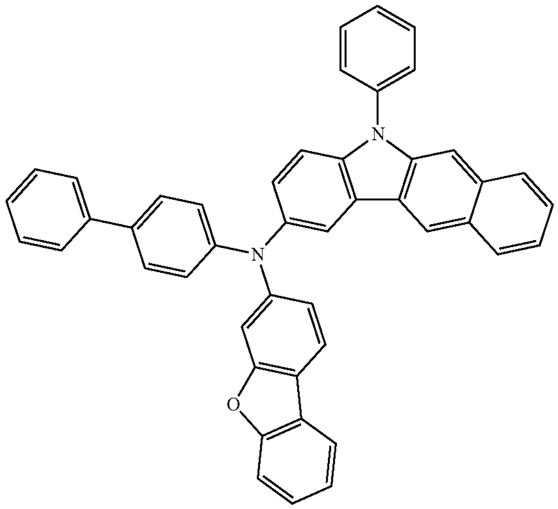

-continued
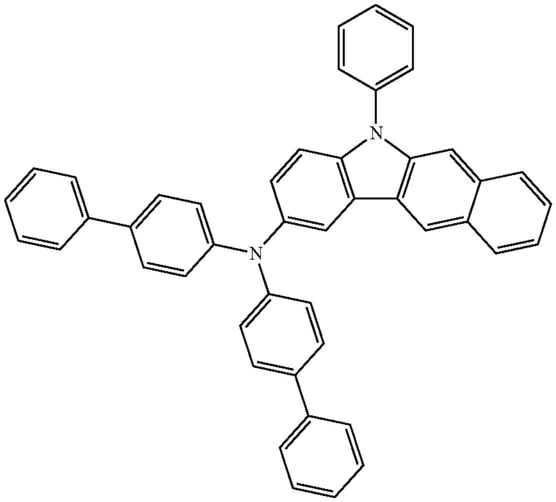
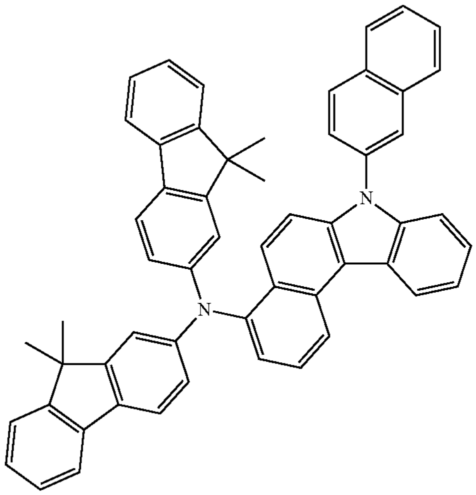
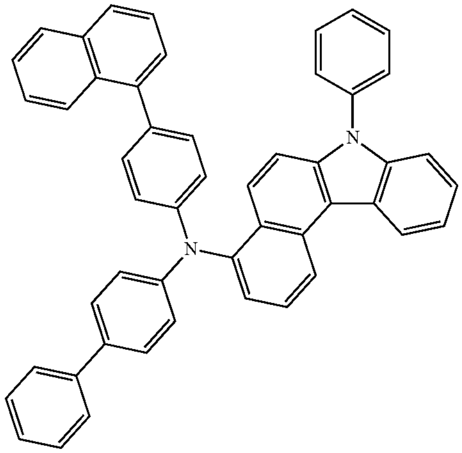
-continued
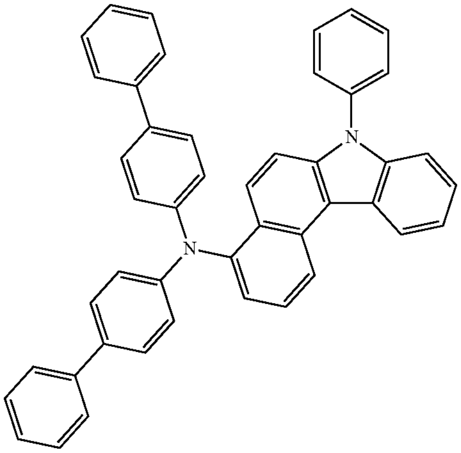
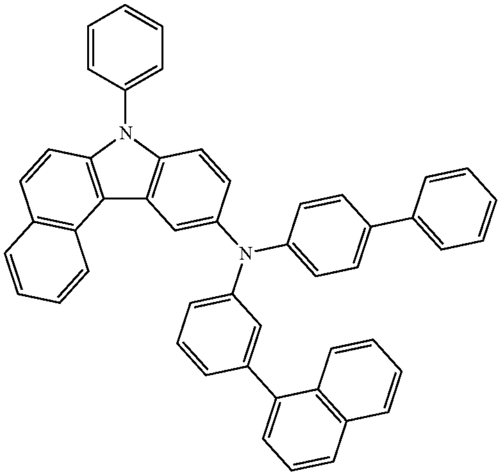
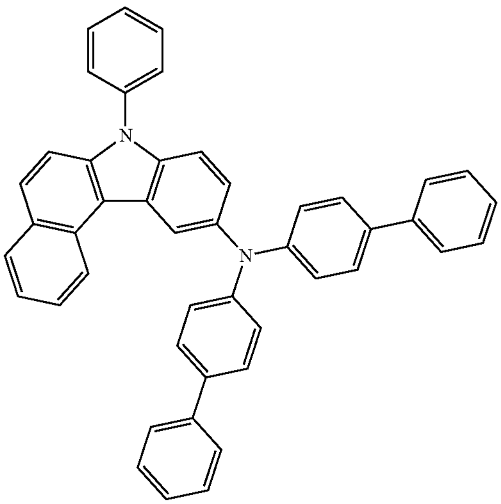

-continued
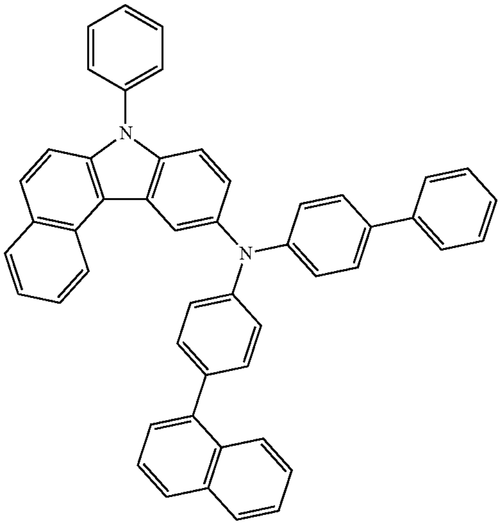
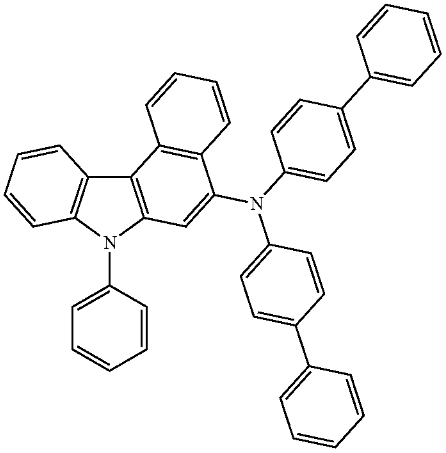
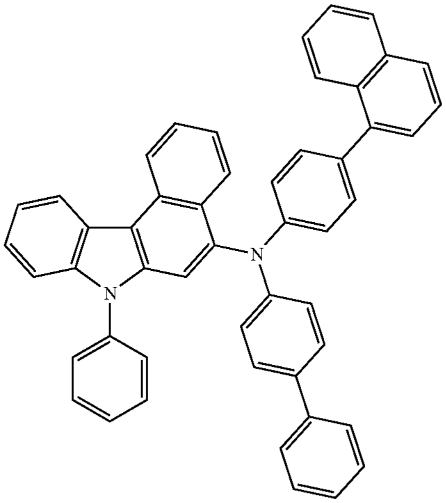
-continued
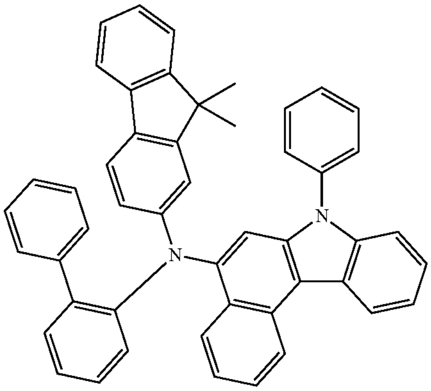
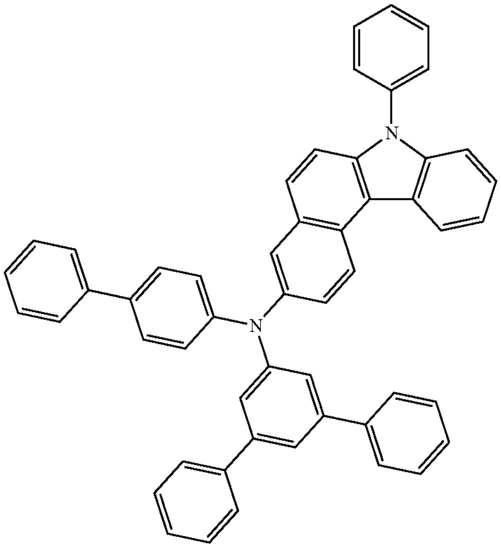
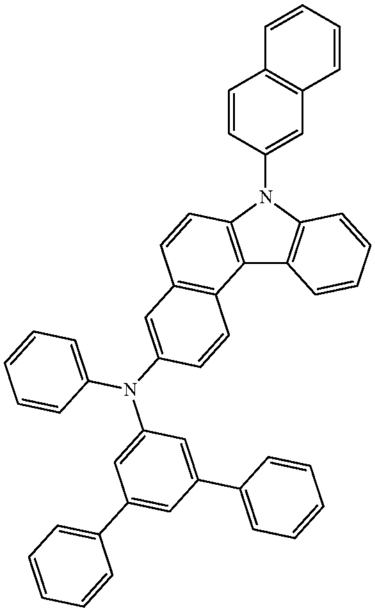

-continued
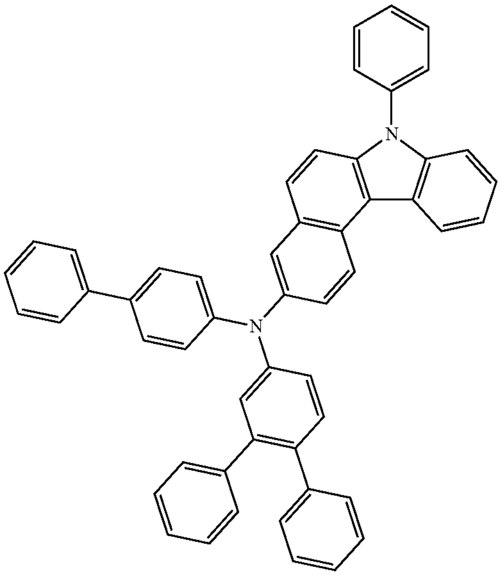
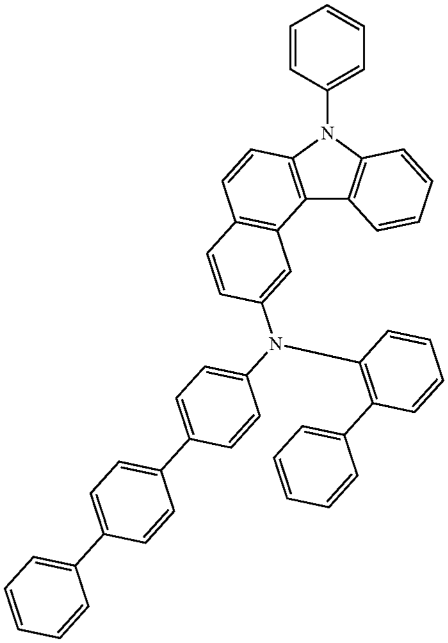
-continued
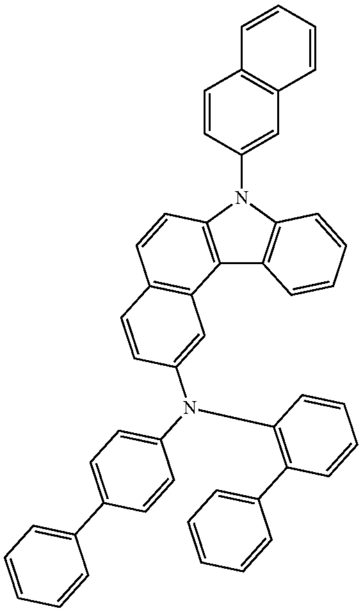
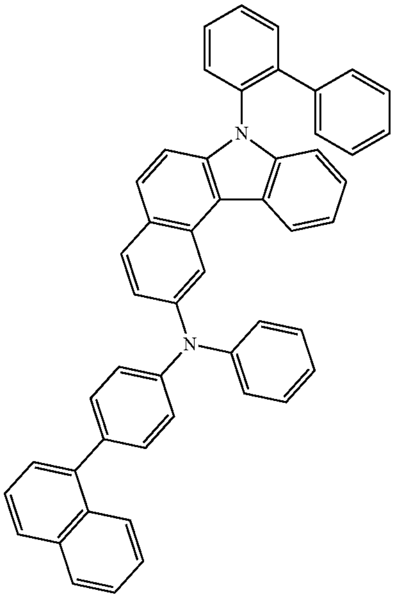
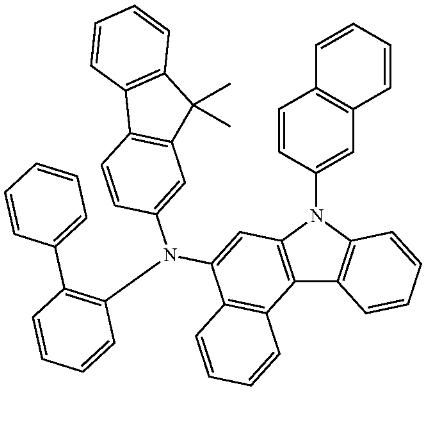

-continued
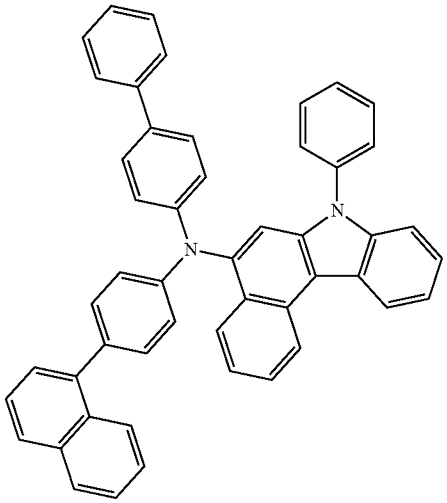
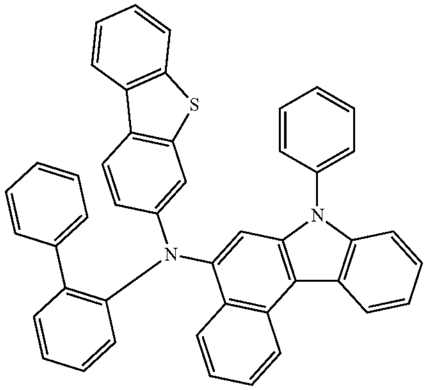
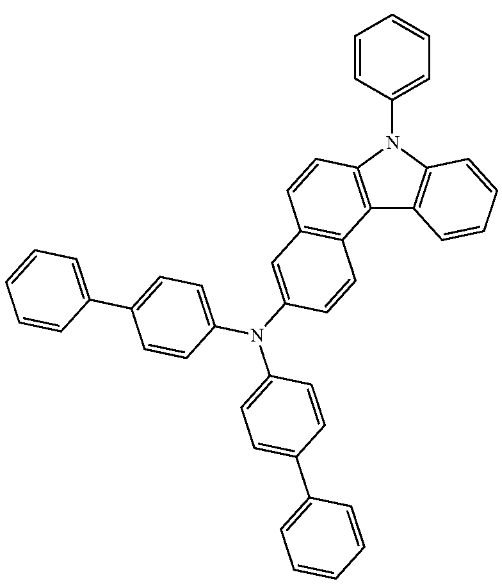
-continued
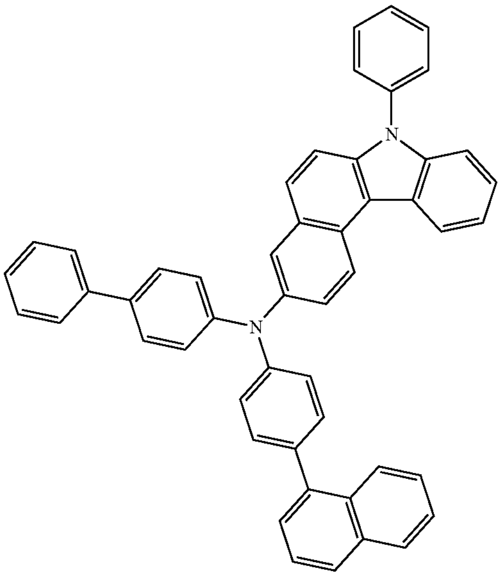
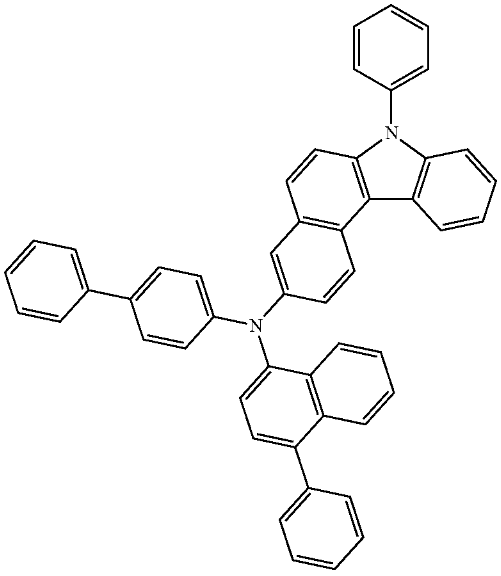

-continued
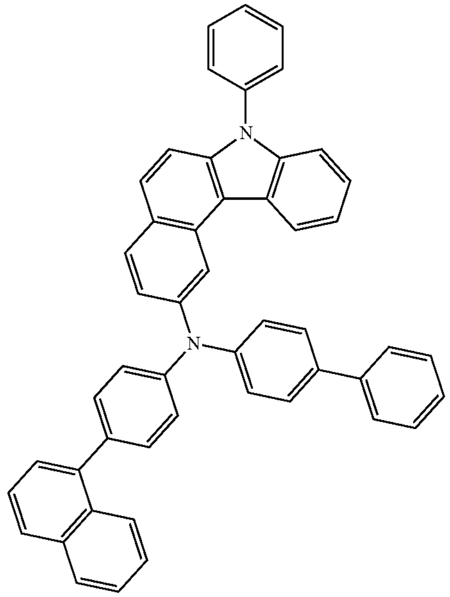
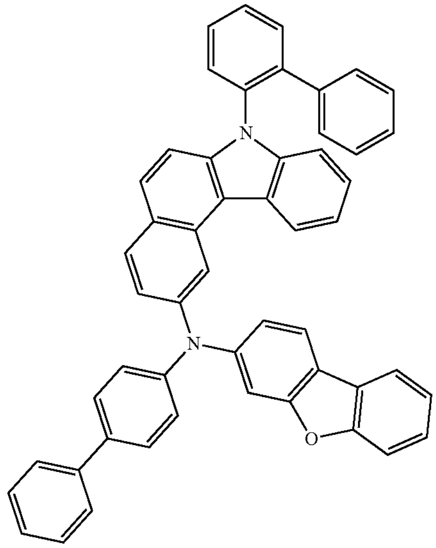
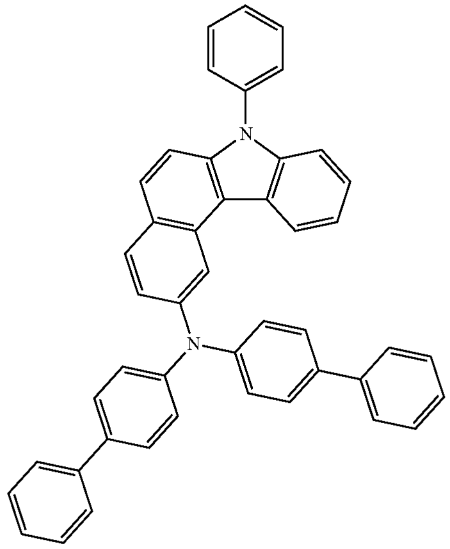
-continued
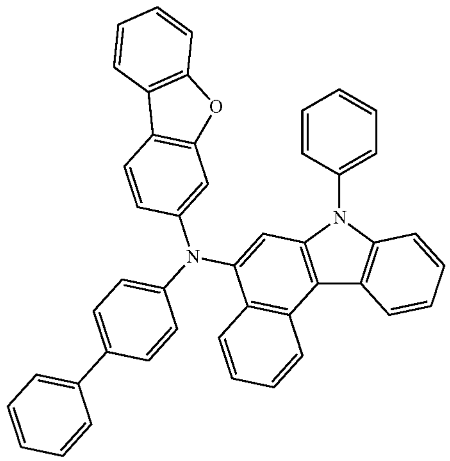
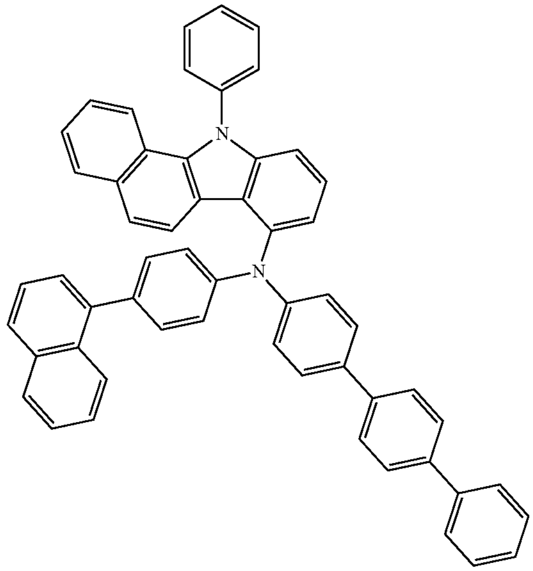
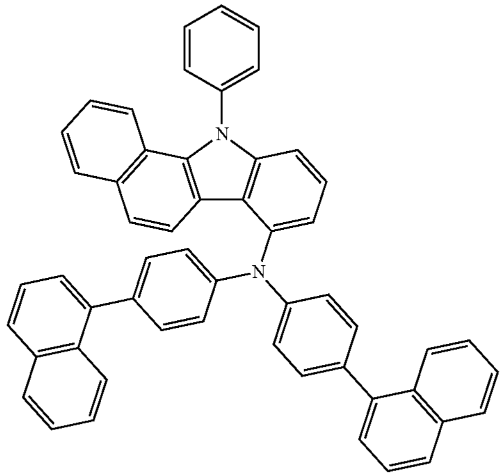

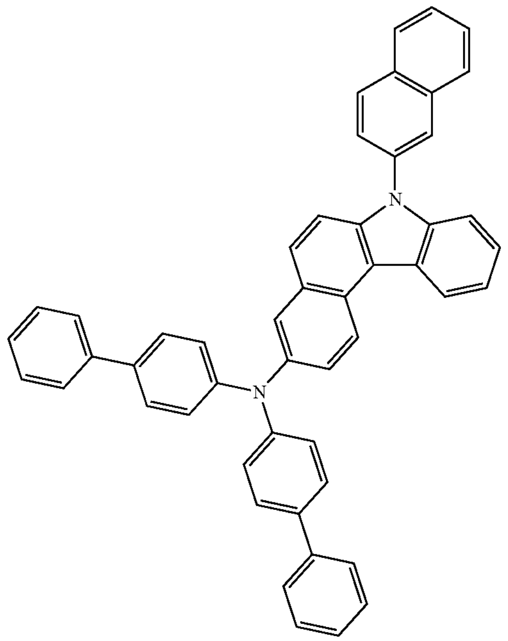
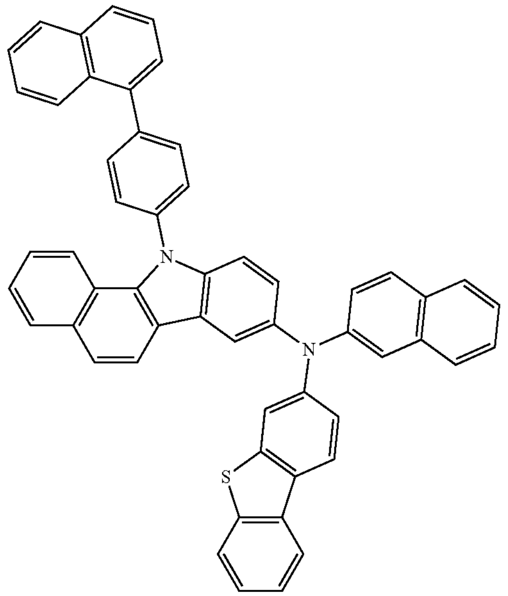
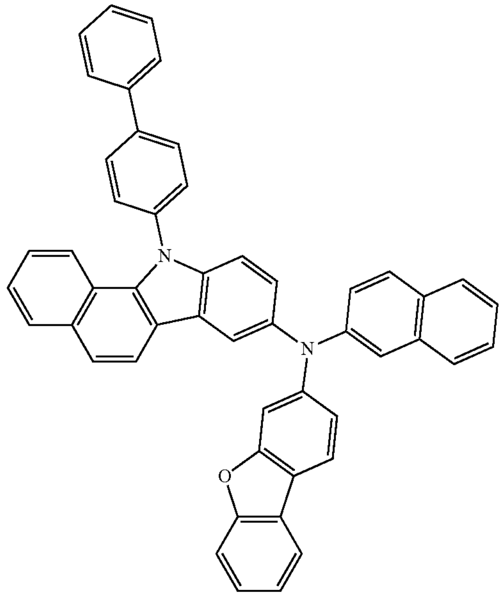
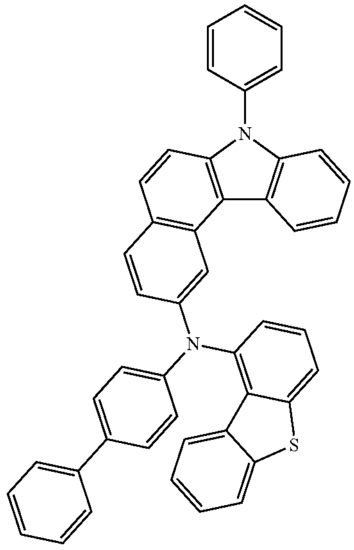

-continued
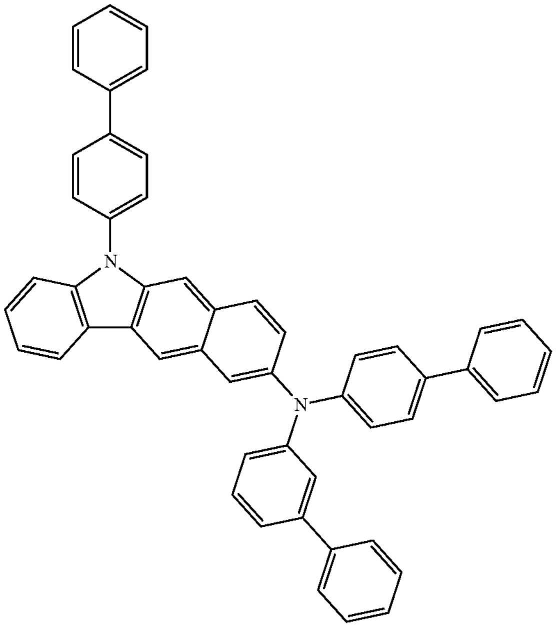
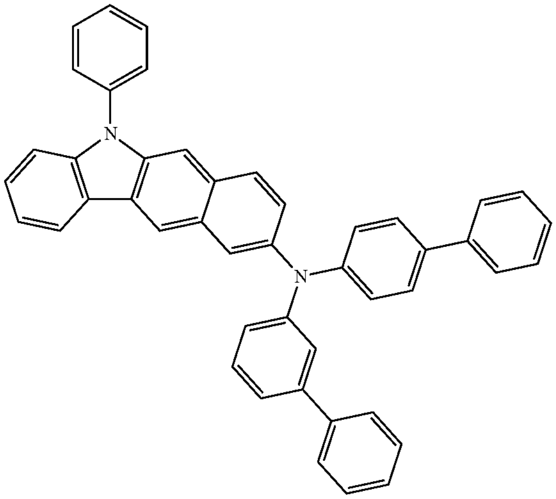
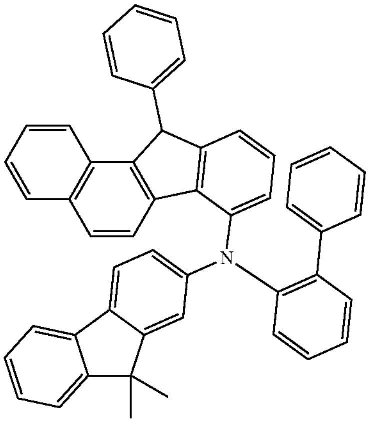
-continued
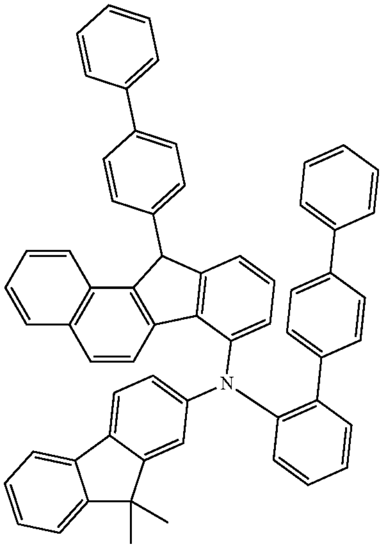
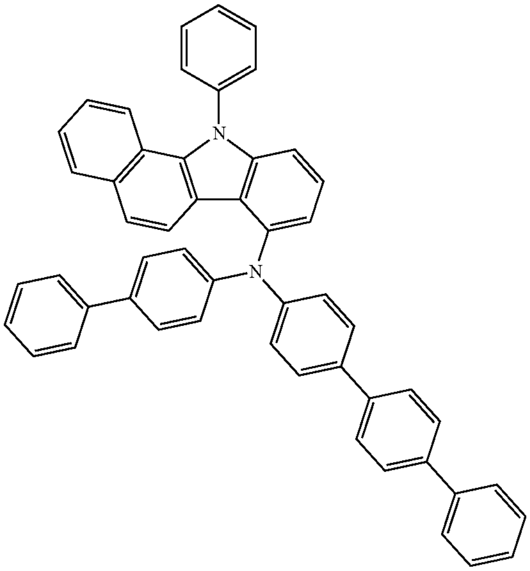
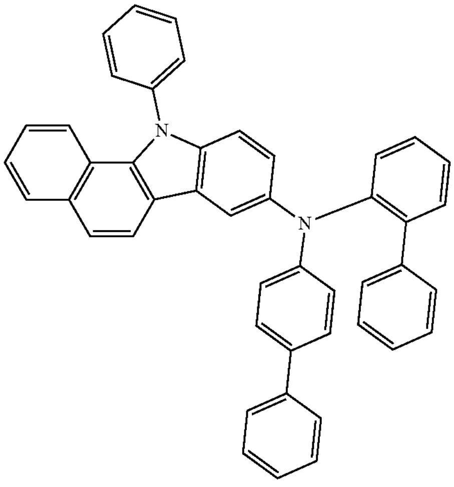

-continued
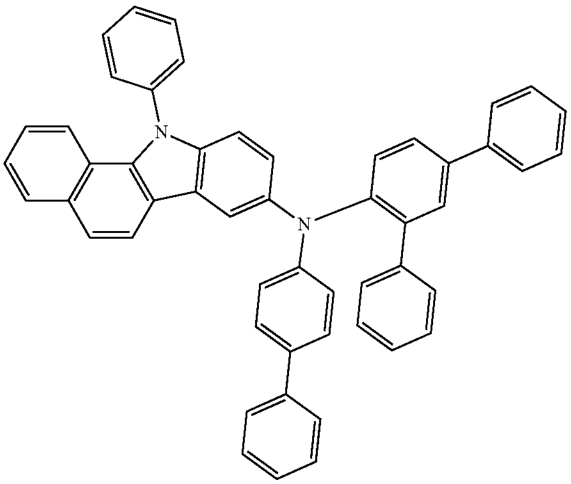
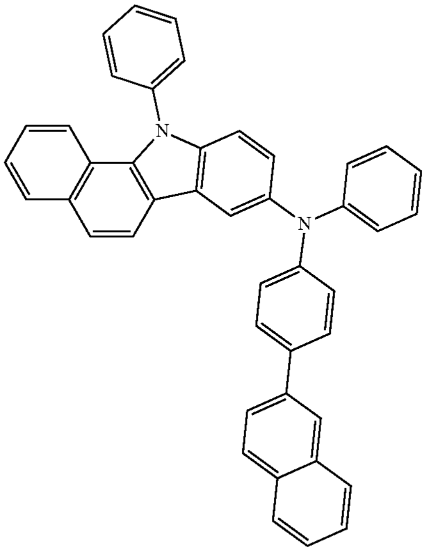
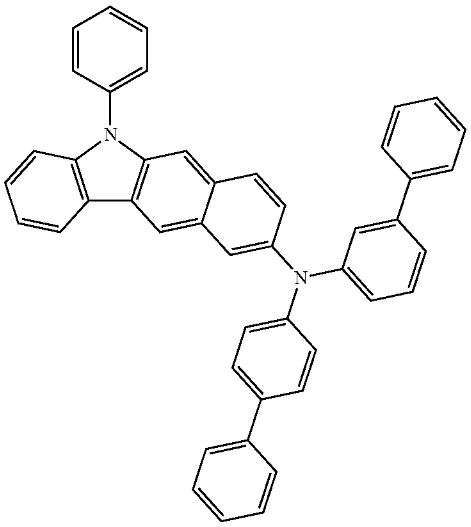
-continued
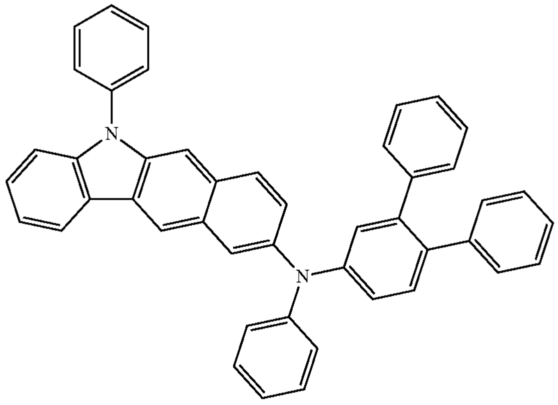
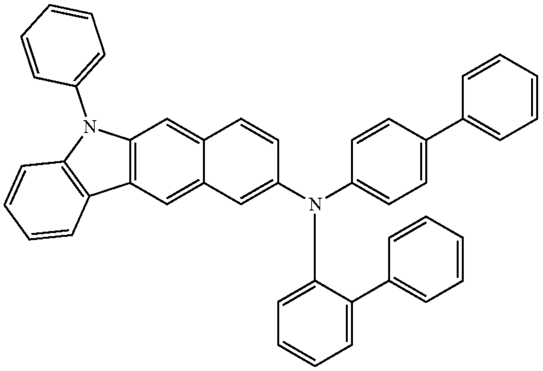
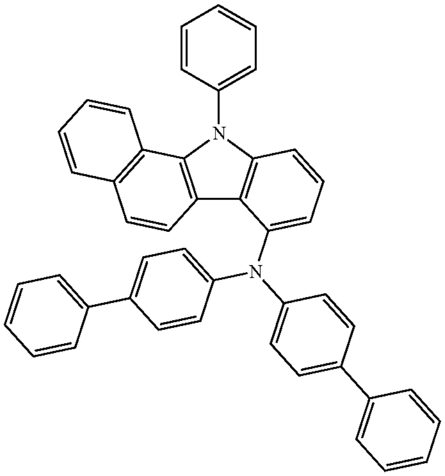
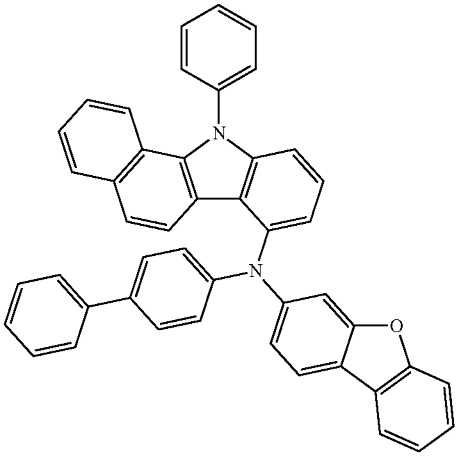

-continued
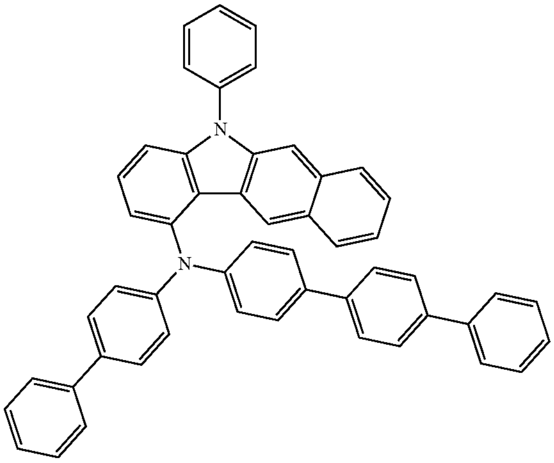
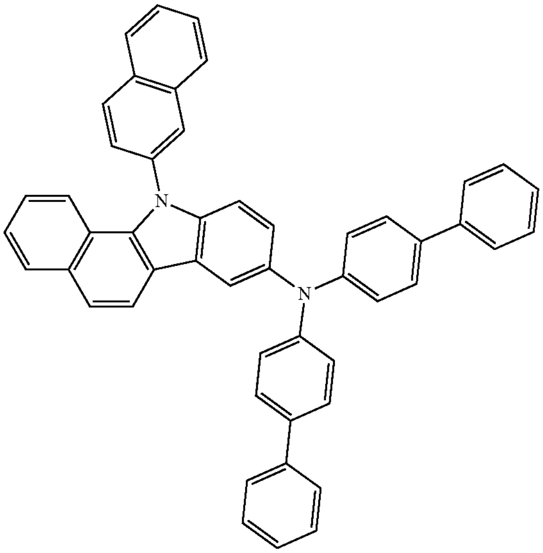
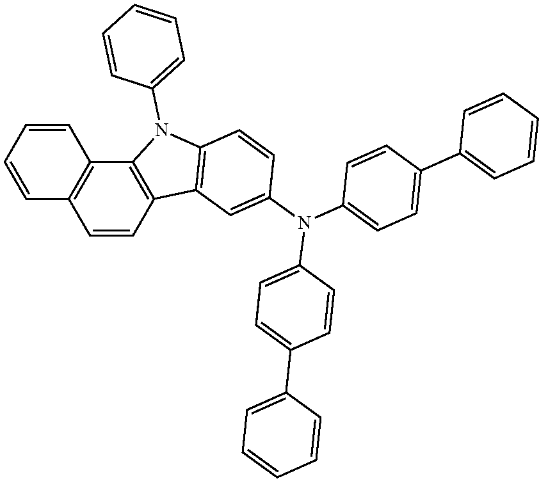
-continued
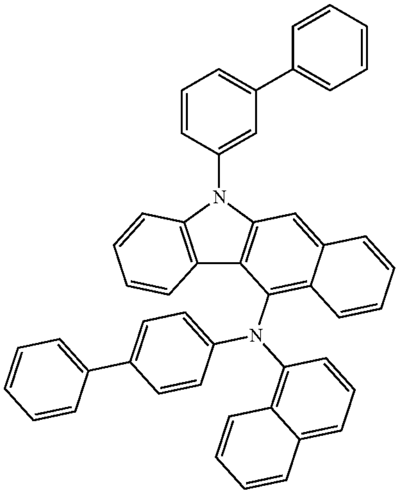
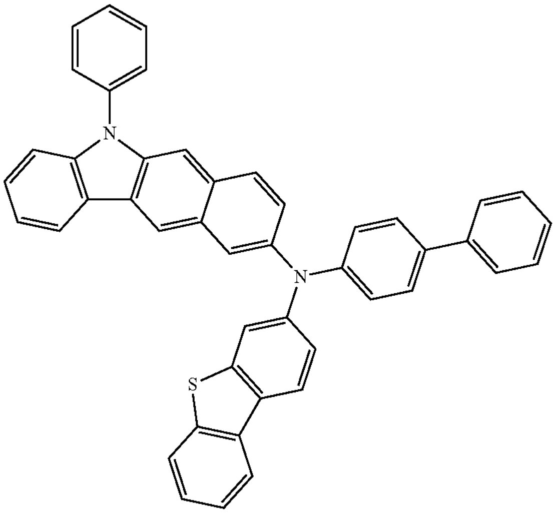
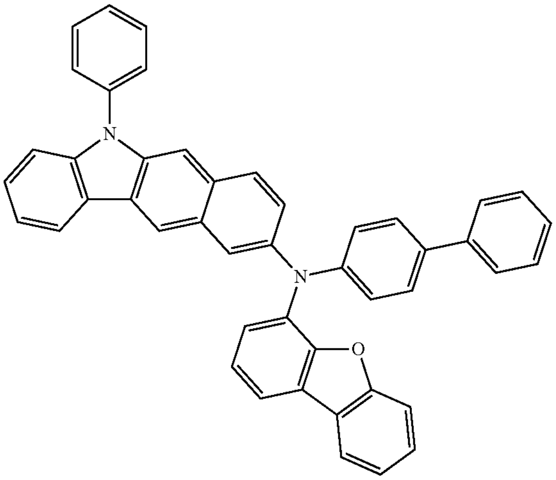

-continued
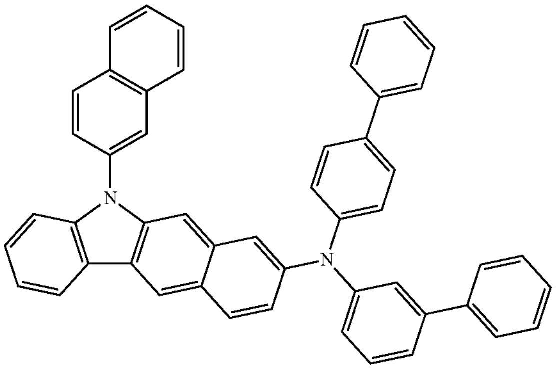
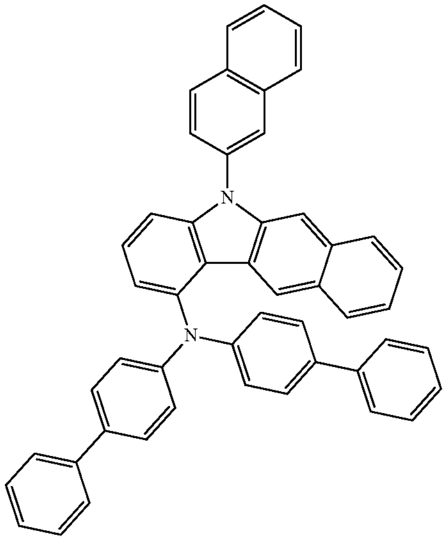
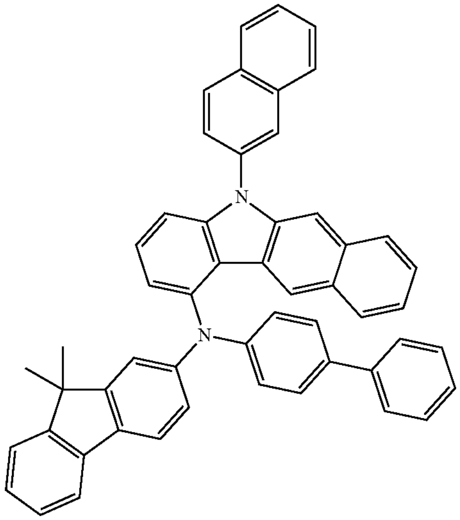
-continued
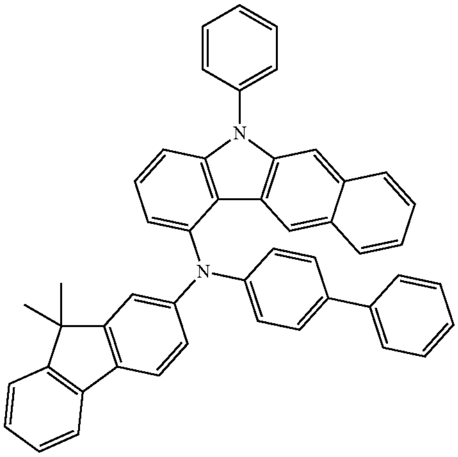
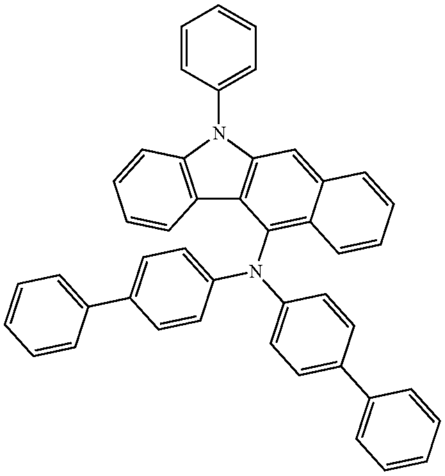
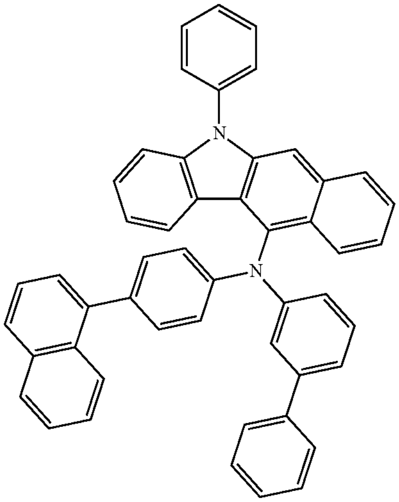

-continued
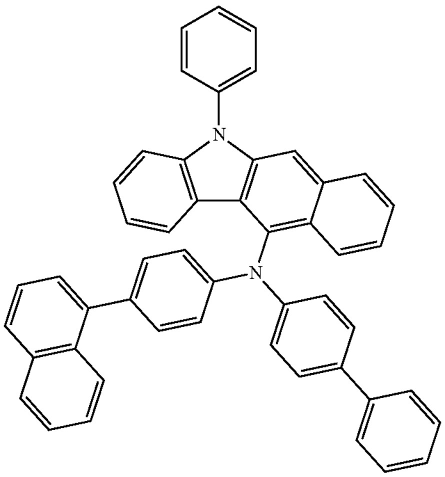
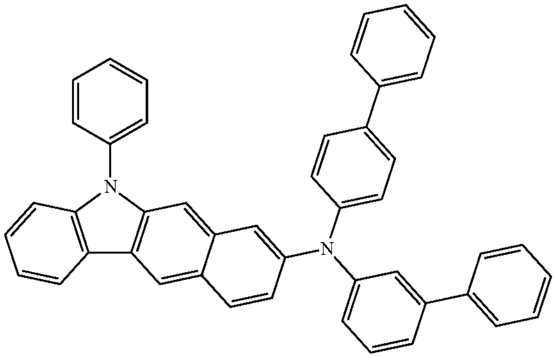
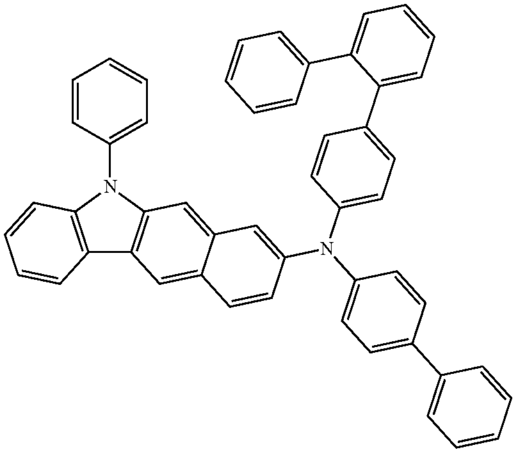
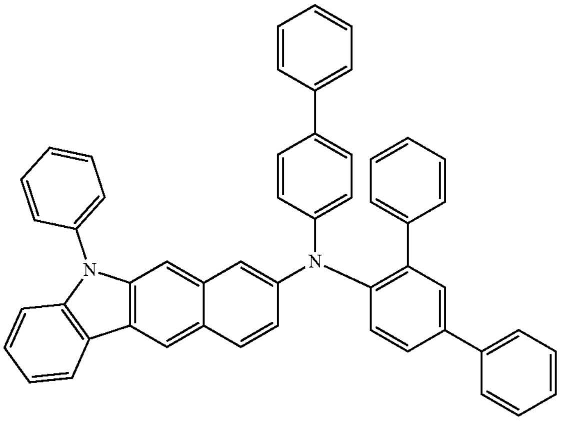
-continued
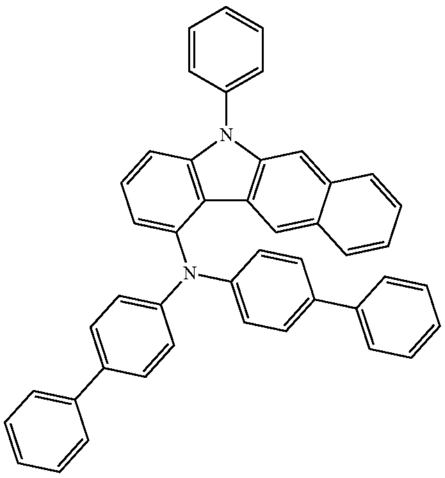
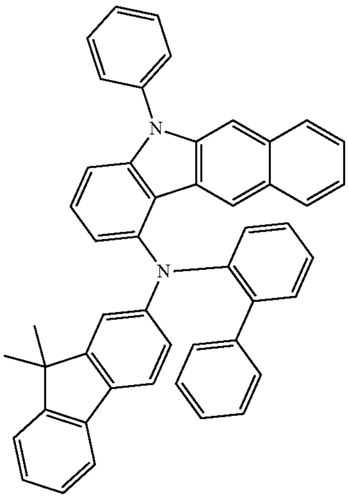
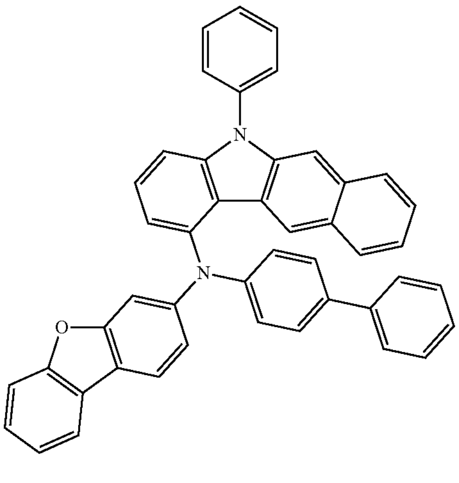

-continued
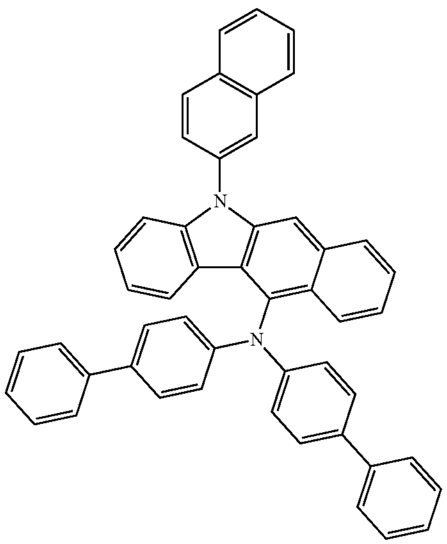
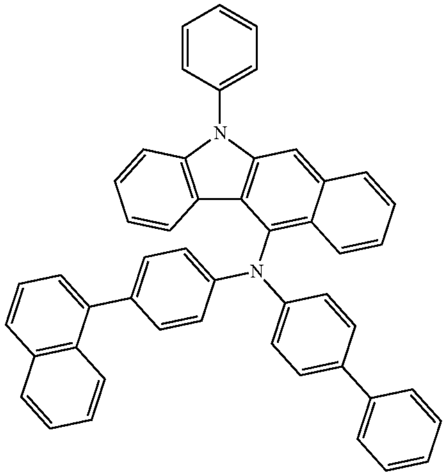
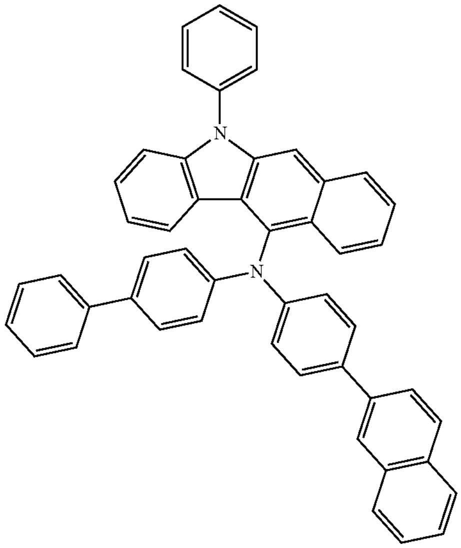
-continued
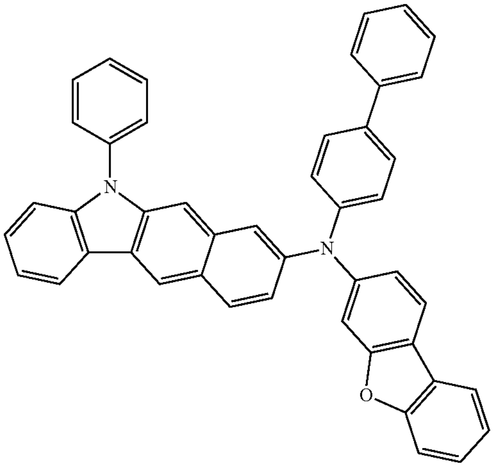
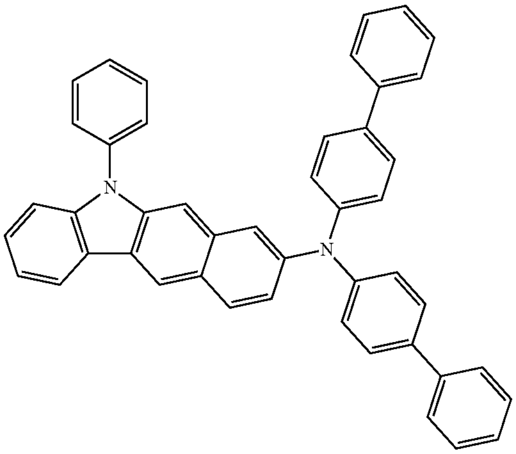
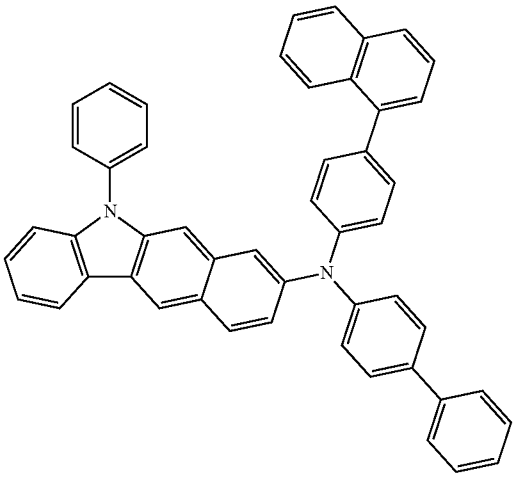

-continued
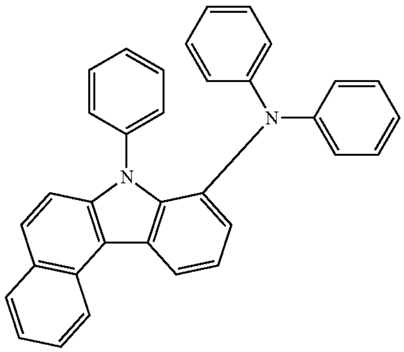
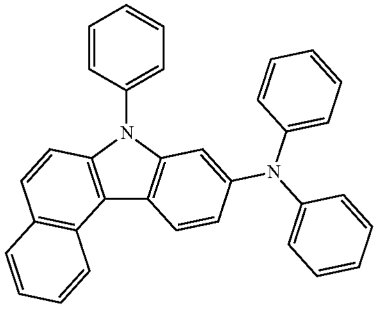
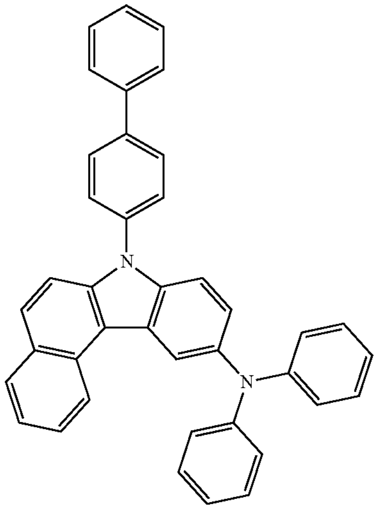
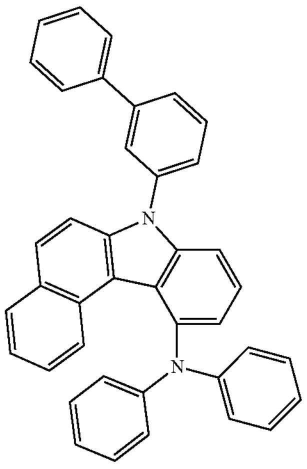
-continued
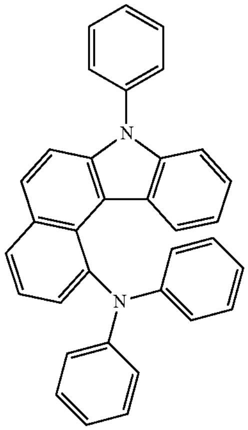
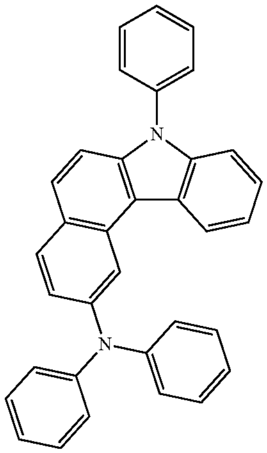
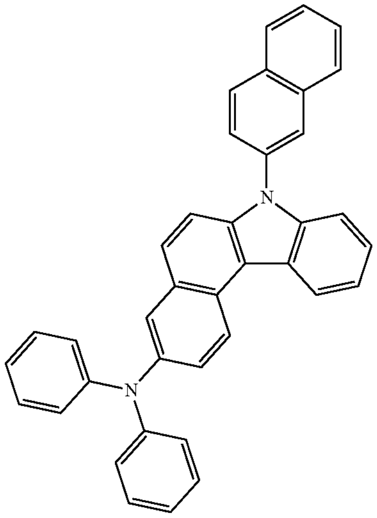

-continued
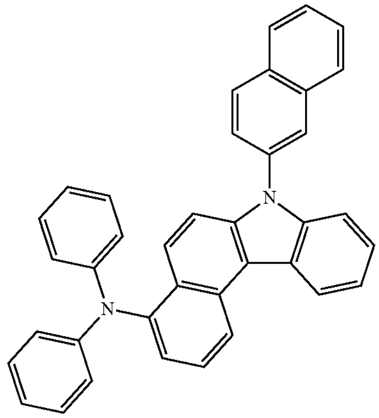
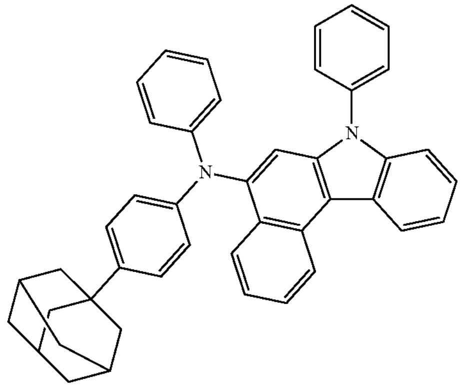
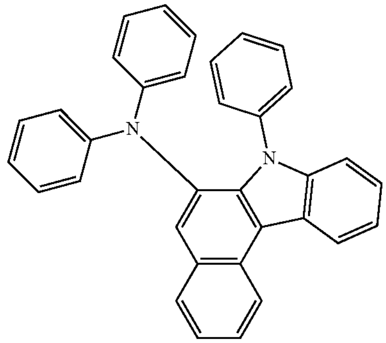
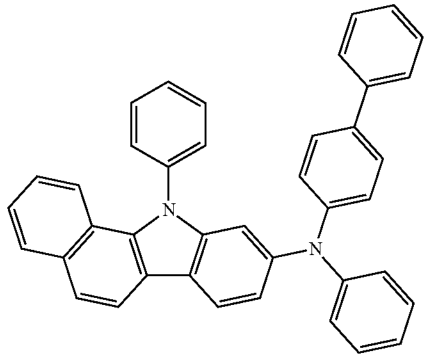
-continued
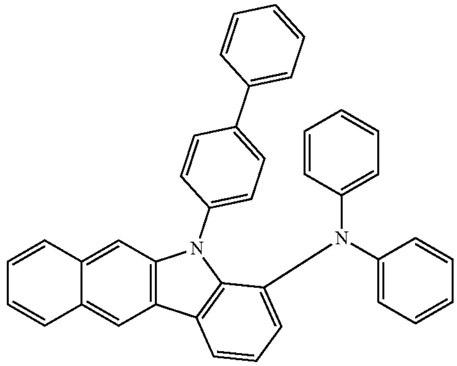
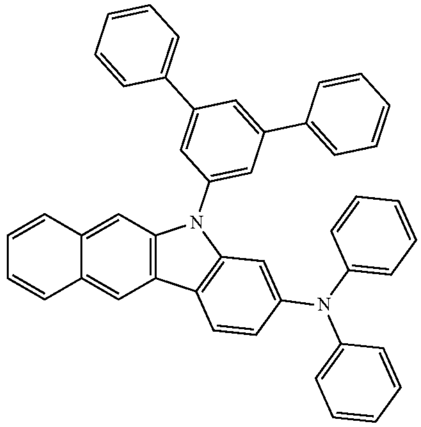
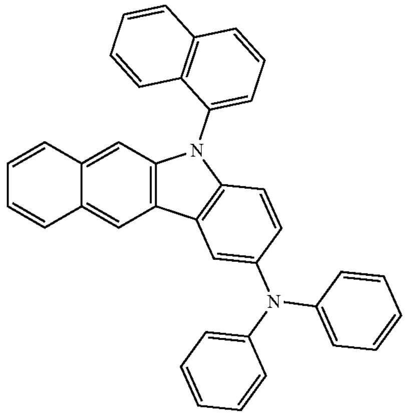
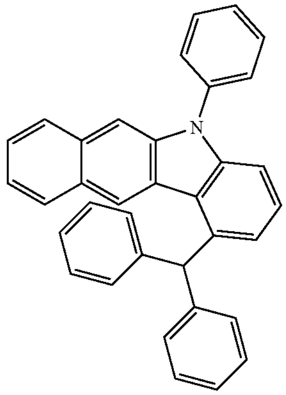

-continued
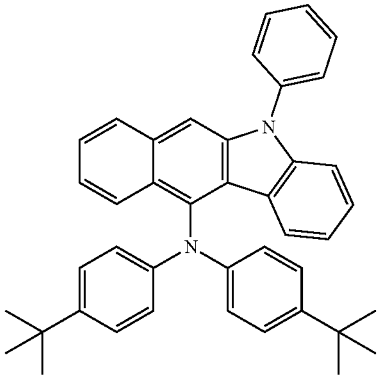
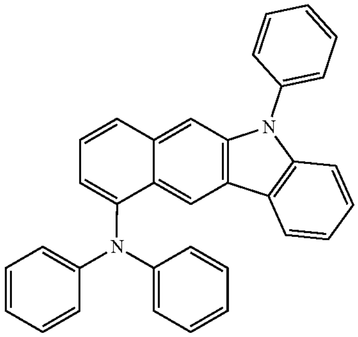
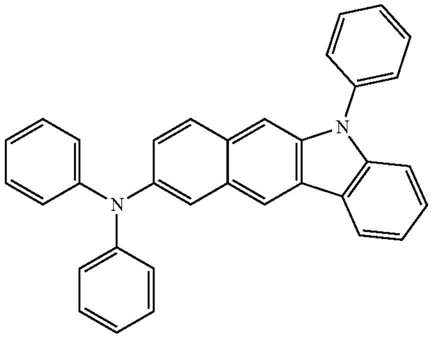
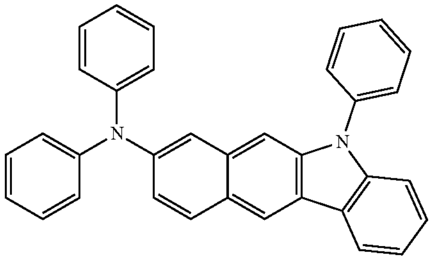
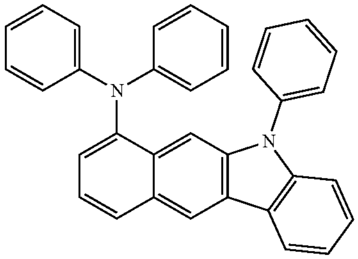
-continued
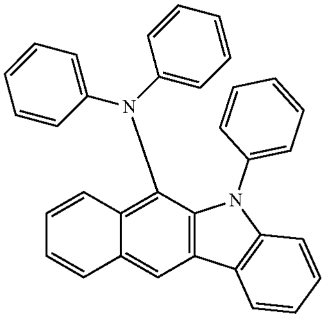
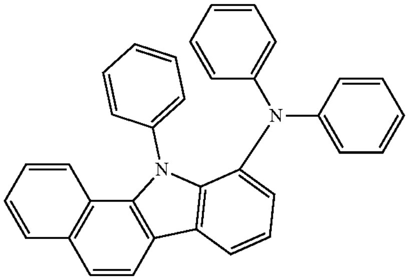
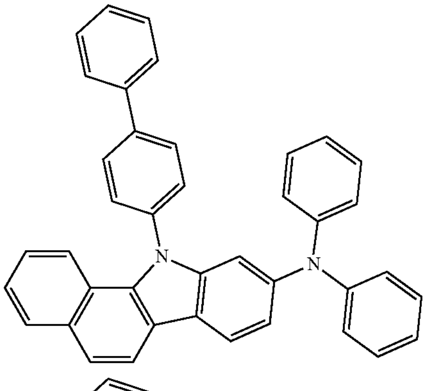
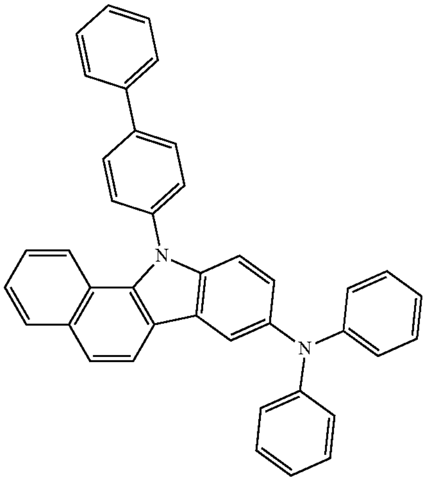

-continued
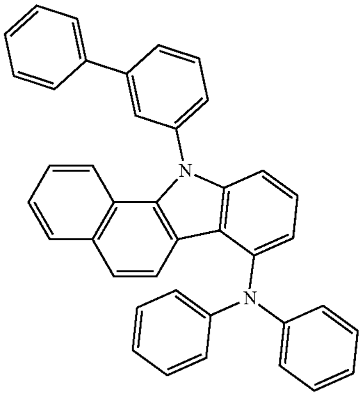
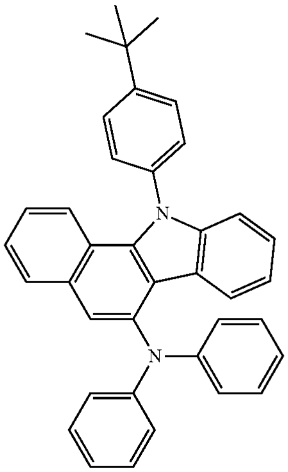
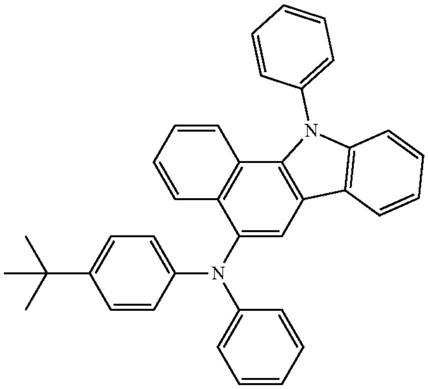
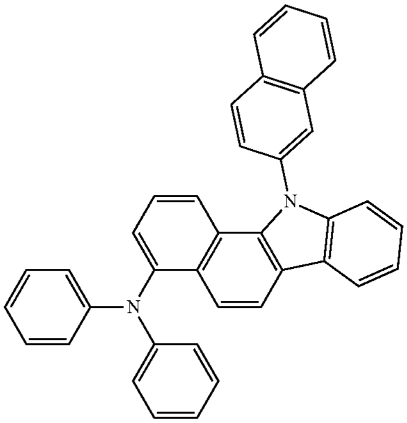
-continued
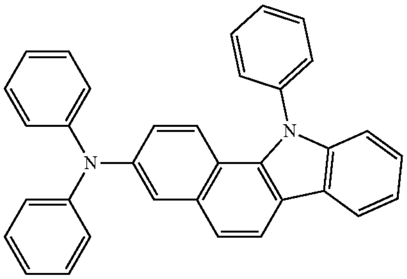
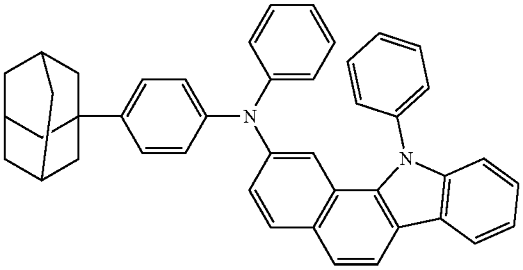
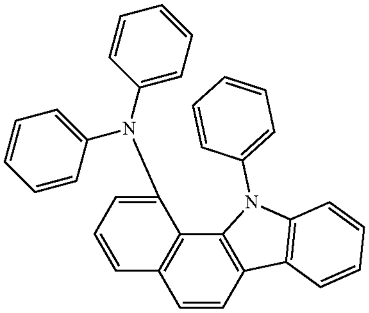
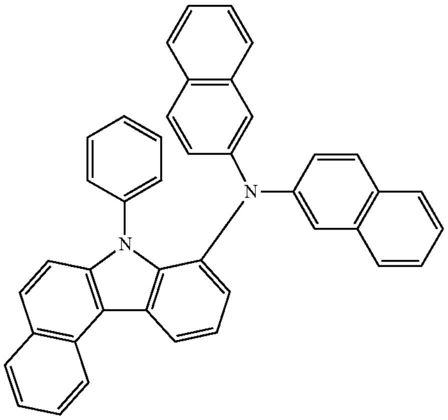
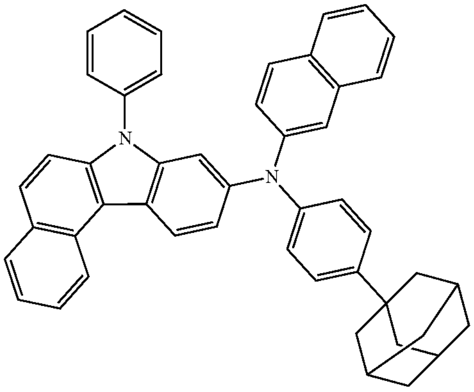

-continued
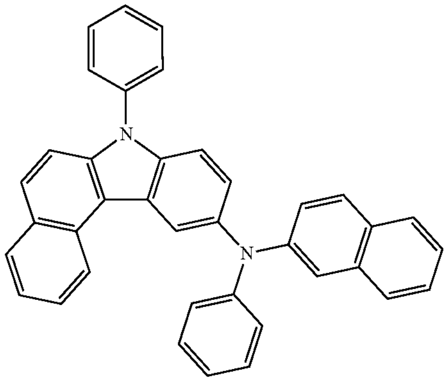
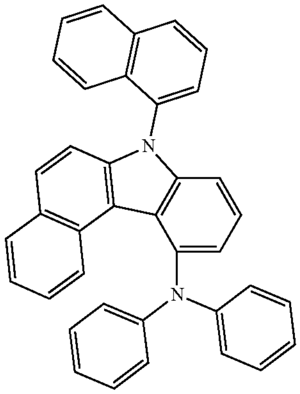
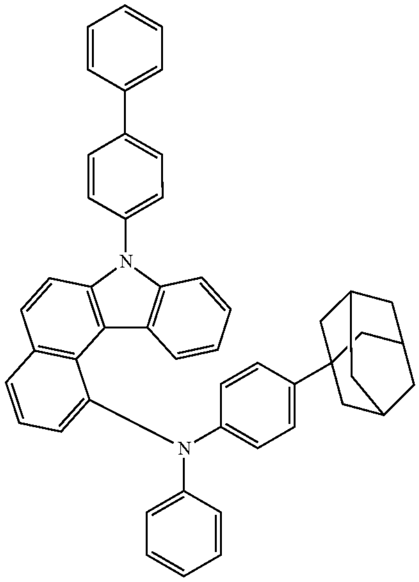
-continued
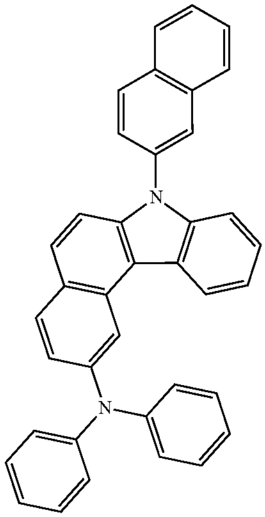
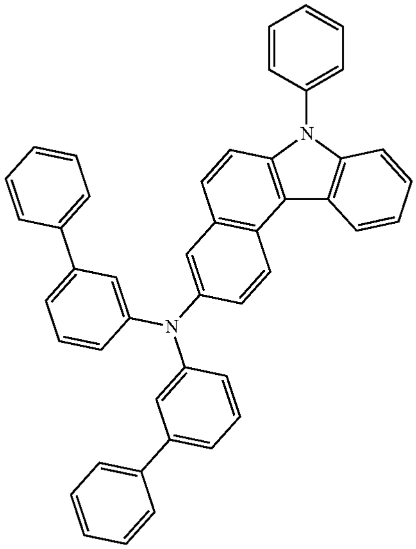
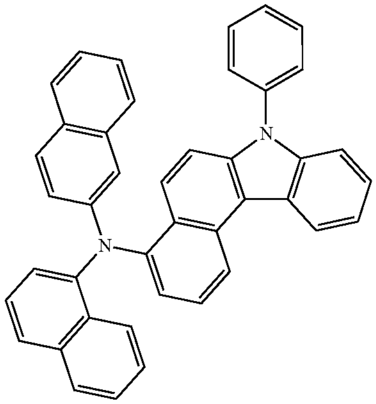

-continued
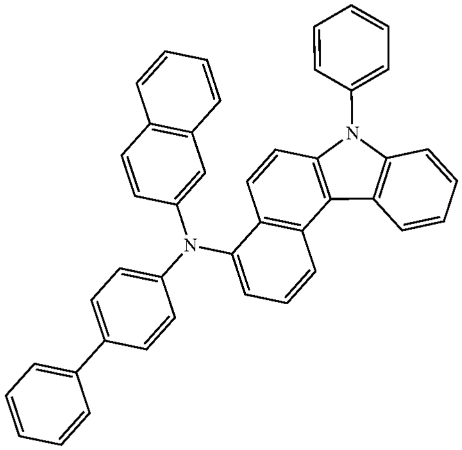
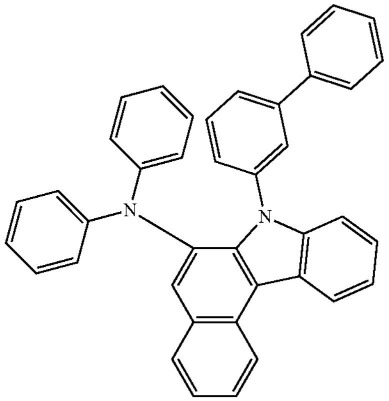
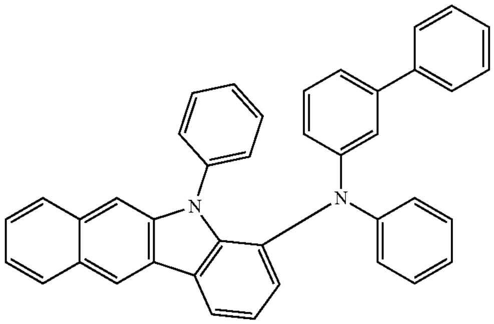
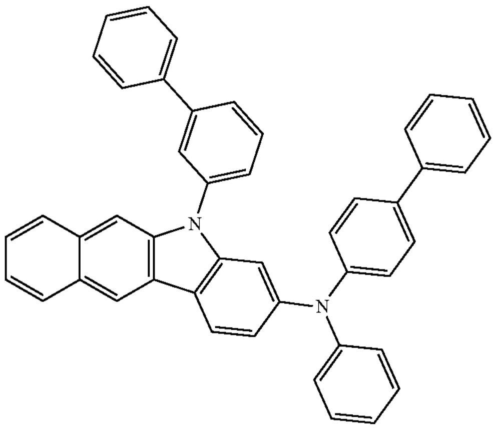
-continued
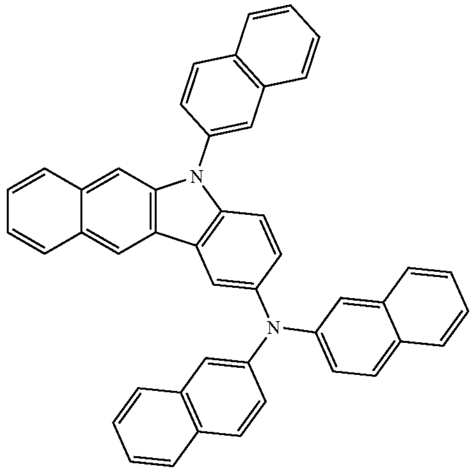
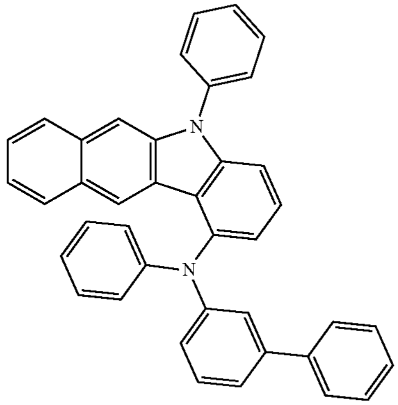
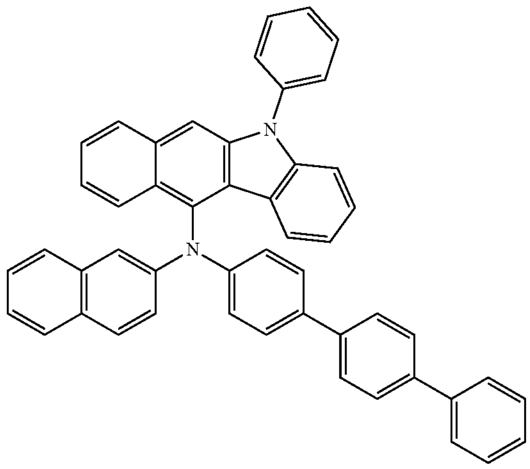

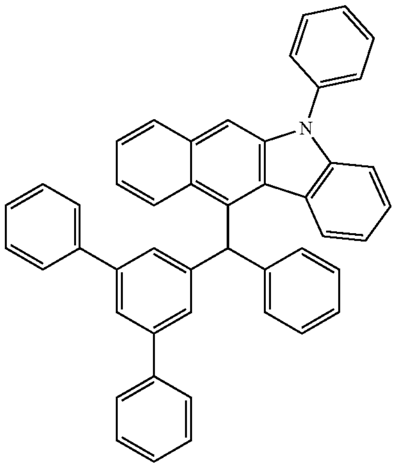
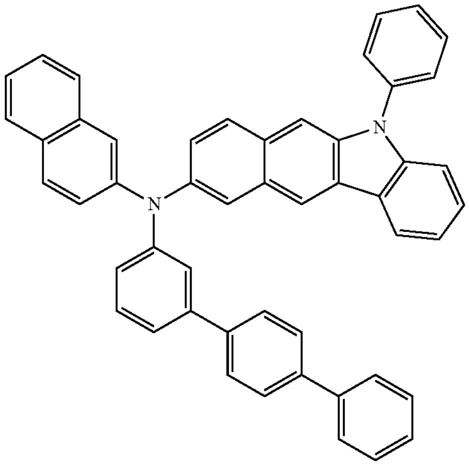
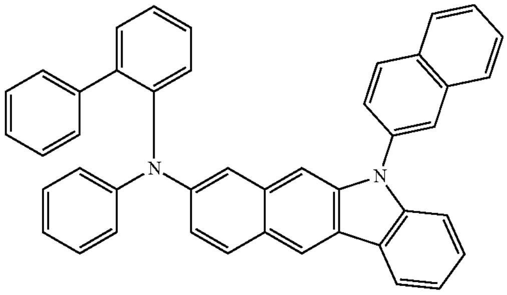
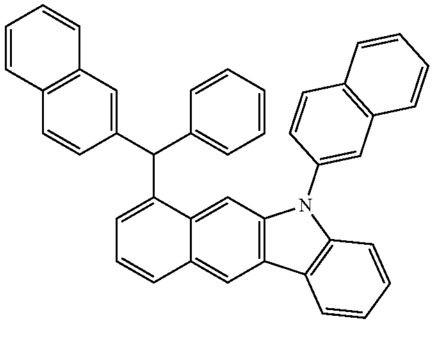
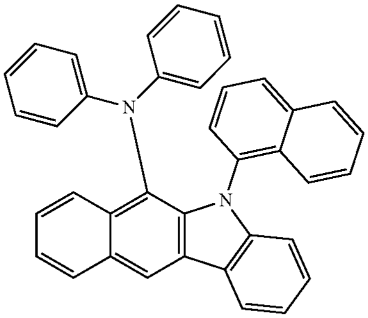
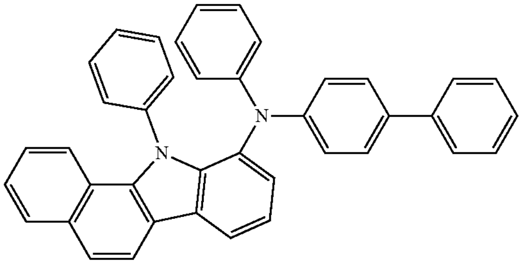
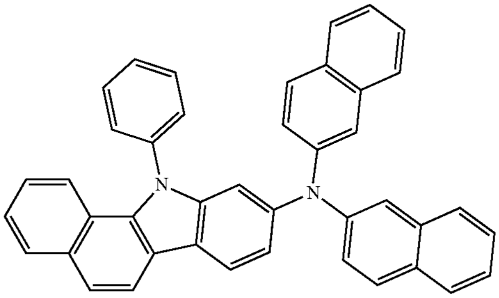
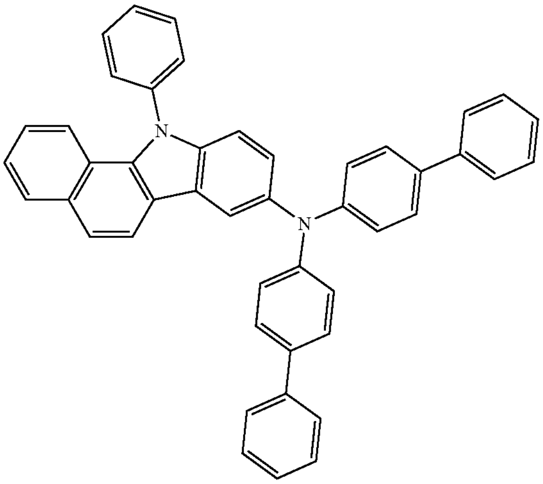
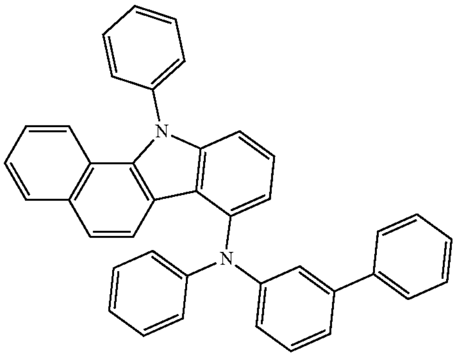

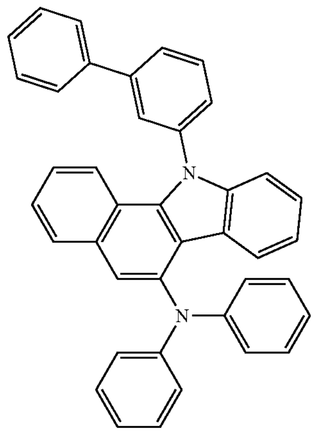
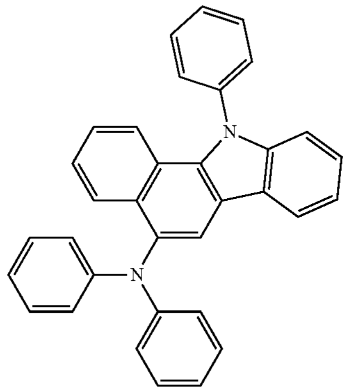
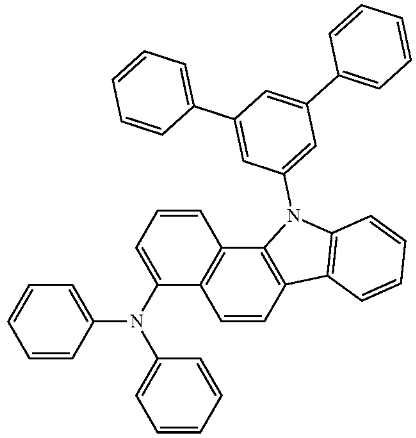
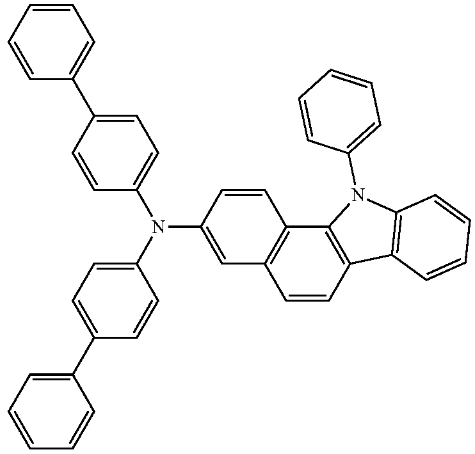
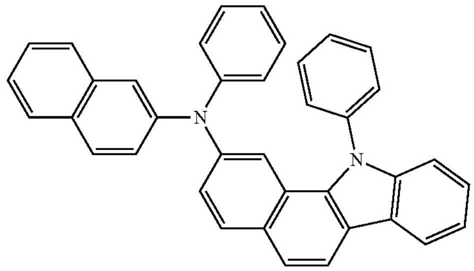
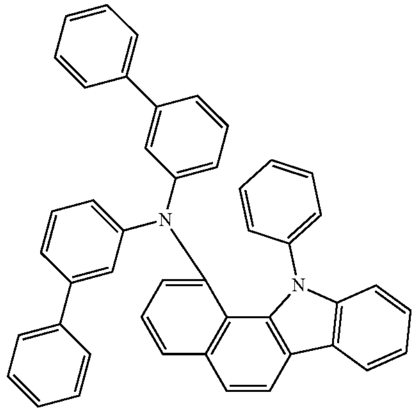
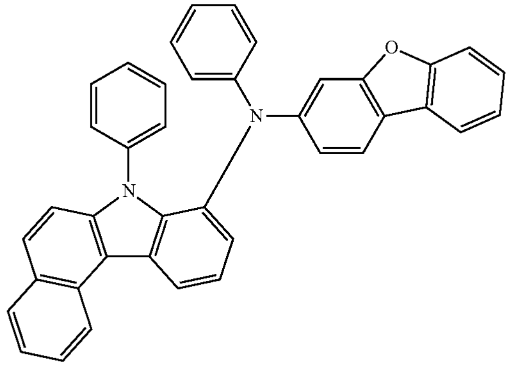
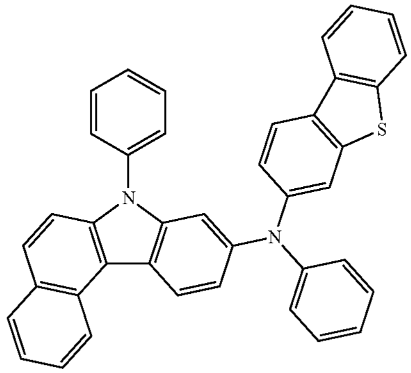

-continued
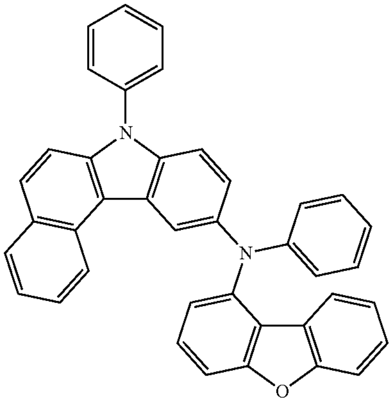
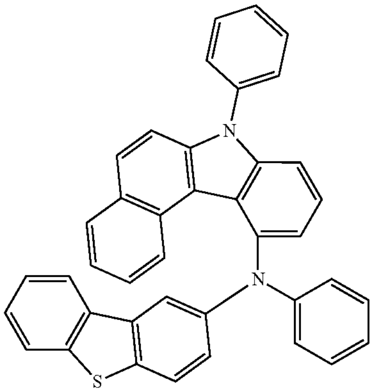
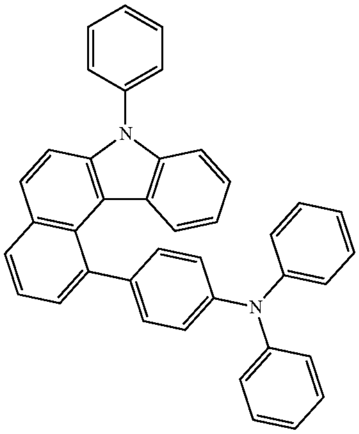
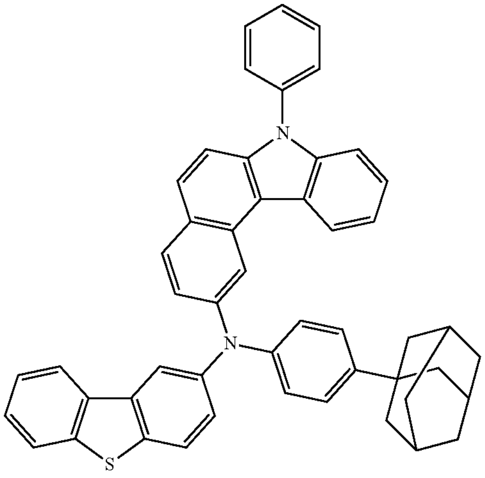
-continued
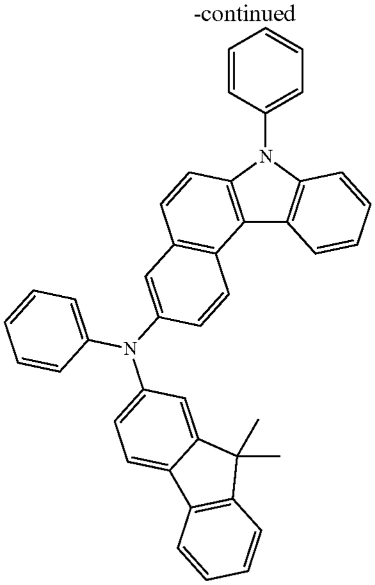
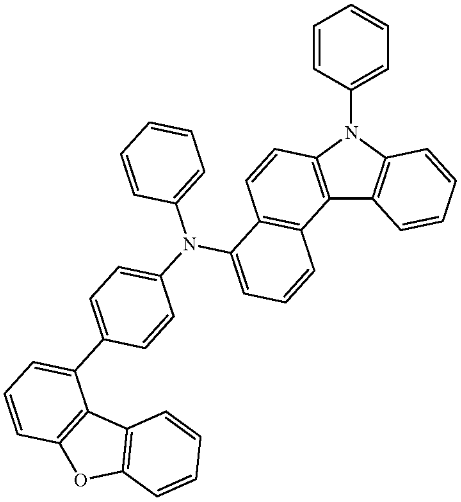
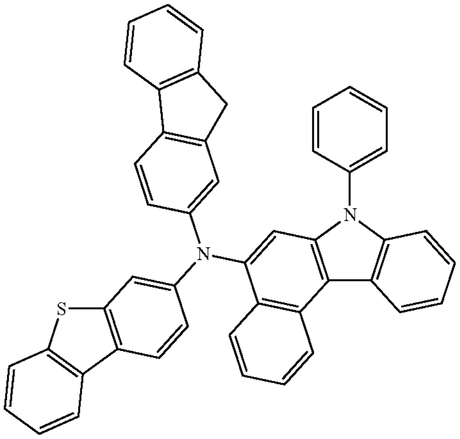

-continued
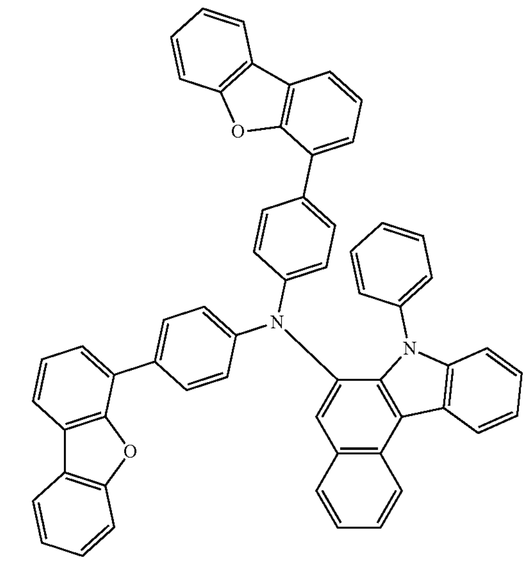
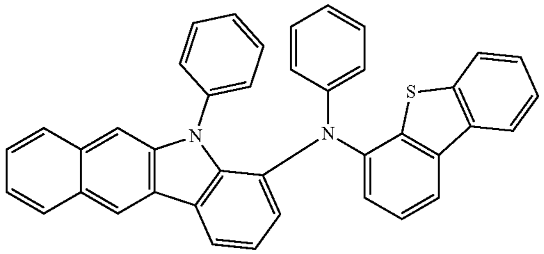
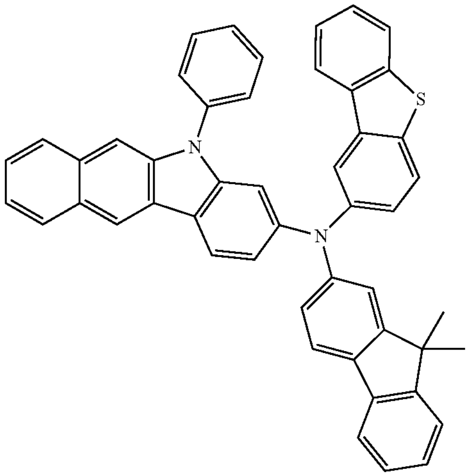
-continued
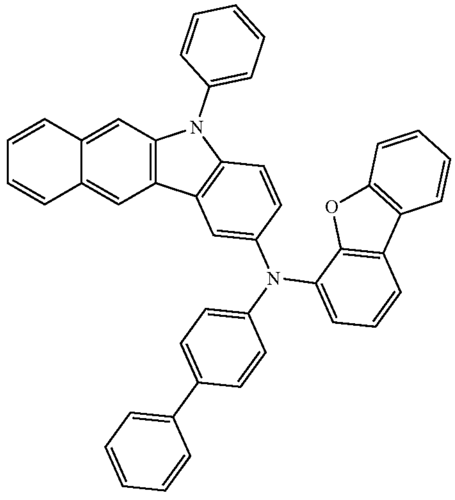
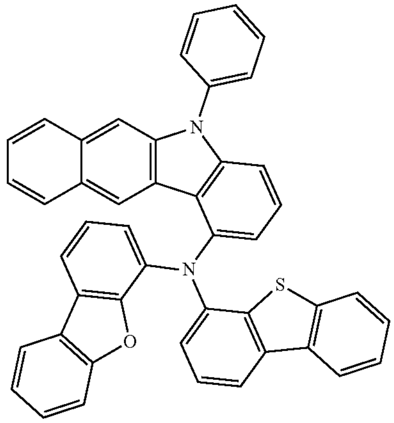
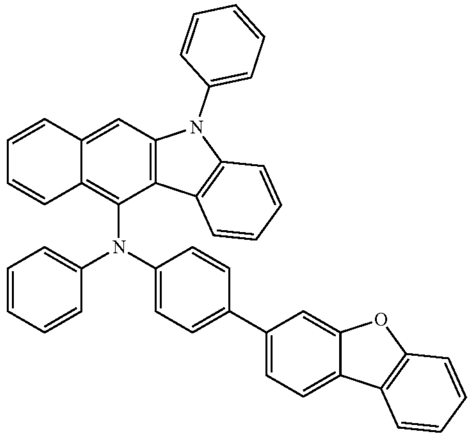

-continued
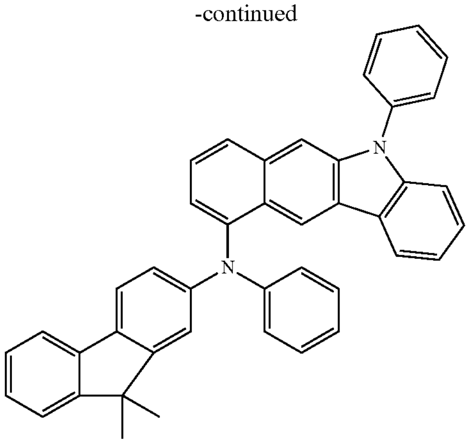
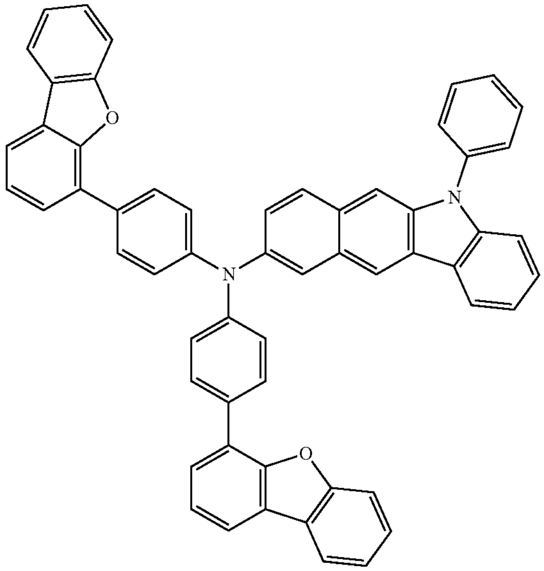
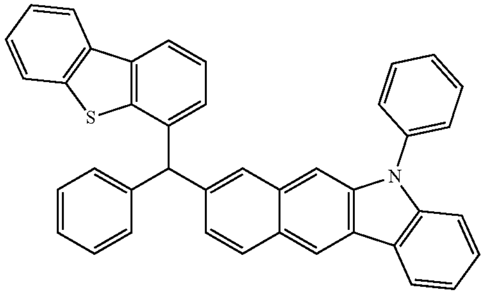
-continued
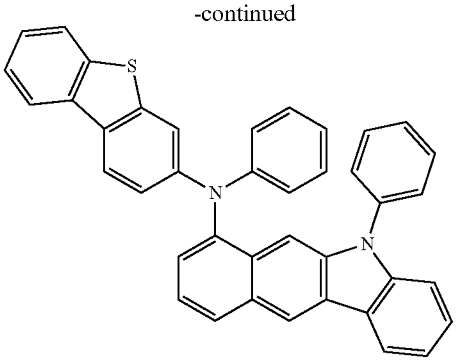
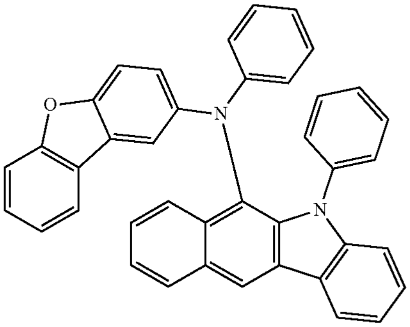
12. The organic light emitting device of claim 5, wherein the organic material layer further comprises one layer or two or more layers selected from the group consisting of a hole injection layer, a hole transport layer, an electron blocking layer, a light emitting layer, a hole blocking layer, and an electron injection and transport layer.
* * * * *